US012807631B2

(12) United States Patent
Wang et al.

(10) Patent No.: US 12,807,631 B2
(45) Date of Patent: Nov. 24, 2026

(54) ORGANIC ELECTROLUMINESCENT MATERIAL AND DEVICE THEREOF

(71) Applicant: BEIJING SUMMER SPROUT TECHNOLOGY CO., LTD., Beijing (CN)

(72) Inventors: Zheng Wang, Beijing (CN); Hongbo Li, Beijing (CN); Zhen Wang, Beijing (CN); Wei Cai, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

(*) Notice: Subject to any disclaimer, the term of this patent is extended or adjusted under 35 U.S.C. 154(b) by 377 days.

(21) Appl. No.: 18/237,579

(22) Filed: Aug. 24, 2023

(65) Prior Publication Data

US 2024/0109926 A1 Apr. 4, 2024

(30) Foreign Application Priority Data

Aug. 25, 2022 (CN) ......................... 202211022393.7
Mar. 22, 2023 (CN) ......................... 202310280294.7
Jul. 13, 2023 (CN) ......................... 202310859895.3

(51) Int. Cl.
*C07F 15/00* (2006.01)
*H10K 50/11* (2023.01)
*H10K 85/30* (2023.01)

(52) U.S. Cl.
CPC .......... *C07F 15/0033* (2013.01); *H10K 50/11* (2023.02); *H10K 85/342* (2023.02)

(58) Field of Classification Search
CPC .... C07F 15/0033; H10K 85/342; H10K 50/11
(Continued)

(56) References Cited

U.S. PATENT DOCUMENTS 5,703,436 A 12/1997 Forrest et al.
5,707,745 A 1/1998 Forrest et al.
(Continued)

FOREIGN PATENT DOCUMENTS

CN 102898477 A 1/2013
CN 103102371 A 5/2013
(Continued)

OTHER PUBLICATIONS

Tang, et al., "Organic electroluminescent diodes," Appl. Phys. Lett., 51, 913 (1987); doi: 10.1063/1.98799.
(Continued)

*Primary Examiner* — Ori Nadav
(74) *Attorney, Agent, or Firm* — KDW FIRM PLLC

(57) ABSTRACT

Provided are an organic electroluminescent material and a device comprising the same. The organic electroluminescent material is a metal complex comprising a ligand $L_a$ having a structure of Formula 1, where the ligand $L_a$ has a (6-5-6)-multi-membered fused cyclic structural unit and comprises particular substituents $R_1$ and $R_n$. These new compounds are applied to electroluminescent devices so that very excellent device performance can be obtained, full widths at half maximum of emission spectra can be further reduced while high performance of the devices can be maintained, the luminescence saturation of the devices can be improved and the devices can have high efficiency under a condition of being closer to a BT.2020 commercial luminescence requirement. Further provided are an organic electroluminescent device comprising the metal complex and a composition comprising the metal complex.

22 Claims, 1 Drawing Sheet

(58) Field of Classification Search
USPC .......................................................... 257/40
See application file for complete search history.

(56) References Cited

U.S. PATENT DOCUMENTS

| | | | |
|---|---|---|---|
| 5,844,363 | A | 12/1998 | Gu et al. |
| 6,097,147 | A | 8/2000 | Baldo et al. |
| 6,303,238 | B1 | 10/2001 | Thompson et al. |
| 7,279,704 | B2 | 10/2007 | Walters et al. |
| 7,968,146 | B2 | 6/2011 | Wagner et al. |
| 8,946,697 | B1 | 2/2015 | Ma et al. |
| 2003/0230980 | A1 | 12/2003 | Forrest et al. |
| 2004/0174116 | A1 | 9/2004 | Lu et al. |
| 2012/0292601 | A1 | 11/2012 | Kottas et al. |
| 2013/0181190 | A1 | 7/2013 | Ma et al. |
| 2014/0175408 | A1 | 6/2014 | Lin et al. |
| 2014/0231755 | A1 | 8/2014 | Xia et al. |
| 2015/0137096 | A1 | 5/2015 | Xia et al. |
| 2015/0171349 | A1 | 6/2015 | Ma et al. |
| 2015/0236276 | A1 | 8/2015 | Boudreault et al. |
| 2015/0315222 | A1 | 11/2015 | Boudreault et al. |
| 2015/0349273 | A1 | 12/2015 | Hung et al. |
| 2016/0049599 | A1 | 2/2016 | Ma et al. |
| 2016/0093815 | A1 | 3/2016 | Ma et al. |
| 2016/0093816 | A1 | 3/2016 | Ma et al. |
| 2016/0133860 | A1 | 5/2016 | Boudreault et al. |
| 2016/0141522 | A1 | 5/2016 | Ma et al. |
| 2016/0359122 | A1 | 12/2016 | Boudreault et al. |
| 2017/0069848 | A1 | 3/2017 | Zeng et al. |
| 2017/0084849 | A1 | 3/2017 | Tsai et al. |
| 2017/0263872 | A1 | 9/2017 | Ma et al. |
| 2017/0365801 | A1 | 12/2017 | Margulies et al. |
| 2018/0026208 | A1 | 1/2018 | Tsai et al. |
| 2018/0097185 | A1 | 4/2018 | Su et al. |
| 2018/0102487 | A1 | 4/2018 | Tsai et al. |
| 2018/0190914 | A1 | 7/2018 | Tsai et al. |
| 2018/0254417 | A1 | 9/2018 | Ma et al. |
| 2018/0287070 | A1 | 10/2018 | Ji et al. |
| 2019/0245153 | A1 | 8/2019 | Kottas et al. |
| 2020/0091442 | A1 | 3/2020 | Cai et al. |
| 2020/0251666 | A1 | 8/2020 | Cai et al. |
| 2021/0403496 | A1 | 12/2021 | Cai et al. |
| 2022/0002329 | A1 | 1/2022 | Cai et al. |
| 2022/0162244 | A1 | 5/2022 | Sang et al. |
| 2022/0165968 | A1 | 5/2022 | Sang et al. |
| 2022/0181560 | A1 | 6/2022 | Wang et al. |
| 2022/0259239 | A1 | 8/2022 | Cai et al. |
| 2022/0372055 | A1 | 11/2022 | Wang et al. |
| 2022/0384741 | A1 | 12/2022 | Cai et al. |
| 2022/0393115 | A1 | 12/2022 | Li et al. |
| 2023/0047519 | A1 | 2/2023 | Wang et al. |
| 2023/0058719 | A1 | 2/2023 | Cai et al. |
| 2023/0189629 | A1 | 6/2023 | Li et al. |
| 2023/0312627 | A1 | 10/2023 | Sang et al. |

FOREIGN PATENT DOCUMENTS

| | | | |
|---|---|---|---|
| CN | 109311922 | A | 2/2019 |
| CN | 111655705 | A | 9/2020 |
| CN | 114907413 | A | 8/2022 |
| CN | 117567517 | A | 2/2024 |
| EP | 2730583 | A1 | 5/2014 |
| EP | 3825320 | A1 | 5/2021 |
| JP | 2020-125289 | A | 8/2020 |
| JP | 2021-191744 | A | 12/2021 |
| JP | 2022-001564 | A | 1/2022 |
| KR | 10-2019-0130513 | A | 11/2019 |
| KR | 10-2021-0157811 | A | 12/2021 |
| KR | 10-2022-0081934 | A | 6/2022 |

OTHER PUBLICATIONS

Uoyama, et al., "Highly efficient organic light-emitting diodes from delayed fluorescence," pp. 234-238, Nature, vol. 492, Dec. 13, 2012, DOI:10.1038/nature11687.

Decision to Grant received for Japanese Patent Application No. 2023-137429, mailed on Sep. 16, 2025, 5 pages (2 pages of English Translation and 3 pages of Original Document).

Extended European Search Report received for European Patent Application No. 23192596.7, mailed on Jan. 25, 2024, 8 pages.

Japanese Search Report received for Japanese Patent Application No. 2023-137429, mailed on Jul. 18, 2024, 31 pages (30 pages of English Translation and 31 pages of Original Document).

Office Action received for Japanese Patent Application No. 2023-137429, mailed on Jan. 28, 2025, 7 pages (3 pages of English Translation and 4 pages of Original Office Action).

Office Action received for Japanese Patent Application No. 2023-137429, mailed on Jul. 30, 2024, 7 pages (3 pages of English Translation and 4 pages of Original Office Action).

Office Action received for Korean Patent Application No. 10-2023-0111415, mailed on Oct. 31, 2025, 25 pages (14 pages of English Translation and 11 pages of Original Office Action).

ORGANIC ELECTROLUMINESCENT MATERIAL AND DEVICE THEREOF

CROSS-REFERENCE TO RELATED APPLICATION(S)

This application claims priority to Chinese Patent Application No. 202211022393.7 filed on Aug. 25, 2022, Chinese Patent Application No. 202310280294.7 filed on Mar. 22, 2023, and Chinese Patent Application No. 202310859895.3 filed on Jul. 13, 2023, the disclosure of which are incorporated herein by reference in their entireties.

TECHNICAL FIELD

The present disclosure relates to compounds for organic electronic devices such as organic light-emitting devices. More particularly, the present disclosure relates to a metal complex comprising a ligand $L_a$ having a structure of Formula 1, an organic electroluminescent device comprising the metal complex and a composition comprising the metal complex.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which includes an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may include multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may include one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

At present, full-color displays are widely applied to our work and life, such as a display of a mobile phone, a display of a computer and an advertising display in a shopping mall. The displays are mainly used for displaying texts, graphics, animations, videos and other information, and imaging display is performed by pixel units of the displays. Each pixel unit displays full-color pictures of different colors by controlling RGB subpixels and is composed of one or more RGB subpixels. The color reproduction generally refers to a color that can be exhibited by RGB subpixels in the display. BT.2020 is a current color gamut requirement with the highest color reproduction. The higher the BT.2020 coverage of the full-color display, the higher the color reproduction of the full-color display. Although the color gamut specification of BT.2020 is higher, the three primary colors of BT.2020 are too saturated, which is difficult for general devices to achieve. The color coordinates of the red, green and blue primary colors are required to be (0.708, 0.292), (0.131, 0.046) and (0.170, 0.797) in BT. 2020, respectively. At present, both a red light device and a blue light device in a commonly used display panel can basically meet the color gamut requirement. However, the display panel is mainly limited by the performance of a green light device. At present, the green light device does not meet the color gamut requirement, and a color coordinate of the green light device needs to be adjusted to be close to the requirement of BT.2020.

CN111655705A has disclosed a metal complex having the following structure:

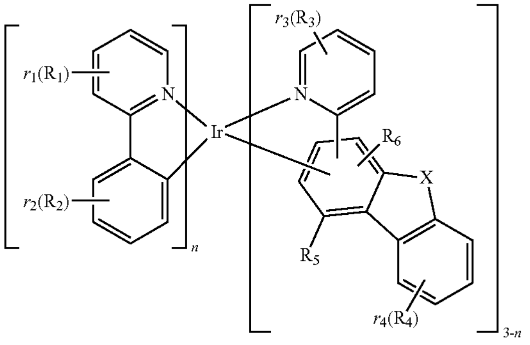
, where $R_5$ is selected from groups such as halogen, a nitrile group, a nitro group, . . . and substituted or unsubstituted alkyl having 3 to 30 carbon atoms, and CN111655705A has further disclosed the following specific structures:

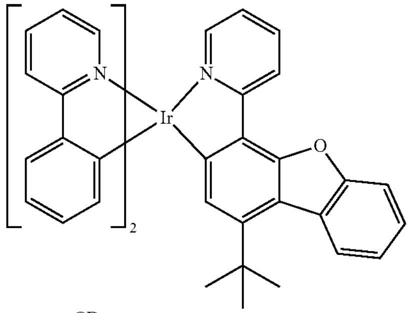
and

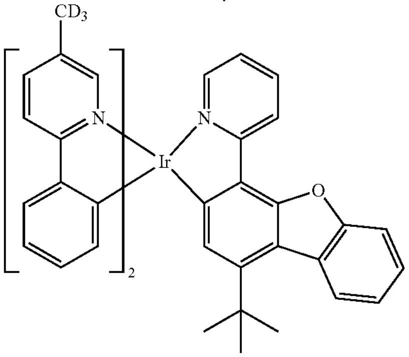
.

The application does not disclose or teach other particular substituents which are present at particular positions while a quaternary carbon atom is present at a position of $R_5$ in the metal complex and an effect of the metal complex on device performance.

SUMMARY

The present disclosure aims to provide a series of metal complexes each comprising a ligand $L_a$ having a structure of Formula 1 to solve at least part of the above-mentioned problems, where the ligand $L_a$ has a (6-5-6)-multi-membered fused cyclic structural unit and comprises particular substituents $R_1$ and $R_n$. These new metal complexes are applied to electroluminescent devices so that very excellent device performance can be obtained, the luminescence performance of the devices can be significantly improved, more saturated luminescence can be obtained and a BT.2020 requirement for commercial application is met.

According to an embodiment of the present disclosure, disclosed is a metal complex, which comprises a metal M and a ligand $L_a$ coordinated to the metal M, wherein $L_a$ has a structure represented by Formula 1:

Formula 1

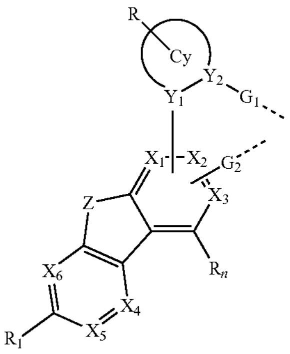

wherein in Formula 1, the ring Cy is, at each occurrence identically or differently, selected from an aromatic ring having 6 to 24 ring atoms which comprises $Y_1$ and $Y_2$, a heteroaromatic ring having 5 to 24 ring atoms which comprises $Y_1$ and $Y_2$ or a combination thereof;

$G_1$ and $G_2$ are, at each occurrence identically or differently, selected from a single bond, O or S; $X_1$ to $X_6$ are, at each occurrence identically or differently, selected from C, $CR_x$ or N, and one of $X_1$ to $X_3$ is selected from C and joined to $Y_1$;

one of $X_1$, $X_2$ and $X_3$ is selected from N and joined to the metal through a metal-nitrogen bond, or one of $X_1$, $X_2$ and $X_3$ is selected from C and joined to the metal through $G_2$;

$Y_1$ and $Y_2$ are, at each occurrence identically or differently, selected from C or N;

Z is selected from the group consisting of O, S, Se, NR', CR'R', SiR'R' and GeR'R'; when two R' are present at the same time, the two R' are identical or different;

R represents mono-substitution, multiple substitutions or non-substitution; when a plurality of R are present, the plurality of R are identical or different;

R, $R_x$ and R' are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$R_1$ is selected from a cyano group or fluorine; and $R_n$ has a structure represented by Formula 2:

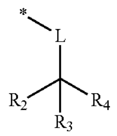

Formula 2 wherein in Formula 2, "*" represents a position where Formula 2 is joined to Formula 1;

L is selected from the group consisting of: a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms and combinations thereof;

$R_2$, $R_3$ and $R_4$ are, at each occurrence identically or differently, selected from the group consisting of: halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R can be optionally joined to form a ring;

adjacent substituents R' and $R_x$ can be optionally joined to form a ring; and adjacent substituents $R_2$, $R_3$ and $R_4$ can be optionally joined to form a ring.

According to another embodiment of the present disclosure, further disclosed is an organic electroluminescent device, which comprises an anode, a cathode and an organic layer disposed between the anode and the cathode, wherein at least one layer of the organic layer comprises the metal complex in the preceding embodiment.

According to another embodiment of the present disclosure, further disclosed is a composition, which comprises the metal complex in the preceding embodiment.

The present disclosure discloses the series of metal complexes each comprising the ligand $L_a$ having the structure of Formula 1 to solve at least part of the above-mentioned problems, where the ligand $L_a$ has the (6-5-6)-multi-membered fused cyclic structural unit and comprises the particular substituents $R_1$ and $R_n$. These new compounds are applied to the electroluminescent devices so that very excellent device performance can be obtained, full widths at half maximum of emission spectra can be further reduced while high performance of the devices can be maintained, the luminescence saturation of the devices can be improved and the devices can have high efficiency under a condition of being closer to a BT.2020 commercial luminescence requirement.

DETAILED DESCRIPTION

Figure 1:
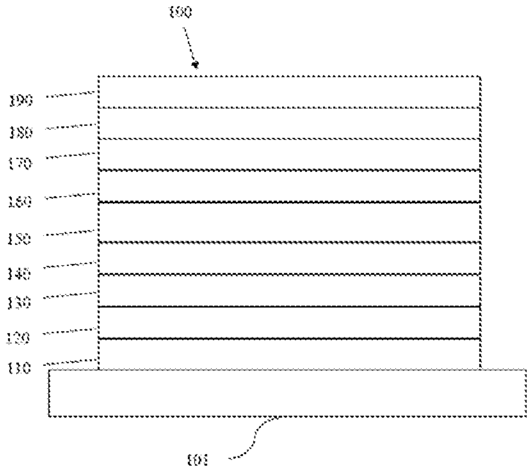
FIG. 1 is a schematic diagram of an organic light-emitting apparatus that may comprise a metal complex and a composition comprising the metal complex disclosed herein.

OLEDs can be fabricated on various types of substrates such as glass, plastic, and metal foil. FIG. 1 schematically shows an organic light-emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with F4-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

As used herein, the term "color coordinates" refers to the corresponding coordinates in the CIE 1931 color space.

Figure 3:
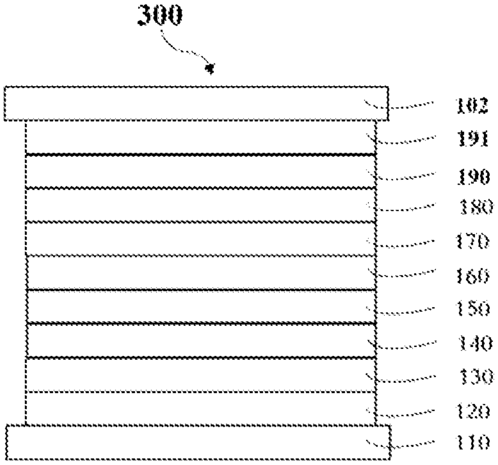
FIG. 3 is a structure diagram of a typical top-emitting OLED device.

A structure of a typical top-emitting OLED device is shown in FIG. 3. An OLED device 300 includes an anode 110, a hole injection layer (HIL) 120, a hole transporting layer (HTL) 130, an electron blocking layer (EBL) 140 (also referred to as a prime layer), an emissive layer (EML) 150, a hole blocking layer (HBL) 160 (optional), an electron transporting layer (ETL) 170, an electron injection layer (EIL) 180, a cathode 190, a capping layer 191, and an encapsulation layer 102. The anode 110 is a material or a combination of materials having a high reflectivity, including, but not limited to, Ag, Al, Ti, Cr, Pt, Ni, TiN, and a combination of the above materials with ITO and/or MoOx (molybdenum oxide). Generally, the reflectivity of the anode is greater than 50%; preferably, the reflectivity of the anode is greater than 70%; more preferably, the reflectivity of the anode is greater than 80%. The cathode 190 should be a translucent or transparent conductive material, including, but not limited to, a MgAg alloy, MoOx, Yb, Ca, ITO, IZO, or a combination thereof, and the average transmittance of the cathode for light having a wavelength in a visible light region is greater than 15%; preferably, the average transmittance of the cathode for light having a wavelength in the visible light region is greater than 20%; more preferably, the average transmittance of the cathode for light having a wavelength in the visible light region is greater than 25%. The hole injection layer 120 may be a single material layer such as commonly used HATCN. The hole injection layer 120 may also be a hole transporting material doped with a certain proportion of conductive p-type doping material, where the doping proportion is generally not higher than 5% and commonly between 1% and 3%. The EBL 140 is optional. However, to better match an energy level of a host material, a device structure with the EBL is generally adopted. The thickness of the hole transporting layer is generally between 100 nm and 200 nm. Since the top-emitting device has a microcavity effect, the microcavity of the device is usually adjusted by adjusting the thickness of the hole transporting layer or the electron blocking layer. For example, to achieve the best microcavity effect of the top-emitting OLED device, that is, to achieve a highest value of current efficiency, the thickness of the EBL may be fixed, and then the microcavity may be adjusted by adjusting the thickness of the HTL. Apparently, those skilled in the art can understand that when two top-emitting devices differ only in that different materials are used in one organic layer, for example, different organic materials are only used in the EML (other functional layers use the same materials), since the different organic materials in the EML may have slightly different refractive indexes, the optimal microcavity lengths of the two top-emitting devices may be slightly different. That is, to achieve the same setting condition (such as $CE_{max}$, CIEx coordinate, or $EQE_{max}$), the optimal microcavity lengths of different top-emitting devices may be slightly different.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may include a single layer or multiple layers.

Figure 2:
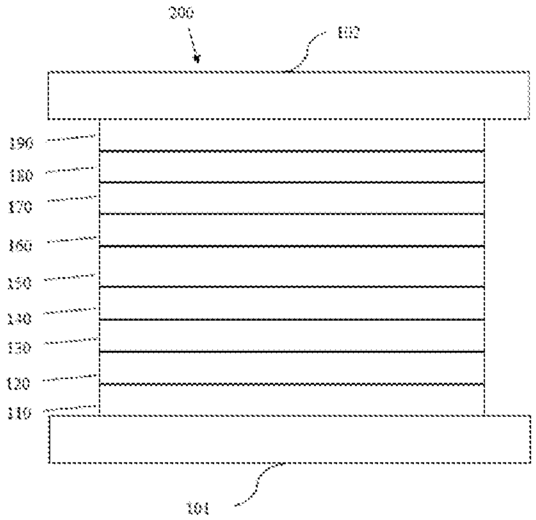
FIG. 2 is a schematic diagram of another organic light-emitting apparatus that may comprise a metal complex and a composition comprising the metal complex disclosed herein.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing (RISC) rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small AES-T. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbornyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylgermanylmethyl, trimethylgermanylethyl, trimethylgermanylisopropyl, dimethylethylgermanylmethyl, dimethylisopropylgermanylmethyl, tert-butylmethylgermanylmethyl, triethylgermanylmethyl, triethylgermanylethyl, triisopropylgermanylmethyl, triisopropylgermanylethyl, trimethylsilylmethyl, trimethylsilylethyl, and trimethylsilylisopropyl, triisopropylsilylmethyl, triisopropylsilylethyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, 1-propenyl group, 1-butenyl, 2-butenyl, 3-butenyl, 1,3-butanedienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups includes saturated heterocyclic groups having 3 to 20 ring atoms and unsaturated non-aromatic heterocyclic groups having 3 to 20 ring atoms, where at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl—as used herein, includes non-condensed and condensed hetero-aromatic groups having 1 to 5 hetero-atoms, where at least one hetero-atom is selected from the group consisting of a nitrogen atom, an oxygen atom, a sulfur atom, a selenium atom, a silicon atom, a phosphorus atom, a germanium atom, and a boron atom. A hetero-aromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyldi-t-butylsilyl. Additionally, the alkylsilyl group may be optionally substituted.

Arylsilyl—as used herein, contemplates a silyl group substituted with an aryl group. Arylsilyl groups may be those having 6 to 30 carbon atoms, preferably those having 8 to 20 carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

Alkylgermanyl—as used herein contemplates a germanyl substituted with an alkyl group. The alkylgermanyl may be those having 3 to 20 carbon atoms, preferably those having 3 to 10 carbon atoms. Examples of alkylgermanyl include trimethylgermanyl, triethylgermanyl, methyldiethylgermanyl, ethyldimethylgermanyl, tripropylgermanyl, tributylgermanyl, triisopropylgermanyl, methyldiisopropylgermanyl, dimethylisopropylgermanyl, tri-t-butylgermanyl, triisobutylgermanyl, dimethyl-t-butylgermanyl, and methyldi-t-butylgermanyl. Additionally, the alkylgermanyl may be optionally substituted.

Arylgermanyl—as used herein contemplates a germanyl substituted with at least one aryl group or heteroaryl group. Arylgermanyl may be those having 6 to 30 carbon atoms, preferably those having 8 to 20 carbon atoms. Examples of arylgermanyl include triphenylgermanyl, phenyldibiphenylylgermanyl, diphenylbiphenylgermanyl, phenyldiethylgermanyl, diphenylethylgermanyl, phenyldimethylgermanyl, diphenylmethylgermanyl, phenyldiisopropylgermanyl, diphenylisopropylgermanyl, diphenylbutylgermanyl, diphenylisobutylgermanyl, and diphenyl-t-butylgermanyl. Additionally, the arylgermanyl may be optionally substituted.

The term "aza" in azadibenzofuran, azadibenzothiophene, etc. means that one or more of C—H groups in the respective aromatic fragment are replaced by a nitrogen atom. For example, azatriphenylene encompasses dibenzo[f,h]quinoxaline, dibenzo[f,h]quinoline and other analogs with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted alkylgermanyl, substituted arylgermanyl, substituted amino, substituted acyl, substituted carbonyl, a substituted carboxylic acid group, a substituted ester group, a substituted hydroxyl group, a substituted sulfanyl group, substituted sulfinyl, substituted sulfonyl, and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, amino, acyl, carbonyl, a carboxylic acid group, an ester group, hydroxyl group, sulfanyl group, sulfinyl, sulfonyl, and phosphino may be substituted with one or more moieties selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl having 6 to 20 carbon atoms, unsubstituted alkylgermanyl having 3 to 20 carbon atoms, unsubstituted arylgermanyl group having 6 to 20 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or an attached fragment are considered to be equivalent.

In the compounds mentioned in the present disclosure, hydrogen atoms may be partially or fully replaced by deuterium. Other atoms such as carbon and nitrogen may also be replaced by their other stable isotopes. The replacement by other stable isotopes in the compounds may be preferred due to its enhancements of device efficiency and stability.

In the compounds mentioned in the present disclosure, multiple substitution refers to a range that includes a di-substitution, up to the maximum available substitution. When substitution in the compounds mentioned in the present disclosure represents multiple substitution (including di-, tri-, and tetra-substitutions, etc.), that means the substituent may exist at a plurality of available substitution positions on its linking structure, the substituents present at a plurality of available substitution positions may be the same structure or different structures.

In the compounds mentioned in the present disclosure, adjacent substituents in the compounds cannot be joined to form a ring unless otherwise explicitly defined, for example, adjacent substituents can be optionally joined to form a ring.

In the compounds mentioned in the present disclosure, the expression that adjacent substituents can be optionally joined to form a ring includes a case where adjacent substituents may be joined to form a ring and a case where adjacent substituents are not joined to form a ring. When adjacent substituents can be optionally joined to form a ring, the ring formed may be monocyclic or polycyclic (including spirocyclic, endocyclic, fused cyclic, and etc.), as well as alicyclic, heteroalicyclic, aromatic, or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

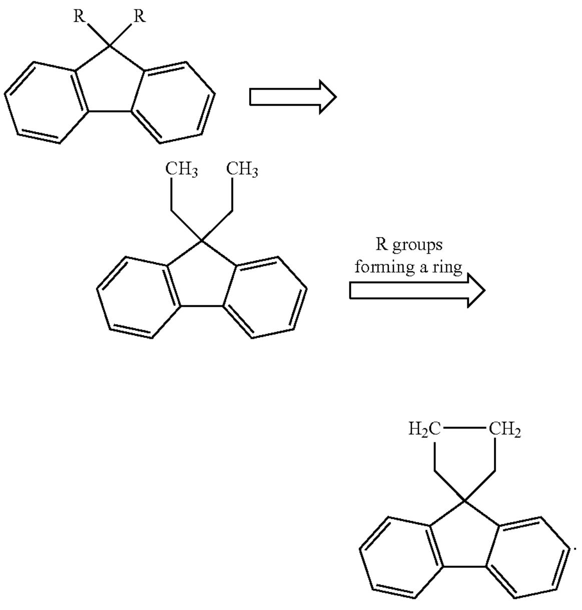

The expression that adjacent substituents can be optionally joined to form a ring is also intended to mean that two substituents bonded to carbon atoms which are directly bonded to each other are joined to each other via a chemical bond to form a ring, which can be exemplified by the following formula:

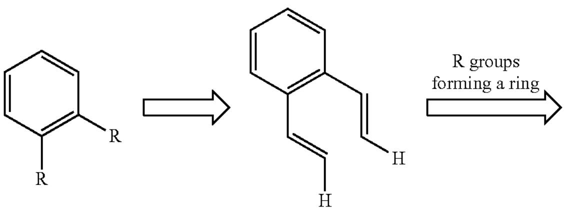

-continued

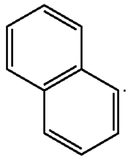

The expression that adjacent substituents can be optionally joined to form a ring is also intended to mean that two substituents bonded to a further distant carbon atom are joined to each other via a chemical bond to form a ring, which can be exemplified by the following formula:

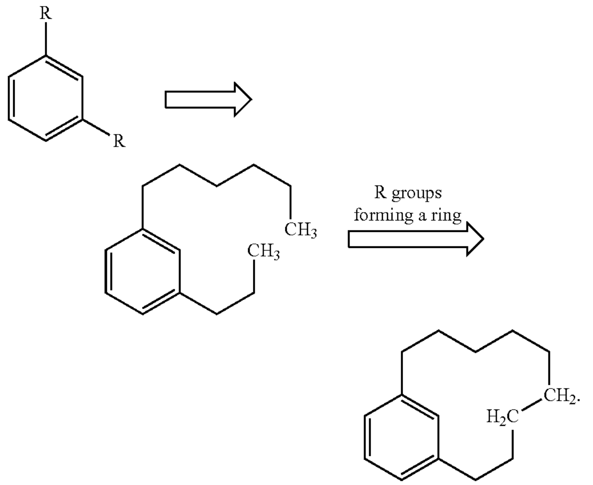

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

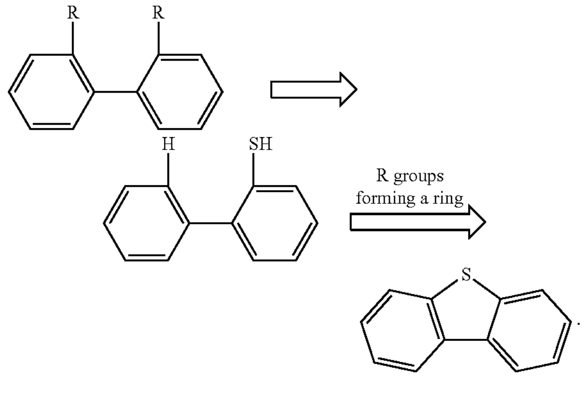

According to an embodiment of the present disclosure, disclosed is a metal complex, which comprises a metal M and a ligand $L_a$ coordinated to the metal M, wherein $L_a$ has a structure represented by Formula 1:

Formula 1

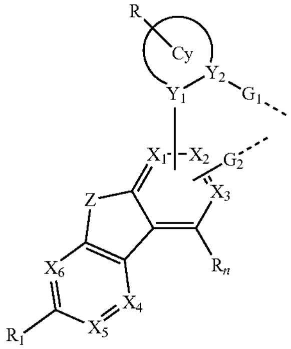

wherein in Formula 1, the ring Cy is, at each occurrence identically or differently, selected from an aromatic ring having 6 to 24 ring atoms which comprises $Y_1$ and $Y_2$, a heteroaromatic ring having 5 to 24 ring atoms which comprises $Y_1$ and $Y_2$ or a combination thereof;

$G_1$ and $G_2$ are, at each occurrence identically or differently, selected from a single bond, O or S;

$X_1$ to $X_6$ are, at each occurrence identically or differently, selected from C, $CR_x$ or N, and one of $X_1$ to $X_3$ is selected from C and joined to $Y_1$;

one of $X_1$, $X_2$ and $X_3$ is selected from N and joined to the metal through a metal-nitrogen bond, or one of $X_1$, $X_2$ and $X_3$ is selected from C and joined to the metal through $G_2$;

$Y_1$ and $Y_2$ are, at each occurrence identically or differently, selected from C or N;

Z is selected from the group consisting of O, S, Se, NR', CR'R', SiR'R' and GeR'R'; when two R' are present at the same time, the two R' are identical or different;

R represents mono-substitution, multiple substitutions or non-substitution; when a plurality of R are present, the plurality of R are identical or different;

R, $R_x$ and R' are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$R_1$ is selected from a cyano group or fluorine; and $R_n$ has a structure represented by Formula 2:

Formula 2

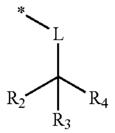

wherein in Formula 2, "*" represents a position where Formula 2 is joined to Formula 1; L is selected from the group consisting of: a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms and combinations thereof;

$R_2$, $R_3$ and $R_4$ are, at each occurrence identically or differently, selected from the group consisting of: halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R can be optionally joined to form a ring;

adjacent substituents R' and $R_x$ can be optionally joined to form a ring; and adjacent substituents $R_2$, $R_3$ and $R_4$ can be optionally joined to form a ring.

In the present disclosure, the expression that "adjacent substituents R can be optionally joined to form a ring" is intended to mean that any one or more of groups of adjacent substituents, such as two substituents R, can be joined to form a ring. Obviously, it is also possible that none of these substituents are joined to form a ring.

In the present disclosure, the expression that "adjacent substituents R' and $R_x$ can be optionally joined to form a ring" is intended to mean that any one or more of groups of adjacent substituents, such as two substituents R', two substituents $R_x$, and substituents R' and $R_x$, can be joined to form a ring. Obviously, it is also possible that none of these substituents are joined to form a ring.

In the present disclosure, the expression that "adjacent substituents $R_2$, $R_3$ and $R_4$ can be optionally joined to form a ring" is intended to mean that any one or more of groups of adjacent substituents, such as substituents $R_2$ and $R_3$, substituents $R_2$ and $R_4$, and substituents $R_4$ and $R_3$, can be joined to form a ring. Obviously, it is also possible that none of these substituents are joined to form a ring.

According to an embodiment of the present disclosure,

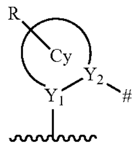

in Formula 1 is, at each occurrence identically or differently, selected from any one of the following structures:

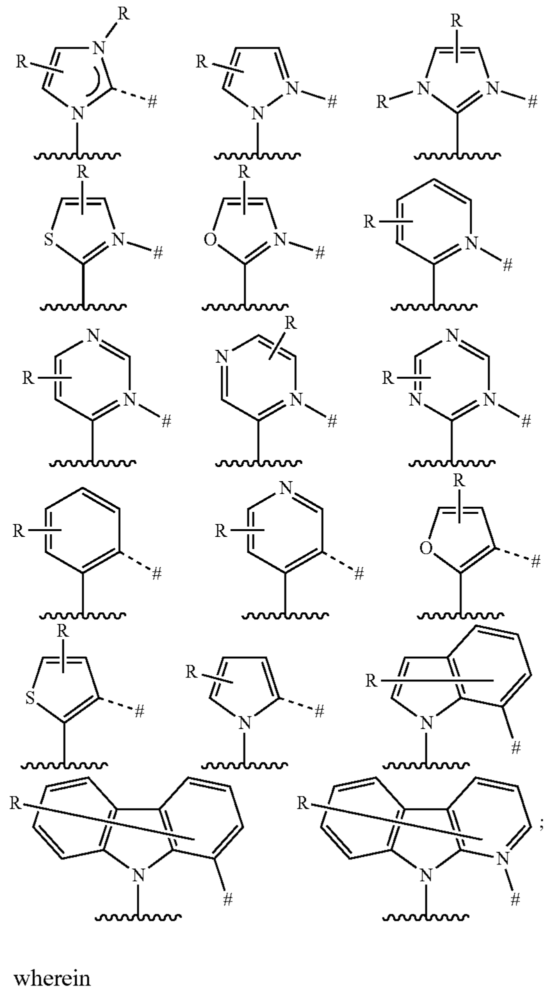

wherein

R represents, at each occurrence identically or differently, mono-substitution, multiple substitutions or non-substitution; when a plurality of R are present in any structure, the plurality of R are identical or different;

R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R can be optionally joined to form a ring; and

"#" represents a position where $G_1$ is joined, and

"  "

represents a position where $X_1$, $X_2$ or $X_3$ is joined.

According to an embodiment of the present disclosure, the metal complex has a general formula of $M(L_a)_m(L_b)_n(L_c)_q$;

$L_a$, $L_b$ and $L_c$ are a first ligand, a second ligand and a third ligand coordinated to the metal M, respectively, and $L_c$ is the same as or different from $L_a$ or $L_b$, wherein $L_a$, $L_b$ and $L_c$ can be optionally joined to form a multidentate ligand;

m is selected from 1, 2 or 3, n is selected from 0, 1 or 2, q is selected from 0, 1 or 2, and m+n+q is equal to an oxidation state of the metal M; when m is greater than or equal to 2, a plurality of $L_a$ are identical or different; when n is equal to 2, two $L_b$ are identical or different; when q is equal to 2, two $L_c$ are identical or different; $L_a$ has, at each occurrence identically or differently, a structure represented by any one of Formula 1-1 to Formula 1-14:

Formula 1-1

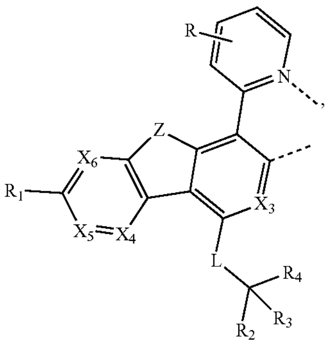

-continued

Formula 1-2

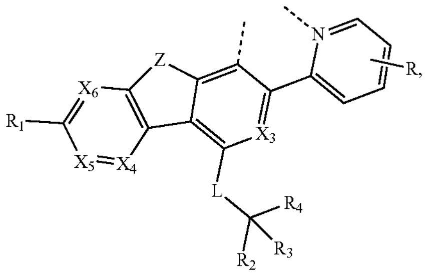

Formula 1-3

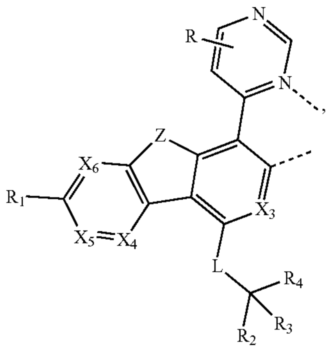

Formula 1-4

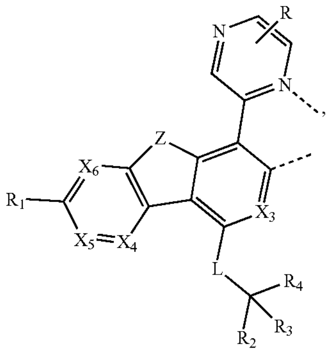

Formula 1-5

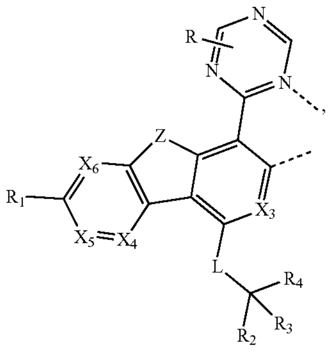

-continued
Formula 1-6
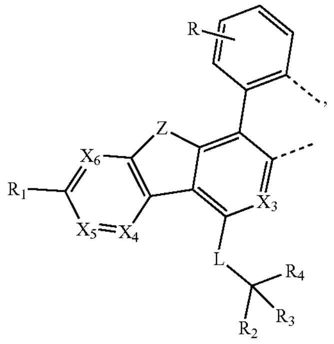
Formula 1-7
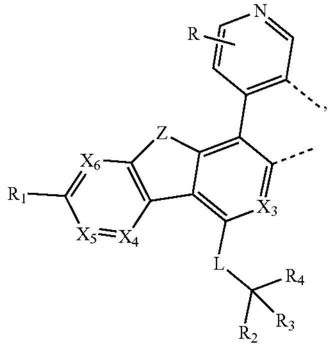
Formula 1-8
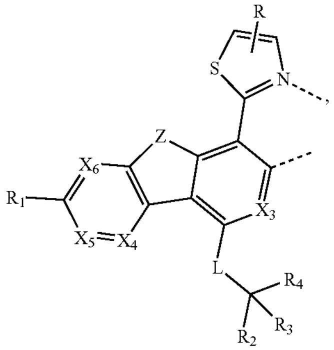
Formula 1-9
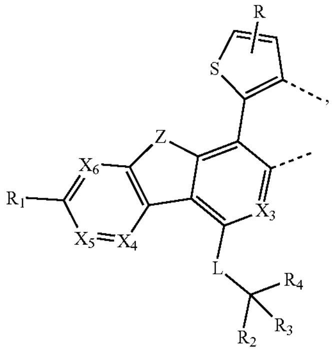
-continued
Formula 1-10
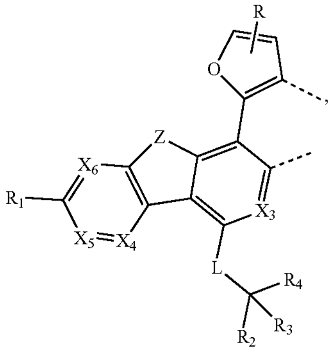
Formula 1-11
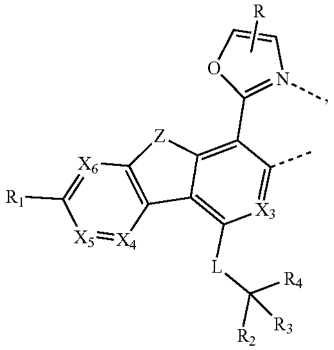
Formula 1-12
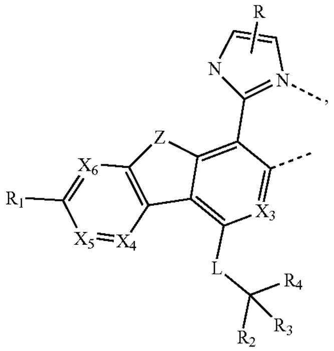
Formula 1-13
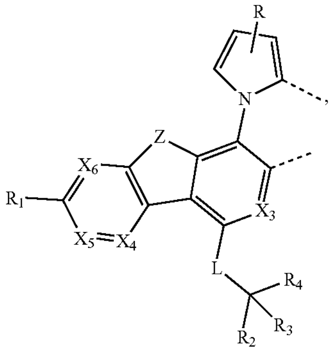

-continued

Formula 1-14

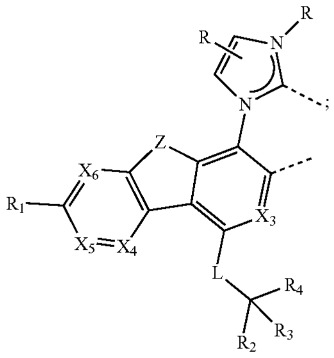

Z is selected from the group consisting of O, S, Se, NR', CR'R', SiR'R' and GeR'R'; when two R' are present at the same time, the two R' are identical or different;

$X_3$ to $X_6$ are, at each occurrence identically or differently, selected from $CR_x$ or N;

R represents mono-substitution, multiple substitutions or non-substitution; when a plurality of R are present, the plurality of R are identical or different;

$R_1$ is selected from a cyano group or fluorine;

L is selected from the group consisting of: a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms and combinations thereof;

R, $R_x$ and R' are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$R_2$, $R_3$ and $R_4$ are, at each occurrence identically or differently, selected from the group consisting of: fluorine, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R can be optionally joined to form a ring;

adjacent substituents R' and $R_x$ can be optionally joined to form a ring;

adjacent substituents $R_2$, $R_3$ and $R_4$ can be optionally joined to form a ring; and $L_b$ and $L_c$ are, at each occurrence identically or differently, selected from a monoanionic bidentate ligand.

According to an embodiment of the present disclosure, $L_b$ and $L_c$ are, at each occurrence identically or differently, selected from a structure represented by any one of the group consisting of:

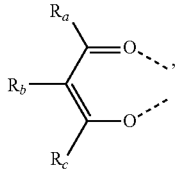
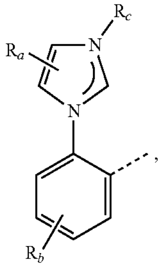
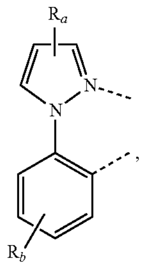
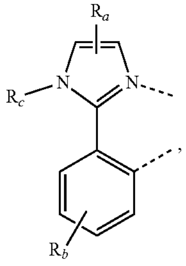
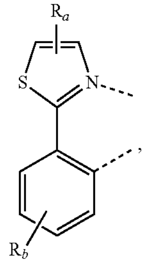
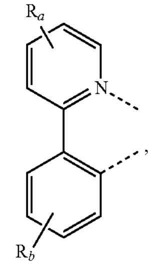
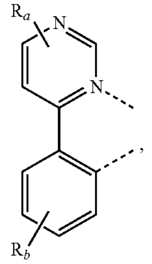
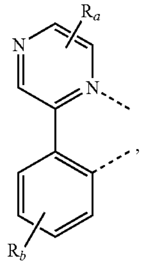
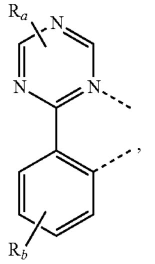

-continued

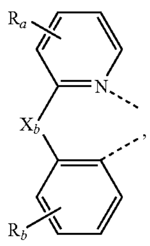

,

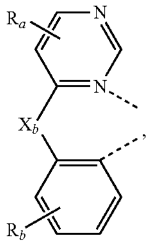

,

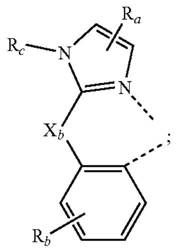

;

wherein $X_b$ is, at each occurrence identically or differently, selected from the group consisting of: O, S, Se, $NR_{N1}$ and $CR_{C1}R_{C2}$;

$R_a$ and $R_b$ represent, at each occurrence identically or differently, mono-substitution, multiple substitutions or non-substitution;

$R_a$, $R_b$, $R_c$, $R_{N1}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and adjacent substituents $R_a$, $R_b$, $R_c$, $R_{N1}$, $R_{C1}$ and $R_{C2}$ can be optionally joined to form a ring.

In the present disclosure, the expression that "adjacent substituents $R_a$, $R_b$, $R_c$, $R_{N1}$, $R_{C1}$ and $R_{C2}$ can be optionally joined to form a ring" is intended to mean that any one or more of groups of adjacent substituents, such as two substituents $R_a$, two substituents $R_b$, substituents $R_a$ and $R_b$, substituents $R_a$ and $R_c$, substituents $R_b$ and $R_c$, substituents $R_a$ and $R_{N1}$, substituents $R_b$ and $R_{N1}$, substituents $R_a$ and $R_{C1}$, substituents $R_a$ and $R_{C2}$, substituents $R_b$ and $R_{C1}$, substituents $R_b$ and $R_{C2}$, and substituents $R_{C1}$ and $R_{C2}$, can be joined to form a ring. Obviously, it is also possible that none of these substituents are joined to form a ring. For example, adjacent substituents $R_a$ and $R_b$ in

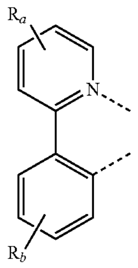

can be optionally joined to form a ring. When $R_a$ is optionally joined to form a ring,

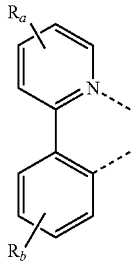

may form a structure of

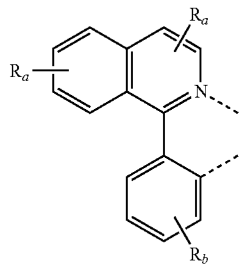

or

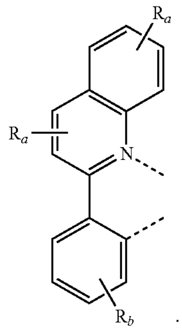

.

According to an embodiment of the present disclosure, the metal M is, at each occurrence identically or differently, selected from the group consisting of Cu, Ag, Au, Ru, Rh, Pd, Os, Ir and Pt.

According to an embodiment of the present disclosure, the metal M is, at each occurrence identically or differently, selected from Pt or Ir.

According to an embodiment of the present disclosure, $G_1$ and $G_2$ are selected from a single bond.

According to an embodiment of the present disclosure, $Y_1$ is selected from C.

According to an embodiment of the present disclosure, the metal complex has a general formula structure of $Ir(L_a)_m(L_b)_{3-m}$, and the structure is represented by Formula 3:

Formula 3

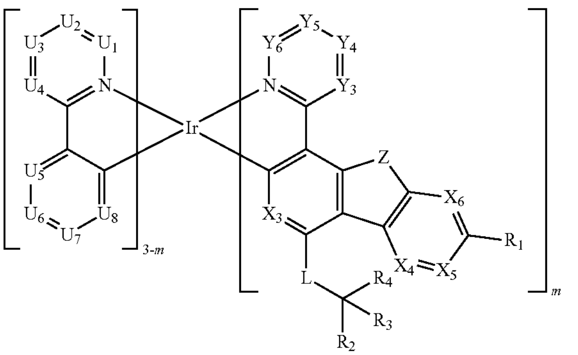

wherein m is selected from 1, 2 or 3; when m is selected from 1, two $L_b$ are identical or different; when m is selected from 2 or 3, a plurality of $L_a$ are identical or different;

Z is selected from the group consisting of O, S, Se, NR', CR'R', SiR'R' and GeR'R'; when two R' are present at the same time, the two R' are identical or different;

$U_1$ to $U_8$ are, at each occurrence identically or differently, selected from $CR_u$ or N;

$X_3$ to $X_6$ are, at each occurrence identically or differently, selected from $CR_x$ or N;

$Y_3$ to $Y_6$ are, at each occurrence identically or differently, selected from CR or N;

$R_1$ is selected from a cyano group or fluorine;

L is selected from the group consisting of: a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms and combinations thereof;

R', $R_u$, $R_x$ and R are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$R_2$, $R_3$ and $R_4$ are, at each occurrence identically or differently, selected from the group consisting of: halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_u$ can be optionally joined to form a ring;

adjacent substituents R can be optionally joined to form a ring;

adjacent substituents R' and $R_x$ can be optionally joined to form a ring; and adjacent substituents $R_2$, $R_3$ and $R_4$ can be optionally joined to form a ring.

In the present disclosure, the expression that "adjacent substituents $R_u$ can be optionally joined to form a ring" is intended to mean that any one or more of groups of adjacent substituents, such as two substituents $R_u$, can be joined to form a ring. Obviously, it is also possible that none of these substituents are joined to form a ring.

According to an embodiment of the present disclosure, Z is selected from O or S.

According to an embodiment of the present disclosure, Z is selected from O.

According to an embodiment of the present disclosure, L is selected from the group consisting of: a single bond, substituted or unsubstituted alkylene having 1 to 6 carbon atoms, substituted or unsubstituted cycloalkylene having 4 to 10 carbon atoms, substituted or unsubstituted arylene having 6 to 12 carbon atoms and combinations thereof.

According to an embodiment of the present disclosure, L is selected from a single bond and substituted or unsubstituted methylene.

According to an embodiment of the present disclosure, $R_2$, $R_3$ and $R_4$ are, at each occurrence identically or differently, selected from the group consisting of: halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, a cyano group and combinations thereof.

According to an embodiment of the present disclosure, $R_2$, $R_3$ and $R_4$ are, at each occurrence identically or differently, selected from the group consisting of: fluorine, substituted or unsubstituted alkyl having 1 to 20 carbon atoms, substituted or unsubstituted aryl having 6 to 30 carbon atoms, a cyano group and combinations thereof.

According to an embodiment of the present disclosure, $R_2$, $R_3$ and $R_4$ are, at each occurrence identically or differently, selected from substituted or unsubstituted alkyl having 1 to 20 carbon atoms.

According to an embodiment of the present disclosure, $R_2$, $R_3$ and $R_4$ are, at each occurrence identically or differently, selected from substituted or unsubstituted alkyl having 1 to 6 carbon atoms.

According to an embodiment of the present disclosure, $X_3$ to $X_6$ are, at each occurrence identically or differently, selected from $CR_x$.

According to an embodiment of the present disclosure, $X_3$ to $X_6$ are, at each occurrence identically or differently, selected from $CR_x$ or N, and at least one of $X_3$ to $X_6$ is N. For example, one of $X_3$ to $X_6$ is selected from N, or two of $X_3$ to $X_6$ are selected from N.

According to an embodiment of the present disclosure, $X_6$ is selected from N.

According to an embodiment of the present disclosure, $Y_3$ to $Y_6$ are, at each occurrence identically or differently, selected from CR.

According to an embodiment of the present disclosure, $Y_3$ to $Y_6$ are, at each occurrence identically or differently, selected from CR or N, and at least one of $Y_3$ to $Y_6$ is N. For example, one of $Y_3$ to $Y_6$ is selected from N, or two of $Y_3$ to $Y_6$ are selected from N.

According to an embodiment of the present disclosure, $R_x$ and R are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted alkylgermanyl having 3 to 20 carbon atoms, a cyano group and combinations thereof.

According to an embodiment of the present disclosure, $R_x$ and R are, at each occurrence identically or differently, selected from the group consisting of: hydrogen, deuterium, fluorine, substituted or unsubstituted alkyl having 1 to 6 carbon atoms, substituted or unsubstituted cycloalkyl having 3 to 6 ring carbon atoms, substituted or unsubstituted aryl having 6 to 12 carbon atoms, substituted or unsubstituted heteroaryl having 3 to 12 carbon atoms, substituted or unsubstituted alkylsilyl having 3 to 12 carbon atoms, substituted or unsubstituted alkylgermanyl having 3 to 12 carbon atoms, a cyano group and combinations thereof.

According to an embodiment of the present disclosure, $R_x$ and R are, at each occurrence identically or differently, selected from the group consisting of: hydrogen, deuterium, fluorine, a cyano group, methyl, ethyl, propyl, isopropyl, n-butyl, isobutyl, t-butyl, cyclopentyl, cyclohexyl, deuterated methyl, deuterated ethyl, deuterated propyl, deuterated isopropyl, deuterated n-butyl, deuterated isobutyl, deuterated t-butyl, deuterated cyclopentyl, deuterated cyclohexyl, phenyl, pyridyl, trimethylsilyl, trimethylgermanyl and combinations thereof.

According to an embodiment of the present disclosure, at least one R is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and combinations thereof.

According to an embodiment of the present disclosure, at least one R is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and combinations thereof.

According to an embodiment of the present disclosure, $Y_3$ to $Y_6$ are, at each occurrence identically or differently, selected from CR, and R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted alkylsilyl having 3 to 20 carbon atoms, substituted or unsubstituted alkylgermanyl having 3 to 20 carbon atoms, a cyano group and combinations thereof.

According to an embodiment of the present disclosure, $Y_3$ to $Y_6$ are, at each occurrence identically or differently, selected from CR, and R is, at each occurrence identically or differently, selected from the group consisting of: hydrogen, deuterium, fluorine, substituted or unsubstituted alkyl having 1 to 6 carbon atoms, substituted or unsubstituted cycloalkyl having 3 to 6 ring carbon atoms and combinations thereof.

According to an embodiment of the present disclosure, at least one of $X_3$ to $X_6$ is selected from $CR_x$, and $R_x$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

According to an embodiment of the present disclosure, at least one of $X_3$ to $X_6$ is selected from $CR_x$, and $R_x$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, a cyano group and combinations thereof.

According to an embodiment of the present disclosure, at least one of $X_3$ to $X_6$ is selected from $CR_x$, and $R_x$ is selected from substituted or unsubstituted aryl having 6 to 30 carbon atoms, substituted or unsubstituted heteroaryl having 3 to 30 carbon atoms or a combination thereof.

According to an embodiment of the present disclosure, $X_6$ is selected from $CR_x$, and $R_x$ is selected from deuterium, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms or a combination thereof.

According to an embodiment of the present disclosure, $X_6$ is selected from $CR_x$, and $R_x$ is selected from substituted or unsubstituted aryl having 6 to 30 carbon atoms, substituted or unsubstituted heteroaryl having 3 to 30 carbon atoms or a combination thereof.

According to an embodiment of the present disclosure, $X_6$ is selected from $CR_x$, and $R_x$ is selected from substituted or unsubstituted aryl having 6 to 18 carbon atoms.

According to an embodiment of the present disclosure, $X_6$ is selected from $CR_x$, and $R_x$ is selected from substituted or unsubstituted phenyl, substituted or unsubstituted biphenyl, substituted or unsubstituted naphthyl, substituted or unsubstituted fluorenyl, substituted or unsubstituted phenanthryl, substituted or substituted anthryl or a combination thereof.

According to an embodiment of the present disclosure, at least one R is selected from the group consisting of: deuterium, halogen, substituted or unsubstituted alkyl having 1 to 6 carbon atoms, substituted or unsubstituted cycloalkyl having 3 to 6 ring carbon atoms, substituted or unsubstituted aryl having 6 to 12 carbon atoms, substituted or unsubstituted heteroaryl having 3 to 12 carbon atoms and combinations thereof.

According to an embodiment of the present disclosure, at least one R is selected from the group consisting of: deuterium, fluorine, substituted or unsubstituted alkyl having 1 to 6 carbon atoms, substituted or unsubstituted cycloalkyl having 3 to 6 ring carbon atoms, substituted or unsubstituted aryl having 6 to 12 carbon atoms and combinations thereof.

According to an embodiment of the present disclosure, $R_n$ is, at each occurrence identically or differently, selected from the group consisting of:

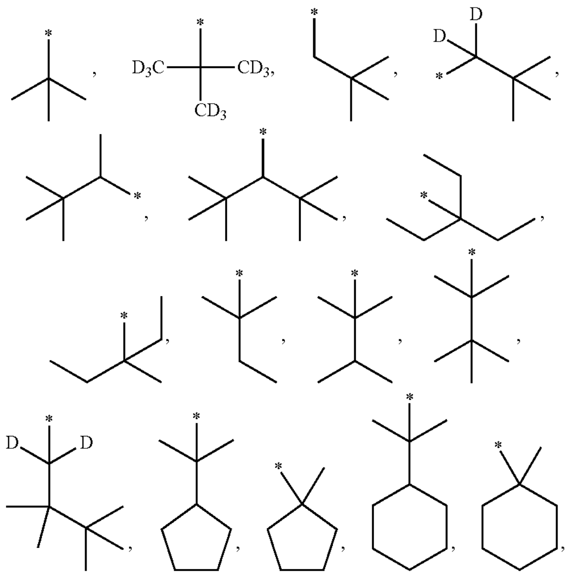

-continued

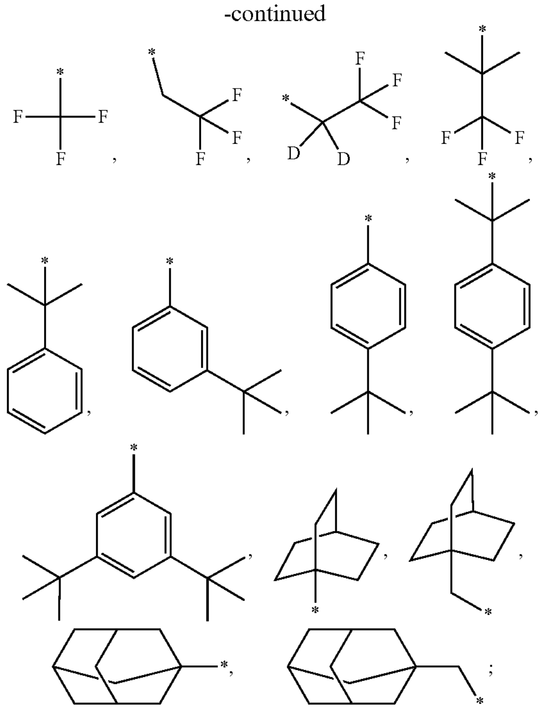

wherein optionally, hydrogens in the above $R_n$ can be partially or fully substituted with deuterium.

According to an embodiment of the present disclosure, $U_1$ to $U_8$ are, at each occurrence identically or differently, selected from $CR_u$.

According to an embodiment of the present disclosure, $U_1$ to $U_8$ are, at each occurrence identically or differently, selected from $CR_u$ or N, and at least one of $U_1$ to $U_8$ is selected from N. For example, one of $U_1$ to $U_8$ is selected from N, or two of $U_1$ to $U_8$ are selected from N.

According to an embodiment of the present disclosure, $R_u$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a cyano group, an isocyano group, a hydroxyl group, a sulfanyl group and combinations thereof.

According to an embodiment of the present disclosure, $R_u$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms and combinations thereof.

According to an embodiment of the present disclosure, $R_u$ is, at each occurrence identically or differently, selected from the group consisting of: hydrogen, deuterium, fluorine, substituted or unsubstituted alkyl having 1 to 6 carbon atoms, substituted or unsubstituted cycloalkyl having 3 to 6 ring carbon atoms, substituted or unsubstituted aryl having 6 to 12 carbon atoms and combinations thereof.

According to an embodiment of the present disclosure, $R_u$ is, at each occurrence identically or differently, selected from the group consisting of: hydrogen, deuterium, fluorine, a cyano group, methyl, ethyl, propyl, isopropyl, n-butyl, isobutyl, t-butyl, cyclopentyl, cyclohexyl, deuterated methyl, deuterated ethyl, deuterated propyl, deuterated isopropyl, deuterated n-butyl, deuterated isobutyl, deuterated t-butyl, deuterated cyclopentyl, deuterated cyclohexyl, phenyl, pyridyl, trimethylsilyl, trimethylgermanyl and combinations thereof.

According to an embodiment of the present disclosure, at least one or at least two of $U_1$ to $U_8$ are selected from $CR_u$, $R_u$ is selected from substituted or unsubstituted alkyl having 1 to 20 carbon atoms, substituted or unsubstituted cycloalkyl having 3 to 20 ring carbon atoms or a combination thereof, and the total number of carbon atoms in all of $R_u$ is at least 4.

According to an embodiment of the present disclosure, at least one or at least two of $U_5$ to $U_8$ are selected from $CR_u$, $R_u$ is selected from substituted or unsubstituted alkyl having 1 to 20 carbon atoms, substituted or unsubstituted cycloalkyl having 3 to 20 ring carbon atoms or a combination thereof, and the total number of carbon atoms in all of $R_u$ is at least 4.

According to an embodiment of the present disclosure, at least one or at least two of $U_1$ to $U_4$ are selected from $CR_u$, $R_u$ is selected from substituted or unsubstituted alkyl having 1 to 20 carbon atoms, substituted or unsubstituted cycloalkyl having 3 to 20 ring carbon atoms or a combination thereof, and the total number of carbon atoms in all of $R_u$ is at least 4.

According to an embodiment of the present disclosure, $U_6$ or $U_7$ is selected from $CR_u$, and $R_u$ is selected from substituted or unsubstituted alkyl having 1 to 20 carbon atoms, substituted or unsubstituted cycloalkyl having 3 to 20 ring carbon atoms or a combination thereof.

According to an embodiment of the present disclosure, $U_6$ or $U_7$ is selected from $CR_u$, and $R_u$ is selected from substituted or unsubstituted alkyl having 4 to 20 carbon atoms, substituted or unsubstituted cycloalkyl having 4 to 20 ring carbon atoms or a combination thereof.

According to an embodiment of the present disclosure, at least one of $U_1$ to $U_4$ is selected from $CR_u$, at least one of $Y_3$ to $Y_6$ is selected from CR, $R_u$ and R are selected from substituted or unsubstituted alkyl having 1 to 20 carbon atoms, substituted or unsubstituted cycloalkyl having 3 to 20 ring carbon atoms or a combination thereof, and the total number of carbon atoms in $R_u$ and R is greater than or equal to 2.

According to an embodiment of the present disclosure, at least one of $U_5$ to $U_8$ is selected from $CR_u$, at least one of $Y_3$ to $Y_6$ is selected from CR, $R_u$ and R are selected from substituted or unsubstituted alkyl having 1 to 20 carbon atoms, substituted or unsubstituted cycloalkyl having 3 to 20 ring carbon atoms or a combination thereof, and the total number of carbon atoms in $R_u$ and R is greater than or equal to 2.

According to an embodiment of the present disclosure, at least one of $U_1$ to $U_4$ is selected from $CR_u$, at least one of $U_5$ to $U_8$ is selected from $CR_u$, $R_u$ is selected from substituted or unsubstituted alkyl having 1 to 20 carbon atoms, substituted or unsubstituted cycloalkyl having 3 to 20 ring carbon atoms or a combination thereof, and the total number of carbon atoms in $R_u$ is greater than or equal to 2.

According to an embodiment of the present disclosure, R' is, at each occurrence identically or differently, selected from substituted or unsubstituted alkyl having 1 to 20 carbon atoms or substituted or unsubstituted cycloalkyl having 3 to 20 ring carbon atoms.

According to an embodiment of the present disclosure, R' is methyl or deuterated methyl.

According to an embodiment of the present disclosure, $L_a$ is, at each occurrence identically or differently, selected from the group consisting of $L_{a1}$ to $L_{a3530}$, wherein the specific structures of $L_{a1}$ to $L_{a3530}$ are referred to claim 15.

According to an embodiment of the present disclosure, hydrogens in $L_{a1}$ to $L_{a3530}$ can be partially or fully substituted with deuterium.

According to an embodiment of the present disclosure, $L_b$ is, at each occurrence identically or differently, selected from the group consisting of $L_{b1}$ to $L_{b151}$, wherein the specific structures of $L_{b1}$ to $L_{b151}$ are referred to claim 16.

According to an embodiment of the present disclosure, hydrogens in $L_{b1}$ to $L_{b18}$, $L_{b20}$ to $L_{b26}$ and $L_{b31}$ to $L_{b151}$ can be partially or fully substituted with deuterium.

According to an embodiment of the present disclosure, $L_c$ is, at each occurrence identically or differently, selected from the group consisting of:

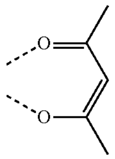

$L_{c1}$

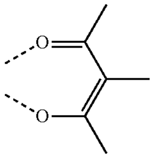

$L_{c2}$

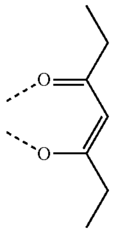

$L_{c3}$

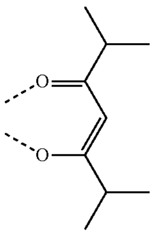

$L_{c4}$

-continued
$L_{c5}$
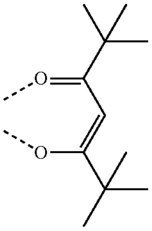
$L_{c6}$
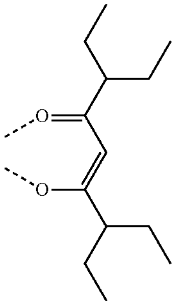
$L_{c7}$
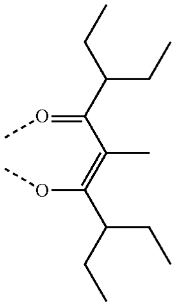
$L_{c8}$
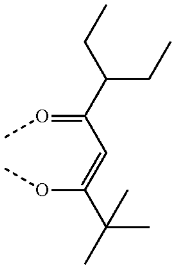
$L_{c9}$
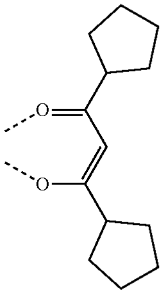
-continued
$L_{c10}$
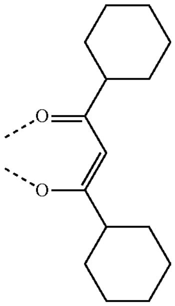
$L_{c11}$
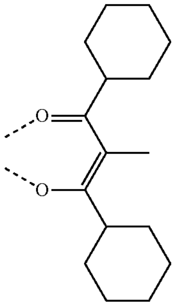
$L_{c12}$
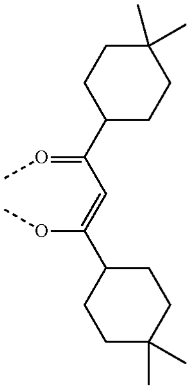
$L_{c13}$
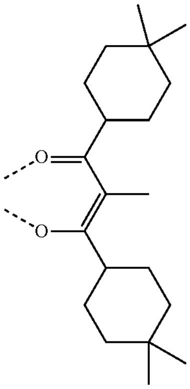

-continued
$L_{c14}$
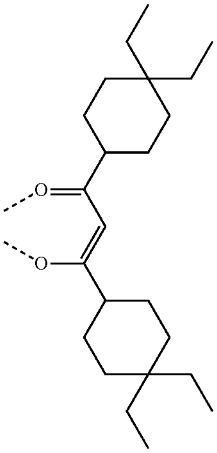
$L_{c15}$
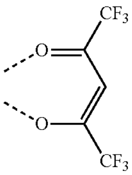
$L_{c16}$
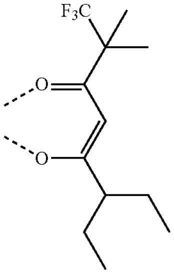
$L_{c17}$
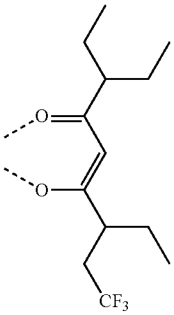
$L_{c18}$
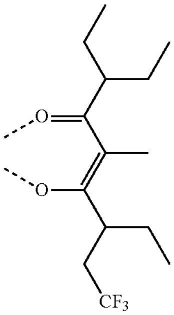
-continued
$L_{c19}$
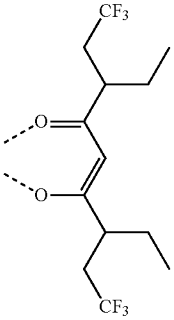
$L_{c20}$
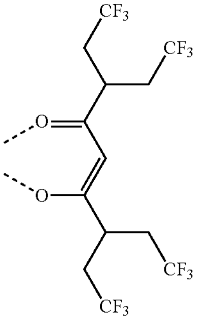
$L_{c21}$
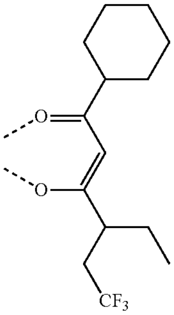
$L_{c22}$
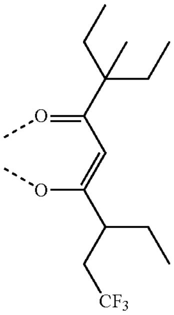
$L_{c23}$
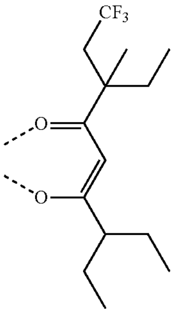

-continued
$L_{c24}$
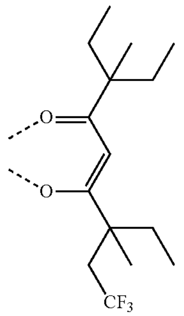
$L_{c25}$
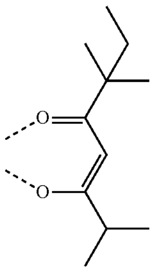
$L_{c26}$
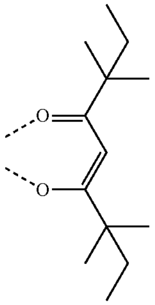
$L_{c27}$
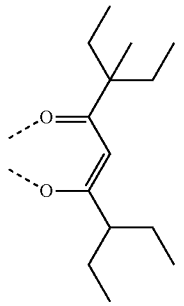
$L_{c28}$
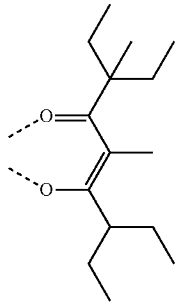
-continued
$L_{c29}$
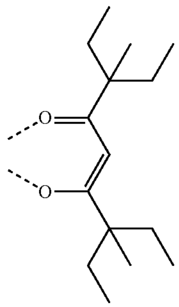
$L_{c30}$
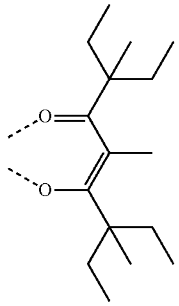
$L_{c31}$
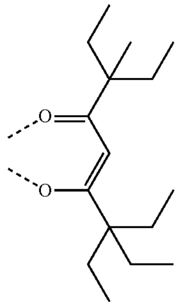
$L_{c32}$
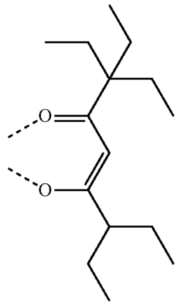
$L_{c33}$
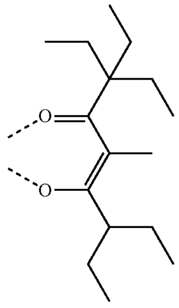

-continued
$L_{c34}$
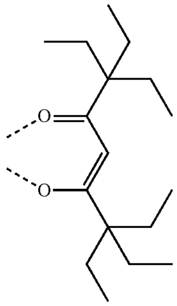
$L_{c35}$
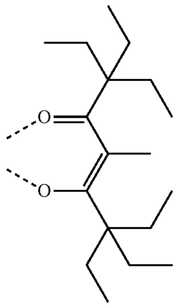
$L_{c36}$
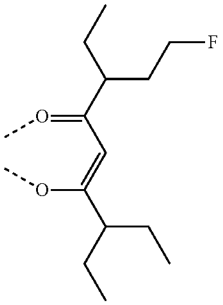
$L_{c37}$
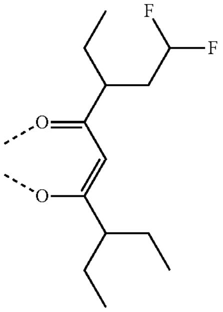
$L_{c38}$
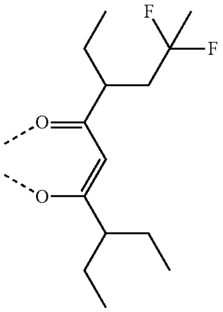
-continued
$L_{c39}$
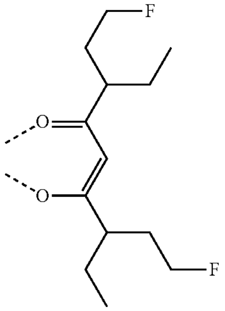
$L_{c40}$
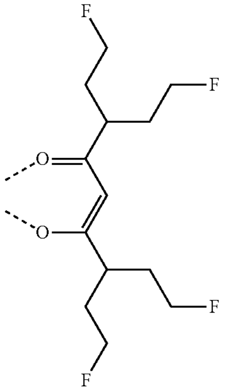
$L_{c41}$
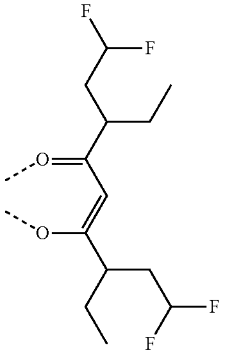
$L_{c42}$
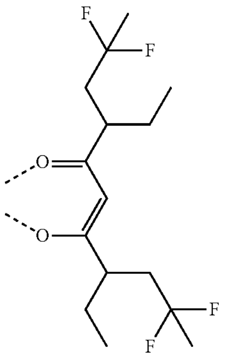
$L_{c43}$
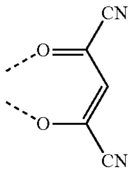

-continued

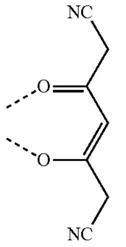

$L_{c44}$

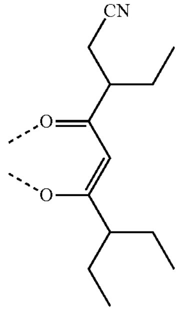

$L_{c45}$

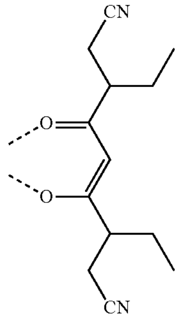

$L_{c46}$

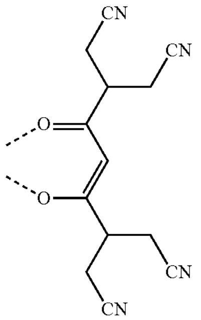

$L_{c47}$

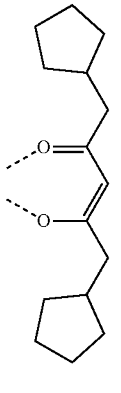

$L_{c48}$

-continued

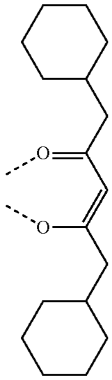

$L_{c49}$

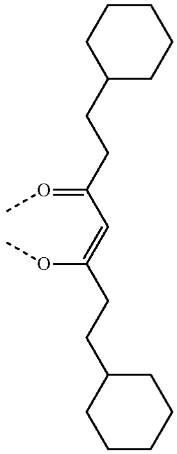

$L_{c50}$.

According to an embodiment of the present disclosure, the metal complex has a structure of $Ir(L_a)_3$, $IrL_a(L_b)_2$, $Ir(L_a)_2L_b$, $Ir(L_a)_2L_c$, $IrL_a(L_c)_2$ or $IrL_aL_bL_c$, wherein the ligand $L_a$ is, at each occurrence identically or differently, selected from any one, any two or any three of the group consisting of $L_{a1}$ to $L_{a3530}$, the ligand $L_b$ is, at each occurrence identically or differently, selected from any one or any two of the group consisting of $L_{b1}$ to $L_{b151}$, and the ligand $L_c$ is, at each occurrence identically or differently, selected from any one or any two of the group consisting of $L_{c1}$ to $L_{c50}$.

According to an embodiment of the present disclosure, the metal complex is selected from the group consisting of Metal Complex 1 to Metal Complex 3806, wherein the specific structures of Metal Complex 1 to Metal Complex 3806 are referred to claim 17.

According to an embodiment of the present disclosure, further disclosed is an organic electroluminescent device, which comprises an anode, a cathode and an organic layer disposed between the anode and the cathode, wherein at least one layer of the organic layer comprises the metal complex in any one of the preceding embodiments.

According to an embodiment of the present disclosure, in the organic electroluminescent device, the organic layer comprising the metal complex is a light-emitting layer.

According to an embodiment of the present disclosure, the organic electroluminescent device emits green light.

According to an embodiment of the present disclosure, the organic electroluminescent device emits white light.

According to an embodiment of the present disclosure, in the organic electroluminescent device, the light-emitting layer further comprises a first host compound.

According to an embodiment of the present disclosure, in the organic electroluminescent device, the light-emitting layer further comprises a first host compound and a second host compound.

According to an embodiment of the present disclosure, in the electroluminescent device, the first host compound and/or the second host compound comprise at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene and combinations thereof.

According to an embodiment of the present disclosure, the first host compound has a structure represented by Formula X-1 or Formula X-2:

Formula X-1

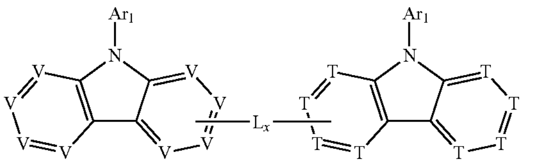

Formula X-2

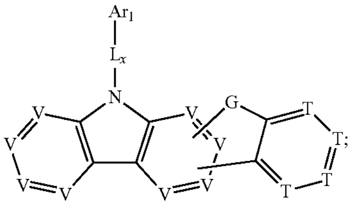

wherein $L_x$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

G is, at each occurrence identically or differently, selected from $C(R_g)_2$, $NR_g$, O or S;

V is, at each occurrence identically or differently, selected from C, $CR_v$ or N;

in Formula X-1, T is, at each occurrence identically or differently, selected from C, $CR_t$ or N;

in Formula X-2, T is, at each occurrence identically or differently, selected from $CR_t$ or N;

$R_g$, $R_v$ and $R_t$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$Ar_1$ is, at each occurrence identically or differently, selected from substituted or unsubstituted aryl having 6 to 30 carbon atoms, substituted or unsubstituted heteroaryl having 3 to 30 carbon atoms or a combination thereof; and adjacent substituents $R_g$, $R_v$ and $R_t$ can be optionally joined to form a ring.

In this embodiment, the expression that "adjacent substituents $R_g$, $R_v$ and $R_t$ can be optionally joined to form a ring" is intended to mean that any one or more of groups of adjacent substituents, such as two substituents $R_v$, two substituents $R_t$, two substituents $R_g$, substituents $R_v$ and $R_t$, substituents $R_v$ and $R_g$, and substituents $R_g$ and $R_t$, can be joined to form a ring. Obviously, it is also possible that none of these substituents are joined to form a ring.

According to an embodiment of the present disclosure, the first host compound has a structure represented by one of Formula X-a to Formula X-p:

X-a

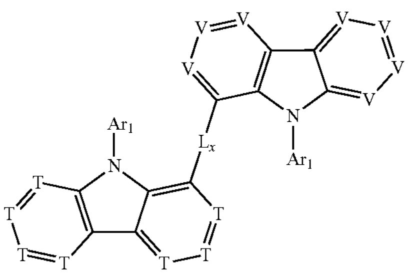

X-b

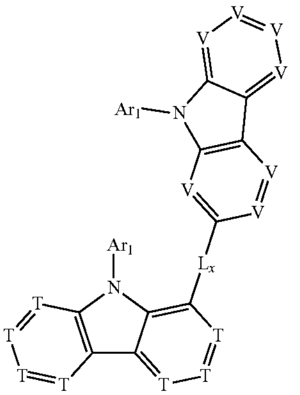

-continued
X-c
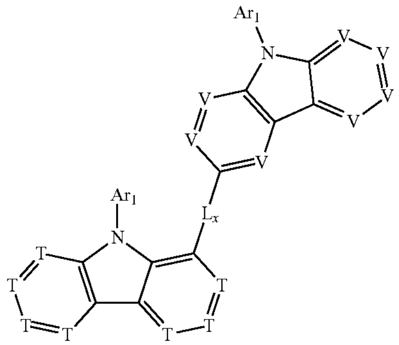
X-d
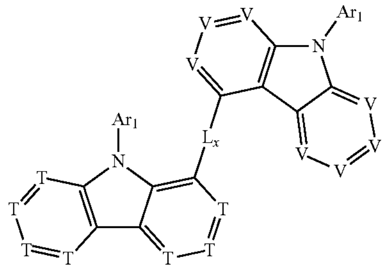
X-e
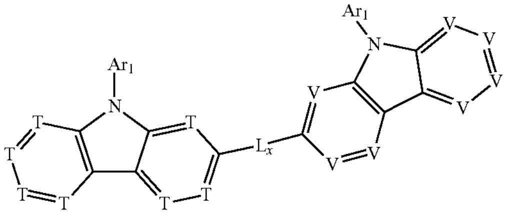
X-f
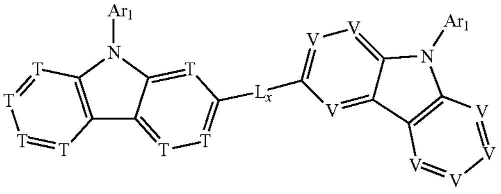
X-g
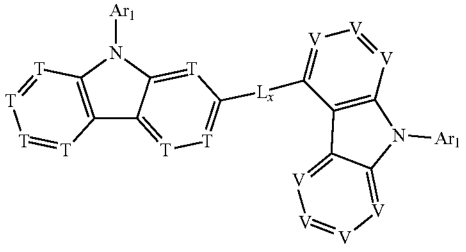
-continued
X-h
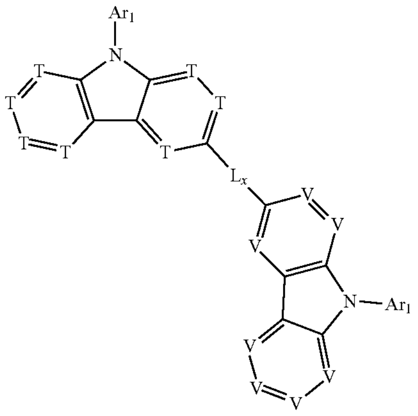
X-i
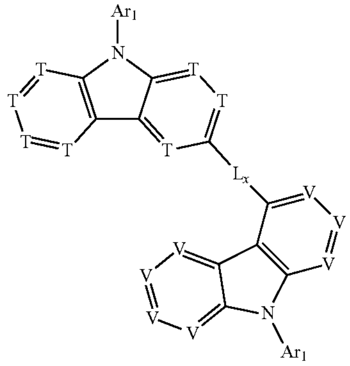
X-j
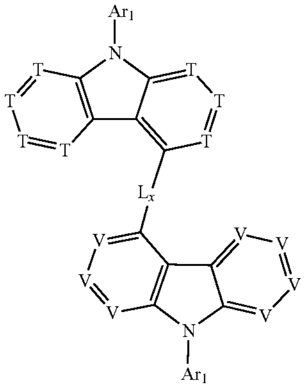
X-k
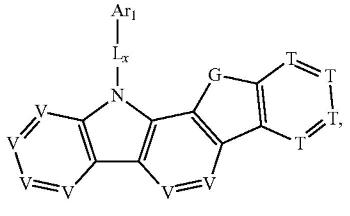
X-l
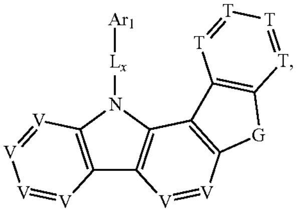

-continued

X-m

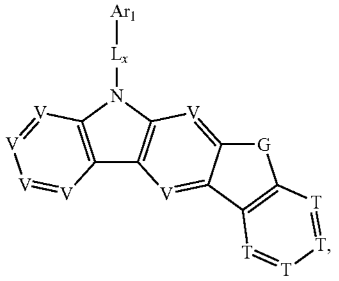

X-n

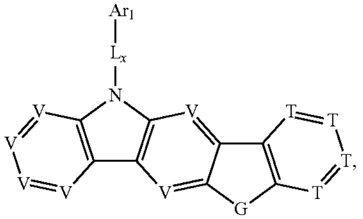

X-o

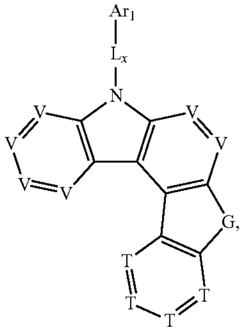

X-p

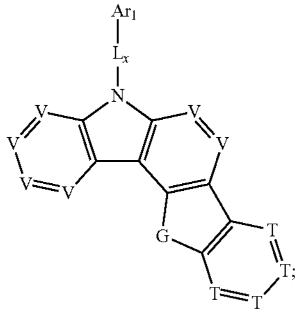

wherein $L_x$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

G is, at each occurrence identically or differently, selected from $C(R_g)_2$, $NR_g$, O or S;

V is, at each occurrence identically or differently, selected from CR, or N;

T is, at each occurrence identically or differently, selected from $CR_t$ or N;

$R_g$, $R_v$ and $R_t$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$Ar_1$ is, at each occurrence identically or differently, selected from substituted or unsubstituted aryl having 6 to 30 carbon atoms, substituted or unsubstituted heteroaryl having 3 to 30 carbon atoms or a combination thereof; and adjacent substituents $R_g$, $R_v$ and $R_t$ can be optionally joined to form a ring.

According to an embodiment of the present disclosure, the first host compound is selected from the group consisting of the following compounds:

PH-1

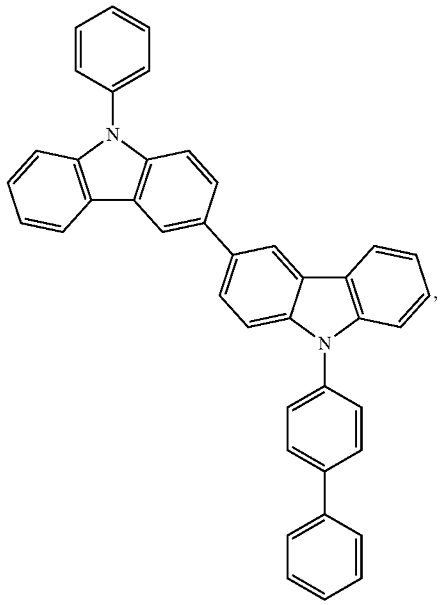

-continued
PH-2
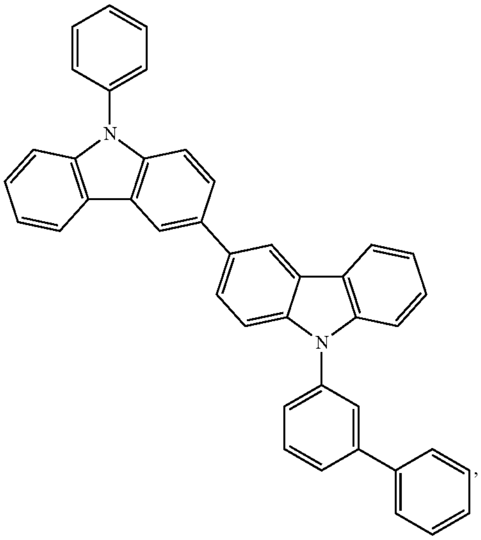
,
PH-3
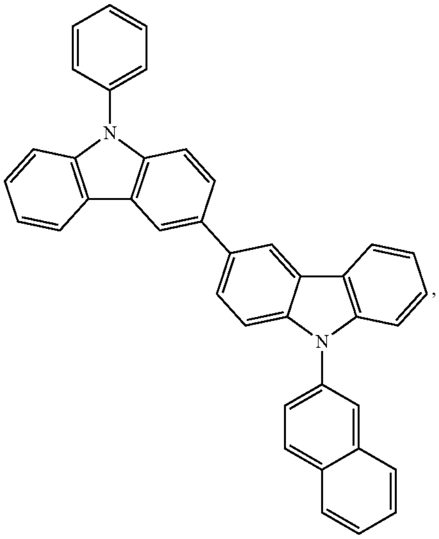
,
PH-4
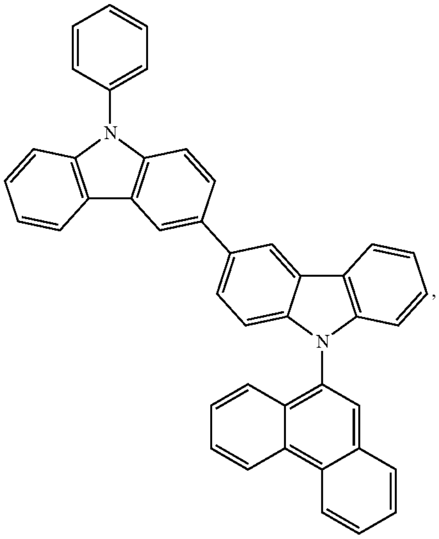
,
-continued
PH-5
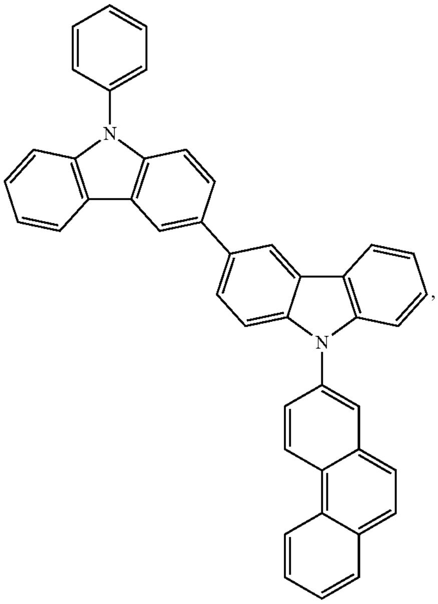
,
PH-6
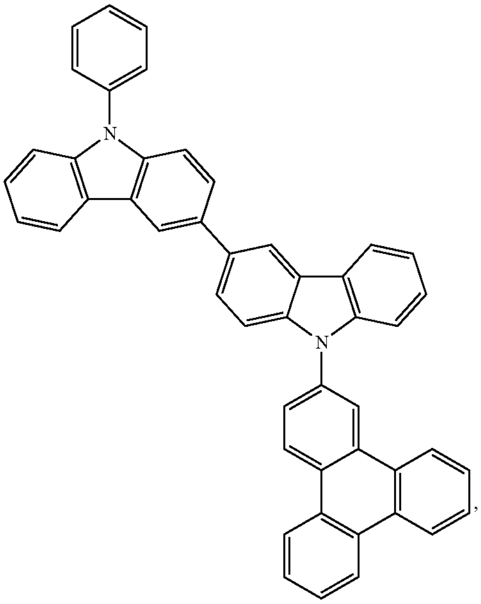
, -continued
PH-7
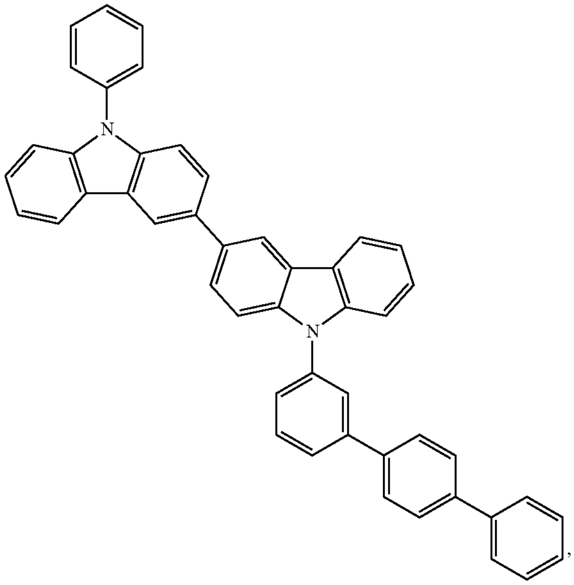
,
-continued
PH-9
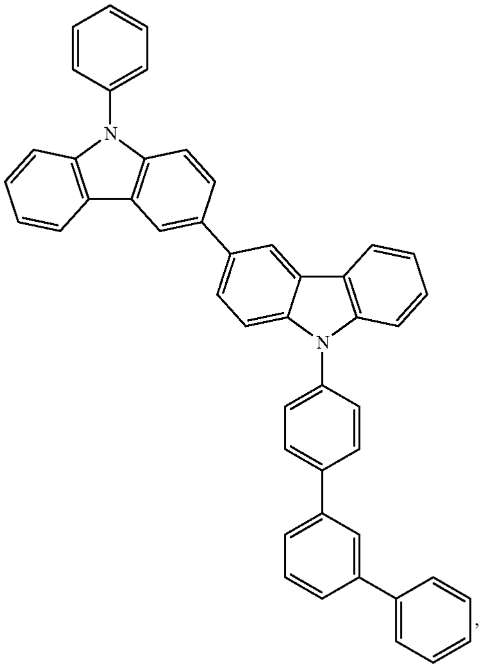
,
PH-8
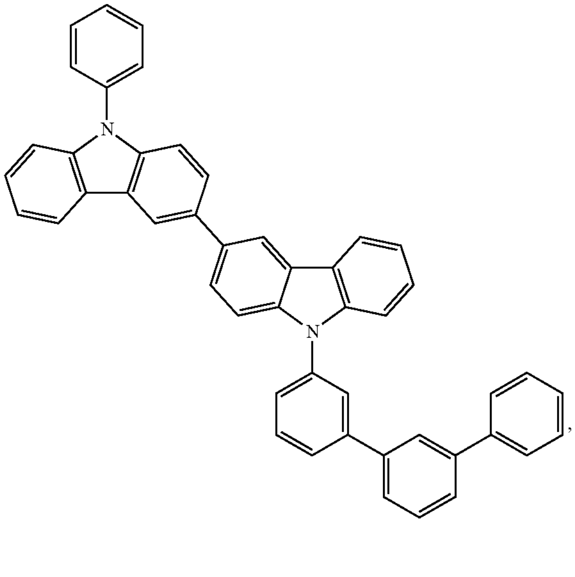
,
PH-10
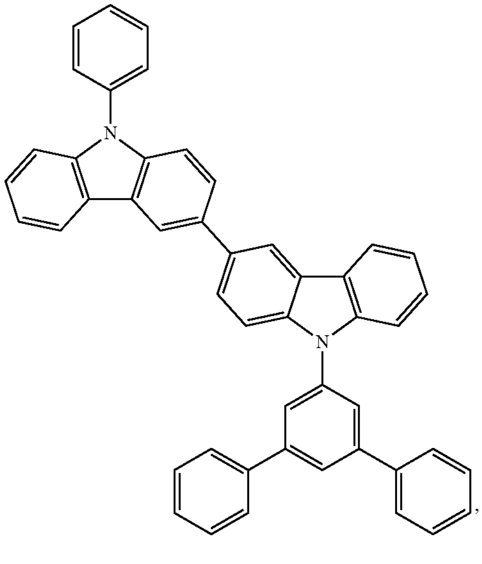
, -continued
PH-11
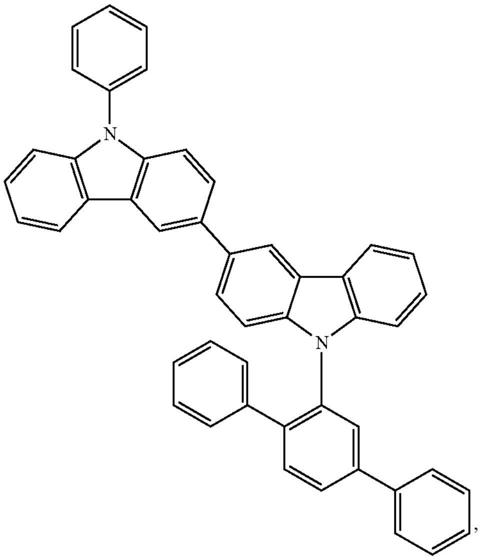
,
PH-12
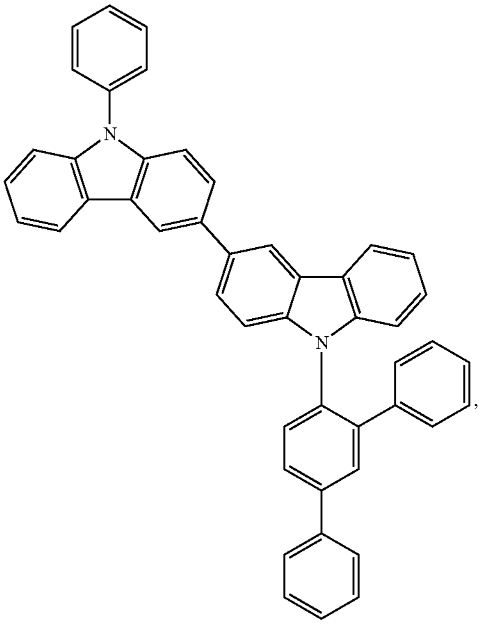
,
-continued
PH-13
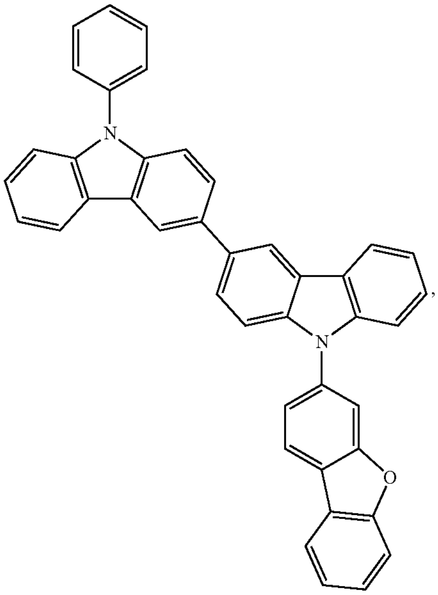
,
PH-14
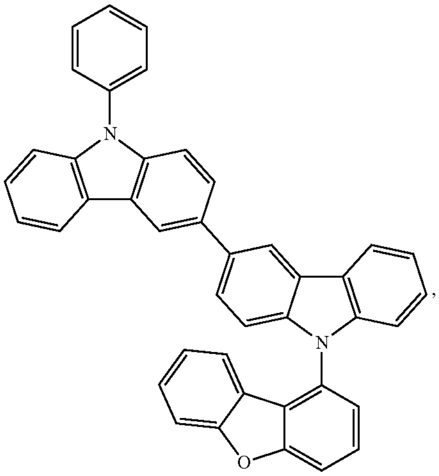
,
PH-15
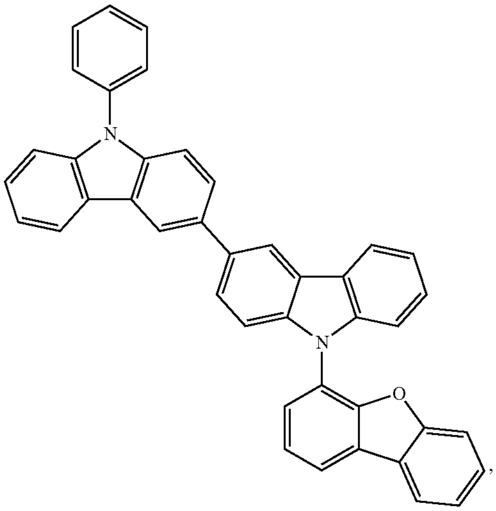
, -continued
PH-16
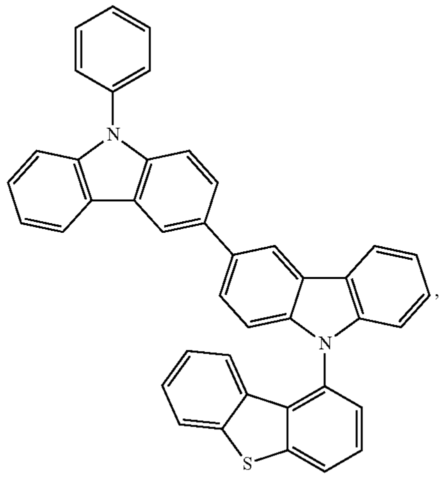
,
PH-17
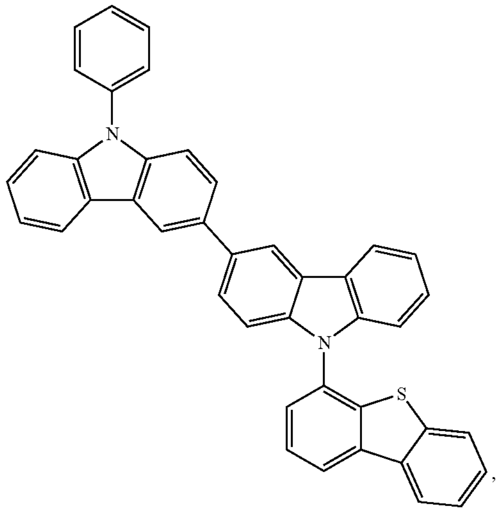
,
PH-18
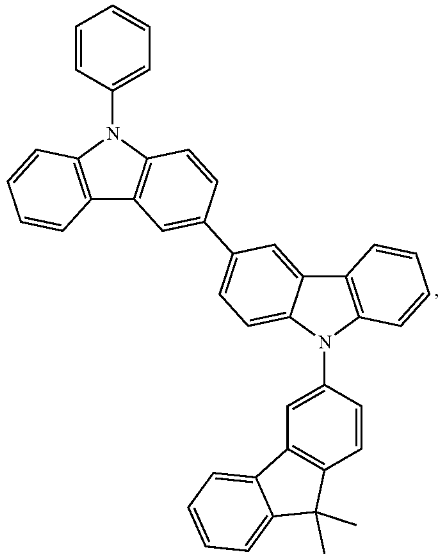
,
-continued
PH-19
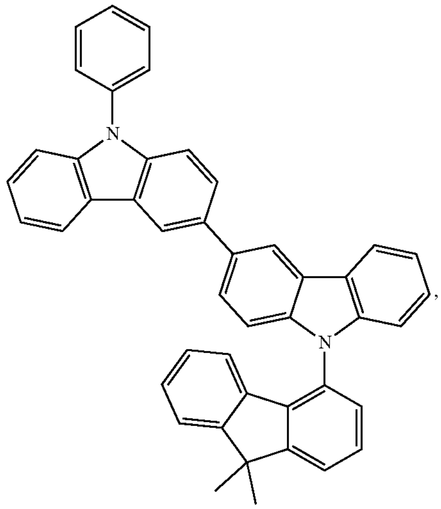
,
PH-20
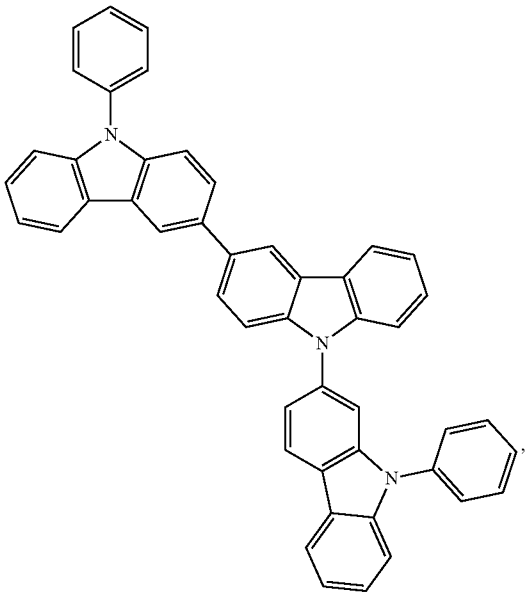
, -continued
PH-21
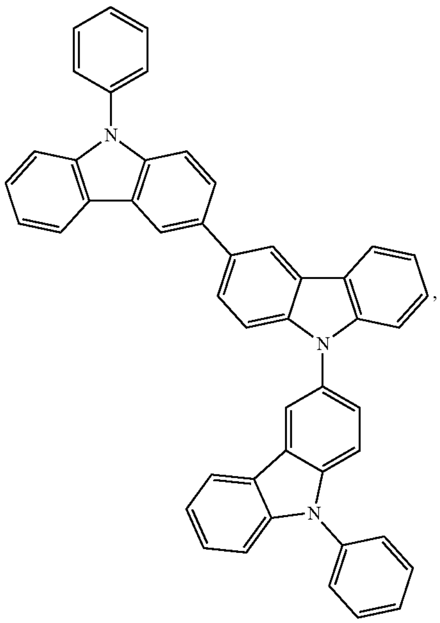
,
PH-22
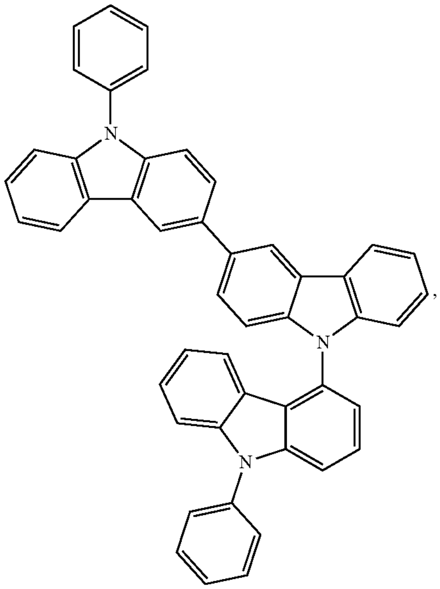
,
-continued
PH-23
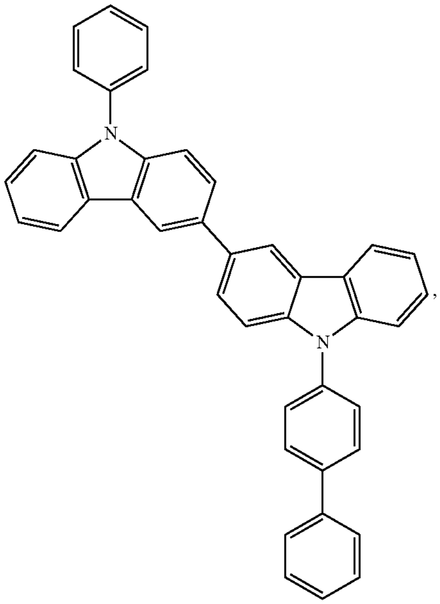
,
PH-24
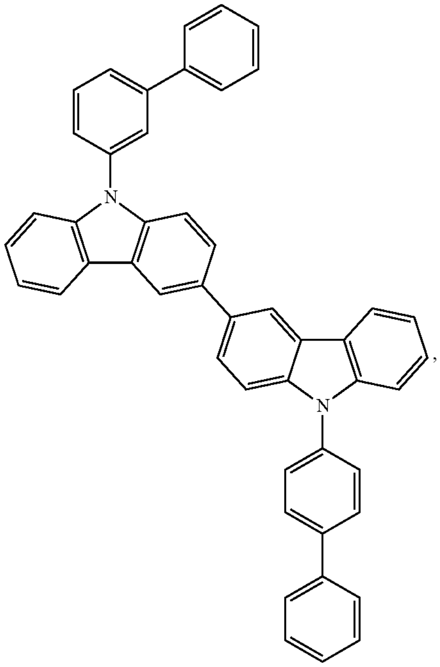
, PH-25
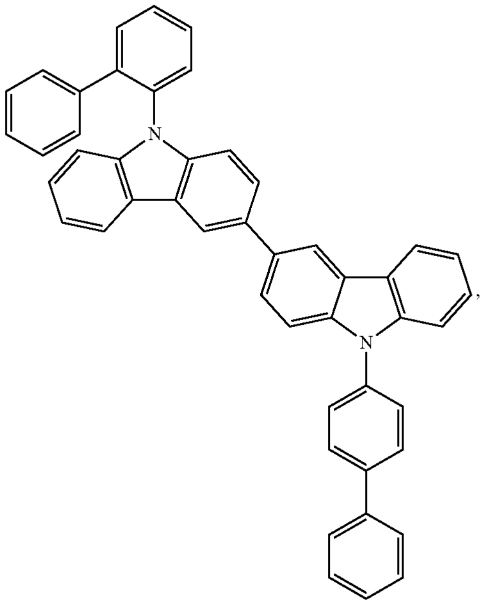
PH-26
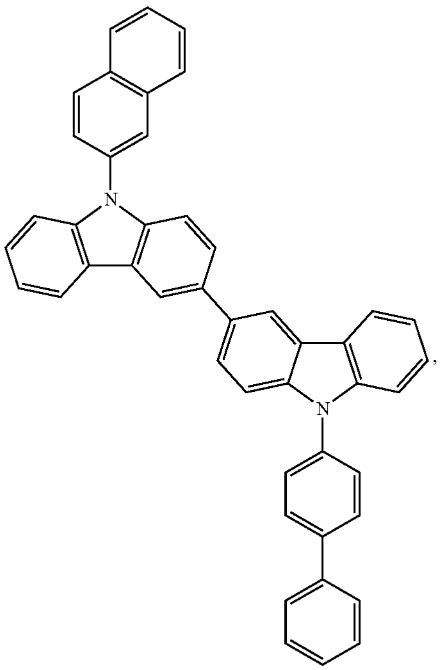
PH-27
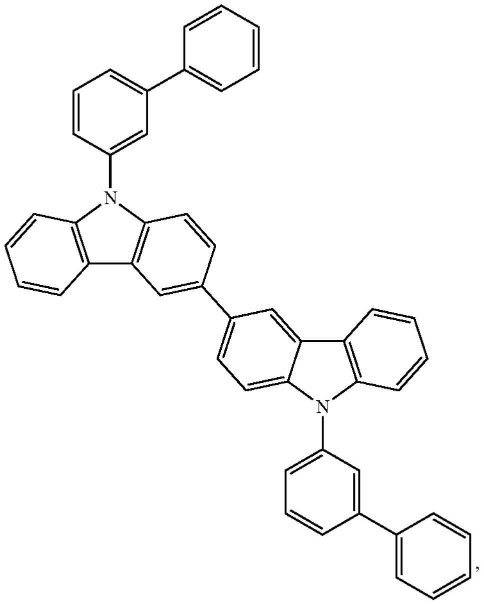
PH-28
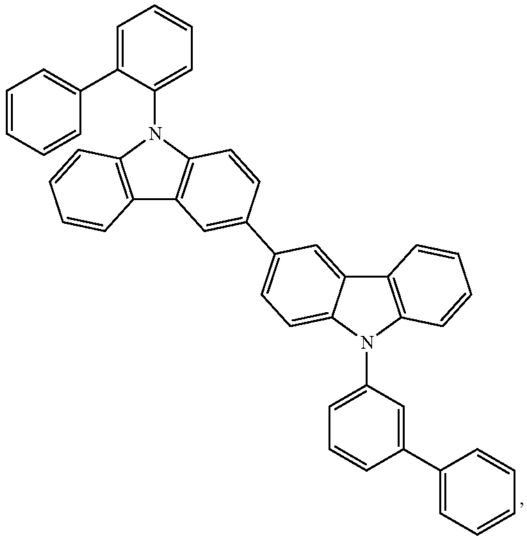

-continued
PH-29
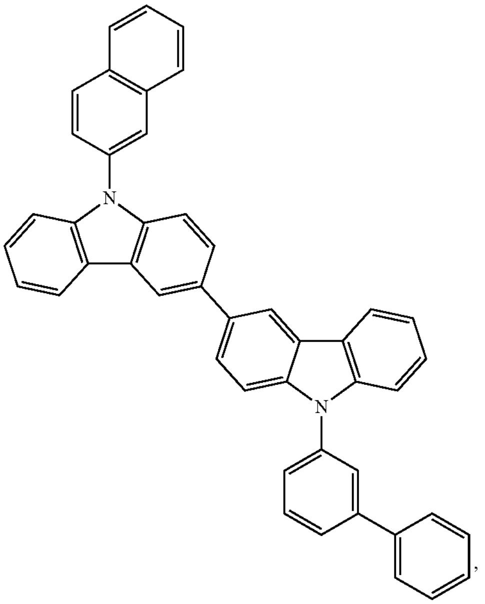
PH-30
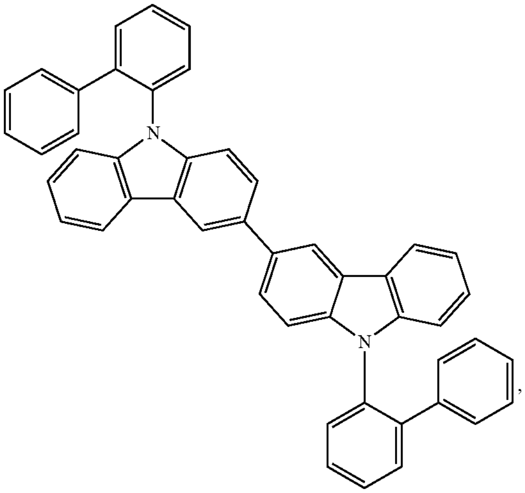
-continued
PH-31
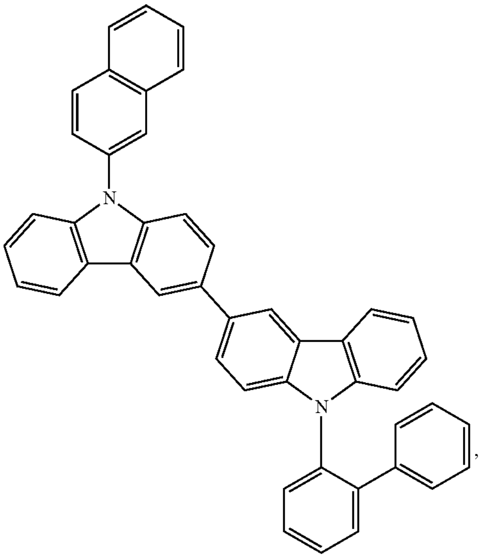
PH-32
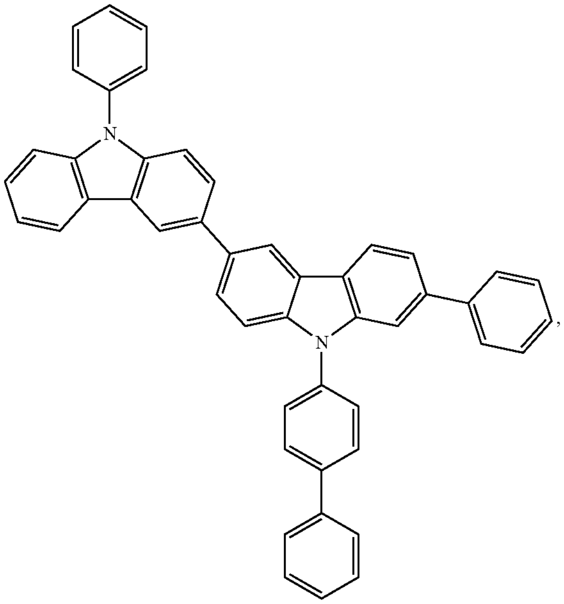

-continued
PH-33
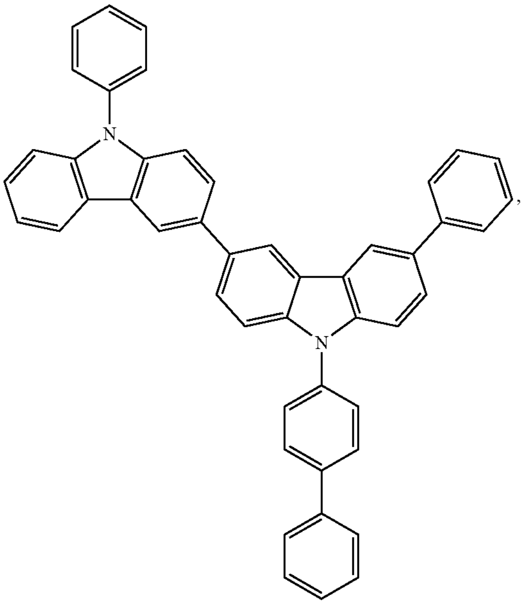
,
PH-34
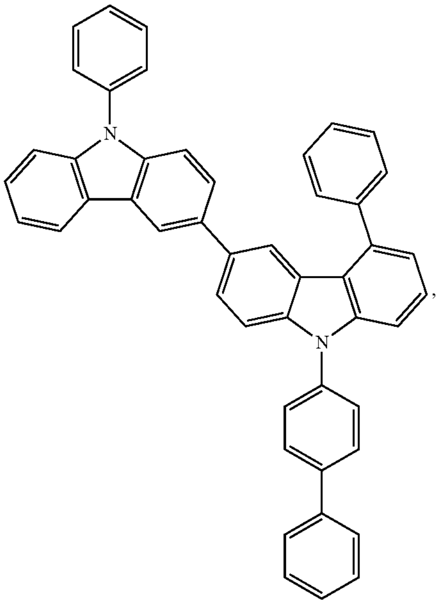
,
-continued
PH-35
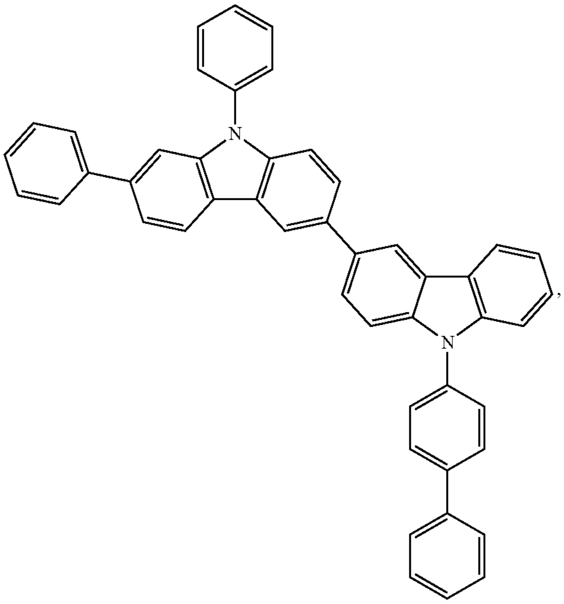
,
PH-36
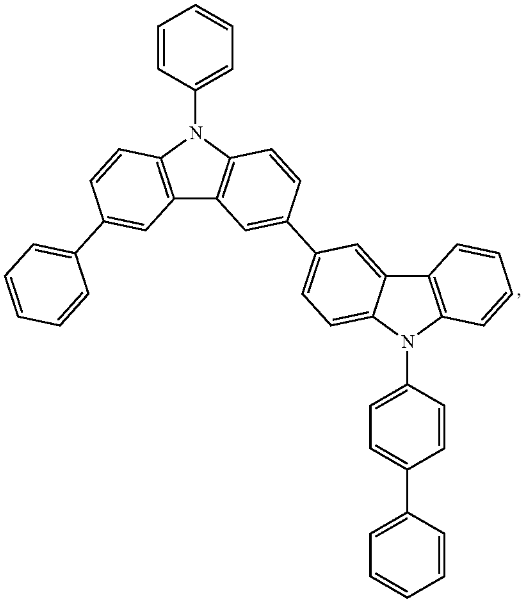
, -continued
PH-37
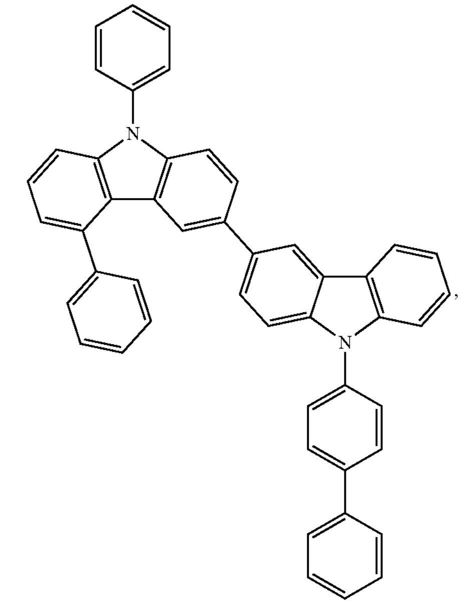
PH-38
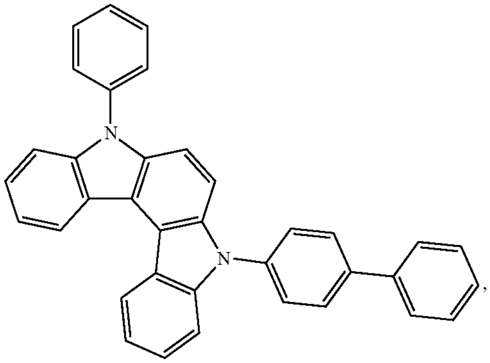
PH-39
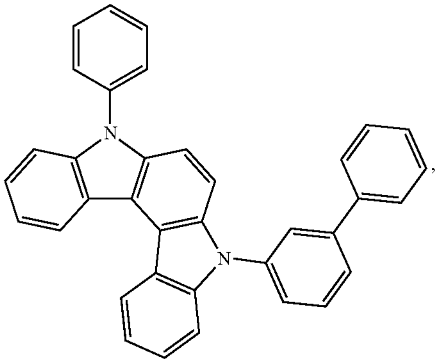
-continued
PH-40
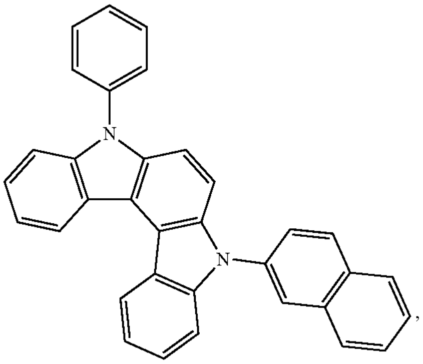
PH-41
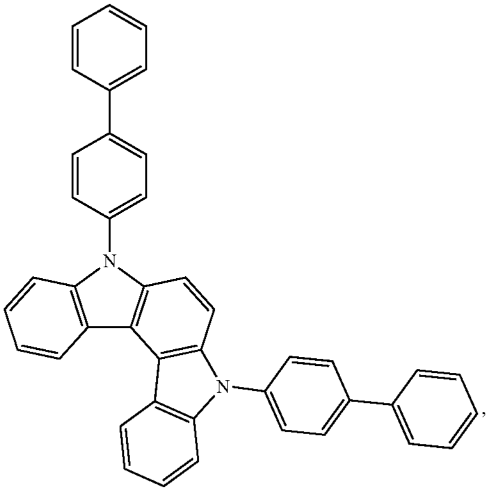
PH-42
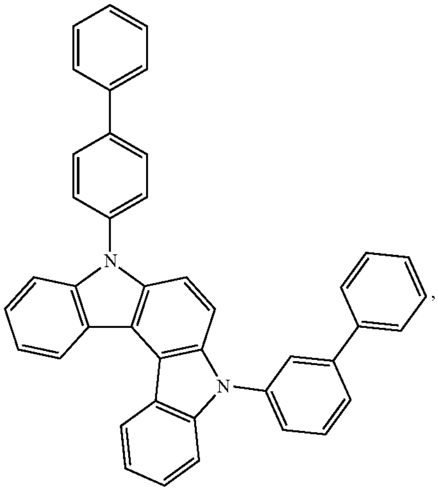

-continued
PH-43
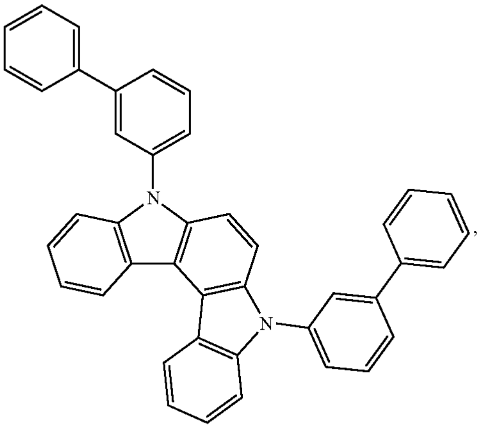
PH-44
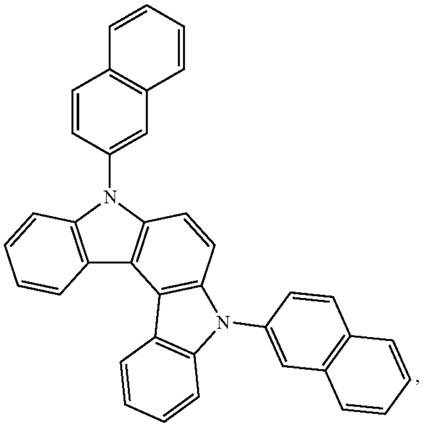
PH-45
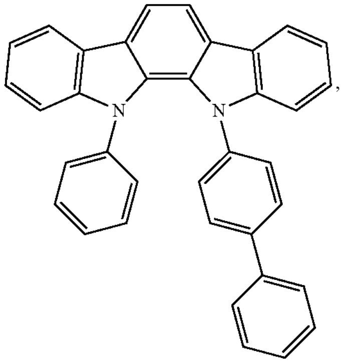
PH-46
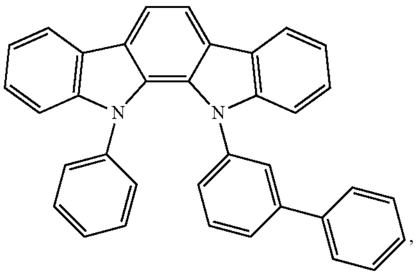
-continued
PH-47
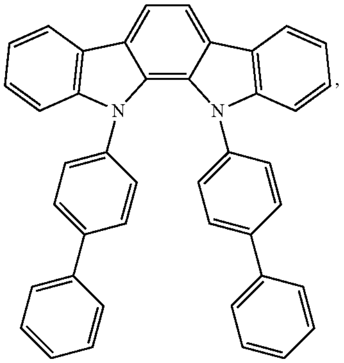
PH-48
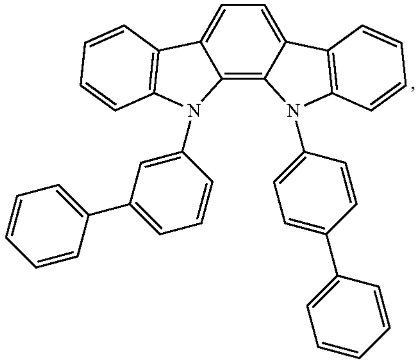
PH-45
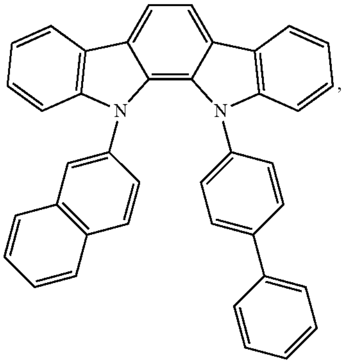
PH-45
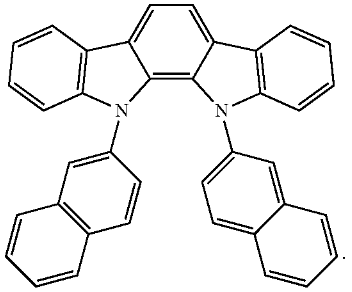
According to an embodiment of the present disclosure, wherein the second host compound has a structure represented by Formula 5:

Formula 5

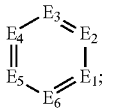

wherein $E_1$ to $E_6$ are, at each occurrence identically or differently, selected from C, $CR_e$ or N, at least two of $E_1$ to $E_6$ are N, and at least one of $E_1$ to $E_6$ is C and is attached to Formula A:

Formula A

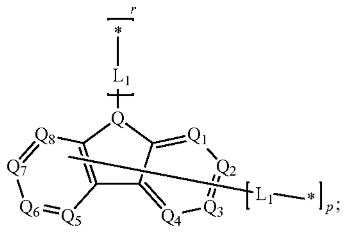

wherein,

Q is, at each occurrence identically or differently, selected from the group consisting of O, S, Se, N, $NR_Q$, $CR_QR_Q$, $SiR_QR_Q$, $GeR_QR_Q$, and $R_QC{=}CR_Q$; when two $R_Q$ are present, the two $R_Q$ can be the same or different;

p is 0 or 1; r is 0 or 1;

when Q is selected from N, p is 0, and r is 1;

when Q is selected from the group consisting of O, S, Se, $NR_Q$, $CR_QR_Q$, $SiR_QR_Q$, $GeR_QR_Q$, and $R_QC{=}CR_Q$, p is 1, and r is 0;

$L_1$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or combinations thereof;

$Q_1$ to $Q_8$ are, at each occurrence identically or differently, selected from C, $CR_q$ or N;

$R_e$, $R_Q$, and $R_q$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a substituted or unsubstituted alkylgermanyl having 3 to 20 carbon atoms, a substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

"*" represents a position where Formula A is attached to Formula 5;

adjacent substituents $R_e$, $R_Q$, $R_q$ can be optionally joined to form a ring.

Herein, the expression that "adjacent substituents $R_e$, $R_Q$, $R_q$ can be optionally joined to form a ring" is intended to mean that any one or more of groups of adjacent substituents, such as two substituents $R_e$, two substituents $R_Q$, two substituents $R_q$, and substituents $R_Q$ and $R_q$, can be joined to form a ring. Obviously, it is also possible that none of these substituents are joined to form a ring.

According to an embodiment of the present disclosure, the second host compound is selected from the group consisting of the following compounds:

H-1

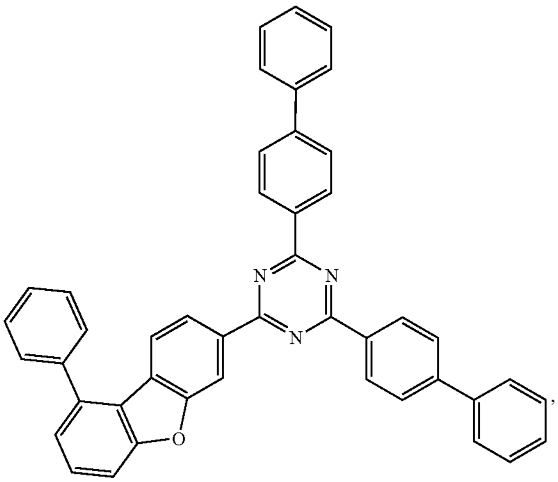

,

H-2

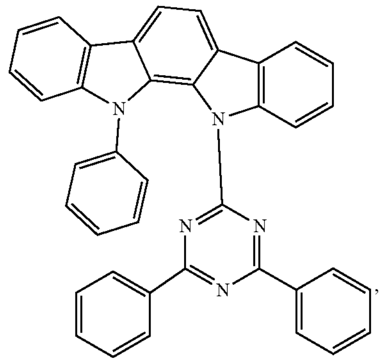

,

-continued
H-3
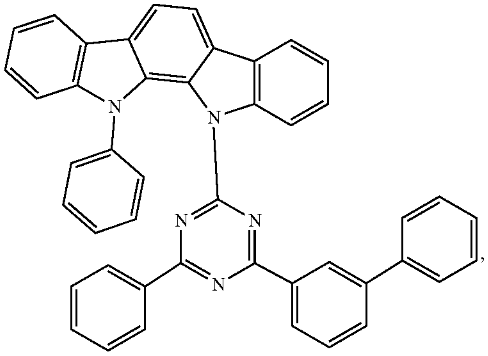
,
H-4
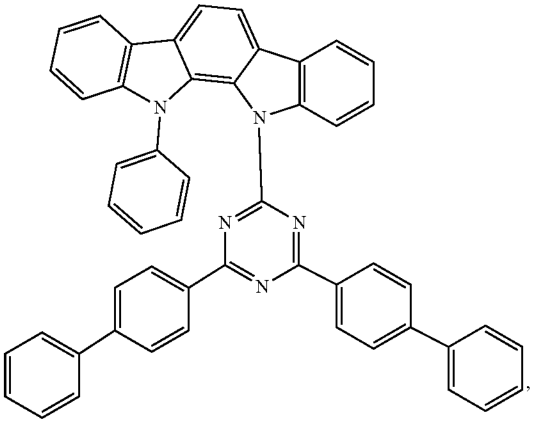
,
H-5
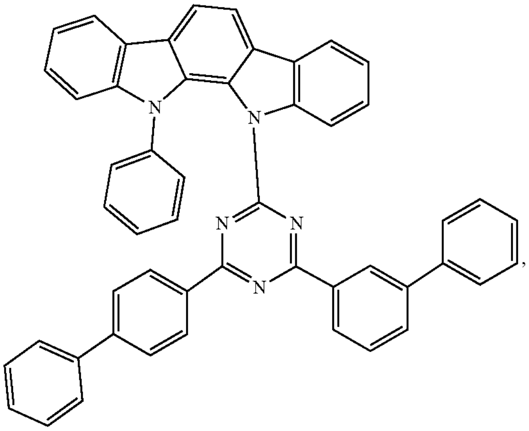
,
-continued
H-6
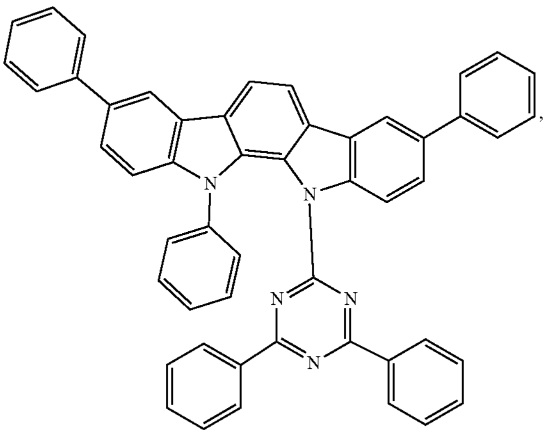
,
H-7
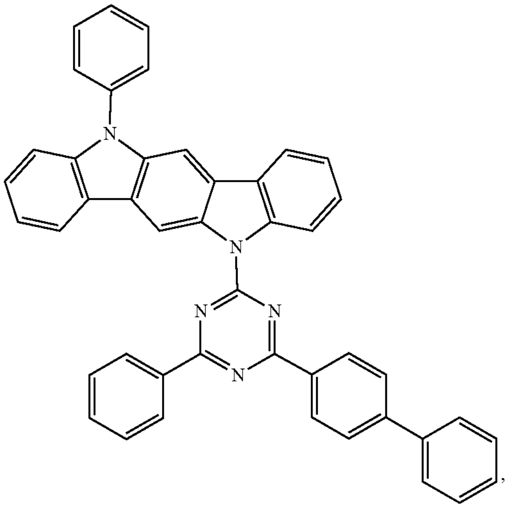
,
H-8
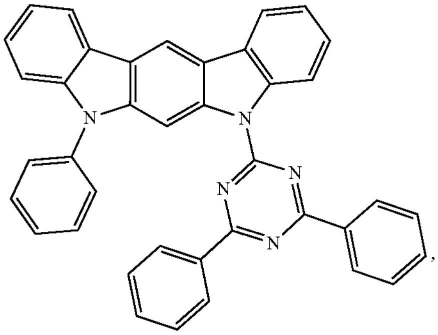
, -continued
H-9
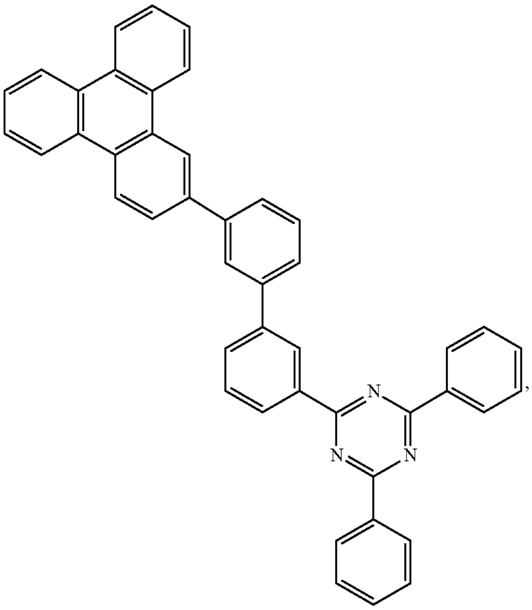
,
H-10
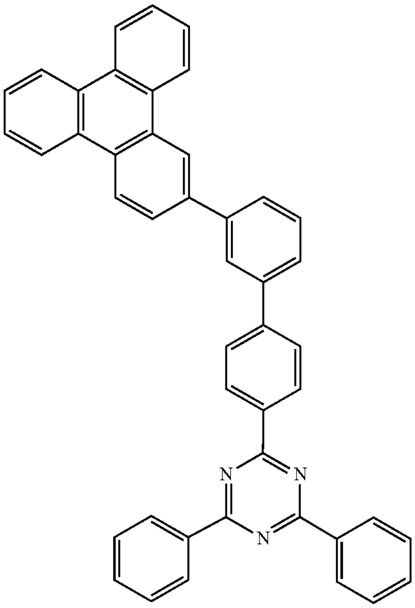
,
H-11
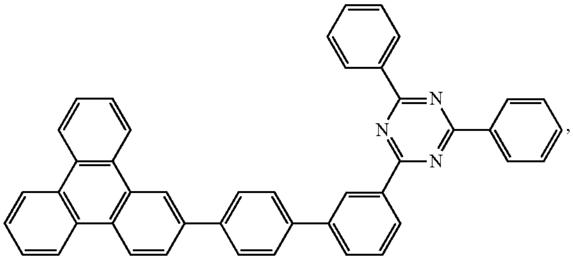
,
-continued
H-12
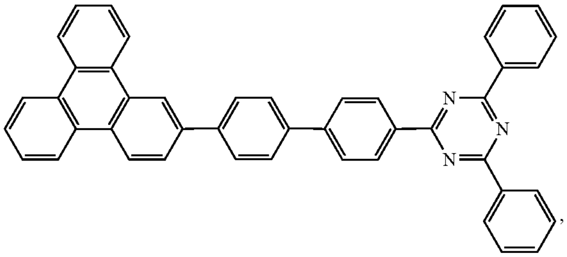
,
H-13
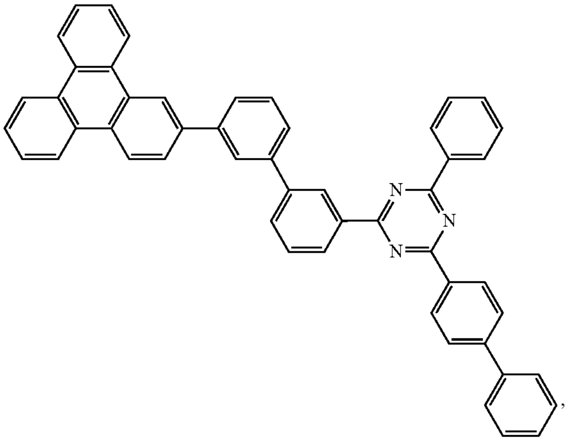
,
H-14
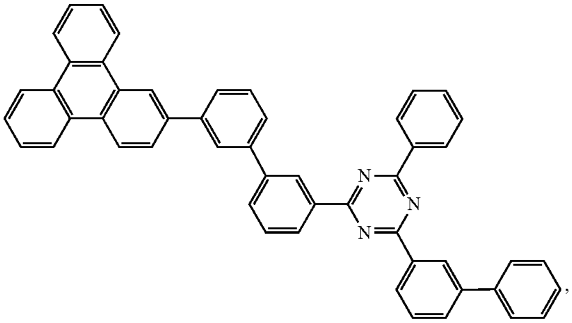
,
H-15
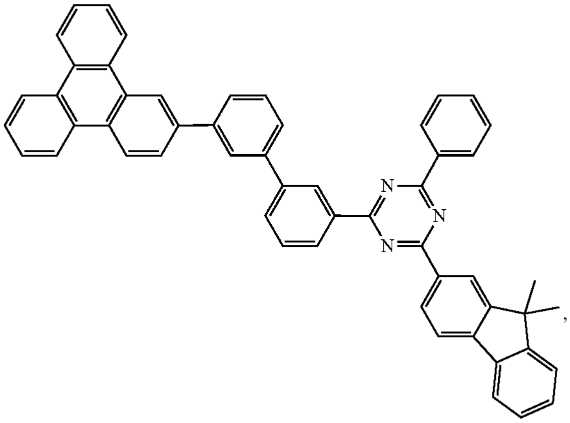
, -continued
H-16
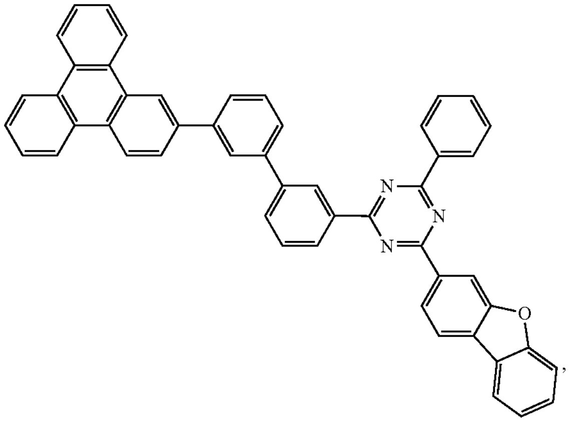
H-17
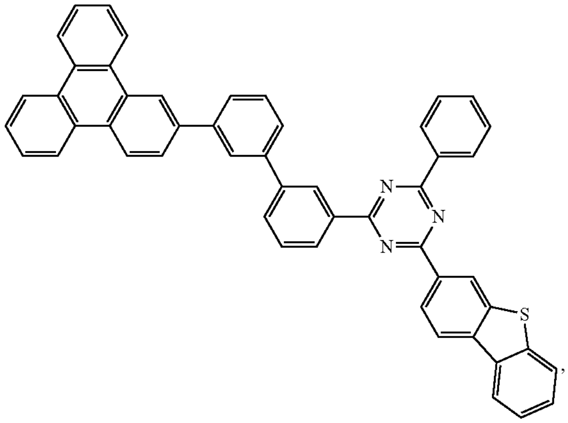
H-18
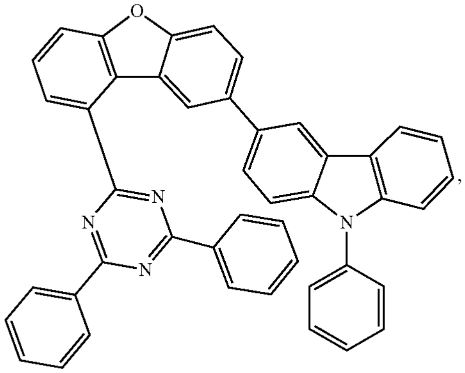
-continued
H-19
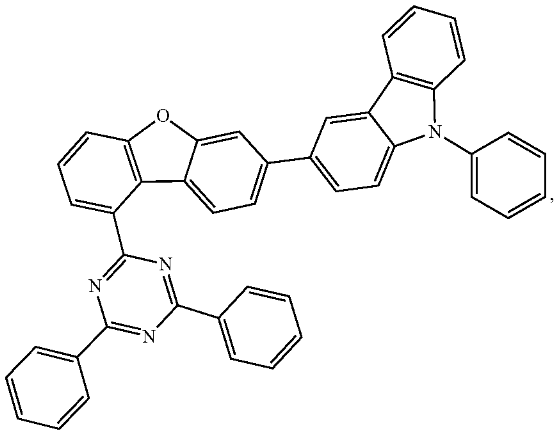
H-20
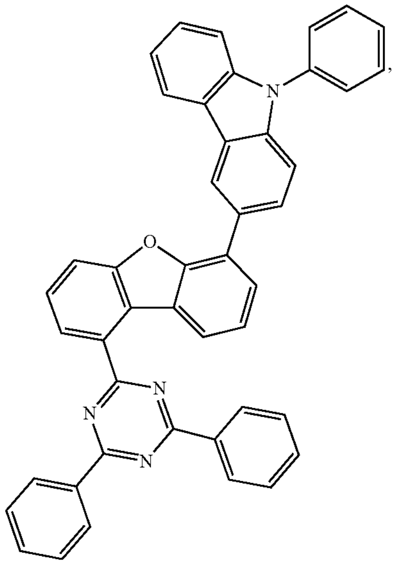
H-21
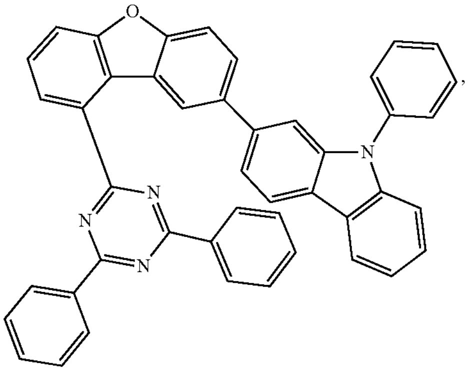

-continued
H-22
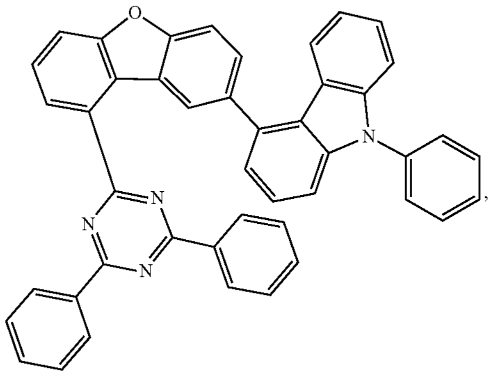
,
H-23
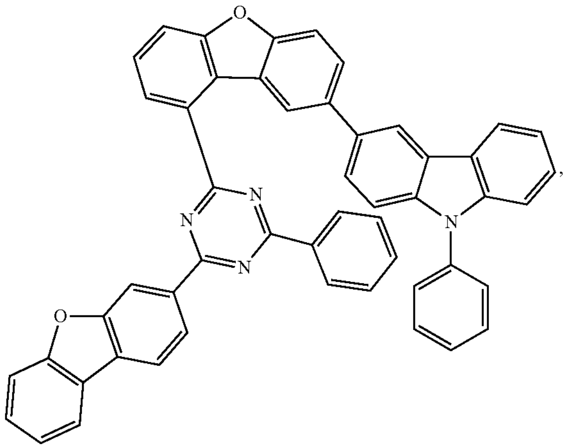
,
H-24
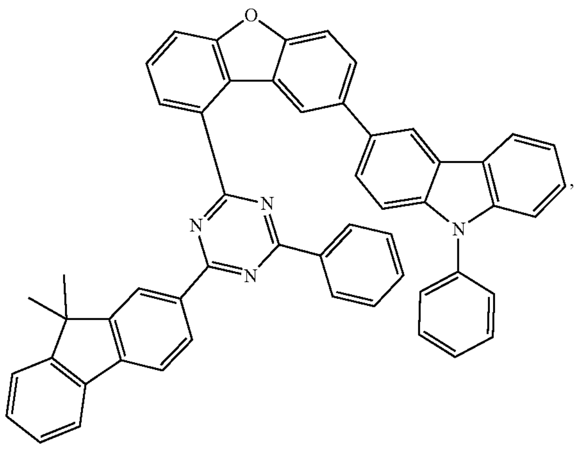
,
-continued
H-25
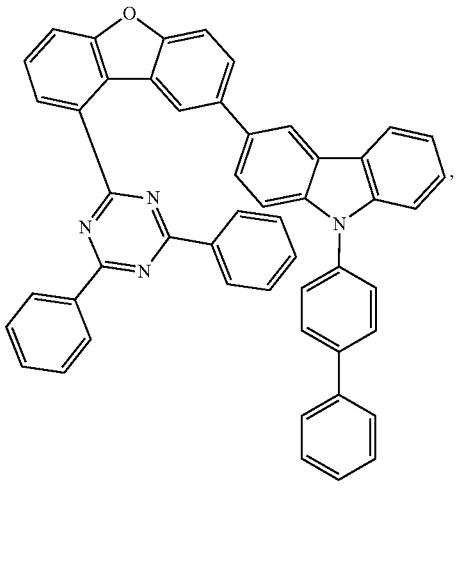
,
H-26
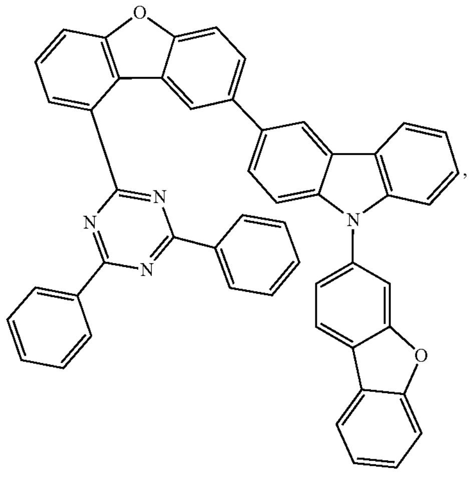
,
H-27
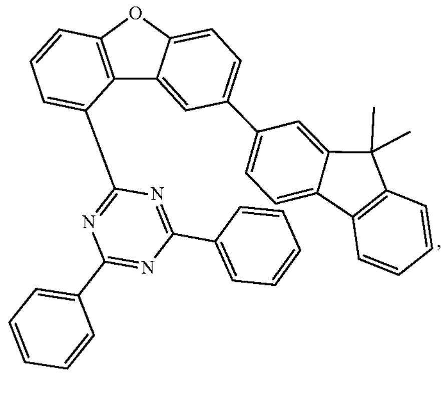
, -continued
H-28
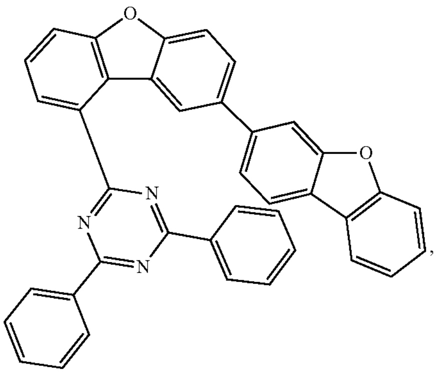
,
H-29
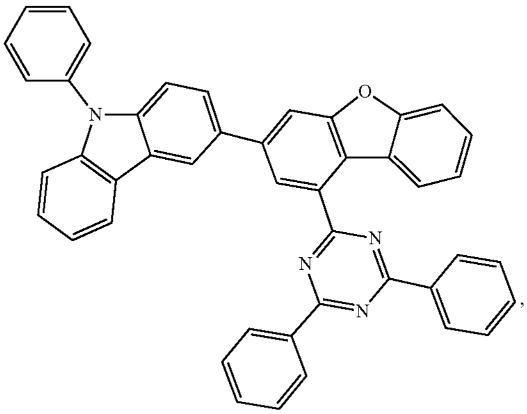
,
H-30
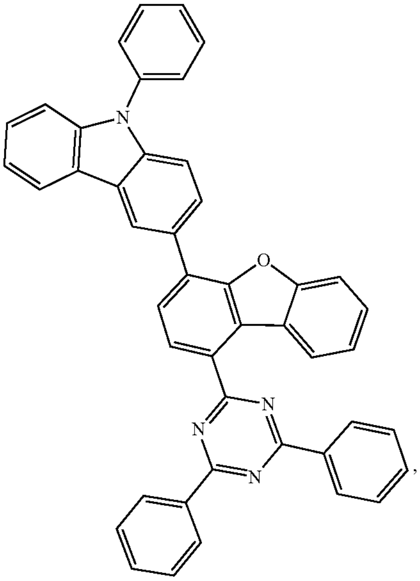
,
-continued
H-31
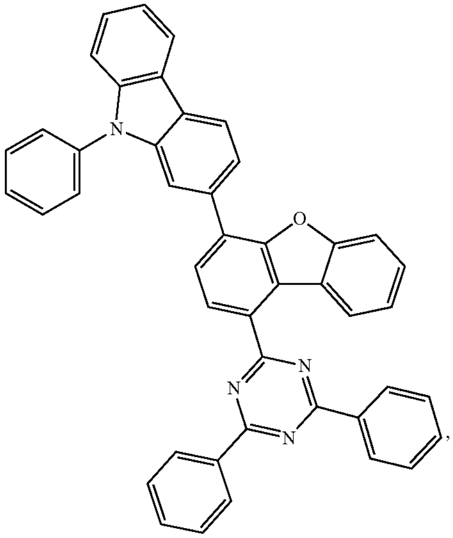
,
H-32
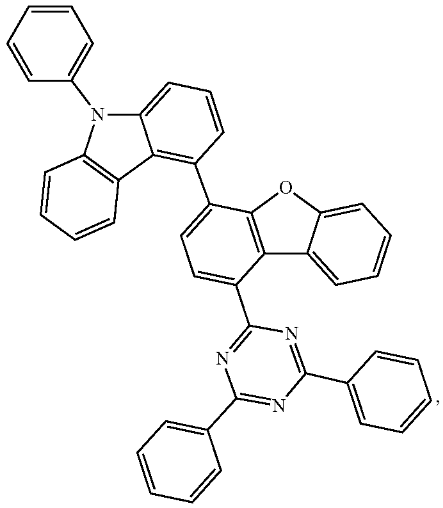
, -continued
H-33
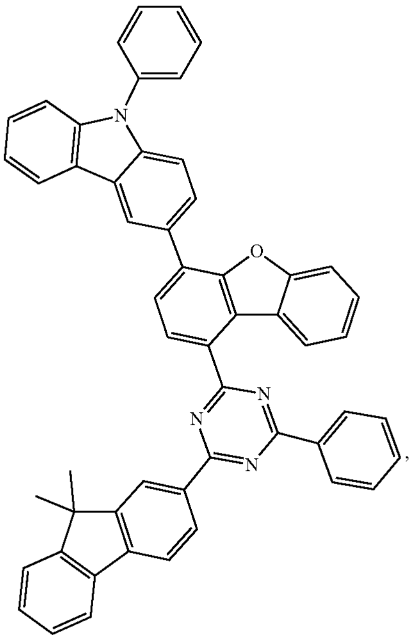
H-34
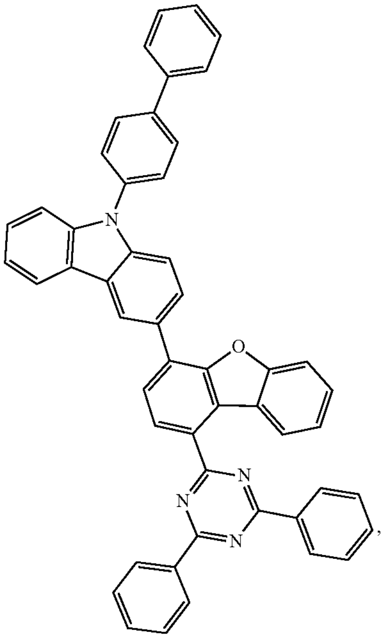
-continued
H-35
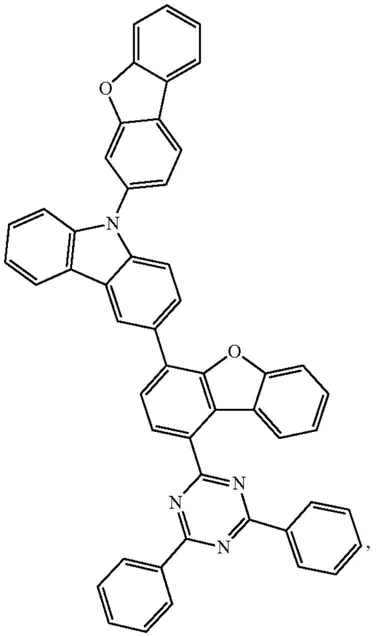
H-36
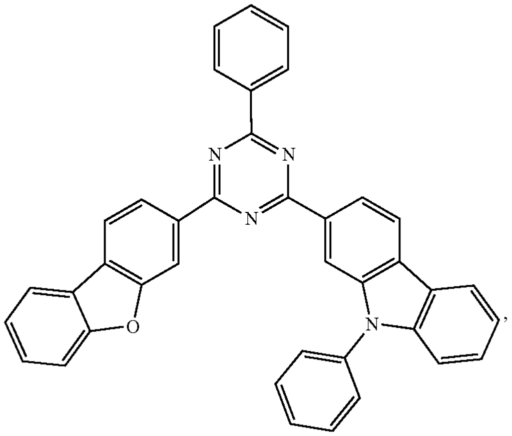
H-37
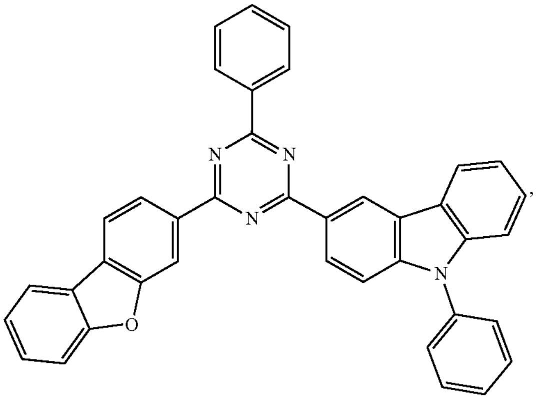

-continued
H-38
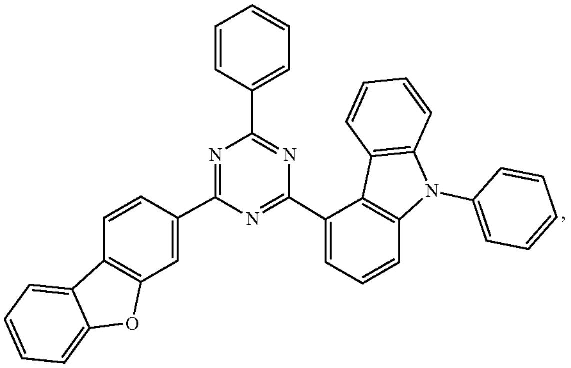
H-39
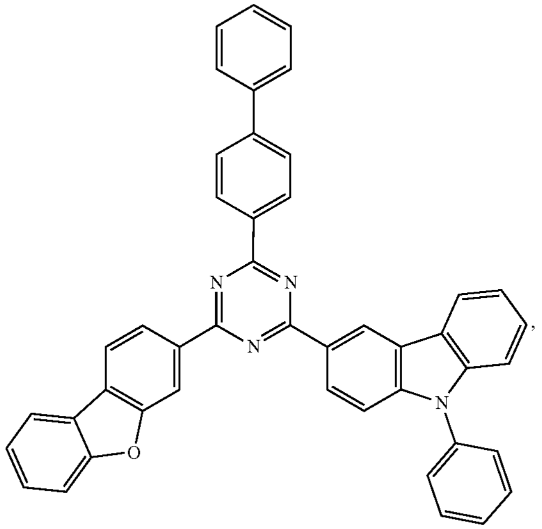
H-40
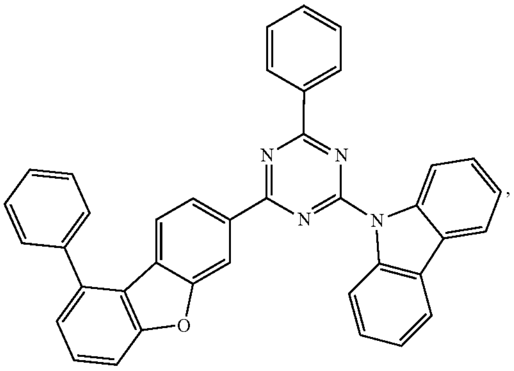
-continued
H-41
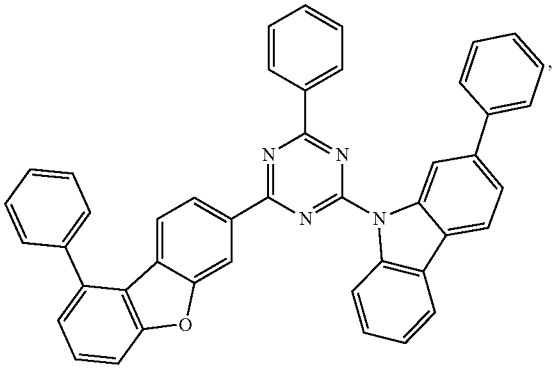
H-42
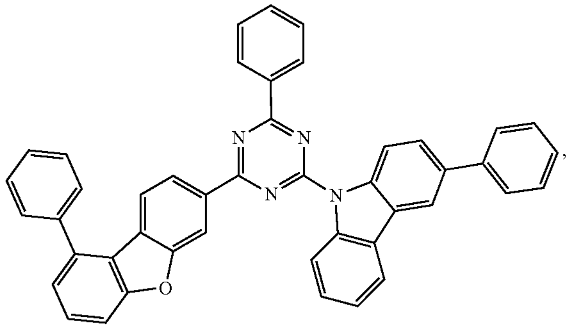
H-43
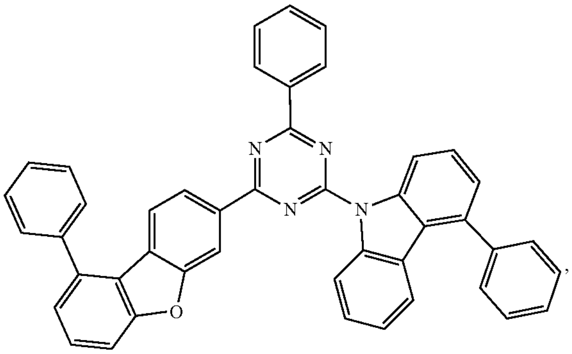
H-44
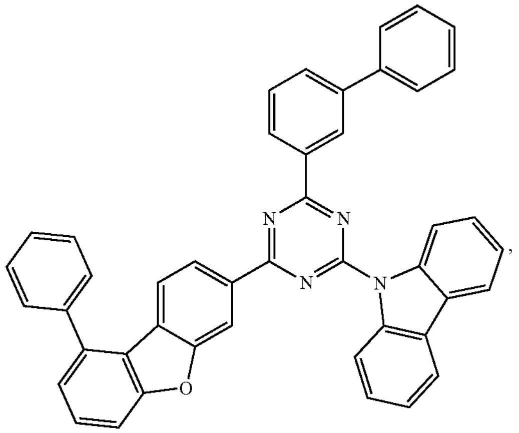

-continued
H-45
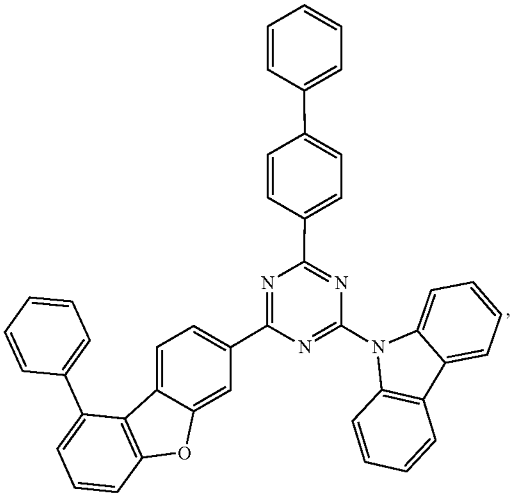
,
H-46
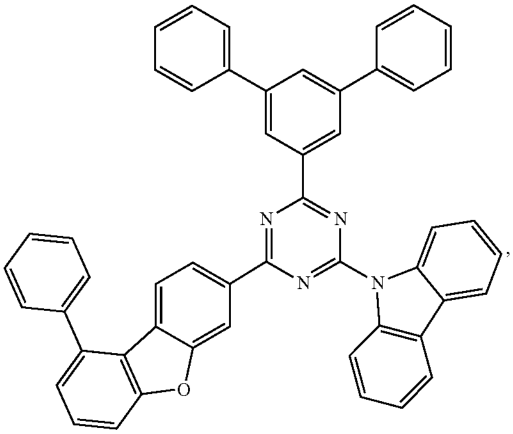
,
H-47
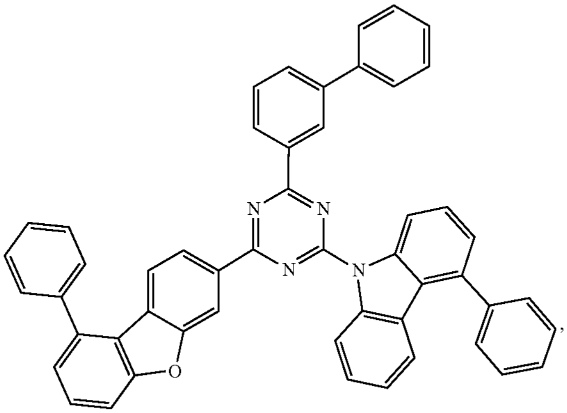
,
-continued
H-48
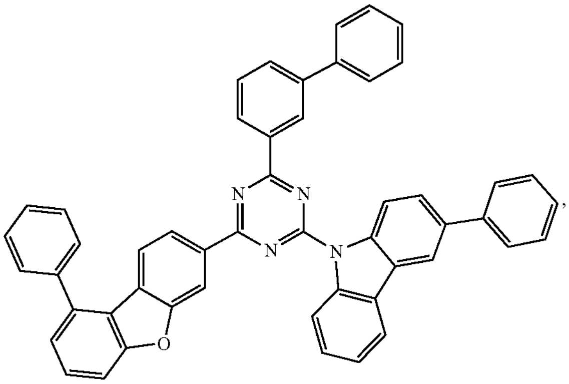
,
H-49
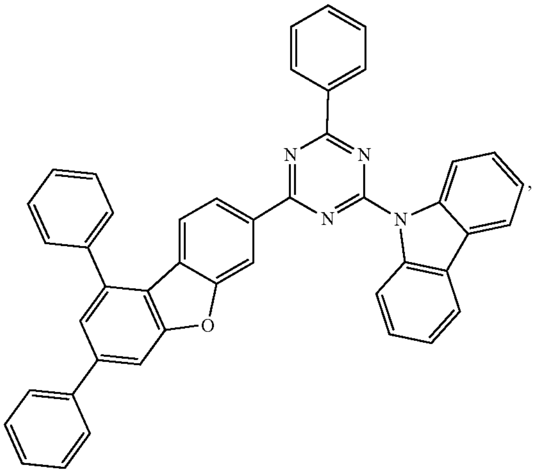
,
H-50
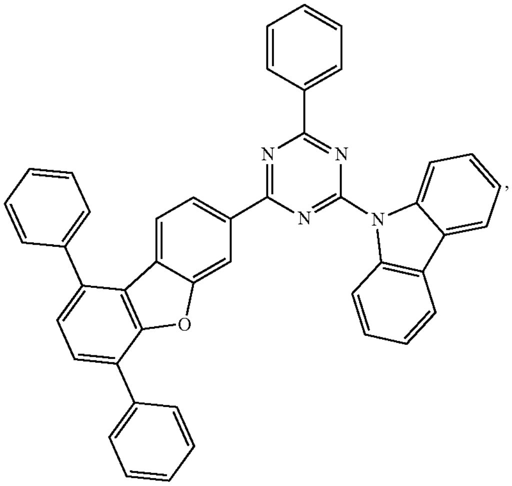
, -continued
H-51
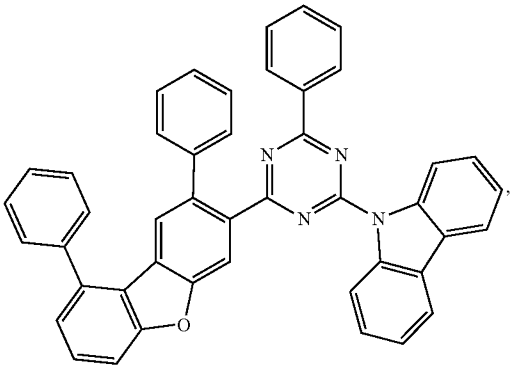
H-52
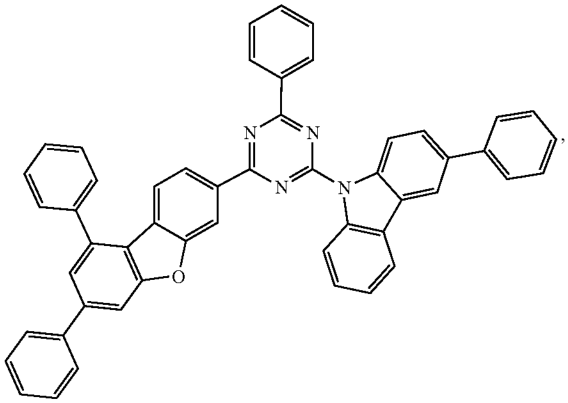
H-53
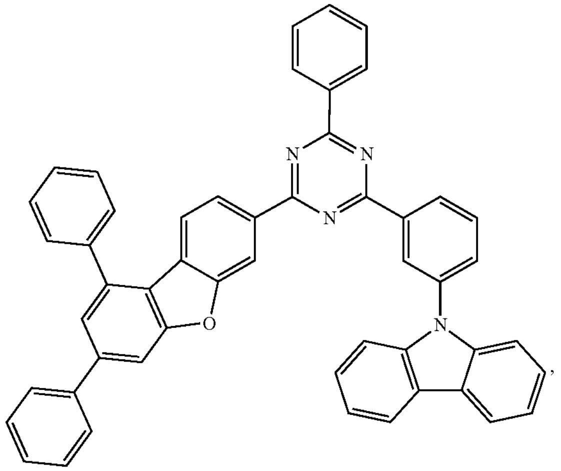
-continued
H-54
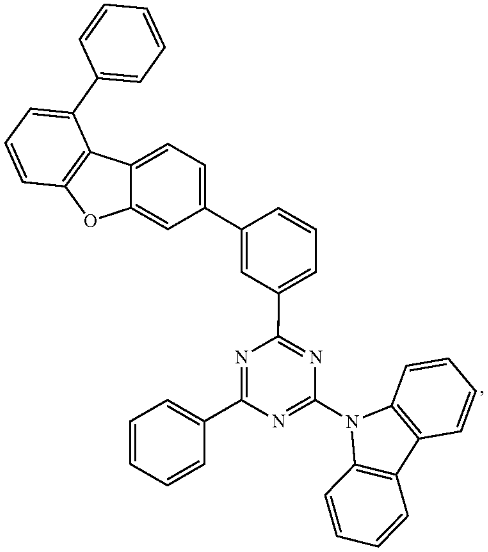
H-55
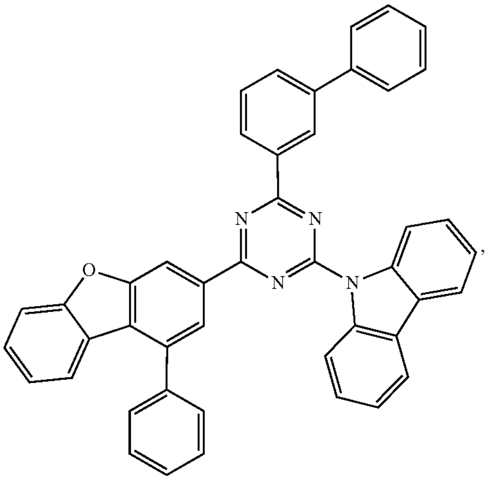
H-56
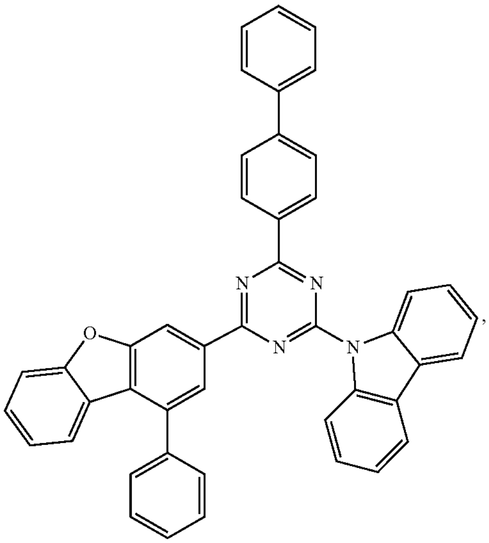

-continued
H-57
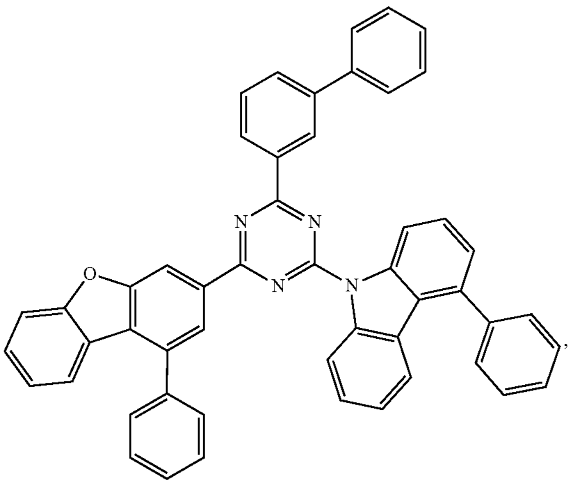
,
H-58
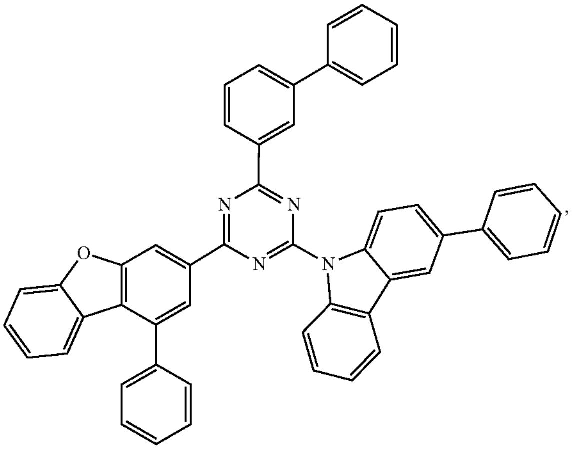
,
H-59
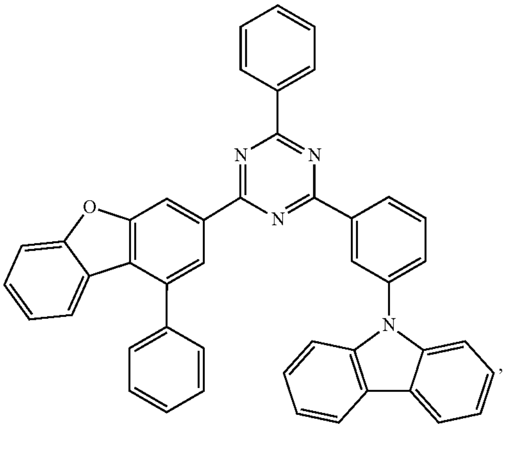
,
-continued
H-60
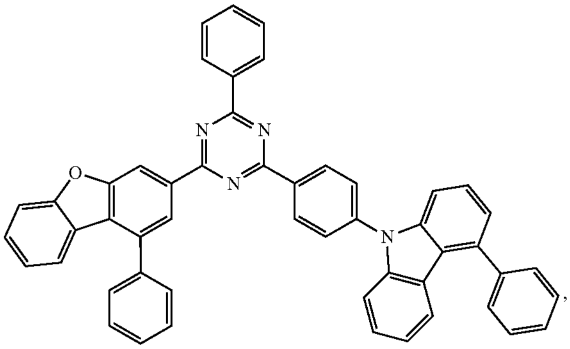
,
H-61
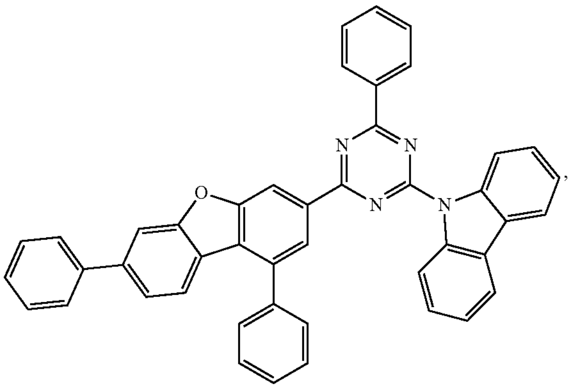
,
H-62
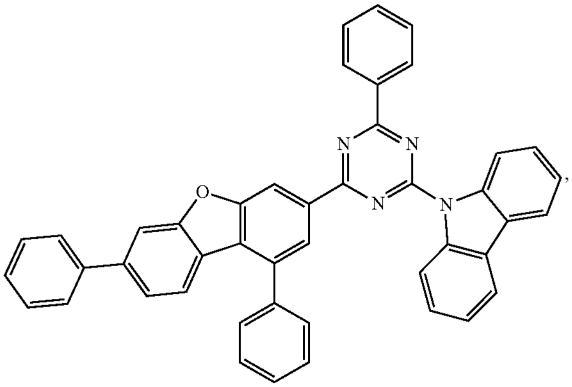
,
H-63
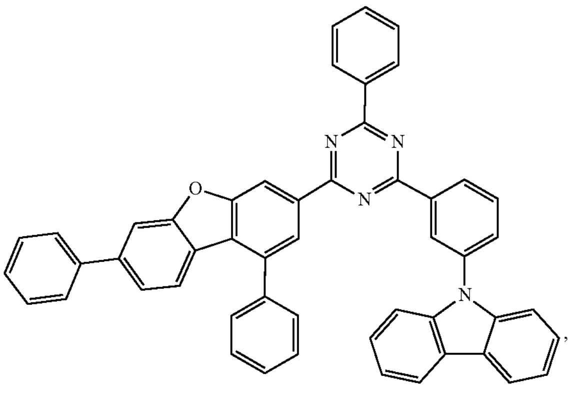
, -continued
H-64
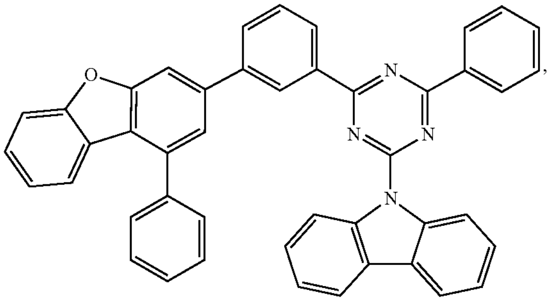
,
H-65
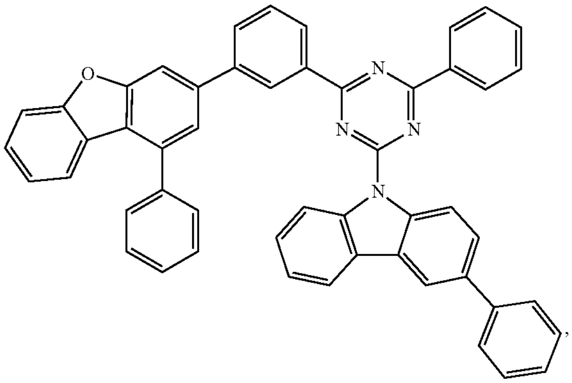
,
H-66
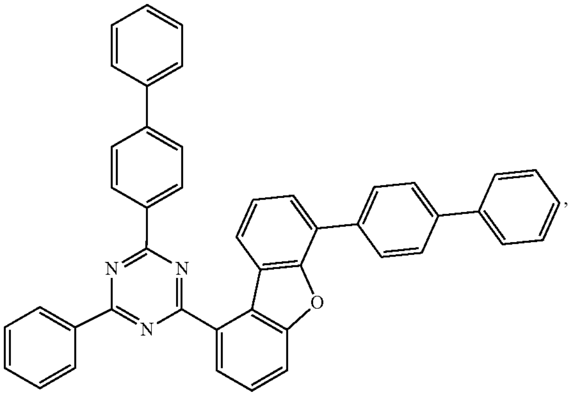
,
H-67
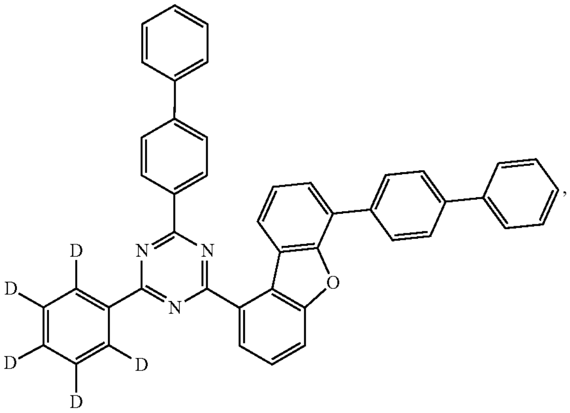
,
-continued
H-68
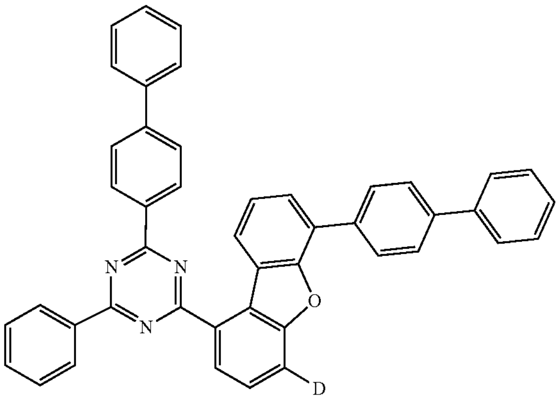
,
H-69
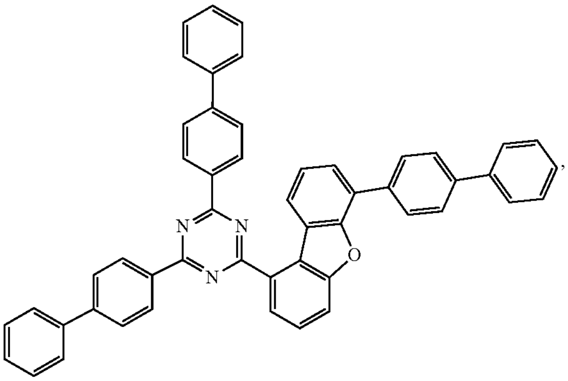
,
H-70
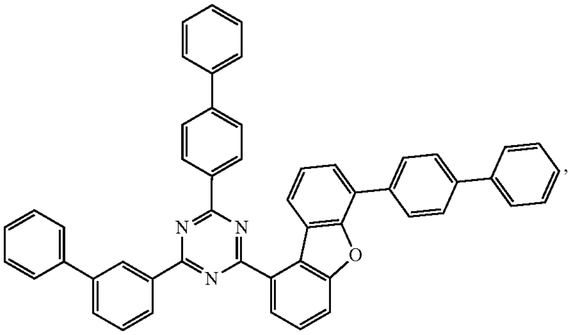
,
H-71
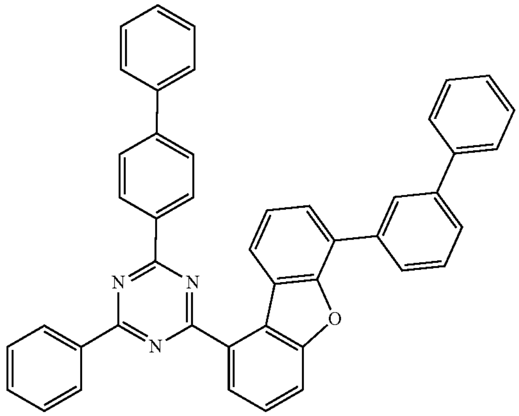
, -continued
H-72
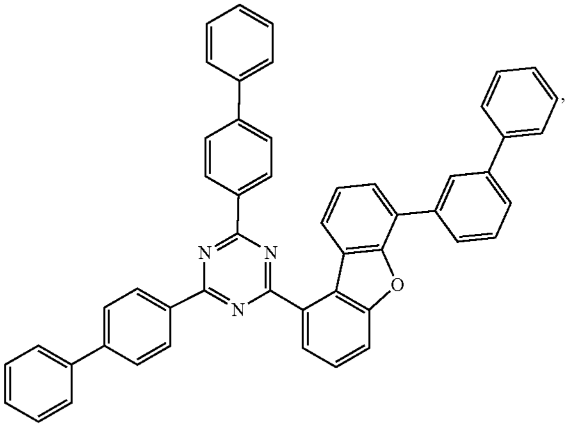
,
H-73
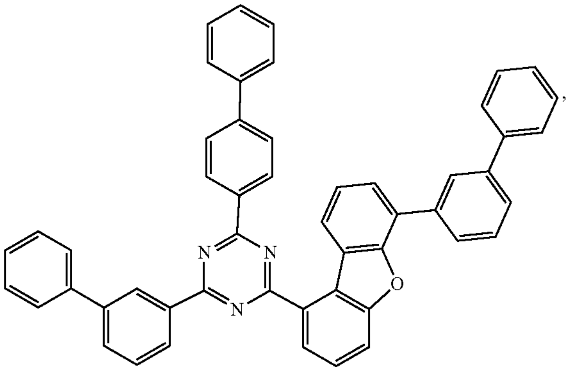
,
H-74
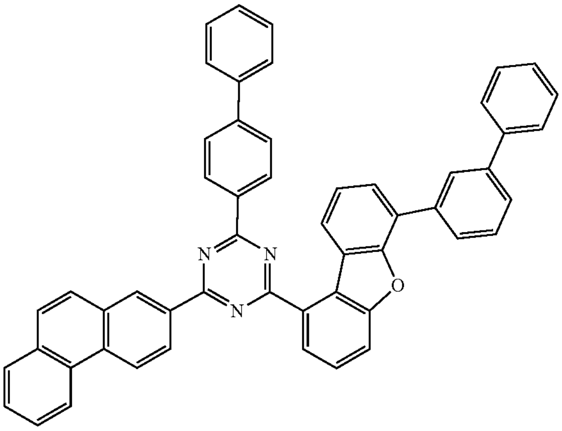
,
-continued
H-75
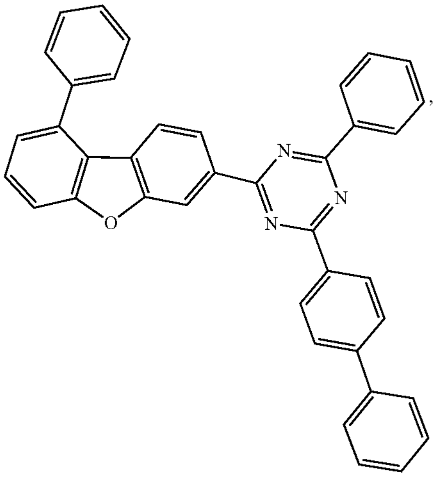
,
H-76
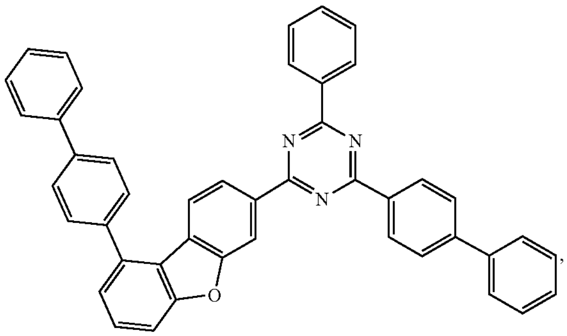
,
H-77
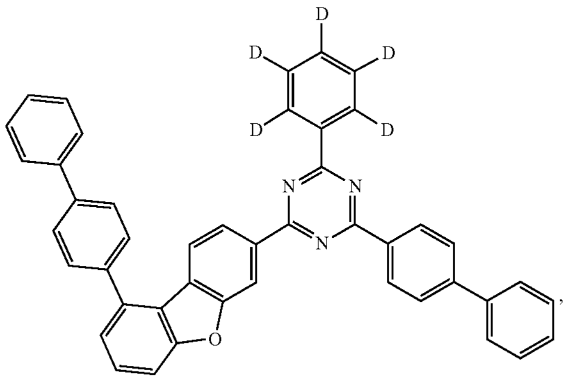
,
H-78
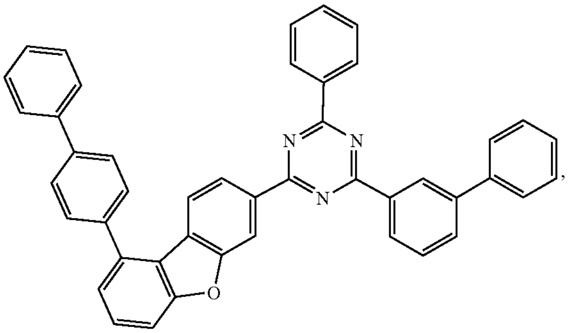
, -continued
H-79
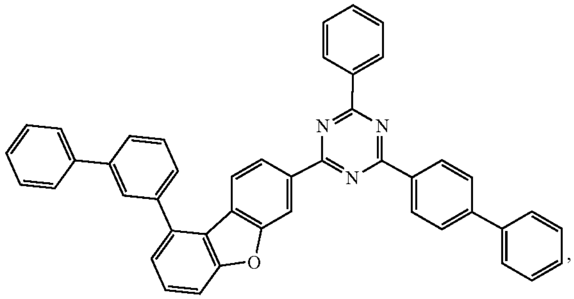
,
H-80
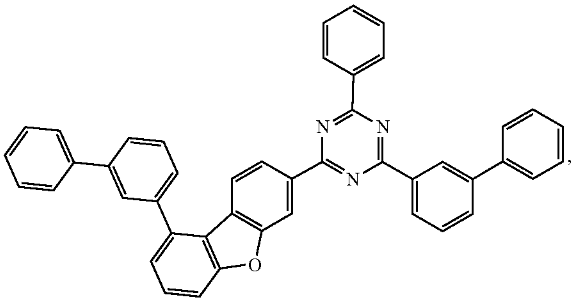
,
H-81
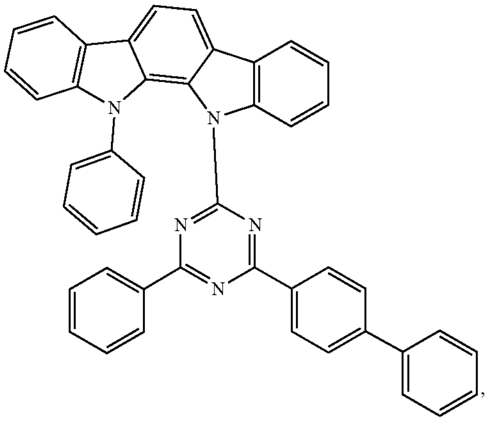
,
H-82
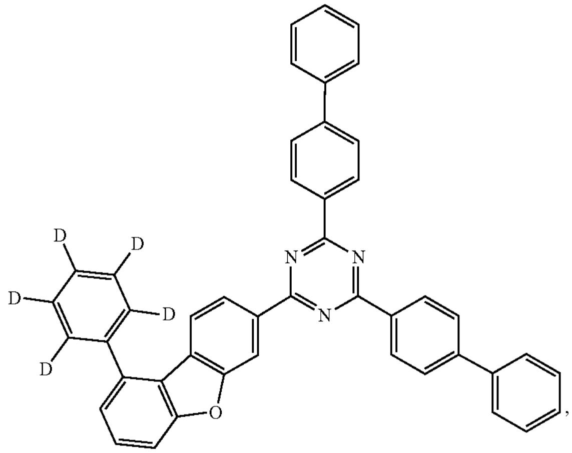
,
-continued
H-83
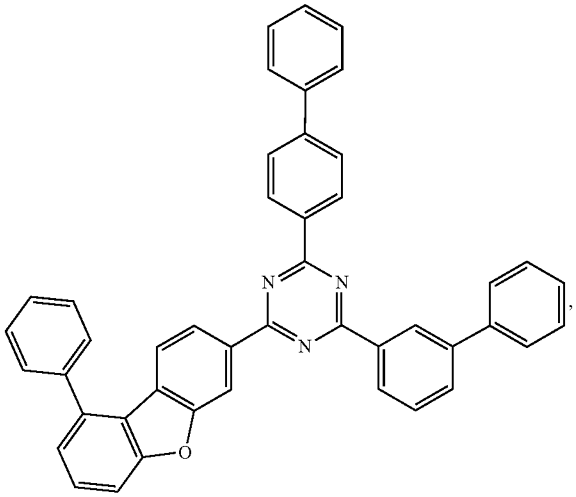
,
H-84
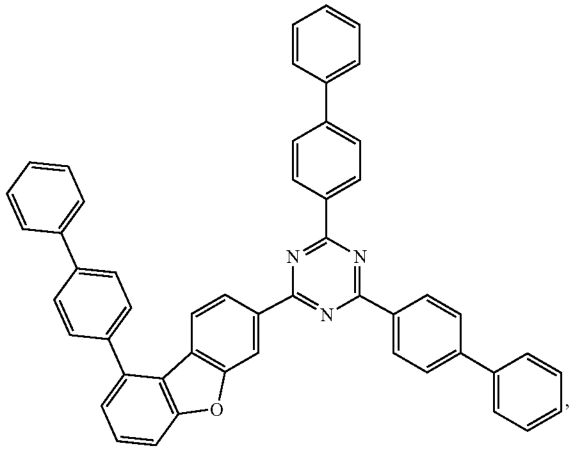
,
H-85
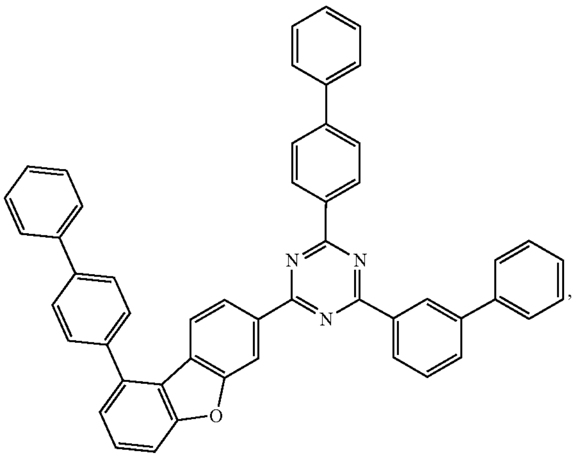
, -continued
H-86
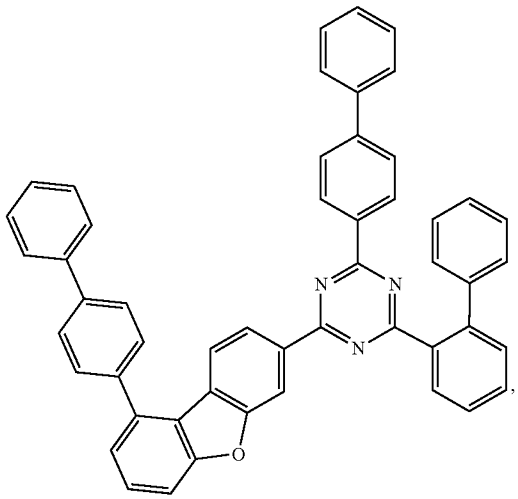
,
H-87
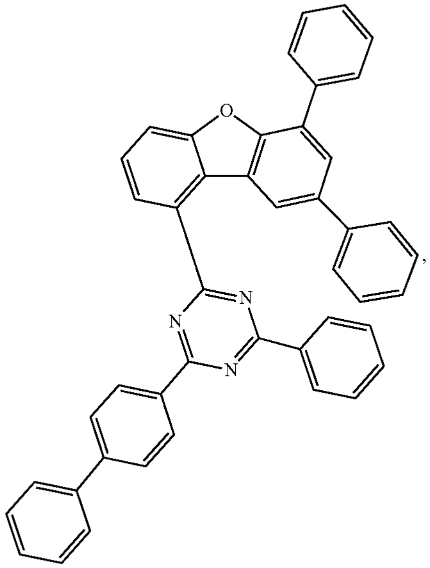
,
H-88
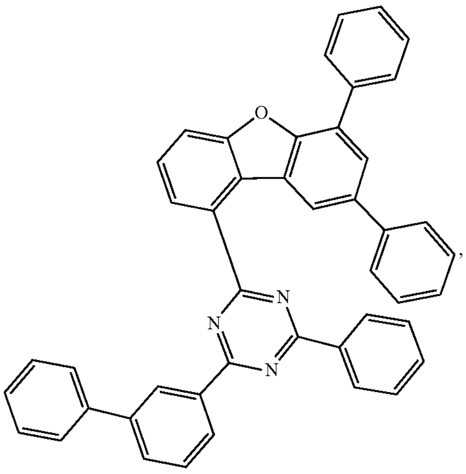
,
-continued
H-89
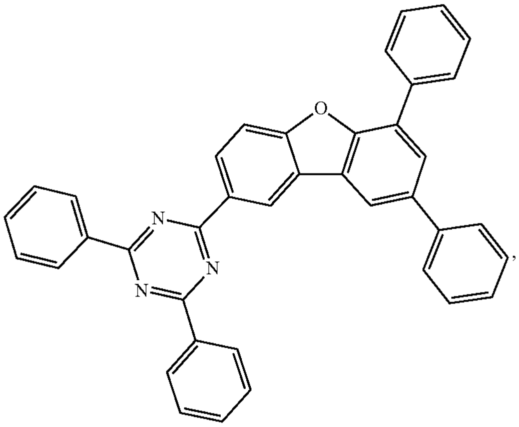
,
H-90
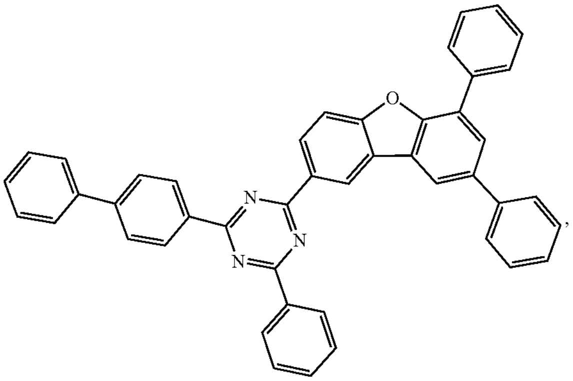
,
H-91
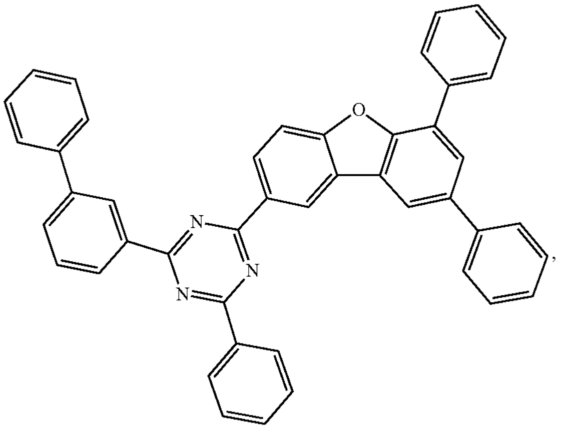
, -continued
H-92
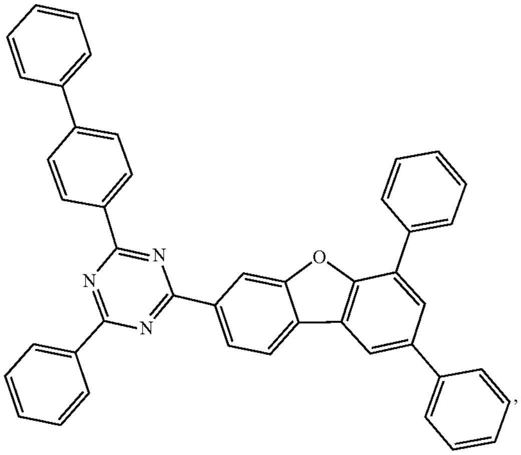,
H-93
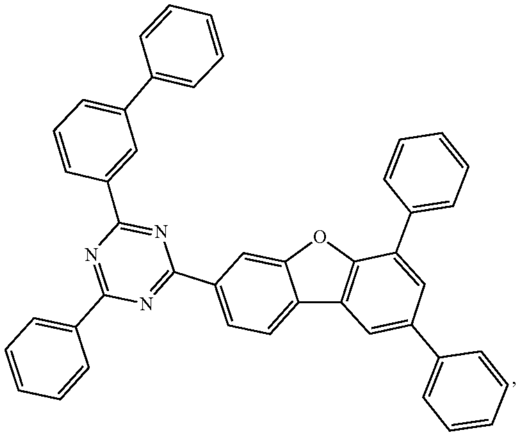,
H-94
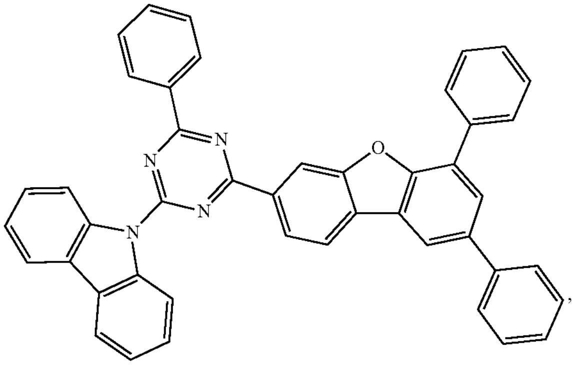,
-continued
H-95
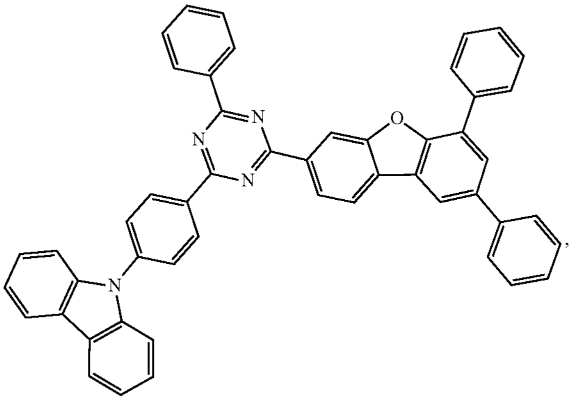,
H-96
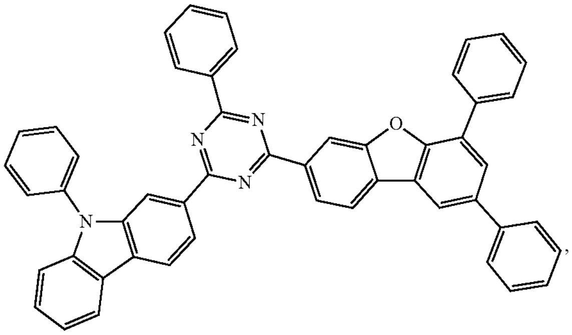,
H-97
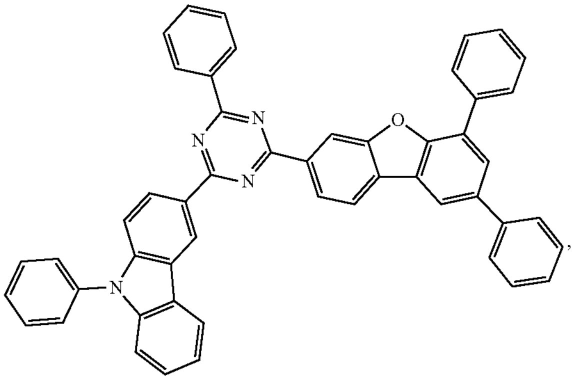, -continued
H-98
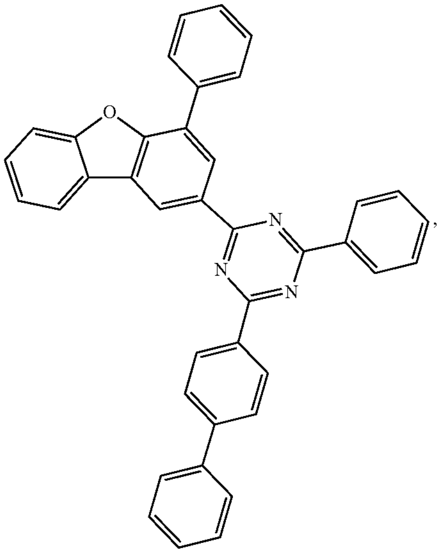
,
H-99
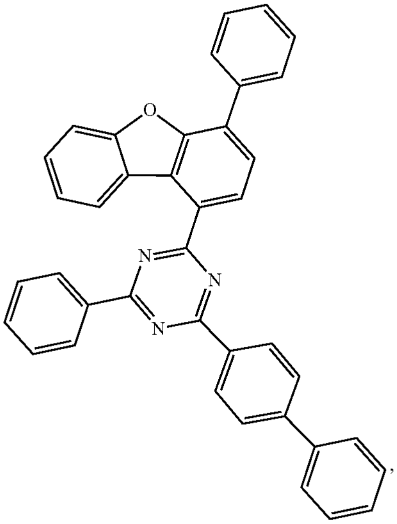
,
H-100
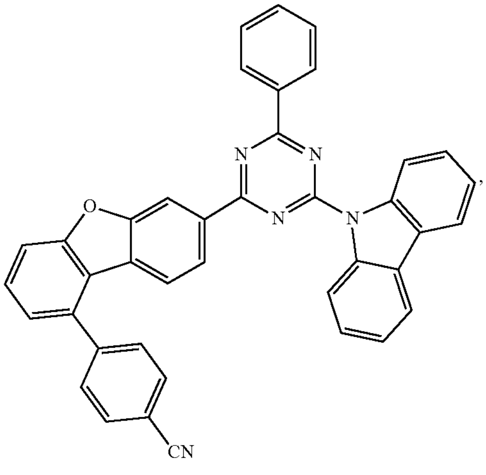
,
-continued
H-101
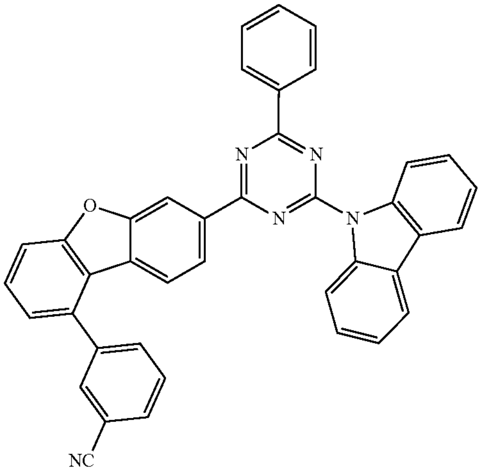
H-102
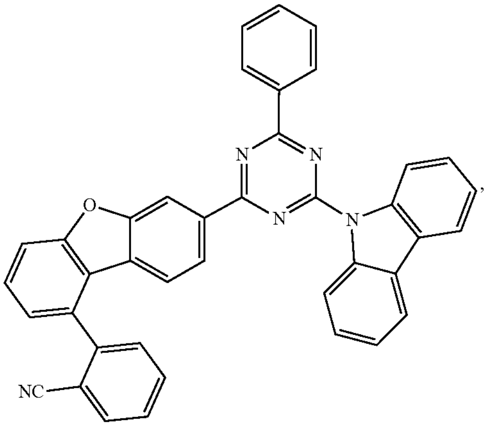
,
H-103
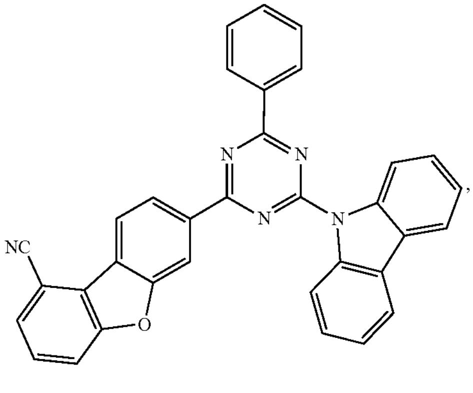
, -continued

H-104

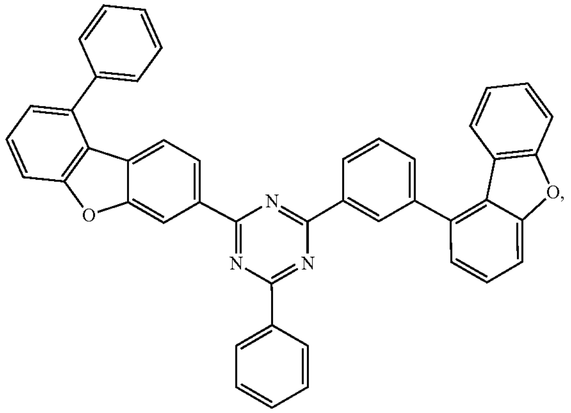

H-105

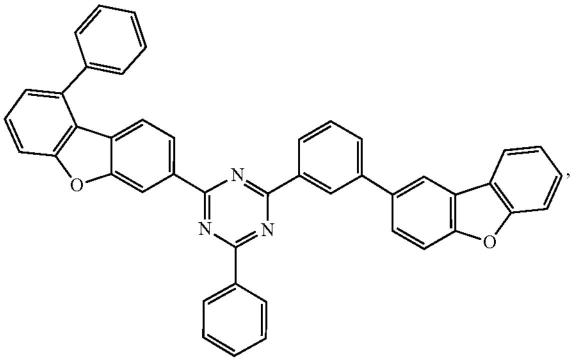

H-106

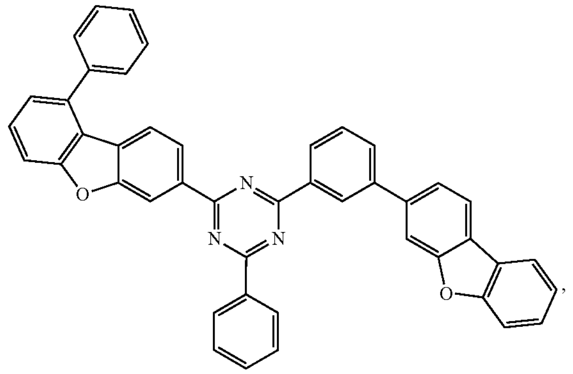

-continued

H-107

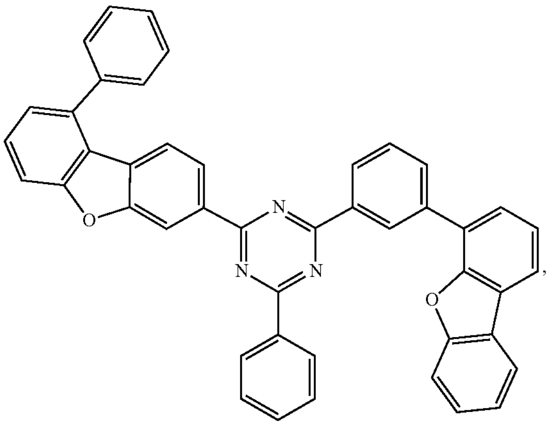

H-108

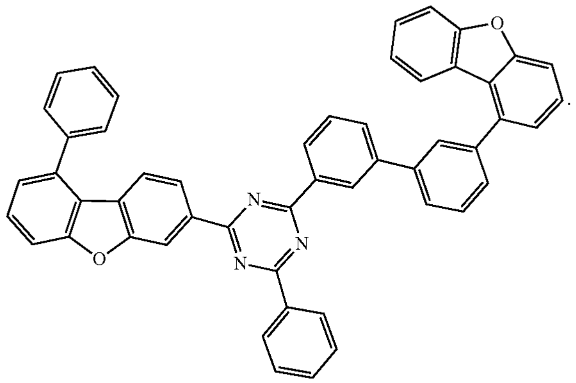

According to an embodiment of the present disclosure, in the electroluminescent device, the metal complex is doped in the first host compound and the second host compound, and the weight of the metal complex accounts for 1% to 30% of the total weight of the emissive layer.

According to an embodiment of the present disclosure, in the electroluminescent device, the metal complex is doped in the first host compound and the second host compound, and the weight of the metal complex accounts for 3% to 13% of the total weight of the emissive layer.

According to an embodiment of the present disclosure, the organic electroluminescent device further comprises a hole injection layer. The hole injection layer may be a functional layer containing a single material or a functional layer containing multiple materials, wherein the contained multiple materials which are the most commonly used are hole transport materials doped with a certain proportion of p-type conductive doping material. Common p-type doped materials are as follows:

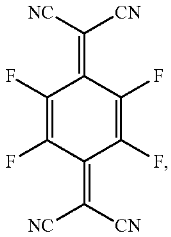

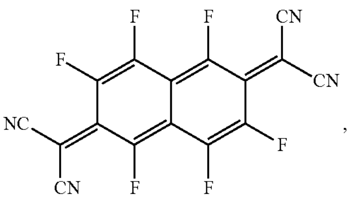

-continued

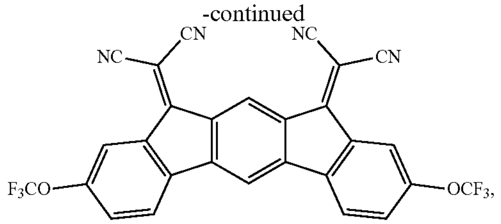

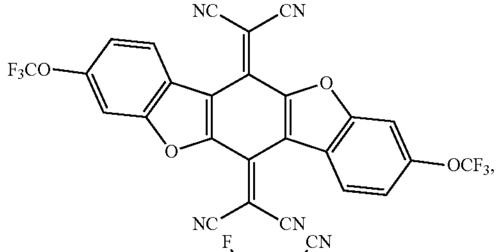

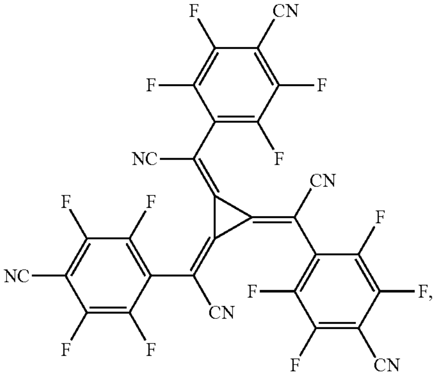

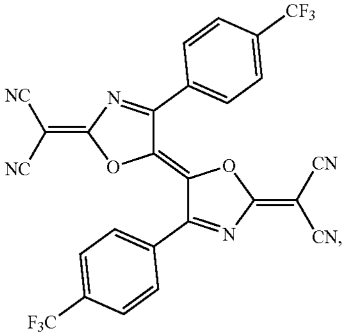

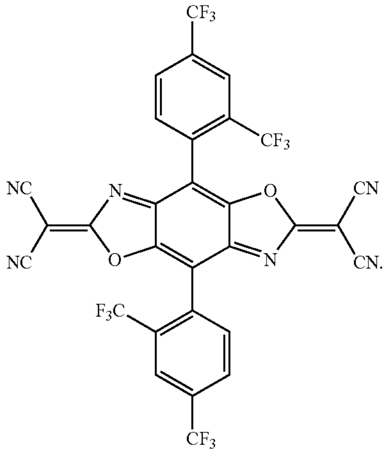 [SMILES: N#CC(C#N)=c1nc2c(-c3ccc(C(F)(F)F)cc3C(F)(F)F)c3oc(=C(C#N)C#N)nc3c(-c3ccc(C(F)(F)F)cc3C(F)(F)F)c2o1]

According to another embodiment of the present disclosure, further disclosed is a composition, which comprises a metal complex whose specific structure is as shown in any one of the preceding embodiments.

Combination with Other Materials

The materials described in the present disclosure for a particular layer in an organic light-emitting device can be used in combination with various other materials present in the device. The combinations of these materials are described in more detail in U.S. Pat. App. Pub. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light-emitting device may be used in combination with a variety of other materials present in the device. For example, dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. Pub. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

MATERIAL SYNTHESIS EXAMPLE

Synthesis Example 1: Synthesis of Metal Complex 1345

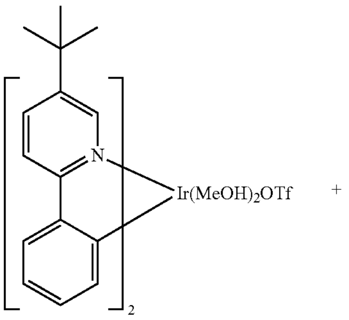

Intermediate 1

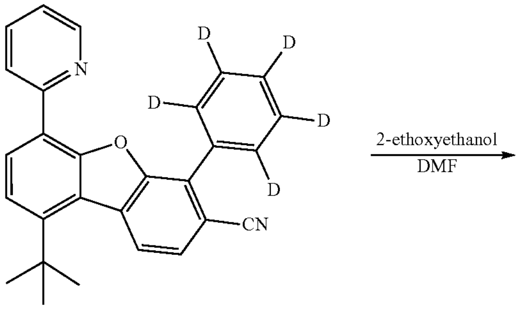

Intermediate 2

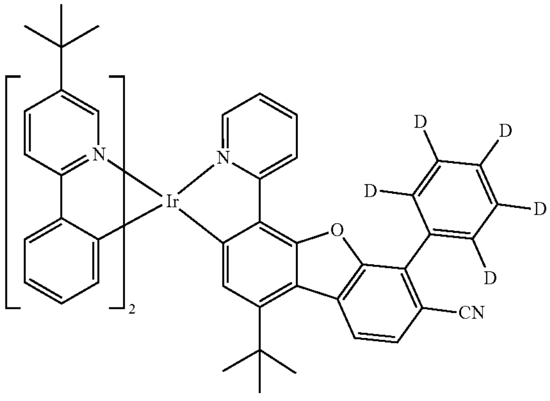

Metal Complex 1345

Intermediate 1 (1.8 g, 2.2 mmol), Intermediate 2 (1.0 g, 2.4 mmol), 2-ethoxyethanol (30 mL) and dimethylformamide (DMF) (30 mL) were sequentially added to a dry 250 mL round-bottom flask and heated to react for 144 h at 100° C. under $N_2$ protection. The reaction was cooled and filtered through Celite. The reaction was washed twice with methanol and n-hexane separately. Yellow solids on the Celite were dissolved with dichloromethane. The organic phases were collected, concentrated under reduced pressure and purified through column chromatography to obtain Metal Complex 1345 as a yellow solid (1.3 g, 1.2 mmol, with a yield of 55%). The product was confirmed as the target product with a molecular weight of 1019.4 and a melting point of 407° C.

Synthesis Example 2: Synthesis of Metal Complex 2252

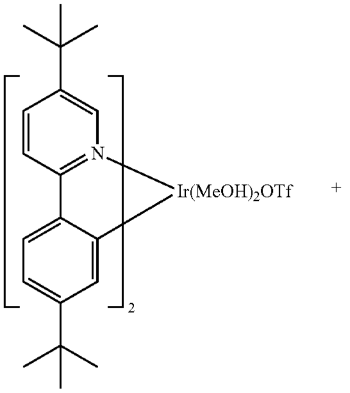

Intermediate 3

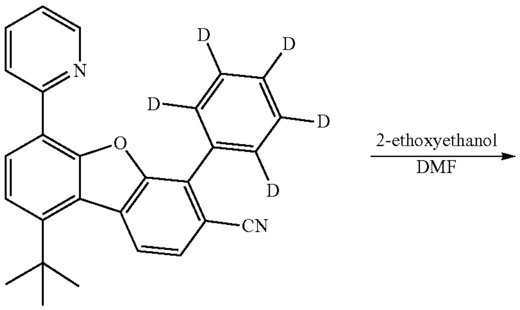

Intermediate 4

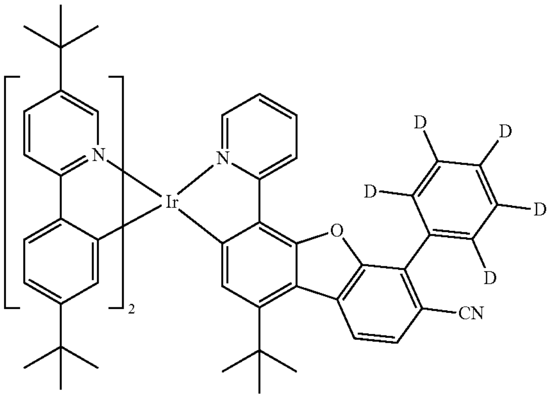

Metal Complex 2252

Intermediate 3 (0.7 g, 0.8 mmol), Intermediate 4 (0.4 g, 1.0 mmol), 2-ethoxyethanol (30 mL) and DMF (30 mL) were sequentially added to a dry 250 mL round-bottom flask and heated to react for 144 h at 100° C. under $N_2$ protection. The reaction was cooled and filtered through Celite. The reaction was washed twice with methanol and n-hexane separately. Yellow solids on the Celite were dissolved with dichloromethane. The organic phases were collected, concentrated under reduced pressure and purified through column chromatography to obtain Metal Complex 2252 as a yellow solid (0.4 g, 0.3 mmol, with a yield of 38%). The product was confirmed as the target product with a molecular weight of 1131.5.

Synthesis Example 3: Synthesis of Metal Complex 1583

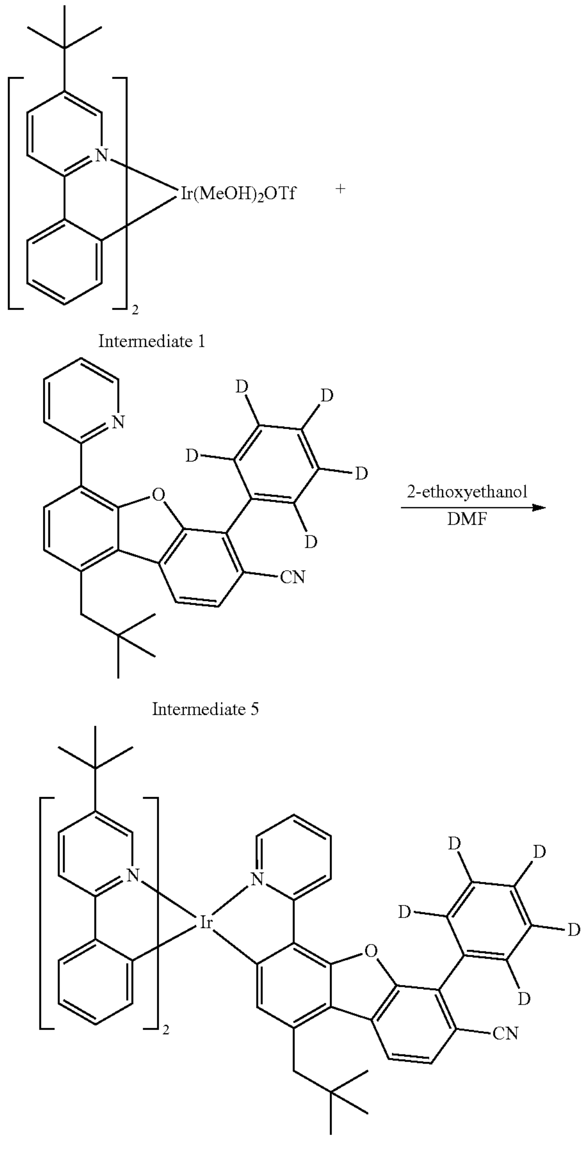

Intermediate 1

Intermediate 5

Metal Complex 1583

Intermediate 1 (2.8 g, 3.4 mmol), Intermediate 5 (2.0 g, 4.7 mmol), 2-ethoxyethanol (40 mL) and DMF (40 mL) were sequentially added to a dry 250 mL round-bottom flask and heated to react for 144 h at 100° C. under $N_2$ protection. The reaction was cooled and filtered through Celite. The reaction was washed twice with methanol and n-hexane separately. Yellow solids on the Celite were dissolved with dichloromethane. The organic phases were collected, concentrated under reduced pressure and purified through column chromatography to obtain Metal Complex 1583 as a yellow solid (1.6 g, 1.6 mmol, with a yield of 47%). The product was confirmed as the target product with a molecular weight of 1033.4 and a melting point of 354° C.

Synthesis Example 4: Synthesis of Metal Complex 1493

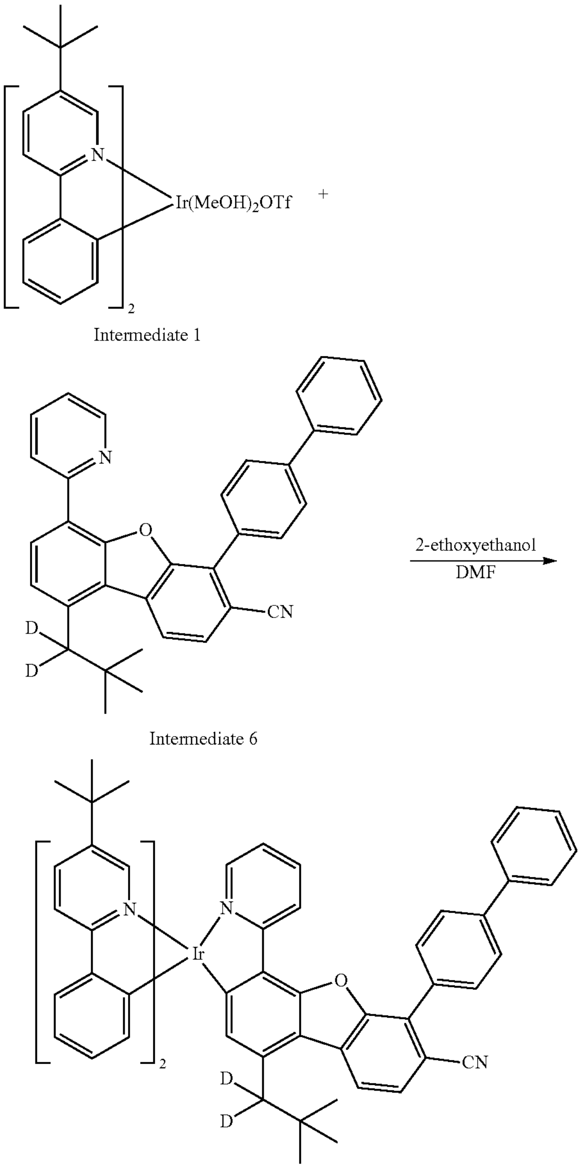

Intermediate 1

Intermediate 6

Metal Complex 1493

Intermediate 1 (1.2 g, 1.5 mmol), Intermediate 6 (0.9 g, 1.8 mmol), 2-ethoxyethanol (30 mL) and DMF (30 mL) were sequentially added to a dry 250 mL round-bottom flask and heated to react for 144 h at 100° C. under $N_2$ protection. The reaction was cooled and filtered through Celite. The reaction was washed twice with methanol and n-hexane separately. Yellow solids on the Celite were dissolved with dichloromethane. The organic phases were collected, concentrated under reduced pressure and purified through column chromatography to obtain Metal Complex 1493 as a yellow solid (0.72 g, 0.65 mmol, with a yield of 43%). The product was confirmed as the target product with a molecular weight of 1106.4 and a melting point of 363° C.

Synthesis Example 5: Synthesis of Metal Complex 2262

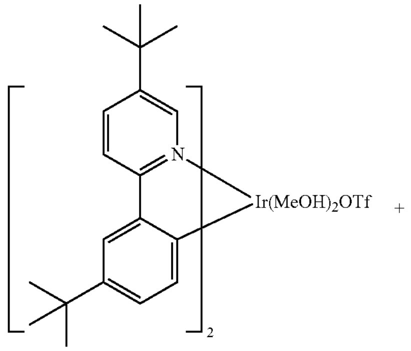

Intermediate 7

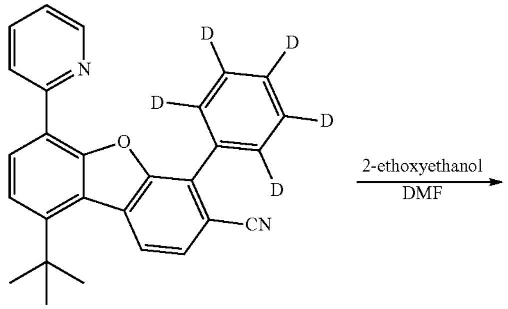

Intermediate 2

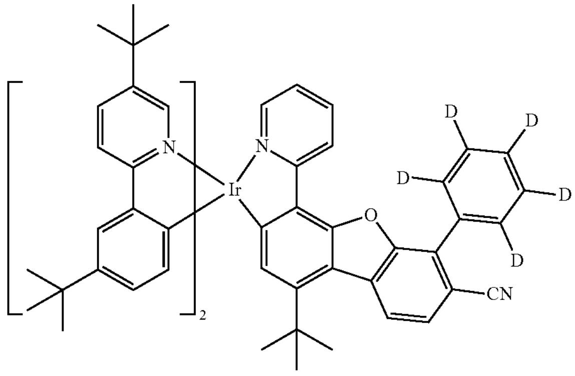

Metal Complex 2262

Intermediate 7 (2.6 g, 2.8 mmol), Intermediate 2 (1.7 g, 4.2 mmol), 2-ethoxyethanol (30 mL) and DMF (30 mL) were sequentially added to a dry 250 mL round-bottom flask and heated to react for 144 h at 100° C. under $N_2$ protection. The reaction was cooled and filtered through Celite. The reaction was washed twice with methanol and n-hexane separately. Yellow solids on the Celite were dissolved with dichloromethane. The organic phases were collected, concentrated under reduced pressure and purified through column chromatography to obtain Metal Complex 2262 as a yellow solid (2.0 g, 1.8 mmol, with a yield of 63%). The product was confirmed as the target product with a molecular weight of 1131.5 and a melting point of 388° C.

Synthesis Example 6: Synthesis of Metal Complex 2164

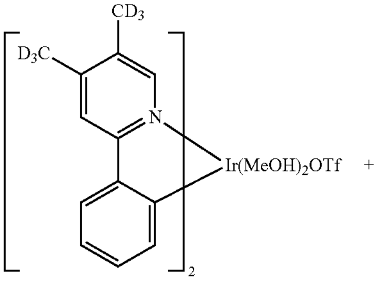

Intermediate 8

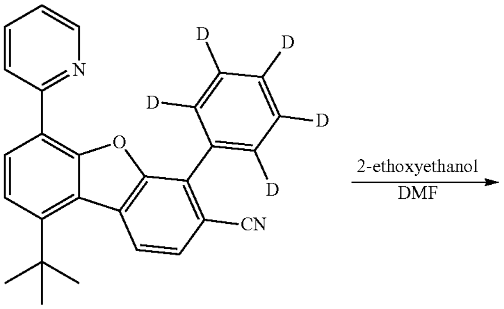

Intermediate 2

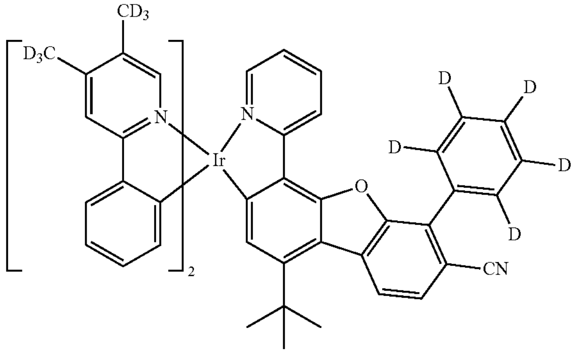

Metal Complex 2164

Intermediate 8 (1.4 g, 1.8 mmol), Intermediate 2 (1.0 g, 2.5 mmol), 2-ethoxyethanol (25 mL) and DMF (25 mL) were sequentially added to a dry 250 mL round-bottom flask and heated to react for 144 h at 100° C. under $N_2$ protection. The reaction was cooled and filtered through Celite. The reaction was washed twice with methanol and n-hexane separately. Yellow solids on the Celite were dissolved with dichloromethane. The organic phases were collected, concentrated under reduced pressure and purified through column chromatography to obtain Metal Complex 2164 as a yellow solid (0.6 g, 0.6 mmol, with a yield of 34%). The product was confirmed as the target product with a molecular weight of 975.4 and a melting point of 451° C.

Synthesis Example 7: Synthesis of Metal Complex 2394

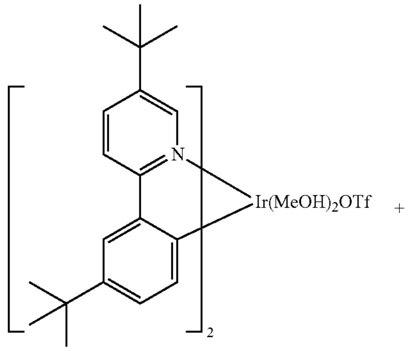

Intermediate 7

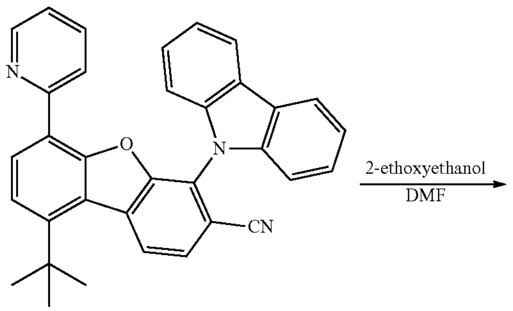

Intermediate 9

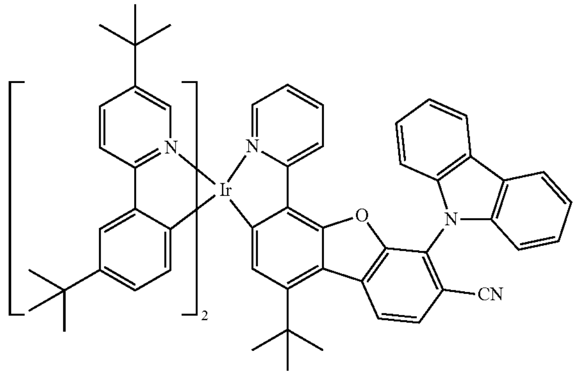

Metal Complex 2394

Intermediate 7 (1.2 g, 1.3 mmol), Intermediate 9 (1.0 g, 2.0 mmol), 2-ethoxyethanol (20 mL) and DMF (20 mL) were sequentially added to a dry 250 mL round-bottom flask and heated to react for 144 h at 100° C. under $N_2$ protection. The reaction was concentrated under reduced pressure and filtered through Celite. The reaction was washed twice with methanol and n-hexane separately. Yellow solids on the Celite were dissolved with dichloromethane. The organic phases were collected and purified through column chromatography to obtain Metal Complex 2394 as a yellow solid (1.1 g, 0.9 mmol, with a yield of 70%). The product was confirmed as the target product with a molecular weight of 1215.5 and a melting point of 426° C.

Synthesis Example 8: Synthesis of Metal Complex 2955

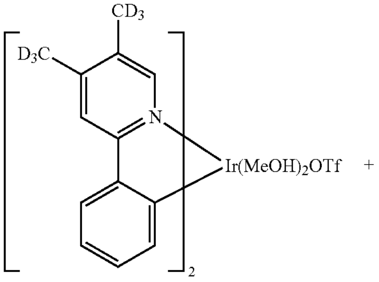

Intermediate 8

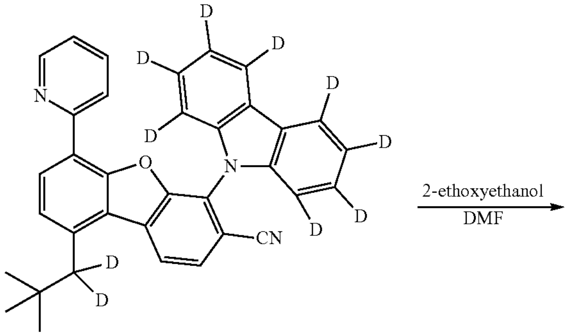

Intermediate 10

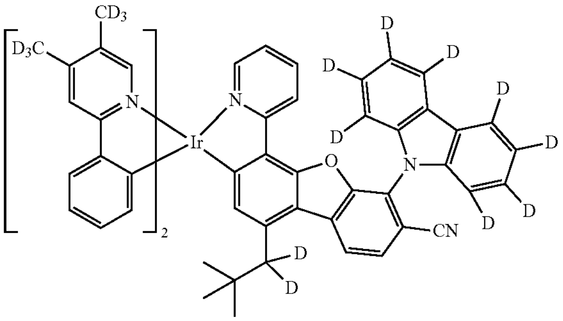

Metal Complex 2955

Intermediate 8 (1.3 g, 1.7 mmol), Intermediate 10 (1.0 g, 2.0 mmol), 2-ethoxyethanol (20 mL) and DMF (20 mL) were sequentially added to a dry 250 mL round-bottom flask and heated to react for 144 h at 100° C. under $N_2$ protection. The reaction was cooled and filtered through Celite. The reaction was washed twice with methanol and n-hexane separately. Yellow solids on the Celite were dissolved with dichloromethane. The organic phases were collected, concentrated under reduced pressure and purified through column chromatography to obtain Metal Complex 2955 as a yellow solid (0.6 g, 0.6 mmol, with a yield of 33%). The product was confirmed as the target product with a molecular weight of 1083.5 and a melting point of 379° C.

Synthesis Example 9: Synthesis of Metal Complex 982

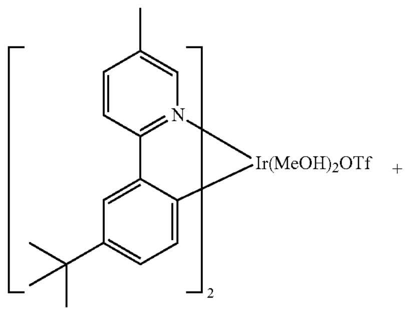

Intermediate 11

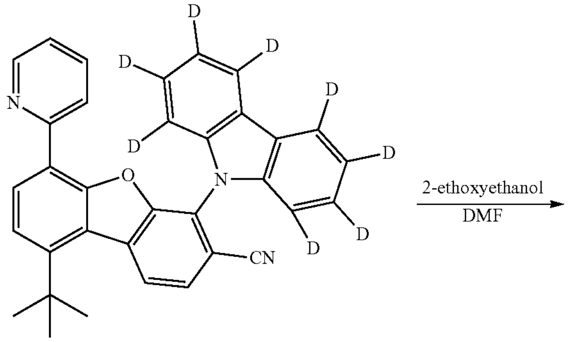

Intermediate 12

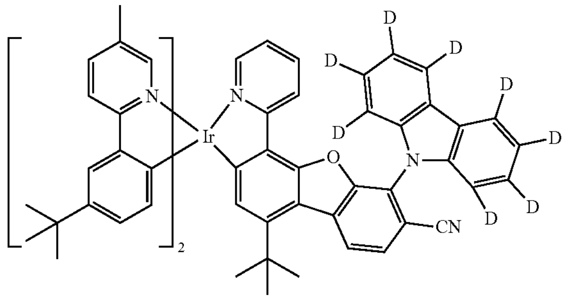

Metal Complex 982

Intermediate 11 (3.0 g, 3.6 mmol), Intermediate 12 (2.5 g, 5.0 mmol), 2-ethoxyethanol (50 mL) and DMF (50 mL) were sequentially added to a dry 250 mL round-bottom flask and heated to react for 144 h at 100° C. under $N_2$ protection. The reaction was cooled and filtered through Celite. The reaction was washed twice with methanol and n-hexane separately. Yellow solids on the Celite were dissolved with dichloromethane. The organic phases were collected, concentrated under reduced pressure and purified through column chromatography to obtain Metal Complex 982 as a yellow solid (2.0 g, 1.8 mmol, with a yield of 49%). The product was confirmed as the target product with a molecular weight of 1139.5 and a melting point of 364° C.

Synthesis Example 10: Synthesis of Metal Complex 3671

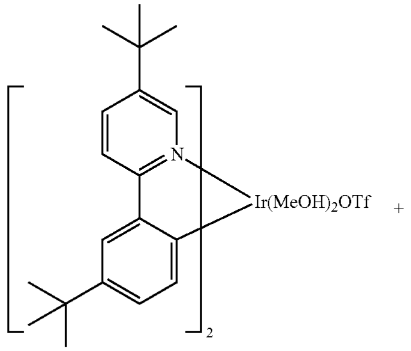

Intermediate 7

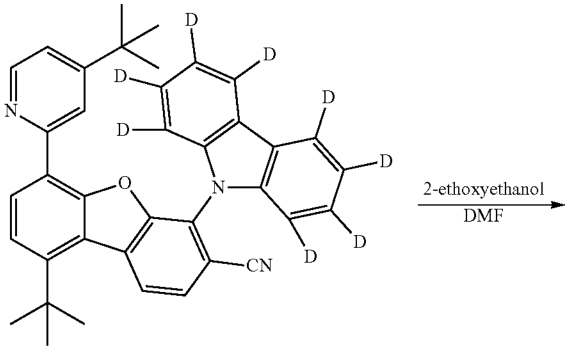

Intermediate 13

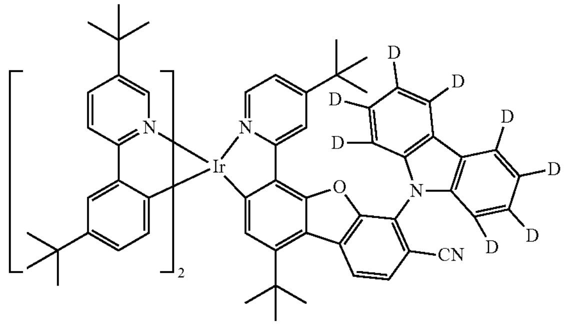

Metal Complex 3671

Intermediate 7 (2.7 g, 3.3 mmol), Intermediate 13 (2.5 g, 4.9 mmol), 2-ethoxyethanol (50 mL) and DMF (50 mL) were sequentially added to a dry 250 mL round-bottom flask and heated to react for 144 h at 100° C. under $N_2$ protection. The reaction was cooled and filtered through Celite. The reaction was washed twice with methanol and n-hexane separately. Yellow solids on the Celite were dissolved with dichloromethane. The organic phases were collected, concentrated under reduced pressure and purified through column chromatography to obtain Metal Complex 3671 as a yellow solid (1.6 g, 1.3 mmol, with a yield of 39%). The product was confirmed as the target product with a molecular weight of 1279.6 and a melting point of 385° C.

Synthesis Example 11: Synthesis of Metal Complex 2526

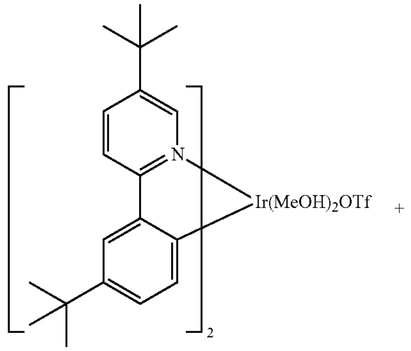

Intermediate 7

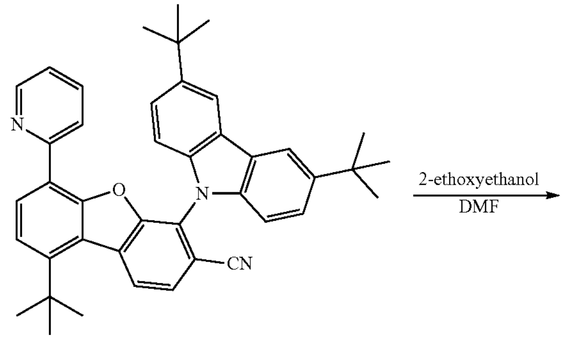

Intermediate 14

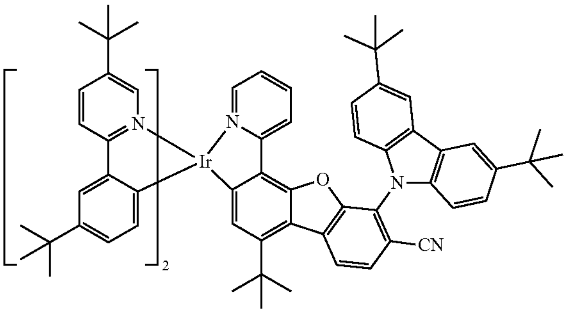

Metal Complex 2526

Intermediate 7 (4.8 g, 5.1 mmol), Intermediate 14 (4.0 g, 6.6 mmol), 2-ethoxyethanol (80 mL) and DMF (80 mL) were sequentially added to a dry 250 mL round-bottom flask and heated to react for 144 h at 100° C. under $N_2$ protection. The reaction was cooled and filtered through Celite. The reaction was washed twice with methanol and n-hexane separately. Yellow solids on the Celite were dissolved with dichloromethane. The organic phases were collected, concentrated under reduced pressure and purified through column chromatography to obtain Metal Complex 2526 as a yellow solid (5.2 g, 3.9 mmol, with a yield of 76%). The product was confirmed as the target product with a molecular weight of 1327.7 and a melting point of 383° C.

Synthesis Example 12: Synthesis of Metal Complex 2657

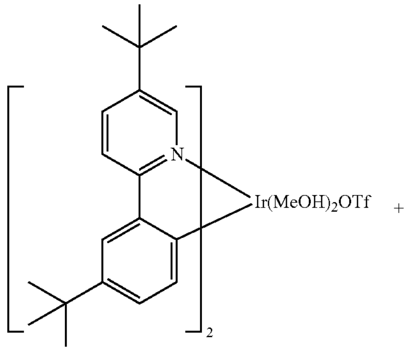

Intermediate 7

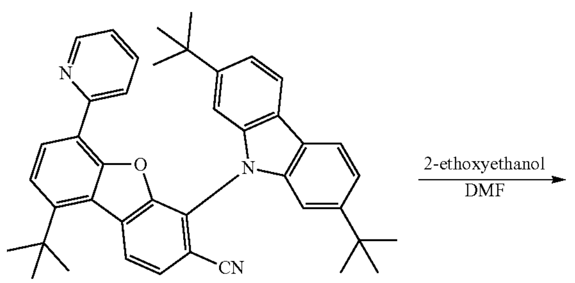

Intermediate 15

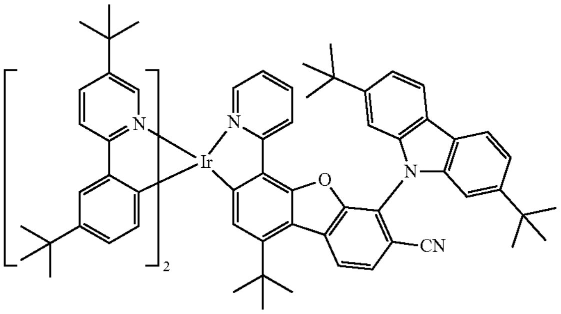

Metal Complex 2657

Intermediate 7 (5.1 g, 5.4 mmol), Intermediate 15 (3.6 g, 6.0 mmol), 2-ethoxyethanol (50 mL) and DMF (50 mL) were sequentially added to a dry 250 mL round-bottom flask and heated to react for 96 h at 100° C. under $N_2$ protection. The reaction was cooled and filtered through Celite. The reaction was washed twice with methanol and n-hexane separately. Yellow solids on the Celite were dissolved with dichloromethane. The organic phases were collected, concentrated under reduced pressure and purified through column chromatography to obtain Metal Complex 2657 as a yellow solid (6.0 g, 4.7 mmol, with a yield of 87%). The product was confirmed as the target product with a molecular weight of 1327.7 and a melting point of 422° C.

Synthesis Example 13: Synthesis of Metal Complex 1371

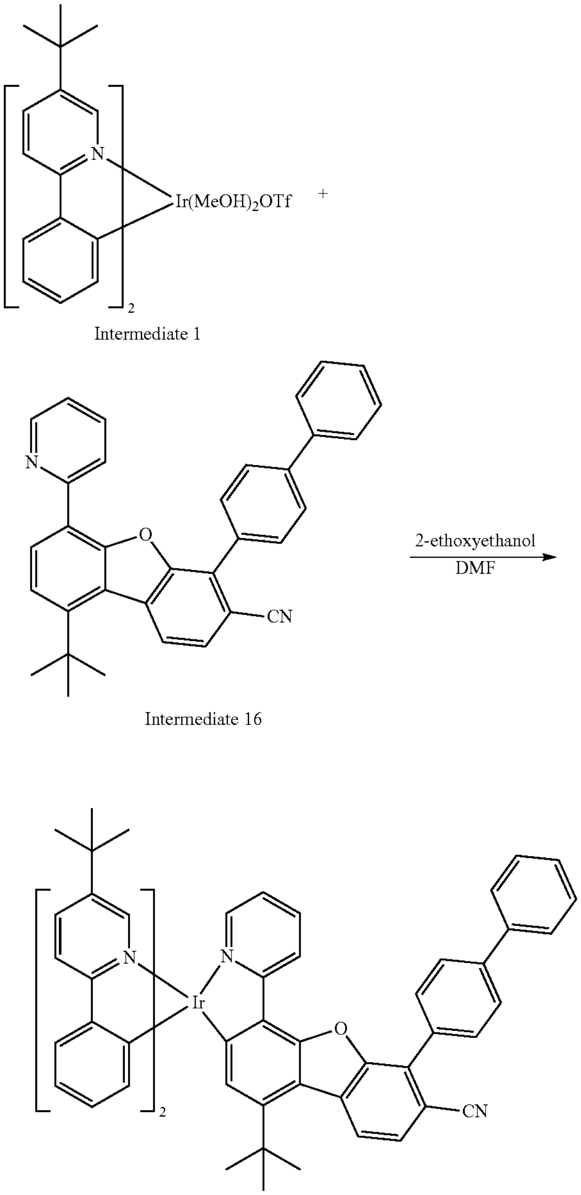

Intermediate 1

Intermediate 16

Metal Complex 1371

Intermediate 1 (0.7 g, 0.8 mmol), Intermediate 16 (0.5 g, 1.0 mmol), 2-ethoxyethanol (30 mL) and DMF (30 mL) were sequentially added to a dry 250 mL round-bottom flask and heated to react for 144 h at 100° C. under $N_2$ protection. The reaction was cooled and filtered through Celite. The reaction was washed twice with methanol and n-hexane separately. Yellow solids on the Celite were dissolved with dichloromethane. The organic phases were collected, concentrated under reduced pressure and purified through column chromatography to obtain Metal Complex 1371 as a yellow solid (0.28 g, 0.25 mmol, with a yield of 31%). The product was confirmed as the target product with a molecular weight of 1090.4 and a melting point of 421° C.

Synthesis Example 14: Synthesis of Metal Complex 2393

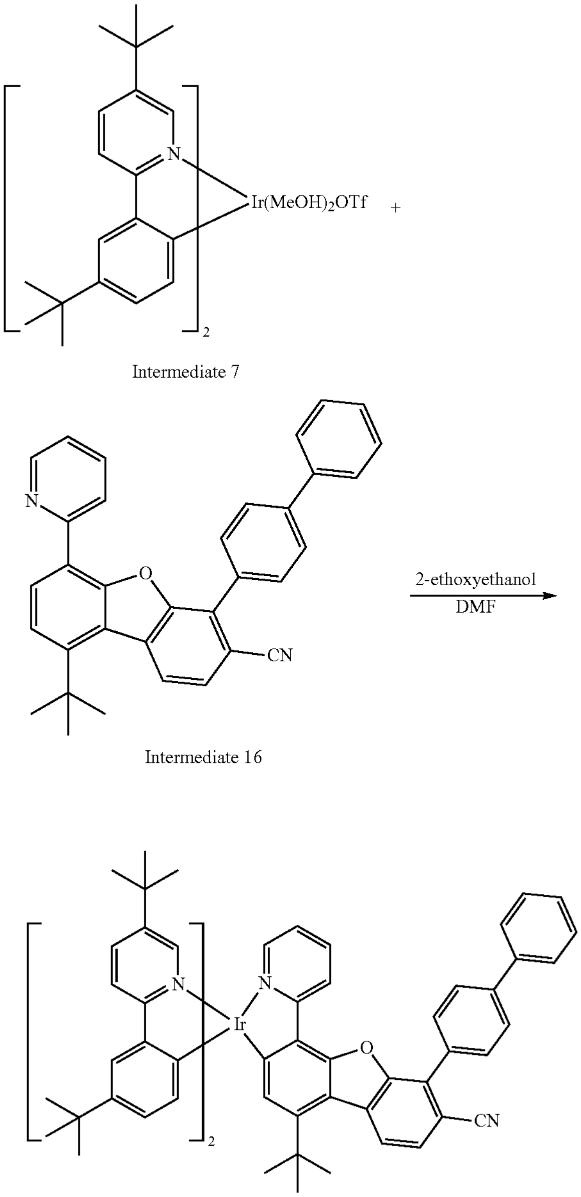

Intermediate 7

Intermediate 16

Metal Complex 2393

Intermediate 7 (1.8 g, 1.9 mmol), Intermediate 16 (1.3 g, 2.7 mmol), 2-ethoxyethanol (40 mL) and DMF (40 mL) were sequentially added to a dry 250 mL round-bottom flask and heated to react for 144 h at 100° C. under $N_2$ protection. The reaction was cooled and filtered through Celite. The reaction was washed twice with methanol and n-hexane separately. Yellow solids on the Celite were dissolved with dichloromethane. The organic phases were collected, concentrated under reduced pressure and purified through column chromatography to obtain Metal Complex 2393 as a yellow solid (1.4 g, 1.2 mmol, with a yield of 63%). The product was confirmed as the target product with a molecular weight of 1202.5 and a melting point of 350° C.

Synthesis Example 15: Synthesis of Metal Complex 2921

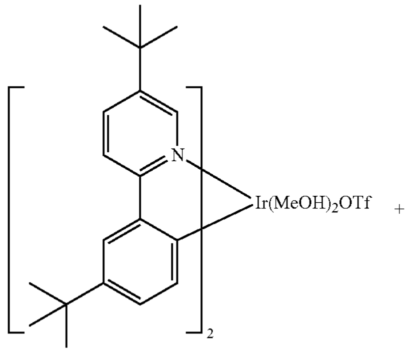

Intermediate 7

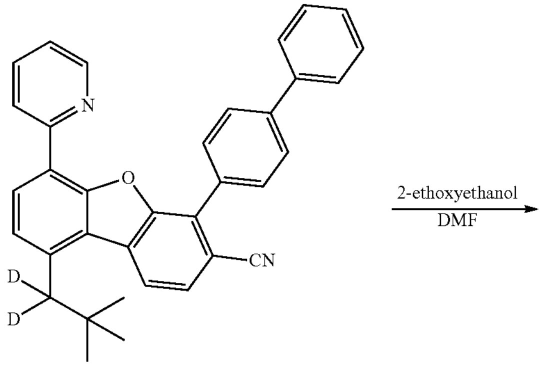

Intermediate 6

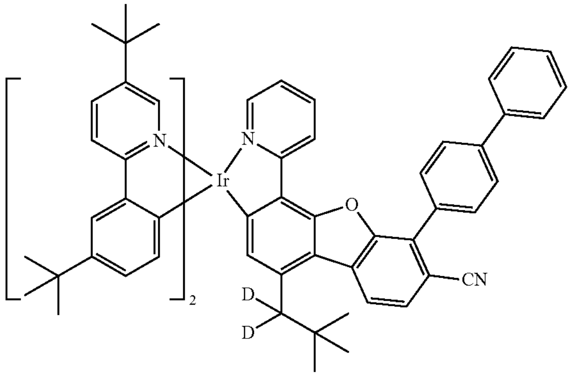

Metal Complex 2921

Intermediate 7 (1.5 g, 1.6 mmol), Intermediate 6 (1.1 g, 2.2 mmol), 2-ethoxyethanol (40 mL) and DMF (40 mL) were sequentially added to a dry 250 mL round-bottom flask and heated to react for 144 h at 100° C. under $N_2$ protection. The reaction was cooled and filtered through Celite. The reaction was washed twice with methanol and n-hexane separately. Yellow solids on the Celite were dissolved with dichloromethane. The organic phases were collected, concentrated under reduced pressure and purified through column chromatography to obtain Metal Complex 2921 as a yellow solid (1.3 g, 1.1 mmol, with a yield of 69%). The product was confirmed as the target product with a molecular weight of 1218.6 and a melting point of 387° C.

Synthesis Example 16: Synthesis of Metal Complex 2249

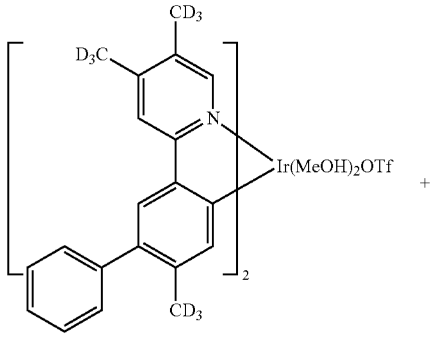

Intermediate 18

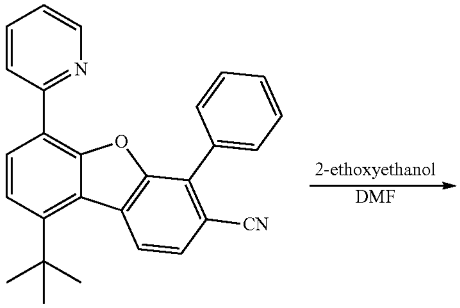

Intermediate 19

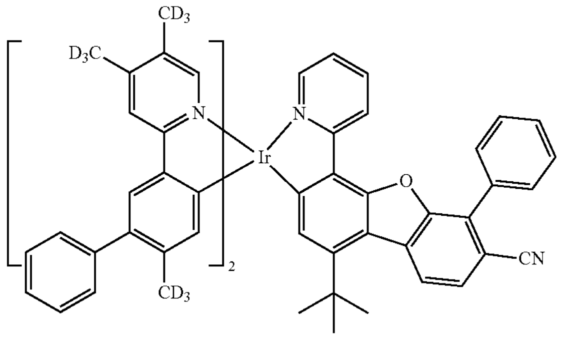

Metal Complex 2249

Intermediate 18 (1.7 g, 1.8 mmol), Intermediate 19 (1.0 g, 2.4 mmol), 2-ethoxyethanol (30 mL) and DMF (30 mL) were sequentially added to a dry 250 mL round-bottom flask and heated to react for 144 h at 100° C. under $N_2$ protection. The reaction was cooled and filtered through Celite. The reaction was washed twice with methanol and n-hexane separately. Yellow solids on the Celite were dissolved with dichloromethane. The organic phases were collected, concentrated under reduced pressure and purified through column chromatography to obtain Metal Complex 2249 as a yellow solid (0.9 g, 0.8 mmol, with a yield of 44%). The product was confirmed as the target product with a molecular weight of 1156.5 and a melting point of 439° C.

Those skilled in the art will appreciate that the above preparation methods are merely exemplary. Those skilled in the art can obtain other compound structures of the present disclosure through the modifications of the preparation methods.

Device Example 1

Firstly, a glass substrate having an indium tin oxide (ITO) anode with a thickness of 80 nm was cleaned and then treated with oxygen plasma and UV ozone. After the treatment, the substrate was dried in a glovebox to remove moisture. Then, the substrate was mounted on a substrate holder and placed in a vacuum chamber. Organic layers specified below were sequentially deposited through vacuum thermal evaporation on the ITO anode at a rate of 0.2 to 2 Angstroms per second and a vacuum degree of about $10^{-6}$ torr. Compound HI was used as a hole injection layer (HIL). Compound HT was used as a hole transporting layer (HTL). Compound PH-23 was used as an electron blocking layer (EBL). Metal Complex 1345 of the present disclosure was doped in Compound PH-23 and Compound H-40, all of which were co-deposited for use as an emissive layer (EML). On the EML, Compound H-2 was used as a hole blocking layer (HBL). On the HBL, Compound ET and 8-hydroxyquinolinolato-lithium (Liq) were co-deposited for use as an electron transporting layer (ETL). Finally, 8-hydroxyquinolinolato-lithium (Liq) was deposited for use as an electron injection layer with a thickness of 1 nm and Al was deposited for use as a cathode with a thickness of 120 nm. The device was transferred back to the glovebox and encapsulated with a glass lid and a moisture getter to complete the device.

Device Example 2

The implementation mode in Device Example 2 was the same as that in Device Example 1, except that in the emissive layer (EML), Metal Complex 1345 of the present disclosure was replaced with Metal Complex 1583.

Device Comparative Example 1

The implementation mode in Device Comparative Example 1 was the same as that in Device Example 1, except that in the emissive layer (EML), Metal Complex 1345 of the present disclosure was replaced with Compound GD1.

Device Comparative Example 2

The implementation mode in Device Comparative Example 2 was the same as that in Device Example 1, except that in the emissive layer (EML), Metal Complex 1345 of the present disclosure was replaced with Compound GD2.

Device Comparative Example 3

The implementation mode in Device Comparative Example 3 was the same as that in Device Example 1, except that in the emissive layer (EML), Metal Complex 1345 of the present disclosure was replaced with Compound GD3.

Detailed structures and thicknesses of layers of the devices are shown in the following table. A layer using more than one material is obtained by doping different compounds at their weight ratio as recorded.

TABLE 1

Device structures in Examples 1 and 2 and Comparative Examples 1 to 3

| Device ID | HIL | HTL | EBL | EML | HBL | ETL |
|---|---|---|---|---|---|---|
| Example 1 | Compound HI (100 Å) | Compound HT (350 Å) | Compound PH-23 (50 Å) | Compound PH-23:Compound H-40:Metal Complex 1345 (56:38:6) (400 Å) | Compound H-2 (50 Å) | Compound ET:Liq (40:60) (350 Å) |
| Example 2 | Compound HI (100 Å) | Compound HT (350 Å) | Compound PH-23 (50 Å) | Compound PH-23:Compound H-40:Metal Complex 1583 (56:38:6) (400 Å) | Compound H-2 (50 Å) | Compound ET:Liq (40:60) (350 Å) |
| Comparative Example 1 | Compound HI (100 Å) | Compound HT (350 Å) | Compound PH-23 (50 Å) | Compound PH-23:Compound H-40:Compound GD1 (56:38:6) (400 Å) | Compound H-2 (50 Å) | Compound ET:Liq (40:60) (350 Å) |
| Comparative Example 2 | Compound HI (100 Å) | Compound HT (350 Å) | Compound PH-23 (50 Å) | Compound PH-23:Compound H-40:Compound GD2 (56:38:6) (400 Å) | Compound H-2 (50 Å) | Compound ET:Liq (40:60) (350 Å) |
| Comparative Example 3 | Compound HI (100 Å) | Compound HT (350 Å) | Compound PH-23 (50 Å) | Compound PH-23:Compound H-40:Compound GD3 (56:38:6) (400 Å) | Compound H-2 (50 Å) | Compound ET:Liq (40:60) (350 Å) |

The materials used in the devices have the following structures:

Compound HI

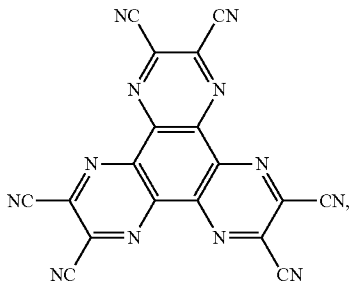

-continued
Compound HT
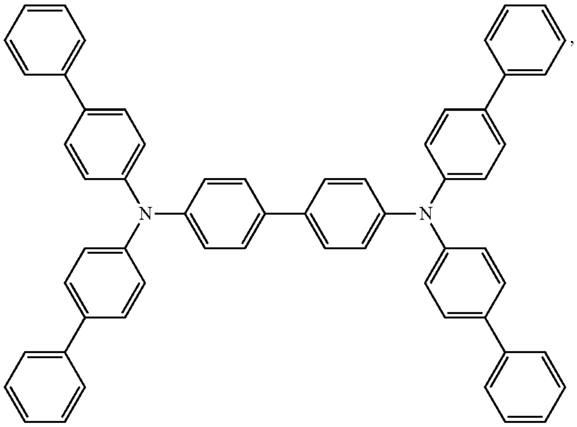
H-2
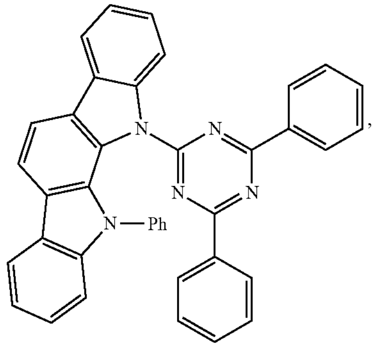
Liq
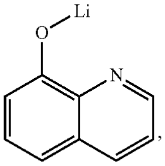
H-40
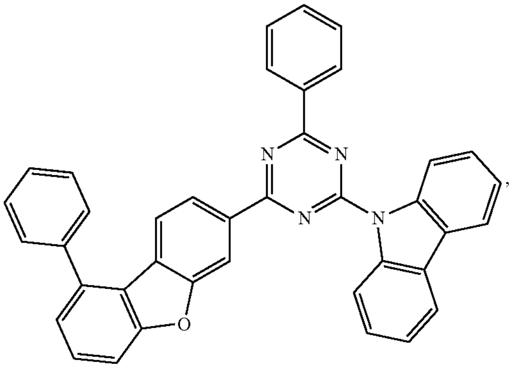
PH-23
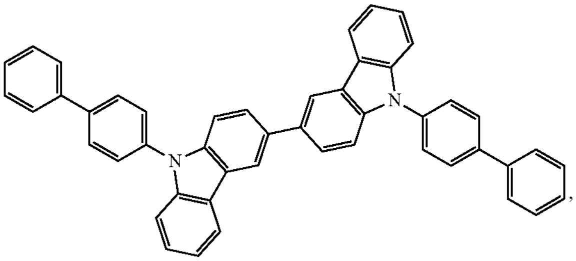
-continued
Metal Complex 1345
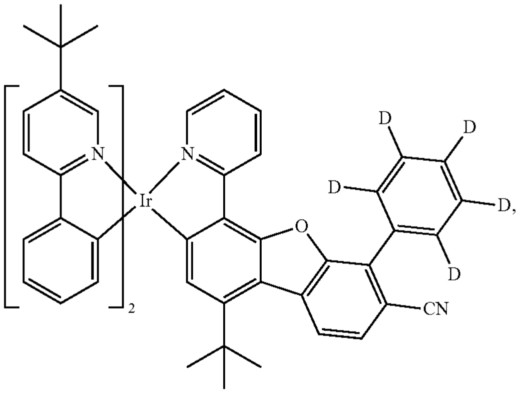
Metal Complex 1583
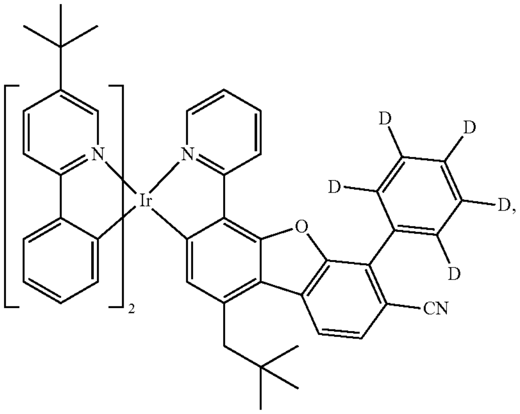
GD1
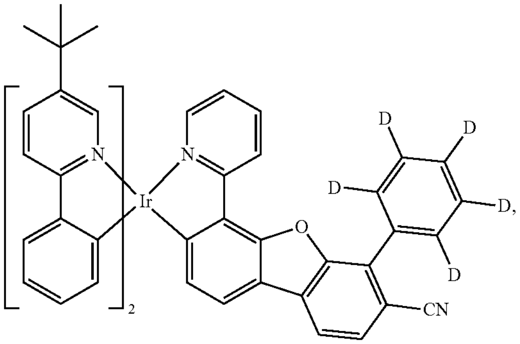
GD2
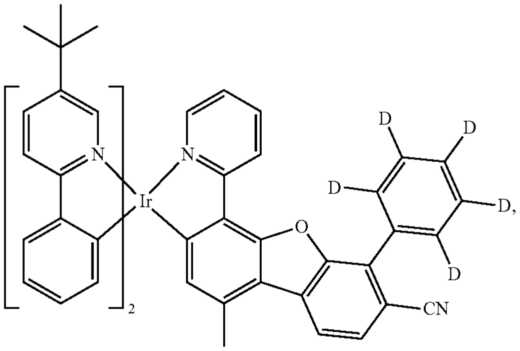

-continued

GD3

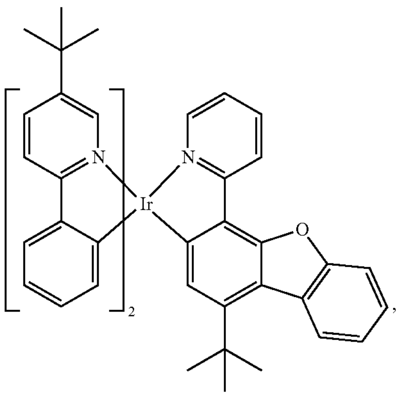

Compound ET

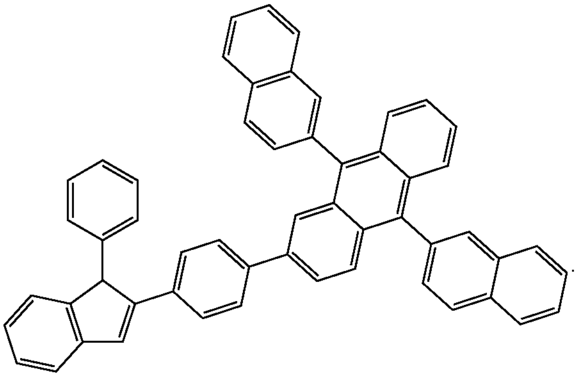

The TVL characteristics of the devices were measured. The CIE data, maximum emission wavelength ($\lambda_{max}$), full width at half maximum (FWHM), drive voltage (V), current efficiency (CE) and external quantum efficiency (EQE) of the devices were measured at a constant current of 10 mA/$cm^2$. The data are recorded and shown in Table 2.

TABLE 2

Device data in Examples 1 and 2 and Comparative Examples 1 to 3

| Device ID | CIE (x, y) | $\lambda_{max}$ (nm) | FWHM (nm) | Voltage (V) | CE (cd/A) | EQE (%) |
|---|---|---|---|---|---|---|
| Example 1 | (0.293, 0.663) | 522 | 30.1 | 3.37 | 92.89 | 24.08 |
| Example 2 | (0.299, 0.659) | 522 | 32.4 | 3.43 | 92.21 | 23.91 |
| Comparative Example 1 | (0.342, 0.634) | 531 | 35.6 | 3.38 | 92.50 | 23.46 |
| Comparative Example 2 | (0.294, 0.660) | 520 | 34.5 | 3.44 | 90.69 | 23.72 |
| Comparative Example 3 | (0.314, 0.641) | 521 | 58.3 | 3.76 | 74.75 | 19.97 |

Examples 1 and 2 differ from Comparative Examples 1 and 2 respectively only in the presence or absence of a $R_n$ group represented by Formula 2 of the present disclosure in the luminescent material. It can be seen from the data in Table 2 that compared with Comparative Examples 1 and 2, respectively, in Examples 1 and 2, the drive voltage was maintained substantially the same or slightly reduced and both the current efficiency and the external quantum efficiency were maintained substantially the same or slightly improved. However, unexpectedly, compared with the full widths at half maximum in Comparative Examples 1 and 2 that have been considered relatively narrow, the full widths at half maximum in Examples 1 and 2 were further narrowed. Compared with Comparative Example 1, the full widths at half maximum in Examples 1 and 2 were narrowed by 5.5 nm and 3.2 nm, respectively, and compared with Comparative Example 2, the full widths at half maximum in Examples 1 and 2 were narrowed by 4.4 nm and 2.1 nm, respectively. It is to be emphasized that the full widths at half maximum in Comparative Examples 1 and 2 have reached a relative high level in the industry, and it is very rare to further reduce the full widths at half maximum on the premise that the device efficiency and the voltages are maintained substantially comparable. Such a result is unexpected. With a narrower full width at half maximum, a higher color purity can be obtained, which is closer to a requirement of the industry for the luminescence performance of a green light material, indicating that with the metal complex provided in the present disclosure, a device with more excellent performance can be obtained.

Although the metal complex GD3 used in Comparative Example 3 has the substituent $R_n$ of the present disclosure, the metal complex GD3 does not have the substituent $R_1$ of the present application. From the data in Table 2, compared with Comparative Example 3, in Examples 1 and 2, the full widths at half maximum were narrowed by 28.2 nm and 25.9 nm, respectively, the EQE was improved by 20.5% and 19.7%, respectively, and the CE was improved by 24.2% and 23.3%, respectively.

Moreover, it can also be seen from the data in Table 2 that Examples 1 and 2 were blue-shifted by 9 nm compared with Comparative Example 1, but red-shifted by 2 nm compared with Comparative Example 2. Such a result is completely different from the result disclosed in CN111655705A and is an unpredictable result for those skilled in the art.

From the above, it can be seen that in the present application, the metal complex comprising both the substituents $R_1$ and $R_n$ can reduce the full width at half maximum in the case where excellent device efficiency is maintained, which is conducive to providing a high-performance device with more saturated luminescence.

Device Example 3

The implementation mode in Device Example 3 was the same as that in Device Example 1, except that in the emissive layer (EML), Metal Complex 1345 of the present disclosure was replaced with Metal Complex 2252.

Device Comparative Example 4

The implementation mode in Device Comparative Example 4 was the same as that in Device Example 1, except that in the emissive layer (EML), Metal Complex 1345 of the present disclosure was replaced with Compound GD4.

Detailed structures and thicknesses of layers of the devices are shown in the following table. A layer using more than one material is obtained by doping different compounds at their weight ratio as recorded.

TABLE 3

| Device structures in Example 3 and Comparative Example 4 | | | | | | |
|---|---|---|---|---|---|---|
| Device ID | HIL | HTL | EBL | EML | HBL | ETL |
| Example 3 | Compound HI (100 Å) | Compound HT (350 Å) | Compound PH-23 (50 Å) | Compound PH-23:Compound H-40:Metal Complex 2252 (56:38:6) (400 Å) | Compound H-2 (50 Å) | Compound ET:Liq (40:60) (350 Å) |
| Comparative Example 4 | Compound HI (100 Å) | Compound HT (350 Å) | Compound PH-23 (50 Å) | Compound PH-23:Compound H-40:Compound GD4 (56:38:6) (400 Å) | Compound H-2 (50 Å) | Compound ET:Liq (40:60) (350 Å) |

The new metal complexes used in the devices have the following structures:

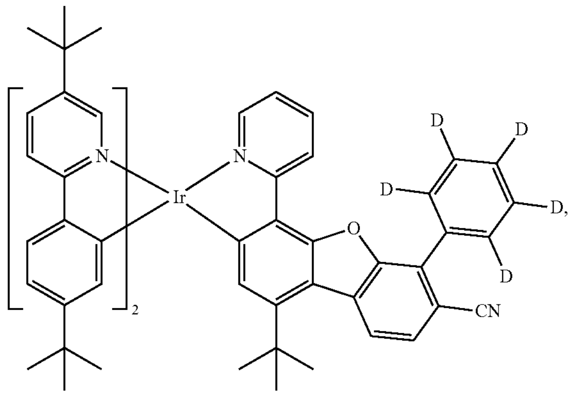

Metal Complex 2252

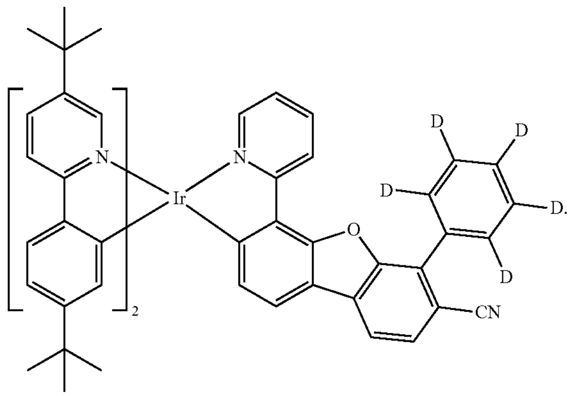

GD4

The TVL characteristics of the devices were measured. The CIE data, maximum emission wavelength ($\lambda_{max}$), full width at half maximum (FWHM), drive voltage (V), current efficiency (CE) and external quantum efficiency (EQE) of the devices were measured at 10 mA/$cm^2$. The data are recorded and shown in Table 4.

TABLE 4

| Device data in Example 3 and Comparative Example 4 | | | | | | |
|---|---|---|---|---|---|---|
| Device ID | CIE (x, y) | $\lambda_{max}$ (nm) | FWHM (nm) | Voltage (V) | CE (cd/A) | EQE (%) |
| Example 3 | (0.314, 0.651) | 525 | 33.0 | 3.77 | 89.84 | 23.05 |
| Comparative Example 4 | (0.362, 0.620) | 535 | 39.1 | 3.57 | 95.32 | 24.35 |

Example 3 differs from Comparative Example 4 only in the presence or absence of a $R_n$ group represented by Formula 2 of the present disclosure in the luminescent material. It can be seen from the data in Table 4 that although the device voltage was improved by 0.2 V and the efficiency was reduced by 5.3%, Example 3 still reached a relatively high level of greater than 23%. More importantly, the emission wavelength in Example 3 was blue-shifted by 10 nm compared with that in Comparative Example 4, and the full width at half maximum in Example 3 was narrowed by 6.1 nm compared with that in Comparative Example 4. A more blue emission wavelength and a narrower full width at half maximum in Example 3 compared with those in Comparative Example 4 can enable the device to have a wider color gamut and a higher color purity, which is closer to a requirement of the industry for the luminescence performance of a green light material, indicating that with the metal complex provided in the present disclosure, a device with more excellent performance can be obtained.

Device Example 4

The implementation mode in Device Example 4 was the same as that in Device Example 1, except that in the emissive layer (EML), Metal Complex 1345 of the present disclosure was replaced with Metal Complex 1493.

Device Comparative Example 5

The implementation mode in Device Comparative Example 5 was the same as that in Device Example 1, except that in the emissive layer (EML), Metal Complex 1345 of the present disclosure was replaced with Compound GD5.

Detailed structures and thicknesses of layers of the devices are shown in the following table. A layer using more than one material is obtained by doping different compounds at their weight ratio as recorded.

TABLE 5

| Device structures in Example 4 and Comparative Example 5 | | | | | | |
|---|---|---|---|---|---|---|
| Device ID | HIL | HTL | EBL | EML | HBL | ETL |
| Example 4 | Compound HI (100 Å) | Compound HT (350 Å) | Compound PH-23 (50 Å) | Compound PH-23:Compound H-40:Metal Complex 1493 (56:38:6) (400 Å) | Compound H-2 (50 Å) | Compound ET:Liq (40:60) (350 Å) |
| Comparative Example 5 | Compound HI (100 Å) | Compound HT (350 Å) | Compound PH-23 (50 Å) | Compound PH-23:Compound H-40:Compound GD5 (56:38:6) (400 Å) | Compound H-2 (50 Å) | Compound ET:Liq (40:60) (350 Å) |

The new metal complexes used in the devices have the following structures:

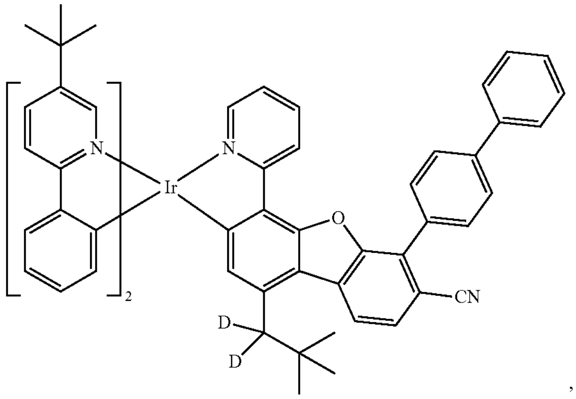

Metal Complex 1493

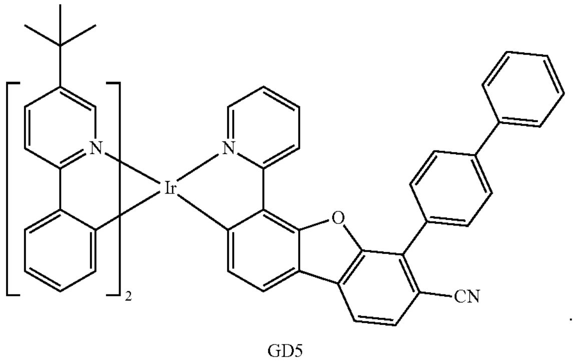

GD5

The IVL characteristics of the devices were measured. The CIE data, maximum emission wavelength ($\lambda_{max}$), full width at half maximum (FWHM), drive voltage (V), current efficiency (CE) and external quantum efficiency (EQE) of the devices were measured at a constant current of 10 mA/cm$^2$. The data are recorded and shown in Table 6.

TABLE 6

| Device data in Example 4 and Comparative Example 5 | | | | | | |
|---|---|---|---|---|---|---|
| Device ID | CIE (x, y) | $\lambda_{max}$ (nm) | FWHM (nm) | Voltage (V) | CE (cd/A) | EQE (%) |
| Example 4 | (0.295, 0.661) | 522 | 31.2 | 3.31 | 97.85 | 25.44 |
| Comparative Example 5 | (0.342, 0.635) | 532 | 34.6 | 3.43 | 100 | 25.34 |

Example 4 differs from Comparative Example 5 only in the presence or absence of a $R_n$ group represented by Formula 2 of the present disclosure in the luminescent material. It can be seen from the data in Table 6 that compared with Comparative Example 5, in Example 4, the drive voltage was reduced by 0.12 V, the current efficiency was slightly reduced, the external quantum efficiency was slightly improved, the emission wavelength was blue-shifted by 10 nm and the full width at half maximum was narrowed by 3.4 nm. Again, it indicates that the metal complex of the present disclosure can have a wider color gamut and a higher color purity on the premise that excellent device performance is maintained, which is closer to a requirement of the industry for the luminescence performance of a green light material, indicating that with the metal complex provided in the present disclosure, a device with more excellent performance can be obtained.

Examples of top-emitting devices: To study the device performance of the metal complex most approaching the BT.2020 luminescence requirement, the microcavities of the following top-emitting devices were all adjusted to CIEx=0.170, and the device performance at this time was recorded. As mentioned above about the top-emitting device, due to different refractive indexes of different metal complexes, the top-emitting devices comprising these different metal complexes may have slightly different microcavity lengths, that is, the HTLs have slightly different thicknesses.

Device Example 5

Firstly, a 0.7 mm thick glass substrate was pre-patterned with ITO 75 Å/Ag 1500 Å/ITO 150 Å as an anode, where 150 Å ITO deposited on Ag had a hole injection function. Then, the substrate was dried in a glovebox to remove moisture, mounted on a holder and transferred into a vacuum chamber. Organic layers specified below were sequentially deposited through vacuum thermal evaporation on the anode at a rate of 0.01 to 10 Å/s and a vacuum degree of about $10^{-6}$ torr. Compound HT and Compound PD were co-deposited as a hole injection layer (HIL, 97:3, 100 Å). On the HIL, Compound HT was deposited as a hole transporting layer (HTL) (where the HTL also served as a microcavity adjustment layer, and the microcavity was adjusted within a range of 1000 to 1500 Å). On the HTL, Compound PH-23 was deposited as an electron blocking layer (EBL, 50 Å). Then, Metal Complex 1493, Compound PH-1, and Compound H-40 of the present disclosure were co-deposited as an emissive layer (EML, 4:48:48, 400 Å). Compound H-2 was deposited as a hole blocking layer (HBL, 50 Å). Compound ET and Liq were co-deposited as an electron transporting layer (ETL, 40:60, 350 Å). A metal Yb was deposited as an electron injection layer (EIL, 10 Å). Metals Ag and Mg were co-deposited at a ratio of 9:1 as a cathode (140 Å). Compound CP (a material with a refractive index of about 2.01 at 530 nm) was deposited as a capping layer with a thickness of 800 Å. The device was transferred back to the glovebox and encapsulated with a glass lid in a nitrogen atmosphere to complete the device. In this example, when the microcavity was adjusted to about 1340 Å, CIEx of the device was 0.170, and $CE_{0.170}$ in this case was obtained.

Device Example 6

The implementation mode in Device Example 6 was the same as that in Device Example 5, except that in the emissive layer, Metal Complex 1493 of the present disclosure was replaced with Metal Complex 1345 of the present disclosure. In this example, when the microcavity was adjusted to about 1370 Å, CIEx of the device was 0.170, and $CE_{0.170}$ in this case was obtained.

Device Comparative Example 6

The implementation mode in Device Comparative Example 6 was the same as that in Device Example 5, except that in the emissive layer, Metal Complex 1493 of the present disclosure was replaced with Metal Complex GD5 of the present disclosure. In this example, when the microcavity was adjusted to about 1410 Å, CIEx of the device was 0.170, and $CE_{0.170}$ in this case was obtained.

Device Comparative Example 7

The implementation mode in Device Comparative Example 7 was the same as that in Device Example 5, except that in the emissive layer, Metal Complex 1493 of the present disclosure was replaced with Metal Complex GD2 of the present disclosure. In this example, when the microcavity was adjusted to about 1370 Å, CIEx of the device was 0.170, and $CE_{0.170}$ in this case was obtained.

Structures and thicknesses of part of layers of the devices are shown in the following table. A layer using more than one material is obtained by doping different compounds at their weight ratio as recorded.

Compound PD

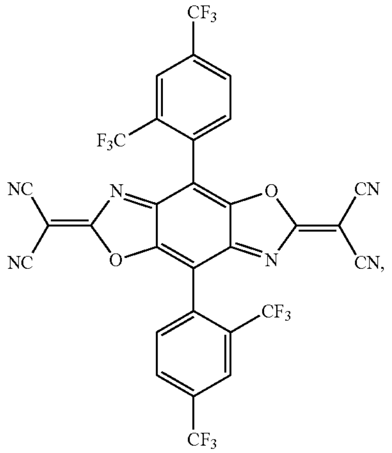

PH-1

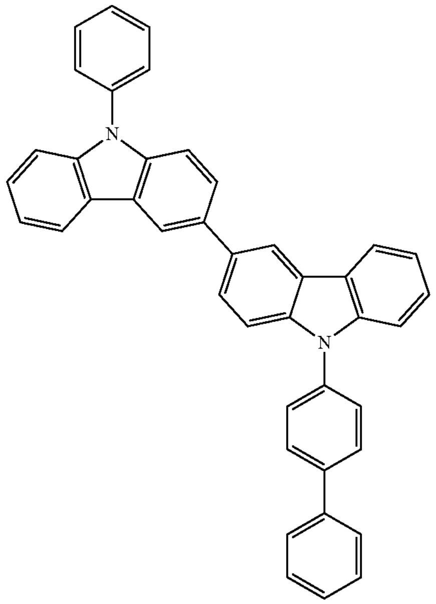

TABLE 7

Part of device structures in Examples 5 and 6 and Comparative Examples 6 and 7

| Device ID | HIL | HTL | EBL | EML | HBL | ETL |
|---|---|---|---|---|---|---|
| Example 5 | Compound HT:Compound PD (97:3) (100 Å) | Compound HT (1340 Å) | Compound PH-23 (50 Å) | Compound PH-1:Compound H-40:Metal Complex 1493 (48:48:4) (400 Å) | Compound H-2 (50 Å) | Compound ET:Liq (40:60) (350 Å) |
| Example 6 | Compound HT:Compound PD (97:3) (100 Å) | Compound HT (1370 Å) | Compound PH-23 (50 Å) | Compound PH-1:Compound H-40:Metal Complex 1345 (48:48:4) (400 Å) | Compound H-2 (50 Å) | Compound ET:Liq (40:60) (350 Å) |
| Comparative Example 6 | Compound HT:Compound PD (97:3) (100 Å) | Compound HT (1410 Å) | Compound PH-23 (50 Å) | Compound PH-1:Compound H-40:Compound GD5 (48:48:4) (400 Å) | Compound H-2 (50 Å) | Compound ET:Liq (40:60) (350 Å) |
| Comparative Example 7 | Compound HT:Compound PD (97:3) (100 Å) | Compound HT (1370 Å) | Compound PH-23 (50 Å) | Compound PH-1:Compound H-40:Compound GD2 (48:48:4) (400 Å) | Compound H-2 (50 Å) | Compound ET:Liq (40:60) (350 Å) |

The new materials used in the devices have the following structures:

The IVL characteristics of the devices were measured at a constant current of 10 mA/cm². The corresponding color coordinate, current efficiency ($CE_{0.170}$) and external quantum efficiency ($EQE_{0.170}$) of the devices are recorded when x=0.170 in the color coordinate CIE (x, y) of the devices. The data are recorded and shown in Table 8.

TABLE 8

Device data in Examples 5 and 6 and Comparative Examples 6 and 7

| Device ID | CIE (x, y) | $CE_{0.170}$ (cd/A) | $EQE_{0.170}$ (%) |
|---|---|---|---|
| Example 5 | (0.170, 0.777) | 171 | 41.29 |
| Example 6 | (0.170, 0.778) | 160 | 38.70 |
| Comparative Example 6 | (0.170, 0.780) | 147 | 35.45 |
| Comparative Example 7 | (0.170, 0.775) | 152 | 36.96 |

It can be seen from the data in Table 8 that when CIEx=0.170 in the color coordinates CIE (x, y) in Example 5 and Comparative Example 6, both the color coordinates in Example 5 and Comparative Example 6 were close to the green coordinate CIE (0.170, 0.797) in BT.2020, that is, both Example 5 and Comparative Example 6 had a relatively saturated green light emission. However, in this case, compared with Comparative Example 6, the current efficiency and the external quantum efficiency in Example 5 were improved by 16.3% and 16.4%, respectively, both of which are significantly improved. It indicates that the technical solution provided in the present disclosure is used so that a device with more excellent performance and close to the BT.2020 luminescence requirement can be obtained and excellent device performance can be maintained under the luminescence requirement.

Similarly, when CIEx=0.170 in the color coordinates CIE (x, y) in Example 6 and Comparative Example 7, both the color coordinates in Example 6 and Comparative Example 7 were close to the green coordinate CIE (0.170, 0.797) in BT.2020, that is, both Example 6 and Comparative Example 7 had a relatively saturated green light emission. However, in this case, compared with Comparative Example 7, both the current efficiency and the external quantum efficiency in Example 6 were improved by about 5%. It indicates that the technical solution provided in the present disclosure is used so that a device with more excellent performance and close to the BT.2020 luminescence requirement can be obtained and excellent device performance can be maintained under the luminescence requirement.

Device Example 7

The implementation mode in Device Example 7 was the same as that in Device Example 1, except that in the emissive layer (EML), Metal Complex 1345 of the present disclosure was replaced with Metal Complex 2262.

Device Example 8

The implementation mode in Device Example 8 was the same as that in Device Example 1, except that in the emissive layer (EML), Metal Complex 1345 of the present disclosure was replaced with Metal Complex 2164.

Device Example 9

The implementation mode in Device Example 9 was the same as that in Device Example 1, except that in the emissive layer (EML), Metal Complex 1345 of the present disclosure was replaced with Metal Complex 2394.

Device Example 10

The implementation mode in Device Example 10 was the same as that in Device Example 1, except that in the emissive layer (EML), Metal Complex 1345 of the present disclosure was replaced with Metal Complex 2955.

Device Example 11

The implementation mode in Device Example 11 was the same as that in Device Example 1, except that in the emissive layer (EML), Metal Complex 1345 of the present disclosure was replaced with Metal Complex 982.

Device Example 12

The implementation mode in Device Example 12 was the same as that in Device Example 1, except that in the emissive layer (EML), Metal Complex 1345 of the present disclosure was replaced with Metal Complex 3671.

Device Example 13

The implementation mode in Device Example 13 was the same as that in Device Example 1, except that in the emissive layer (EML), Metal Complex 1345 of the present disclosure was replaced with Metal Complex 2526, and in the HIL, Compound HI was replaced with Compound HT:Compound PD=97:3.

Device Example 14

The implementation mode in Device Example 14 was the same as that in Device Example 13, except that in the emissive layer (EML), Metal Complex 2526 of the present disclosure was replaced with Metal Complex 2657.

Device Example 15

The implementation mode in Device Example 15 was the same as that in Device Example 1, except that in the emissive layer (EML), Metal Complex 1345 of the present disclosure was replaced with Metal Complex 1371.

Device Example 16

The implementation mode in Device Example 16 was the same as that in Device Example 13, except that in the emissive layer (EML), Metal Complex 2526 of the present disclosure was replaced with Metal Complex 2393.

Device Example 17

The implementation mode in Device Example 17 was the same as that in Device Example 13, except that in the emissive layer (EML), Metal Complex 2526 of the present disclosure was replaced with Metal Complex 2921.

Device Example 18

The implementation mode in Device Example 18 was the same as that in Device Example 13, except that in the emissive layer (EML), Metal Complex 2526 of the present disclosure was replaced with Metal Complex 2249.

Detailed structures and thicknesses of layers of the devices are shown in the following table. A layer using more than one material is obtained by doping different compounds at their weight ratio as recorded.

TABLE 9

Device structures in Examples 7 to 18

| Device ID | HIL | HTL | EBL | EML | HBL | ETL |
|---|---|---|---|---|---|---|
| Example 7 | Compound HI (100 Å) | Compound HT (350 Å) | Compound PH-23 (50 Å) | Compound PH-23:Compound H-40:Metal Complex 2262 (56:38:6) (400 Å) | Compound H-2 (50 Å) | Compound ET:Liq (40:60) (350 Å) |
| Example 8 | Compound HI (100 Å) | Compound HT (350 Å) | Compound PH-23 (50 Å) | Compound PH-23:Compound H-40:Metal Complex 2164 (56:38:6) (400 Å) | Compound H-2 (50 Å) | Compound ET:Liq (40:60) (350 Å) |
| Example 9 | Compound HI (100 Å) | Compound HT (350 Å) | Compound PH-23 (50 Å) | Compound PH-23:Compound H-40:Metal Complex 2394 (56:38:6) (400 Å) | Compound H-2 (50 Å) | Compound ET:Liq (40:60) (350 Å) |
| Example 10 | Compound HI (100 Å) | Compound HT (350 Å) | Compound PH-23 (50 Å) | Compound PH-23:Compound H-40:Metal Complex 2955 (56:38:6) (400 Å) | Compound H-2 (50 Å) | Compound ET:Liq (40:60) (350 Å) |
| Example 11 | Compound HI (100 Å) | Compound HT (350 Å) | Compound PH-23 (50 Å) | Compound PH-23:Compound H-40:Metal Complex 982 (56:38:6) (400 Å) | Compound H-2 (50 Å) | Compound ET:Liq (40:60) (350 Å) |
| Example 12 | Compound HI (100 Å) | Compound HT (350 Å) | Compound PH-23 (50 Å) | Compound PH-23:Compound H-40:Metal Complex 3671 (56:38:6) (400 Å) | Compound H-2 (50 Å) | Compound ET:Liq (40:60) (350 Å) |
| Example 13 | Compound HT:Compound PD (97:3) (100 Å) | Compound HT (350 Å) | Compound PH-23 (50 Å) | Compound PH-23:Compound H-40:Metal Complex 2526 (56:38:6) (400 Å) | Compound H-2 (50 Å) | Compound ET:Liq (40:60) (350 Å) |
| Example 14 | Compound HT:Compound PD (97:3) (100 Å) | Compound HT (350 Å) | Compound PH-23 (50 Å) | Compound PH-23:Compound H-40:Metal Complex 2657 (56:38:6) (400 Å) | Compound H-2 (50 Å) | Compound ET:Liq (40:60) (350 Å) |
| Example 15 | Compound HI (100 Å) | Compound HT (350 Å) | Compound PH-23 (50 Å) | Compound PH-23:Compound H-40:Metal Complex 1371 (56:38:6) (400 Å) | Compound H-2 (50 Å) | Compound ET:Liq (40:60) (350 Å) |
| Example 16 | Compound HT:Compound PD (97:3) (100 Å) | Compound HT (350 Å) | Compound PH-23 (50 Å) | Compound PH-23:Compound H-40:Metal Complex 2393 (56:38:6) (400 Å) | Compound H-2 (50 Å) | Compound ET:Liq (40:60) (350 Å) |
| Example 17 | Compound HT:Compound PD (97:3) (100 Å) | Compound HT (350 Å) | Compound PH-23 (50 Å) | Compound PH-23:Compound H-40:Metal Complex 2921 (56:38:6) (400 Å) | Compound H-2 (50 Å) | Compound ET:Liq (40:60) (350 Å) |
| Example 18 | Compound HT:Compound PD (97:3) (100 Å) | Compound HT (350 Å) | Compound PH-23 (50 Å) | Compound PH-23:Compound H-40:Metal Complex 2249 (56:38:6) (400 Å) | Compound H-2 (50 Å) | Compound ET:Liq (40:60) (350 Å) |

The new materials used in the devices have the following structures:

Metal Complex 2262

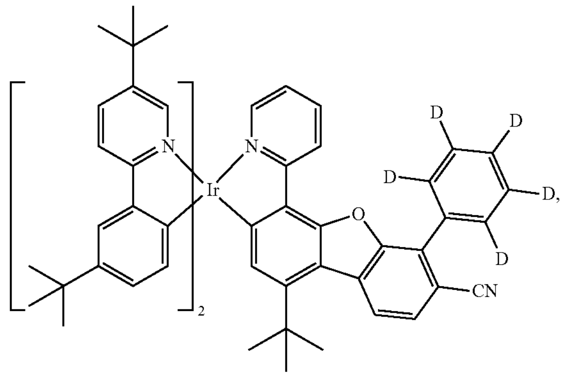

-continued

Metal Complex 2164

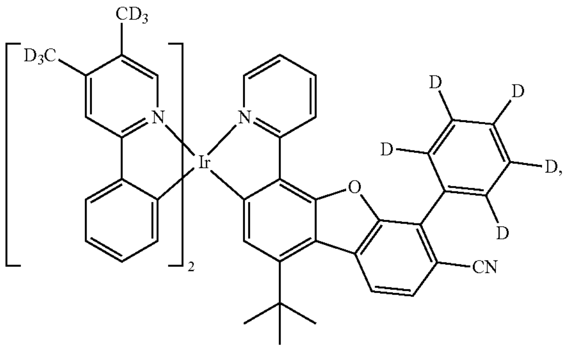

-continued
Metal Complex 2394
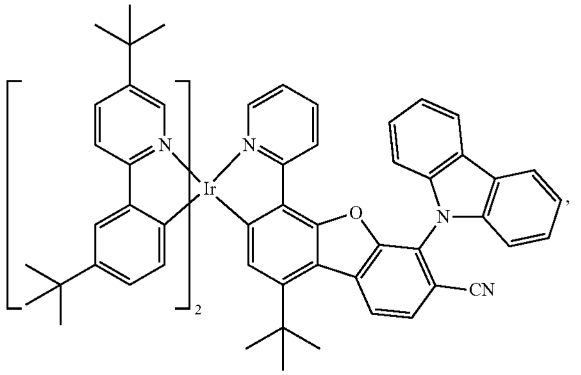
Metal Complex 2955
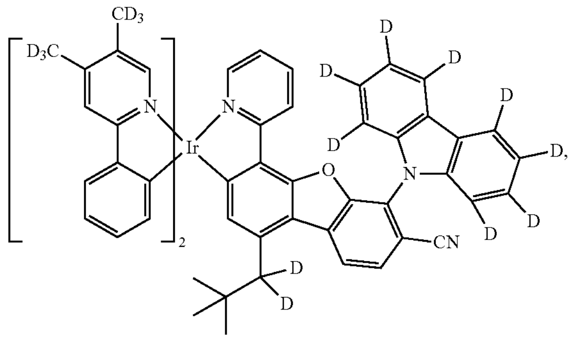
Metal Complex 982
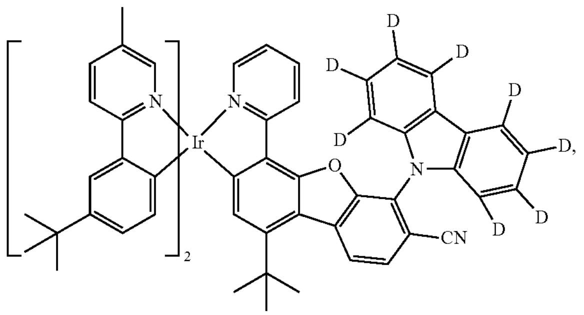
Metal Complex 3671
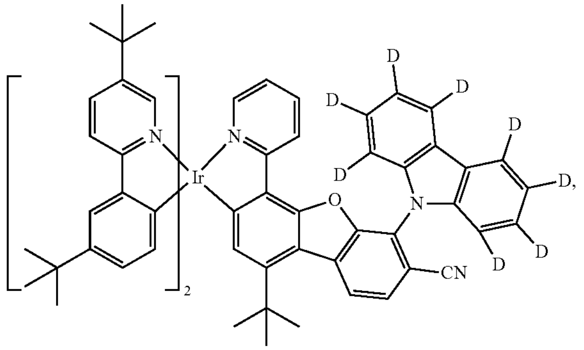
-continued
Metal Complex 2526
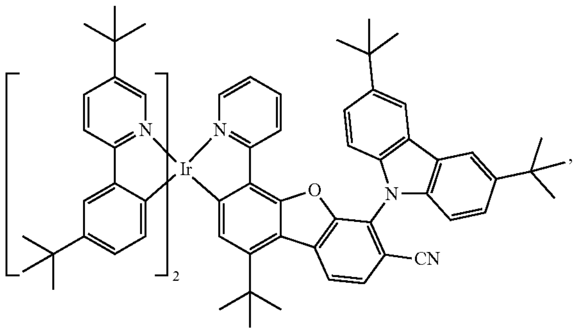
Metal Complex 2657
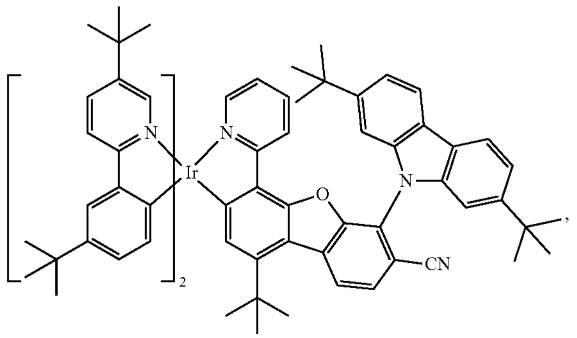
Metal Complex 1371
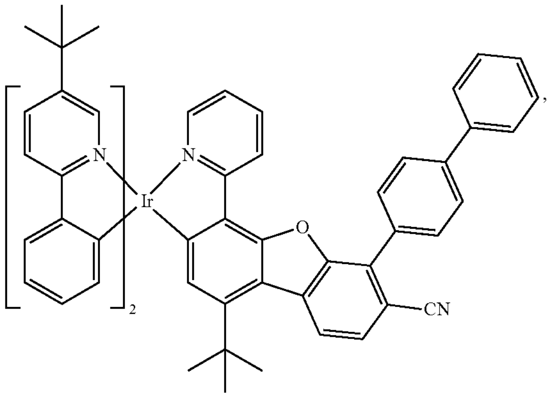
Metal Complex 2393
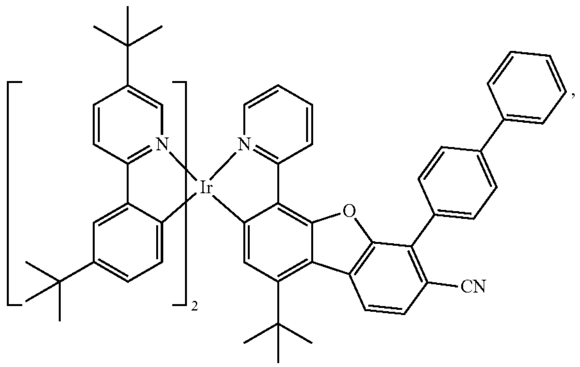

-continued

Metal Complex 2921

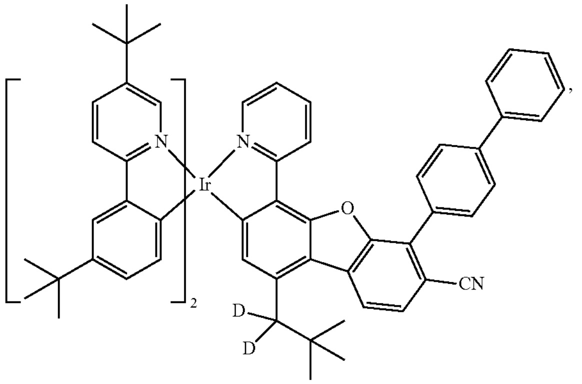

Metal Complex 2249

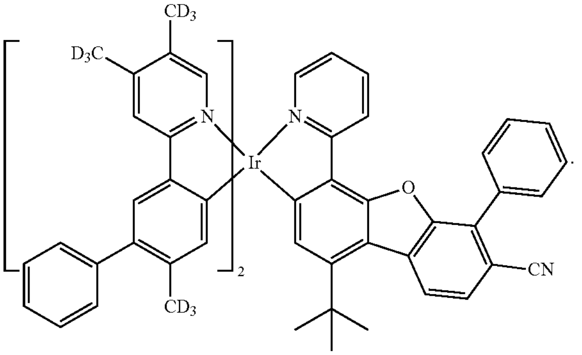

The IVL characteristics of the devices were measured. The CIE data, maximum emission wavelength ($\lambda_{max}$), full width at half maximum (FWHM), drive voltage (V), current efficiency (CE) and external quantum efficiency (EQE) of the devices were measured at a constant current of 10 mA/cm$^2$. The data are recorded and shown in Table 10.

TABLE 10

Device data in Examples 7 to 18

| Device ID | CIE (x, y) | $\lambda_{max}$ (nm) | FWHM (nm) | Voltage (V) | CE (cd/A) | EQE (%) |
|---|---|---|---|---|---|---|
| Example 7 | (0.315, 0.651) | 525 | 34.0 | 3.68 | 95.04 | 24.29 |
| Example 8 | (0.309, 0.655) | 524 | 32.0 | 3.56 | 96.3 | 24.79 |
| Example 9 | (0.312, 0.654) | 527 | 33.1 | 3.46 | 97.66 | 24.94 |
| Example 10 | (0.311, 0.653) | 525 | 34.0 | 3.60 | 100.03 | 25.64 |
| Example 11 | (0.310, 0.654) | 526 | 33.8 | 4.18 | 95.17 | 24.37 |
| Example 12 | (0.296, 0.663) | 525 | 31.1 | 3.62 | 100.22 | 25.73 |
| Example 13 | (0.309, 0.655) | 526 | 32.6 | 3.39 | 105.94 | 27.02 |
| Example 14 | (0.299, 0.662) | 525 | 29.4 | 3.64 | 106.77 | 27.25 |
| Example 15 | (0.290, 0.665) | 522 | 29.2 | 3.41 | 97.61 | 25.25 |
| Example 16 | (0.314, 0.652) | 526 | 33.3 | 3.55 | 99.32 | 25.43 |
| Example 17 | (0.318, 0.649) | 526 | 36.3 | 3.54 | 101.05 | 25.92 |
| Example 18 | (0.315, 0.650) | 525 | 34.6 | 4.35 | 96.69 | 24.84 |

As can be seen from the data in Table 10, the luminescent materials used in Examples 7 to 18 each comprised the ligand $L_a$ having a structure of Formula 1 of the present application. The devices of Examples 7 to 18 all had a deep green light emission, a narrow full width at half maximum and external quantum efficiency (EQE) of 24% or more at a deep green emission wavelength, reaching a relatively high level in the art, where Examples 10, 12 to 14 and 17 all reached external quantum efficiency (EQE) of 25.5% or more, and in particular, Examples 13 and 14 even reached surprising external quantum efficiency (EQE) of 27.02% and 27.25%, respectively. It also indicates that in the present application, the metal complexes each comprising the ligand $L_a$ having the structure of Formula 1 comprising different substituents can all obtain excellent device performance. Moreover, in the present application, the ligand $L_a$ having the structure of Formula 1 matched with different ligands Le can also obtain excellent device performance.

The above results indicate that in the present application, the metal complex comprising the ligand $L_a$ having the structure of Formula 1 comprising specific substituents $R_1$ and $R_n$ is applied to an organic electroluminescent device so that a full width at half maximum of an emission spectrum can be further reduced while high performance of the device can be maintained, the luminescence saturation of the device can be improved and the device can have high efficiency under a condition of being closer to a BT.2020 commercial luminescence requirement. Therefore, in the present application, the metal complex comprising the ligand $L_a$ having the structure of Formula 1 comprising specific substituents $R_1$ and $R_n$ is a high-performance luminescent material with a commercial application prospect.

It is to be understood that various embodiments described herein are merely examples and not intended to limit the scope of the present disclosure. Therefore, it is apparent to the persons skilled in the art that the present disclosure as claimed may include variations of specific embodiments and preferred embodiments described herein. Many of materials and structures described herein may be substituted with other materials and structures without departing from the spirit of the present disclosure. It is to be understood that various theories as to why the present disclosure works are not intended to be limitative.

What is claimed is:

1. A metal complex, comprising a metal M and a ligand $L_a$ coordinated to the metal M, wherein $L_a$ has a structure represented by Formula 1:

Formula 1

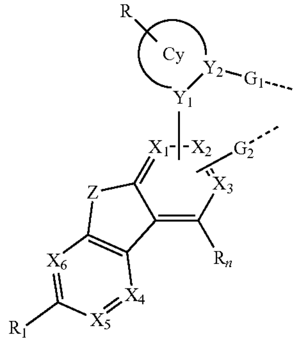

wherein in Formula 1, the ring Cy is, at each occurrence identically or differently, selected from an aromatic ring having 6 to 24 ring atoms which comprises $Y_1$ and $Y_2$, a heteroaromatic ring having 5 to 24 ring atoms which comprises $Y_1$ and $Y_2$ or a combination thereof;

$G_1$ and $G_2$ are, at each occurrence identically or differently, selected from a single bond, O or S;

$X_1$ to $X_6$ are, at each occurrence identically or differently, selected from C, $CR_x$ or N, and one of $X_1$ to $X_3$ is selected from C and joined to $Y_1$;

one of $X_1$, $X_2$ and $X_3$ is selected from N and joined to the metal through a metal-nitrogen bond, or one of $X_1$, $X_2$ and $X_3$ is selected from C and joined to the metal through $G_2$;

$Y_1$ and $Y_2$ are, at each occurrence identically or differently, selected from C or N;

Z is selected from the group consisting of O, S, Se, NR', CR'R', SiR'R' and GeR'R'; when two R' are present at the same time, the two R' are identical or different;

R represents mono-substitution, multiple substitutions or non-substitution; when a plurality of R are present, the plurality of R are identical or different;

R, $R_x$ and R' are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$R_1$ is selected from a cyano group or fluorine; and $R_n$ has a structure represented by Formula 2:

Formula 2

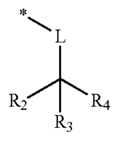

wherein in Formula 2, "*" represents a position where Formula 2 is joined to Formula 1;

L is selected from the group consisting of: a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms and combinations thereof;

$R_2$, $R_3$ and $R_4$ are, at each occurrence identically or differently, selected from the group consisting of: halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R can be optionally joined to form a ring;

adjacent substituents R' and $R_x$ can be optionally joined to form a ring; and adjacent substituents $R_2$, $R_3$ and $R_4$ can be optionally joined to form a ring.

2. The metal complex according to claim 1, wherein

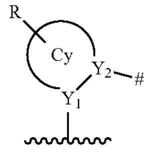

in Formula 1 is, at each occurrence identically or differently, selected from any one of the following structures:

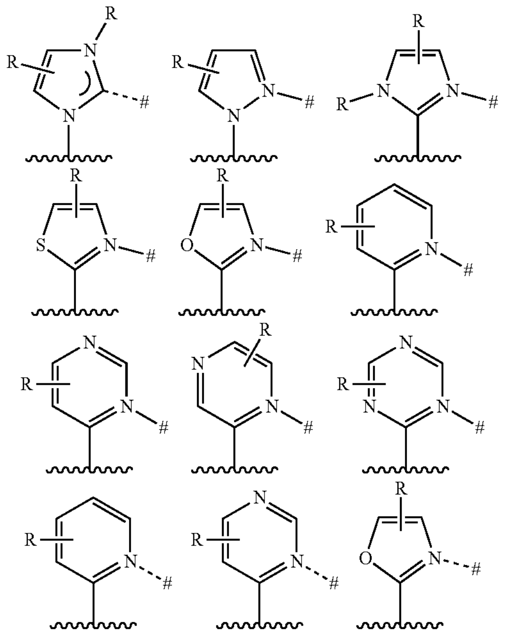

-continued

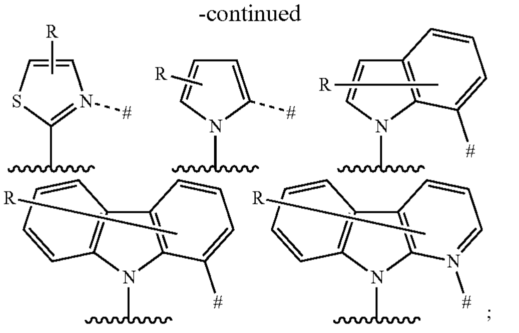

wherein

R represents, at each occurrence identically or differently, mono-substitution, multiple substitutions or non-substitution; when a plurality of R are present in any structure, the plurality of R are identical or different;

R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R can be optionally joined to form a ring; and

"#" represents a position where $G_1$ is joined, and

“  ”

represents a position where $X_1$, $X_2$ or $X_3$ is joined.

3. The metal complex according to claim 1, wherein the metal complex has a general formula of $M(L_a)_m(L_b)_n(L_c)_q$;

$L_a$, $L_b$ and $L_c$ are a first ligand, a second ligand and a third ligand coordinated to the metal M, respectively, and $L_c$ is the same as or different from $L_a$ or $L_b$, wherein $L_a$, $L_b$ and $L_c$ can be optionally joined to form a multidentate ligand;

m is selected from 1, 2 or 3, n is selected from 0, 1 or 2, q is selected from 0, 1 or 2, and m+n+q is equal to an oxidation state of the metal M; when m is greater than or equal to 2, a plurality of $L_a$ are identical or different; when n is equal to 2, two $L_b$ are identical or different; when q is equal to 2, two $L_c$ are identical or different;

$L_b$ and $L_c$ are, at each occurrence identically or differently, selected from a structure represented by any one of the group consisting of:

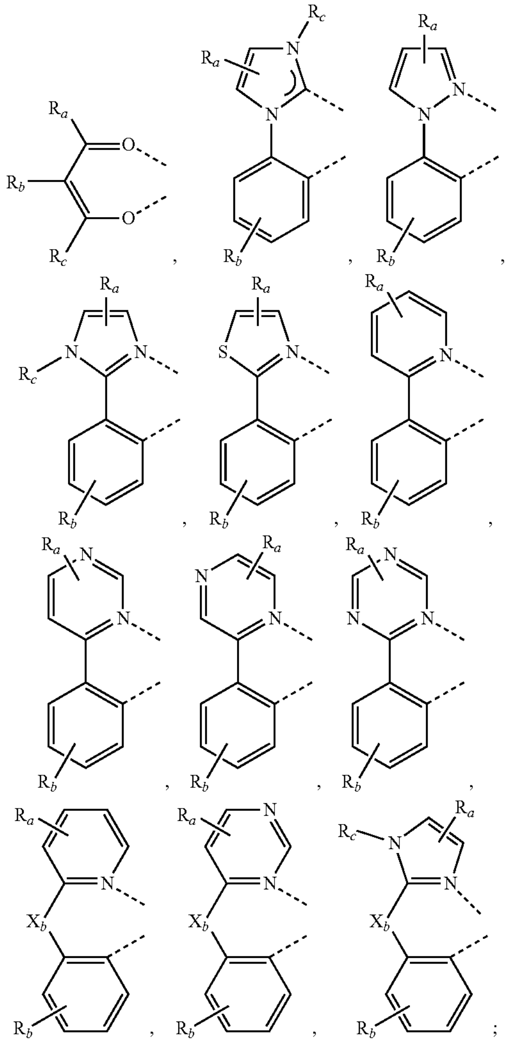

wherein $X_b$ is, at each occurrence identically or differently, selected from the group consisting of: O, S, Se, $NR_{N1}$ and $CR_{C1}R_{C2}$;

$R_a$ and $R_b$ represent, at each occurrence identically or differently, mono-substitution, multiple substitutions or non-substitution;

$R_a$, $R_b$, $R_c$, $R_{N1}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and adjacent substituents $R_a$, $R_b$, $R_c$, $R_{N1}$, $R_{C1}$ and $R_{C2}$ can be optionally joined to form a ring.

4. The metal complex according to claim 1, wherein the metal M is, at each occurrence identically or differently, selected from the group consisting of Cu, Ag, Au, Ru, Rh, Pd, Os, Ir and Pt; and preferably, the metal M is, at each occurrence identically or differently, selected from Pt or Ir.

5. The metal complex according to claim 1, wherein Z is selected from O or S; preferably, Z is selected from O.

6. The metal complex according to claim 1, wherein the metal complex has a general formula structure of $Ir(L_a)_m(L_b)_{3-m}$, and the structure is represented by Formula 3:

Formula 3

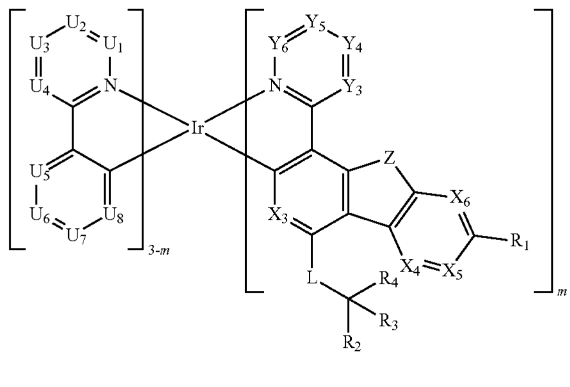

wherein m is selected from 1, 2 or 3; when m is selected from 1, two Le are identical or different; when m is selected from 2 or 3, a plurality of $L_a$ are identical or different;

Z is selected from the group consisting of O, S, Se, NR', CR'R', SiR'R' and GeR'R'; when two R' are present at the same time, the two R' are identical or different;

$U_1$ to $U_8$ are, at each occurrence identically or differently, selected from $CR_u$ or N;

$X_3$ to $X_6$ are, at each occurrence identically or differently, selected from $CR_x$ or N;

$Y_3$ to $Y_6$ are, at each occurrence identically or differently, selected from CR or N;

$R_1$ is selected from a cyano group or fluorine;

R', $R_u$, $R_x$ and R are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

L is selected from the group consisting of: a single bond, substituted or unsubstituted alkylene having 1 to 20 carbon atoms, substituted or unsubstituted cycloalkylene having 3 to 20 carbon atoms, substituted or unsubstituted arylene having 6 to 30 carbon atoms, substituted or unsubstituted heteroarylene having 3 to 30 carbon atoms and combinations thereof;

$R_2$, $R_3$ and $R_4$ are, at each occurrence identically or differently, selected from the group consisting of: halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents $R_u$ can be optionally joined to form a ring;

adjacent substituents R can be optionally joined to form a ring;

adjacent substituents R' and $R_x$ can be optionally joined to form a ring; and adjacent substituents $R_2$, $R_3$ and $R_4$ can be optionally joined to form a ring.

7. The metal complex according to claim 1, wherein L is selected from the group consisting of: a single bond, substituted or unsubstituted alkylene having 1 to 6 carbon atoms, substituted or unsubstituted cycloalkylene having 4 to 10 carbon atoms, substituted or unsubstituted arylene having 6 to 12 carbon atoms and combinations thereof; and preferably, L is selected from a single bond and substituted or unsubstituted methylene.

8. The metal complex according to claim 1, wherein $R_2$, $R_3$ and $R_4$ are, at each occurrence identically or differently, selected from the group consisting of: halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, a cyano group and combinations thereof;

preferably, $R_2$, $R_3$ and $R_4$ are, at each occurrence identically or differently, selected from the group consisting of: fluorine, substituted or unsubstituted alkyl having 1 to 20 carbon atoms, substituted or unsubstituted aryl having 6 to 30 carbon atoms, a cyano group and combinations thereof; and more preferably, $R_2$, $R_3$ and $R_4$ are, at each occurrence identically or differently, selected from substituted or unsubstituted alkyl having 1 to 20 carbon atoms.

9. The metal complex according to claim 6, wherein $X_3$ to $X_6$ are, at each occurrence identically or differently, selected from $CR_x$, and/or $Y_3$ to $Y_6$ are, at each occurrence identically or differently, selected from CR, and/or $U_1$ to $U_8$ are, at each occurrence identically or differently, selected from $CR_u$;

$R_x$, R and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted alkylgermanyl having 3 to 20 carbon atoms, a cyano group and combinations thereof;

preferably, $R_x$, R and $R_u$ are, at each occurrence identically or differently, selected from the group consisting of: hydrogen, deuterium, fluorine, substituted or unsubstituted alkyl having 1 to 6 carbon atoms, substituted or unsubstituted cycloalkyl having 3 to 6 ring carbon atoms, substituted or unsubstituted aryl having 6 to 12 carbon atoms, substituted or unsubstituted heteroaryl having 3 to 12 carbon atoms, substituted or unsubstituted alkylsilyl having 3 to 12 carbon atoms, substituted or unsubstituted alkylgermanyl having 3 to 12 carbon atoms, a cyano group and combinations thereof; and more preferably, $R_x$, R and $R_u$ are, at each occurrence identically or differently, selected from the group consisting of: hydrogen, deuterium, fluorine, a cyano group, methyl, ethyl, propyl, isopropyl, n-butyl, isobutyl, neopentyl, t-butyl, cyclopentyl, cyclohexyl, deuterated methyl, deuterated ethyl, deuterated propyl, deuterated isopropyl, deuterated n-butyl, deuterated isobutyl, deuterated neopentyl, deuterated t-butyl, deuterated cyclopentyl, deuterated cyclohexyl, phenyl, pyridyl, trimethylsilyl, trimethylgermanyl and combinations thereof.

10. The metal complex according to claim 6, wherein $Y_3$ to $Y_6$ are, at each occurrence identically or differently, CR or N, at least one of $Y_3$ to $Y_6$ is selected from CR, and R is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and combinations thereof; and preferably, R is selected from the group consisting of: deuterium, fluorine, substituted or unsubstituted alkyl having 1 to 6 carbon atoms, substituted or unsubstituted cycloalkyl having 3 to 6 ring carbon atoms, substituted or unsubstituted aryl having 6 to 12 carbon atoms and combinations thereof.

11. The metal complex according to claim 6, wherein at least one of $X_3$ to $X_6$ is selected from $CR_x$, and $R_x$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

preferably, $X_6$ is selected from $CR_x$, and $R_x$ is selected from the group consisting of: deuterium, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and combinations thereof; and more preferably, $X_6$ is selected from $CR_x$, and $R_x$ is selected from substituted or unsubstituted aryl having 6 to 18 carbon atoms, substituted or unsubstituted heteroaryl having 3 to 18 carbon atoms or a combination thereof.

12. The metal complex according to claim 1, wherein $R_n$ is, at each occurrence identically or differently, selected from the group consisting of:

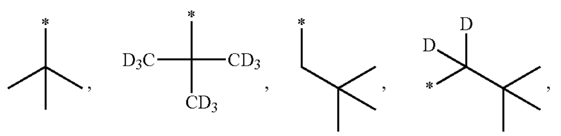

-continued

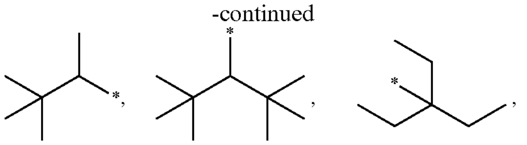

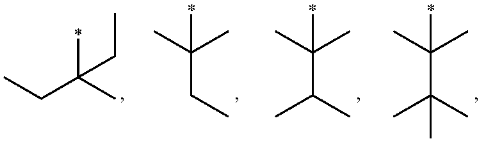

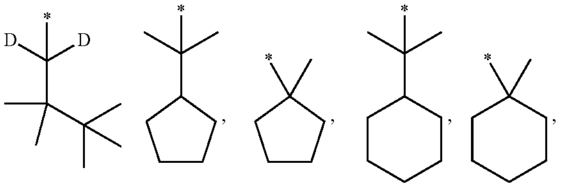

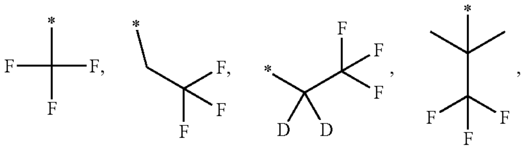

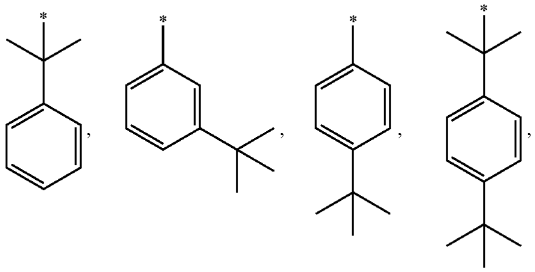

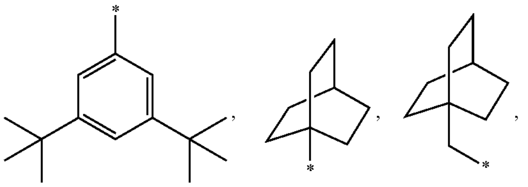

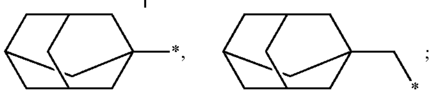

wherein optionally, hydrogens in the above $R_u$ can be partially or fully substituted with deuterium.

13. The metal complex according to claim 6, wherein at least one or at least two of $U_1$ to $U_8$ are selected from $CR_u$, $R_u$ is selected from substituted or unsubstituted alkyl having 1 to 20 carbon atoms, substituted or unsubstituted cycloalkyl having 3 to 20 ring carbon atoms or a combination thereof, and the total number of carbon atoms in all of $R_u$ is at least 4; and preferably, at least one or at least two of $U_1$ to $U_4$ and/or $U_5$ to $U_8$ are selected from $CR_u$, $R_u$ is selected from substituted or unsubstituted alkyl having 1 to 20 carbon atoms, substituted or unsubstituted cycloalkyl having 3 to 20 ring carbon atoms or a combination thereof, and the total number of carbon atoms in all of $R_u$ is at least 4.

14. The metal complex according to claim 6, wherein at least one of $U_1$ to $U_4$ is selected from $CR_u$, at least one of $Y_3$ to $Y_6$ is selected from CR, $R_u$ and R are selected from substituted or unsubstituted alkyl having 1 to 20 carbon atoms, substituted or unsubstituted cycloalkyl having 3 to 20 ring carbon atoms or a combination thereof, and the total number of carbon atoms in $R_u$ and R is greater than or equal to 2; or at least one of $U_5$ to $U_8$ is selected from $CR_u$, at least one of $Y_3$ to $Y_6$ is selected from CR, $R_u$ and R are selected from substituted or unsubstituted alkyl having 1 to 20 carbon atoms, substituted or unsubstituted cycloalkyl having 3 to 20 ring carbon atoms or a combination thereof, and the total number of carbon atoms in $R_u$ and R is greater than or equal to 2; or at least one of $U_1$ to $U_4$ is selected from $CR_u$, at least one of $U_5$ to $U_8$ is selected from $CR_u$, $R_u$ is selected from substituted or unsubstituted alkyl having 1 to 20 carbon atoms, substituted or unsubstituted cycloalkyl having 3 to 20 ring carbon atoms or a combination thereof, and the total number of carbon atoms in $R_u$ is greater than or equal to 2.

15. The metal complex according to claim 1, wherein $L_a$ is, at each occurrence identically or differently, selected from the group consisting of $L_{a1}$ to $L_{a3530}$;

wherein $L_{a1}$ to $L_{a3457}$ each have the following structure:

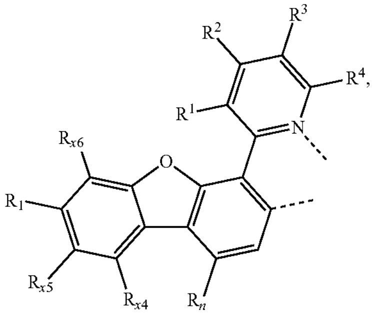

wherein $R_1$, $R_n$, $R_{x4}$, $R_{x5}$, $R_{x6}$ and $R^1$ to $R^4$ are selected from the atoms or groups in the following table:

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a1}$ | P6 | CN | H | H | H | H | H | H | H |
| $L_{a2}$ | P6 | CN | H | H | H | H | P1 | H | H |
| $L_{a3}$ | P6 | CN | H | H | H | H | P2 | H | H |
| $L_{a4}$ | P6 | CN | H | H | H | H | P3 | H | H |
| $L_{a5}$ | P6 | CN | H | H | H | H | P4 | H | H |
| $L_{a6}$ | P6 | CN | H | H | H | H | P5 | H | H |
| $L_{a7}$ | P6 | CN | H | H | H | H | P6 | H | H |
| $L_{a8}$ | P6 | CN | H | H | H | H | P7 | H | H |
| $L_{a9}$ | P6 | CN | H | H | H | H | P8 | H | H |
| $L_{a10}$ | P6 | CN | H | H | H | H | P9 | H | H |
| $L_{a11}$ | P6 | CN | H | H | H | H | P10 | H | H |
| $L_{a12}$ | P6 | CN | H | H | H | H | P11 | H | H |
| $L_{a13}$ | P6 | CN | H | H | H | H | P12 | H | H |
| $L_{a14}$ | P6 | CN | H | H | H | H | P13 | H | H |
| $L_{a15}$ | P6 | CN | H | H | H | H | P14 | H | H |
| $L_{a16}$ | P6 | CN | H | H | H | H | P15 | H | H |
| $L_{a17}$ | P6 | CN | H | H | H | H | P16 | H | H |
| $L_{a18}$ | P6 | CN | H | H | H | H | P17 | H | H |
| $L_{a19}$ | P6 | CN | H | H | H | H | P18 | H | H |
| $L_{a20}$ | P6 | CN | H | H | H | H | P19 | H | H |
| $L_{a21}$ | P6 | CN | H | H | H | H | P20 | H | H |
| $L_{a22}$ | P6 | CN | H | H | H | H | P21 | H | H |
| $L_{a23}$ | P6 | CN | H | H | H | H | P1 | F | H |
| $L_{a24}$ | P6 | CN | H | H | H | H | P2 | F | H |
| $L_{a25}$ | P6 | CN | H | H | H | H | P3 | F | H |
| $L_{a26}$ | P6 | CN | H | H | H | H | P4 | F | H |
| $L_{a27}$ | P6 | CN | H | H | H | H | P5 | F | H |
| $L_{a28}$ | P6 | CN | H | H | H | H | P6 | F | H |
| $L_{a29}$ | P6 | CN | H | H | H | H | P7 | F | H |
| $L_{a30}$ | P6 | CN | H | H | H | H | P8 | F | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a31}$ | P6 | CN | H | H | H | H | P9 | F | H |
| $L_{a32}$ | P6 | CN | H | H | H | H | P10 | F | H |
| $L_{a33}$ | P6 | CN | H | H | H | H | P11 | F | H |
| $L_{a34}$ | P6 | CN | H | H | H | H | P12 | F | H |
| $L_{a35}$ | P6 | CN | H | H | H | H | P13 | F | H |
| $L_{a36}$ | P6 | CN | H | H | H | H | P14 | F | H |
| $L_{a37}$ | P6 | CN | H | H | H | H | P15 | F | H |
| $L_{a38}$ | P6 | CN | H | H | H | H | P16 | F | H |
| $L_{a39}$ | P6 | CN | H | H | H | H | P17 | F | H |
| $L_{a40}$ | P6 | CN | H | H | H | H | P18 | F | H |
| $L_{a41}$ | P6 | CN | H | H | H | H | P19 | F | H |
| $L_{a42}$ | P6 | CN | H | H | H | H | P20 | F | H |
| $L_{a43}$ | P6 | CN | H | H | H | H | P21 | F | H |
| $L_{a44}$ | P6 | CN | H | H | H | H | H | P1 | H |
| $L_{a45}$ | P6 | CN | H | H | H | H | H | P2 | H |
| $L_{a46}$ | P6 | CN | H | H | H | H | H | P3 | H |
| $L_{a47}$ | P6 | CN | H | H | H | H | H | P4 | H |
| $L_{a48}$ | P6 | CN | H | H | H | H | H | P5 | H |
| $L_{a49}$ | P6 | CN | H | H | H | H | H | P6 | H |
| $L_{a50}$ | P6 | CN | H | H | H | H | H | P7 | H |
| $L_{a51}$ | P6 | CN | H | H | H | H | H | P8 | H |
| $L_{a52}$ | P6 | CN | H | H | H | H | H | P9 | H |
| $L_{a53}$ | P6 | CN | H | H | H | H | H | P10 | H |
| $L_{a54}$ | P6 | CN | H | H | H | H | H | P11 | H |
| $L_{a55}$ | P6 | CN | H | H | H | H | H | P12 | H |
| $L_{a56}$ | P6 | CN | H | H | H | H | H | P13 | H |
| $L_{a57}$ | P6 | CN | H | H | H | H | H | P14 | H |
| $L_{a58}$ | P6 | CN | H | H | H | H | H | P15 | H |
| $L_{a59}$ | P6 | CN | H | H | H | H | H | P16 | H |
| $L_{a60}$ | P6 | CN | H | H | H | H | H | P17 | H |
| $L_{a61}$ | P6 | CN | H | H | H | H | H | P18 | H |
| $L_{a62}$ | P6 | CN | H | H | H | H | H | P19 | H |
| $L_{a63}$ | P6 | CN | H | H | H | H | H | P20 | H |
| $L_{a64}$ | P6 | CN | H | H | H | H | H | P21 | H |
| $L_{a65}$ | P6 | CN | H | H | H | H | F | P1 | H |
| $L_{a66}$ | P6 | CN | H | H | H | H | F | P2 | H |
| $L_{a67}$ | P6 | CN | H | H | H | H | F | P3 | H |
| $L_{a68}$ | P6 | CN | H | H | H | H | F | P4 | H |
| $L_{a69}$ | P6 | CN | H | H | H | H | F | P5 | H |
| $L_{a70}$ | P6 | CN | H | H | H | H | F | P6 | H |
| $L_{a71}$ | P6 | CN | H | H | H | H | F | P7 | H |
| $L_{a72}$ | P6 | CN | H | H | H | H | F | P8 | H |
| $L_{a73}$ | P6 | CN | H | H | H | H | F | P9 | H |
| $L_{a74}$ | P6 | CN | H | H | H | H | F | P10 | H |
| $L_{a75}$ | P6 | CN | H | H | H | H | F | P11 | H |
| $L_{a76}$ | P6 | CN | H | H | H | H | F | P12 | H |
| $L_{a77}$ | P6 | CN | H | H | H | H | F | P13 | H |
| $L_{a78}$ | P6 | CN | H | H | H | H | F | P14 | H |
| $L_{a79}$ | P6 | CN | H | H | H | H | F | P15 | H |
| $L_{a80}$ | P6 | CN | H | H | H | H | F | P16 | H |
| $L_{a81}$ | P6 | CN | H | H | H | H | F | P17 | H |
| $L_{a82}$ | P6 | CN | H | H | H | H | F | P18 | H |
| $L_{a83}$ | P6 | CN | H | H | H | H | F | P19 | H |
| $L_{a84}$ | P6 | CN | H | H | H | H | F | P20 | H |
| $L_{a85}$ | P6 | CN | H | H | H | H | F | P21 | H |
| $L_{a86}$ | P6 | CN | H | H | H | H | P1 | P1 | H |
| $L_{a87}$ | P6 | CN | H | H | H | H | P1 | P3 | H |
| $L_{a88}$ | P6 | CN | H | H | H | H | P1 | P8 | H |
| $L_{a89}$ | P6 | CN | H | H | H | H | P1 | P10 | H |
| $L_{a90}$ | P6 | CN | H | H | H | H | P1 | P20 | H |
| $L_{a91}$ | P6 | CN | H | H | H | H | P1 | P21 | H |
| $L_{a92}$ | P6 | CN | H | H | H | H | P2 | P2 | H |
| $L_{a93}$ | P6 | CN | H | H | H | H | P2 | P4 | H |
| $L_{a94}$ | P6 | CN | H | H | H | H | P2 | P5 | H |
| $L_{a95}$ | P6 | CN | H | H | H | H | P2 | P9 | H |
| $L_{a96}$ | P6 | CN | H | H | H | H | P2 | P11 | H |
| $L_{a97}$ | P6 | CN | H | H | H | H | P2 | P20 | H |
| $L_{a98}$ | P6 | CN | H | H | H | H | P2 | P21 | H |
| $L_{a99}$ | P6 | CN | H | H | H | D | D | D | D |
| $L_{a100}$ | P6 | CN | H | H | H | D | F | D | D |
| $L_{a101}$ | P6 | CN | H | H | H | D | D | F | D |
| $L_{a102}$ | P6 | CN | H | H | H | D | P2 | D | D |
| $L_{a103}$ | P6 | CN | H | H | H | D | D | P2 | D |
| $L_{a104}$ | P6 | CN | H | H | H | D | P2 | P2 | D |
| $L_{a105}$ | P6 | CN | H | H | D | H | H | H | H |
| $L_{a106}$ | P6 | CN | H | H | D | H | P6 | H | H |
| $L_{a107}$ | P6 | CN | H | H | D | H | P2 | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a108}$ | P6 | CN | H | H | D | H | P5 | H | H |
| $L_{a109}$ | P6 | CN | H | H | D | H | P10 | H | H |
| $L_{a110}$ | P6 | CN | H | H | D | H | P11 | H | H |
| $L_{a111}$ | P6 | CN | H | H | D | H | H | P6 | H |
| $L_{a112}$ | P6 | CN | H | H | D | H | H | P2 | H |
| $L_{a113}$ | P6 | CN | H | H | D | H | H | P4 | H |
| $L_{a114}$ | P6 | CN | H | H | D | H | H | P5 | H |
| $L_{a115}$ | P6 | CN | H | H | D | H | H | P10 | H |
| $L_{a116}$ | P6 | CN | H | H | D | H | H | P11 | H |
| $L_{a117}$ | P6 | CN | H | H | D | H | P1 | F | H |
| $L_{a118}$ | P6 | CN | H | H | D | H | P2 | F | H |
| $L_{a119}$ | P6 | CN | H | H | D | H | P11 | F | H |
| $L_{a120}$ | P6 | CN | H | H | D | H | F | P1 | H |
| $L_{a121}$ | P6 | CN | H | H | D | H | F | P2 | H |
| $L_{a122}$ | P6 | CN | H | H | D | H | F | P3 | H |
| $L_{a123}$ | P6 | CN | H | H | D | H | F | P4 | H |
| $L_{a124}$ | P6 | CN | H | H | D | H | F | P5 | H |
| $L_{a125}$ | P6 | CN | H | H | D | H | F | P8 | H |
| $L_{a126}$ | P6 | CN | H | H | D | H | F | P11 | H |
| $L_{a127}$ | P6 | CN | H | H | D | H | P1 | P1 | H |
| $L_{a128}$ | P6 | CN | H | H | D | H | P2 | P2 | H |
| $L_{a129}$ | P6 | CN | H | H | D | H | P2 | P2 | D |
| $L_{a130}$ | P6 | CN | H | H | P20 | H | H | H | H |
| $L_{a131}$ | P6 | CN | H | H | P20 | H | P1 | H | H |
| $L_{a132}$ | P6 | CN | H | H | P20 | H | P2 | H | H |
| $L_{a133}$ | P6 | CN | H | H | P20 | H | P3 | H | H |
| $L_{a134}$ | P6 | CN | H | H | P20 | H | P4 | H | H |
| $L_{a135}$ | P6 | CN | H | H | P20 | H | P5 | H | H |
| $L_{a136}$ | P6 | CN | H | H | P20 | H | P6 | H | H |
| $L_{a137}$ | P6 | CN | H | H | P20 | H | P7 | H | H |
| $L_{a138}$ | P6 | CN | H | H | P20 | H | P8 | H | H |
| $L_{a139}$ | P6 | CN | H | H | P20 | H | P9 | H | H |
| $L_{a140}$ | P6 | CN | H | H | P20 | H | P10 | H | H |
| $L_{a141}$ | P6 | CN | H | H | P20 | H | P11 | H | H |
| $L_{a142}$ | P6 | CN | H | H | P20 | H | P12 | H | H |
| $L_{a143}$ | P6 | CN | H | H | P20 | H | P13 | H | H |
| $L_{a144}$ | P6 | CN | H | H | P20 | H | P14 | H | H |
| $L_{a145}$ | P6 | CN | H | H | P20 | H | P15 | H | H |
| $L_{a146}$ | P6 | CN | H | H | P20 | H | P16 | H | H |
| $L_{a147}$ | P6 | CN | H | H | P20 | H | P17 | H | H |
| $L_{a148}$ | P6 | CN | H | H | P20 | H | P18 | H | H |
| $L_{a149}$ | P6 | CN | H | H | P20 | H | P19 | H | H |
| $L_{a150}$ | P6 | CN | H | H | P20 | H | P20 | H | H |
| $L_{a151}$ | P6 | CN | H | H | P20 | H | P21 | H | H |
| $L_{a152}$ | P6 | CN | H | H | P20 | H | H | P1 | H |
| $L_{a153}$ | P6 | CN | H | H | P20 | H | H | P2 | H |
| $L_{a154}$ | P6 | CN | H | H | P20 | H | H | P3 | H |
| $L_{a155}$ | P6 | CN | H | H | P20 | H | H | P4 | H |
| $L_{a156}$ | P6 | CN | H | H | P20 | H | H | P5 | H |
| $L_{a157}$ | P6 | CN | H | H | P20 | H | H | P6 | H |
| $L_{a158}$ | P6 | CN | H | H | P20 | H | H | P7 | H |
| $L_{a159}$ | P6 | CN | H | H | P20 | H | H | P8 | H |
| $L_{a160}$ | P6 | CN | H | H | P20 | H | H | P9 | H |
| $L_{a161}$ | P6 | CN | H | H | P20 | H | H | P10 | H |
| $L_{a162}$ | P6 | CN | H | H | P20 | H | H | P11 | H |
| $L_{a163}$ | P6 | CN | H | H | P20 | H | H | P12 | H |
| $L_{a164}$ | P6 | CN | H | H | P20 | H | H | P15 | H |
| $L_{a165}$ | P6 | CN | H | H | P20 | H | H | P17 | H |
| $L_{a166}$ | P6 | CN | H | H | P20 | H | H | P18 | H |
| $L_{a167}$ | P6 | CN | H | H | P20 | H | H | P19 | H |
| $L_{a168}$ | P6 | CN | H | H | P20 | H | H | P20 | H |
| $L_{a169}$ | P6 | CN | H | H | P20 | H | H | P21 | H |
| $L_{a170}$ | P6 | CN | H | H | P20 | H | F | H | H |
| $L_{a171}$ | P6 | CN | H | H | P20 | H | F | P1 | H |
| $L_{a172}$ | P6 | CN | H | H | P20 | H | F | P2 | H |
| $L_{a173}$ | P6 | CN | H | H | P20 | H | F | P3 | H |
| $L_{a174}$ | P6 | CN | H | H | P20 | H | F | P4 | H |
| $L_{a175}$ | P6 | CN | H | H | P20 | H | F | P5 | H |
| $L_{a176}$ | P6 | CN | H | H | P20 | H | F | P6 | H |
| $L_{a177}$ | P6 | CN | H | H | P20 | H | F | P7 | H |
| $L_{a178}$ | P6 | CN | H | H | P20 | H | F | P8 | H |
| $L_{a179}$ | P6 | CN | H | H | P20 | H | F | P9 | H |
| $L_{a180}$ | P6 | CN | H | H | P20 | H | F | P10 | H |
| $L_{a181}$ | P6 | CN | H | H | P20 | H | F | P11 | H |
| $L_{a182}$ | P6 | CN | H | H | P20 | H | P1 | F | H |
| $L_{a183}$ | P6 | CN | H | H | P20 | H | P2 | F | H |
| $L_{a184}$ | P6 | CN | H | H | P20 | H | P3 | F | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a185}$ | P6 | CN | H | H | P20 | H | P4 | F | H |
| $L_{a186}$ | P6 | CN | H | H | P20 | H | P5 | F | H |
| $L_{a187}$ | P6 | CN | H | H | P20 | H | P6 | F | H |
| $L_{a188}$ | P6 | CN | H | H | P20 | H | P7 | F | H |
| $L_{a189}$ | P6 | CN | H | H | P20 | H | P8 | F | H |
| $L_{a190}$ | P6 | CN | H | H | P20 | H | P9 | F | H |
| $L_{a191}$ | P6 | CN | H | H | P20 | H | P10 | F | H |
| $L_{a192}$ | P6 | CN | H | H | P20 | H | P11 | F | H |
| $L_{a193}$ | P6 | CN | H | H | P20 | H | P1 | P1 | H |
| $L_{a194}$ | P6 | CN | H | H | P20 | H | P2 | P2 | H |
| $L_{a195}$ | P6 | CN | H | H | P20 | D | D | D | D |
| $L_{a196}$ | P6 | CN | H | H | P20 | D | P2 | P2 | D |
| $L_{a197}$ | P6 | CN | H | H | P20 | D | F | P4 | D |
| $L_{a198}$ | P6 | CN | H | H | P20 | D | F | P5 | D |
| $L_{a199}$ | P6 | CN | H | H | P20 | D | F | P9 | D |
| $L_{a200}$ | P6 | CN | H | H | P20 | D | F | P11 | D |
| $L_{a201}$ | P6 | CN | H | H | P21 | H | H | H | H |
| $L_{a202}$ | P6 | CN | H | H | P21 | H | P1 | H | H |
| $L_{a203}$ | P6 | CN | H | H | P21 | H | P2 | H | H |
| $L_{a204}$ | P6 | CN | H | H | P21 | H | P3 | H | H |
| $L_{a205}$ | P6 | CN | H | H | P21 | H | P4 | H | H |
| $L_{a206}$ | P6 | CN | H | H | P21 | H | P5 | H | H |
| $L_{a207}$ | P6 | CN | H | H | P21 | H | P6 | H | H |
| $L_{a208}$ | P6 | CN | H | H | P21 | H | P7 | H | H |
| $L_{a209}$ | P6 | CN | H | H | P21 | H | P8 | H | H |
| $L_{a210}$ | P6 | CN | H | H | P21 | H | P9 | H | H |
| $L_{a211}$ | P6 | CN | H | H | P21 | H | P10 | H | H |
| $L_{a212}$ | P6 | CN | H | H | P21 | H | P11 | H | H |
| $L_{a213}$ | P6 | CN | H | H | P21 | H | P12 | H | H |
| $L_{a214}$ | P6 | CN | H | H | P21 | H | P13 | H | H |
| $L_{a215}$ | P6 | CN | H | H | P21 | H | P14 | H | H |
| $L_{a216}$ | P6 | CN | H | H | P21 | H | P15 | H | H |
| $L_{a217}$ | P6 | CN | H | H | P21 | H | P16 | H | H |
| $L_{a218}$ | P6 | CN | H | H | P21 | H | P17 | H | H |
| $L_{a219}$ | P6 | CN | H | H | P21 | H | P18 | H | H |
| $L_{a220}$ | P6 | CN | H | H | P21 | H | P19 | H | H |
| $L_{a221}$ | P6 | CN | H | H | P21 | H | P20 | H | H |
| $L_{a222}$ | P6 | CN | H | H | P21 | H | P21 | H | H |
| $L_{a223}$ | P6 | CN | H | H | P21 | H | H | P1 | H |
| $L_{a224}$ | P6 | CN | H | H | P21 | H | H | P2 | H |
| $L_{a225}$ | P6 | CN | H | H | P21 | H | H | P3 | H |
| $L_{a226}$ | P6 | CN | H | H | P21 | H | H | P4 | H |
| $L_{a227}$ | P6 | CN | H | H | P21 | H | H | P5 | H |
| $L_{a228}$ | P6 | CN | H | H | P21 | H | H | P6 | H |
| $L_{a229}$ | P6 | CN | H | H | P21 | H | H | P7 | H |
| $L_{a230}$ | P6 | CN | H | H | P21 | H | H | P8 | H |
| $L_{a231}$ | P6 | CN | H | H | P21 | H | H | P9 | H |
| $L_{a232}$ | P6 | CN | H | H | P21 | H | H | P10 | H |
| $L_{a233}$ | P6 | CN | H | H | P21 | H | H | P11 | H |
| $L_{a234}$ | P6 | CN | H | H | P21 | H | H | P12 | H |
| $L_{a235}$ | P6 | CN | H | H | P21 | H | H | P15 | H |
| $L_{a236}$ | P6 | CN | H | H | P21 | H | H | P17 | H |
| $L_{a237}$ | P6 | CN | H | H | P21 | H | H | P18 | H |
| $L_{a238}$ | P6 | CN | H | H | P21 | H | H | P19 | H |
| $L_{a239}$ | P6 | CN | H | H | P21 | H | H | P20 | H |
| $L_{a240}$ | P6 | CN | H | H | P21 | H | H | P21 | H |
| $L_{a241}$ | P6 | CN | H | H | P21 | H | F | H | H |
| $L_{a242}$ | P6 | CN | H | H | P21 | H | F | P1 | H |
| $L_{a243}$ | P6 | CN | H | H | P21 | H | F | P2 | H |
| $L_{a244}$ | P6 | CN | H | H | P21 | H | F | P3 | H |
| $L_{a245}$ | P6 | CN | H | H | P21 | H | F | P4 | H |
| $L_{a246}$ | P6 | CN | H | H | P21 | H | F | P5 | H |
| $L_{a247}$ | P6 | CN | H | H | P21 | H | F | P6 | H |
| $L_{a248}$ | P6 | CN | H | H | P21 | H | F | P7 | H |
| $L_{a249}$ | P6 | CN | H | H | P21 | H | F | P8 | H |
| $L_{a250}$ | P6 | CN | H | H | P21 | H | F | P9 | H |
| $L_{a251}$ | P6 | CN | H | H | P21 | H | F | P10 | H |
| $L_{a252}$ | P6 | CN | H | H | P21 | H | F | P11 | H |
| $L_{a253}$ | P6 | CN | H | H | P21 | H | P1 | F | H |
| $L_{a254}$ | P6 | CN | H | H | P21 | H | P2 | F | H |
| $L_{a255}$ | P6 | CN | H | H | P21 | H | P3 | F | H |
| $L_{a256}$ | P6 | CN | H | H | P21 | H | P4 | F | H |
| $L_{a257}$ | P6 | CN | H | H | P21 | H | P5 | F | H |
| $L_{a258}$ | P6 | CN | H | H | P21 | H | P6 | F | H |
| $L_{a259}$ | P6 | CN | H | H | P21 | H | P7 | F | H |
| $L_{a260}$ | P6 | CN | H | H | P21 | H | P8 | F | H |
| $L_{a261}$ | P6 | CN | H | H | P21 | H | P9 | F | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a262}$ | P6 | CN | H | H | P21 | H | P10 | F | H |
| $L_{a263}$ | P6 | CN | H | H | P21 | H | P11 | F | H |
| $L_{a264}$ | P6 | CN | H | H | P21 | H | P1 | P1 | H |
| $L_{a265}$ | P6 | CN | H | H | P21 | H | P2 | P2 | H |
| $L_{a266}$ | P6 | CN | H | H | P21 | D | D | D | D |
| $L_{a267}$ | P6 | CN | H | H | P21 | D | P2 | P2 | D |
| $L_{a268}$ | P6 | CN | H | H | P21 | D | F | P4 | D |
| $L_{a269}$ | P6 | CN | H | H | P21 | D | F | P5 | D |
| $L_{a270}$ | P6 | CN | H | H | P21 | D | F | P9 | D |
| $L_{a271}$ | P6 | CN | H | H | P21 | D | F | P11 | D |
| $L_{a272}$ | P6 | CN | H | H | P54 | H | H | H | H |
| $L_{a273}$ | P6 | CN | H | H | P54 | H | P1 | H | H |
| $L_{a274}$ | P6 | CN | H | H | P54 | H | P2 | H | H |
| $L_{a275}$ | P6 | CN | H | H | P54 | H | P3 | H | H |
| $L_{a276}$ | P6 | CN | H | H | P54 | H | P4 | H | H |
| $L_{a277}$ | P6 | CN | H | H | P54 | H | P5 | H | H |
| $L_{a278}$ | P6 | CN | H | H | P54 | H | P6 | H | H |
| $L_{a279}$ | P6 | CN | H | H | P54 | H | P7 | H | H |
| $L_{a280}$ | P6 | CN | H | H | P54 | H | P8 | H | H |
| $L_{a281}$ | P6 | CN | H | H | P54 | H | P9 | H | H |
| $L_{a282}$ | P6 | CN | H | H | P54 | H | P10 | H | H |
| $L_{a283}$ | P6 | CN | H | H | P54 | H | P11 | H | H |
| $L_{a284}$ | P6 | CN | H | H | P54 | H | P12 | H | H |
| $L_{a285}$ | P6 | CN | H | H | P54 | H | P13 | H | H |
| $L_{a286}$ | P6 | CN | H | H | P54 | H | P14 | H | H |
| $L_{a287}$ | P6 | CN | H | H | P54 | H | P15 | H | H |
| $L_{a288}$ | P6 | CN | H | H | P54 | H | P16 | H | H |
| $L_{a289}$ | P6 | CN | H | H | P54 | H | P17 | H | H |
| $L_{a290}$ | P6 | CN | H | H | P54 | H | P18 | H | H |
| $L_{a291}$ | P6 | CN | H | H | P54 | H | P19 | H | H |
| $L_{a292}$ | P6 | CN | H | H | P54 | H | P20 | H | H |
| $L_{a293}$ | P6 | CN | H | H | P54 | H | P21 | H | H |
| $L_{a294}$ | P6 | CN | H | H | P54 | H | H | P1 | H |
| $L_{a295}$ | P6 | CN | H | H | P54 | H | H | P2 | H |
| $L_{a296}$ | P6 | CN | H | H | P54 | H | H | P3 | H |
| $L_{a297}$ | P6 | CN | H | H | P54 | H | H | P4 | H |
| $L_{a298}$ | P6 | CN | H | H | P54 | H | H | P5 | H |
| $L_{a299}$ | P6 | CN | H | H | P54 | H | H | P6 | H |
| $L_{a300}$ | P6 | CN | H | H | P54 | H | H | P7 | H |
| $L_{a301}$ | P6 | CN | H | H | P54 | H | H | P8 | H |
| $L_{a302}$ | P6 | CN | H | H | P54 | H | H | P9 | H |
| $L_{a303}$ | P6 | CN | H | H | P54 | H | H | P10 | H |
| $L_{a304}$ | P6 | CN | H | H | P54 | H | H | P11 | H |
| $L_{a305}$ | P6 | CN | H | H | P54 | H | H | P12 | H |
| $L_{a306}$ | P6 | CN | H | H | P54 | H | H | P15 | H |
| $L_{a307}$ | P6 | CN | H | H | P54 | H | H | P17 | H |
| $L_{a308}$ | P6 | CN | H | H | P54 | H | H | P18 | H |
| $L_{a309}$ | P6 | CN | H | H | P54 | H | H | P19 | H |
| $L_{a310}$ | P6 | CN | H | H | P54 | H | H | P20 | H |
| $L_{a311}$ | P6 | CN | H | H | P54 | H | H | P21 | H |
| $L_{a312}$ | P6 | CN | H | H | P54 | H | F | H | H |
| $L_{a313}$ | P6 | CN | H | H | P54 | H | F | P1 | H |
| $L_{a314}$ | P6 | CN | H | H | P54 | H | F | P2 | H |
| $L_{a315}$ | P6 | CN | H | H | P54 | H | F | P3 | H |
| $L_{a316}$ | P6 | CN | H | H | P54 | H | F | P4 | H |
| $L_{a317}$ | P6 | CN | H | H | P54 | H | F | P5 | H |
| $L_{a318}$ | P6 | CN | H | H | P54 | H | F | P6 | H |
| $L_{a319}$ | P6 | CN | H | H | P54 | H | F | P7 | H |
| $L_{a320}$ | P6 | CN | H | H | P54 | H | F | P8 | H |
| $L_{a321}$ | P6 | CN | H | H | P54 | H | F | P9 | H |
| $L_{a322}$ | P6 | CN | H | H | P54 | H | F | P10 | H |
| $L_{a323}$ | P6 | CN | H | H | P54 | H | F | P11 | H |
| $L_{a324}$ | P6 | CN | H | H | P54 | H | P1 | F | H |
| $L_{a325}$ | P6 | CN | H | H | P54 | H | P2 | F | H |
| $L_{a326}$ | P6 | CN | H | H | P54 | H | P3 | F | H |
| $L_{a327}$ | P6 | CN | H | H | P54 | H | P4 | F | H |
| $L_{a328}$ | P6 | CN | H | H | P54 | H | P5 | F | H |
| $L_{a329}$ | P6 | CN | H | H | P54 | H | P6 | F | H |
| $L_{a330}$ | P6 | CN | H | H | P54 | H | P7 | F | H |
| $L_{a331}$ | P6 | CN | H | H | P54 | H | P8 | F | H |
| $L_{a332}$ | P6 | CN | H | H | P54 | H | P9 | F | H |
| $L_{a333}$ | P6 | CN | H | H | P54 | H | P10 | F | H |
| $L_{a334}$ | P6 | CN | H | H | P54 | H | P11 | F | H |
| $L_{a335}$ | P6 | CN | H | H | P54 | H | P1 | P1 | H |
| $L_{a336}$ | P6 | CN | H | H | P54 | H | P2 | P2 | H |
| $L_{a337}$ | P6 | CN | H | H | P54 | D | D | D | D |
| $L_{a338}$ | P6 | CN | H | H | P54 | D | P2 | P2 | D |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a339}$ | P6 | CN | H | H | P54 | D | F | P4 | D |
| $L_{a340}$ | P6 | CN | H | H | P54 | D | F | P5 | D |
| $L_{a341}$ | P6 | CN | H | H | P54 | D | F | P9 | D |
| $L_{a342}$ | P6 | CN | H | H | P54 | D | F | P11 | D |
| $L_{a343}$ | P6 | CN | H | H | P96 | H | H | H | H |
| $L_{a344}$ | P6 | CN | H | H | P96 | H | P1 | H | H |
| $L_{a345}$ | P6 | CN | H | H | P96 | H | P2 | H | H |
| $L_{a346}$ | P6 | CN | H | H | P96 | H | P3 | H | H |
| $L_{a347}$ | P6 | CN | H | H | P96 | H | P4 | H | H |
| $L_{a348}$ | P6 | CN | H | H | P96 | H | P5 | H | H |
| $L_{a349}$ | P6 | CN | H | H | P96 | H | P6 | H | H |
| $L_{a350}$ | P6 | CN | H | H | P96 | H | P7 | H | H |
| $L_{a351}$ | P6 | CN | H | H | P96 | H | P8 | H | H |
| $L_{a352}$ | P6 | CN | H | H | P96 | H | P9 | H | H |
| $L_{a353}$ | P6 | CN | H | H | P96 | H | P10 | H | H |
| $L_{a354}$ | P6 | CN | H | H | P96 | H | P11 | H | H |
| $L_{a355}$ | P6 | CN | H | H | P96 | H | P12 | H | H |
| $L_{a356}$ | P6 | CN | H | H | P96 | H | P13 | H | H |
| $L_{a357}$ | P6 | CN | H | H | P96 | H | P14 | H | H |
| $L_{a358}$ | P6 | CN | H | H | P96 | H | P15 | H | H |
| $L_{a359}$ | P6 | CN | H | H | P96 | H | P16 | H | H |
| $L_{a360}$ | P6 | CN | H | H | P96 | H | P17 | H | H |
| $L_{a361}$ | P6 | CN | H | H | P96 | H | P18 | H | H |
| $L_{a362}$ | P6 | CN | H | H | P96 | H | P19 | H | H |
| $L_{a363}$ | P6 | CN | H | H | P96 | H | P20 | H | H |
| $L_{a364}$ | P6 | CN | H | H | P96 | H | P21 | H | H |
| $L_{a365}$ | P6 | CN | H | H | P96 | H | H | P1 | H |
| $L_{a366}$ | P6 | CN | H | H | P96 | H | H | P2 | H |
| $L_{a367}$ | P6 | CN | H | H | P96 | H | H | P3 | H |
| $L_{a368}$ | P6 | CN | H | H | P96 | H | H | P4 | H |
| $L_{a369}$ | P6 | CN | H | H | P96 | H | H | P5 | H |
| $L_{a370}$ | P6 | CN | H | H | P96 | H | H | P6 | H |
| $L_{a371}$ | P6 | CN | H | H | P96 | H | H | P7 | H |
| $L_{a372}$ | P6 | CN | H | H | P96 | H | H | P8 | H |
| $L_{a373}$ | P6 | CN | H | H | P96 | H | H | P9 | H |
| $L_{a374}$ | P6 | CN | H | H | P96 | H | H | P10 | H |
| $L_{a375}$ | P6 | CN | H | H | P96 | H | H | P11 | H |
| $L_{a376}$ | P6 | CN | H | H | P96 | H | H | P12 | H |
| $L_{a377}$ | P6 | CN | H | H | P96 | H | H | P15 | H |
| $L_{a378}$ | P6 | CN | H | H | P96 | H | H | P17 | H |
| $L_{a379}$ | P6 | CN | H | H | P96 | H | H | P18 | H |
| $L_{a380}$ | P6 | CN | H | H | P96 | H | H | P19 | H |
| $L_{a381}$ | P6 | CN | H | H | P96 | H | H | P20 | H |
| $L_{a382}$ | P6 | CN | H | H | P96 | H | H | P21 | H |
| $L_{a383}$ | P6 | CN | H | H | P96 | H | F | H | H |
| $L_{a384}$ | P6 | CN | H | H | P96 | H | F | P1 | H |
| $L_{a385}$ | P6 | CN | H | H | P96 | H | F | P2 | H |
| $L_{a386}$ | P6 | CN | H | H | P96 | H | F | P3 | H |
| $L_{a387}$ | P6 | CN | H | H | P96 | H | F | P4 | H |
| $L_{a388}$ | P6 | CN | H | H | P96 | H | F | P5 | H |
| $L_{a389}$ | P6 | CN | H | H | P96 | H | F | P6 | H |
| $L_{a390}$ | P6 | CN | H | H | P96 | H | F | P7 | H |
| $L_{a391}$ | P6 | CN | H | H | P96 | H | F | P8 | H |
| $L_{a392}$ | P6 | CN | H | H | P96 | H | F | P9 | H |
| $L_{a393}$ | P6 | CN | H | H | P96 | H | F | P10 | H |
| $L_{a394}$ | P6 | CN | H | H | P96 | H | F | P11 | H |
| $L_{a395}$ | P6 | CN | H | H | P96 | H | P1 | F | H |
| $L_{a396}$ | P6 | CN | H | H | P96 | H | P2 | F | H |
| $L_{a397}$ | P6 | CN | H | H | P96 | H | P3 | F | H |
| $L_{a398}$ | P6 | CN | H | H | P96 | H | P4 | F | H |
| $L_{a399}$ | P6 | CN | H | H | P96 | H | P5 | F | H |
| $L_{a400}$ | P6 | CN | H | H | P96 | H | P6 | F | H |
| $L_{a401}$ | P6 | CN | H | H | P96 | H | P7 | F | H |
| $L_{a402}$ | P6 | CN | H | H | P96 | H | P8 | F | H |
| $L_{a403}$ | P6 | CN | H | H | P96 | H | P9 | F | H |
| $L_{a404}$ | P6 | CN | H | H | P96 | H | P10 | F | H |
| $L_{a405}$ | P6 | CN | H | H | P96 | H | P11 | F | H |
| $L_{a406}$ | P6 | CN | H | H | P96 | H | P1 | P1 | H |
| $L_{a407}$ | P6 | CN | H | H | P96 | H | P2 | P2 | H |
| $L_{a408}$ | P6 | CN | H | H | P96 | D | D | D | D |
| $L_{a409}$ | P6 | CN | H | H | P96 | D | P2 | P2 | D |
| $L_{a410}$ | P6 | CN | H | H | P96 | D | F | P4 | D |
| $L_{a411}$ | P6 | CN | H | H | P96 | D | F | P5 | D |
| $L_{a412}$ | P6 | CN | H | H | P96 | D | F | P9 | D |
| $L_{a413}$ | P6 | CN | H | H | P96 | D | F | P11 | D |
| $L_{a414}$ | P6 | CN | H | H | P97 | H | H | H | H |
| $L_{a415}$ | P6 | CN | H | H | P97 | H | P1 | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a416}$ | P6 | CN | H | H | P97 | H | P2 | H | H |
| $L_{a417}$ | P6 | CN | H | H | P97 | H | P3 | H | H |
| $L_{a418}$ | P6 | CN | H | H | P97 | H | P4 | H | H |
| $L_{a419}$ | P6 | CN | H | H | P97 | H | P5 | H | H |
| $L_{a420}$ | P6 | CN | H | H | P97 | H | P6 | H | H |
| $L_{a421}$ | P6 | CN | H | H | P97 | H | P7 | H | H |
| $L_{a422}$ | P6 | CN | H | H | P97 | H | P8 | H | H |
| $L_{a423}$ | P6 | CN | H | H | P97 | H | P9 | H | H |
| $L_{a424}$ | P6 | CN | H | H | P97 | H | P10 | H | H |
| $L_{a425}$ | P6 | CN | H | H | P97 | H | P11 | H | H |
| $L_{a426}$ | P6 | CN | H | H | P97 | H | P12 | H | H |
| $L_{a427}$ | P6 | CN | H | H | P97 | H | P13 | H | H |
| $L_{a428}$ | P6 | CN | H | H | P97 | H | P14 | H | H |
| $L_{a429}$ | P6 | CN | H | H | P97 | H | P15 | H | H |
| $L_{a430}$ | P6 | CN | H | H | P97 | H | P16 | H | H |
| $L_{a431}$ | P6 | CN | H | H | P97 | H | P17 | H | H |
| $L_{a432}$ | P6 | CN | H | H | P97 | H | P18 | H | H |
| $L_{a433}$ | P6 | CN | H | H | P97 | H | P19 | H | H |
| $L_{a434}$ | P6 | CN | H | H | P97 | H | P20 | H | H |
| $L_{a435}$ | P6 | CN | H | H | P97 | H | P21 | H | H |
| $L_{a436}$ | P6 | CN | H | H | P97 | H | H | P1 | H |
| $L_{a437}$ | P6 | CN | H | H | P97 | H | H | P2 | H |
| $L_{a438}$ | P6 | CN | H | H | P97 | H | H | P3 | H |
| $L_{a439}$ | P6 | CN | H | H | P97 | H | H | P4 | H |
| $L_{a440}$ | P6 | CN | H | H | P97 | H | H | P5 | H |
| $L_{a441}$ | P6 | CN | H | H | P97 | H | H | P6 | H |
| $L_{a442}$ | P6 | CN | H | H | P97 | H | H | P7 | H |
| $L_{a443}$ | P6 | CN | H | H | P97 | H | H | P8 | H |
| $L_{a444}$ | P6 | CN | H | H | P97 | H | H | P9 | H |
| $L_{a445}$ | P6 | CN | H | H | P97 | H | H | P10 | H |
| $L_{a446}$ | P6 | CN | H | H | P97 | H | H | P11 | H |
| $L_{a447}$ | P6 | CN | H | H | P97 | H | H | P12 | H |
| $L_{a448}$ | P6 | CN | H | H | P97 | H | H | P15 | H |
| $L_{a449}$ | P6 | CN | H | H | P97 | H | H | P17 | H |
| $L_{a450}$ | P6 | CN | H | H | P97 | H | H | P18 | H |
| $L_{a451}$ | P6 | CN | H | H | P97 | H | H | P19 | H |
| $L_{a452}$ | P6 | CN | H | H | P97 | H | H | P20 | H |
| $L_{a453}$ | P6 | CN | H | H | P97 | H | H | P21 | H |
| $L_{a454}$ | P6 | CN | H | H | P97 | H | F | H | H |
| $L_{a455}$ | P6 | CN | H | H | P97 | H | F | P1 | H |
| $L_{a456}$ | P6 | CN | H | H | P97 | H | F | P2 | H |
| $L_{a457}$ | P6 | CN | H | H | P97 | H | F | P3 | H |
| $L_{a458}$ | P6 | CN | H | H | P97 | H | F | P4 | H |
| $L_{a459}$ | P6 | CN | H | H | P97 | H | F | P5 | H |
| $L_{a460}$ | P6 | CN | H | H | P97 | H | F | P6 | H |
| $L_{a461}$ | P6 | CN | H | H | P97 | H | F | P7 | H |
| $L_{a462}$ | P6 | CN | H | H | P97 | H | F | P8 | H |
| $L_{a463}$ | P6 | CN | H | H | P97 | H | F | P9 | H |
| $L_{a464}$ | P6 | CN | H | H | P97 | H | F | P10 | H |
| $L_{a465}$ | P6 | CN | H | H | P97 | H | F | P11 | H |
| $L_{a466}$ | P6 | CN | H | H | P97 | H | P1 | F | H |
| $L_{a467}$ | P6 | CN | H | H | P97 | H | P2 | F | H |
| $L_{a468}$ | P6 | CN | H | H | P97 | H | P3 | F | H |
| $L_{a469}$ | P6 | CN | H | H | P97 | H | P4 | F | H |
| $L_{a470}$ | P6 | CN | H | H | P97 | H | P5 | F | H |
| $L_{a471}$ | P6 | CN | H | H | P97 | H | P6 | F | H |
| $L_{a472}$ | P6 | CN | H | H | P97 | H | P7 | F | H |
| $L_{a473}$ | P6 | CN | H | H | P97 | H | P8 | F | H |
| $L_{a474}$ | P6 | CN | H | H | P97 | H | P9 | F | H |
| $L_{a475}$ | P6 | CN | H | H | P97 | H | P10 | F | H |
| $L_{a476}$ | P6 | CN | H | H | P97 | H | P11 | F | H |
| $L_{a477}$ | P6 | CN | H | H | P97 | H | P1 | P1 | H |
| $L_{a478}$ | P6 | CN | H | H | P97 | H | P2 | P2 | H |
| $L_{a479}$ | P6 | CN | H | H | P97 | D | D | D | D |
| $L_{a480}$ | P6 | CN | H | H | P97 | D | P2 | P2 | D |
| $L_{a481}$ | P6 | CN | H | H | P97 | D | F | P4 | D |
| $L_{a482}$ | P6 | CN | H | H | P97 | D | F | P5 | D |
| $L_{a483}$ | P6 | CN | H | H | P97 | D | F | P9 | D |
| $L_{a484}$ | P6 | CN | H | H | P97 | D | F | P11 | D |
| $L_{a485}$ | P6 | CN | H | H | P102 | H | P1 | H | H |
| $L_{a486}$ | P6 | CN | H | H | P102 | H | P2 | H | H |
| $L_{a487}$ | P6 | CN | H | H | P102 | H | P3 | H | H |
| $L_{a488}$ | P6 | CN | H | H | P102 | H | P4 | H | H |
| $L_{a489}$ | P6 | CN | H | H | P102 | H | P5 | H | H |
| $L_{a490}$ | P6 | CN | H | H | P102 | H | P6 | H | H |
| $L_{a491}$ | P6 | CN | H | H | P102 | H | P7 | H | H |
| $L_{a492}$ | P6 | CN | H | H | P102 | H | P8 | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a493}$ | P6 | CN | H | H | P102 | H | P9 | H | H |
| $L_{a494}$ | P6 | CN | H | H | P102 | H | P10 | H | H |
| $L_{a495}$ | P6 | CN | H | H | P102 | H | P11 | H | H |
| $L_{a496}$ | P6 | CN | H | H | P102 | H | P12 | H | H |
| $L_{a497}$ | P6 | CN | H | H | P102 | H | P13 | H | H |
| $L_{a498}$ | P6 | CN | H | H | P102 | H | P14 | H | H |
| $L_{a499}$ | P6 | CN | H | H | P102 | H | P15 | H | H |
| $L_{a500}$ | P6 | CN | H | H | P102 | H | P16 | H | H |
| $L_{a501}$ | P6 | CN | H | H | P102 | H | P17 | H | H |
| $L_{a502}$ | P6 | CN | H | H | P102 | H | P18 | H | H |
| $L_{a503}$ | P6 | CN | H | H | P102 | H | P19 | H | H |
| $L_{a504}$ | P6 | CN | H | H | P102 | H | P20 | H | H |
| $L_{a505}$ | P6 | CN | H | H | P102 | H | P21 | H | H |
| $L_{a506}$ | P6 | CN | H | H | P102 | H | H | P1 | H |
| $L_{a507}$ | P6 | CN | H | H | P102 | H | H | P2 | H |
| $L_{a508}$ | P6 | CN | H | H | P102 | H | H | P3 | H |
| $L_{a509}$ | P6 | CN | H | H | P102 | H | H | P4 | H |
| $L_{a510}$ | P6 | CN | H | H | P102 | H | H | P5 | H |
| $L_{a511}$ | P6 | CN | H | H | P102 | H | H | P6 | H |
| $L_{a512}$ | P6 | CN | H | H | P102 | H | H | P7 | H |
| $L_{a513}$ | P6 | CN | H | H | P102 | H | H | P8 | H |
| $L_{a514}$ | P6 | CN | H | H | P102 | H | H | P9 | H |
| $L_{a515}$ | P6 | CN | H | H | P102 | H | H | P10 | H |
| $L_{a516}$ | P6 | CN | H | H | P102 | H | H | P11 | H |
| $L_{a517}$ | P6 | CN | H | H | P102 | H | H | P12 | H |
| $L_{a518}$ | P6 | CN | H | H | P102 | H | H | P15 | H |
| $L_{a519}$ | P6 | CN | H | H | P102 | H | H | P17 | H |
| $L_{a520}$ | P6 | CN | H | H | P102 | H | H | P18 | H |
| $L_{a521}$ | P6 | CN | H | H | P102 | H | H | P19 | H |
| $L_{a522}$ | P6 | CN | H | H | P102 | H | H | P20 | H |
| $L_{a523}$ | P6 | CN | H | H | P102 | H | H | P21 | H |
| $L_{a524}$ | P6 | CN | H | H | P102 | H | F | H | H |
| $L_{a525}$ | P6 | CN | H | H | P102 | H | F | P1 | H |
| $L_{a526}$ | P6 | CN | H | H | P102 | H | F | P2 | H |
| $L_{a527}$ | P6 | CN | H | H | P102 | H | F | P3 | H |
| $L_{a528}$ | P6 | CN | H | H | P102 | H | F | P4 | H |
| $L_{a529}$ | P6 | CN | H | H | P102 | H | F | P5 | H |
| $L_{a530}$ | P6 | CN | H | H | P102 | H | F | P6 | H |
| $L_{a531}$ | P6 | CN | H | H | P102 | H | F | P7 | H |
| $L_{a532}$ | P6 | CN | H | H | P102 | H | F | P8 | H |
| $L_{a533}$ | P6 | CN | H | H | P102 | H | F | P9 | H |
| $L_{a534}$ | P6 | CN | H | H | P102 | H | F | P10 | H |
| $L_{a535}$ | P6 | CN | H | H | P102 | H | F | P11 | H |
| $L_{a536}$ | P6 | CN | H | H | P102 | H | P1 | F | H |
| $L_{a537}$ | P6 | CN | H | H | P102 | H | P2 | F | H |
| $L_{a538}$ | P6 | CN | H | H | P102 | H | P3 | F | H |
| $L_{a539}$ | P6 | CN | H | H | P102 | H | P4 | F | H |
| $L_{a540}$ | P6 | CN | H | H | P102 | H | P5 | F | H |
| $L_{a541}$ | P6 | CN | H | H | P102 | H | P6 | F | H |
| $L_{a542}$ | P6 | CN | H | H | P102 | H | P7 | F | H |
| $L_{a543}$ | P6 | CN | H | H | P102 | H | P8 | F | H |
| $L_{a544}$ | P6 | CN | H | H | P102 | H | P9 | F | H |
| $L_{a545}$ | P6 | CN | H | H | P102 | H | P10 | F | H |
| $L_{a546}$ | P6 | CN | H | H | P102 | H | P11 | F | H |
| $L_{a547}$ | P6 | CN | H | H | P102 | H | P1 | P1 | H |
| $L_{a548}$ | P6 | CN | H | H | P102 | H | P2 | P2 | H |
| $L_{a549}$ | P6 | CN | H | H | P102 | D | D | D | D |
| $L_{a550}$ | P6 | CN | H | H | P102 | D | P2 | P2 | D |
| $L_{a551}$ | P6 | CN | H | H | P102 | D | F | P4 | D |
| $L_{a552}$ | P6 | CN | H | H | P102 | D | F | P5 | D |
| $L_{a553}$ | P6 | CN | H | H | P102 | D | F | P9 | D |
| $L_{a554}$ | P6 | CN | H | H | P102 | D | F | P11 | D |
| $L_{a555}$ | P6 | CN | H | H | P103 | H | P1 | H | H |
| $L_{a556}$ | P6 | CN | H | H | P103 | H | P2 | H | H |
| $L_{a557}$ | P6 | CN | H | H | P103 | H | P3 | H | H |
| $L_{a558}$ | P6 | CN | H | H | P103 | H | P4 | H | H |
| $L_{a559}$ | P6 | CN | H | H | P103 | H | P5 | H | H |
| $L_{a560}$ | P6 | CN | H | H | P103 | H | P6 | H | H |
| $L_{a561}$ | P6 | CN | H | H | P103 | H | P7 | H | H |
| $L_{a562}$ | P6 | CN | H | H | P103 | H | P8 | H | H |
| $L_{a563}$ | P6 | CN | H | H | P103 | H | P9 | H | H |
| $L_{a564}$ | P6 | CN | H | H | P103 | H | P10 | H | H |
| $L_{a565}$ | P6 | CN | H | H | P103 | H | P11 | H | H |
| $L_{a566}$ | P6 | CN | H | H | P103 | H | P12 | H | H |
| $L_{a567}$ | P6 | CN | H | H | P103 | H | P13 | H | H |
| $L_{a568}$ | P6 | CN | H | H | P103 | H | P14 | H | H |
| $L_{a569}$ | P6 | CN | H | H | P103 | H | P15 | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a570}$ | P6 | CN | H | H | P103 | H | P16 | H | H |
| $L_{a571}$ | P6 | CN | H | H | P103 | H | P17 | H | H |
| $L_{a572}$ | P6 | CN | H | H | P103 | H | P18 | H | H |
| $L_{a573}$ | P6 | CN | H | H | P103 | H | P19 | H | H |
| $L_{a574}$ | P6 | CN | H | H | P103 | H | P20 | H | H |
| $L_{a575}$ | P6 | CN | H | H | P103 | H | P21 | H | H |
| $L_{a576}$ | P6 | CN | H | H | P103 | H | H | P1 | H |
| $L_{a577}$ | P6 | CN | H | H | P103 | H | H | P2 | H |
| $L_{a578}$ | P6 | CN | H | H | P103 | H | H | P3 | H |
| $L_{a579}$ | P6 | CN | H | H | P103 | H | H | P4 | H |
| $L_{a580}$ | P6 | CN | H | H | P103 | H | H | P5 | H |
| $L_{a581}$ | P6 | CN | H | H | P103 | H | H | P6 | H |
| $L_{a582}$ | P6 | CN | H | H | P103 | H | H | P7 | H |
| $L_{a583}$ | P6 | CN | H | H | P103 | H | H | P8 | H |
| $L_{a584}$ | P6 | CN | H | H | P103 | H | H | P9 | H |
| $L_{a585}$ | P6 | CN | H | H | P103 | H | H | P10 | H |
| $L_{a586}$ | P6 | CN | H | H | P103 | H | H | P11 | H |
| $L_{a587}$ | P6 | CN | H | H | P103 | H | H | P12 | H |
| $L_{a588}$ | P6 | CN | H | H | P103 | H | H | P15 | H |
| $L_{a589}$ | P6 | CN | H | H | P103 | H | H | P17 | H |
| $L_{a590}$ | P6 | CN | H | H | P103 | H | H | P18 | H |
| $L_{a591}$ | P6 | CN | H | H | P103 | H | H | P19 | H |
| $L_{a592}$ | P6 | CN | H | H | P103 | H | H | P20 | H |
| $L_{a593}$ | P6 | CN | H | H | P103 | H | H | P21 | H |
| $L_{a594}$ | P6 | CN | H | H | P103 | H | F | H | H |
| $L_{a595}$ | P6 | CN | H | H | P103 | H | F | P1 | H |
| $L_{a596}$ | P6 | CN | H | H | P103 | H | F | P2 | H |
| $L_{a597}$ | P6 | CN | H | H | P103 | H | F | P3 | H |
| $L_{a598}$ | P6 | CN | H | H | P103 | H | F | P4 | H |
| $L_{a599}$ | P6 | CN | H | H | P103 | H | F | P5 | H |
| $L_{a600}$ | P6 | CN | H | H | P103 | H | F | P6 | H |
| $L_{a601}$ | P6 | CN | H | H | P103 | H | F | P7 | H |
| $L_{a602}$ | P6 | CN | H | H | P103 | H | F | P8 | H |
| $L_{a603}$ | P6 | CN | H | H | P103 | H | F | P9 | H |
| $L_{a604}$ | P6 | CN | H | H | P103 | H | F | P10 | H |
| $L_{a605}$ | P6 | CN | H | H | P103 | H | F | P11 | H |
| $L_{a606}$ | P6 | CN | H | H | P103 | H | P1 | F | H |
| $L_{a607}$ | P6 | CN | H | H | P103 | H | P2 | F | H |
| $L_{a608}$ | P6 | CN | H | H | P103 | H | P3 | F | H |
| $L_{a609}$ | P6 | CN | H | H | P103 | H | P4 | F | H |
| $L_{a610}$ | P6 | CN | H | H | P103 | H | P5 | F | H |
| $L_{a611}$ | P6 | CN | H | H | P103 | H | P6 | F | H |
| $L_{a612}$ | P6 | CN | H | H | P103 | H | P7 | F | H |
| $L_{a613}$ | P6 | CN | H | H | P103 | H | P8 | F | H |
| $L_{a614}$ | P6 | CN | H | H | P103 | H | P9 | F | H |
| $L_{a615}$ | P6 | CN | H | H | P103 | H | P10 | F | H |
| $L_{a616}$ | P6 | CN | H | H | P103 | H | P11 | F | H |
| $L_{a617}$ | P6 | CN | H | H | P103 | H | P1 | P1 | H |
| $L_{a618}$ | P6 | CN | H | H | P103 | H | P2 | P2 | H |
| $L_{a619}$ | P6 | CN | H | H | P103 | D | D | D | D |
| $L_{a620}$ | P6 | CN | H | H | P103 | D | P2 | P2 | D |
| $L_{a621}$ | P6 | CN | H | H | P103 | D | F | P4 | D |
| $L_{a622}$ | P6 | CN | H | H | P103 | D | F | P5 | D |
| $L_{a623}$ | P6 | CN | H | H | P103 | D | F | P9 | D |
| $L_{a624}$ | P6 | CN | H | H | P103 | D | F | P11 | D |
| $L_{a625}$ | P6 | CN | H | H | H | H | P20 | P1 | H |
| $L_{a626}$ | P6 | CN | H | H | H | H | P21 | P2 | H |
| $L_{a627}$ | P6 | CN | H | H | H | H | P29 | H | H |
| $L_{a628}$ | P6 | CN | H | H | H | H | P29 | P1 | H |
| $L_{a629}$ | P6 | CN | H | H | H | H | P54 | H | H |
| $L_{a630}$ | P6 | CN | H | H | H | H | P96 | H | H |
| $L_{a631}$ | P6 | CN | H | H | H | H | P97 | H | H |
| $L_{a632}$ | P6 | CN | H | H | H | H | P96 | P1 | H |
| $L_{a633}$ | P6 | CN | H | H | H | H | P97 | P1 | H |
| $L_{a634}$ | P6 | CN | H | H | H | H | P102 | H | H |
| $L_{a635}$ | P6 | CN | H | H | H | H | P103 | H | H |
| $L_{a636}$ | P6 | CN | H | H | D | H | P20 | P1 | H |
| $L_{a637}$ | P6 | CN | H | H | D | H | P21 | P2 | H |
| $L_{a638}$ | P6 | CN | H | H | D | H | P29 | H | H |
| $L_{a639}$ | P6 | CN | H | H | D | H | P29 | P1 | H |
| $L_{a640}$ | P6 | CN | H | H | D | H | P54 | H | H |
| $L_{a641}$ | P6 | CN | H | H | D | H | P96 | H | H |
| $L_{a642}$ | P6 | CN | H | H | D | H | P97 | H | H |
| $L_{a643}$ | P6 | CN | H | H | D | H | P96 | P1 | H |
| $L_{a644}$ | P6 | CN | H | H | D | H | P97 | P1 | H |
| $L_{a645}$ | P6 | CN | H | H | D | H | P102 | H | H |
| $L_{a646}$ | P6 | CN | H | H | D | H | P103 | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a647}$ | P6 | CN | H | H | P20 | H | P20 | P1 | H |
| $L_{a648}$ | P6 | CN | H | H | P20 | H | P21 | P2 | H |
| $L_{a649}$ | P6 | CN | H | H | P20 | H | P29 | H | H |
| $L_{a650}$ | P6 | CN | H | H | P20 | H | P29 | P1 | H |
| $L_{a651}$ | P6 | CN | H | H | P20 | H | P54 | H | H |
| $L_{a652}$ | P6 | CN | H | H | P20 | H | P96 | H | H |
| $L_{a653}$ | P6 | CN | H | H | P20 | H | P97 | H | H |
| $L_{a654}$ | P6 | CN | H | H | P20 | H | P96 | P1 | H |
| $L_{a655}$ | P6 | CN | H | H | P20 | H | P97 | P1 | H |
| $L_{a656}$ | P6 | CN | H | H | P20 | H | P102 | H | H |
| $L_{a657}$ | P6 | CN | H | H | P20 | H | P103 | H | H |
| $L_{a658}$ | P6 | CN | H | H | P21 | H | P20 | P1 | H |
| $L_{a659}$ | P6 | CN | H | H | P21 | H | P21 | P2 | H |
| $L_{a660}$ | P6 | CN | H | H | P21 | H | P29 | H | H |
| $L_{a661}$ | P6 | CN | H | H | P21 | H | P29 | P1 | H |
| $L_{a662}$ | P6 | CN | H | H | P21 | H | P54 | H | H |
| $L_{a663}$ | P6 | CN | H | H | P21 | H | P96 | H | H |
| $L_{a664}$ | P6 | CN | H | H | P21 | H | P97 | H | H |
| $L_{a665}$ | P6 | CN | H | H | P21 | H | P96 | P1 | H |
| $L_{a666}$ | P6 | CN | H | H | P21 | H | P97 | P1 | H |
| $L_{a667}$ | P6 | CN | H | H | P21 | H | P102 | H | H |
| $L_{a668}$ | P6 | CN | H | H | P21 | H | P103 | H | H |
| $L_{a669}$ | P6 | CN | H | H | P22 | H | H | H | H |
| $L_{a670}$ | P6 | CN | H | H | P23 | H | H | H | H |
| $L_{a671}$ | P6 | CN | H | H | P24 | H | H | H | H |
| $L_{a672}$ | P6 | CN | H | H | P25 | H | H | H | H |
| $L_{a673}$ | P6 | CN | H | H | P26 | H | H | H | H |
| $L_{a674}$ | P6 | CN | H | H | P27 | H | H | H | H |
| $L_{a675}$ | P6 | CN | H | H | P28 | H | H | H | H |
| $L_{a676}$ | P6 | CN | H | H | P29 | H | H | H | H |
| $L_{a677}$ | P6 | CN | H | H | P30 | H | H | H | H |
| $L_{a678}$ | P6 | CN | H | H | P31 | H | H | H | H |
| $L_{a679}$ | P6 | CN | H | H | P32 | H | H | H | H |
| $L_{a680}$ | P6 | CN | H | H | P33 | H | H | H | H |
| $L_{a681}$ | P6 | CN | H | H | P34 | H | H | H | H |
| $L_{a682}$ | P6 | CN | H | H | P35 | H | H | H | H |
| $L_{a683}$ | P6 | CN | H | H | P36 | H | H | H | H |
| $L_{a684}$ | P6 | CN | H | H | P37 | H | H | H | H |
| $L_{a685}$ | P6 | CN | H | H | P38 | H | H | H | H |
| $L_{a686}$ | P6 | CN | H | H | P39 | H | H | H | H |
| $L_{a687}$ | P6 | CN | H | H | P40 | H | H | H | H |
| $L_{a688}$ | P6 | CN | H | H | P41 | H | H | H | H |
| $L_{a689}$ | P6 | CN | H | H | P42 | H | H | H | H |
| $L_{a690}$ | P6 | CN | H | H | P43 | H | H | H | H |
| $L_{a691}$ | P6 | CN | H | H | P44 | H | H | H | H |
| $L_{a692}$ | P6 | CN | H | H | P45 | H | H | H | H |
| $L_{a693}$ | P6 | CN | H | H | P46 | H | H | H | H |
| $L_{a694}$ | P6 | CN | H | H | P47 | H | H | H | H |
| $L_{a695}$ | P6 | CN | H | H | P48 | H | H | H | H |
| $L_{a696}$ | P6 | CN | H | H | P49 | H | H | H | H |
| $L_{a697}$ | P6 | CN | H | H | P50 | H | H | H | H |
| $L_{a698}$ | P6 | CN | H | H | P51 | H | H | H | H |
| $L_{a699}$ | P6 | CN | H | H | P52 | H | H | H | H |
| $L_{a700}$ | P6 | CN | H | H | P53 | H | H | H | H |
| $L_{a701}$ | P6 | CN | H | H | P55 | H | H | H | H |
| $L_{a702}$ | P6 | CN | H | H | P56 | H | H | H | H |
| $L_{a703}$ | P6 | CN | H | H | P57 | H | H | H | H |
| $L_{a704}$ | P6 | CN | H | H | P58 | H | H | H | H |
| $L_{a705}$ | P6 | CN | H | H | P59 | H | H | H | H |
| $L_{a706}$ | P6 | CN | H | H | P60 | H | H | H | H |
| $L_{a707}$ | P6 | CN | H | H | P61 | H | H | H | H |
| $L_{a708}$ | P6 | CN | H | H | P62 | H | H | H | H |
| $L_{a709}$ | P6 | CN | H | H | P63 | H | H | H | H |
| $L_{a710}$ | P6 | CN | H | H | P64 | H | H | H | H |
| $L_{a711}$ | P6 | CN | H | H | P65 | H | H | H | H |
| $L_{a712}$ | P6 | CN | H | H | P66 | H | H | H | H |
| $L_{a713}$ | P6 | CN | H | H | P67 | H | H | H | H |
| $L_{a714}$ | P6 | CN | H | H | P68 | H | H | H | H |
| $L_{a715}$ | P6 | CN | H | H | P69 | H | H | H | H |
| $L_{a716}$ | P6 | CN | H | H | P70 | H | H | H | H |
| $L_{a717}$ | P6 | CN | H | H | P71 | H | H | H | H |
| $L_{a718}$ | P6 | CN | H | H | P72 | H | H | H | H |
| $L_{a719}$ | P6 | CN | H | H | P73 | H | H | H | H |
| $L_{a720}$ | P6 | CN | H | H | P74 | H | H | H | H |
| $L_{a721}$ | P6 | CN | H | H | P75 | H | H | H | H |
| $L_{a722}$ | P6 | CN | H | H | P76 | H | H | H | H |
| $L_{a723}$ | P6 | CN | H | H | P77 | H | H | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a724}$ | P6 | CN | H | H | P78 | H | H | H | H |
| $L_{a725}$ | P6 | CN | H | H | P79 | H | H | H | H |
| $L_{a726}$ | P6 | CN | H | H | P80 | H | H | H | H |
| $L_{a727}$ | P6 | CN | H | H | P81 | H | H | H | H |
| $L_{a728}$ | P6 | CN | H | H | P82 | H | H | H | H |
| $L_{a729}$ | P6 | CN | H | H | P83 | H | H | H | H |
| $L_{a730}$ | P6 | CN | H | H | P84 | H | H | H | H |
| $L_{a731}$ | P6 | CN | H | H | P85 | H | H | H | H |
| $L_{a732}$ | P6 | CN | H | H | P86 | H | H | H | H |
| $L_{a733}$ | P6 | CN | H | H | P87 | H | H | H | H |
| $L_{a734}$ | P6 | CN | H | H | P88 | H | H | H | H |
| $L_{a735}$ | P6 | CN | H | H | P89 | H | H | H | H |
| $L_{a736}$ | P6 | CN | H | H | P90 | H | H | H | H |
| $L_{a737}$ | P6 | CN | H | H | P91 | H | H | H | H |
| $L_{a738}$ | P6 | CN | H | H | P92 | H | H | H | H |
| $L_{a739}$ | P6 | CN | H | H | P93 | H | H | H | H |
| $L_{a740}$ | P6 | CN | H | H | P94 | H | H | H | H |
| $L_{a741}$ | P6 | CN | H | H | P95 | H | H | H | H |
| $L_{a742}$ | P6 | CN | H | H | P98 | H | H | H | H |
| $L_{a743}$ | P6 | CN | P97 | H | P21 | H | H | H | H |
| $L_{a744}$ | P6 | CN | P97 | H | P97 | H | H | H | H |
| $L_{a745}$ | P6 | CN | H | H | P101 | H | H | H | H |
| $L_{a746}$ | P6 | CN | H | H | P102 | H | H | H | H |
| $L_{a747}$ | P6 | CN | H | H | P103 | H | H | H | H |
| $L_{a748}$ | P6 | CN | H | H | P104 | H | H | H | H |
| $L_{a749}$ | P6 | CN | H | H | P105 | H | H | H | H |
| $L_{a750}$ | P6 | CN | H | H | P106 | H | H | H | H |
| $L_{a751}$ | P6 | CN | H | H | P107 | H | H | H | H |
| $L_{a752}$ | P6 | CN | H | H | P108 | H | H | H | H |
| $L_{a753}$ | P6 | CN | H | H | P109 | H | H | H | H |
| $L_{a754}$ | P6 | CN | H | H | P110 | H | H | H | H |
| $L_{a755}$ | P6 | CN | H | H | P111 | H | H | H | H |
| $L_{a756}$ | P6 | CN | H | H | P112 | H | H | H | H |
| $L_{a757}$ | P6 | CN | H | H | P113 | H | H | H | H |
| $L_{a758}$ | P6 | CN | H | H | P114 | H | H | H | H |
| $L_{a759}$ | P6 | CN | H | H | P115 | H | H | H | H |
| $L_{a760}$ | P6 | CN | H | H | P116 | H | H | H | H |
| $L_{a761}$ | P6 | CN | H | H | P117 | H | H | H | H |
| $L_{a762}$ | P6 | CN | H | H | P118 | H | H | H | H |
| $L_{a763}$ | P6 | CN | H | H | P119 | H | H | H | H |
| $L_{a764}$ | P6 | CN | H | H | P120 | H | H | H | H |
| $L_{a765}$ | P6 | CN | H | H | P121 | H | H | H | H |
| $L_{a766}$ | P6 | CN | H | H | P122 | H | H | H | H |
| $L_{a767}$ | P6 | CN | H | H | P123 | H | H | H | H |
| $L_{a768}$ | P6 | CN | H | H | P124 | H | H | H | H |
| $L_{a769}$ | P6 | CN | H | H | P125 | H | H | H | H |
| $L_{a770}$ | P6 | CN | H | H | P126 | H | H | H | H |
| $L_{a771}$ | P6 | CN | H | H | P127 | H | H | H | H |
| $L_{a772}$ | P6 | CN | H | H | P128 | H | H | H | H |
| $L_{a773}$ | P6 | CN | H | H | P129 | H | H | H | H |
| $L_{a774}$ | P6 | CN | H | H | P130 | H | H | H | H |
| $L_{a775}$ | P6 | CN | H | H | P131 | H | H | H | H |
| $L_{a776}$ | P6 | CN | H | H | P132 | H | H | H | H |
| $L_{a777}$ | P6 | CN | H | H | P133 | H | H | H | H |
| $L_{a778}$ | P6 | CN | H | H | P134 | H | H | H | H |
| $L_{a779}$ | P6 | CN | H | H | P135 | H | H | H | H |
| $L_{a780}$ | P6 | CN | H | H | P136 | H | H | H | H |
| $L_{a781}$ | P6 | CN | H | H | P137 | H | H | H | H |
| $L_{a782}$ | P6 | CN | H | H | P138 | H | H | H | H |
| $L_{a783}$ | P6 | CN | H | H | P139 | H | H | H | H |
| $L_{a784}$ | P6 | CN | H | H | P140 | H | H | H | H |
| $L_{a785}$ | P6 | CN | H | H | P141 | H | H | H | H |
| $L_{a786}$ | P6 | CN | H | H | P142 | H | H | H | H |
| $L_{a787}$ | P6 | CN | H | H | P143 | H | H | H | H |
| $L_{a788}$ | P6 | CN | H | H | P144 | H | H | H | H |
| $L_{a789}$ | P6 | CN | H | H | P145 | H | H | H | H |
| $L_{a790}$ | P6 | CN | H | H | P146 | H | H | H | H |
| $L_{a791}$ | P6 | CN | H | H | P147 | H | H | H | H |
| $L_{a792}$ | P6 | CN | H | H | P148 | H | H | H | H |
| $L_{a793}$ | P6 | CN | H | H | P149 | H | H | H | H |
| $L_{a794}$ | P6 | CN | H | H | P150 | H | H | H | H |
| $L_{a795}$ | P6 | CN | H | H | P151 | H | H | H | H |
| $L_{a796}$ | P6 | CN | H | P18 | H | H | H | H | H |
| $L_{a797}$ | P6 | CN | H | P18 | D | H | H | H | H |
| $L_{a798}$ | P6 | CN | H | P18 | P20 | H | H | H | H |
| $L_{a799}$ | P6 | CN | H | P19 | H | H | H | H | H |
| $L_{a800}$ | P6 | CN | H | P19 | D | H | H | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a801}$ | P6 | CN | H | P19 | P20 | H | H | H | H |
| $L_{a802}$ | P6 | CN | H | P20 | H | H | H | H | H |
| $L_{a803}$ | P6 | CN | H | P20 | D | H | H | H | H |
| $L_{a804}$ | P6 | CN | H | P20 | H | H | P1 | H | H |
| $L_{a805}$ | P6 | CN | H | P20 | D | H | P2 | H | H |
| $L_{a806}$ | P6 | CN | H | P20 | H | H | H | P1 | H |
| $L_{a807}$ | P6 | CN | H | P20 | D | H | H | P2 | H |
| $L_{a808}$ | P6 | CN | H | P20 | H | H | P1 | P1 | H |
| $L_{a809}$ | P6 | CN | H | P20 | D | H | P2 | P2 | H |
| $L_{a810}$ | P6 | CN | H | P20 | H | H | P3 | H | H |
| $L_{a811}$ | P6 | CN | H | P20 | D | H | P4 | H | H |
| $L_{a812}$ | P6 | CN | H | P20 | H | H | P5 | H | H |
| $L_{a813}$ | P6 | CN | H | P21 | H | H | H | H | H |
| $L_{a814}$ | P6 | CN | H | P21 | D | H | H | H | H |
| $L_{a815}$ | P6 | CN | H | P21 | H | H | P1 | H | H |
| $L_{a816}$ | P6 | CN | H | P21 | D | H | P2 | H | H |
| $L_{a817}$ | P6 | CN | H | P21 | H | H | H | P1 | H |
| $L_{a818}$ | P6 | CN | H | P21 | D | H | H | P2 | H |
| $L_{a819}$ | P6 | CN | H | P21 | H | H | P1 | P1 | H |
| $L_{a820}$ | P6 | CN | H | P21 | D | H | P2 | P2 | H |
| $L_{a821}$ | P6 | CN | H | P21 | H | H | P3 | H | H |
| $L_{a822}$ | P6 | CN | H | P21 | D | H | P4 | H | H |
| $L_{a823}$ | P6 | CN | H | P21 | H | H | P5 | H | H |
| $L_{a824}$ | P11 | CN | H | H | H | H | H | H | H |
| $L_{a825}$ | P11 | CN | H | H | H | H | P1 | H | H |
| $L_{a826}$ | P11 | CN | H | H | H | H | P2 | H | H |
| $L_{a827}$ | P11 | CN | H | H | H | H | P3 | H | H |
| $L_{a828}$ | P11 | CN | H | H | H | H | P4 | H | H |
| $L_{a829}$ | P11 | CN | H | H | H | H | P5 | H | H |
| $L_{a830}$ | P11 | CN | H | H | H | H | P6 | H | H |
| $L_{a831}$ | P11 | CN | H | H | H | H | P7 | H | H |
| $L_{a832}$ | P11 | CN | H | H | H | H | P8 | H | H |
| $L_{a833}$ | P11 | CN | H | H | H | H | P9 | H | H |
| $L_{a834}$ | P11 | CN | H | H | H | H | P10 | H | H |
| $L_{a835}$ | P11 | CN | H | H | H | H | P11 | H | H |
| $L_{a836}$ | P11 | CN | H | H | H | H | P12 | H | H |
| $L_{a837}$ | P11 | CN | H | H | H | H | P13 | H | H |
| $L_{a838}$ | P11 | CN | H | H | H | H | P14 | H | H |
| $L_{a839}$ | P11 | CN | H | H | H | H | P15 | H | H |
| $L_{a840}$ | P11 | CN | H | H | H | H | P16 | H | H |
| $L_{a841}$ | P11 | CN | H | H | H | H | P17 | H | H |
| $L_{a842}$ | P11 | CN | H | H | H | H | P18 | H | H |
| $L_{a843}$ | P11 | CN | H | H | H | H | P19 | H | H |
| $L_{a844}$ | P11 | CN | H | H | H | H | P20 | H | H |
| $L_{a845}$ | P11 | CN | H | H | H | H | P21 | H | H |
| $L_{a846}$ | P11 | CN | H | H | H | H | P1 | F | H |
| $L_{a847}$ | P11 | CN | H | H | H | H | P2 | F | H |
| $L_{a848}$ | P11 | CN | H | H | H | H | P3 | F | H |
| $L_{a849}$ | P11 | CN | H | H | H | H | P4 | F | H |
| $L_{a850}$ | P11 | CN | H | H | H | H | P5 | F | H |
| $L_{a851}$ | P11 | CN | H | H | H | H | P6 | F | H |
| $L_{a852}$ | P11 | CN | H | H | H | H | P7 | F | H |
| $L_{a853}$ | P11 | CN | H | H | H | H | P8 | F | H |
| $L_{a854}$ | P11 | CN | H | H | H | H | P9 | F | H |
| $L_{a855}$ | P11 | CN | H | H | H | H | P10 | F | H |
| $L_{a856}$ | P11 | CN | H | H | H | H | P11 | F | H |
| $L_{a857}$ | P11 | CN | H | H | H | H | P12 | F | H |
| $L_{a858}$ | P11 | CN | H | H | H | H | P13 | F | H |
| $L_{a859}$ | P11 | CN | H | H | H | H | P14 | F | H |
| $L_{a860}$ | P11 | CN | H | H | H | H | P15 | F | H |
| $L_{a861}$ | P11 | CN | H | H | H | H | P16 | F | H |
| $L_{a862}$ | P11 | CN | H | H | H | H | P17 | F | H |
| $L_{a863}$ | P11 | CN | H | H | H | H | P18 | F | H |
| $L_{a864}$ | P11 | CN | H | H | H | H | P19 | F | H |
| $L_{a865}$ | P11 | CN | H | H | H | H | P20 | F | H |
| $L_{a866}$ | P11 | CN | H | H | H | H | P21 | F | H |
| $L_{a867}$ | P11 | CN | H | H | H | H | H | P1 | H |
| $L_{a868}$ | P11 | CN | H | H | H | H | H | P2 | H |
| $L_{a869}$ | P11 | CN | H | H | H | H | H | P3 | H |
| $L_{a870}$ | P11 | CN | H | H | H | H | H | P4 | H |
| $L_{a871}$ | P11 | CN | H | H | H | H | H | P5 | H |
| $L_{a872}$ | P11 | CN | H | H | H | H | H | P6 | H |
| $L_{a873}$ | P11 | CN | H | H | H | H | H | P7 | H |
| $L_{a874}$ | P11 | CN | H | H | H | H | H | P8 | H |
| $L_{a875}$ | P11 | CN | H | H | H | H | H | P9 | H |
| $L_{a876}$ | P11 | CN | H | H | H | H | H | P10 | H |
| $L_{a877}$ | P11 | CN | H | H | H | H | H | P11 | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a878}$ | P11 | CN | H | H | H | H | H | P12 | H |
| $L_{a879}$ | P11 | CN | H | H | H | H | H | P13 | H |
| $L_{a880}$ | P11 | CN | H | H | H | H | H | P14 | H |
| $L_{a881}$ | P11 | CN | H | H | H | H | H | P15 | H |
| $L_{a882}$ | P11 | CN | H | H | H | H | H | P16 | H |
| $L_{a883}$ | P11 | CN | H | H | H | H | H | P17 | H |
| $L_{a884}$ | P11 | CN | H | H | H | H | H | P18 | H |
| $L_{a885}$ | P11 | CN | H | H | H | H | H | P19 | H |
| $L_{a886}$ | P11 | CN | H | H | H | H | H | P20 | H |
| $L_{a887}$ | P11 | CN | H | H | H | H | H | P21 | H |
| $L_{a888}$ | P11 | CN | H | H | H | H | F | P1 | H |
| $L_{a889}$ | P11 | CN | H | H | H | H | F | P2 | H |
| $L_{a890}$ | P11 | CN | H | H | H | H | F | P3 | H |
| $L_{a891}$ | P11 | CN | H | H | H | H | F | P4 | H |
| $L_{a892}$ | P11 | CN | H | H | H | H | F | P5 | H |
| $L_{a893}$ | P11 | CN | H | H | H | H | F | P6 | H |
| $L_{a894}$ | P11 | CN | H | H | H | H | F | P7 | H |
| $L_{a895}$ | P11 | CN | H | H | H | H | F | P8 | H |
| $L_{a896}$ | P11 | CN | H | H | H | H | F | P9 | H |
| $L_{a897}$ | P11 | CN | H | H | H | H | F | P10 | H |
| $L_{a898}$ | P11 | CN | H | H | H | H | F | P11 | H |
| $L_{a899}$ | P11 | CN | H | H | H | H | F | P12 | H |
| $L_{a900}$ | P11 | CN | H | H | H | H | F | P13 | H |
| $L_{a901}$ | P11 | CN | H | H | H | H | F | P14 | H |
| $L_{a902}$ | P11 | CN | H | H | H | H | F | P15 | H |
| $L_{a903}$ | P11 | CN | H | H | H | H | F | P16 | H |
| $L_{a904}$ | P11 | CN | H | H | H | H | F | P17 | H |
| $L_{a905}$ | P11 | CN | H | H | H | H | F | P18 | H |
| $L_{a906}$ | P11 | CN | H | H | H | H | F | P19 | H |
| $L_{a907}$ | P11 | CN | H | H | H | H | F | P20 | H |
| $L_{a908}$ | P11 | CN | H | H | H | H | F | P21 | H |
| $L_{a909}$ | P11 | CN | H | H | H | H | P1 | P1 | H |
| $L_{a910}$ | P11 | CN | H | H | H | H | P1 | P3 | H |
| $L_{a911}$ | P11 | CN | H | H | H | H | P1 | P8 | H |
| $L_{a912}$ | P11 | CN | H | H | H | H | P1 | P10 | H |
| $L_{a913}$ | P11 | CN | H | H | H | H | P1 | P20 | H |
| $L_{a914}$ | P11 | CN | H | H | H | H | P1 | P21 | H |
| $L_{a915}$ | P11 | CN | H | H | H | H | P2 | P2 | H |
| $L_{a916}$ | P11 | CN | H | H | H | H | P2 | P4 | H |
| $L_{a917}$ | P11 | CN | H | H | H | H | P2 | P5 | H |
| $L_{a918}$ | P11 | CN | H | H | H | H | P2 | P9 | H |
| $L_{a919}$ | P11 | CN | H | H | H | H | P2 | P11 | H |
| $L_{a920}$ | P11 | CN | H | H | H | H | P2 | P20 | H |
| $L_{a921}$ | P11 | CN | H | H | H | H | P2 | P21 | H |
| $L_{a922}$ | P11 | CN | H | H | H | D | D | D | D |
| $L_{a923}$ | P11 | CN | H | H | H | D | F | D | D |
| $L_{a924}$ | P11 | CN | H | H | H | D | D | F | D |
| $L_{a925}$ | P11 | CN | H | H | H | D | P2 | D | D |
| $L_{a926}$ | P11 | CN | H | H | H | D | D | P2 | D |
| $L_{a927}$ | P11 | CN | H | H | H | D | P2 | P2 | D |
| $L_{a928}$ | P11 | CN | H | H | D | H | H | H | H |
| $L_{a929}$ | P11 | CN | H | H | D | H | P1 | H | H |
| $L_{a930}$ | P11 | CN | H | H | D | H | P2 | H | H |
| $L_{a931}$ | P11 | CN | H | H | D | H | P5 | H | H |
| $L_{a932}$ | P11 | CN | H | H | D | H | P10 | H | H |
| $L_{a933}$ | P11 | CN | H | H | D | H | P11 | H | H |
| $L_{a934}$ | P11 | CN | H | H | D | H | H | P1 | H |
| $L_{a935}$ | P11 | CN | H | H | D | H | H | P2 | H |
| $L_{a936}$ | P11 | CN | H | H | D | H | H | P4 | H |
| $L_{a937}$ | P11 | CN | H | H | D | H | H | P5 | H |
| $L_{a938}$ | P11 | CN | H | H | D | H | H | P10 | H |
| $L_{a939}$ | P11 | CN | H | H | D | H | H | P11 | H |
| $L_{a940}$ | P11 | CN | H | H | D | H | P1 | F | H |
| $L_{a941}$ | P11 | CN | H | H | D | H | P2 | F | H |
| $L_{a942}$ | P11 | CN | H | H | D | H | P11 | F | H |
| $L_{a943}$ | P11 | CN | H | H | D | H | F | P1 | H |
| $L_{a944}$ | P11 | CN | H | H | D | H | F | P2 | H |
| $L_{a945}$ | P11 | CN | H | H | D | H | F | P3 | H |
| $L_{a946}$ | P11 | CN | H | H | D | H | F | P4 | H |
| $L_{a947}$ | P11 | CN | H | H | D | H | F | P5 | H |
| $L_{a948}$ | P11 | CN | H | H | D | H | F | P8 | H |
| $L_{a949}$ | P11 | CN | H | H | D | H | F | P11 | H |
| $L_{a950}$ | P11 | CN | H | H | D | H | P1 | P1 | H |
| $L_{a951}$ | P11 | CN | H | H | D | H | P2 | P2 | H |
| $L_{a952}$ | P11 | CN | H | H | D | H | P2 | P2 | D |
| $L_{a953}$ | P11 | CN | H | H | P20 | H | H | H | H |
| $L_{a954}$ | P11 | CN | H | H | P20 | H | P1 | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a955}$ | P11 | CN | H | H | P20 | H | P2 | H | H |
| $L_{a956}$ | P11 | CN | H | H | P20 | H | P3 | H | H |
| $L_{a957}$ | P11 | CN | H | H | P20 | H | P4 | H | H |
| $L_{a958}$ | P11 | CN | H | H | P20 | H | P5 | H | H |
| $L_{a959}$ | P11 | CN | H | H | P20 | H | P6 | H | H |
| $L_{a960}$ | P11 | CN | H | H | P20 | H | P7 | H | H |
| $L_{a961}$ | P11 | CN | H | H | P20 | H | P8 | H | H |
| $L_{a962}$ | P11 | CN | H | H | P20 | H | P9 | H | H |
| $L_{a963}$ | P11 | CN | H | H | P20 | H | P10 | H | H |
| $L_{a964}$ | P11 | CN | H | H | P20 | H | P11 | H | H |
| $L_{a965}$ | P11 | CN | H | H | P20 | H | P12 | H | H |
| $L_{a966}$ | P11 | CN | H | H | P20 | H | P13 | H | H |
| $L_{a967}$ | P11 | CN | H | H | P20 | H | P14 | H | H |
| $L_{a968}$ | P11 | CN | H | H | P20 | H | P15 | H | H |
| $L_{a969}$ | P11 | CN | H | H | P20 | H | P16 | H | H |
| $L_{a970}$ | P11 | CN | H | H | P20 | H | P17 | H | H |
| $L_{a971}$ | P11 | CN | H | H | P20 | H | P18 | H | H |
| $L_{a972}$ | P11 | CN | H | H | P20 | H | P19 | H | H |
| $L_{a973}$ | P11 | CN | H | H | P20 | H | P20 | H | H |
| $L_{a974}$ | P11 | CN | H | H | P20 | H | P21 | H | H |
| $L_{a975}$ | P11 | CN | H | H | P20 | H | H | P1 | H |
| $L_{a976}$ | P11 | CN | H | H | P20 | H | H | P2 | H |
| $L_{a977}$ | P11 | CN | H | H | P20 | H | H | P3 | H |
| $L_{a978}$ | P11 | CN | H | H | P20 | H | H | P4 | H |
| $L_{a979}$ | P11 | CN | H | H | P20 | H | H | P5 | H |
| $L_{a980}$ | P11 | CN | H | H | P20 | H | H | P6 | H |
| $L_{a981}$ | P11 | CN | H | H | P20 | H | H | P7 | H |
| $L_{a982}$ | P11 | CN | H | H | P20 | H | H | P8 | H |
| $L_{a983}$ | P11 | CN | H | H | P20 | H | H | P9 | H |
| $L_{a984}$ | P11 | CN | H | H | P20 | H | H | P10 | H |
| $L_{a985}$ | P11 | CN | H | H | P20 | H | H | P11 | H |
| $L_{a986}$ | P11 | CN | H | H | P20 | H | H | P12 | H |
| $L_{a987}$ | P11 | CN | H | H | P20 | H | H | P15 | H |
| $L_{a988}$ | P11 | CN | H | H | P20 | H | H | P17 | H |
| $L_{a989}$ | P11 | CN | H | H | P20 | H | H | P18 | H |
| $L_{a990}$ | P11 | CN | H | H | P20 | H | H | P19 | H |
| $L_{a991}$ | P11 | CN | H | H | P20 | H | H | P20 | H |
| $L_{a992}$ | P11 | CN | H | H | P20 | H | H | P21 | H |
| $L_{a993}$ | P11 | CN | H | H | P20 | H | F | H | H |
| $L_{a994}$ | P11 | CN | H | H | P20 | H | F | P1 | H |
| $L_{a995}$ | P11 | CN | H | H | P20 | H | F | P2 | H |
| $L_{a996}$ | P11 | CN | H | H | P20 | H | F | P3 | H |
| $L_{a997}$ | P11 | CN | H | H | P20 | H | F | P4 | H |
| $L_{a998}$ | P11 | CN | H | H | P20 | H | F | P5 | H |
| $L_{a999}$ | P11 | CN | H | H | P20 | H | F | P6 | H |
| $L_{a1000}$ | P11 | CN | H | H | P20 | H | F | P7 | H |
| $L_{a1001}$ | P11 | CN | H | H | P20 | H | F | P8 | H |
| $L_{a1002}$ | P11 | CN | H | H | P20 | H | F | P9 | H |
| $L_{a1003}$ | P11 | CN | H | H | P20 | H | F | P10 | H |
| $L_{a1004}$ | P11 | CN | H | H | P20 | H | F | P11 | H |
| $L_{a1005}$ | P11 | CN | H | H | P20 | H | P1 | F | H |
| $L_{a1006}$ | P11 | CN | H | H | P20 | H | P2 | F | H |
| $L_{a1007}$ | P11 | CN | H | H | P20 | H | P3 | F | H |
| $L_{a1008}$ | P11 | CN | H | H | P20 | H | P4 | F | H |
| $L_{a1009}$ | P11 | CN | H | H | P20 | H | P5 | F | H |
| $L_{a1010}$ | P11 | CN | H | H | P20 | H | P6 | F | H |
| $L_{a1011}$ | P11 | CN | H | H | P20 | H | P7 | F | H |
| $L_{a1012}$ | P11 | CN | H | H | P20 | H | P8 | F | H |
| $L_{a1013}$ | P11 | CN | H | H | P20 | H | P9 | F | H |
| $L_{a1014}$ | P11 | CN | H | H | P20 | H | P10 | F | H |
| $L_{a1015}$ | P11 | CN | H | H | P20 | H | P11 | F | H |
| $L_{a1016}$ | P11 | CN | H | H | P20 | H | P1 | P1 | H |
| $L_{a1017}$ | P11 | CN | H | H | P20 | H | P2 | P2 | H |
| $L_{a1018}$ | P11 | CN | H | H | P20 | D | D | D | D |
| $L_{a1019}$ | P11 | CN | H | H | P20 | D | P2 | P2 | D |
| $L_{a1020}$ | P11 | CN | H | H | P20 | D | F | P4 | D |
| $L_{a1021}$ | P11 | CN | H | H | P20 | D | F | P5 | D |
| $L_{a1022}$ | P11 | CN | H | H | P20 | D | F | P9 | D |
| $L_{a1023}$ | P11 | CN | H | H | P20 | D | F | P11 | D |
| $L_{a1024}$ | P11 | CN | H | H | P21 | H | H | H | H |
| $L_{a1025}$ | P11 | CN | H | H | P21 | H | P1 | H | H |
| $L_{a1026}$ | P11 | CN | H | H | P21 | H | P2 | H | H |
| $L_{a1027}$ | P11 | CN | H | H | P21 | H | P3 | H | H |
| $L_{a1028}$ | P11 | CN | H | H | P21 | H | P4 | H | H |
| $L_{a1029}$ | P11 | CN | H | H | P21 | H | P5 | H | H |
| $L_{a1030}$ | P11 | CN | H | H | P21 | H | P6 | H | H |
| $L_{a1031}$ | P11 | CN | H | H | P21 | H | P7 | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a1032}$ | P11 | CN | H | H | P21 | H | P8 | H | H |
| $L_{a1033}$ | P11 | CN | H | H | P21 | H | P9 | H | H |
| $L_{a1034}$ | P11 | CN | H | H | P21 | H | P10 | H | H |
| $L_{a1035}$ | P11 | CN | H | H | P21 | H | P11 | H | H |
| $L_{a1036}$ | P11 | CN | H | H | P21 | H | P12 | H | H |
| $L_{a1037}$ | P11 | CN | H | H | P21 | H | P13 | H | H |
| $L_{a1038}$ | P11 | CN | H | H | P21 | H | P14 | H | H |
| $L_{a1039}$ | P11 | CN | H | H | P21 | H | P15 | H | H |
| $L_{a1040}$ | P11 | CN | H | H | P21 | H | P16 | H | H |
| $L_{a1041}$ | P11 | CN | H | H | P21 | H | P17 | H | H |
| $L_{a1042}$ | P11 | CN | H | H | P21 | H | P18 | H | H |
| $L_{a1043}$ | P11 | CN | H | H | P21 | H | P19 | H | H |
| $L_{a1044}$ | P11 | CN | H | H | P21 | H | P20 | H | H |
| $L_{a1045}$ | P11 | CN | H | H | P21 | H | P21 | H | H |
| $L_{a1046}$ | P11 | CN | H | H | P21 | H | H | P1 | H |
| $L_{a1047}$ | P11 | CN | H | H | P21 | H | H | P2 | H |
| $L_{a1048}$ | P11 | CN | H | H | P21 | H | H | P3 | H |
| $L_{a1049}$ | P11 | CN | H | H | P21 | H | H | P4 | H |
| $L_{a1050}$ | P11 | CN | H | H | P21 | H | H | P5 | H |
| $L_{a1051}$ | P11 | CN | H | H | P21 | H | H | P6 | H |
| $L_{a1052}$ | P11 | CN | H | H | P21 | H | H | P7 | H |
| $L_{a1053}$ | P11 | CN | H | H | P21 | H | H | P8 | H |
| $L_{a1054}$ | P11 | CN | H | H | P21 | H | H | P9 | H |
| $L_{a1055}$ | P11 | CN | H | H | P21 | H | H | P10 | H |
| $L_{a1056}$ | P11 | CN | H | H | P21 | H | H | P11 | H |
| $L_{a1057}$ | P11 | CN | H | H | P21 | H | H | P12 | H |
| $L_{a1058}$ | P11 | CN | H | H | P21 | H | H | P15 | H |
| $L_{a1059}$ | P11 | CN | H | H | P21 | H | H | P17 | H |
| $L_{a1060}$ | P11 | CN | H | H | P21 | H | H | P18 | H |
| $L_{a1061}$ | P11 | CN | H | H | P21 | H | H | P19 | H |
| $L_{a1062}$ | P11 | CN | H | H | P21 | H | H | P20 | H |
| $L_{a1063}$ | P11 | CN | H | H | P21 | H | H | P21 | H |
| $L_{a1064}$ | P11 | CN | H | H | P21 | H | F | H | H |
| $L_{a1065}$ | P11 | CN | H | H | P21 | H | F | P1 | H |
| $L_{a1066}$ | P11 | CN | H | H | P21 | H | F | P2 | H |
| $L_{a1067}$ | P11 | CN | H | H | P21 | H | F | P3 | H |
| $L_{a1068}$ | P11 | CN | H | H | P21 | H | F | P4 | H |
| $L_{a1069}$ | P11 | CN | H | H | P21 | H | F | P5 | H |
| $L_{a1070}$ | P11 | CN | H | H | P21 | H | F | P6 | H |
| $L_{a1071}$ | P11 | CN | H | H | P21 | H | F | P7 | H |
| $L_{a1072}$ | P11 | CN | H | H | P21 | H | F | P8 | H |
| $L_{a1073}$ | P11 | CN | H | H | P21 | H | F | P9 | H |
| $L_{a1074}$ | P11 | CN | H | H | P21 | H | F | P10 | H |
| $L_{a1075}$ | P11 | CN | H | H | P21 | H | F | P11 | H |
| $L_{a1076}$ | P11 | CN | H | H | P21 | H | P1 | F | H |
| $L_{a1077}$ | P11 | CN | H | H | P21 | H | P2 | F | H |
| $L_{a1078}$ | P11 | CN | H | H | P21 | H | P3 | F | H |
| $L_{a1079}$ | P11 | CN | H | H | P21 | H | P4 | F | H |
| $L_{a1080}$ | P11 | CN | H | H | P21 | H | P5 | F | H |
| $L_{a1081}$ | P11 | CN | H | H | P21 | H | P6 | F | H |
| $L_{a1082}$ | P11 | CN | H | H | P21 | H | P7 | F | H |
| $L_{a1083}$ | P11 | CN | H | H | P21 | H | P8 | F | H |
| $L_{a1084}$ | P11 | CN | H | H | P21 | H | P9 | F | H |
| $L_{a1085}$ | P11 | CN | H | H | P21 | H | P10 | F | H |
| $L_{a1086}$ | P11 | CN | H | H | P21 | H | P11 | F | H |
| $L_{a1087}$ | P11 | CN | H | H | P21 | H | P1 | P1 | H |
| $L_{a1088}$ | P11 | CN | H | H | P21 | H | P2 | P2 | H |
| $L_{a1089}$ | P11 | CN | H | H | P21 | D | D | D | D |
| $L_{a1090}$ | P11 | CN | H | H | P21 | D | P2 | P2 | D |
| $L_{a1091}$ | P11 | CN | H | H | P21 | D | F | P4 | D |
| $L_{a1092}$ | P11 | CN | H | H | P21 | D | F | P5 | D |
| $L_{a1093}$ | P11 | CN | H | H | P21 | D | F | P9 | D |
| $L_{a1094}$ | P11 | CN | H | H | P21 | D | F | P11 | D |
| $L_{a1095}$ | P11 | CN | H | H | P54 | H | H | H | H |
| $L_{a1096}$ | P11 | CN | H | H | P54 | H | P1 | H | H |
| $L_{a1097}$ | P11 | CN | H | H | P54 | H | P2 | H | H |
| $L_{a1098}$ | P11 | CN | H | H | P54 | H | P3 | H | H |
| $L_{a1099}$ | P11 | CN | H | H | P54 | H | P4 | H | H |
| $L_{a1100}$ | P11 | CN | H | H | P54 | H | P5 | H | H |
| $L_{a1101}$ | P11 | CN | H | H | P54 | H | P6 | H | H |
| $L_{a1102}$ | P11 | CN | H | H | P54 | H | P7 | H | H |
| $L_{a1103}$ | P11 | CN | H | H | P54 | H | P8 | H | H |
| $L_{a1104}$ | P11 | CN | H | H | P54 | H | P9 | H | H |
| $L_{a1105}$ | P11 | CN | H | H | P54 | H | P10 | H | H |
| $L_{a1106}$ | P11 | CN | H | H | P54 | H | P11 | H | H |
| $L_{a1107}$ | P11 | CN | H | H | P54 | H | P12 | H | H |
| $L_{a1108}$ | P11 | CN | H | H | P54 | H | P13 | H | H |

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a1109}$ | P11 | CN | H | H | P54 | H | P14 | H | H |
| $L_{a1110}$ | P11 | CN | H | H | P54 | H | P15 | H | H |
| $L_{a1111}$ | P11 | CN | H | H | P54 | H | P16 | H | H |
| $L_{a1112}$ | P11 | CN | H | H | P54 | H | P17 | H | H |
| $L_{a1113}$ | P11 | CN | H | H | P54 | H | P18 | H | H |
| $L_{a1114}$ | P11 | CN | H | H | P54 | H | P19 | H | H |
| $L_{a1115}$ | P11 | CN | H | H | P54 | H | P20 | H | H |
| $L_{a1116}$ | P11 | CN | H | H | P54 | H | P21 | H | H |
| $L_{a1117}$ | P11 | CN | H | H | P54 | H | H | P1 | H |
| $L_{a1118}$ | P11 | CN | H | H | P54 | H | H | P2 | H |
| $L_{a1119}$ | P11 | CN | H | H | P54 | H | H | P3 | H |
| $L_{a1120}$ | P11 | CN | H | H | P54 | H | H | P4 | H |
| $L_{a1121}$ | P11 | CN | H | H | P54 | H | H | P5 | H |
| $L_{a1122}$ | P11 | CN | H | H | P54 | H | H | P6 | H |
| $L_{a1123}$ | P11 | CN | H | H | P54 | H | H | P7 | H |
| $L_{a1124}$ | P11 | CN | H | H | P54 | H | H | P8 | H |
| $L_{a1125}$ | P11 | CN | H | H | P54 | H | H | P9 | H |
| $L_{a1126}$ | P11 | CN | H | H | P54 | H | H | P10 | H |
| $L_{a1127}$ | P11 | CN | H | H | P54 | H | H | P11 | H |
| $L_{a1128}$ | P11 | CN | H | H | P54 | H | H | P12 | H |
| $L_{a1129}$ | P11 | CN | H | H | P54 | H | H | P15 | H |
| $L_{a1130}$ | P11 | CN | H | H | P54 | H | H | P17 | H |
| $L_{a1131}$ | P11 | CN | H | H | P54 | H | H | P18 | H |
| $L_{a1132}$ | P11 | CN | H | H | P54 | H | H | P19 | H |
| $L_{a1133}$ | P11 | CN | H | H | P54 | H | H | P20 | H |
| $L_{a1134}$ | P11 | CN | H | H | P54 | H | H | P21 | H |
| $L_{a1135}$ | P11 | CN | H | H | P54 | H | F | H | H |
| $L_{a1136}$ | P11 | CN | H | H | P54 | H | F | P1 | H |
| $L_{a1137}$ | P11 | CN | H | H | P54 | H | F | P2 | H |
| $L_{a1138}$ | P11 | CN | H | H | P54 | H | F | P3 | H |
| $L_{a1139}$ | P11 | CN | H | H | P54 | H | F | P4 | H |
| $L_{a1140}$ | P11 | CN | H | H | P54 | H | F | P5 | H |
| $L_{a1141}$ | P11 | CN | H | H | P54 | H | F | P6 | H |
| $L_{a1142}$ | P11 | CN | H | H | P54 | H | F | P7 | H |
| $L_{a1143}$ | P11 | CN | H | H | P54 | H | F | P8 | H |
| $L_{a1144}$ | P11 | CN | H | H | P54 | H | F | P9 | H |
| $L_{a1145}$ | P11 | CN | H | H | P54 | H | F | P10 | H |
| $L_{a1146}$ | P11 | CN | H | H | P54 | H | F | P11 | H |
| $L_{a1147}$ | P11 | CN | H | H | P54 | H | P1 | F | H |
| $L_{a1148}$ | P11 | CN | H | H | P54 | H | P2 | F | H |
| $L_{a1149}$ | P11 | CN | H | H | P54 | H | P3 | F | H |
| $L_{a1150}$ | P11 | CN | H | H | P54 | H | P4 | F | H |
| $L_{a1151}$ | P11 | CN | H | H | P54 | H | P5 | F | H |
| $L_{a1152}$ | P11 | CN | H | H | P54 | H | P6 | F | H |
| $L_{a1153}$ | P11 | CN | H | H | P54 | H | P7 | F | H |
| $L_{a1154}$ | P11 | CN | H | H | P54 | H | P8 | F | H |
| $L_{a1155}$ | P11 | CN | H | H | P54 | H | P9 | F | H |
| $L_{a1156}$ | P11 | CN | H | H | P54 | H | P10 | F | H |
| $L_{a1157}$ | P11 | CN | H | H | P54 | H | P11 | F | H |
| $L_{a1158}$ | P11 | CN | H | H | P54 | H | P1 | P1 | H |
| $L_{a1159}$ | P11 | CN | H | H | P54 | H | P2 | P2 | H |
| $L_{a1160}$ | P11 | CN | H | H | P54 | D | D | D | D |
| $L_{a1161}$ | P11 | CN | H | H | P54 | D | P2 | P2 | D |
| $L_{a1162}$ | P11 | CN | H | H | P54 | D | F | P4 | D |
| $L_{a1163}$ | P11 | CN | H | H | P54 | D | F | P5 | D |
| $L_{a1164}$ | P11 | CN | H | H | P54 | D | F | P9 | D |
| $L_{a1165}$ | P11 | CN | H | H | P54 | D | F | P11 | D |
| $L_{a1166}$ | P11 | CN | H | H | P96 | H | H | H | H |
| $L_{a1167}$ | P11 | CN | H | H | P96 | H | P1 | H | H |
| $L_{a1168}$ | P11 | CN | H | H | P96 | H | P2 | H | H |
| $L_{a1169}$ | P11 | CN | H | H | P96 | H | P3 | H | H |
| $L_{a1170}$ | P11 | CN | H | H | P96 | H | P4 | H | H |
| $L_{a1171}$ | P11 | CN | H | H | P96 | H | P5 | H | H |
| $L_{a1172}$ | P11 | CN | H | H | P96 | H | P6 | H | H |
| $L_{a1173}$ | P11 | CN | H | H | P96 | H | P7 | H | H |
| $L_{a1174}$ | P11 | CN | H | H | P96 | H | P8 | H | H |
| $L_{a1175}$ | P11 | CN | H | H | P96 | H | P9 | H | H |
| $L_{a1176}$ | P11 | CN | H | H | P96 | H | P10 | H | H |
| $L_{a1177}$ | P11 | CN | H | H | P96 | H | P11 | H | H |
| $L_{a1178}$ | P11 | CN | H | H | P96 | H | P12 | H | H |
| $L_{a1179}$ | P11 | CN | H | H | P96 | H | P13 | H | H |
| $L_{a1180}$ | P11 | CN | H | H | P96 | H | P14 | H | H |
| $L_{a1181}$ | P11 | CN | H | H | P96 | H | P15 | H | H |
| $L_{a1182}$ | P11 | CN | H | H | P96 | H | P16 | H | H |
| $L_{a1183}$ | P11 | CN | H | H | P96 | H | P17 | H | H |
| $L_{a1184}$ | P11 | CN | H | H | P96 | H | P18 | H | H |
| $L_{a1185}$ | P11 | CN | H | H | P96 | H | P19 | H | H |
| $L_{a1186}$ | P11 | CN | H | H | P96 | H | P20 | H | H |
| $L_{a1187}$ | P11 | CN | H | H | P96 | H | P21 | H | H |
| $L_{a1188}$ | P11 | CN | H | H | P96 | H | H | P1 | H |
| $L_{a1189}$ | P11 | CN | H | H | P96 | H | H | P2 | H |
| $L_{a1190}$ | P11 | CN | H | H | P96 | H | H | P3 | H |
| $L_{a1191}$ | P11 | CN | H | H | P96 | H | H | P4 | H |
| $L_{a1192}$ | P11 | CN | H | H | P96 | H | H | P5 | H |
| $L_{a1193}$ | P11 | CN | H | H | P96 | H | H | P6 | H |
| $L_{a1194}$ | P11 | CN | H | H | P96 | H | H | P7 | H |
| $L_{a1195}$ | P11 | CN | H | H | P96 | H | H | P8 | H |
| $L_{a1196}$ | P11 | CN | H | H | P96 | H | H | P9 | H |
| $L_{a1197}$ | P11 | CN | H | H | P96 | H | H | P10 | H |
| $L_{a1198}$ | P11 | CN | H | H | P96 | H | H | P11 | H |
| $L_{a1199}$ | P11 | CN | H | H | P96 | H | H | P12 | H |
| $L_{a1200}$ | P11 | CN | H | H | P96 | H | H | P15 | H |
| $L_{a1201}$ | P11 | CN | H | H | P96 | H | H | P17 | H |
| $L_{a1202}$ | P11 | CN | H | H | P96 | H | H | P18 | H |
| $L_{a1203}$ | P11 | CN | H | H | P96 | H | H | P19 | H |
| $L_{a1204}$ | P11 | CN | H | H | P96 | H | H | P20 | H |
| $L_{a1205}$ | P11 | CN | H | H | P96 | H | H | P21 | H |
| $L_{a1206}$ | P11 | CN | H | H | P96 | H | F | H | H |
| $L_{a1207}$ | P11 | CN | H | H | P96 | H | F | P1 | H |
| $L_{a1208}$ | P11 | CN | H | H | P96 | H | F | P2 | H |
| $L_{a1209}$ | P11 | CN | H | H | P96 | H | F | P3 | H |
| $L_{a1210}$ | P11 | CN | H | H | P96 | H | F | P4 | H |
| $L_{a1211}$ | P11 | CN | H | H | P96 | H | F | P5 | H |
| $L_{a1212}$ | P11 | CN | H | H | P96 | H | F | P6 | H |
| $L_{a1213}$ | P11 | CN | H | H | P96 | H | F | P7 | H |
| $L_{a1214}$ | P11 | CN | H | H | P96 | H | F | P8 | H |
| $L_{a1215}$ | P11 | CN | H | H | P96 | H | F | P9 | H |
| $L_{a1216}$ | P11 | CN | H | H | P96 | H | F | P10 | H |
| $L_{a1217}$ | P11 | CN | H | H | P96 | H | F | P11 | H |
| $L_{a1218}$ | P11 | CN | H | H | P96 | H | P1 | F | H |
| $L_{a1219}$ | P11 | CN | H | H | P96 | H | P2 | F | H |
| $L_{a1220}$ | P11 | CN | H | H | P96 | H | P3 | F | H |
| $L_{a1221}$ | P11 | CN | H | H | P96 | H | P4 | F | H |
| $L_{a1222}$ | P11 | CN | H | H | P96 | H | P5 | F | H |
| $L_{a1223}$ | P11 | CN | H | H | P96 | H | P6 | F | H |
| $L_{a1224}$ | P11 | CN | H | H | P96 | H | P7 | F | H |
| $L_{a1225}$ | P11 | CN | H | H | P96 | H | P8 | F | H |
| $L_{a1226}$ | P11 | CN | H | H | P96 | H | P9 | F | H |
| $L_{a1227}$ | P11 | CN | H | H | P96 | H | P10 | F | H |
| $L_{a1228}$ | P11 | CN | H | H | P96 | H | P11 | F | H |
| $L_{a1229}$ | P11 | CN | H | H | P96 | H | P1 | P1 | H |
| $L_{a1230}$ | P11 | CN | H | H | P96 | H | P2 | P2 | H |
| $L_{a1231}$ | P11 | CN | H | H | P96 | D | D | D | D |
| $L_{a1232}$ | P11 | CN | H | H | P96 | D | P2 | P2 | D |
| $L_{a1233}$ | P11 | CN | H | H | P96 | D | F | P4 | D |
| $L_{a1234}$ | P11 | CN | H | H | P96 | D | F | P5 | D |
| $L_{a1235}$ | P11 | CN | H | H | P96 | D | F | P9 | D |
| $L_{a1236}$ | P11 | CN | H | H | P96 | D | F | P11 | D |
| $L_{a1237}$ | P11 | CN | H | H | P97 | H | H | H | H |
| $L_{a1238}$ | P11 | CN | H | H | P97 | H | P1 | H | H |
| $L_{a1239}$ | P11 | CN | H | H | P97 | H | P2 | H | H |
| $L_{a1240}$ | P11 | CN | H | H | P97 | H | P3 | H | H |
| $L_{a1241}$ | P11 | CN | H | H | P97 | H | P4 | H | H |
| $L_{a1242}$ | P11 | CN | H | H | P97 | H | P5 | H | H |
| $L_{a1243}$ | P11 | CN | H | H | P97 | H | P6 | H | H |
| $L_{a1244}$ | P11 | CN | H | H | P97 | H | P7 | H | H |
| $L_{a1245}$ | P11 | CN | H | H | P97 | H | P8 | H | H |
| $L_{a1246}$ | P11 | CN | H | H | P97 | H | P9 | H | H |
| $L_{a1247}$ | P11 | CN | H | H | P97 | H | P10 | H | H |
| $L_{a1248}$ | P11 | CN | H | H | P97 | H | P11 | H | H |
| $L_{a1249}$ | P11 | CN | H | H | P97 | H | P12 | H | H |
| $L_{a1250}$ | P11 | CN | H | H | P97 | H | P13 | H | H |
| $L_{a1251}$ | P11 | CN | H | H | P97 | H | P14 | H | H |
| $L_{a1252}$ | P11 | CN | H | H | P97 | H | P15 | H | H |
| $L_{a1253}$ | P11 | CN | H | H | P97 | H | P16 | H | H |
| $L_{a1254}$ | P11 | CN | H | H | P97 | H | P17 | H | H |
| $L_{a1255}$ | P11 | CN | H | H | P97 | H | P18 | H | H |
| $L_{a1256}$ | P11 | CN | H | H | P97 | H | P19 | H | H |
| $L_{a1257}$ | P11 | CN | H | H | P97 | H | P20 | H | H |
| $L_{a1258}$ | P11 | CN | H | H | P97 | H | P21 | H | H |
| $L_{a1259}$ | P11 | CN | H | H | P97 | H | H | P1 | H |
| $L_{a1260}$ | P11 | CN | H | H | P97 | H | H | P2 | H |
| $L_{a1261}$ | P11 | CN | H | H | P97 | H | H | P3 | H |
| $L_{a1262}$ | P11 | CN | H | H | P97 | H | H | P4 | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a1263}$ | P11 | CN | H | H | P97 | H | H | P5 | H |
| $L_{a1264}$ | P11 | CN | H | H | P97 | H | H | P6 | H |
| $L_{a1265}$ | P11 | CN | H | H | P97 | H | H | P7 | H |
| $L_{a1266}$ | P11 | CN | H | H | P97 | H | H | P8 | H |
| $L_{a1267}$ | P11 | CN | H | H | P97 | H | H | P9 | H |
| $L_{a1268}$ | P11 | CN | H | H | P97 | H | H | P10 | H |
| $L_{a1269}$ | P11 | CN | H | H | P97 | H | H | P11 | H |
| $L_{a1270}$ | P11 | CN | H | H | P97 | H | H | P12 | H |
| $L_{a1271}$ | P11 | CN | H | H | P97 | H | H | P15 | H |
| $L_{a1272}$ | P11 | CN | H | H | P97 | H | H | P17 | H |
| $L_{a1273}$ | P11 | CN | H | H | P97 | H | H | P18 | H |
| $L_{a1274}$ | P11 | CN | H | H | P97 | H | H | P19 | H |
| $L_{a1275}$ | P11 | CN | H | H | P97 | H | H | P20 | H |
| $L_{a1276}$ | P11 | CN | H | H | P97 | H | H | P21 | H |
| $L_{a1277}$ | P11 | CN | H | H | P97 | H | F | H | H |
| $L_{a1278}$ | P11 | CN | H | H | P97 | H | F | P1 | H |
| $L_{a1279}$ | P11 | CN | H | H | P97 | H | F | P2 | H |
| $L_{a1280}$ | P11 | CN | H | H | P97 | H | F | P3 | H |
| $L_{a1281}$ | P11 | CN | H | H | P97 | H | F | P4 | H |
| $L_{a1282}$ | P11 | CN | H | H | P97 | H | F | P5 | H |
| $L_{a1283}$ | P11 | CN | H | H | P97 | H | F | P6 | H |
| $L_{a1284}$ | P11 | CN | H | H | P97 | H | F | P7 | H |
| $L_{a1285}$ | P11 | CN | H | H | P97 | H | F | P8 | H |
| $L_{a1286}$ | P11 | CN | H | H | P97 | H | F | P9 | H |
| $L_{a1287}$ | P11 | CN | H | H | P97 | H | F | P10 | H |
| $L_{a1288}$ | P11 | CN | H | H | P97 | H | F | P11 | H |
| $L_{a1289}$ | P11 | CN | H | H | P97 | H | P1 | F | H |
| $L_{a1290}$ | P11 | CN | H | H | P97 | H | P2 | F | H |
| $L_{a1291}$ | P11 | CN | H | H | P97 | H | P3 | F | H |
| $L_{a1292}$ | P11 | CN | H | H | P97 | H | P4 | F | H |
| $L_{a1293}$ | P11 | CN | H | H | P97 | H | P5 | F | H |
| $L_{a1294}$ | P11 | CN | H | H | P97 | H | P6 | F | H |
| $L_{a1295}$ | P11 | CN | H | H | P97 | H | P7 | F | H |
| $L_{a1296}$ | P11 | CN | H | H | P97 | H | P8 | F | H |
| $L_{a1297}$ | P11 | CN | H | H | P97 | H | P9 | F | H |
| $L_{a1298}$ | P11 | CN | H | H | P97 | H | P10 | F | H |
| $L_{a1299}$ | P11 | CN | H | H | P97 | H | P11 | F | H |
| $L_{a1300}$ | P11 | CN | H | H | P97 | H | P1 | P1 | H |
| $L_{a1301}$ | P11 | CN | H | H | P97 | H | P2 | P2 | H |
| $L_{a1302}$ | P11 | CN | H | H | P97 | D | D | D | D |
| $L_{a1303}$ | P11 | CN | H | H | P97 | D | P2 | P2 | D |
| $L_{a1304}$ | P11 | CN | H | H | P97 | D | F | P4 | D |
| $L_{a1305}$ | P11 | CN | H | H | P97 | D | F | P5 | D |
| $L_{a1306}$ | P11 | CN | H | H | P97 | D | F | P9 | D |
| $L_{a1307}$ | P11 | CN | H | H | P97 | D | F | P11 | D |
| $L_{a1308}$ | P11 | CN | H | H | P102 | H | P1 | H | H |
| $L_{a1309}$ | P11 | CN | H | H | P102 | H | P2 | H | H |
| $L_{a1310}$ | P11 | CN | H | H | P102 | H | P3 | H | H |
| $L_{a1311}$ | P11 | CN | H | H | P102 | H | P4 | H | H |
| $L_{a1312}$ | P11 | CN | H | H | P102 | H | P5 | H | H |
| $L_{a1313}$ | P11 | CN | H | H | P102 | H | P6 | H | H |
| $L_{a1314}$ | P11 | CN | H | H | P102 | H | P7 | H | H |
| $L_{a1315}$ | P11 | CN | H | H | P102 | H | P8 | H | H |
| $L_{a1316}$ | P11 | CN | H | H | P102 | H | P9 | H | H |
| $L_{a1317}$ | P11 | CN | H | H | P102 | H | P10 | H | H |
| $L_{a1318}$ | P11 | CN | H | H | P102 | H | P11 | H | H |
| $L_{a1319}$ | P11 | CN | H | H | P102 | H | P12 | H | H |
| $L_{a1320}$ | P11 | CN | H | H | P102 | H | P13 | H | H |
| $L_{a1321}$ | P11 | CN | H | H | P102 | H | P14 | H | H |
| $L_{a1322}$ | P11 | CN | H | H | P102 | H | P15 | H | H |
| $L_{a1323}$ | P11 | CN | H | H | P102 | H | P16 | H | H |
| $L_{a1324}$ | P11 | CN | H | H | P102 | H | P17 | H | H |
| $L_{a1325}$ | P11 | CN | H | H | P102 | H | P18 | H | H |
| $L_{a1326}$ | P11 | CN | H | H | P102 | H | P19 | H | H |
| $L_{a1327}$ | P11 | CN | H | H | P102 | H | P20 | H | H |
| $L_{a1328}$ | P11 | CN | H | H | P102 | H | P21 | H | H |
| $L_{a1329}$ | P11 | CN | H | H | P102 | H | H | P1 | H |
| $L_{a1330}$ | P11 | CN | H | H | P102 | H | H | P2 | H |
| $L_{a1331}$ | P11 | CN | H | H | P102 | H | H | P3 | H |
| $L_{a1332}$ | P11 | CN | H | H | P102 | H | H | P4 | H |
| $L_{a1333}$ | P11 | CN | H | H | P102 | H | H | P5 | H |
| $L_{a1334}$ | P11 | CN | H | H | P102 | H | H | P6 | H |
| $L_{a1335}$ | P11 | CN | H | H | P102 | H | H | P7 | H |
| $L_{a1336}$ | P11 | CN | H | H | P102 | H | H | P8 | H |
| $L_{a1337}$ | P11 | CN | H | H | P102 | H | H | P9 | H |
| $L_{a1338}$ | P11 | CN | H | H | P102 | H | H | P10 | H |
| $L_{a1339}$ | P11 | CN | H | H | P102 | H | H | P11 | H |
| $L_{a1340}$ | P11 | CN | H | H | P102 | H | H | P12 | H |
| $L_{a1341}$ | P11 | CN | H | H | P102 | H | H | P15 | H |
| $L_{a1342}$ | P11 | CN | H | H | P102 | H | H | P17 | H |
| $L_{a1343}$ | P11 | CN | H | H | P102 | H | H | P18 | H |
| $L_{a1344}$ | P11 | CN | H | H | P102 | H | H | P19 | H |
| $L_{a1345}$ | P11 | CN | H | H | P102 | H | H | P20 | H |
| $L_{a1346}$ | P11 | CN | H | H | P102 | H | H | P21 | H |
| $L_{a1347}$ | P11 | CN | H | H | P102 | H | F | H | H |
| $L_{a1348}$ | P11 | CN | H | H | P102 | H | F | P1 | H |
| $L_{a1349}$ | P11 | CN | H | H | P102 | H | F | P2 | H |
| $L_{a1350}$ | P11 | CN | H | H | P102 | H | F | P3 | H |
| $L_{a1351}$ | P11 | CN | H | H | P102 | H | F | P4 | H |
| $L_{a1352}$ | P11 | CN | H | H | P102 | H | F | P5 | H |
| $L_{a1353}$ | P11 | CN | H | H | P102 | H | F | P6 | H |
| $L_{a1354}$ | P11 | CN | H | H | P102 | H | F | P7 | H |
| $L_{a1355}$ | P11 | CN | H | H | P102 | H | F | P8 | H |
| $L_{a1356}$ | P11 | CN | H | H | P102 | H | F | P9 | H |
| $L_{a1357}$ | P11 | CN | H | H | P102 | H | F | P10 | H |
| $L_{a1358}$ | P11 | CN | H | H | P102 | H | F | P11 | H |
| $L_{a1359}$ | P11 | CN | H | H | P102 | H | P1 | F | H |
| $L_{a1360}$ | P11 | CN | H | H | P102 | H | P2 | F | H |
| $L_{a1361}$ | P11 | CN | H | H | P102 | H | P3 | F | H |
| $L_{a1362}$ | P11 | CN | H | H | P102 | H | P4 | F | H |
| $L_{a1363}$ | P11 | CN | H | H | P102 | H | P5 | F | H |
| $L_{a1364}$ | P11 | CN | H | H | P102 | H | P6 | F | H |
| $L_{a1365}$ | P11 | CN | H | H | P102 | H | P7 | F | H |
| $L_{a1366}$ | P11 | CN | H | H | P102 | H | P8 | F | H |
| $L_{a1367}$ | P11 | CN | H | H | P102 | H | P9 | F | H |
| $L_{a1368}$ | P11 | CN | H | H | P102 | H | P10 | F | H |
| $L_{a1369}$ | P11 | CN | H | H | P102 | H | P11 | F | H |
| $L_{a1370}$ | P11 | CN | H | H | P102 | H | P1 | P1 | H |
| $L_{a1371}$ | P11 | CN | H | H | P102 | H | P2 | P2 | H |
| $L_{a1372}$ | P11 | CN | H | H | P102 | D | D | D | D |
| $L_{a1373}$ | P11 | CN | H | H | P102 | D | P2 | P2 | D |
| $L_{a1374}$ | P11 | CN | H | H | P102 | D | F | P4 | D |
| $L_{a1375}$ | P11 | CN | H | H | P102 | D | F | P5 | D |
| $L_{a1376}$ | P11 | CN | H | H | P102 | D | F | P9 | D |
| $L_{a1377}$ | P11 | CN | H | H | P102 | D | F | P11 | D |
| $L_{a1378}$ | P11 | CN | H | H | P103 | H | P1 | H | H |
| $L_{a1379}$ | P11 | CN | H | H | P103 | H | P2 | H | H |
| $L_{a1380}$ | P11 | CN | H | H | P103 | H | P3 | H | H |
| $L_{a1381}$ | P11 | CN | H | H | P103 | H | P4 | H | H |
| $L_{a1382}$ | P11 | CN | H | H | P103 | H | P5 | H | H |
| $L_{a1383}$ | P11 | CN | H | H | P103 | H | P6 | H | H |
| $L_{a1384}$ | P11 | CN | H | H | P103 | H | P7 | H | H |
| $L_{a1385}$ | P11 | CN | H | H | P103 | H | P8 | H | H |
| $L_{a1386}$ | P11 | CN | H | H | P103 | H | P9 | H | H |
| $L_{a1387}$ | P11 | CN | H | H | P103 | H | P10 | H | H |
| $L_{a1388}$ | P11 | CN | H | H | P103 | H | P11 | H | H |
| $L_{a1389}$ | P11 | CN | H | H | P103 | H | P12 | H | H |
| $L_{a1390}$ | P11 | CN | H | H | P103 | H | P13 | H | H |
| $L_{a1391}$ | P11 | CN | H | H | P103 | H | P14 | H | H |
| $L_{a1392}$ | P11 | CN | H | H | P103 | H | P15 | H | H |
| $L_{a1393}$ | P11 | CN | H | H | P103 | H | P16 | H | H |
| $L_{a1394}$ | P11 | CN | H | H | P103 | H | P17 | H | H |
| $L_{a1395}$ | P11 | CN | H | H | P103 | H | P18 | H | H |
| $L_{a1396}$ | P11 | CN | H | H | P103 | H | P19 | H | H |
| $L_{a1397}$ | P11 | CN | H | H | P103 | H | P20 | H | H |
| $L_{a1398}$ | P11 | CN | H | H | P103 | H | P21 | H | H |
| $L_{a1399}$ | P11 | CN | H | H | P103 | H | H | P1 | H |
| $L_{a1400}$ | P11 | CN | H | H | P103 | H | H | P2 | H |
| $L_{a1401}$ | P11 | CN | H | H | P103 | H | H | P3 | H |
| $L_{a1402}$ | P11 | CN | H | H | P103 | H | H | P4 | H |
| $L_{a1403}$ | P11 | CN | H | H | P103 | H | H | P5 | H |
| $L_{a1404}$ | P11 | CN | H | H | P103 | H | H | P6 | H |
| $L_{a1405}$ | P11 | CN | H | H | P103 | H | H | P7 | H |
| $L_{a1406}$ | P11 | CN | H | H | P103 | H | H | P8 | H |
| $L_{a1407}$ | P11 | CN | H | H | P103 | H | H | P9 | H |
| $L_{a1408}$ | P11 | CN | H | H | P103 | H | H | P10 | H |
| $L_{a1409}$ | P11 | CN | H | H | P103 | H | H | P11 | H |
| $L_{a1410}$ | P11 | CN | H | H | P103 | H | H | P12 | H |
| $L_{a1411}$ | P11 | CN | H | H | P103 | H | H | P15 | H |
| $L_{a1412}$ | P11 | CN | H | H | P103 | H | H | P17 | H |
| $L_{a1413}$ | P11 | CN | H | H | P103 | H | H | P18 | H |
| $L_{a1414}$ | P11 | CN | H | H | P103 | H | H | P19 | H |
| $L_{a1415}$ | P11 | CN | H | H | P103 | H | H | P20 | H |
| $L_{a1416}$ | P11 | CN | H | H | P103 | H | H | P21 | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a1417}$ | P11 | CN | H | H | P103 | H | F | H | H |
| $L_{a1418}$ | P11 | CN | H | H | P103 | H | F | P1 | H |
| $L_{a1419}$ | P11 | CN | H | H | P103 | H | F | P2 | H |
| $L_{a1420}$ | P11 | CN | H | H | P103 | H | F | P3 | H |
| $L_{a1421}$ | P11 | CN | H | H | P103 | H | F | P4 | H |
| $L_{a1422}$ | P11 | CN | H | H | P103 | H | F | P5 | H |
| $L_{a1423}$ | P11 | CN | H | H | P103 | H | F | P6 | H |
| $L_{a1424}$ | P11 | CN | H | H | P103 | H | F | P7 | H |
| $L_{a1425}$ | P11 | CN | H | H | P103 | H | F | P8 | H |
| $L_{a1426}$ | P11 | CN | H | H | P103 | H | F | P9 | H |
| $L_{a1427}$ | P11 | CN | H | H | P103 | H | F | P10 | H |
| $L_{a1428}$ | P11 | CN | H | H | P103 | H | F | P11 | H |
| $L_{a1429}$ | P11 | CN | H | H | P103 | H | P1 | F | H |
| $L_{a1430}$ | P11 | CN | H | H | P103 | H | P2 | F | H |
| $L_{a1431}$ | P11 | CN | H | H | P103 | H | P3 | F | H |
| $L_{a1432}$ | P11 | CN | H | H | P103 | H | P4 | F | H |
| $L_{a1433}$ | P11 | CN | H | H | P103 | H | P5 | F | H |
| $L_{a1434}$ | P11 | CN | H | H | P103 | H | P6 | F | H |
| $L_{a1435}$ | P11 | CN | H | H | P103 | H | P7 | F | H |
| $L_{a1436}$ | P11 | CN | H | H | P103 | H | P8 | F | H |
| $L_{a1437}$ | P11 | CN | H | H | P103 | H | P9 | F | H |
| $L_{a1438}$ | P11 | CN | H | H | P103 | H | P10 | F | H |
| $L_{a1439}$ | P11 | CN | H | H | P103 | H | P11 | F | H |
| $L_{a1440}$ | P11 | CN | H | H | P103 | H | P1 | P1 | H |
| $L_{a1441}$ | P11 | CN | H | H | P103 | H | P2 | P2 | H |
| $L_{a1442}$ | P11 | CN | H | H | P103 | D | D | D | D |
| $L_{a1443}$ | P11 | CN | H | H | P103 | D | P2 | P2 | D |
| $L_{a1444}$ | P11 | CN | H | H | P103 | D | F | P4 | D |
| $L_{a1445}$ | P11 | CN | H | H | P103 | D | F | P5 | D |
| $L_{a1446}$ | P11 | CN | H | H | P103 | D | F | P9 | D |
| $L_{a1447}$ | P11 | CN | H | H | P103 | D | F | P11 | D |
| $L_{a1448}$ | P11 | CN | H | H | H | H | P20 | P1 | H |
| $L_{a1449}$ | P11 | CN | H | H | H | H | P21 | P2 | H |
| $L_{a1450}$ | P11 | CN | H | H | H | H | P29 | H | H |
| $L_{a1451}$ | P11 | CN | H | H | H | H | P29 | P1 | H |
| $L_{a1452}$ | P11 | CN | H | H | H | H | P54 | H | H |
| $L_{a1453}$ | P11 | CN | H | H | H | H | P96 | H | H |
| $L_{a1454}$ | P11 | CN | H | H | H | H | P97 | H | H |
| $L_{a1455}$ | P11 | CN | H | H | H | H | P96 | P1 | H |
| $L_{a1456}$ | P11 | CN | H | H | H | H | P97 | P1 | H |
| $L_{a1457}$ | P11 | CN | H | H | H | H | P102 | H | H |
| $L_{a1458}$ | P11 | CN | H | H | H | H | P103 | H | H |
| $L_{a1459}$ | P11 | CN | H | H | D | H | P20 | P1 | H |
| $L_{a1460}$ | P11 | CN | H | H | D | H | P21 | P2 | H |
| $L_{a1461}$ | P11 | CN | H | H | D | H | P29 | H | H |
| $L_{a1462}$ | P11 | CN | H | H | D | H | P29 | P1 | H |
| $L_{a1463}$ | P11 | CN | H | H | D | H | P54 | H | H |
| $L_{a1464}$ | P11 | CN | H | H | D | H | P96 | H | H |
| $L_{a1465}$ | P11 | CN | H | H | D | H | P97 | H | H |
| $L_{a1466}$ | P11 | CN | H | H | D | H | P96 | P1 | H |
| $L_{a1467}$ | P11 | CN | H | H | D | H | P97 | P1 | H |
| $L_{a1468}$ | P11 | CN | H | H | D | H | P102 | H | H |
| $L_{a1469}$ | P11 | CN | H | H | D | H | P103 | H | H |
| $L_{a1470}$ | P11 | CN | H | H | P20 | H | P20 | P1 | H |
| $L_{a1471}$ | P11 | CN | H | H | P20 | H | P21 | P2 | H |
| $L_{a1472}$ | P11 | CN | H | H | P20 | H | P29 | H | H |
| $L_{a1473}$ | P11 | CN | H | H | P20 | H | P29 | P1 | H |
| $L_{a1474}$ | P11 | CN | H | H | P20 | H | P54 | H | H |
| $L_{a1475}$ | P11 | CN | H | H | P20 | H | P96 | H | H |
| $L_{a1476}$ | P11 | CN | H | H | P20 | H | P97 | H | H |
| $L_{a1477}$ | P11 | CN | H | H | P20 | H | P96 | P1 | H |
| $L_{a1478}$ | P11 | CN | H | H | P20 | H | P97 | P1 | H |
| $L_{a1479}$ | P11 | CN | H | H | P20 | H | P102 | H | H |
| $L_{a1480}$ | P11 | CN | H | H | P20 | H | P103 | H | H |
| $L_{a1481}$ | P11 | CN | H | H | P21 | H | P20 | P1 | H |
| $L_{a1482}$ | P11 | CN | H | H | P21 | H | P21 | P2 | H |
| $L_{a1483}$ | P11 | CN | H | H | P21 | H | P29 | H | H |
| $L_{a1484}$ | P11 | CN | H | H | P21 | H | P29 | P1 | H |
| $L_{a1485}$ | P11 | CN | H | H | P21 | H | P54 | H | H |
| $L_{a1486}$ | P11 | CN | H | H | P21 | H | P96 | H | H |
| $L_{a1487}$ | P11 | CN | H | H | P21 | H | P97 | H | H |
| $L_{a1488}$ | P11 | CN | H | H | P21 | H | P96 | P1 | H |
| $L_{a1489}$ | P11 | CN | H | H | P21 | H | P97 | P1 | H |
| $L_{a1490}$ | P11 | CN | H | H | P21 | H | P102 | H | H |
| $L_{a1491}$ | P11 | CN | H | H | P21 | H | P103 | H | H |
| $L_{a1492}$ | P11 | CN | H | H | P22 | H | H | H | H |
| $L_{a1493}$ | P11 | CN | H | H | P23 | H | H | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a1494}$ | P11 | CN | H | H | P24 | H | H | H | H |
| $L_{a1495}$ | P11 | CN | H | H | P25 | H | H | H | H |
| $L_{a1496}$ | P11 | CN | H | H | P26 | H | H | H | H |
| $L_{a1497}$ | P11 | CN | H | H | P27 | H | H | H | H |
| $L_{a1498}$ | P11 | CN | H | H | P28 | H | H | H | H |
| $L_{a1499}$ | P11 | CN | H | H | P29 | H | H | H | H |
| $L_{a1500}$ | P11 | CN | H | H | P30 | H | H | H | H |
| $L_{a1501}$ | P11 | CN | H | H | P31 | H | H | H | H |
| $L_{a1502}$ | P11 | CN | H | H | P32 | H | H | H | H |
| $L_{a1503}$ | P11 | CN | H | H | P33 | H | H | H | H |
| $L_{a1504}$ | P11 | CN | H | H | P34 | H | H | H | H |
| $L_{a1505}$ | P11 | CN | H | H | P35 | H | H | H | H |
| $L_{a1506}$ | P11 | CN | H | H | P36 | H | H | H | H |
| $L_{a1507}$ | P11 | CN | H | H | P37 | H | H | H | H |
| $L_{a1508}$ | P11 | CN | H | H | P38 | H | H | H | H |
| $L_{a1509}$ | P11 | CN | H | H | P39 | H | H | H | H |
| $L_{a1510}$ | P11 | CN | H | H | P40 | H | H | H | H |
| $L_{a1511}$ | P11 | CN | H | H | P41 | H | H | H | H |
| $L_{a1512}$ | P11 | CN | H | H | P42 | H | H | H | H |
| $L_{a1513}$ | P11 | CN | H | H | P43 | H | H | H | H |
| $L_{a1514}$ | P11 | CN | H | H | P44 | H | H | H | H |
| $L_{a1515}$ | P11 | CN | H | H | P45 | H | H | H | H |
| $L_{a1516}$ | P11 | CN | H | H | P46 | H | H | H | H |
| $L_{a1517}$ | P11 | CN | H | H | P47 | H | H | H | H |
| $L_{a1518}$ | P11 | CN | H | H | P48 | H | H | H | H |
| $L_{a1519}$ | P11 | CN | H | H | P49 | H | H | H | H |
| $L_{a1520}$ | P11 | CN | H | H | P50 | H | H | H | H |
| $L_{a1521}$ | P11 | CN | H | H | P51 | H | H | H | H |
| $L_{a1522}$ | P11 | CN | H | H | P52 | H | H | H | H |
| $L_{a1523}$ | P11 | CN | H | H | P53 | H | H | H | H |
| $L_{a1524}$ | P11 | CN | H | H | P55 | H | H | H | H |
| $L_{a1525}$ | P11 | CN | H | H | P56 | H | H | H | H |
| $L_{a1526}$ | P11 | CN | H | H | P57 | H | H | H | H |
| $L_{a1527}$ | P11 | CN | H | H | P58 | H | H | H | H |
| $L_{a1528}$ | P11 | CN | H | H | P59 | H | H | H | H |
| $L_{a1529}$ | P11 | CN | H | H | P60 | H | H | H | H |
| $L_{a1530}$ | P11 | CN | H | H | P61 | H | H | H | H |
| $L_{a1531}$ | P11 | CN | H | H | P62 | H | H | H | H |
| $L_{a1532}$ | P11 | CN | H | H | P63 | H | H | H | H |
| $L_{a1533}$ | P11 | CN | H | H | P64 | H | H | H | H |
| $L_{a1534}$ | P11 | CN | H | H | P65 | H | H | H | H |
| $L_{a1535}$ | P11 | CN | H | H | P66 | H | H | H | H |
| $L_{a1536}$ | P11 | CN | H | H | P67 | H | H | H | H |
| $L_{a1537}$ | P11 | CN | H | H | P68 | H | H | H | H |
| $L_{a1538}$ | P11 | CN | H | H | P69 | H | H | H | H |
| $L_{a1539}$ | P11 | CN | H | H | P70 | H | H | H | H |
| $L_{a1540}$ | P11 | CN | H | H | P71 | H | H | H | H |
| $L_{a1541}$ | P11 | CN | H | H | P72 | H | H | H | H |
| $L_{a1542}$ | P11 | CN | H | H | P73 | H | H | H | H |
| $L_{a1543}$ | P11 | CN | H | H | P74 | H | H | H | H |
| $L_{a1544}$ | P11 | CN | H | H | P75 | H | H | H | H |
| $L_{a1545}$ | P11 | CN | H | H | P76 | H | H | H | H |
| $L_{a1546}$ | P11 | CN | H | H | P77 | H | H | H | H |
| $L_{a1547}$ | P11 | CN | H | H | P78 | H | H | H | H |
| $L_{a1548}$ | P11 | CN | H | H | P79 | H | H | H | H |
| $L_{a1549}$ | P11 | CN | H | H | P80 | H | H | H | H |
| $L_{a1550}$ | P11 | CN | H | H | P81 | H | H | H | H |
| $L_{a1551}$ | P11 | CN | H | H | P82 | H | H | H | H |
| $L_{a1552}$ | P11 | CN | H | H | P83 | H | H | H | H |
| $L_{a1553}$ | P11 | CN | H | H | P84 | H | H | H | H |
| $L_{a1554}$ | P11 | CN | H | H | P85 | H | H | H | H |
| $L_{a1555}$ | P11 | CN | H | H | P86 | H | H | H | H |
| $L_{a1556}$ | P11 | CN | H | H | P87 | H | H | H | H |
| $L_{a1557}$ | P11 | CN | H | H | P88 | H | H | H | H |
| $L_{a1558}$ | P11 | CN | H | H | P89 | H | H | H | H |
| $L_{a1559}$ | P11 | CN | H | H | P90 | H | H | H | H |
| $L_{a1560}$ | P11 | CN | H | H | P91 | H | H | H | H |
| $L_{a1561}$ | P11 | CN | H | H | P92 | H | H | H | H |
| $L_{a1562}$ | P11 | CN | H | H | P93 | H | H | H | H |
| $L_{a1563}$ | P11 | CN | H | H | P94 | H | H | H | H |
| $L_{a1564}$ | P11 | CN | H | H | P95 | H | H | H | H |
| $L_{a1565}$ | P11 | CN | H | H | P98 | H | H | H | H |
| $L_{a1566}$ | P11 | CN | H | H | P99 | H | H | H | H |
| $L_{a1567}$ | P11 | CN | H | H | P100 | H | H | H | H |
| $L_{a1568}$ | P11 | CN | H | H | P101 | H | H | H | H |
| $L_{a1569}$ | P11 | CN | H | H | P102 | H | H | H | H |
| $L_{a1570}$ | P11 | CN | H | H | P103 | H | H | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a1571}$ | P11 | CN | H | H | P104 | H | H | H | H |
| $L_{a1572}$ | P11 | CN | H | H | P105 | H | H | H | H |
| $L_{a1573}$ | P11 | CN | H | H | P106 | H | H | H | H |
| $L_{a1574}$ | P11 | CN | H | H | P107 | H | H | H | H |
| $L_{a1575}$ | P11 | CN | H | H | P108 | H | H | H | H |
| $L_{a1576}$ | P11 | CN | H | H | P109 | H | H | H | H |
| $L_{a1577}$ | P11 | CN | H | H | P110 | H | H | H | H |
| $L_{a1578}$ | P11 | CN | H | H | P111 | H | H | H | H |
| $L_{a1579}$ | P11 | CN | H | H | P112 | H | H | H | H |
| $L_{a1580}$ | P11 | CN | H | H | P113 | H | H | H | H |
| $L_{a1581}$ | P11 | CN | H | H | P114 | H | H | H | H |
| $L_{a1582}$ | P11 | CN | H | H | P115 | H | H | H | H |
| $L_{a1583}$ | P11 | CN | H | H | P116 | H | H | H | H |
| $L_{a1584}$ | P11 | CN | H | H | P117 | H | H | H | H |
| $L_{a1585}$ | P11 | CN | H | H | P118 | H | H | H | H |
| $L_{a1586}$ | P11 | CN | H | H | P119 | H | H | H | H |
| $L_{a1587}$ | P11 | CN | H | H | P120 | H | H | H | H |
| $L_{a1588}$ | P11 | CN | H | H | P121 | H | H | H | H |
| $L_{a1589}$ | P11 | CN | H | H | P122 | H | H | H | H |
| $L_{a1590}$ | P11 | CN | H | H | P123 | H | H | H | H |
| $L_{a1591}$ | P11 | CN | H | H | P124 | H | H | H | H |
| $L_{a1592}$ | P11 | CN | H | H | P125 | H | H | H | H |
| $L_{a1593}$ | P11 | CN | H | H | P126 | H | H | H | H |
| $L_{a1594}$ | P11 | CN | H | H | P127 | H | H | H | H |
| $L_{a1595}$ | P11 | CN | H | H | P128 | H | H | H | H |
| $L_{a1596}$ | P11 | CN | H | H | P129 | H | H | H | H |
| $L_{a1597}$ | P11 | CN | H | H | P130 | H | H | H | H |
| $L_{a1598}$ | P11 | CN | H | H | P131 | H | H | H | H |
| $L_{a1599}$ | P11 | CN | H | H | P132 | H | H | H | H |
| $L_{a1600}$ | P11 | CN | H | H | P133 | H | H | H | H |
| $L_{a1601}$ | P11 | CN | H | H | P134 | H | H | H | H |
| $L_{a1602}$ | P11 | CN | H | H | P135 | H | H | H | H |
| $L_{a1603}$ | P11 | CN | H | H | P136 | H | H | H | H |
| $L_{a1604}$ | P11 | CN | H | H | P137 | H | H | H | H |
| $L_{a1605}$ | P11 | CN | H | H | P138 | H | H | H | H |
| $L_{a1606}$ | P11 | CN | H | H | P139 | H | H | H | H |
| $L_{a1607}$ | P11 | CN | H | H | P140 | H | H | H | H |
| $L_{a1608}$ | P11 | CN | H | H | P141 | H | H | H | H |
| $L_{a1609}$ | P11 | CN | H | H | P142 | H | H | H | H |
| $L_{a1610}$ | P11 | CN | H | H | P143 | H | H | H | H |
| $L_{a1611}$ | P11 | CN | H | H | P144 | H | H | H | H |
| $L_{a1612}$ | P11 | CN | H | H | P145 | H | H | H | H |
| $L_{a1613}$ | P11 | CN | H | H | P146 | H | H | H | H |
| $L_{a1614}$ | P11 | CN | H | H | P147 | H | H | H | H |
| $L_{a1615}$ | P11 | CN | H | H | P148 | H | H | H | H |
| $L_{a1616}$ | P11 | CN | H | H | P149 | H | H | H | H |
| $L_{a1617}$ | P11 | CN | H | H | P150 | H | H | H | H |
| $L_{a1618}$ | P11 | CN | H | H | P151 | H | H | H | H |
| $L_{a1619}$ | P11 | CN | H | P18 | H | H | H | H | H |
| $L_{a1620}$ | P11 | CN | H | P18 | D | H | H | H | H |
| $L_{a1621}$ | P11 | CN | H | P18 | P20 | H | H | H | H |
| $L_{a1622}$ | P11 | CN | H | P19 | H | H | H | H | H |
| $L_{a1623}$ | P11 | CN | H | P19 | D | H | H | H | H |
| $L_{a1624}$ | P11 | CN | H | P19 | P20 | H | H | H | H |
| $L_{a1625}$ | P11 | CN | H | P20 | H | H | H | H | H |
| $L_{a1626}$ | P11 | CN | H | P20 | D | H | H | H | H |
| $L_{a1627}$ | P11 | CN | H | P20 | H | H | P1 | H | H |
| $L_{a1628}$ | P11 | CN | H | P20 | D | H | P2 | H | H |
| $L_{a1629}$ | P11 | CN | H | P20 | H | H | H | P1 | H |
| $L_{a1630}$ | P11 | CN | H | P20 | D | H | H | P2 | H |
| $L_{a1631}$ | P11 | CN | H | P20 | H | H | P1 | P1 | H |
| $L_{a1632}$ | P11 | CN | H | P20 | D | H | P2 | P2 | H |
| $L_{a1633}$ | P11 | CN | H | P20 | H | H | P3 | H | H |
| $L_{a1634}$ | P11 | CN | H | P20 | D | H | P4 | H | H |
| $L_{a1635}$ | P11 | CN | H | P20 | H | H | P5 | H | H |
| $L_{a1636}$ | P11 | CN | H | P21 | H | H | H | H | H |
| $L_{a1637}$ | P11 | CN | H | P21 | D | H | H | H | H |
| $L_{a1638}$ | P11 | CN | H | P21 | H | H | P1 | H | H |
| $L_{a1639}$ | P11 | CN | H | P21 | D | H | P2 | H | H |
| $L_{a1640}$ | P11 | CN | H | P21 | H | H | H | P1 | H |
| $L_{a1641}$ | P11 | CN | H | P21 | D | H | H | P2 | H |
| $L_{a1642}$ | P11 | CN | H | P21 | H | H | P1 | P1 | H |
| $L_{a1643}$ | P11 | CN | H | P21 | D | H | P2 | P2 | H |
| $L_{a1644}$ | P11 | CN | H | P21 | H | H | P3 | H | H |
| $L_{a1645}$ | P11 | CN | H | P21 | D | H | P4 | H | H |
| $L_{a1646}$ | P11 | CN | H | P21 | H | H | P5 | H | H |
| $L_{a1647}$ | P10 | CN | H | H | H | H | H | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a1648}$ | P10 | CN | H | H | D | H | H | H | H |
| $L_{a1649}$ | P10 | CN | H | H | P20 | H | H | H | H |
| $L_{a1650}$ | P10 | CN | H | H | P21 | H | H | H | H |
| $L_{a1651}$ | P10 | CN | H | H | P54 | H | H | H | H |
| $L_{a1652}$ | P10 | CN | H | H | P55 | H | H | H | H |
| $L_{a1653}$ | P10 | CN | H | H | P56 | H | H | H | H |
| $L_{a1654}$ | P10 | CN | H | H | P57 | H | H | H | H |
| $L_{a1655}$ | P10 | CN | H | H | P20 | H | P1 | H | H |
| $L_{a1656}$ | P10 | CN | H | H | P20 | H | P3 | H | H |
| $L_{a1657}$ | P10 | CN | H | H | P20 | H | P4 | H | H |
| $L_{a1658}$ | P10 | CN | H | H | P20 | H | P6 | H | H |
| $L_{a1659}$ | P10 | CN | H | H | P20 | H | P8 | H | H |
| $L_{a1660}$ | P10 | CN | H | H | P20 | H | P10 | H | H |
| $L_{a1661}$ | P10 | CN | H | H | P20 | H | P1 | F | H |
| $L_{a1662}$ | P10 | CN | H | H | P20 | H | P2 | F | H |
| $L_{a1663}$ | P10 | CN | H | H | P20 | H | P10 | F | H |
| $L_{a1664}$ | P10 | CN | H | H | P20 | H | F | P1 | H |
| $L_{a1665}$ | P10 | CN | H | H | P20 | H | F | P2 | H |
| $L_{a1666}$ | P10 | CN | H | H | P20 | H | F | P10 | H |
| $L_{a1667}$ | P10 | CN | H | H | P21 | H | P2 | P2 | H |
| $L_{a1668}$ | P10 | CN | H | H | P21 | H | P5 | H | H |
| $L_{a1669}$ | P10 | CN | H | H | P21 | H | P9 | H | H |
| $L_{a1670}$ | P10 | CN | H | H | P21 | H | P11 | H | H |
| $L_{a1671}$ | P10 | CN | H | H | P21 | H | P1 | F | H |
| $L_{a1672}$ | P10 | CN | H | H | P21 | H | P2 | F | H |
| $L_{a1673}$ | P10 | CN | H | H | P21 | H | P11 | F | H |
| $L_{a1674}$ | P10 | CN | H | H | P21 | H | F | P1 | H |
| $L_{a1675}$ | P10 | CN | H | H | P21 | H | F | P2 | H |
| $L_{a1676}$ | P10 | CN | H | H | P21 | H | F | P11 | H |
| $L_{a1677}$ | P10 | CN | H | H | P96 | H | H | H | H |
| $L_{a1678}$ | P10 | CN | H | H | P97 | H | H | H | H |
| $L_{a1679}$ | P10 | CN | H | H | P102 | H | H | H | H |
| $L_{a1680}$ | P10 | CN | H | H | P103 | H | H | H | H |
| $L_{a1681}$ | P7 | CN | H | H | P20 | H | H | H | H |
| $L_{a1682}$ | P7 | CN | H | H | P21 | H | H | H | H |
| $L_{a1683}$ | P7 | CN | H | H | P54 | H | H | H | H |
| $L_{a1684}$ | P7 | CN | H | H | P96 | H | H | H | H |
| $L_{a1685}$ | P7 | CN | H | H | P97 | H | H | H | H |
| $L_{a1686}$ | P14 | CN | H | H | P20 | H | H | H | H |
| $L_{a1687}$ | P14 | CN | H | H | P21 | H | H | H | H |
| $L_{a1688}$ | P14 | CN | H | H | P54 | H | H | H | H |
| $L_{a1689}$ | P14 | CN | H | H | P96 | H | H | H | H |
| $L_{a1690}$ | P14 | CN | H | H | P97 | H | H | H | H |
| $L_{a1691}$ | P6 | F | H | H | H | H | H | H | H |
| $L_{a1692}$ | P6 | F | H | H | H | H | P1 | H | H |
| $L_{a1693}$ | P6 | F | H | H | H | H | P2 | H | H |
| $L_{a1694}$ | P6 | F | H | H | H | H | P3 | H | H |
| $L_{a1695}$ | P6 | F | H | H | H | H | P4 | H | H |
| $L_{a1696}$ | P6 | F | H | H | H | H | P5 | H | H |
| $L_{a1697}$ | P6 | F | H | H | H | H | P6 | H | H |
| $L_{a1698}$ | P6 | F | H | H | H | H | P7 | H | H |
| $L_{a1699}$ | P6 | F | H | H | H | H | P8 | H | H |
| $L_{a1700}$ | P6 | F | H | H | H | H | P9 | H | H |
| $L_{a1701}$ | P6 | F | H | H | H | H | P10 | H | H |
| $L_{a1702}$ | P6 | F | H | H | H | H | P11 | H | H |
| $L_{a1703}$ | P6 | F | H | H | H | H | P12 | H | H |
| $L_{a1704}$ | P6 | F | H | H | H | H | P13 | H | H |
| $L_{a1705}$ | P6 | F | H | H | H | H | P14 | H | H |
| $L_{a1706}$ | P6 | F | H | H | H | H | P15 | H | H |
| $L_{a1707}$ | P6 | F | H | H | H | H | P16 | H | H |
| $L_{a1708}$ | P6 | F | H | H | H | H | P17 | H | H |
| $L_{a1709}$ | P6 | F | H | H | H | H | P18 | H | H |
| $L_{a1710}$ | P6 | F | H | H | H | H | P19 | H | H |
| $L_{a1711}$ | P6 | F | H | H | H | H | P20 | H | H |
| $L_{a1712}$ | P6 | F | H | H | H | H | P21 | H | H |
| $L_{a1713}$ | P6 | F | H | H | H | H | P1 | F | H |
| $L_{a1714}$ | P6 | F | H | H | H | H | P2 | F | H |
| $L_{a1715}$ | P6 | F | H | H | H | H | P3 | F | H |
| $L_{a1716}$ | P6 | F | H | H | H | H | P4 | F | H |
| $L_{a1717}$ | P6 | F | H | H | H | H | P5 | F | H |
| $L_{a1718}$ | P6 | F | H | H | H | H | P6 | F | H |
| $L_{a1719}$ | P6 | F | H | H | H | H | P7 | F | H |
| $L_{a1720}$ | P6 | F | H | H | H | H | P8 | F | H |
| $L_{a1721}$ | P6 | F | H | H | H | H | P9 | F | H |
| $L_{a1722}$ | P6 | F | H | H | H | H | P10 | F | H |
| $L_{a1723}$ | P6 | F | H | H | H | H | P11 | F | H |
| $L_{a1724}$ | P6 | F | H | H | H | H | P12 | F | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a1725}$ | P6 | F | H | H | H | H | P13 | F | H |
| $L_{a1726}$ | P6 | F | H | H | H | H | P14 | F | H |
| $L_{a1727}$ | P6 | F | H | H | H | H | P15 | F | H |
| $L_{a1728}$ | P6 | F | H | H | H | H | P16 | F | H |
| $L_{a1729}$ | P6 | F | H | H | H | H | P17 | F | H |
| $L_{a1730}$ | P6 | F | H | H | H | H | P18 | F | H |
| $L_{a1731}$ | P6 | F | H | H | H | H | P19 | F | H |
| $L_{a1732}$ | P6 | F | H | H | H | H | P20 | F | H |
| $L_{a1733}$ | P6 | F | H | H | H | H | P21 | F | H |
| $L_{a1734}$ | P6 | F | H | H | H | H | H | P1 | H |
| $L_{a1735}$ | P6 | F | H | H | H | H | H | P2 | H |
| $L_{a1736}$ | P6 | F | H | H | H | H | H | P3 | H |
| $L_{a1737}$ | P6 | F | H | H | H | H | H | P4 | H |
| $L_{a1738}$ | P6 | F | H | H | H | H | H | P5 | H |
| $L_{a1739}$ | P6 | F | H | H | H | H | H | P6 | H |
| $L_{a1740}$ | P6 | F | H | H | H | H | H | P7 | H |
| $L_{a1741}$ | P6 | F | H | H | H | H | H | P8 | H |
| $L_{a1742}$ | P6 | F | H | H | H | H | H | P9 | H |
| $L_{a1743}$ | P6 | F | H | H | H | H | H | P10 | H |
| $L_{a1744}$ | P6 | F | H | H | H | H | H | P11 | H |
| $L_{a1745}$ | P6 | F | H | H | H | H | H | P12 | H |
| $L_{a1746}$ | P6 | F | H | H | H | H | H | P13 | H |
| $L_{a1747}$ | P6 | F | H | H | H | H | H | P14 | H |
| $L_{a1748}$ | P6 | F | H | H | H | H | H | P15 | H |
| $L_{a1749}$ | P6 | F | H | H | H | H | H | P16 | H |
| $L_{a1750}$ | P6 | F | H | H | H | H | H | P17 | H |
| $L_{a1751}$ | P6 | F | H | H | H | H | H | P18 | H |
| $L_{a1752}$ | P6 | F | H | H | H | H | H | P19 | H |
| $L_{a1753}$ | P6 | F | H | H | H | H | H | P20 | H |
| $L_{a1754}$ | P6 | F | H | H | H | H | H | P21 | H |
| $L_{a1755}$ | P6 | F | H | H | H | H | F | P1 | H |
| $L_{a1756}$ | P6 | F | H | H | H | H | F | P2 | H |
| $L_{a1757}$ | P6 | F | H | H | H | H | F | P3 | H |
| $L_{a1758}$ | P6 | F | H | H | H | H | F | P4 | H |
| $L_{a1759}$ | P6 | F | H | H | H | H | F | P5 | H |
| $L_{a1760}$ | P6 | F | H | H | H | H | F | P6 | H |
| $L_{a1761}$ | P6 | F | H | H | H | H | F | P7 | H |
| $L_{a1762}$ | P6 | F | H | H | H | H | F | P8 | H |
| $L_{a1763}$ | P6 | F | H | H | H | H | F | P9 | H |
| $L_{a1764}$ | P6 | F | H | H | H | H | F | P10 | H |
| $L_{a1765}$ | P6 | F | H | H | H | H | F | P11 | H |
| $L_{a1766}$ | P6 | F | H | H | H | H | F | P12 | H |
| $L_{a1767}$ | P6 | F | H | H | H | H | F | P13 | H |
| $L_{a1768}$ | P6 | F | H | H | H | H | F | P14 | H |
| $L_{a1769}$ | P6 | F | H | H | H | H | F | P15 | H |
| $L_{a1770}$ | P6 | F | H | H | H | H | F | P16 | H |
| $L_{a1771}$ | P6 | F | H | H | H | H | F | P17 | H |
| $L_{a1772}$ | P6 | F | H | H | H | H | F | P18 | H |
| $L_{a1773}$ | P6 | F | H | H | H | H | F | P19 | H |
| $L_{a1774}$ | P6 | F | H | H | H | H | F | P20 | H |
| $L_{a1775}$ | P6 | F | H | H | H | H | F | P21 | H |
| $L_{a1776}$ | P6 | F | H | H | H | H | P1 | P1 | H |
| $L_{a1777}$ | P6 | F | H | H | H | H | P1 | P3 | H |
| $L_{a1778}$ | P6 | F | H | H | H | H | P1 | P8 | H |
| $L_{a1779}$ | P6 | F | H | H | H | H | P1 | P10 | H |
| $L_{a1780}$ | P6 | F | H | H | H | H | P1 | P20 | H |
| $L_{a1781}$ | P6 | F | H | H | H | H | P1 | P21 | H |
| $L_{a1782}$ | P6 | F | H | H | H | H | P2 | P2 | H |
| $L_{a1783}$ | P6 | F | H | H | H | H | P2 | P4 | H |
| $L_{a1784}$ | P6 | F | H | H | H | H | P2 | P5 | H |
| $L_{a1785}$ | P6 | F | H | H | H | H | P2 | P9 | H |
| $L_{a1786}$ | P6 | F | H | H | H | H | P2 | P11 | H |
| $L_{a1787}$ | P6 | F | H | H | H | H | P2 | P20 | H |
| $L_{a1788}$ | P6 | F | H | H | H | H | P2 | P21 | H |
| $L_{a1789}$ | P6 | F | H | H | H | D | D | D | D |
| $L_{a1790}$ | P6 | F | H | H | H | D | F | D | D |
| $L_{a1791}$ | P6 | F | H | H | H | D | D | F | D |
| $L_{a1792}$ | P6 | F | H | H | H | D | P2 | D | D |
| $L_{a1793}$ | P6 | F | H | H | H | D | D | P2 | D |
| $L_{a1794}$ | P6 | F | H | H | H | D | P2 | P2 | D |
| $L_{a1795}$ | P6 | F | H | H | D | H | H | H | H |
| $L_{a1796}$ | P6 | F | H | H | D | H | P1 | H | H |
| $L_{a1797}$ | P6 | F | H | H | D | H | P2 | H | H |
| $L_{a1798}$ | P6 | F | H | H | D | H | P5 | H | H |
| $L_{a1799}$ | P6 | F | H | H | D | H | P10 | H | H |
| $L_{a1800}$ | P6 | F | H | H | D | H | P11 | H | H |
| $L_{a1801}$ | P6 | F | H | H | D | H | H | P1 | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a1802}$ | P6 | F | H | H | D | H | H | P2 | H |
| $L_{a1803}$ | P6 | F | H | H | D | H | H | P4 | H |
| $L_{a1804}$ | P6 | F | H | H | D | H | H | P5 | H |
| $L_{a1805}$ | P6 | F | H | H | D | H | H | P10 | H |
| $L_{a1806}$ | P6 | F | H | H | D | H | H | P11 | H |
| $L_{a1807}$ | P6 | F | H | H | D | H | P1 | F | H |
| $L_{a1808}$ | P6 | F | H | H | D | H | P2 | F | H |
| $L_{a1809}$ | P6 | F | H | H | D | H | P11 | F | H |
| $L_{a1810}$ | P6 | F | H | H | D | H | F | P1 | H |
| $L_{a1811}$ | P6 | F | H | H | D | H | F | P2 | H |
| $L_{a1812}$ | P6 | F | H | H | D | H | F | P3 | H |
| $L_{a1813}$ | P6 | F | H | H | D | H | F | P4 | H |
| $L_{a1814}$ | P6 | F | H | H | D | H | F | P5 | H |
| $L_{a1815}$ | P6 | F | H | H | D | H | F | P8 | H |
| $L_{a1816}$ | P6 | F | H | H | D | H | F | P11 | H |
| $L_{a1817}$ | P6 | F | H | H | D | H | P1 | P1 | H |
| $L_{a1818}$ | P6 | F | H | H | D | H | P2 | P2 | H |
| $L_{a1819}$ | P6 | F | H | H | D | H | P2 | P2 | D |
| $L_{a1820}$ | P6 | F | H | H | P20 | H | H | H | H |
| $L_{a1821}$ | P6 | F | H | H | P20 | H | P1 | H | H |
| $L_{a1822}$ | P6 | F | H | H | P20 | H | P2 | H | H |
| $L_{a1823}$ | P6 | F | H | H | P20 | H | P3 | H | H |
| $L_{a1824}$ | P6 | F | H | H | P20 | H | P4 | H | H |
| $L_{a1825}$ | P6 | F | H | H | P20 | H | P5 | H | H |
| $L_{a1826}$ | P6 | F | H | H | P20 | H | P6 | H | H |
| $L_{a1827}$ | P6 | F | H | H | P20 | H | P7 | H | H |
| $L_{a1828}$ | P6 | F | H | H | P20 | H | P8 | H | H |
| $L_{a1829}$ | P6 | F | H | H | P20 | H | P9 | H | H |
| $L_{a1830}$ | P6 | F | H | H | P20 | H | P10 | H | H |
| $L_{a1831}$ | P6 | F | H | H | P20 | H | P11 | H | H |
| $L_{a1832}$ | P6 | F | H | H | P20 | H | P12 | H | H |
| $L_{a1833}$ | P6 | F | H | H | P20 | H | P13 | H | H |
| $L_{a1834}$ | P6 | F | H | H | P20 | H | P14 | H | H |
| $L_{a1835}$ | P6 | F | H | H | P20 | H | P15 | H | H |
| $L_{a1836}$ | P6 | F | H | H | P20 | H | P16 | H | H |
| $L_{a1837}$ | P6 | F | H | H | P20 | H | P17 | H | H |
| $L_{a1838}$ | P6 | F | H | H | P20 | H | P18 | H | H |
| $L_{a1839}$ | P6 | F | H | H | P20 | H | P19 | H | H |
| $L_{a1840}$ | P6 | F | H | H | P20 | H | P20 | H | H |
| $L_{a1841}$ | P6 | F | H | H | P20 | H | P21 | H | H |
| $L_{a1842}$ | P6 | F | H | H | P20 | H | H | P1 | H |
| $L_{a1843}$ | P6 | F | H | H | P20 | H | H | P2 | H |
| $L_{a1844}$ | P6 | F | H | H | P20 | H | H | P3 | H |
| $L_{a1845}$ | P6 | F | H | H | P20 | H | H | P4 | H |
| $L_{a1846}$ | P6 | F | H | H | P20 | H | H | P5 | H |
| $L_{a1847}$ | P6 | F | H | H | P20 | H | H | P6 | H |
| $L_{a1848}$ | P6 | F | H | H | P20 | H | H | P7 | H |
| $L_{a1849}$ | P6 | F | H | H | P20 | H | H | P8 | H |
| $L_{a1850}$ | P6 | F | H | H | P20 | H | H | P9 | H |
| $L_{a1851}$ | P6 | F | H | H | P20 | H | H | P10 | H |
| $L_{a1852}$ | P6 | F | H | H | P20 | H | H | P11 | H |
| $L_{a1853}$ | P6 | F | H | H | P20 | H | H | P12 | H |
| $L_{a1854}$ | P6 | F | H | H | P20 | H | H | P15 | H |
| $L_{a1855}$ | P6 | F | H | H | P20 | H | H | P17 | H |
| $L_{a1856}$ | P6 | F | H | H | P20 | H | H | P18 | H |
| $L_{a1857}$ | P6 | F | H | H | P20 | H | H | P19 | H |
| $L_{a1858}$ | P6 | F | H | H | P20 | H | H | P20 | H |
| $L_{a1859}$ | P6 | F | H | H | P20 | H | H | P21 | H |
| $L_{a1860}$ | P6 | F | H | H | P20 | H | F | H | H |
| $L_{a1861}$ | P6 | F | H | H | P20 | H | F | P1 | H |
| $L_{a1862}$ | P6 | F | H | H | P20 | H | F | P2 | H |
| $L_{a1863}$ | P6 | F | H | H | P20 | H | F | P3 | H |
| $L_{a1864}$ | P6 | F | H | H | P20 | H | F | P4 | H |
| $L_{a1865}$ | P6 | F | H | H | P20 | H | F | P5 | H |
| $L_{a1866}$ | P6 | F | H | H | P20 | H | F | P6 | H |
| $L_{a1867}$ | P6 | F | H | H | P20 | H | F | P7 | H |
| $L_{a1868}$ | P6 | F | H | H | P20 | H | F | P8 | H |
| $L_{a1869}$ | P6 | F | H | H | P20 | H | F | P9 | H |
| $L_{a1870}$ | P6 | F | H | H | P20 | H | F | P10 | H |
| $L_{a1871}$ | P6 | F | H | H | P20 | H | F | P11 | H |
| $L_{a1872}$ | P6 | F | H | H | P20 | H | P1 | F | H |
| $L_{a1873}$ | P6 | F | H | H | P20 | H | P2 | F | H |
| $L_{a1874}$ | P6 | F | H | H | P20 | H | P3 | F | H |
| $L_{a1875}$ | P6 | F | H | H | P20 | H | P4 | F | H |
| $L_{a1876}$ | P6 | F | H | H | P20 | H | P5 | F | H |
| $L_{a1877}$ | P6 | F | H | H | P20 | H | P6 | F | H |
| $L_{a1878}$ | P6 | F | H | H | P20 | H | P7 | F | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a1879}$ | P6 | F | H | H | P20 | H | P8 | F | H |
| $L_{a1880}$ | P6 | F | H | H | P20 | H | P9 | F | H |
| $L_{a1881}$ | P6 | F | H | H | P20 | H | P10 | F | H |
| $L_{a1882}$ | P6 | F | H | H | P20 | H | P11 | F | H |
| $L_{a1883}$ | P6 | F | H | H | P20 | H | P1 | P1 | H |
| $L_{a1884}$ | P6 | F | H | H | P20 | H | P2 | P2 | H |
| $L_{a1885}$ | P6 | F | H | H | P20 | D | D | D | D |
| $L_{a1886}$ | P6 | F | H | H | P20 | D | P2 | P2 | D |
| $L_{a1887}$ | P6 | F | H | H | P20 | D | F | P4 | D |
| $L_{a1888}$ | P6 | F | H | H | P20 | D | F | P5 | D |
| $L_{a1889}$ | P6 | F | H | H | P20 | D | F | P9 | D |
| $L_{a1890}$ | P6 | F | H | H | P20 | D | F | P11 | D |
| $L_{a1891}$ | P6 | F | H | H | P21 | H | H | H | H |
| $L_{a1892}$ | P6 | F | H | H | P21 | H | P1 | H | H |
| $L_{a1893}$ | P6 | F | H | H | P21 | H | P2 | H | H |
| $L_{a1894}$ | P6 | F | H | H | P21 | H | P3 | H | H |
| $L_{a1895}$ | P6 | F | H | H | P21 | H | P4 | H | H |
| $L_{a1896}$ | P6 | F | H | H | P21 | H | P5 | H | H |
| $L_{a1897}$ | P6 | F | H | H | P21 | H | P6 | H | H |
| $L_{a1898}$ | P6 | F | H | H | P21 | H | P7 | H | H |
| $L_{a1899}$ | P6 | F | H | H | P21 | H | P8 | H | H |
| $L_{a1900}$ | P6 | F | H | H | P21 | H | P9 | H | H |
| $L_{a1901}$ | P6 | F | H | H | P21 | H | P10 | H | H |
| $L_{a1902}$ | P6 | F | H | H | P21 | H | P11 | H | H |
| $L_{a1903}$ | P6 | F | H | H | P21 | H | P12 | H | H |
| $L_{a1904}$ | P6 | F | H | H | P21 | H | P13 | H | H |
| $L_{a1905}$ | P6 | F | H | H | P21 | H | P14 | H | H |
| $L_{a1906}$ | P6 | F | H | H | P21 | H | P15 | H | H |
| $L_{a1907}$ | P6 | F | H | H | P21 | H | P16 | H | H |
| $L_{a1908}$ | P6 | F | H | H | P21 | H | P17 | H | H |
| $L_{a1909}$ | P6 | F | H | H | P21 | H | P18 | H | H |
| $L_{a1910}$ | P6 | F | H | H | P21 | H | P19 | H | H |
| $L_{a1911}$ | P6 | F | H | H | P21 | H | P20 | H | H |
| $L_{a1912}$ | P6 | F | H | H | P21 | H | P21 | H | H |
| $L_{a1913}$ | P6 | F | H | H | P21 | H | H | P1 | H |
| $L_{a1914}$ | P6 | F | H | H | P21 | H | H | P2 | H |
| $L_{a1915}$ | P6 | F | H | H | P21 | H | H | P3 | H |
| $L_{a1916}$ | P6 | F | H | H | P21 | H | H | P4 | H |
| $L_{a1917}$ | P6 | F | H | H | P21 | H | H | P5 | H |
| $L_{a1918}$ | P6 | F | H | H | P21 | H | H | P6 | H |
| $L_{a1919}$ | P6 | F | H | H | P21 | H | H | P7 | H |
| $L_{a1920}$ | P6 | F | H | H | P21 | H | H | P8 | H |
| $L_{a1921}$ | P6 | F | H | H | P21 | H | H | P9 | H |
| $L_{a1922}$ | P6 | F | H | H | P21 | H | H | P10 | H |
| $L_{a1923}$ | P6 | F | H | H | P21 | H | H | P11 | H |
| $L_{a1924}$ | P6 | F | H | H | P21 | H | H | P12 | H |
| $L_{a1925}$ | P6 | F | H | H | P21 | H | H | P15 | H |
| $L_{a1926}$ | P6 | F | H | H | P21 | H | H | P17 | H |
| $L_{a1927}$ | P6 | F | H | H | P21 | H | H | P18 | H |
| $L_{a1928}$ | P6 | F | H | H | P21 | H | H | P19 | H |
| $L_{a1929}$ | P6 | F | H | H | P21 | H | H | P20 | H |
| $L_{a1930}$ | P6 | F | H | H | P21 | H | H | P21 | H |
| $L_{a1931}$ | P6 | F | H | H | P21 | H | F | H | H |
| $L_{a1932}$ | P6 | F | H | H | P21 | H | F | P1 | H |
| $L_{a1933}$ | P6 | F | H | H | P21 | H | F | P2 | H |
| $L_{a1934}$ | P6 | F | H | H | P21 | H | F | P3 | H |
| $L_{a1935}$ | P6 | F | H | H | P21 | H | F | P4 | H |
| $L_{a1936}$ | P6 | F | H | H | P21 | H | F | P5 | H |
| $L_{a1937}$ | P6 | F | H | H | P21 | H | F | P6 | H |
| $L_{a1938}$ | P6 | F | H | H | P21 | H | F | P7 | H |
| $L_{a1939}$ | P6 | F | H | H | P21 | H | F | P8 | H |
| $L_{a1940}$ | P6 | F | H | H | P21 | H | F | P9 | H |
| $L_{a1941}$ | P6 | F | H | H | P21 | H | F | P10 | H |
| $L_{a1942}$ | P6 | F | H | H | P21 | H | F | P11 | H |
| $L_{a1943}$ | P6 | F | H | H | P21 | H | P1 | F | H |
| $L_{a1944}$ | P6 | F | H | H | P21 | H | P2 | F | H |
| $L_{a1945}$ | P6 | F | H | H | P21 | H | P3 | F | H |
| $L_{a1946}$ | P6 | F | H | H | P21 | H | P4 | F | H |
| $L_{a1947}$ | P6 | F | H | H | P21 | H | P5 | F | H |
| $L_{a1948}$ | P6 | F | H | H | P21 | H | P6 | F | H |
| $L_{a1949}$ | P6 | F | H | H | P21 | H | P7 | F | H |
| $L_{a1950}$ | P6 | F | H | H | P21 | H | P8 | F | H |
| $L_{a1951}$ | P6 | F | H | H | P21 | H | P9 | F | H |
| $L_{a1952}$ | P6 | F | H | H | P21 | H | P10 | F | H |
| $L_{a1953}$ | P6 | F | H | H | P21 | H | P11 | F | H |
| $L_{a1954}$ | P6 | F | H | H | P21 | H | P1 | P1 | H |
| $L_{a1955}$ | P6 | F | H | H | P21 | H | P2 | P2 | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a1956}$ | P6 | F | H | H | P21 | D | D | D | D |
| $L_{a1957}$ | P6 | F | H | H | P21 | D | P2 | P2 | D |
| $L_{a1958}$ | P6 | F | H | H | P21 | D | F | P4 | D |
| $L_{a1959}$ | P6 | F | H | H | P21 | D | F | P5 | D |
| $L_{a1960}$ | P6 | F | H | H | P21 | D | F | P9 | D |
| $L_{a1961}$ | P6 | F | H | H | P21 | D | F | P11 | D |
| $L_{a1962}$ | P6 | F | H | H | P54 | H | H | H | H |
| $L_{a1963}$ | P6 | F | H | H | P54 | H | P1 | H | H |
| $L_{a1964}$ | P6 | F | H | H | P54 | H | P2 | H | H |
| $L_{a1965}$ | P6 | F | H | H | P54 | H | P3 | H | H |
| $L_{a1966}$ | P6 | F | H | H | P54 | H | P4 | H | H |
| $L_{a1967}$ | P6 | F | H | H | P54 | H | P5 | H | H |
| $L_{a1968}$ | P6 | F | H | H | P54 | H | P6 | H | H |
| $L_{a1969}$ | P6 | F | H | H | P54 | H | P7 | H | H |
| $L_{a1970}$ | P6 | F | H | H | P54 | H | P8 | H | H |
| $L_{a1971}$ | P6 | F | H | H | P54 | H | P9 | H | H |
| $L_{a1972}$ | P6 | F | H | H | P54 | H | P10 | H | H |
| $L_{a1973}$ | P6 | F | H | H | P54 | H | P11 | H | H |
| $L_{a1974}$ | P6 | F | H | H | P54 | H | P12 | H | H |
| $L_{a1975}$ | P6 | F | H | H | P54 | H | P13 | H | H |
| $L_{a1976}$ | P6 | F | H | H | P54 | H | P14 | H | H |
| $L_{a1977}$ | P6 | F | H | H | P54 | H | P15 | H | H |
| $L_{a1978}$ | P6 | F | H | H | P54 | H | P16 | H | H |
| $L_{a1979}$ | P6 | F | H | H | P54 | H | P17 | H | H |
| $L_{a1980}$ | P6 | F | H | H | P54 | H | P18 | H | H |
| $L_{a1981}$ | P6 | F | H | H | P54 | H | P19 | H | H |
| $L_{a1982}$ | P6 | F | H | H | P54 | H | P20 | H | H |
| $L_{a1983}$ | P6 | F | H | H | P54 | H | P21 | H | H |
| $L_{a1984}$ | P6 | F | H | H | P54 | H | H | P1 | H |
| $L_{a1985}$ | P6 | F | H | H | P54 | H | H | P2 | H |
| $L_{a1986}$ | P6 | F | H | H | P54 | H | H | P3 | H |
| $L_{a1987}$ | P6 | F | H | H | P54 | H | H | P4 | H |
| $L_{a1988}$ | P6 | F | H | H | P54 | H | H | P5 | H |
| $L_{a1989}$ | P6 | F | H | H | P54 | H | H | P6 | H |
| $L_{a1990}$ | P6 | F | H | H | P54 | H | H | P7 | H |
| $L_{a1991}$ | P6 | F | H | H | P54 | H | H | P8 | H |
| $L_{a1992}$ | P6 | F | H | H | P54 | H | H | P9 | H |
| $L_{a1993}$ | P6 | F | H | H | P54 | H | H | P10 | H |
| $L_{a1994}$ | P6 | F | H | H | P54 | H | H | P11 | H |
| $L_{a1995}$ | P6 | F | H | H | P54 | H | H | P12 | H |
| $L_{a1996}$ | P6 | F | H | H | P54 | H | H | P15 | H |
| $L_{a1997}$ | P6 | F | H | H | P54 | H | H | P17 | H |
| $L_{a1998}$ | P6 | F | H | H | P54 | H | H | P18 | H |
| $L_{a1999}$ | P6 | F | H | H | P54 | H | H | P19 | H |
| $L_{a2000}$ | P6 | F | H | H | P54 | H | H | P20 | H |
| $L_{a2001}$ | P6 | F | H | H | P54 | H | H | P21 | H |
| $L_{a2002}$ | P6 | F | H | H | P54 | H | F | H | H |
| $L_{a2003}$ | P6 | F | H | H | P54 | H | F | P1 | H |
| $L_{a2004}$ | P6 | F | H | H | P54 | H | F | P2 | H |
| $L_{a2005}$ | P6 | F | H | H | P54 | H | F | P3 | H |
| $L_{a2006}$ | P6 | F | H | H | P54 | H | F | P4 | H |
| $L_{a2007}$ | P6 | F | H | H | P54 | H | F | P5 | H |
| $L_{a2008}$ | P6 | F | H | H | P54 | H | F | P6 | H |
| $L_{a2009}$ | P6 | F | H | H | P54 | H | F | P7 | H |
| $L_{a2010}$ | P6 | F | H | H | P54 | H | F | P8 | H |
| $L_{a2011}$ | P6 | F | H | H | P54 | H | F | P9 | H |
| $L_{a2012}$ | P6 | F | H | H | P54 | H | F | P10 | H |
| $L_{a2013}$ | P6 | F | H | H | P54 | H | F | P11 | H |
| $L_{a2014}$ | P6 | F | H | H | P54 | H | P1 | F | H |
| $L_{a2015}$ | P6 | F | H | H | P54 | H | P2 | F | H |
| $L_{a2016}$ | P6 | F | H | H | P54 | H | P3 | F | H |
| $L_{a2017}$ | P6 | F | H | H | P54 | H | P4 | F | H |
| $L_{a2018}$ | P6 | F | H | H | P54 | H | P5 | F | H |
| $L_{a2019}$ | P6 | F | H | H | P54 | H | P6 | F | H |
| $L_{a2020}$ | P6 | F | H | H | P54 | H | P7 | F | H |
| $L_{a2021}$ | P6 | F | H | H | P54 | H | P8 | F | H |
| $L_{a2022}$ | P6 | F | H | H | P54 | H | P9 | F | H |
| $L_{a2023}$ | P6 | F | H | H | P54 | H | P10 | F | H |
| $L_{a2024}$ | P6 | F | H | H | P54 | H | P11 | F | H |
| $L_{a2025}$ | P6 | F | H | H | P54 | H | P1 | P1 | H |
| $L_{a2026}$ | P6 | F | H | H | P54 | H | P2 | P2 | H |
| $L_{a2027}$ | P6 | F | H | H | P54 | D | D | D | D |
| $L_{a2028}$ | P6 | F | H | H | P54 | D | P2 | P2 | D |
| $L_{a2029}$ | P6 | F | H | H | P54 | D | F | P4 | D |
| $L_{a2030}$ | P6 | F | H | H | P54 | D | F | P5 | D |
| $L_{a2031}$ | P6 | F | H | H | P54 | D | F | P9 | D |
| $L_{a2032}$ | P6 | F | H | H | P54 | D | F | P11 | D |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a2033}$ | P6 | F | H | H | P96 | H | H | H | H |
| $L_{a2034}$ | P6 | F | H | H | P96 | H | P1 | H | H |
| $L_{a2035}$ | P6 | F | H | H | P96 | H | P2 | H | H |
| $L_{a2036}$ | P6 | F | H | H | P96 | H | P3 | H | H |
| $L_{a2037}$ | P6 | F | H | H | P96 | H | P4 | H | H |
| $L_{a2038}$ | P6 | F | H | H | P96 | H | P5 | H | H |
| $L_{a2039}$ | P6 | F | H | H | P96 | H | P6 | H | H |
| $L_{a2040}$ | P6 | F | H | H | P96 | H | P7 | H | H |
| $L_{a2041}$ | P6 | F | H | H | P96 | H | P8 | H | H |
| $L_{a2042}$ | P6 | F | H | H | P96 | H | P9 | H | H |
| $L_{a2043}$ | P6 | F | H | H | P96 | H | P10 | H | H |
| $L_{a2044}$ | P6 | F | H | H | P96 | H | P11 | H | H |
| $L_{a2045}$ | P6 | F | H | H | P96 | H | P12 | H | H |
| $L_{a2046}$ | P6 | F | H | H | P96 | H | P13 | H | H |
| $L_{a2047}$ | P6 | F | H | H | P96 | H | P14 | H | H |
| $L_{a2048}$ | P6 | F | H | H | P96 | H | P15 | H | H |
| $L_{a2049}$ | P6 | F | H | H | P96 | H | P16 | H | H |
| $L_{a2050}$ | P6 | F | H | H | P96 | H | P17 | H | H |
| $L_{a2051}$ | P6 | F | H | H | P96 | H | P18 | H | H |
| $L_{a2052}$ | P6 | F | H | H | P96 | H | P19 | H | H |
| $L_{a2053}$ | P6 | F | H | H | P96 | H | P20 | H | H |
| $L_{a2054}$ | P6 | F | H | H | P96 | H | P21 | H | H |
| $L_{a2055}$ | P6 | F | H | H | P96 | H | H | P1 | H |
| $L_{a2056}$ | P6 | F | H | H | P96 | H | H | P2 | H |
| $L_{a2057}$ | P6 | F | H | H | P96 | H | H | P3 | H |
| $L_{a2058}$ | P6 | F | H | H | P96 | H | H | P4 | H |
| $L_{a2059}$ | P6 | F | H | H | P96 | H | H | P5 | H |
| $L_{a2060}$ | P6 | F | H | H | P96 | H | H | P6 | H |
| $L_{a2061}$ | P6 | F | H | H | P96 | H | H | P7 | H |
| $L_{a2062}$ | P6 | F | H | H | P96 | H | H | P8 | H |
| $L_{a2063}$ | P6 | F | H | H | P96 | H | H | P9 | H |
| $L_{a2064}$ | P6 | F | H | H | P96 | H | H | P10 | H |
| $L_{a2065}$ | P6 | F | H | H | P96 | H | H | P11 | H |
| $L_{a2066}$ | P6 | F | H | H | P96 | H | H | P12 | H |
| $L_{a2067}$ | P6 | F | H | H | P96 | H | H | P15 | H |
| $L_{a2068}$ | P6 | F | H | H | P96 | H | H | P17 | H |
| $L_{a2069}$ | P6 | F | H | H | P96 | H | H | P18 | H |
| $L_{a2070}$ | P6 | F | H | H | P96 | H | H | P19 | H |
| $L_{a2071}$ | P6 | F | H | H | P96 | H | H | P20 | H |
| $L_{a2072}$ | P6 | F | H | H | P96 | H | H | P21 | H |
| $L_{a2073}$ | P6 | F | H | H | P96 | H | F | H | H |
| $L_{a2074}$ | P6 | F | H | H | P96 | H | F | P1 | H |
| $L_{a2075}$ | P6 | F | H | H | P96 | H | F | P2 | H |
| $L_{a2076}$ | P6 | F | H | H | P96 | H | F | P3 | H |
| $L_{a2077}$ | P6 | F | H | H | P96 | H | F | P4 | H |
| $L_{a2078}$ | P6 | F | H | H | P96 | H | F | P5 | H |
| $L_{a2079}$ | P6 | F | H | H | P96 | H | F | P6 | H |
| $L_{a2080}$ | P6 | F | H | H | P96 | H | F | P7 | H |
| $L_{a2081}$ | P6 | F | H | H | P96 | H | F | P8 | H |
| $L_{a2082}$ | P6 | F | H | H | P96 | H | F | P9 | H |
| $L_{a2083}$ | P6 | F | H | H | P96 | H | F | P10 | H |
| $L_{a2084}$ | P6 | F | H | H | P96 | H | F | P11 | H |
| $L_{a2085}$ | P6 | F | H | H | P96 | H | P1 | F | H |
| $L_{a2086}$ | P6 | F | H | H | P96 | H | P2 | F | H |
| $L_{a2087}$ | P6 | F | H | H | P96 | H | P3 | F | H |
| $L_{a2088}$ | P6 | F | H | H | P96 | H | P4 | F | H |
| $L_{a2089}$ | P6 | F | H | H | P96 | H | P5 | F | H |
| $L_{a2090}$ | P6 | F | H | H | P96 | H | P6 | F | H |
| $L_{a2091}$ | P6 | F | H | H | P96 | H | P7 | F | H |
| $L_{a2092}$ | P6 | F | H | H | P96 | H | P8 | F | H |
| $L_{a2093}$ | P6 | F | H | H | P96 | H | P9 | F | H |
| $L_{a2094}$ | P6 | F | H | H | P96 | H | P10 | F | H |
| $L_{a2095}$ | P6 | F | H | H | P96 | H | P11 | F | H |
| $L_{a2096}$ | P6 | F | H | H | P96 | H | P1 | P1 | H |
| $L_{a2097}$ | P6 | F | H | H | P96 | H | P2 | P2 | H |
| $L_{a2098}$ | P6 | F | H | H | P96 | D | D | D | D |
| $L_{a2099}$ | P6 | F | H | H | P96 | D | P2 | P2 | D |
| $L_{a2100}$ | P6 | F | H | H | P96 | D | F | P4 | D |
| $L_{a2101}$ | P6 | F | H | H | P96 | D | F | P5 | D |
| $L_{a2102}$ | P6 | F | H | H | P96 | D | F | P9 | D |
| $L_{a2103}$ | P6 | F | H | H | P96 | D | F | P11 | D |
| $L_{a2104}$ | P6 | F | H | H | P97 | H | H | H | H |
| $L_{a2105}$ | P6 | F | H | H | P97 | H | P1 | H | H |
| $L_{a2106}$ | P6 | F | H | H | P97 | H | P2 | H | H |
| $L_{a2107}$ | P6 | F | H | H | P97 | H | P3 | H | H |
| $L_{a2108}$ | P6 | F | H | H | P97 | H | P4 | H | H |
| $L_{a2109}$ | P6 | F | H | H | P97 | H | P5 | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a2110}$ | P6 | F | H | H | P97 | H | P6 | H | H |
| $L_{a2111}$ | P6 | F | H | H | P97 | H | P7 | H | H |
| $L_{a2112}$ | P6 | F | H | H | P97 | H | P8 | H | H |
| $L_{a2113}$ | P6 | F | H | H | P97 | H | P9 | H | H |
| $L_{a2114}$ | P6 | F | H | H | P97 | H | P10 | H | H |
| $L_{a2115}$ | P6 | F | H | H | P97 | H | P11 | H | H |
| $L_{a2116}$ | P6 | F | H | H | P97 | H | P12 | H | H |
| $L_{a2117}$ | P6 | F | H | H | P97 | H | P13 | H | H |
| $L_{a2118}$ | P6 | F | H | H | P97 | H | P14 | H | H |
| $L_{a2119}$ | P6 | F | H | H | P97 | H | P15 | H | H |
| $L_{a2120}$ | P6 | F | H | H | P97 | H | P16 | H | H |
| $L_{a2121}$ | P6 | F | H | H | P97 | H | P17 | H | H |
| $L_{a2122}$ | P6 | F | H | H | P97 | H | P18 | H | H |
| $L_{a2123}$ | P6 | F | H | H | P97 | H | P19 | H | H |
| $L_{a2124}$ | P6 | F | H | H | P97 | H | P20 | H | H |
| $L_{a2125}$ | P6 | F | H | H | P97 | H | P21 | H | H |
| $L_{a2126}$ | P6 | F | H | H | P97 | H | H | P1 | H |
| $L_{a2127}$ | P6 | F | H | H | P97 | H | H | P2 | H |
| $L_{a2128}$ | P6 | F | H | H | P97 | H | H | P3 | H |
| $L_{a2129}$ | P6 | F | H | H | P97 | H | H | P4 | H |
| $L_{a2130}$ | P6 | F | H | H | P97 | H | H | P5 | H |
| $L_{a2131}$ | P6 | F | H | H | P97 | H | H | P6 | H |
| $L_{a2132}$ | P6 | F | H | H | P97 | H | H | P7 | H |
| $L_{a2133}$ | P6 | F | H | H | P97 | H | H | P8 | H |
| $L_{a2134}$ | P6 | F | H | H | P97 | H | H | P9 | H |
| $L_{a2135}$ | P6 | F | H | H | P97 | H | H | P10 | H |
| $L_{a2136}$ | P6 | F | H | H | P97 | H | H | P11 | H |
| $L_{a2137}$ | P6 | F | H | H | P97 | H | H | P12 | H |
| $L_{a2138}$ | P6 | F | H | H | P97 | H | H | P15 | H |
| $L_{a2139}$ | P6 | F | H | H | P97 | H | H | P17 | H |
| $L_{a2140}$ | P6 | F | H | H | P97 | H | H | P18 | H |
| $L_{a2141}$ | P6 | F | H | H | P97 | H | H | P19 | H |
| $L_{a2142}$ | P6 | F | H | H | P97 | H | H | P20 | H |
| $L_{a2143}$ | P6 | F | H | H | P97 | H | H | P21 | H |
| $L_{a2144}$ | P6 | F | H | H | P97 | H | F | H | H |
| $L_{a2145}$ | P6 | F | H | H | P97 | H | F | P1 | H |
| $L_{a2146}$ | P6 | F | H | H | P97 | H | F | P2 | H |
| $L_{a2147}$ | P6 | F | H | H | P97 | H | F | P3 | H |
| $L_{a2148}$ | P6 | F | H | H | P97 | H | F | P4 | H |
| $L_{a2149}$ | P6 | F | H | H | P97 | H | F | P5 | H |
| $L_{a2150}$ | P6 | F | H | H | P97 | H | F | P6 | H |
| $L_{a2151}$ | P6 | F | H | H | P97 | H | F | P7 | H |
| $L_{a2152}$ | P6 | F | H | H | P97 | H | F | P8 | H |
| $L_{a2153}$ | P6 | F | H | H | P97 | H | F | P9 | H |
| $L_{a2154}$ | P6 | F | H | H | P97 | H | F | P10 | H |
| $L_{a2155}$ | P6 | F | H | H | P97 | H | F | P11 | H |
| $L_{a2156}$ | P6 | F | H | H | P97 | H | P1 | F | H |
| $L_{a2157}$ | P6 | F | H | H | P97 | H | P2 | F | H |
| $L_{a2158}$ | P6 | F | H | H | P97 | H | P3 | F | H |
| $L_{a2159}$ | P6 | F | H | H | P97 | H | P4 | F | H |
| $L_{a2160}$ | P6 | F | H | H | P97 | H | P5 | F | H |
| $L_{a2161}$ | P6 | F | H | H | P97 | H | P6 | F | H |
| $L_{a2162}$ | P6 | F | H | H | P97 | H | P7 | F | H |
| $L_{a2163}$ | P6 | F | H | H | P97 | H | P8 | F | H |
| $L_{a2164}$ | P6 | F | H | H | P97 | H | P9 | F | H |
| $L_{a2165}$ | P6 | F | H | H | P97 | H | P10 | F | H |
| $L_{a2166}$ | P6 | F | H | H | P97 | H | P11 | F | H |
| $L_{a2167}$ | P6 | F | H | H | P97 | H | P1 | P1 | H |
| $L_{a2168}$ | P6 | F | H | H | P97 | H | P2 | P2 | H |
| $L_{a2169}$ | P6 | F | H | H | P97 | D | D | D | D |
| $L_{a2170}$ | P6 | F | H | H | P97 | D | P2 | P2 | D |
| $L_{a2171}$ | P6 | F | H | H | P97 | D | F | P4 | D |
| $L_{a2172}$ | P6 | F | H | H | P97 | D | F | P5 | D |
| $L_{a2173}$ | P6 | F | H | H | P97 | D | F | P9 | D |
| $L_{a2174}$ | P6 | F | H | H | P97 | D | F | P11 | D |
| $L_{a2175}$ | P6 | F | H | H | P102 | H | P1 | H | H |
| $L_{a2176}$ | P6 | F | H | H | P102 | H | P2 | H | H |
| $L_{a2177}$ | P6 | F | H | H | P102 | H | P3 | H | H |
| $L_{a2178}$ | P6 | F | H | H | P102 | H | P4 | H | H |
| $L_{a2179}$ | P6 | F | H | H | P102 | H | P5 | H | H |
| $L_{a2180}$ | P6 | F | H | H | P102 | H | P6 | H | H |
| $L_{a2181}$ | P6 | F | H | H | P102 | H | P7 | H | H |
| $L_{a2182}$ | P6 | F | H | H | P102 | H | P8 | H | H |
| $L_{a2183}$ | P6 | F | H | H | P102 | H | P9 | H | H |
| $L_{a2184}$ | P6 | F | H | H | P102 | H | P10 | H | H |
| $L_{a2185}$ | P6 | F | H | H | P102 | H | P11 | H | H |
| $L_{a2186}$ | P6 | F | H | H | P102 | H | P12 | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a2187}$ | P6 | F | H | H | P102 | H | P13 | H | H |
| $L_{a2188}$ | P6 | F | H | H | P102 | H | P14 | H | H |
| $L_{a2189}$ | P6 | F | H | H | P102 | H | P15 | H | H |
| $L_{a2190}$ | P6 | F | H | H | P102 | H | P16 | H | H |
| $L_{a2191}$ | P6 | F | H | H | P102 | H | P17 | H | H |
| $L_{a2192}$ | P6 | F | H | H | P102 | H | P18 | H | H |
| $L_{a2193}$ | P6 | F | H | H | P102 | H | P19 | H | H |
| $L_{a2194}$ | P6 | F | H | H | P102 | H | P20 | H | H |
| $L_{a2195}$ | P6 | F | H | H | P102 | H | P21 | H | H |
| $L_{a2196}$ | P6 | F | H | H | P102 | H | H | P1 | H |
| $L_{a2197}$ | P6 | F | H | H | P102 | H | H | P2 | H |
| $L_{a2198}$ | P6 | F | H | H | P102 | H | H | P3 | H |
| $L_{a2199}$ | P6 | F | H | H | P102 | H | H | P4 | H |
| $L_{a2200}$ | P6 | F | H | H | P102 | H | H | P5 | H |
| $L_{a2201}$ | P6 | F | H | H | P102 | H | H | P6 | H |
| $L_{a2202}$ | P6 | F | H | H | P102 | H | H | P7 | H |
| $L_{a2203}$ | P6 | F | H | H | P102 | H | H | P8 | H |
| $L_{a2204}$ | P6 | F | H | H | P102 | H | H | P9 | H |
| $L_{a2205}$ | P6 | F | H | H | P102 | H | H | P10 | H |
| $L_{a2206}$ | P6 | F | H | H | P102 | H | H | P11 | H |
| $L_{a2207}$ | P6 | F | H | H | P102 | H | H | P12 | H |
| $L_{a2208}$ | P6 | F | H | H | P102 | H | H | P15 | H |
| $L_{a2209}$ | P6 | F | H | H | P102 | H | H | P17 | H |
| $L_{a2210}$ | P6 | F | H | H | P102 | H | H | P18 | H |
| $L_{a2211}$ | P6 | F | H | H | P102 | H | H | P19 | H |
| $L_{a2212}$ | P6 | F | H | H | P102 | H | H | P20 | H |
| $L_{a2213}$ | P6 | F | H | H | P102 | H | H | P21 | H |
| $L_{a2214}$ | P6 | F | H | H | P102 | H | F | H | H |
| $L_{a2215}$ | P6 | F | H | H | P102 | H | F | P1 | H |
| $L_{a2216}$ | P6 | F | H | H | P102 | H | F | P2 | H |
| $L_{a2217}$ | P6 | F | H | H | P102 | H | F | P3 | H |
| $L_{a2218}$ | P6 | F | H | H | P102 | H | F | P4 | H |
| $L_{a2219}$ | P6 | F | H | H | P102 | H | F | P5 | H |
| $L_{a2220}$ | P6 | F | H | H | P102 | H | F | P6 | H |
| $L_{a2221}$ | P6 | F | H | H | P102 | H | F | P7 | H |
| $L_{a2222}$ | P6 | F | H | H | P102 | H | F | P8 | H |
| $L_{a2223}$ | P6 | F | H | H | P102 | H | F | P9 | H |
| $L_{a2224}$ | P6 | F | H | H | P102 | H | F | P10 | H |
| $L_{a2225}$ | P6 | F | H | H | P102 | H | F | P11 | H |
| $L_{a2226}$ | P6 | F | H | H | P102 | H | P1 | F | H |
| $L_{a2227}$ | P6 | F | H | H | P102 | H | P2 | F | H |
| $L_{a2228}$ | P6 | F | H | H | P102 | H | P3 | F | H |
| $L_{a2229}$ | P6 | F | H | H | P102 | H | P4 | F | H |
| $L_{a2230}$ | P6 | F | H | H | P102 | H | P5 | F | H |
| $L_{a2231}$ | P6 | F | H | H | P102 | H | P6 | F | H |
| $L_{a2232}$ | P6 | F | H | H | P102 | H | P7 | F | H |
| $L_{a2233}$ | P6 | F | H | H | P102 | H | P8 | F | H |
| $L_{a2234}$ | P6 | F | H | H | P102 | H | P9 | F | H |
| $L_{a2235}$ | P6 | F | H | H | P102 | H | P10 | F | H |
| $L_{a2236}$ | P6 | F | H | H | P102 | H | P11 | F | H |
| $L_{a2237}$ | P6 | F | H | H | P102 | H | P1 | P1 | H |
| $L_{a2238}$ | P6 | F | H | H | P102 | H | P2 | P2 | H |
| $L_{a2239}$ | P6 | F | H | H | P102 | D | D | D | D |
| $L_{a2240}$ | P6 | F | H | H | P102 | D | P2 | P2 | D |
| $L_{a2241}$ | P6 | F | H | H | P102 | D | F | P4 | D |
| $L_{a2242}$ | P6 | F | H | H | P102 | D | F | P5 | D |
| $L_{a2243}$ | P6 | F | H | H | P102 | D | F | P9 | D |
| $L_{a2244}$ | P6 | F | H | H | P102 | D | F | P11 | D |
| $L_{a2245}$ | P6 | F | H | H | P103 | H | P1 | H | H |
| $L_{a2246}$ | P6 | F | H | H | P103 | H | P2 | H | H |
| $L_{a2247}$ | P6 | F | H | H | P103 | H | P3 | H | H |
| $L_{a2248}$ | P6 | F | H | H | P103 | H | P4 | H | H |
| $L_{a2249}$ | P6 | F | H | H | P103 | H | P5 | H | H |
| $L_{a2250}$ | P6 | F | H | H | P103 | H | P6 | H | H |
| $L_{a2251}$ | P6 | F | H | H | P103 | H | P7 | H | H |
| $L_{a2252}$ | P6 | F | H | H | P103 | H | P8 | H | H |
| $L_{a2253}$ | P6 | F | H | H | P103 | H | P9 | H | H |
| $L_{a2254}$ | P6 | F | H | H | P103 | H | P10 | H | H |
| $L_{a2255}$ | P6 | F | H | H | P103 | H | P11 | H | H |
| $L_{a2256}$ | P6 | F | H | H | P103 | H | P12 | H | H |
| $L_{a2257}$ | P6 | F | H | H | P103 | H | P13 | H | H |
| $L_{a2258}$ | P6 | F | H | H | P103 | H | P14 | H | H |
| $L_{a2259}$ | P6 | F | H | H | P103 | H | P15 | H | H |
| $L_{a2260}$ | P6 | F | H | H | P103 | H | P16 | H | H |
| $L_{a226;}$ | P6 | F | H | H | P103 | H | P17 | H | H |
| $L_{a2262}$ | P6 | F | H | H | P103 | H | P18 | H | H |
| $L_{a2263}$ | P6 | F | H | H | P103 | H | P19 | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a2264}$ | P6 | F | H | H | P103 | H | P20 | H | H |
| $L_{a2265}$ | P6 | F | H | H | P103 | H | P21 | H | H |
| $L_{a2266}$ | P6 | F | H | H | P103 | H | H | P1 | H |
| $L_{a2267}$ | P6 | F | H | H | P103 | H | H | P2 | H |
| $L_{a2268}$ | P6 | F | H | H | P103 | H | H | P3 | H |
| $L_{a2269}$ | P6 | F | H | H | P103 | H | H | P4 | H |
| $L_{a2270}$ | P6 | F | H | H | P103 | H | H | P5 | H |
| $L_{a2271}$ | P6 | F | H | H | P103 | H | H | P6 | H |
| $L_{a2272}$ | P6 | F | H | H | P103 | H | H | P7 | H |
| $L_{a2273}$ | P6 | F | H | H | P103 | H | H | P8 | H |
| $L_{a2274}$ | P6 | F | H | H | P103 | H | H | P9 | H |
| $L_{a2275}$ | P6 | F | H | H | P103 | H | H | P10 | H |
| $L_{a2276}$ | P6 | F | H | H | P103 | H | H | P11 | H |
| $L_{a2277}$ | P6 | F | H | H | P103 | H | H | P12 | H |
| $L_{a2278}$ | P6 | F | H | H | P103 | H | H | P15 | H |
| $L_{a2279}$ | P6 | F | H | H | P103 | H | H | P17 | H |
| $L_{a2280}$ | P6 | F | H | H | P103 | H | H | P18 | H |
| $L_{a2281}$ | P6 | F | H | H | P103 | H | H | P19 | H |
| $L_{a2282}$ | P6 | F | H | H | P103 | H | H | P20 | H |
| $L_{a2283}$ | P6 | F | H | H | P103 | H | H | P21 | H |
| $L_{a2284}$ | P6 | F | H | H | P103 | H | F | H | H |
| $L_{a2285}$ | P6 | F | H | H | P103 | H | F | P1 | H |
| $L_{a2286}$ | P6 | F | H | H | P103 | H | F | P2 | H |
| $L_{a2287}$ | P6 | F | H | H | P103 | H | F | P3 | H |
| $L_{a2288}$ | P6 | F | H | H | P103 | H | F | P4 | H |
| $L_{a2289}$ | P6 | F | H | H | P103 | H | F | P5 | H |
| $L_{a2290}$ | P6 | F | H | H | P103 | H | F | P6 | H |
| $L_{a2291}$ | P6 | F | H | H | P103 | H | F | P7 | H |
| $L_{a2292}$ | P6 | F | H | H | P103 | H | F | P8 | H |
| $L_{a2293}$ | P6 | F | H | H | P103 | H | F | P9 | H |
| $L_{a2294}$ | P6 | F | H | H | P103 | H | F | P10 | H |
| $L_{a2295}$ | P6 | F | H | H | P103 | H | F | P11 | H |
| $L_{a2296}$ | P6 | F | H | H | P103 | H | P1 | F | H |
| $L_{a2297}$ | P6 | F | H | H | P103 | H | P2 | F | H |
| $L_{a2298}$ | P6 | F | H | H | P103 | H | P3 | F | H |
| $L_{a2299}$ | P6 | F | H | H | P103 | H | P4 | F | H |
| $L_{a2300}$ | P6 | F | H | H | P103 | H | P5 | F | H |
| $L_{a2301}$ | P6 | F | H | H | P103 | H | P6 | F | H |
| $L_{a2302}$ | P6 | F | H | H | P103 | H | P7 | F | H |
| $L_{a2303}$ | P6 | F | H | H | P103 | H | P8 | F | H |
| $L_{a2304}$ | P6 | F | H | H | P103 | H | P9 | F | H |
| $L_{a2305}$ | P6 | F | H | H | P103 | H | P10 | F | H |
| $L_{a2306}$ | P6 | F | H | H | P103 | H | P11 | F | H |
| $L_{a2307}$ | P6 | F | H | H | P103 | H | P1 | P1 | H |
| $L_{a2308}$ | P6 | F | H | H | P103 | H | P2 | P2 | H |
| $L_{a2309}$ | P6 | F | H | H | P103 | D | D | D | D |
| $L_{a2310}$ | P6 | F | H | H | P103 | D | P2 | P2 | D |
| $L_{a2311}$ | P6 | F | H | H | P103 | D | F | P4 | D |
| $L_{a2312}$ | P6 | F | H | H | P103 | D | F | P5 | D |
| $L_{a2313}$ | P6 | F | H | H | P103 | D | F | P9 | D |
| $L_{a2314}$ | P6 | F | H | H | P103 | D | F | P11 | D |
| $L_{a2315}$ | P6 | F | H | H | H | H | P20 | P1 | H |
| $L_{a2316}$ | P6 | F | H | H | H | H | P21 | P2 | H |
| $L_{a2317}$ | P6 | F | H | H | H | H | P29 | H | H |
| $L_{a2318}$ | P6 | F | H | H | H | H | P29 | P1 | H |
| $L_{a2319}$ | P6 | F | H | H | H | H | P54 | H | H |
| $L_{a2320}$ | P6 | F | H | H | H | H | P96 | H | H |
| $L_{a2321}$ | P6 | F | H | H | H | H | P97 | H | H |
| $L_{a2322}$ | P6 | F | H | H | H | H | P96 | P1 | H |
| $L_{a2323}$ | P6 | F | H | H | H | H | P97 | P1 | H |
| $L_{a2324}$ | P6 | F | H | H | H | H | P102 | H | H |
| $L_{a2325}$ | P6 | F | H | H | H | H | P103 | H | H |
| $L_{a2326}$ | P6 | F | H | H | D | H | P20 | P1 | H |
| $L_{a2327}$ | P6 | F | H | H | D | H | P21 | P2 | H |
| $L_{a2328}$ | P6 | F | H | H | D | H | P29 | H | H |
| $L_{a2329}$ | P6 | F | H | H | D | H | P29 | P1 | H |
| $L_{a2330}$ | P6 | F | H | H | D | H | P54 | H | H |
| $L_{a2331}$ | P6 | F | H | H | D | H | P96 | H | H |
| $L_{a2332}$ | P6 | F | H | H | D | H | P97 | H | H |
| $L_{a2333}$ | P6 | F | H | H | D | H | P96 | P1 | H |
| $L_{a2334}$ | P6 | F | H | H | D | H | P97 | P1 | H |
| $L_{a2335}$ | P6 | F | H | H | D | H | P102 | H | H |
| $L_{a2336}$ | P6 | F | H | H | D | H | P103 | H | H |
| $L_{a2337}$ | P6 | F | H | H | P20 | H | P20 | P1 | H |
| $L_{a2338}$ | P6 | F | H | H | P20 | H | P21 | P2 | H |
| $L_{a2339}$ | P6 | F | H | H | P20 | H | P29 | H | H |
| $L_{a2340}$ | P6 | F | H | H | P20 | H | P29 | P1 | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a2341}$ | P6 | F | H | H | P20 | H | P54 | H | H |
| $L_{a2342}$ | P6 | F | H | H | P20 | H | P96 | H | H |
| $L_{a2343}$ | P6 | F | H | H | P20 | H | P97 | H | H |
| $L_{a2344}$ | P6 | F | H | H | P20 | H | P96 | P1 | H |
| $L_{a2345}$ | P6 | F | H | H | P20 | H | P97 | P1 | H |
| $L_{a2346}$ | P6 | F | H | H | P20 | H | P102 | H | H |
| $L_{a2347}$ | P6 | F | H | H | P20 | H | P103 | H | H |
| $L_{a2348}$ | P6 | F | H | H | P21 | H | P20 | P1 | H |
| $L_{a2349}$ | P6 | F | H | H | P21 | H | P21 | P2 | H |
| $L_{a2350}$ | P6 | F | H | H | P21 | H | P29 | H | H |
| $L_{a2351}$ | P6 | F | H | H | P21 | H | P29 | P1 | H |
| $L_{a2352}$ | P6 | F | H | H | P21 | H | P54 | H | H |
| $L_{a2353}$ | P6 | F | H | H | P21 | H | P96 | H | H |
| $L_{a2354}$ | P6 | F | H | H | P21 | H | P97 | H | H |
| $L_{a2355}$ | P6 | F | H | H | P21 | H | P96 | P1 | H |
| $L_{a2356}$ | P6 | F | H | H | P21 | H | P97 | P1 | H |
| $L_{a2357}$ | P6 | F | H | H | P21 | H | P102 | H | H |
| $L_{a2358}$ | P6 | F | H | H | P21 | H | P103 | H | H |
| $L_{a2359}$ | P6 | F | H | H | P22 | H | H | H | H |
| $L_{a2360}$ | P6 | F | H | H | P23 | H | H | H | H |
| $L_{a2361}$ | P6 | F | H | H | P24 | H | H | H | H |
| $L_{a2362}$ | P6 | F | H | H | P25 | H | H | H | H |
| $L_{a2363}$ | P6 | F | H | H | P26 | H | H | H | H |
| $L_{a2364}$ | P6 | F | H | H | P27 | H | H | H | H |
| $L_{a2365}$ | P6 | F | H | H | P28 | H | H | H | H |
| $L_{a2366}$ | P6 | F | H | H | P29 | H | H | H | H |
| $L_{a2367}$ | P6 | F | H | H | P30 | H | H | H | H |
| $L_{a2368}$ | P6 | F | H | H | P31 | H | H | H | H |
| $L_{a2369}$ | P6 | F | H | H | P32 | H | H | H | H |
| $L_{a2370}$ | P6 | F | H | H | P33 | H | H | H | H |
| $L_{a2371}$ | P6 | F | H | H | P34 | H | H | H | H |
| $L_{a2372}$ | P6 | F | H | H | P35 | H | H | H | H |
| $L_{a2373}$ | P6 | F | H | H | P36 | H | H | H | H |
| $L_{a2374}$ | P6 | F | H | H | P37 | H | H | H | H |
| $L_{a2375}$ | P6 | F | H | H | P38 | H | H | H | H |
| $L_{a2376}$ | P6 | F | H | H | P39 | H | H | H | H |
| $L_{a2377}$ | P6 | F | H | H | P40 | H | H | H | H |
| $L_{a2378}$ | P6 | F | H | H | P41 | H | H | H | H |
| $L_{a2379}$ | P6 | F | H | H | P42 | H | H | H | H |
| $L_{a2380}$ | P6 | F | H | H | P43 | H | H | H | H |
| $L_{a2381}$ | P6 | F | H | H | P44 | H | H | H | H |
| $L_{a2382}$ | P6 | F | H | H | P45 | H | H | H | H |
| $L_{a2383}$ | P6 | F | H | H | P46 | H | H | H | H |
| $L_{a2384}$ | P6 | F | H | H | P47 | H | H | H | H |
| $L_{a2385}$ | P6 | F | H | H | P48 | H | H | H | H |
| $L_{a2386}$ | P6 | F | H | H | P49 | H | H | H | H |
| $L_{a2387}$ | P6 | F | H | H | P50 | H | H | H | H |
| $L_{a2388}$ | P6 | F | H | H | P51 | H | H | H | H |
| $L_{a2389}$ | P6 | F | H | H | P52 | H | H | H | H |
| $L_{a2390}$ | P6 | F | H | H | P53 | H | H | H | H |
| $L_{a2391}$ | P6 | F | H | H | P55 | H | H | H | H |
| $L_{a2392}$ | P6 | F | H | H | P56 | H | H | H | H |
| $L_{a2393}$ | P6 | F | H | H | P57 | H | H | H | H |
| $L_{a2394}$ | P6 | F | H | H | P58 | H | H | H | H |
| $L_{a2395}$ | P6 | F | H | H | P59 | H | H | H | H |
| $L_{a2396}$ | P6 | F | H | H | P60 | H | H | H | H |
| $L_{a2397}$ | P6 | F | H | H | P61 | H | H | H | H |
| $L_{a2398}$ | P6 | F | H | H | P62 | H | H | H | H |
| $L_{a2399}$ | P6 | F | H | H | P63 | H | H | H | H |
| $L_{a2400}$ | P6 | F | H | H | P64 | H | H | H | H |
| $L_{a2401}$ | P6 | F | H | H | P65 | H | H | H | H |
| $L_{a2402}$ | P6 | F | H | H | P66 | H | H | H | H |
| $L_{a2403}$ | P6 | F | H | H | P67 | H | H | H | H |
| $L_{a2404}$ | P6 | F | H | H | P68 | H | H | H | H |
| $L_{a2405}$ | P6 | F | H | H | P69 | H | H | H | H |
| $L_{a2406}$ | P6 | F | H | H | P70 | H | H | H | H |
| $L_{a2407}$ | P6 | F | H | H | P71 | H | H | H | H |
| $L_{a2408}$ | P6 | F | H | H | P72 | H | H | H | H |
| $L_{a2409}$ | P6 | F | H | H | P73 | H | H | H | H |
| $L_{a2410}$ | P6 | F | H | H | P74 | H | H | H | H |
| $L_{a2411}$ | P6 | F | H | H | P75 | H | H | H | H |
| $L_{a2412}$ | P6 | F | H | H | P76 | H | H | H | H |
| $L_{a2413}$ | P6 | F | H | H | P77 | H | H | H | H |
| $L_{a2414}$ | P6 | F | H | H | P78 | H | H | H | H |
| $L_{a2415}$ | P6 | F | H | H | P79 | H | H | H | H |
| $L_{a2416}$ | P6 | F | H | H | P80 | H | H | H | H |
| $L_{a2417}$ | P6 | F | H | H | P81 | H | H | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a2418}$ | P6 | F | H | H | P82 | H | H | H | H |
| $L_{a2419}$ | P6 | F | H | H | P83 | H | H | H | H |
| $L_{a2420}$ | P6 | F | H | H | P84 | H | H | H | H |
| $L_{a2421}$ | P6 | F | H | H | P85 | H | H | H | H |
| $L_{a2422}$ | P6 | F | H | H | P86 | H | H | H | H |
| $L_{a2423}$ | P6 | F | H | H | P87 | H | H | H | H |
| $L_{a2424}$ | P6 | F | H | H | P88 | H | H | H | H |
| $L_{a2425}$ | P6 | F | H | H | P89 | H | H | H | H |
| $L_{a2426}$ | P6 | F | H | H | P90 | H | H | H | H |
| $L_{a2427}$ | P6 | F | H | H | P91 | H | H | H | H |
| $L_{a2428}$ | P6 | F | H | H | P92 | H | H | H | H |
| $L_{a2429}$ | P6 | F | H | H | P93 | H | H | H | H |
| $L_{a2430}$ | P6 | F | H | H | P94 | H | H | H | H |
| $L_{a2431}$ | P6 | F | H | H | P95 | H | H | H | H |
| $L_{a2432}$ | P6 | F | H | H | P98 | H | H | H | H |
| $L_{a2433}$ | P6 | F | H | H | P99 | H | H | H | H |
| $L_{a2434}$ | P6 | F | H | H | P100 | H | H | H | H |
| $L_{a2435}$ | P6 | F | H | H | P101 | H | H | H | H |
| $L_{a2436}$ | P6 | F | H | H | P102 | H | H | H | H |
| $L_{a2437}$ | P6 | F | H | H | P103 | H | H | H | H |
| $L_{a2438}$ | P6 | F | H | H | P104 | H | H | H | H |
| $L_{a2439}$ | P6 | F | H | H | P105 | H | H | H | H |
| $L_{a2440}$ | P6 | F | H | H | P106 | H | H | H | H |
| $L_{a2441}$ | P6 | F | H | H | P107 | H | H | H | H |
| $L_{a2442}$ | P6 | F | H | H | P108 | H | H | H | H |
| $L_{a2443}$ | P6 | F | H | H | P109 | H | H | H | H |
| $L_{a2444}$ | P6 | F | H | H | P110 | H | H | H | H |
| $L_{a2445}$ | P6 | F | H | H | P111 | H | H | H | H |
| $L_{a2446}$ | P6 | F | H | H | P112 | H | H | H | H |
| $L_{a2447}$ | P6 | F | H | H | P113 | H | H | H | H |
| $L_{a2448}$ | P6 | F | H | H | P114 | H | H | H | H |
| $L_{a2449}$ | P6 | F | H | H | P115 | H | H | H | H |
| $L_{a2450}$ | P6 | F | H | H | P116 | H | H | H | H |
| $L_{a2451}$ | P6 | F | H | H | P117 | H | H | H | H |
| $L_{a2452}$ | P6 | F | H | H | P118 | H | H | H | H |
| $L_{a2453}$ | P6 | F | H | H | P119 | H | H | H | H |
| $L_{a2454}$ | P6 | F | H | H | P120 | H | H | H | H |
| $L_{a2455}$ | P6 | F | H | H | P121 | H | H | H | H |
| $L_{a2456}$ | P6 | F | H | H | P122 | H | H | H | H |
| $L_{a2457}$ | P6 | F | H | H | P123 | H | H | H | H |
| $L_{a2458}$ | P6 | F | H | H | P124 | H | H | H | H |
| $L_{a2459}$ | P6 | F | H | H | P125 | H | H | H | H |
| $L_{a2460}$ | P6 | F | H | H | P126 | H | H | H | H |
| $L_{a2461}$ | P6 | F | H | H | P127 | H | H | H | H |
| $L_{a2462}$ | P6 | F | H | H | P128 | H | H | H | H |
| $L_{a2463}$ | P6 | F | H | H | P129 | H | H | H | H |
| $L_{a2464}$ | P6 | F | H | H | P130 | H | H | H | H |
| $L_{a2465}$ | P6 | F | H | H | P131 | H | H | H | H |
| $L_{a2466}$ | P6 | F | H | H | P132 | H | H | H | H |
| $L_{a2467}$ | P6 | F | H | H | P133 | H | H | H | H |
| $L_{a2468}$ | P6 | F | H | H | P134 | H | H | H | H |
| $L_{a2469}$ | P6 | F | H | H | P135 | H | H | H | H |
| $L_{a2470}$ | P6 | F | H | H | P136 | H | H | H | H |
| $L_{a2471}$ | P6 | F | H | H | P137 | H | H | H | H |
| $L_{a2472}$ | P6 | F | H | H | P138 | H | H | H | H |
| $L_{a2473}$ | P6 | F | H | H | P139 | H | H | H | H |
| $L_{a2474}$ | P6 | F | H | H | P140 | H | H | H | H |
| $L_{a2475}$ | P6 | F | H | H | P141 | H | H | H | H |
| $L_{a2476}$ | P6 | F | H | H | P142 | H | H | H | H |
| $L_{a2477}$ | P6 | F | H | H | P143 | H | H | H | H |
| $L_{a2478}$ | P6 | F | H | H | P144 | H | H | H | H |
| $L_{a2479}$ | P6 | F | H | H | P145 | H | H | H | H |
| $L_{a2480}$ | P6 | F | H | H | P146 | H | H | H | H |
| $L_{a2481}$ | P6 | F | H | H | P147 | H | H | H | H |
| $L_{a2482}$ | P6 | F | H | H | P148 | H | H | H | H |
| $L_{a2483}$ | P6 | F | H | H | P149 | H | H | H | H |
| $L_{a2484}$ | P6 | F | H | H | P150 | H | H | H | H |
| $L_{a2485}$ | P6 | F | H | H | P151 | H | H | H | H |
| $L_{a2486}$ | P6 | F | H | P18 | H | H | H | H | H |
| $L_{a2487}$ | P6 | F | H | P18 | D | H | H | H | H |
| $L_{a2488}$ | P6 | F | H | P18 | P20 | H | H | H | H |
| $L_{a2489}$ | P6 | F | H | P19 | H | H | H | H | H |
| $L_{a2490}$ | P6 | F | H | P19 | D | H | H | H | H |
| $L_{a2491}$ | P6 | F | H | P19 | P20 | H | H | H | H |
| $L_{a2492}$ | P6 | F | H | P20 | H | H | H | H | H |
| $L_{a2493}$ | P6 | F | H | P20 | D | H | H | H | H |
| $L_{a2494}$ | P6 | F | H | P20 | H | H | P1 | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a2495}$ | P6 | F | H | P20 | D | H | P2 | H | H |
| $L_{a2496}$ | P6 | F | H | P20 | H | H | H | P1 | H |
| $L_{a2497}$ | P6 | F | H | P20 | D | H | H | P2 | H |
| $L_{a2498}$ | P6 | F | H | P20 | H | H | P1 | P1 | H |
| $L_{a2499}$ | P6 | F | H | P20 | D | H | P2 | P2 | H |
| $L_{a2500}$ | P6 | F | H | P20 | H | H | P3 | H | H |
| $L_{a2501}$ | P6 | F | H | P20 | D | H | P4 | H | H |
| $L_{a2502}$ | P6 | F | H | P20 | H | H | P5 | H | H |
| $L_{a2503}$ | P6 | F | H | P21 | H | H | H | H | H |
| $L_{a2504}$ | P6 | F | H | P21 | D | H | H | H | H |
| $L_{a2505}$ | P6 | F | H | P21 | H | H | P1 | H | H |
| $L_{a2506}$ | P6 | F | H | P21 | D | H | P2 | H | H |
| $L_{a2507}$ | P6 | F | H | P21 | H | H | H | P1 | H |
| $L_{a2508}$ | P6 | F | H | P21 | D | H | H | P2 | H |
| $L_{a2509}$ | P6 | F | H | P21 | H | H | P1 | P1 | H |
| $L_{a2510}$ | P6 | F | H | P21 | D | H | P2 | P2 | H |
| $L_{a2511}$ | P6 | F | H | P21 | H | H | P3 | H | H |
| $L_{a2512}$ | P6 | F | H | P21 | D | H | P4 | H | H |
| $L_{a2513}$ | P6 | F | H | P21 | H | H | P5 | H | H |
| $L_{a2514}$ | P11 | F | H | H | H | H | H | H | H |
| $L_{a2515}$ | P11 | F | H | H | H | H | P1 | H | H |
| $L_{a2516}$ | P11 | F | H | H | H | H | P2 | H | H |
| $L_{a2517}$ | P11 | F | H | H | H | H | P3 | H | H |
| $L_{a2518}$ | P11 | F | H | H | H | H | P4 | H | H |
| $L_{a2519}$ | P11 | F | H | H | H | H | P5 | H | H |
| $L_{a2520}$ | P11 | F | H | H | H | H | P6 | H | H |
| $L_{a2521}$ | P11 | F | H | H | H | H | P7 | H | H |
| $L_{a2522}$ | P11 | F | H | H | H | H | P8 | H | H |
| $L_{a2523}$ | P11 | F | H | H | H | H | P9 | H | H |
| $L_{a2524}$ | P11 | F | H | H | H | H | P10 | H | H |
| $L_{a2525}$ | P11 | F | H | H | H | H | P11 | H | H |
| $L_{a2526}$ | P11 | F | H | H | H | H | P12 | H | H |
| $L_{a2527}$ | P11 | F | H | H | H | H | P13 | H | H |
| $L_{a2528}$ | P11 | F | H | H | H | H | P14 | H | H |
| $L_{a2529}$ | P11 | F | H | H | H | H | P15 | H | H |
| $L_{a2530}$ | P11 | F | H | H | H | H | P16 | H | H |
| $L_{a2531}$ | P11 | F | H | H | H | H | P17 | H | H |
| $L_{a2532}$ | P11 | F | H | H | H | H | P18 | H | H |
| $L_{a2533}$ | P11 | F | H | H | H | H | P19 | H | H |
| $L_{a2534}$ | P11 | F | H | H | H | H | P20 | H | H |
| $L_{a2535}$ | P11 | F | H | H | H | H | P21 | H | H |
| $L_{a2536}$ | P11 | F | H | H | H | H | P1 | F | H |
| $L_{a2537}$ | P11 | F | H | H | H | H | P2 | F | H |
| $L_{a2538}$ | P11 | F | H | H | H | H | P3 | F | H |
| $L_{a2539}$ | P11 | F | H | H | H | H | P4 | F | H |
| $L_{a2540}$ | P11 | F | H | H | H | H | P5 | F | H |
| $L_{a2541}$ | P11 | F | H | H | H | H | P6 | F | H |
| $L_{a2542}$ | P11 | F | H | H | H | H | P7 | F | H |
| $L_{a2543}$ | P11 | F | H | H | H | H | P8 | F | H |
| $L_{a2544}$ | P11 | F | H | H | H | H | P9 | F | H |
| $L_{a2545}$ | P11 | F | H | H | H | H | P10 | F | H |
| $L_{a2546}$ | P11 | F | H | H | H | H | P11 | F | H |
| $L_{a2547}$ | P11 | F | H | H | H | H | P12 | F | H |
| $L_{a2548}$ | P11 | F | H | H | H | H | P13 | F | H |
| $L_{a2549}$ | P11 | F | H | H | H | H | P14 | F | H |
| $L_{a2550}$ | P11 | F | H | H | H | H | P15 | F | H |
| $L_{a2551}$ | P11 | F | H | H | H | H | P16 | F | H |
| $L_{a2552}$ | P11 | F | H | H | H | H | P17 | F | H |
| $L_{a2553}$ | P11 | F | H | H | H | H | P18 | F | H |
| $L_{a2554}$ | P11 | F | H | H | H | H | P19 | F | H |
| $L_{22555}$ | P11 | F | H | H | H | H | P20 | F | H |
| $L_{a2556}$ | P11 | F | H | H | H | H | P21 | F | H |
| $L_{a2557}$ | P11 | F | H | H | H | H | H | P1 | H |
| $L_{a2558}$ | P11 | F | H | H | H | H | H | P2 | H |
| $L_{a2559}$ | P11 | F | H | H | H | H | H | P3 | H |
| $L_{a2560}$ | P11 | F | H | H | H | H | H | P4 | H |
| $L_{a2561}$ | P11 | F | H | H | H | H | H | P5 | H |
| $L_{a2562}$ | P11 | F | H | H | H | H | H | P6 | H |
| $L_{a2563}$ | P11 | F | H | H | H | H | H | P7 | H |
| $L_{a2564}$ | P11 | F | H | H | H | H | H | P8 | H |
| $L_{a2565}$ | P11 | F | H | H | H | H | H | P9 | H |
| $L_{a2566}$ | P11 | F | H | H | H | H | H | P10 | H |
| $L_{a2567}$ | P11 | F | H | H | H | H | H | P11 | H |
| $L_{a2568}$ | P11 | F | H | H | H | H | H | P12 | H |
| $L_{a2569}$ | P11 | F | H | H | H | H | H | P13 | H |
| $L_{a2570}$ | P11 | F | H | H | H | H | H | P14 | H |
| $L_{a2571}$ | P11 | F | H | H | H | H | H | P15 | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a2572}$ | P11 | F | H | H | H | H | H | P16 | H |
| $L_{a2573}$ | P11 | F | H | H | H | H | H | P17 | H |
| $L_{a2574}$ | P11 | F | H | H | H | H | H | P18 | H |
| $L_{a2575}$ | P11 | F | H | H | H | H | H | P19 | H |
| $L_{a2576}$ | P11 | F | H | H | H | H | H | P20 | H |
| $L_{a2577}$ | P11 | F | H | H | H | H | H | P21 | H |
| $L_{a2578}$ | P11 | F | H | H | H | H | F | P1 | H |
| $L_{a2579}$ | P11 | F | H | H | H | H | F | P2 | H |
| $L_{a2580}$ | P11 | F | H | H | H | H | F | P3 | H |
| $L_{a2581}$ | P11 | F | H | H | H | H | F | P4 | H |
| $L_{a2582}$ | P11 | F | H | H | H | H | F | P5 | H |
| $L_{a2583}$ | P11 | F | H | H | H | H | F | P6 | H |
| $L_{a2584}$ | P11 | F | H | H | H | H | F | P7 | H |
| $L_{a2585}$ | P11 | F | H | H | H | H | F | P8 | H |
| $L_{a2586}$ | P11 | F | H | H | H | H | F | P9 | H |
| $L_{a2587}$ | P11 | F | H | H | H | H | F | P10 | H |
| $L_{a2588}$ | P11 | F | H | H | H | H | F | P11 | H |
| $L_{a2589}$ | P11 | F | H | H | H | H | F | P12 | H |
| $L_{a2590}$ | P11 | F | H | H | H | H | F | P13 | H |
| $L_{a2591}$ | P11 | F | H | H | H | H | F | P14 | H |
| $L_{a2592}$ | P11 | F | H | H | H | H | F | P15 | H |
| $L_{a2593}$ | P11 | F | H | H | H | H | F | P16 | H |
| $L_{a2594}$ | P11 | F | H | H | H | H | F | P17 | H |
| $L_{a2595}$ | P11 | F | H | H | H | H | F | P18 | H |
| $L_{a2596}$ | P11 | F | H | H | H | H | F | P19 | H |
| $L_{a2597}$ | P11 | F | H | H | H | H | F | P20 | H |
| $L_{a2598}$ | P11 | F | H | H | H | H | F | P21 | H |
| $L_{a2599}$ | P11 | F | H | H | H | H | P1 | P1 | H |
| $L_{a2600}$ | P11 | F | H | H | H | H | P1 | P3 | H |
| $L_{a2601}$ | P11 | F | H | H | H | H | P1 | P8 | H |
| $L_{a2602}$ | P11 | F | H | H | H | H | P1 | P10 | H |
| $L_{a2603}$ | P11 | F | H | H | H | H | P1 | P20 | H |
| $L_{a2604}$ | P11 | F | H | H | H | H | P1 | P21 | H |
| $L_{a2605}$ | P11 | F | H | H | H | H | P2 | P2 | H |
| $L_{a2606}$ | P11 | F | H | H | H | H | P2 | P4 | H |
| $L_{a2607}$ | P11 | F | H | H | H | H | P2 | P5 | H |
| $L_{a2608}$ | P11 | F | H | H | H | H | P2 | P9 | H |
| $L_{a2609}$ | P11 | F | H | H | H | H | P2 | P11 | H |
| $L_{a2610}$ | P11 | F | H | H | H | H | P2 | P20 | H |
| $L_{a2611}$ | P11 | F | H | H | H | H | P2 | P21 | H |
| $L_{a2612}$ | P11 | F | H | H | H | D | D | D | D |
| $L_{a2613}$ | P11 | F | H | H | H | D | F | D | D |
| $L_{a2614}$ | P11 | F | H | H | H | D | D | F | D |
| $L_{a2615}$ | P11 | F | H | H | H | D | P2 | D | D |
| $L_{a2616}$ | P11 | F | H | H | H | D | D | P2 | D |
| $L_{a2617}$ | P11 | F | H | H | H | D | P2 | P2 | D |
| $L_{a2618}$ | P11 | F | H | H | D | H | H | H | H |
| $L_{a2619}$ | P11 | F | H | H | D | H | P1 | H | H |
| $L_{a2620}$ | P11 | F | H | H | D | H | P2 | H | H |
| $L_{a2621}$ | P11 | F | H | H | D | H | P5 | H | H |
| $L_{a2622}$ | P11 | F | H | H | D | H | P10 | H | H |
| $L_{a2623}$ | P11 | F | H | H | D | H | P11 | H | H |
| $L_{a2624}$ | P11 | F | H | H | D | H | H | P1 | H |
| $L_{a2625}$ | P11 | F | H | H | D | H | H | P2 | H |
| $L_{a2626}$ | P11 | F | H | H | D | H | H | P4 | H |
| $L_{a2627}$ | P11 | F | H | H | D | H | H | P5 | H |
| $L_{a2628}$ | P11 | F | H | H | D | H | H | P10 | H |
| $L_{a2629}$ | P11 | F | H | H | D | H | H | P11 | H |
| $L_{a2630}$ | P11 | F | H | H | D | H | P1 | F | H |
| $L_{a2631}$ | P11 | F | H | H | D | H | P2 | F | H |
| $L_{a2632}$ | P11 | F | H | H | D | H | P11 | F | H |
| $L_{a2633}$ | P11 | F | H | H | D | H | F | P1 | H |
| $L_{a2634}$ | P11 | F | H | H | D | H | F | P2 | H |
| $L_{a2635}$ | P11 | F | H | H | D | H | F | P3 | H |
| $L_{a2636}$ | P11 | F | H | H | D | H | F | P4 | H |
| $L_{a2637}$ | P11 | F | H | H | D | H | F | P5 | H |
| $L_{a2638}$ | P11 | F | H | H | D | H | F | P8 | H |
| $L_{a2639}$ | P11 | F | H | H | D | H | F | P11 | H |
| $L_{a2640}$ | P11 | F | H | H | D | H | P1 | P1 | H |
| $L_{a2641}$ | P11 | F | H | H | D | H | P2 | P2 | H |
| $L_{a2642}$ | P11 | F | H | H | D | H | P2 | P2 | D |
| $L_{a2643}$ | P11 | F | H | H | P20 | H | H | H | H |
| $L_{a2644}$ | P11 | F | H | H | P20 | H | P1 | H | H |
| $L_{a2645}$ | P11 | F | H | H | P20 | H | P2 | H | H |
| $L_{a2646}$ | P11 | F | H | H | P20 | H | P3 | H | H |
| $L_{a2647}$ | P11 | F | H | H | P20 | H | P4 | H | H |
| $L_{a2648}$ | P11 | F | H | H | P20 | H | P5 | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a2649}$ | P11 | F | H | H | P20 | H | P6 | H | H |
| $L_{a2650}$ | P11 | F | H | H | P20 | H | P7 | H | H |
| $L_{a2651}$ | P11 | F | H | H | P20 | H | P8 | H | H |
| $L_{a2652}$ | P11 | F | H | H | P20 | H | P9 | H | H |
| $L_{a2653}$ | P11 | F | H | H | P20 | H | P10 | H | H |
| $L_{a2654}$ | P11 | F | H | H | P20 | H | P11 | H | H |
| $L_{a2655}$ | P11 | F | H | H | P20 | H | P12 | H | H |
| $L_{a2656}$ | P11 | F | H | H | P20 | H | P13 | H | H |
| $L_{a2657}$ | P11 | F | H | H | P20 | H | P14 | H | H |
| $L_{a2658}$ | P11 | F | H | H | P20 | H | P15 | H | H |
| $L_{a2659}$ | P11 | F | H | H | P20 | H | P16 | H | H |
| $L_{a2660}$ | P11 | F | H | H | P20 | H | P17 | H | H |
| $L_{a2661}$ | P11 | F | H | H | P20 | H | P18 | H | H |
| $L_{a2662}$ | P11 | F | H | H | P20 | H | P19 | H | H |
| $L_{a2663}$ | P11 | F | H | H | P20 | H | P20 | H | H |
| $L_{a2664}$ | P11 | F | H | H | P20 | H | P21 | H | H |
| $L_{a2665}$ | P11 | F | H | H | P20 | H | H | P1 | H |
| $L_{a2666}$ | P11 | F | H | H | P20 | H | H | P2 | H |
| $L_{a2667}$ | P11 | F | H | H | P20 | H | H | P3 | H |
| $L_{a2668}$ | P11 | F | H | H | P20 | H | H | P4 | H |
| $L_{a2669}$ | P11 | F | H | H | P20 | H | H | P5 | H |
| $L_{a2670}$ | P11 | F | H | H | P20 | H | H | P6 | H |
| $L_{a2671}$ | P11 | F | H | H | P20 | H | H | P7 | H |
| $L_{a2672}$ | P11 | F | H | H | P20 | H | H | P8 | H |
| $L_{a2673}$ | P11 | F | H | H | P20 | H | H | P9 | H |
| $L_{a2674}$ | P11 | F | H | H | P20 | H | H | P10 | H |
| $L_{a2675}$ | P11 | F | H | H | P20 | H | H | P11 | H |
| $L_{a2676}$ | P11 | F | H | H | P20 | H | H | P12 | H |
| $L_{a2677}$ | P11 | F | H | H | P20 | H | H | P15 | H |
| $L_{a2678}$ | P11 | F | H | H | P20 | H | H | P17 | H |
| $L_{a2679}$ | P11 | F | H | H | P20 | H | H | P18 | H |
| $L_{a2680}$ | P11 | F | H | H | P20 | H | H | P19 | H |
| $L_{a2681}$ | P11 | F | H | H | P20 | H | H | P20 | H |
| $L_{a2682}$ | P11 | F | H | H | P20 | H | H | P21 | H |
| $L_{a2683}$ | P11 | F | H | H | P20 | H | F | H | H |
| $L_{a2684}$ | P11 | F | H | H | P20 | H | F | P1 | H |
| $L_{a2685}$ | P11 | F | H | H | P20 | H | F | P2 | H |
| $L_{a2686}$ | P11 | F | H | H | P20 | H | F | P3 | H |
| $L_{a2687}$ | P11 | F | H | H | P20 | H | F | P4 | H |
| $L_{a2688}$ | P11 | F | H | H | P20 | H | F | P5 | H |
| $L_{a2689}$ | P11 | F | H | H | P20 | H | F | P6 | H |
| $L_{a2690}$ | P11 | F | H | H | P20 | H | F | P7 | H |
| $L_{a2691}$ | P11 | F | H | H | P20 | H | F | P8 | H |
| $L_{a2692}$ | P11 | F | H | H | P20 | H | F | P9 | H |
| $L_{a2693}$ | P11 | F | H | H | P20 | H | F | P10 | H |
| $L_{a2694}$ | P11 | F | H | H | P20 | H | F | P11 | H |
| $L_{a2695}$ | P11 | F | H | H | P20 | H | P1 | F | H |
| $L_{a2696}$ | P11 | F | H | H | P20 | H | P2 | F | H |
| $L_{a2697}$ | P11 | F | H | H | P20 | H | P3 | F | H |
| $L_{a2698}$ | P11 | F | H | H | P20 | H | P4 | F | H |
| $L_{a2699}$ | P11 | F | H | H | P20 | H | P5 | F | H |
| $L_{a2700}$ | P11 | F | H | H | P20 | H | P6 | F | H |
| $L_{a2701}$ | P11 | F | H | H | P20 | H | P7 | F | H |
| $L_{a2702}$ | P11 | F | H | H | P20 | H | P8 | F | H |
| $L_{a2703}$ | P11 | F | H | H | P20 | H | P9 | F | H |
| $L_{a2704}$ | P11 | F | H | H | P20 | H | P10 | F | H |
| $L_{a2705}$ | P11 | F | H | H | P20 | H | P11 | F | H |
| $L_{a2706}$ | P11 | F | H | H | P20 | H | P1 | P1 | H |
| $L_{a2707}$ | P11 | F | H | H | P20 | H | P2 | P2 | H |
| $L_{a2708}$ | P11 | F | H | H | P20 | D | D | D | D |
| $L_{a2709}$ | P11 | F | H | H | P20 | D | P2 | P2 | D |
| $L_{a2710}$ | P11 | F | H | H | P20 | D | F | P4 | D |
| $L_{a2711}$ | P11 | F | H | H | P20 | D | F | P5 | D |
| $L_{a2712}$ | P11 | F | H | H | P20 | D | F | P9 | D |
| $L_{a2713}$ | P11 | F | H | H | P20 | D | F | P11 | D |
| $L_{a2714}$ | P11 | F | H | H | P21 | H | H | H | H |
| $L_{a2715}$ | P11 | F | H | H | P21 | H | P1 | H | H |
| $L_{a2716}$ | P11 | F | H | H | P21 | H | P2 | H | H |
| $L_{a2717}$ | P11 | F | H | H | P21 | H | P3 | H | H |
| $L_{a2718}$ | P11 | F | H | H | P21 | H | P4 | H | H |
| $L_{a2719}$ | P11 | F | H | H | P21 | H | P5 | H | H |
| $L_{a2720}$ | P11 | F | H | H | P21 | H | P6 | H | H |
| $L_{a2721}$ | P11 | F | H | H | P21 | H | P7 | H | H |
| $L_{a2722}$ | P11 | F | H | H | P21 | H | P8 | H | H |
| $L_{a2723}$ | P11 | F | H | H | P21 | H | P9 | H | H |
| $L_{a2724}$ | P11 | F | H | H | P21 | H | P10 | H | H |
| $L_{a2725}$ | P11 | F | H | H | P21 | H | P11 | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a2726}$ | P11 | F | H | H | P21 | H | P12 | H | H |
| $L_{a2727}$ | P11 | F | H | H | P21 | H | P13 | H | H |
| $L_{a2728}$ | P11 | F | H | H | P21 | H | P14 | H | H |
| $L_{a2729}$ | P11 | F | H | H | P21 | H | P15 | H | H |
| $L_{a2730}$ | P11 | F | H | H | P21 | H | P16 | H | H |
| $L_{a2731}$ | P11 | F | H | H | P21 | H | P17 | H | H |
| $L_{a2732}$ | P11 | F | H | H | P21 | H | P18 | H | H |
| $L_{a2733}$ | P11 | F | H | H | P21 | H | P19 | H | H |
| $L_{a2734}$ | P11 | F | H | H | P21 | H | P20 | H | H |
| $L_{a2735}$ | P11 | F | H | H | P21 | H | P21 | H | H |
| $L_{a2736}$ | P11 | F | H | H | P21 | H | H | P1 | H |
| $L_{a2737}$ | P11 | F | H | H | P21 | H | H | P2 | H |
| $L_{a2738}$ | P11 | F | H | H | P21 | H | H | P3 | H |
| $L_{a2739}$ | P11 | F | H | H | P21 | H | H | P4 | H |
| $L_{a2740}$ | P11 | F | H | H | P21 | H | H | P5 | H |
| $L_{a2741}$ | P11 | F | H | H | P21 | H | H | P6 | H |
| $L_{a2742}$ | P11 | F | H | H | P21 | H | H | P7 | H |
| $L_{a2743}$ | P11 | F | H | H | P21 | H | H | P8 | H |
| $L_{a2744}$ | P11 | F | H | H | P21 | H | H | P9 | H |
| $L_{a2745}$ | P11 | F | H | H | P21 | H | H | P10 | H |
| $L_{a2746}$ | P11 | F | H | H | P21 | H | H | P11 | H |
| $L_{a2747}$ | P11 | F | H | H | P21 | H | H | P12 | H |
| $L_{a2748}$ | P11 | F | H | H | P21 | H | H | P15 | H |
| $L_{a2749}$ | P11 | F | H | H | P21 | H | H | P17 | H |
| $L_{a2750}$ | P11 | F | H | H | P21 | H | H | P18 | H |
| $L_{a2751}$ | P11 | F | H | H | P21 | H | H | P19 | H |
| $L_{a2752}$ | P11 | F | H | H | P21 | H | H | P20 | H |
| $L_{a2753}$ | P11 | F | H | H | P21 | H | H | P21 | H |
| $L_{a2754}$ | P11 | F | H | H | P21 | H | F | H | H |
| $L_{a2755}$ | P11 | F | H | H | P21 | H | F | P1 | H |
| $L_{a2756}$ | P11 | F | H | H | P21 | H | F | P2 | H |
| $L_{a2757}$ | P11 | F | H | H | P21 | H | F | P3 | H |
| $L_{a2758}$ | P11 | F | H | H | P21 | H | F | P4 | H |
| $L_{a2759}$ | P11 | F | H | H | P21 | H | F | P5 | H |
| $L_{a2760}$ | P11 | F | H | H | P21 | H | F | P6 | H |
| $L_{a2761}$ | P11 | F | H | H | P21 | H | F | P7 | H |
| $L_{a2762}$ | P11 | F | H | H | P21 | H | F | P8 | H |
| $L_{a2763}$ | P11 | F | H | H | P21 | H | F | P9 | H |
| $L_{a2764}$ | P11 | F | H | H | P21 | H | F | P10 | H |
| $L_{a2765}$ | P11 | F | H | H | P21 | H | F | P11 | H |
| $L_{a2766}$ | P11 | F | H | H | P21 | H | P1 | F | H |
| $L_{a2767}$ | P11 | F | H | H | P21 | H | P2 | F | H |
| $L_{a2768}$ | P11 | F | H | H | P21 | H | P3 | F | H |
| $L_{a2769}$ | P11 | F | H | H | P21 | H | P4 | F | H |
| $L_{a2770}$ | P11 | F | H | H | P21 | H | P5 | F | H |
| $L_{a2771}$ | P11 | F | H | H | P21 | H | P6 | F | H |
| $L_{a2772}$ | P11 | F | H | H | P21 | H | P7 | F | H |
| $L_{a2773}$ | P11 | F | H | H | P21 | H | P8 | F | H |
| $L_{a2774}$ | P11 | F | H | H | P21 | H | P9 | F | H |
| $L_{a2775}$ | P11 | F | H | H | P21 | H | P10 | F | H |
| $L_{a2776}$ | P11 | F | H | H | P21 | H | P11 | F | H |
| $L_{a2777}$ | P11 | F | H | H | P21 | H | P1 | P1 | H |
| $L_{a2778}$ | P11 | F | H | H | P21 | H | P2 | P2 | H |
| $L_{a2779}$ | P11 | F | H | H | P21 | D | D | D | D |
| $L_{a2780}$ | P11 | F | H | H | P21 | D | P2 | P2 | D |
| $L_{a2781}$ | P11 | F | H | H | P21 | D | F | P4 | D |
| $L_{a2782}$ | P11 | F | H | H | P21 | D | F | P5 | D |
| $L_{a2783}$ | P11 | F | H | H | P21 | D | F | P9 | D |
| $L_{a2784}$ | P11 | F | H | H | P21 | D | F | P11 | D |
| $L_{a2785}$ | P11 | F | H | H | P54 | H | H | H | H |
| $L_{a2786}$ | P11 | F | H | H | P54 | H | P1 | H | H |
| $L_{a2787}$ | P11 | F | H | H | P54 | H | P2 | H | H |
| $L_{a2788}$ | P11 | F | H | H | P54 | H | P3 | H | H |
| $L_{a2789}$ | P11 | F | H | H | P54 | H | P4 | H | H |
| $L_{a2790}$ | P11 | F | H | H | P54 | H | P5 | H | H |
| $L_{a2791}$ | P11 | F | H | H | P54 | H | P6 | H | H |
| $L_{a2792}$ | P11 | F | H | H | P54 | H | P7 | H | H |
| $L_{a2793}$ | P11 | F | H | H | P54 | H | P8 | H | H |
| $L_{a2794}$ | P11 | F | H | H | P54 | H | P9 | H | H |
| $L_{a2795}$ | P11 | F | H | H | P54 | H | P10 | H | H |
| $L_{a2796}$ | P11 | F | H | H | P54 | H | P11 | H | H |
| $L_{a2797}$ | P11 | F | H | H | P54 | H | P12 | H | H |
| $L_{a2798}$ | P11 | F | H | H | P54 | H | P13 | H | H |
| $L_{a2799}$ | P11 | F | H | H | P54 | H | P14 | H | H |
| $L_{a2800}$ | P11 | F | H | H | P54 | H | P15 | H | H |
| $L_{a2801}$ | P11 | F | H | H | P54 | H | P16 | H | H |
| $L_{a2802}$ | P11 | F | H | H | P54 | H | P17 | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a2803}$ | P11 | F | H | H | P54 | H | P18 | H | H |
| $L_{a2804}$ | P11 | F | H | H | P54 | H | P19 | H | H |
| $L_{a2805}$ | P11 | F | H | H | P54 | H | P20 | H | H |
| $L_{a2806}$ | P11 | F | H | H | P54 | H | P21 | H | H |
| $L_{a2807}$ | P11 | F | H | H | P54 | H | H | P1 | H |
| $L_{a2808}$ | P11 | F | H | H | P54 | H | H | P2 | H |
| $L_{a2809}$ | P11 | F | H | H | P54 | H | H | P3 | H |
| $L_{a2810}$ | P11 | F | H | H | P54 | H | H | P4 | H |
| $L_{a2811}$ | P11 | F | H | H | P54 | H | H | P5 | H |
| $L_{a2812}$ | P11 | F | H | H | P54 | H | H | P6 | H |
| $L_{a2813}$ | P11 | F | H | H | P54 | H | H | P7 | H |
| $L_{a2814}$ | P11 | F | H | H | P54 | H | H | P8 | H |
| $L_{a2815}$ | P11 | F | H | H | P54 | H | H | P9 | H |
| $L_{a2816}$ | P11 | F | H | H | P54 | H | H | P10 | H |
| $L_{a2817}$ | P11 | F | H | H | P54 | H | H | P11 | H |
| $L_{a2818}$ | P11 | F | H | H | P54 | H | H | P12 | H |
| $L_{a2819}$ | P11 | F | H | H | P54 | H | H | P15 | H |
| $L_{a2820}$ | P11 | F | H | H | P54 | H | H | P17 | H |
| $L_{a2821}$ | P11 | F | H | H | P54 | H | H | P18 | H |
| $L_{a2822}$ | P11 | F | H | H | P54 | H | H | P19 | H |
| $L_{a2823}$ | P11 | F | H | H | P54 | H | H | P20 | H |
| $L_{a2824}$ | P11 | F | H | H | P54 | H | H | P21 | H |
| $L_{a2825}$ | P11 | F | H | H | P54 | H | F | H | H |
| $L_{a2826}$ | P11 | F | H | H | P54 | H | F | P1 | H |
| $L_{a2827}$ | P11 | F | H | H | P54 | H | F | P2 | H |
| $L_{a2828}$ | P11 | F | H | H | P54 | H | F | P3 | H |
| $L_{a2829}$ | P11 | F | H | H | P54 | H | F | P4 | H |
| $L_{a2830}$ | P11 | F | H | H | P54 | H | F | P5 | H |
| $L_{a2831}$ | P11 | F | H | H | P54 | H | F | P6 | H |
| $L_{a2832}$ | P11 | F | H | H | P54 | H | F | P7 | H |
| $L_{a2833}$ | P11 | F | H | H | P54 | H | F | P8 | H |
| $L_{a2834}$ | P11 | F | H | H | P54 | H | F | P9 | H |
| $L_{a2835}$ | P11 | F | H | H | P54 | H | F | P10 | H |
| $L_{a2836}$ | P11 | F | H | H | P54 | H | F | P11 | H |
| $L_{a2837}$ | P11 | F | H | H | P54 | H | P1 | F | H |
| $L_{a2838}$ | P11 | F | H | H | P54 | H | P2 | F | H |
| $L_{a2839}$ | P11 | F | H | H | P54 | H | P3 | F | H |
| $L_{a2840}$ | P11 | F | H | H | P54 | H | P4 | F | H |
| $L_{a2841}$ | P11 | F | H | H | P54 | H | P5 | F | H |
| $L_{a2842}$ | P11 | F | H | H | P54 | H | P6 | F | H |
| $L_{a2843}$ | P11 | F | H | H | P54 | H | P7 | F | H |
| $L_{a2844}$ | P11 | F | H | H | P54 | H | P8 | F | H |
| $L_{a2845}$ | P11 | F | H | H | P54 | H | P9 | F | H |
| $L_{a2846}$ | P11 | F | H | H | P54 | H | P10 | F | H |
| $L_{a2847}$ | P11 | F | H | H | P54 | H | P11 | F | H |
| $L_{a2848}$ | P11 | F | H | H | P54 | H | P1 | P1 | H |
| $L_{a2849}$ | P11 | F | H | H | P54 | H | P2 | P2 | H |
| $L_{a2850}$ | P11 | F | H | H | P54 | D | D | D | D |
| $L_{a2851}$ | P11 | F | H | H | P54 | D | P2 | P2 | D |
| $L_{a2852}$ | P11 | F | H | H | P54 | D | F | P4 | D |
| $L_{a2853}$ | P11 | F | H | H | P54 | D | F | P5 | D |
| $L_{a2854}$ | P11 | F | H | H | P54 | D | F | P9 | D |
| $L_{a2855}$ | P11 | F | H | H | P54 | D | F | P11 | D |
| $L_{a2856}$ | P11 | F | H | H | P96 | H | H | H | H |
| $L_{a2857}$ | P11 | F | H | H | P96 | H | P1 | H | H |
| $L_{a2858}$ | P11 | F | H | H | P96 | H | P2 | H | H |
| $L_{a2859}$ | P11 | F | H | H | P96 | H | P3 | H | H |
| $L_{a2860}$ | P11 | F | H | H | P96 | H | P4 | H | H |
| $L_{a2861}$ | P11 | F | H | H | P96 | H | P5 | H | H |
| $L_{a2862}$ | P11 | F | H | H | P96 | H | P6 | H | H |
| $L_{a2863}$ | P11 | F | H | H | P96 | H | P7 | H | H |
| $L_{a2864}$ | P11 | F | H | H | P96 | H | P8 | H | H |
| $L_{a2865}$ | P11 | F | H | H | P96 | H | P9 | H | H |
| $L_{a2866}$ | P11 | F | H | H | P96 | H | P10 | H | H |
| $L_{a2867}$ | P11 | F | H | H | P96 | H | P11 | H | H |
| $L_{a2868}$ | P11 | F | H | H | P96 | H | P12 | H | H |
| $L_{a2869}$ | P11 | F | H | H | P96 | H | P13 | H | H |
| $L_{a2870}$ | P11 | F | H | H | P96 | H | P14 | H | H |
| $L_{a2871}$ | P11 | F | H | H | P96 | H | P15 | H | H |
| $L_{a2872}$ | P11 | F | H | H | P96 | H | P16 | H | H |
| $L_{a2873}$ | P11 | F | H | H | P96 | H | P17 | H | H |
| $L_{a2874}$ | P11 | F | H | H | P96 | H | P18 | H | H |
| $L_{a2875}$ | P11 | F | H | H | P96 | H | P19 | H | H |
| $L_{a2876}$ | P11 | F | H | H | P96 | H | P20 | H | H |
| $L_{a2877}$ | P11 | F | H | H | P96 | H | P21 | H | H |
| $L_{a2878}$ | P11 | F | H | H | P96 | H | H | P1 | H |
| $L_{a2879}$ | P11 | F | H | H | P96 | H | H | P2 | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a2880}$ | P11 | F | H | H | P96 | H | H | P3 | H |
| $L_{a2881}$ | P11 | F | H | H | P96 | H | H | P4 | H |
| $L_{a2882}$ | P11 | F | H | H | P96 | H | H | P5 | H |
| $L_{a2883}$ | P11 | F | H | H | P96 | H | H | P6 | H |
| $L_{a2884}$ | P11 | F | H | H | P96 | H | H | P7 | H |
| $L_{a2885}$ | P11 | F | H | H | P96 | H | H | P8 | H |
| $L_{a2886}$ | P11 | F | H | H | P96 | H | H | P9 | H |
| $L_{a2887}$ | P11 | F | H | H | P96 | H | H | P10 | H |
| $L_{a2888}$ | P11 | F | H | H | P96 | H | H | P11 | H |
| $L_{a2889}$ | P11 | F | H | H | P96 | H | H | P12 | H |
| $L_{a2890}$ | P11 | F | H | H | P96 | H | H | P15 | H |
| $L_{a2891}$ | P11 | F | H | H | P96 | H | H | P17 | H |
| $L_{a2892}$ | P11 | F | H | H | P96 | H | H | P18 | H |
| $L_{a2893}$ | P11 | F | H | H | P96 | H | H | P19 | H |
| $L_{a2894}$ | P11 | F | H | H | P96 | H | H | P20 | H |
| $L_{a2895}$ | P11 | F | H | H | P96 | H | H | P21 | H |
| $L_{a2896}$ | P11 | F | H | H | P96 | H | F | H | H |
| $L_{a2897}$ | P11 | F | H | H | P96 | H | F | P1 | H |
| $L_{a2898}$ | P11 | F | H | H | P96 | H | F | P2 | H |
| $L_{a2899}$ | P11 | F | H | H | P96 | H | F | P3 | H |
| $L_{a2900}$ | P11 | F | H | H | P96 | H | F | P4 | H |
| $L_{a2901}$ | P11 | F | H | H | P96 | H | F | P5 | H |
| $L_{a2902}$ | P11 | F | H | H | P96 | H | F | P6 | H |
| $L_{a2903}$ | P11 | F | H | H | P96 | H | F | P7 | H |
| $L_{a2904}$ | P11 | F | H | H | P96 | H | F | P8 | H |
| $L_{a2905}$ | P11 | F | H | H | P96 | H | F | P9 | H |
| $L_{a2906}$ | P11 | F | H | H | P96 | H | F | P10 | H |
| $L_{a2907}$ | P11 | F | H | H | P96 | H | F | P11 | H |
| $L_{a2908}$ | P11 | F | H | H | P96 | H | P1 | F | H |
| $L_{a2909}$ | P11 | F | H | H | P96 | H | P2 | F | H |
| $L_{a2910}$ | P11 | F | H | H | P96 | H | P3 | F | H |
| $L_{a2911}$ | P11 | F | H | H | P96 | H | P4 | F | H |
| $L_{a2912}$ | P11 | F | H | H | P96 | H | P5 | F | H |
| $L_{a2913}$ | P11 | F | H | H | P96 | H | P6 | F | H |
| $L_{a2914}$ | P11 | F | H | H | P96 | H | P7 | F | H |
| $L_{a2915}$ | P11 | F | H | H | P96 | H | P8 | F | H |
| $L_{a2916}$ | P11 | F | H | H | P96 | H | P9 | F | H |
| $L_{a2917}$ | P11 | F | H | H | P96 | H | P10 | F | H |
| $L_{a2918}$ | P11 | F | H | H | P96 | H | P11 | F | H |
| $L_{a2919}$ | P11 | F | H | H | P96 | H | P1 | P1 | H |
| $L_{a2920}$ | P11 | F | H | H | P96 | H | P2 | P2 | H |
| $L_{a2921}$ | P11 | F | H | H | P96 | D | D | D | D |
| $L_{a2922}$ | P11 | F | H | H | P96 | D | P2 | P2 | D |
| $L_{a2923}$ | P11 | F | H | H | P96 | D | F | P4 | D |
| $L_{a2924}$ | P11 | F | H | H | P96 | D | F | P5 | D |
| $L_{a2925}$ | P11 | F | H | H | P96 | D | F | P9 | D |
| $L_{a2926}$ | P11 | F | H | H | P96 | D | F | P11 | D |
| $L_{a2927}$ | P11 | F | H | H | P97 | H | H | H | H |
| $L_{a2928}$ | P11 | F | H | H | P97 | H | P1 | H | H |
| $L_{a2929}$ | P11 | F | H | H | P97 | H | P2 | H | H |
| $L_{a2930}$ | P11 | F | H | H | P97 | H | P3 | H | H |
| $L_{a2931}$ | P11 | F | H | H | P97 | H | P4 | H | H |
| $L_{a2932}$ | P11 | F | H | H | P97 | H | P5 | H | H |
| $L_{a2933}$ | P11 | F | H | H | P97 | H | P6 | H | H |
| $L_{a2934}$ | P11 | F | H | H | P97 | H | P7 | H | H |
| $L_{a2935}$ | P11 | F | H | H | P97 | H | P8 | H | H |
| $L_{a2936}$ | P11 | F | H | H | P97 | H | P9 | H | H |
| $L_{a2937}$ | P11 | F | H | H | P97 | H | P10 | H | H |
| $L_{a2938}$ | P11 | F | H | H | P97 | H | P11 | H | H |
| $L_{a2939}$ | P11 | F | H | H | P97 | H | P12 | H | H |
| $L_{a2940}$ | P11 | F | H | H | P97 | H | P13 | H | H |
| $L_{a2941}$ | P11 | F | H | H | P97 | H | P14 | H | H |
| $L_{a2942}$ | P11 | F | H | H | P97 | H | P15 | H | H |
| $L_{a2943}$ | P11 | F | H | H | P97 | H | P16 | H | H |
| $L_{a2944}$ | P11 | F | H | H | P97 | H | P17 | H | H |
| $L_{a2945}$ | P11 | F | H | H | P97 | H | P18 | H | H |
| $L_{a2946}$ | P11 | F | H | H | P97 | H | P19 | H | H |
| $L_{a2947}$ | P11 | F | H | H | P97 | H | P20 | H | H |
| $L_{a2948}$ | P11 | F | H | H | P97 | H | P21 | H | H |
| $L_{a2949}$ | P11 | F | H | H | P97 | H | H | P1 | H |
| $L_{a2950}$ | P11 | F | H | H | P97 | H | H | P2 | H |
| $L_{a2951}$ | P11 | F | H | H | P97 | H | H | P3 | H |
| $L_{a2952}$ | P11 | F | H | H | P97 | H | H | P4 | H |
| $L_{a2953}$ | P11 | F | H | H | P97 | H | H | P5 | H |
| $L_{a2954}$ | P11 | F | H | H | P97 | H | H | P6 | H |
| $L_{a2955}$ | P11 | F | H | H | P97 | H | H | P7 | H |
| $L_{a2956}$ | P11 | F | H | H | P97 | H | H | P8 | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a2957}$ | P11 | F | H | H | P97 | H | H | P9 | H |
| $L_{a2958}$ | P11 | F | H | H | P97 | H | H | P10 | H |
| $L_{a2959}$ | P11 | F | H | H | P97 | H | H | P11 | H |
| $L_{a2960}$ | P11 | F | H | H | P97 | H | H | P12 | H |
| $L_{a2961}$ | P11 | F | H | H | P97 | H | H | P15 | H |
| $L_{a2962}$ | P11 | F | H | H | P97 | H | H | P17 | H |
| $L_{a2963}$ | P11 | F | H | H | P97 | H | H | P18 | H |
| $L_{a2964}$ | P11 | F | H | H | P97 | H | H | P19 | H |
| $L_{a2965}$ | P11 | F | H | H | P97 | H | H | P20 | H |
| $L_{a2966}$ | P11 | F | H | H | P97 | H | H | P21 | H |
| $L_{a2967}$ | P11 | F | H | H | P97 | H | F | H | H |
| $L_{a2968}$ | P11 | F | H | H | P97 | H | F | P1 | H |
| $L_{a2969}$ | P11 | F | H | H | P97 | H | F | P2 | H |
| $L_{a2970}$ | P11 | F | H | H | P97 | H | F | P3 | H |
| $L_{a2971}$ | P11 | F | H | H | P97 | H | F | P4 | H |
| $L_{a2972}$ | P11 | F | H | H | P97 | H | F | P5 | H |
| $L_{a2973}$ | P11 | F | H | H | P97 | H | F | P6 | H |
| $L_{a2974}$ | P11 | F | H | H | P97 | H | F | P7 | H |
| $L_{a2975}$ | P11 | F | H | H | P97 | H | F | P8 | H |
| $L_{a2976}$ | P11 | F | H | H | P97 | H | F | P9 | H |
| $L_{a2977}$ | P11 | F | H | H | P97 | H | F | P10 | H |
| $L_{a2978}$ | P11 | F | H | H | P97 | H | F | P11 | H |
| $L_{a2979}$ | P11 | F | H | H | P97 | H | P1 | F | H |
| $L_{a2980}$ | P11 | F | H | H | P97 | H | P2 | F | H |
| $L_{a2981}$ | P11 | F | H | H | P97 | H | P3 | F | H |
| $L_{a2982}$ | P11 | F | H | H | P97 | H | P4 | F | H |
| $L_{a2983}$ | P11 | F | H | H | P97 | H | P5 | F | H |
| $L_{a2984}$ | P11 | F | H | H | P97 | H | P6 | F | H |
| $L_{a2985}$ | P11 | F | H | H | P97 | H | P7 | F | H |
| $L_{a2986}$ | P11 | F | H | H | P97 | H | P8 | F | H |
| $L_{a2987}$ | P11 | F | H | H | P97 | H | P9 | F | H |
| $L_{a2988}$ | P11 | F | H | H | P97 | H | P10 | F | H |
| $L_{a2989}$ | P11 | F | H | H | P97 | H | P11 | F | H |
| $L_{a2990}$ | P11 | F | H | H | P97 | H | P1 | P1 | H |
| $L_{a2991}$ | P11 | F | H | H | P97 | H | P2 | P2 | H |
| $L_{a2992}$ | P11 | F | H | H | P97 | D | D | D | D |
| $L_{a2993}$ | P11 | F | H | H | P97 | D | P2 | P2 | D |
| $L_{a2994}$ | P11 | F | H | H | P97 | D | F | P4 | D |
| $L_{a2995}$ | P11 | F | H | H | P97 | D | F | P5 | D |
| $L_{a2996}$ | P11 | F | H | H | P97 | D | F | P9 | D |
| $L_{a2997}$ | P11 | F | H | H | P97 | D | F | P11 | D |
| $L_{a2998}$ | P11 | F | H | H | P102 | H | P1 | H | H |
| $L_{a2999}$ | P11 | F | H | H | P102 | H | P2 | H | H |
| $L_{a3000}$ | P11 | F | H | H | P102 | H | P3 | H | H |
| $L_{a3001}$ | P11 | F | H | H | P102 | H | P4 | H | H |
| $L_{a3002}$ | P11 | F | H | H | P102 | H | P5 | H | H |
| $L_{a3003}$ | P11 | F | H | H | P102 | H | P6 | H | H |
| $L_{a3004}$ | P11 | F | H | H | P102 | H | P7 | H | H |
| $L_{a3005}$ | P11 | F | H | H | P102 | H | P8 | H | H |
| $L_{a3006}$ | P11 | F | H | H | P102 | H | P9 | H | H |
| $L_{a3007}$ | P11 | F | H | H | P102 | H | P10 | H | H |
| $L_{a3008}$ | P11 | F | H | H | P102 | H | P11 | H | H |
| $L_{a3009}$ | P11 | F | H | H | P102 | H | P12 | H | H |
| $L_{a3010}$ | P11 | F | H | H | P102 | H | P13 | H | H |
| $L_{a3011}$ | P11 | F | H | H | P102 | H | P14 | H | H |
| $L_{a3012}$ | P11 | F | H | H | P102 | H | P15 | H | H |
| $L_{a3013}$ | P11 | F | H | H | P102 | H | P16 | H | H |
| $L_{a3014}$ | P11 | F | H | H | P102 | H | P17 | H | H |
| $L_{a3015}$ | P11 | F | H | H | P102 | H | P18 | H | H |
| $L_{a3016}$ | P11 | F | H | H | P102 | H | P19 | H | H |
| $L_{a3017}$ | P11 | F | H | H | P102 | H | P20 | H | H |
| $L_{a3018}$ | P11 | F | H | H | P102 | H | P21 | H | H |
| $L_{a3019}$ | P11 | F | H | H | P102 | H | H | P1 | H |
| $L_{a3020}$ | P11 | F | H | H | P102 | H | H | P2 | H |
| $L_{a3021}$ | P11 | F | H | H | P102 | H | H | P3 | H |
| $L_{a3022}$ | P11 | F | H | H | P102 | H | H | P4 | H |
| $L_{a3023}$ | P11 | F | H | H | P102 | H | H | P5 | H |
| $L_{a3024}$ | P11 | F | H | H | P102 | H | H | P6 | H |
| $L_{a3025}$ | P11 | F | H | H | P102 | H | H | P7 | H |
| $L_{a3026}$ | P11 | F | H | H | P102 | H | H | P8 | H |
| $L_{a3027}$ | P11 | F | H | H | P102 | H | H | P9 | H |
| $L_{a3028}$ | P11 | F | H | H | P102 | H | H | P10 | H |
| $L_{a3029}$ | P11 | F | H | H | P102 | H | H | P11 | H |
| $L_{a3030}$ | P11 | F | H | H | P102 | H | H | P12 | H |
| $L_{a3031}$ | P11 | F | H | H | P102 | H | H | P15 | H |
| $L_{a3032}$ | P11 | F | H | H | P102 | H | H | P17 | H |
| $L_{a3033}$ | P11 | F | H | H | P102 | H | H | P18 | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a3034}$ | P11 | F | H | H | P102 | H | H | P19 | H |
| $L_{a3035}$ | P11 | F | H | H | P102 | H | H | P20 | H |
| $L_{a3036}$ | P11 | F | H | H | P102 | H | H | P21 | H |
| $L_{a3037}$ | P11 | F | H | H | P102 | H | F | H | H |
| $L_{a3038}$ | P11 | F | H | H | P102 | H | F | P1 | H |
| $L_{a3039}$ | P11 | F | H | H | P102 | H | F | P2 | H |
| $L_{a3040}$ | P11 | F | H | H | P102 | H | F | P3 | H |
| $L_{a3041}$ | P11 | F | H | H | P102 | H | F | P4 | H |
| $L_{a3042}$ | P11 | F | H | H | P102 | H | F | P5 | H |
| $L_{a3043}$ | P11 | F | H | H | P102 | H | F | P6 | H |
| $L_{a3044}$ | P11 | F | H | H | P102 | H | F | P7 | H |
| $L_{a3045}$ | P11 | F | H | H | P102 | H | F | P8 | H |
| $L_{a3046}$ | P11 | F | H | H | P102 | H | F | P9 | H |
| $L_{a3047}$ | P11 | F | H | H | P102 | H | F | P10 | H |
| $L_{a3048}$ | P11 | F | H | H | P102 | H | F | P11 | H |
| $L_{a3049}$ | P11 | F | H | H | P102 | H | P1 | F | H |
| $L_{a3050}$ | P11 | F | H | H | P102 | H | P2 | F | H |
| $L_{a3051}$ | P11 | F | H | H | P102 | H | P3 | F | H |
| $L_{a3052}$ | P11 | F | H | H | P102 | H | P4 | F | H |
| $L_{a3053}$ | P11 | F | H | H | P102 | H | P5 | | H |
| $L_{a3054}$ | P11 | F | H | H | P102 | H | P6 | F | H |
| $L_{a3055}$ | P11 | F | H | H | P102 | H | P7 | F | H |
| $L_{a3056}$ | P11 | F | H | H | P102 | H | P8 | F | H |
| $L_{a3057}$ | P11 | F | H | H | P102 | H | P9 | F | H |
| $L_{a3058}$ | P11 | F | H | H | P102 | H | P10 | F | H |
| $L_{a3059}$ | P11 | F | H | H | P102 | H | P11 | F | H |
| $L_{a3060}$ | P11 | F | H | H | P102 | H | P1 | P1 | H |
| $L_{a3061}$ | P11 | F | H | H | P102 | H | P2 | P2 | H |
| $L_{a3062}$ | P11 | F | H | H | P102 | D | D | D | D |
| $L_{a3063}$ | P11 | F | H | H | P102 | D | P2 | P2 | D |
| $L_{a3064}$ | P11 | F | H | H | P102 | D | F | P4 | D |
| $L_{a3065}$ | P11 | F | H | H | P102 | D | F | P5 | D |
| $L_{a3066}$ | P11 | F | H | H | P102 | D | F | P9 | D |
| $L_{a3067}$ | P11 | F | H | H | P102 | D | F | P11 | D |
| $L_{a3068}$ | P11 | F | H | H | P103 | H | P1 | H | H |
| $L_{a3069}$ | P11 | F | H | H | P103 | H | P2 | H | H |
| $L_{a3070}$ | P11 | F | H | H | P103 | H | P3 | H | H |
| $L_{a3071}$ | P11 | F | H | H | P103 | H | P4 | H | H |
| $L_{a3072}$ | P11 | F | H | H | P103 | H | P5 | H | H |
| $L_{a3073}$ | P11 | F | H | H | P103 | H | P6 | H | H |
| $L_{a3074}$ | P11 | F | H | H | P103 | H | P7 | H | H |
| $L_{a3075}$ | P11 | F | H | H | P103 | H | P8 | H | H |
| $L_{a3076}$ | P11 | F | H | H | P103 | H | P9 | H | H |
| $L_{a3077}$ | P11 | F | H | H | P103 | H | P10 | H | H |
| $L_{a3078}$ | P11 | F | H | H | P103 | H | P11 | H | H |
| $L_{a3079}$ | P11 | F | H | H | P103 | H | P12 | H | H |
| $L_{a3080}$ | P11 | F | H | H | P103 | H | P13 | H | H |
| $L_{a3081}$ | P11 | F | H | H | P103 | H | P14 | H | H |
| $L_{a3082}$ | P11 | F | H | H | P103 | H | P15 | H | H |
| $L_{a3083}$ | P11 | F | H | H | P103 | H | P16 | H | H |
| $L_{a3084}$ | P11 | F | H | H | P103 | H | P17 | H | H |
| $L_{a3085}$ | P11 | F | H | H | P103 | H | P18 | H | H |
| $L_{a3086}$ | P11 | F | H | H | P103 | H | P19 | H | H |
| $L_{a3087}$ | P11 | F | H | H | P103 | H | P20 | H | H |
| $L_{a3088}$ | P11 | F | H | H | P103 | H | P21 | H | H |
| $L_{a3089}$ | P11 | F | H | H | P103 | H | H | P1 | H |
| $L_{a3090}$ | P11 | F | H | H | P103 | H | H | P2 | H |
| $L_{a3091}$ | P11 | F | H | H | P103 | H | H | P3 | H |
| $L_{a3092}$ | P11 | F | H | H | P103 | H | H | P4 | H |
| $L_{a3093}$ | P11 | F | H | H | P103 | H | H | P5 | H |
| $L_{a3094}$ | P11 | F | H | H | P103 | H | H | P6 | H |
| $L_{a3095}$ | P11 | F | H | H | P103 | H | H | P7 | H |
| $L_{a3096}$ | P11 | F | H | H | P103 | H | H | P8 | H |
| $L_{a3097}$ | P11 | F | H | H | P103 | H | H | P9 | H |
| $L_{a3098}$ | P11 | F | H | H | P103 | H | H | P10 | H |
| $L_{a3099}$ | P11 | F | H | H | P103 | H | H | P11 | H |
| $L_{a3100}$ | P11 | F | H | H | P103 | H | H | P12 | H |
| $L_{a3101}$ | P11 | F | H | H | P103 | H | H | P15 | H |
| $L_{a3102}$ | P11 | F | H | H | P103 | H | H | P17 | H |
| $L_{a3103}$ | P11 | F | H | H | P103 | H | H | P18 | H |
| $L_{a3104}$ | P11 | F | H | H | P103 | H | H | P19 | H |
| $L_{a3105}$ | P11 | F | H | H | P103 | H | H | P20 | H |
| $L_{a3106}$ | P11 | F | H | H | P103 | H | H | P21 | H |
| $L_{a3107}$ | P11 | F | H | H | P103 | H | F | H | H |
| $L_{a3108}$ | P11 | F | H | H | P103 | H | F | P1 | H |
| $L_{a3109}$ | P11 | F | H | H | P103 | H | F | P2 | H |
| $L_{a3110}$ | P11 | F | H | H | P103 | H | F | P3 | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a3111}$ | P11 | F | H | H | P103 | H | F | P4 | H |
| $L_{a3112}$ | P11 | F | H | H | P103 | H | F | P5 | H |
| $L_{a3113}$ | P11 | F | H | H | P103 | H | F | P6 | H |
| $L_{a3114}$ | P11 | F | H | H | P103 | H | F | P7 | H |
| $L_{a3115}$ | P11 | F | H | H | P103 | H | F | P8 | H |
| $L_{a3116}$ | P11 | F | H | H | P103 | H | F | P9 | H |
| $L_{a3117}$ | P11 | F | H | H | P103 | H | F | P10 | H |
| $L_{a3118}$ | P11 | F | H | H | P103 | H | F | P11 | H |
| $L_{a3119}$ | P11 | F | H | H | P103 | H | P1 | F | H |
| $L_{a3120}$ | P11 | F | H | H | P103 | H | P2 | F | H |
| $L_{a3121}$ | P11 | F | H | H | P103 | H | P3 | F | H |
| $L_{a3122}$ | P11 | F | H | H | P103 | H | P4 | F | H |
| $L_{a3123}$ | P11 | F | H | H | P103 | H | P5 | F | H |
| $L_{a3124}$ | P11 | F | H | H | P103 | H | P6 | F | H |
| $L_{a3125}$ | P11 | F | H | H | P103 | H | P7 | F | H |
| $L_{a3126}$ | P11 | F | H | H | P103 | H | P8 | F | H |
| $L_{a3127}$ | P11 | F | H | H | P103 | H | P9 | F | H |
| $L_{a3128}$ | P11 | F | H | H | P103 | H | P10 | F | H |
| $L_{a3129}$ | P11 | F | H | H | P103 | H | P11 | F | H |
| $L_{a3130}$ | P11 | F | H | H | P103 | H | P1 | P1 | H |
| $L_{a3131}$ | P11 | F | H | H | P103 | H | P2 | P2 | H |
| $L_{a3132}$ | P11 | F | H | H | P103 | D | D | D | D |
| $L_{a3133}$ | P11 | F | H | H | P103 | D | P2 | P2 | D |
| $L_{a3134}$ | P11 | F | H | H | P103 | D | F | P4 | D |
| $L_{a3135}$ | P11 | F | H | H | P103 | D | F | P5 | D |
| $L_{a3136}$ | P11 | F | H | H | P103 | D | F | P9 | D |
| $L_{a3137}$ | P11 | F | H | H | P103 | D | F | P11 | D |
| $L_{a3138}$ | P11 | F | H | H | H | H | P20 | P1 | H |
| $L_{a3139}$ | P11 | F | H | H | H | H | P21 | P2 | H |
| $L_{a3140}$ | P11 | F | H | H | H | H | P29 | H | H |
| $L_{a3141}$ | P11 | F | H | H | H | H | P29 | P1 | H |
| $L_{a3142}$ | P11 | F | H | H | H | H | P54 | H | H |
| $L_{a3143}$ | P11 | F | H | H | H | H | P96 | H | H |
| $L_{a3144}$ | P11 | F | H | H | H | H | P97 | H | H |
| $L_{a3145}$ | P11 | F | H | H | H | H | P96 | P1 | H |
| $L_{a3146}$ | P11 | F | H | H | H | H | P97 | P1 | H |
| $L_{a3147}$ | P11 | F | H | H | H | H | P102 | H | H |
| $L_{a3148}$ | P11 | F | H | H | H | H | P103 | H | H |
| $L_{a3149}$ | P11 | F | H | H | D | H | P20 | P1 | H |
| $L_{a3150}$ | P11 | F | H | H | D | H | P21 | P2 | H |
| $L_{a3151}$ | P11 | F | H | H | D | H | P29 | H | H |
| $L_{a3152}$ | P11 | F | H | H | D | H | P29 | P1 | H |
| $L_{a3153}$ | P11 | F | H | H | D | H | P54 | H | H |
| $L_{a3154}$ | P11 | F | H | H | D | H | P96 | H | H |
| $L_{a3155}$ | P11 | F | H | H | D | H | P97 | H | H |
| $L_{a3156}$ | P11 | F | H | H | D | H | P96 | P1 | H |
| $L_{a3157}$ | P11 | F | H | H | D | H | P97 | P1 | H |
| $L_{a3158}$ | P11 | F | H | H | D | H | P102 | H | H |
| $L_{a3159}$ | P11 | F | H | H | D | H | P103 | H | H |
| $L_{a3160}$ | P11 | F | H | H | P20 | H | P20 | P1 | H |
| $L_{a3161}$ | P11 | F | H | H | P20 | H | P21 | P2 | H |
| $L_{a3162}$ | P11 | F | H | H | P20 | H | P29 | H | H |
| $L_{a3163}$ | P11 | F | H | H | P20 | H | P29 | P1 | H |
| $L_{a3164}$ | P11 | F | H | H | P20 | H | P54 | H | H |
| $L_{a3165}$ | P11 | F | H | H | P20 | H | P96 | H | H |
| $L_{a3166}$ | P11 | F | H | H | P20 | H | P97 | H | H |
| $L_{a3167}$ | P11 | F | H | H | P20 | H | P96 | P1 | H |
| $L_{a3168}$ | P11 | F | H | H | P20 | H | P97 | P1 | H |
| $L_{a3169}$ | P11 | F | H | H | P20 | H | P102 | H | H |
| $L_{a3170}$ | P11 | F | H | H | P20 | H | P103 | H | H |
| $L_{a3171}$ | P11 | F | H | H | P21 | H | P20 | P1 | H |
| $L_{a3172}$ | P11 | F | H | H | P21 | H | P21 | P2 | H |
| $L_{a3173}$ | P11 | F | H | H | P21 | H | P29 | H | H |
| $L_{a3174}$ | P11 | F | H | H | P21 | H | P29 | P1 | H |
| $L_{a3175}$ | P11 | F | H | H | P21 | H | P54 | H | H |
| $L_{a3176}$ | P11 | F | H | H | P21 | H | P96 | H | H |
| $L_{a3177}$ | P11 | F | H | H | P21 | H | P97 | H | H |
| $L_{a3178}$ | P11 | F | H | H | P21 | H | P96 | P1 | H |
| $L_{a3179}$ | P11 | F | H | H | P21 | H | P97 | P1 | H |
| $L_{a3180}$ | P11 | F | H | H | P21 | H | P102 | H | H |
| $L_{a3181}$ | P11 | F | H | H | P21 | H | P103 | H | H |
| $L_{a3182}$ | P11 | F | H | H | P22 | H | H | H | H |
| $L_{a3183}$ | P11 | F | H | H | P23 | H | H | H | H |
| $L_{a3184}$ | P11 | F | H | H | P24 | H | H | H | H |
| $L_{a3185}$ | P11 | F | H | H | P25 | H | H | H | H |
| $L_{a3186}$ | P11 | F | H | H | P26 | H | H | H | H |
| $L_{a3187}$ | P11 | F | H | H | P27 | H | H | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a3188}$ | P11 | F | H | H | P28 | H | H | H | H |
| $L_{a3189}$ | P11 | F | H | H | P29 | H | H | H | H |
| $L_{a3190}$ | P11 | F | H | H | P30 | H | H | H | H |
| $L_{a3191}$ | P11 | F | H | H | P31 | H | H | H | H |
| $L_{a3192}$ | P11 | F | H | H | P32 | H | H | H | H |
| $L_{a3193}$ | P11 | F | H | H | P33 | H | H | H | H |
| $L_{a3194}$ | P11 | F | H | H | P34 | H | H | H | H |
| $L_{a3195}$ | P11 | F | H | H | P35 | H | H | H | H |
| $L_{a3196}$ | P11 | F | H | H | P36 | H | H | H | H |
| $L_{a3197}$ | P11 | F | H | H | P37 | H | H | H | H |
| $L_{a3198}$ | P11 | F | H | H | P38 | H | H | H | H |
| $L_{a3199}$ | P11 | F | H | H | P39 | H | H | H | H |
| $L_{a3200}$ | P11 | F | H | H | P40 | H | H | H | H |
| $L_{a3201}$ | P11 | F | H | H | P41 | H | H | H | H |
| $L_{a3202}$ | P11 | F | H | H | P42 | H | H | H | H |
| $L_{a3203}$ | P11 | F | H | H | P43 | H | H | H | H |
| $L_{a3204}$ | P11 | F | H | H | P44 | H | H | H | H |
| $L_{a3205}$ | P11 | F | H | H | P45 | H | H | H | H |
| $L_{a3206}$ | P11 | F | H | H | P46 | H | H | H | H |
| $L_{a3207}$ | P11 | F | H | H | P47 | H | H | H | H |
| $L_{a3208}$ | P11 | F | H | H | P48 | H | H | H | H |
| $L_{a3209}$ | P11 | F | H | H | P49 | H | H | H | H |
| $L_{a3210}$ | P11 | F | H | H | P50 | H | H | H | H |
| $L_{a3211}$ | P11 | F | H | H | P51 | H | H | H | H |
| $L_{a3212}$ | P11 | F | H | H | P52 | H | H | H | H |
| $L_{a3213}$ | P11 | F | H | H | P53 | H | H | H | H |
| $L_{a3214}$ | P11 | F | H | H | P55 | H | H | H | H |
| $L_{a3215}$ | P11 | F | H | H | P56 | H | H | H | H |
| $L_{a3216}$ | P11 | F | H | H | P57 | H | H | H | H |
| $L_{a3217}$ | P11 | F | H | H | P58 | H | H | H | H |
| $L_{a3218}$ | P11 | F | H | H | P59 | H | H | H | H |
| $L_{a3219}$ | P11 | F | H | H | P60 | H | H | H | H |
| $L_{a3220}$ | P11 | F | H | H | P61 | H | H | H | H |
| $L_{a3221}$ | P11 | F | H | H | P62 | H | H | H | H |
| $L_{a3222}$ | P11 | F | H | H | P63 | H | H | H | H |
| $L_{a3223}$ | P11 | F | H | H | P64 | H | H | H | H |
| $L_{a3224}$ | P11 | F | H | H | P65 | H | H | H | H |
| $L_{a3225}$ | P11 | F | H | H | P66 | H | H | H | H |
| $L_{a3226}$ | P11 | F | H | H | P67 | H | H | H | H |
| $L_{a3227}$ | P11 | F | H | H | P68 | H | H | H | H |
| $L_{a3228}$ | P11 | F | H | H | P69 | H | H | H | H |
| $L_{a3229}$ | P11 | F | H | H | P70 | H | H | H | H |
| $L_{a3230}$ | P11 | F | H | H | P71 | H | H | H | H |
| $L_{a3231}$ | P11 | F | H | H | P72 | H | H | H | H |
| $L_{a3232}$ | P11 | F | H | H | P73 | H | H | H | H |
| $L_{a3233}$ | P11 | F | H | H | P74 | H | H | H | H |
| $L_{a3234}$ | P11 | F | H | H | P75 | H | H | H | H |
| $L_{a3235}$ | P11 | F | H | H | P76 | H | H | H | H |
| $L_{a3236}$ | P11 | F | H | H | P77 | H | H | H | H |
| $L_{a3237}$ | P11 | F | H | H | P78 | H | H | H | H |
| $L_{a3238}$ | P11 | F | H | H | P79 | H | H | H | H |
| $L_{a3239}$ | P11 | F | H | H | P80 | H | H | H | H |
| $L_{a3240}$ | P11 | F | H | H | P81 | H | H | H | H |
| $L_{a3241}$ | P11 | F | H | H | P82 | H | H | H | H |
| $L_{a3242}$ | P11 | F | H | H | P83 | H | H | H | H |
| $L_{a3243}$ | P11 | F | H | H | P84 | H | H | H | H |
| $L_{a3244}$ | P11 | F | H | H | P85 | H | H | H | H |
| $L_{a3245}$ | P11 | F | H | H | P86 | H | H | H | H |
| $L_{a3246}$ | P11 | F | H | H | P87 | H | H | H | H |
| $L_{a3247}$ | P11 | F | H | H | P88 | H | H | H | H |
| $L_{a3248}$ | P11 | F | H | H | P89 | H | H | H | H |
| $L_{a3249}$ | P11 | F | H | H | P90 | H | H | H | H |
| $L_{a3250}$ | P11 | F | H | H | P91 | H | H | H | H |
| $L_{a3251}$ | P11 | F | H | H | P92 | H | H | H | H |
| $L_{a3252}$ | P11 | F | H | H | P93 | H | H | H | H |
| $L_{a3253}$ | P11 | F | H | H | P94 | H | H | H | H |
| $L_{a3254}$ | P11 | F | H | H | P95 | H | H | H | H |
| $L_{a3255}$ | P11 | F | H | H | P98 | H | H | H | H |
| $L_{a3256}$ | P11 | F | H | H | P99 | H | H | H | H |
| $L_{a3257}$ | P11 | F | H | H | P100 | H | H | H | H |
| $L_{a3258}$ | P11 | F | H | H | P101 | H | H | H | H |
| $L_{a3259}$ | P11 | F | H | H | P102 | H | H | H | H |
| $L_{a3260}$ | P11 | F | H | H | P103 | H | H | H | H |
| $L_{a3261}$ | P11 | F | H | H | P104 | H | H | H | H |
| $L_{a3262}$ | P11 | F | H | H | P105 | H | H | H | H |
| $L_{a3263}$ | P11 | F | H | H | P106 | H | H | H | H |
| $L_{a3264}$ | P11 | F | H | H | P107 | H | H | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a3265}$ | P11 | F | H | H | P108 | H | H | H | H |
| $L_{a3266}$ | P11 | F | H | H | P109 | H | H | H | H |
| $L_{a3267}$ | P11 | F | H | H | P110 | H | H | H | H |
| $L_{a3268}$ | P11 | F | H | H | P111 | H | H | H | H |
| $L_{a3269}$ | P11 | F | H | H | P112 | H | H | H | H |
| $L_{a3270}$ | P11 | F | H | H | P113 | H | H | H | H |
| $L_{a3271}$ | P11 | F | H | H | P114 | H | H | H | H |
| $L_{a3272}$ | P11 | F | H | H | P115 | H | H | H | H |
| $L_{a3273}$ | P11 | F | H | H | P116 | H | H | H | H |
| $L_{a3274}$ | P11 | F | H | H | P117 | H | H | H | H |
| $L_{a3275}$ | P11 | F | H | H | P118 | H | H | H | H |
| $L_{a3276}$ | P11 | F | H | H | P119 | H | H | H | H |
| $L_{a3277}$ | P11 | F | H | H | P120 | H | H | H | H |
| $L_{a3278}$ | P11 | F | H | H | P121 | H | H | H | H |
| $L_{a3279}$ | P11 | F | H | H | P122 | H | H | H | H |
| $L_{a3280}$ | P11 | F | H | H | P123 | H | H | H | H |
| $L_{a3281}$ | P11 | F | H | H | P124 | H | H | H | H |
| $L_{a3282}$ | P11 | F | H | H | P125 | H | H | H | H |
| $L_{a3283}$ | P11 | F | H | H | P126 | H | H | H | H |
| $L_{a3284}$ | P11 | F | H | H | P127 | H | H | H | H |
| $L_{a3285}$ | P11 | F | H | H | P128 | H | H | H | H |
| $L_{a3286}$ | P11 | F | H | H | P129 | H | H | H | H |
| $L_{a3287}$ | P11 | F | H | H | P130 | H | H | H | H |
| $L_{a3288}$ | P11 | F | H | H | P131 | H | H | H | H |
| $L_{a3289}$ | P11 | F | H | H | P132 | H | H | H | H |
| $L_{a3290}$ | P11 | F | H | H | P133 | H | H | H | H |
| $L_{a3291}$ | P11 | F | H | H | P134 | H | H | H | H |
| $L_{a3292}$ | P11 | F | H | H | P135 | H | H | H | H |
| $L_{a3293}$ | P11 | F | H | H | P136 | H | H | H | H |
| $L_{a3294}$ | P11 | F | H | H | P137 | H | H | H | H |
| $L_{a3295}$ | P11 | F | H | H | P138 | H | H | H | H |
| $L_{a3296}$ | P11 | F | H | H | P139 | H | H | H | H |
| $L_{a3297}$ | P11 | F | H | H | P140 | H | H | H | H |
| $L_{a3298}$ | P11 | F | H | H | P141 | H | H | H | H |
| $L_{a3299}$ | P11 | F | H | H | P142 | H | H | H | H |
| $L_{a3300}$ | P11 | F | H | H | P143 | H | H | H | H |
| $L_{a3301}$ | P11 | F | H | H | P144 | H | H | H | H |
| $L_{a3302}$ | P11 | F | H | H | P145 | H | H | H | H |
| $L_{a3303}$ | P11 | F | H | H | P146 | H | H | H | H |
| $L_{a3304}$ | P11 | F | H | H | P147 | H | H | H | H |
| $L_{a3305}$ | P11 | F | H | H | P148 | H | H | H | H |
| $L_{a3306}$ | P11 | F | H | H | P149 | H | H | H | H |
| $L_{a3307}$ | P11 | F | H | H | P150 | H | H | H | H |
| $L_{a3308}$ | P11 | F | H | H | P151 | H | H | H | H |
| $L_{a3309}$ | P11 | F | H | P18 | H | H | H | H | H |
| $L_{a3310}$ | P11 | F | H | P18 | D | H | H | H | H |
| $L_{a3311}$ | P11 | F | H | P18 | P20 | H | H | H | H |
| $L_{a3312}$ | P11 | F | H | P19 | H | H | H | H | H |
| $L_{a3313}$ | P11 | F | H | P19 | D | H | H | H | H |
| $L_{a3314}$ | P11 | F | H | P19 | P20 | H | H | H | H |
| $L_{a3315}$ | P11 | F | H | P20 | H | H | H | H | H |
| $L_{a3316}$ | P11 | F | H | P20 | D | H | H | H | H |
| $L_{a3317}$ | P11 | F | H | P20 | H | H | P1 | H | H |
| $L_{a3318}$ | P11 | F | H | P20 | D | H | P2 | H | H |
| $L_{a3319}$ | P11 | F | H | P20 | H | H | H | P1 | H |
| $L_{a3320}$ | P11 | F | H | P20 | D | H | H | P2 | H |
| $L_{a3321}$ | P11 | F | H | P20 | H | H | P1 | P1 | H |
| $L_{a3322}$ | P11 | F | H | P20 | D | H | P2 | P2 | H |
| $L_{a3323}$ | P11 | F | H | P20 | H | H | P3 | H | H |
| $L_{a3324}$ | P11 | F | H | P20 | D | H | P4 | H | H |
| $L_{a3325}$ | P11 | F | H | P20 | H | H | P5 | H | H |
| $L_{a3326}$ | P11 | F | H | P21 | H | H | H | H | H |
| $L_{a3327}$ | P11 | F | H | P21 | D | H | H | H | H |
| $L_{a3328}$ | P11 | F | H | P21 | H | H | P1 | H | H |
| $L_{a3329}$ | P11 | F | H | P21 | D | H | P2 | H | H |
| $L_{a3330}$ | P11 | F | H | P21 | H | H | H | P1 | H |
| $L_{a3331}$ | P11 | F | H | P21 | D | H | H | P2 | H |
| $L_{a3332}$ | P11 | F | H | P21 | H | H | P1 | P1 | H |
| $L_{a3333}$ | P11 | F | H | P21 | D | H | P2 | P2 | H |
| $L_{a3334}$ | P11 | F | H | P21 | H | H | P3 | H | H |
| $L_{a3335}$ | P11 | F | H | P21 | D | H | P4 | H | H |
| $L_{a3336}$ | P11 | F | H | P21 | H | H | P5 | H | H |
| $L_{a3337}$ | P10 | F | H | H | H | H | H | H | H |
| $L_{a3338}$ | P10 | F | H | H | D | H | H | H | H |
| $L_{a3339}$ | P10 | F | H | H | P20 | H | H | H | H |
| $L_{a3340}$ | P10 | F | H | H | P21 | H | H | H | H |
| $L_{a3341}$ | P10 | F | H | H | P54 | H | H | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a3342}$ | P10 | F | H | H | P55 | H | H | H | H |
| $L_{a3343}$ | P10 | F | H | H | P56 | H | H | H | H |
| $L_{a3344}$ | P10 | F | H | H | P57 | H | H | H | H |
| $L_{a3345}$ | P10 | F | H | H | P20 | H | P1 | H | H |
| $L_{a3346}$ | P10 | F | H | H | P20 | H | P3 | H | H |
| $L_{a3347}$ | P10 | F | H | H | P20 | H | P4 | H | H |
| $L_{a3348}$ | P10 | F | H | H | P20 | H | P6 | H | H |
| $L_{a3349}$ | P10 | F | H | H | P20 | H | P8 | H | H |
| $L_{a3350}$ | P10 | F | H | H | P20 | H | P10 | H | H |
| $L_{a3351}$ | P10 | F | H | H | P20 | H | P1 | F | H |
| $L_{a3352}$ | P10 | F | H | H | P20 | H | P2 | F | H |
| $L_{a3353}$ | P10 | F | H | H | P20 | H | P10 | F | H |
| $L_{a3354}$ | P10 | F | H | H | P20 | H | F | P1 | H |
| $L_{a3355}$ | P10 | F | H | H | P20 | H | F | P2 | H |
| $L_{a3356}$ | P10 | F | H | H | P20 | H | F | P10 | H |
| $L_{a3357}$ | P10 | F | H | H | P21 | H | P2 | P2 | H |
| $L_{a3358}$ | P10 | F | H | H | P21 | H | P5 | H | H |
| $L_{a3359}$ | P10 | F | H | H | P21 | H | P9 | H | H |
| $L_{a3360}$ | P10 | F | H | H | P21 | H | P11 | H | H |
| $L_{a3361}$ | P10 | F | H | H | P21 | H | P1 | F | H |
| $L_{a3362}$ | P10 | F | H | H | P21 | H | P2 | F | H |
| $L_{a3363}$ | P10 | F | H | H | P21 | H | P11 | F | H |
| $L_{a3364}$ | P10 | F | H | H | P21 | H | F | P1 | H |
| $L_{a3365}$ | P10 | F | H | H | P21 | H | F | P2 | H |
| $L_{a3366}$ | P10 | F | H | H | P21 | H | F | P11 | H |
| $L_{a3367}$ | P6 | CN | F | H | H | H | H | H | H |
| $L_{a3368}$ | P6 | CN | F | H | D | H | H | H | H |
| $L_{a3369}$ | P6 | CN | F | H | P20 | H | H | H | H |
| $L_{a3370}$ | P6 | CN | F | H | P21 | H | H | H | H |
| $L_{a3371}$ | P6 | CN | F | H | P54 | H | H | H | H |
| $L_{a3372}$ | P6 | CN | F | H | P96 | H | H | H | H |
| $L_{a3373}$ | P6 | CN | F | H | P97 | H | H | H | H |
| $L_{a3374}$ | P6 | CN | F | H | P103 | H | H | H | H |
| $L_{a3375}$ | P11 | CN | F | H | H | H | H | H | H |
| $L_{a3376}$ | P11 | CN | F | H | D | H | H | H | H |
| $L_{a3377}$ | P11 | CN | F | H | P20 | H | H | H | H |
| $L_{a3378}$ | P11 | CN | F | H | P21 | H | H | H | H |
| $L_{a3379}$ | P11 | CN | F | H | P54 | H | H | H | H |
| $L_{a3380}$ | P11 | CN | F | H | P96 | H | H | H | H |
| $L_{a3381}$ | P11 | CN | F | H | P97 | H | H | H | H |
| $L_{a3382}$ | P11 | CN | F | H | P103 | H | H | H | H |
| $L_{a3383}$ | P152 | CN | H | H | H | H | H | H | H |
| $L_{a3384}$ | P153 | CN | H | H | H | H | H | H | H |
| $L_{a3385}$ | P154 | CN | H | H | H | H | H | H | H |
| $L_{a3386}$ | P155 | CN | H | H | H | H | H | H | H |
| $L_{a3387}$ | P156 | CN | H | H | H | H | H | H | H |
| $L_{a3388}$ | P157 | CN | H | H | H | H | H | H | H |
| $L_{a3389}$ | P158 | CN | H | H | H | H | H | H | H |
| $L_{a3390}$ | P159 | CN | H | H | H | H | H | H | H |
| $L_{a3391}$ | P160 | CN | H | H | H | H | H | H | H |
| $L_{a3392}$ | P161 | CN | H | H | H | H | H | H | H |
| $L_{a3393}$ | P162 | CN | H | H | H | H | H | H | H |
| $L_{a3394}$ | P163 | CN | H | H | H | H | H | H | H |
| $L_{a3395}$ | P164 | CN | H | H | H | H | H | H | H |
| $L_{a3396}$ | P165 | CN | H | H | H | H | H | H | H |
| $L_{a3397}$ | P166 | CN | H | H | H | H | H | H | H |
| $L_{a3398}$ | P152 | CN | H | H | P20 | H | H | H | H |
| $L_{a3399}$ | P153 | CN | H | H | P20 | H | H | H | H |
| $L_{a3400}$ | P154 | CN | H | H | P20 | H | H | H | H |
| $L_{a3401}$ | P155 | CN | H | H | P20 | H | H | H | H |
| $L_{a3402}$ | P156 | CN | H | H | P20 | H | H | H | H |
| $L_{a3403}$ | P157 | CN | H | H | P20 | H | H | H | H |
| $L_{a3404}$ | P158 | CN | H | H | P20 | H | H | H | H |
| $L_{a3405}$ | P159 | CN | H | H | P20 | H | H | H | H |
| $L_{a3406}$ | P160 | CN | H | H | P20 | H | H | H | H |
| $L_{a3407}$ | P161 | CN | H | H | P20 | H | H | H | H |
| $L_{a3408}$ | P29 | CN | H | H | H | H | H | H | H |
| $L_{a3409}$ | P30 | CN | H | H | H | H | H | H | H |
| $L_{a3410}$ | P31 | CN | H | H | H | H | H | H | H |
| $L_{a3411}$ | P165 | CN | H | H | P20 | H | H | H | H |
| $L_{a3412}$ | P166 | CN | H | H | P20 | H | H | H | H |
| $L_{a3413}$ | P152 | CN | H | H | P21 | H | H | H | H |
| $L_{a3414}$ | P153 | CN | H | H | P21 | H | H | H | H |
| $L_{a3415}$ | P154 | CN | H | H | P21 | H | H | H | H |
| $L_{a3416}$ | P155 | CN | H | H | P21 | H | H | H | H |
| $L_{a3417}$ | P156 | CN | H | H | P21 | H | H | H | H |
| $L_{a3418}$ | P157 | CN | H | H | P21 | H | H | H | H |

-continued

| $L_a$ No. | $R_n$ | $R_1$ | $Rx_4$ | $Rx_5$ | $Rx_6$ | $R^1$ | $R^2$ | $R^3$ | $R^4$ |
|---|---|---|---|---|---|---|---|---|---|
| $L_{a3419}$ | P158 | CN | H | H | P21 | H | H | H | H |
| $L_{a3420}$ | P159 | CN | H | H | P21 | H | H | H | H |
| $L_{a3421}$ | P160 | CN | H | H | P21 | H | H | H | H |
| $L_{a3422}$ | P161 | CN | H | H | P21 | H | H | H | H |
| $L_{a3423}$ | P29 | CN | H | H | P21 | H | H | H | H |
| $L_{a3424}$ | P30 | CN | H | H | P21 | H | H | H | H |
| $L_{a3425}$ | P31 | CN | H | H | P21 | H | H | H | H |
| $L_{a3426}$ | P165 | CN | H | H | P21 | H | H | H | H |
| $L_{a3427}$ | P166 | CN | H | H | P21 | H | H | H | H |
| $L_{a3428}$ | P152 | CN | H | H | P54 | H | H | H | H |
| $L_{a3429}$ | P153 | CN | H | H | P54 | H | H | H | H |
| $L_{a3430}$ | P154 | CN | H | H | P54 | H | H | H | H |
| $L_{a3431}$ | P155 | CN | H | H | P54 | H | H | H | H |
| $L_{a3432}$ | P156 | CN | H | H | P54 | H | H | H | H |
| $L_{a3433}$ | P157 | CN | H | H | P54 | H | H | H | H |
| $L_{a3434}$ | P158 | CN | H | H | P54 | H | H | H | H |
| $L_{a3435}$ | P159 | CN | H | H | P54 | H | H | H | H |
| $L_{a3436}$ | P160 | CN | H | H | P54 | H | H | H | H |
| $L_{a3437}$ | P161 | CN | H | H | P54 | H | H | H | H |
| $L_{a3438}$ | P29 | CN | H | H | P54 | H | H | H | H |
| $L_{a3439}$ | P30 | CN | H | H | P54 | H | H | H | H |
| $L_{a3440}$ | P31 | CN | H | H | P54 | H | H | H | H |
| $L_{a3441}$ | P165 | CN | H | H | P54 | H | H | H | H |
| $L_{a3442}$ | P166 | CN | H | H | P54 | H | H | H | H |
| $L_{a3443}$ | P152 | CN | H | H | P96 | H | H | H | H |
| $L_{a3444}$ | P153 | CN | H | H | P96 | H | H | H | H |
| $L_{a3445}$ | P154 | CN | H | H | P96 | H | H | H | H |
| $L_{a3446}$ | P155 | CN | H | H | P96 | H | H | H | H |
| $L_{a3447}$ | P156 | CN | H | H | P96 | H | H | H | H |
| $L_{a3448}$ | P157 | CN | H | H | P96 | H | H | H | H |
| $L_{a3449}$ | P158 | CN | H | H | P96 | H | H | H | H |
| $L_{a3450}$ | P159 | CN | H | H | P96 | H | H | H | H |
| $L_{a3451}$ | P160 | CN | H | H | P96 | H | H | H | H |
| $L_{a3452}$ | P161 | CN | H | H | P96 | H | H | H | H |
| $L_{a3453}$ | P29 | CN | H | H | P96 | H | H | H | H |
| $L_{a3454}$ | P30 | CN | H | H | P96 | H | H | H | H |
| $L_{a3455}$ | P31 | CN | H | H | P96 | H | H | H | H |
| $L_{a3456}$ | P165 | CN | H | H | P96 | H | H | H | H |
| $L_{a3457}$ | P166 | CN | H | H | P96 | H | H | H | H; |

wherein P1 to P166 have the following structures:

P1

P2

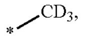

P3

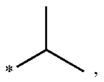

P4

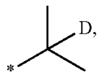

P5

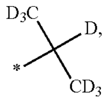

P6

P7

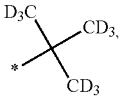

-continued

P8

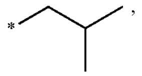

P9

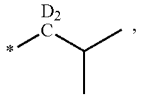

P10

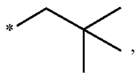

P11

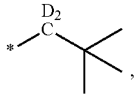

P12

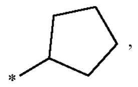

P13

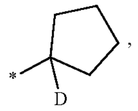

P14

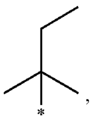

P15

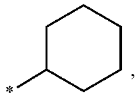

P16

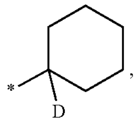

P17

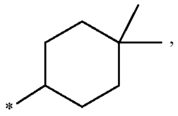

P18

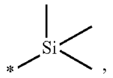

P19

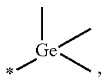

P20

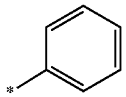

-continued
P21
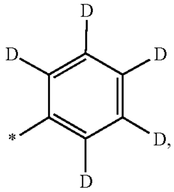
P22
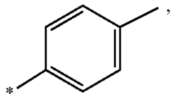
P23
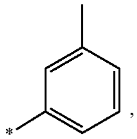
P24
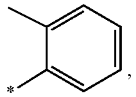
P25
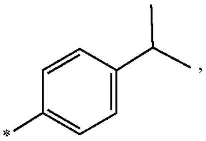
P26
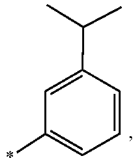
P27
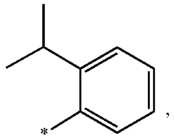
P28
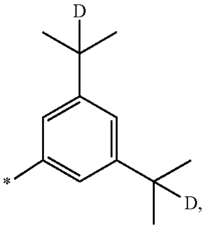
P29
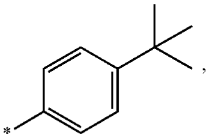
P30
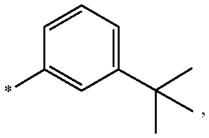
-continued
P31
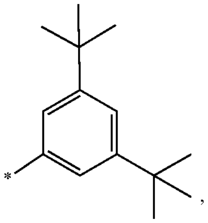
P32
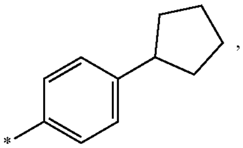
P33
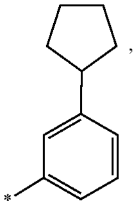
P34
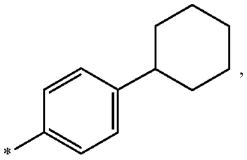
P35
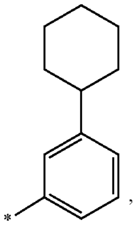
P36
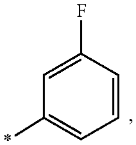
P37
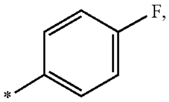
P38
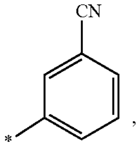
P39
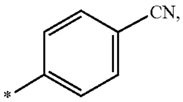

-continued
P40
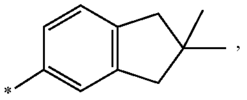,
P41
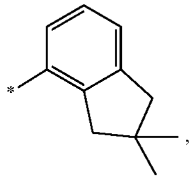,
P42
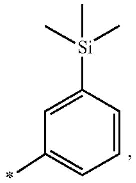,
P43
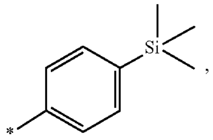,
P44
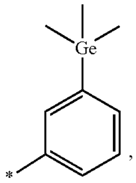,
P45
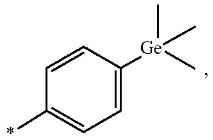,
P46
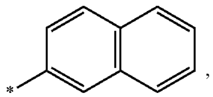,
P47
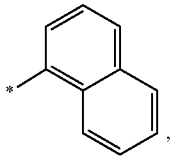,
P48
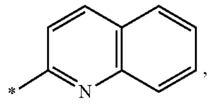,
P49
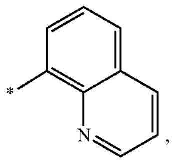,
-continued
P50
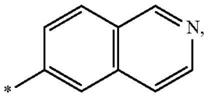,
P51
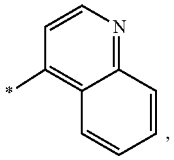,
P52
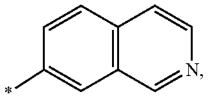,
P53
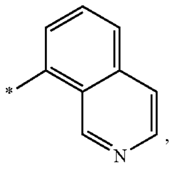,
P54
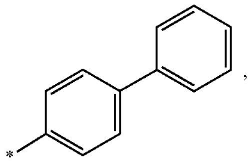,
P55
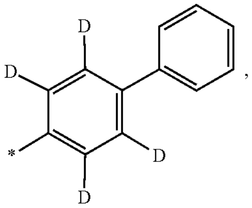,
P56
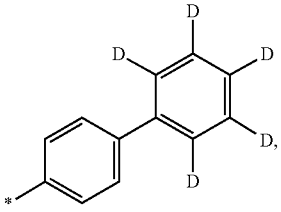,
P57
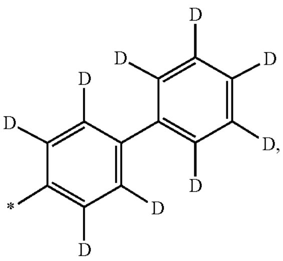,
P58
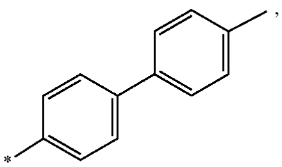, -continued
P59
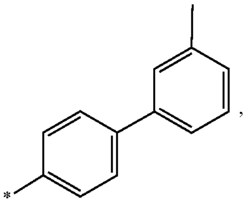
P60
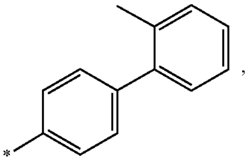
P61
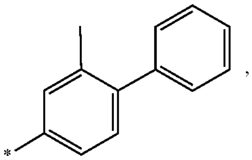
P62
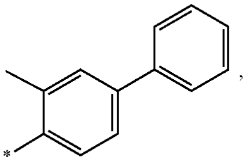
P63
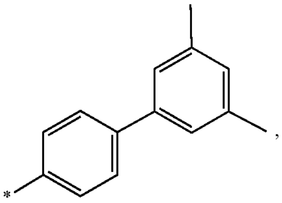
P64
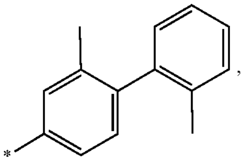
P65
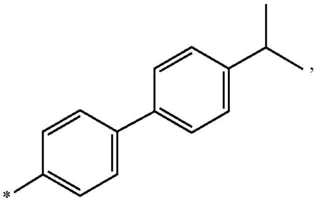
P66
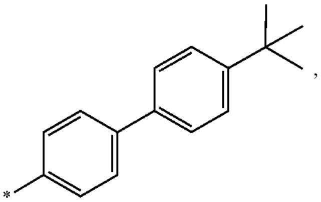
-continued
P67
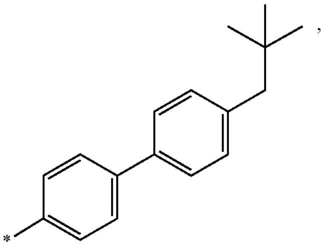
P68
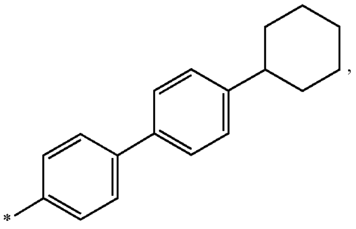
P69
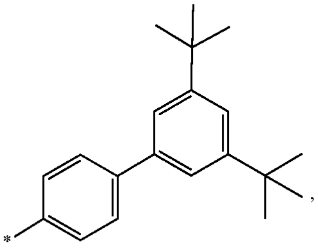
P70
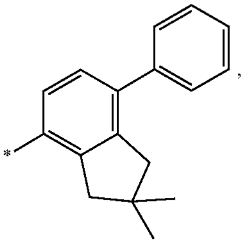
P71
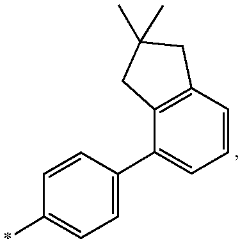
P72
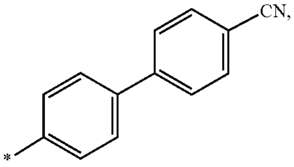
P73
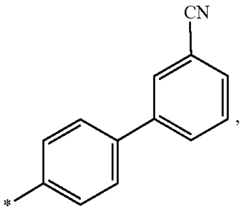

-continued
P74
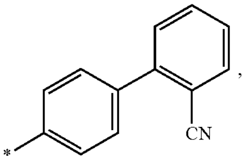
P75
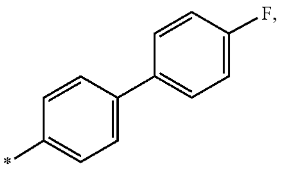
P76
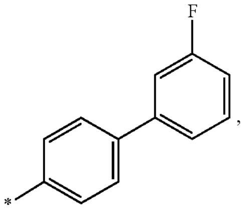
P77
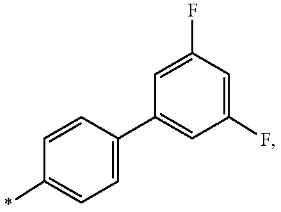
P78
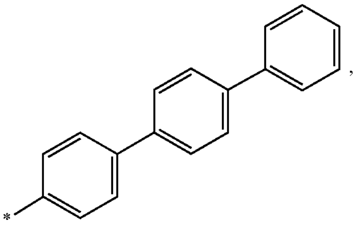
P79
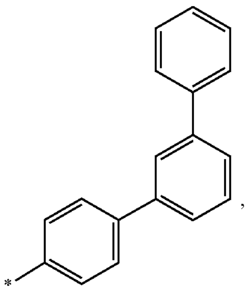
P80
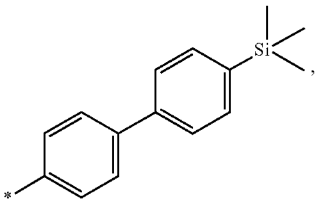
-continued
P81
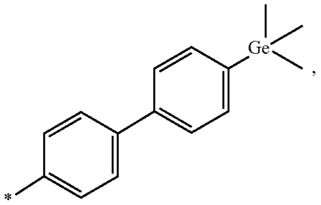
P82
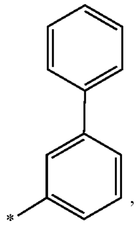
P83
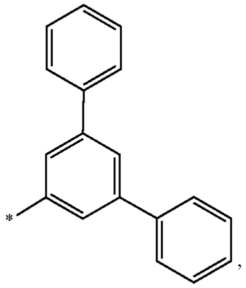
P84
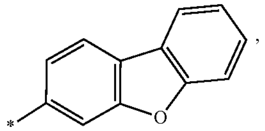
P85
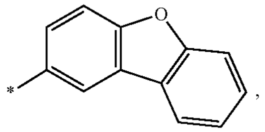
P86
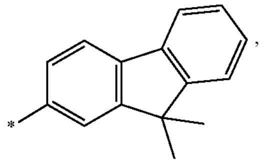
P87
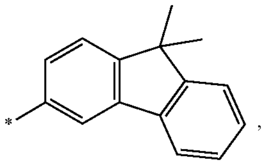
P88
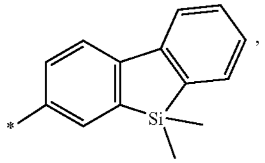

-continued
P89
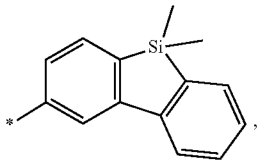
P90
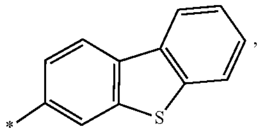
P91
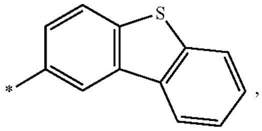
P92
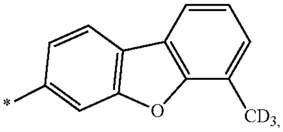
P93
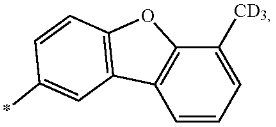
P94
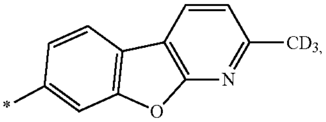
P95
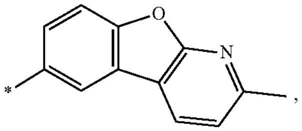
P96
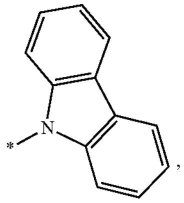
P97
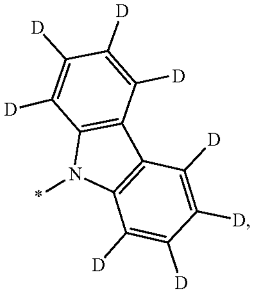
-continued
P98
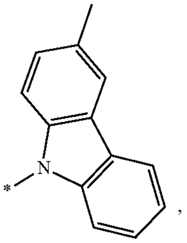
P99
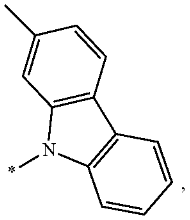
P100
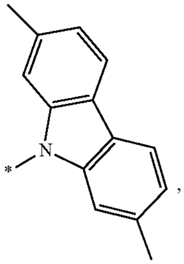
P101
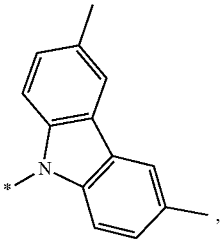
P102
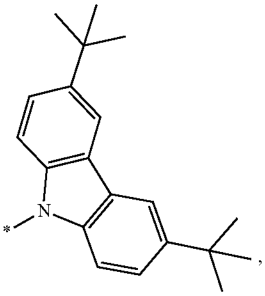

-continued
P103
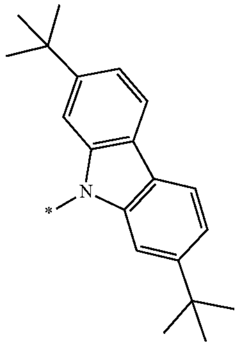
,
P104
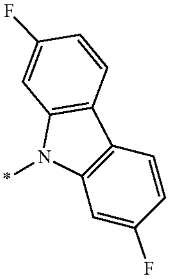
,
P105
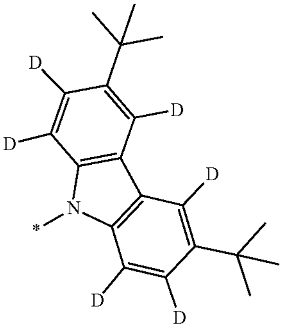
,
P106
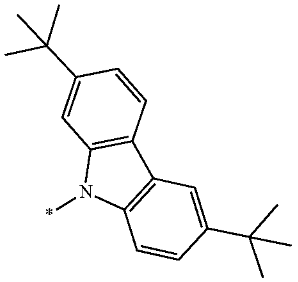
,
P107
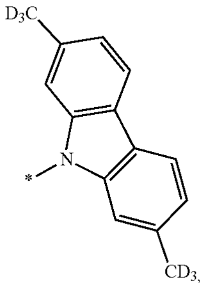
-continued
P108
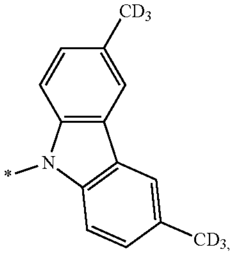
P109
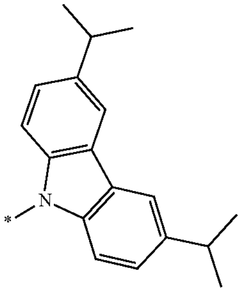
,
P110
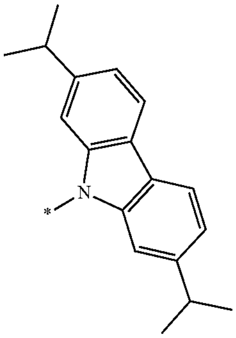
,
P111
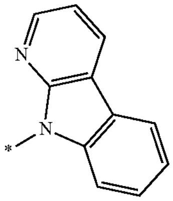
,
P112
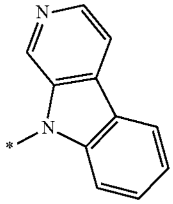
,
P113
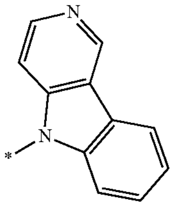
, -continued
P114
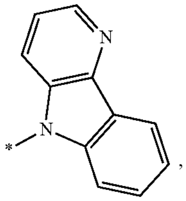
,
P115
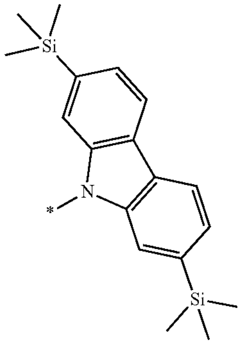
,
P116
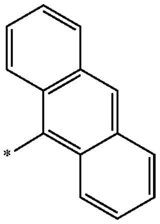
P117
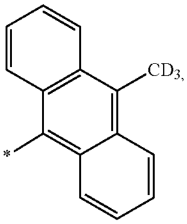
P118
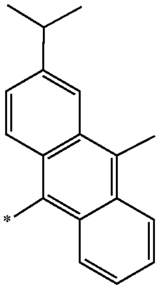
P119
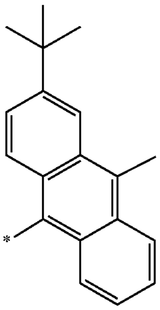
,
-continued
P120
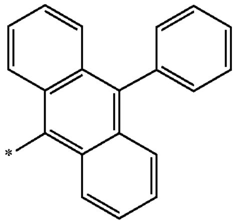
,
P121
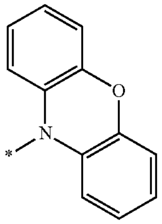
,
P122
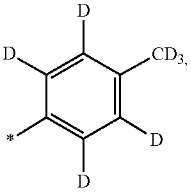
P123
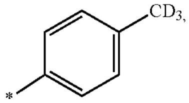
P124
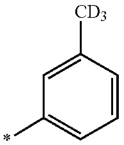
,
P125
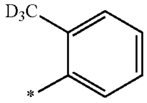
,
P126
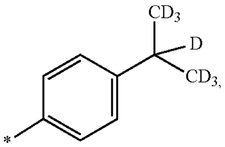
P127
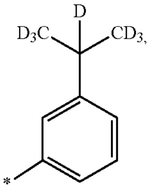
P128
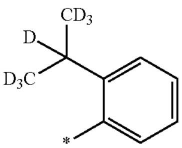
, -continued
P129
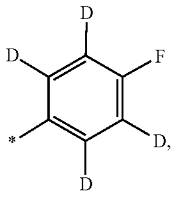
P130
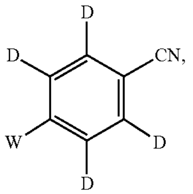
P131
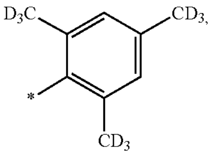
P132
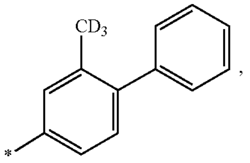
P133
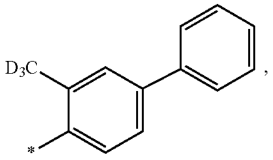
P134
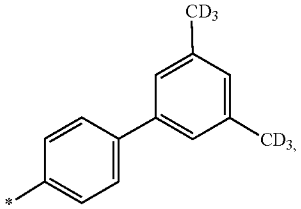
P135
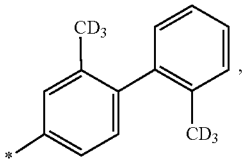
P136
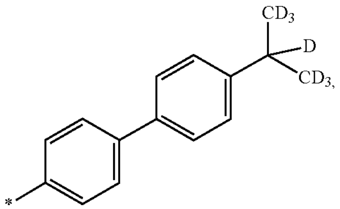
-continued
P137
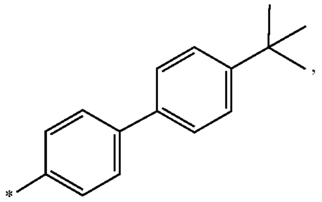
P138
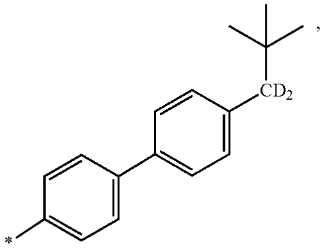
P139
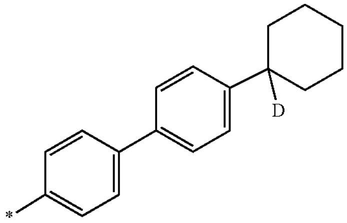
P140
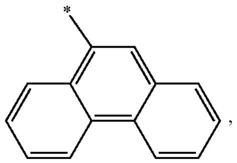
P141
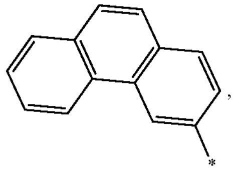
P142
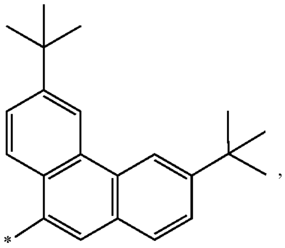
P143
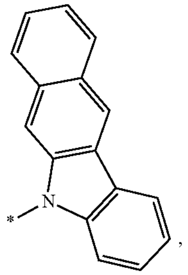

-continued
P144
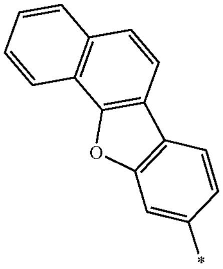
,
P145
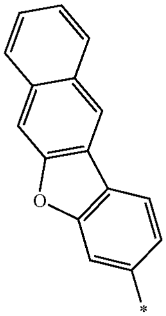
,
P146
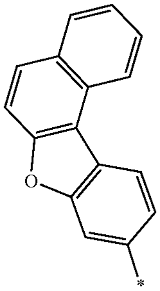
,
P147
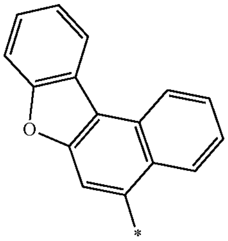
,
P148
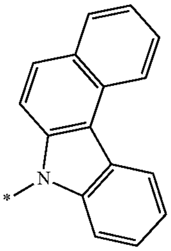
,
P149
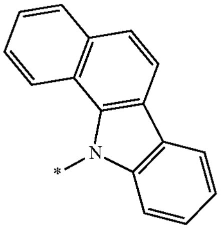
,
-continued
P150
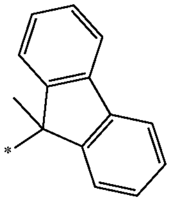
,
P151
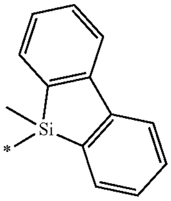
,
P152
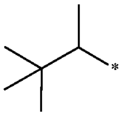
,
P153
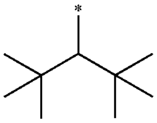
,
P154
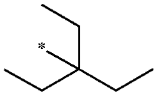
,
P155
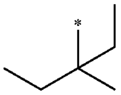
,
P156
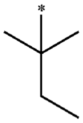
,
P157
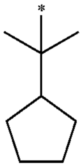
,
P158
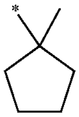
,
P159
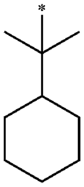
, -continued
P160
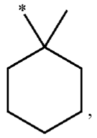
P161
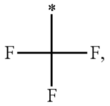
P162
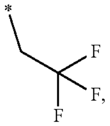
P163
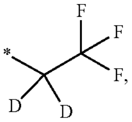
P164
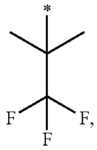
P165
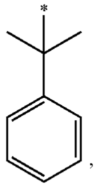
P166
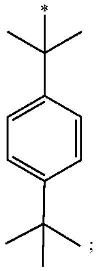
wherein $L_{a3458}$ to $L_{a3530}$ are shown as follows:
$L_{a3458}$
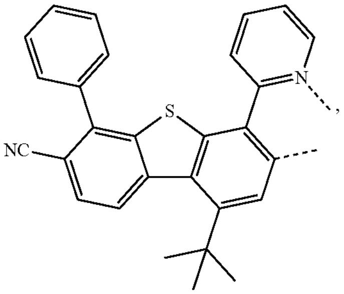
-continued
$L_{a3459}$
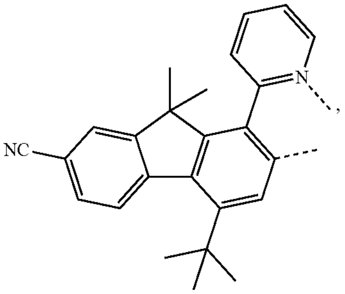
$L_{a3460}$
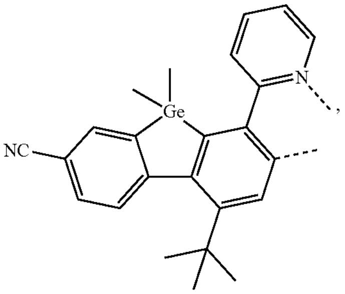
$L_{a3461}$
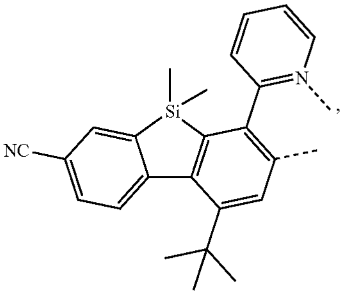
$L_{a3462}$
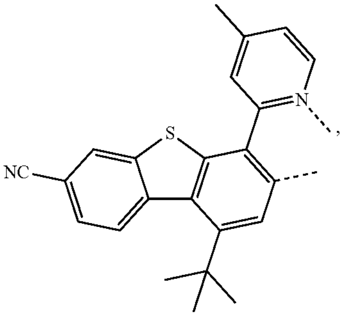
$L_{a3463}$
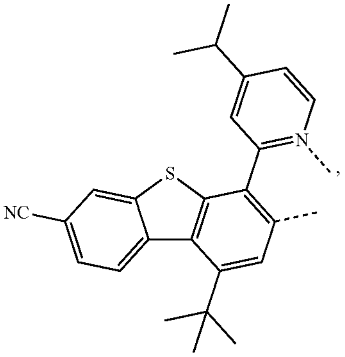

$L_{a3464}$
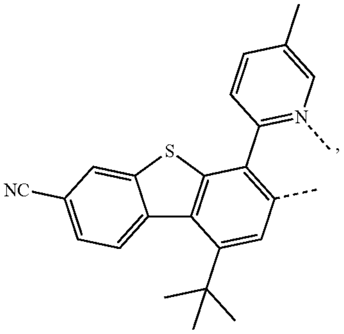
$L_{a3465}$
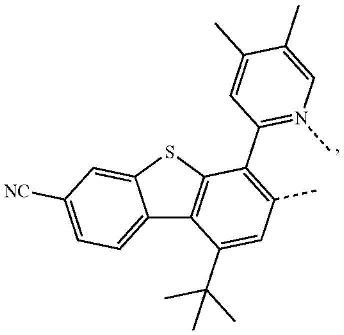
$L_{a3466}$
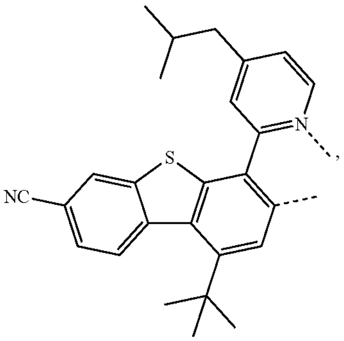
$L_{a3467}$
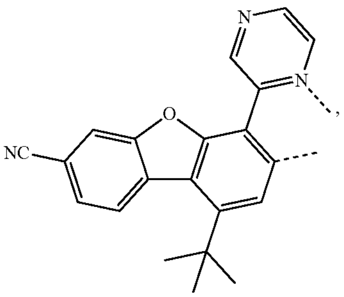
$L_{a3468}$
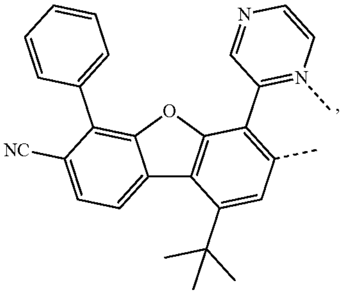
$L_{a3469}$
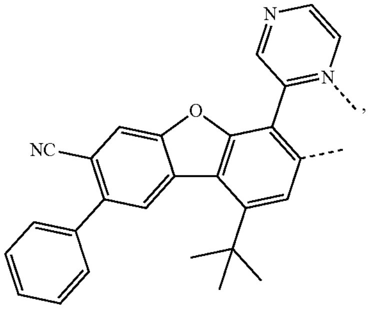
$L_{a3470}$
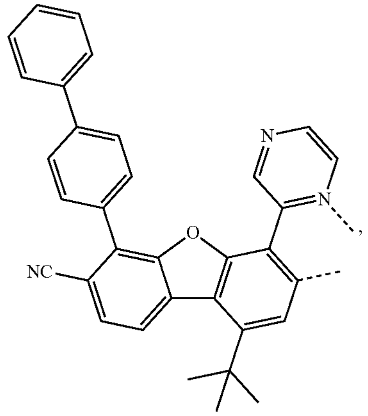
$L_{a3471}$
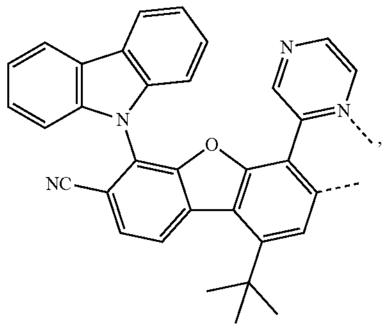
$L_{a3472}$
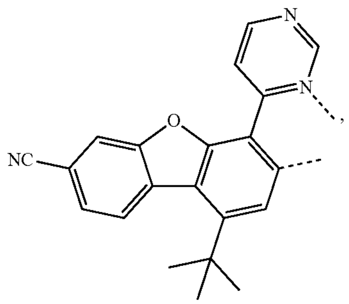

-continued
$L_{a3473}$
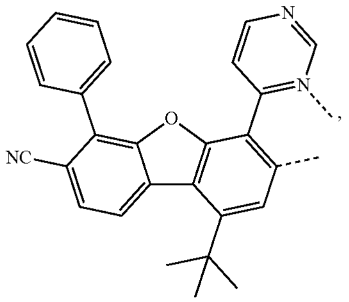
$L_{a3474}$
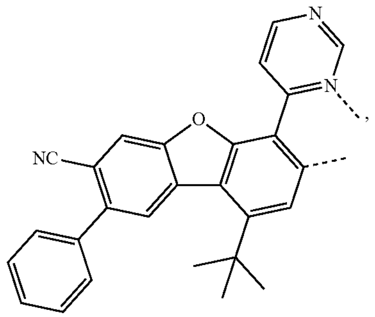
$L_{a3475}$
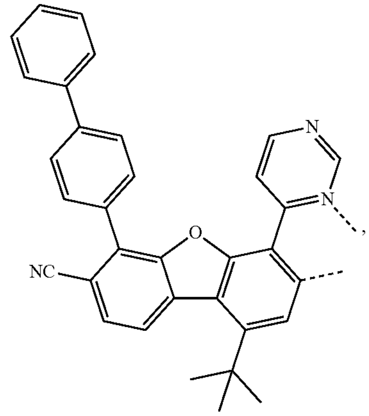
$L_{a3476}$
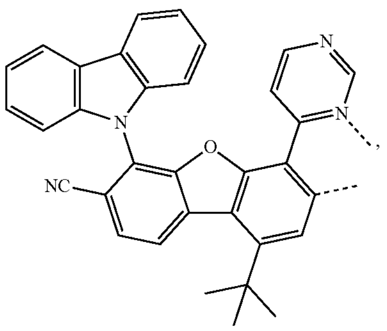
-continued
$L_{a3477}$
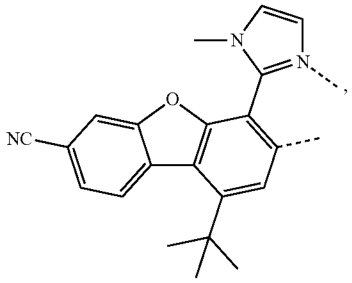
$L_{a3478}$
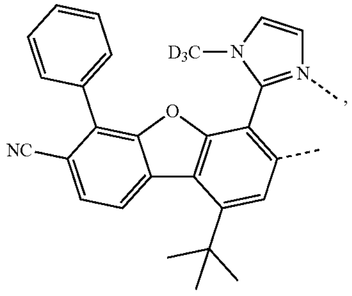
$L_{a3479}$
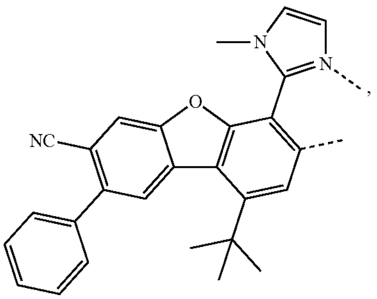
$L_{a3480}$
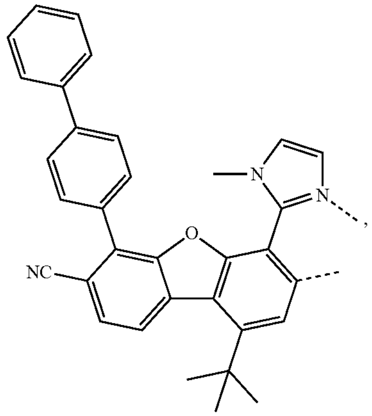

-continued
$L_{a3481}$
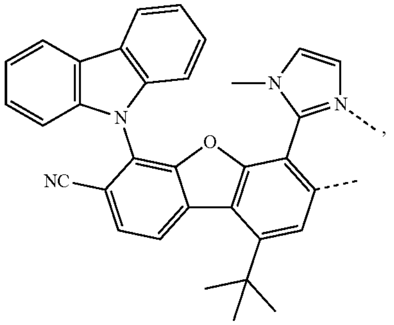
$L_{a3482}$
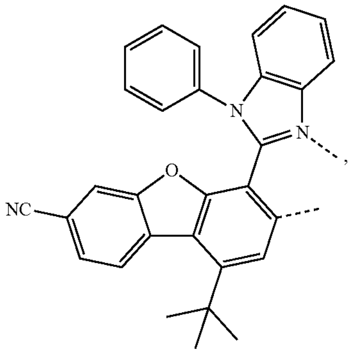
$L_{a3483}$
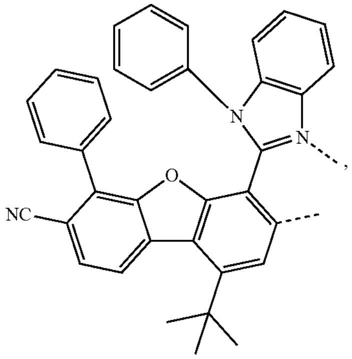
$L_{a3484}$
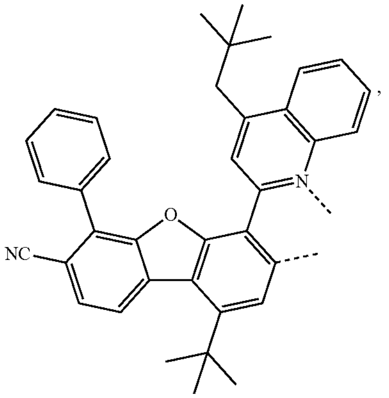
-continued
$L_{a3485}$
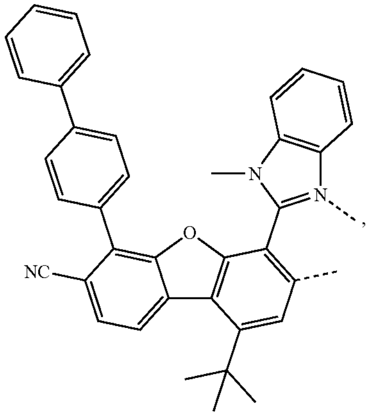
$L_{a3486}$
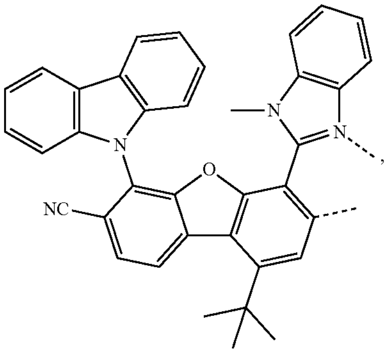
$L_{a3487}$
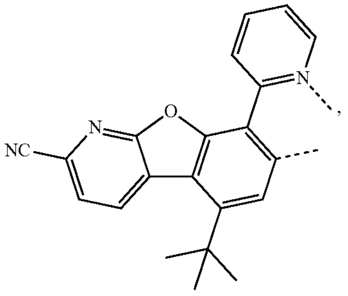
$L_{a3488}$
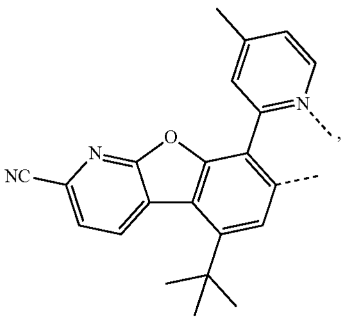

-continued
$L_{a3489}$
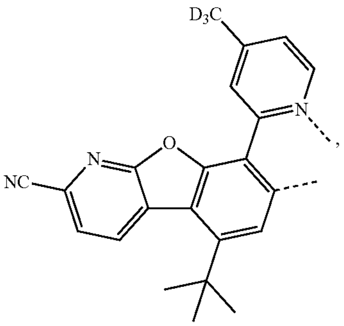
$L_{a3490}$
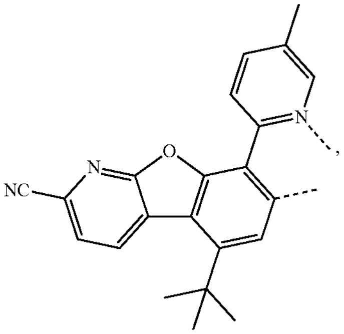
$L_{a3491}$
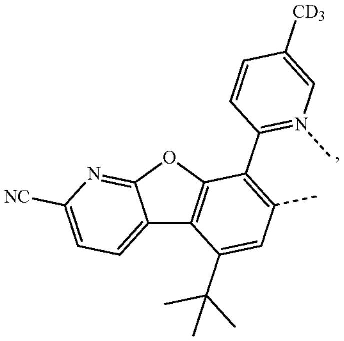
$L_{a3492}$
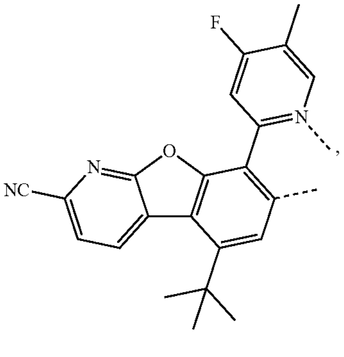
-continued
$L_{a3493}$
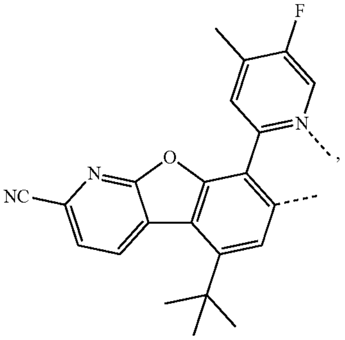
$L_{a3494}$
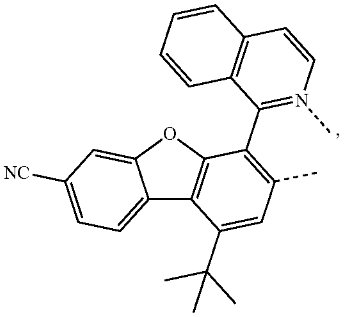
$L_{a3495}$
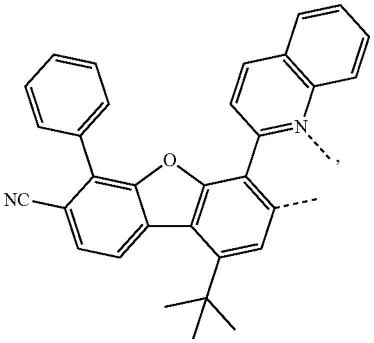
$L_{a3496}$
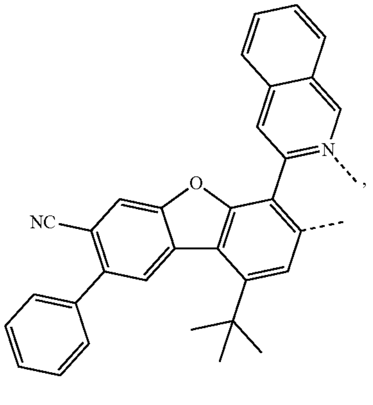

-continued
$L_{a3497}$
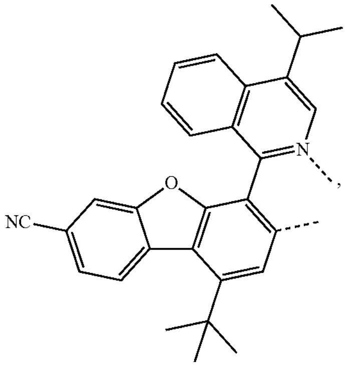
$L_{a3498}$
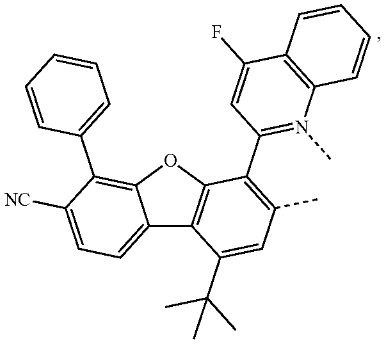
$L_{a3499}$
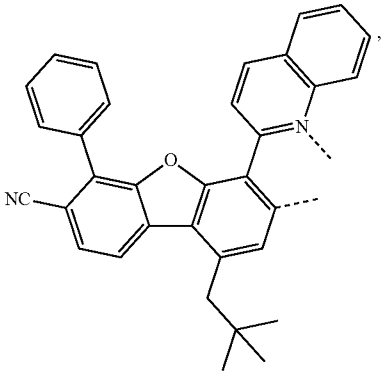
$L_{a3500}$
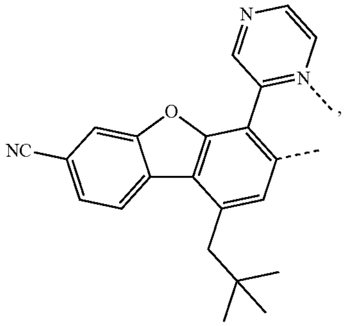
-continued
$L_{a3501}$
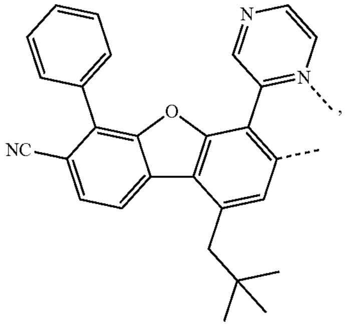
$L_{a3502}$
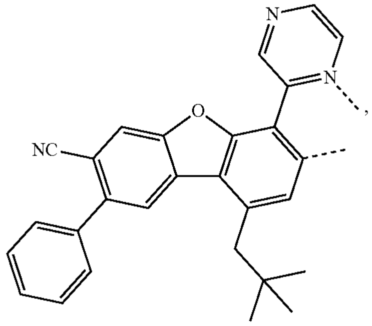
$L_{a3503}$
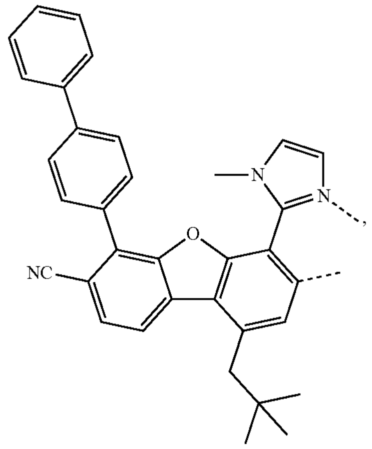
$L_{a3504}$
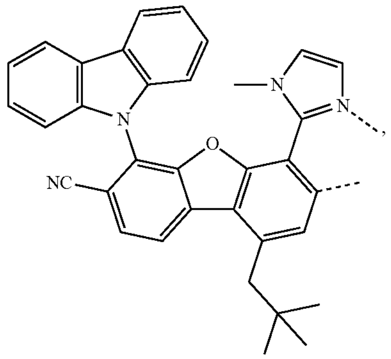

-continued
$L_{a3505}$
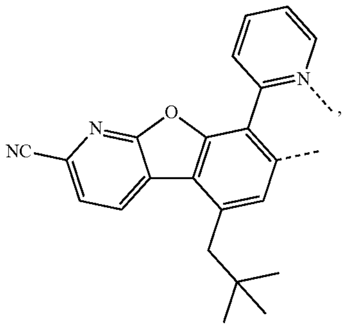
$L_{a3506}$
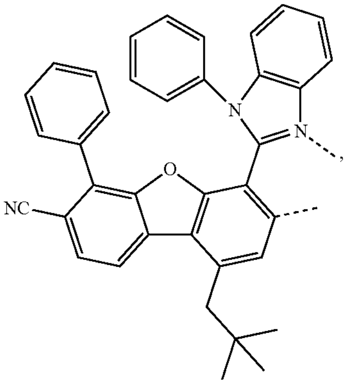
$L_{a3507}$
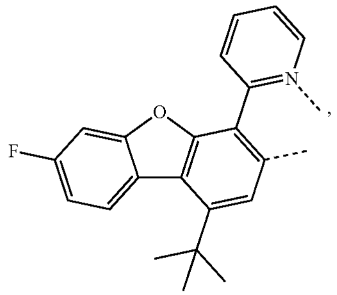
$L_{a3508}$
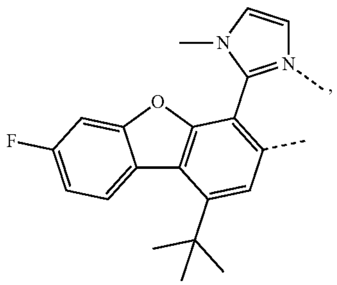
-continued
$L_{a3509}$
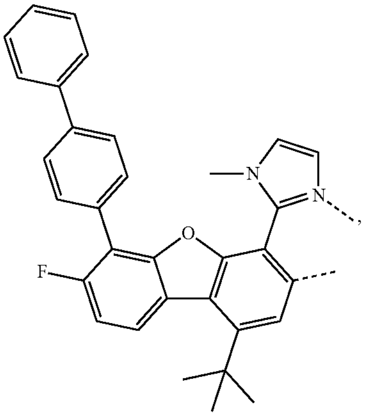
$L_{a3510}$
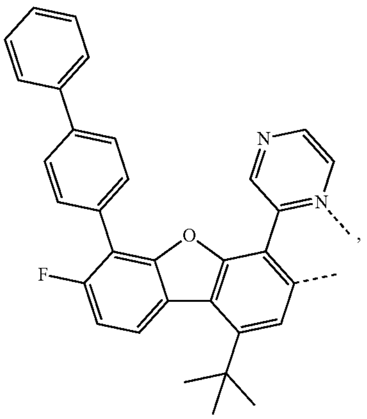
$L_{a3511}$
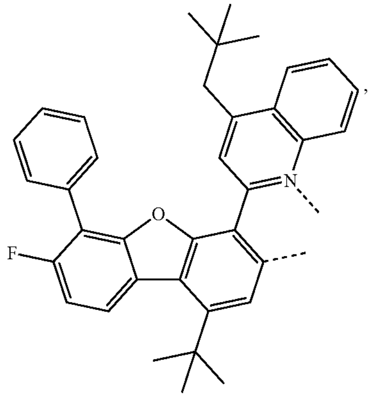

$L_{a3512}$
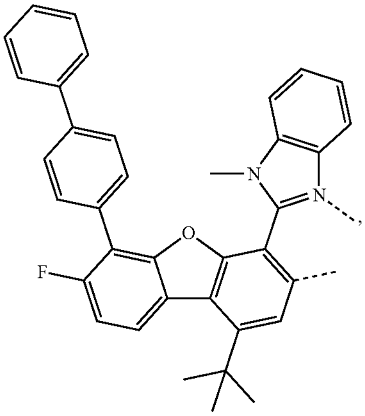
$L_{a3513}$
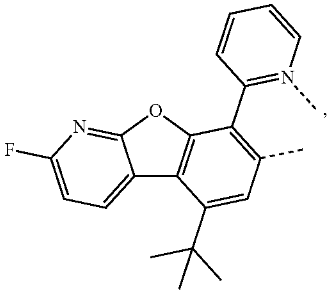
$L_{a3514}$
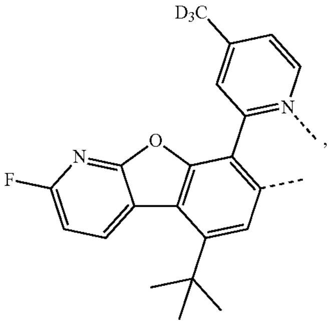
$L_{a3515}$
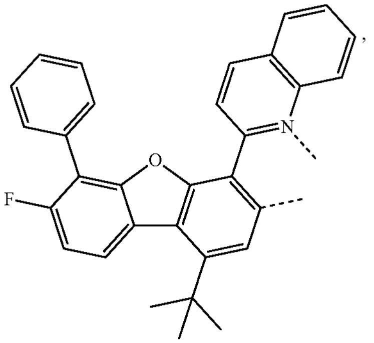
$L_{a3516}$
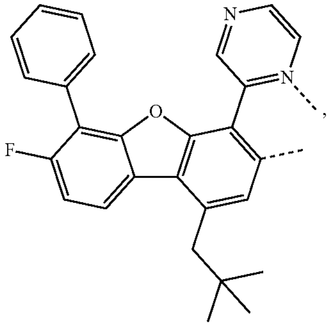
$L_{a3517}$
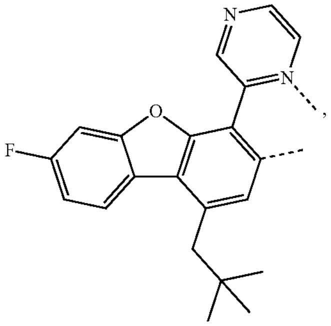
$L_{a3518}$
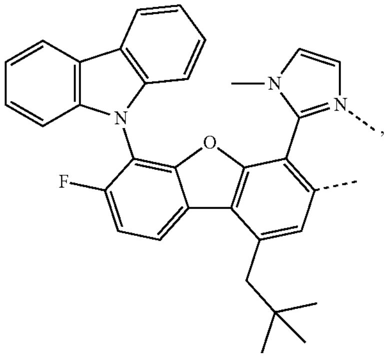
$L_{a3519}$
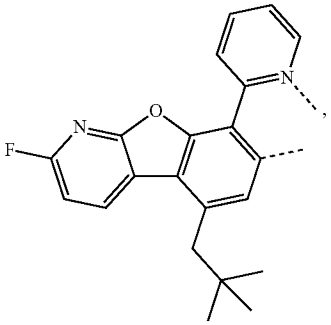

$L_{a3520}$
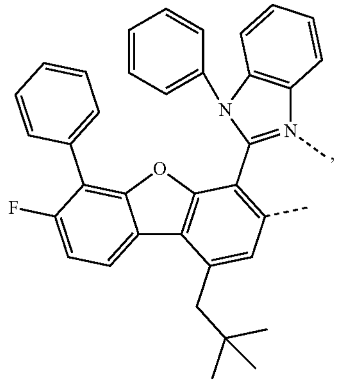
$L_{a3521}$
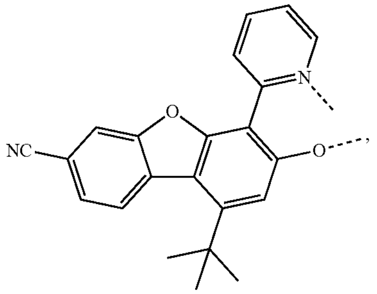
$L_{a3522}$
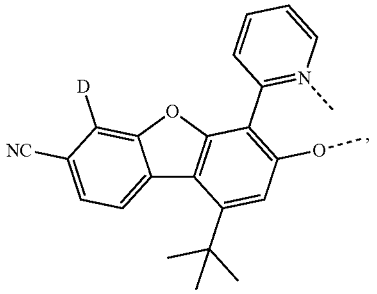
$L_{a3523}$
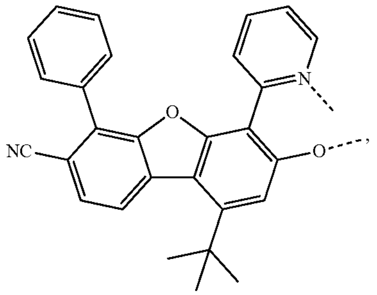
$L_{a3524}$
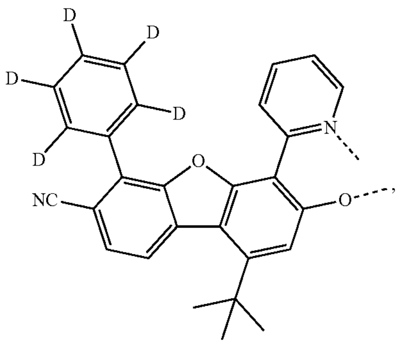
$L_{a3525}$
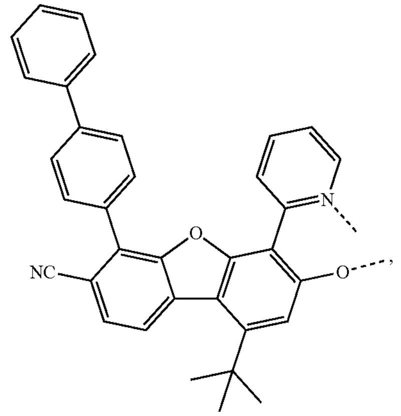
$L_{a3526}$
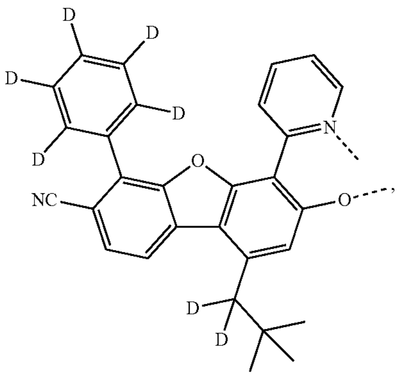
$L_{a3527}$
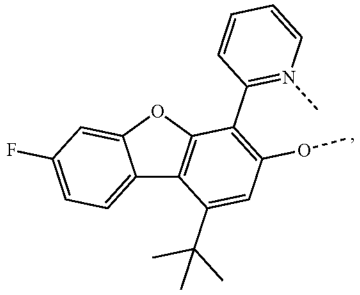
$L_{a3528}$
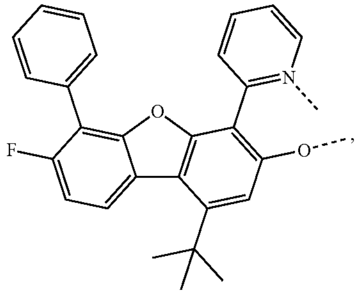

-continued
$L_{a3529}$
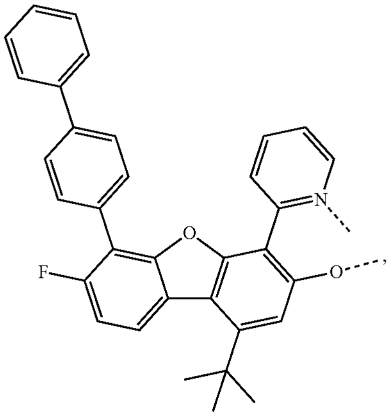
$L_{a3530}$
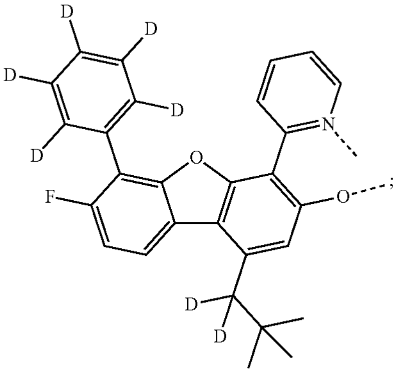
wherein optionally, hydrogens in $L_{a1}$ to $L_{a3530}$ can be partially or fully substituted with deuterium.
16. The metal complex according to claim 15, wherein $L_b$ is, at each occurrence identically or differently, selected from the group consisting of:
$L_{b1}$
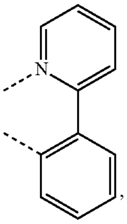
$L_{b2}$
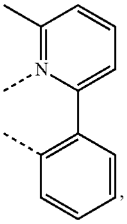
-continued
$L_{b3}$
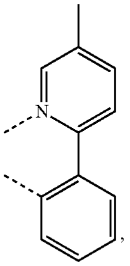
$L_{b4}$
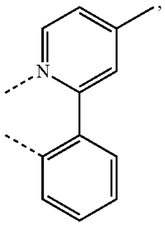
$L_{b5}$
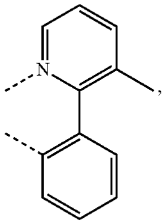
$L_{b6}$
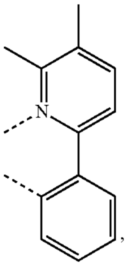
$L_{b7}$
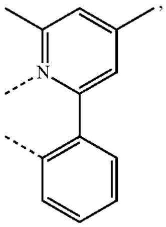
$L_{b8}$
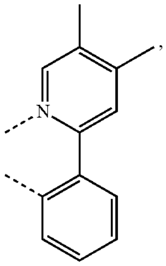

-continued
$L_{b9}$
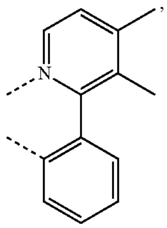
$L_{b10}$
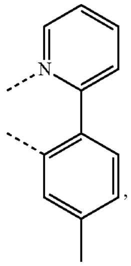
$L_{b11}$
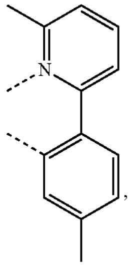
$L_{b12}$
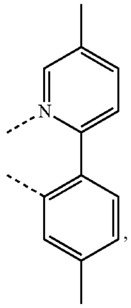
$L_{b13}$
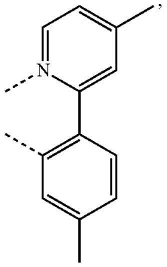
-continued
$L_{b14}$
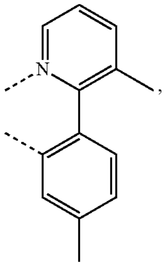
$L_{b15}$
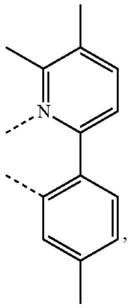
$L_{b16}$
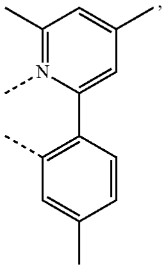
$L_{b17}$
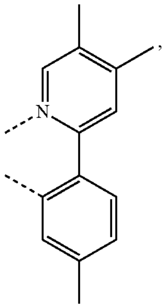
$L_{b18}$
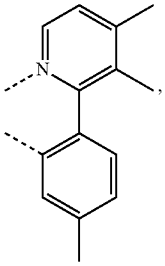

-continued
$L_{b19}$
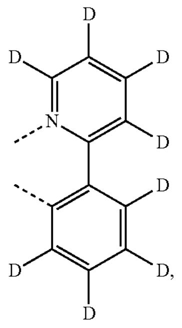
$L_{b20}$
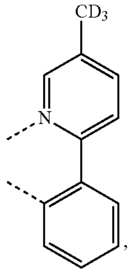
$L_{b21}$
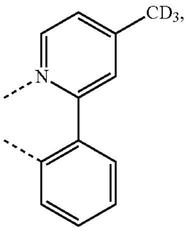
$L_{b22}$
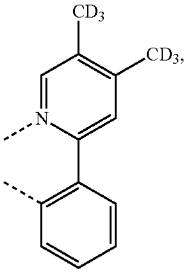
$L_{b23}$
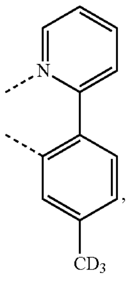
-continued
$L_{b24}$
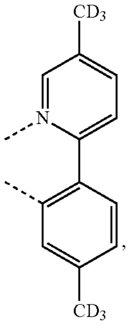
$L_{b25}$
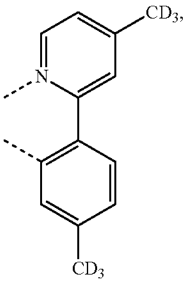
$L_{b26}$
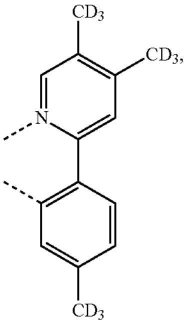
$L_{b27}$
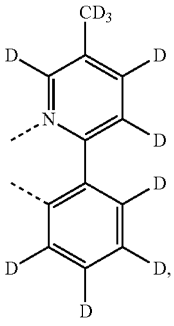
$L_{b28}$
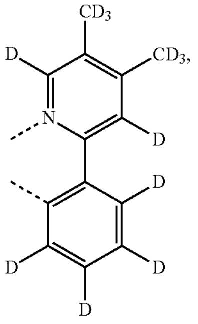

-continued
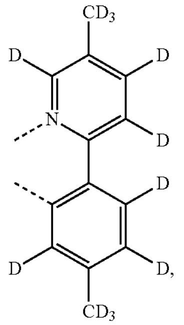
$L_{b29}$
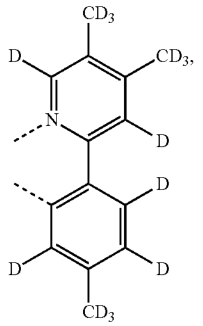
$L_{b30}$
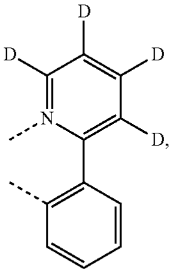
$L_{b31}$
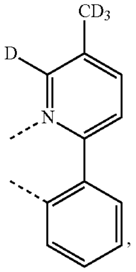
$L_{b32}$
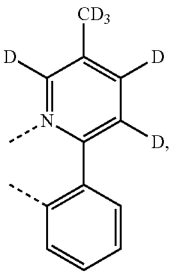
$L_{b33}$
-continued
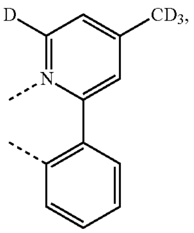
$L_{b34}$
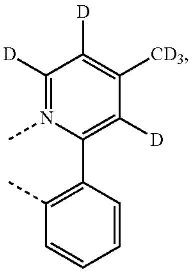
$L_{b35}$
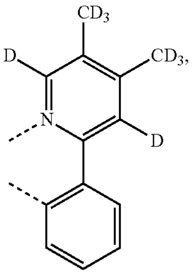
$L_{b36}$
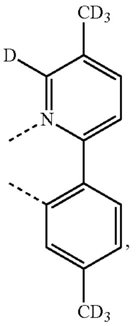
$L_{b37}$
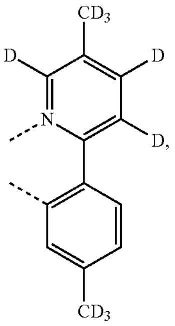
$L_{b38}$ -continued
$L_{b39}$
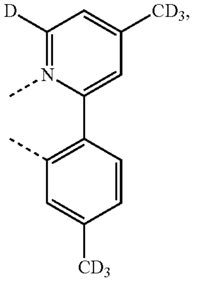
$L_{b40}$
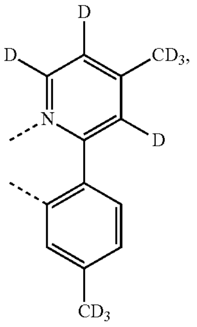
$L_{b41}$
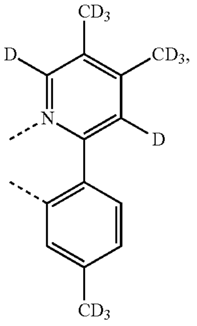
$L_{b42}$
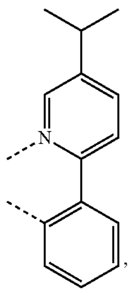
$L_{b43}$
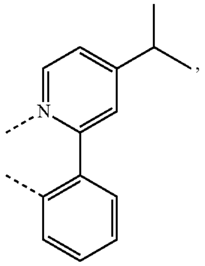
-continued
$L_{b44}$
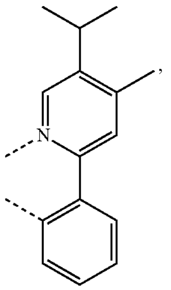
$L_{b45}$
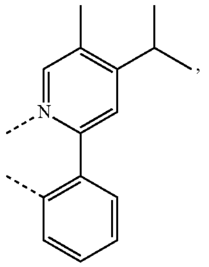
$L_{b46}$
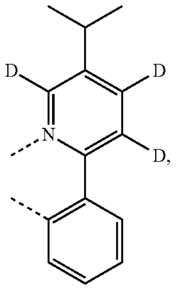
$L_{b47}$
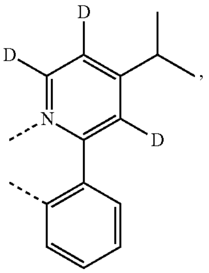
$L_{b48}$
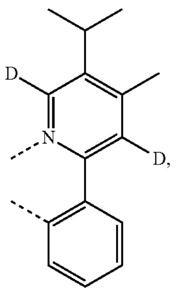

-continued
$L_{b49}$
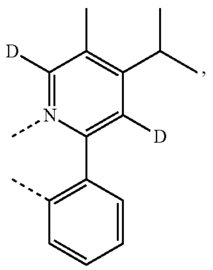
$L_{b50}$
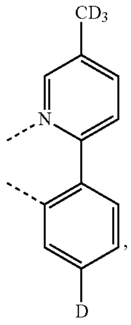
$L_{b51}$
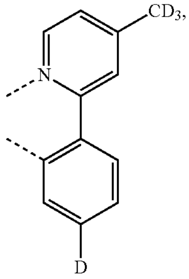
$L_{b52}$
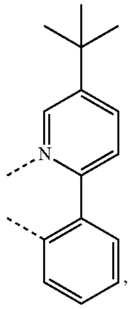
$L_{b53}$
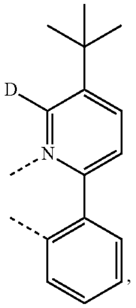
-continued
$L_{b54}$
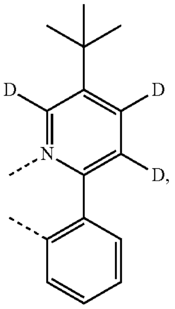
$L_{b55}$
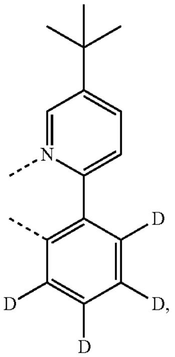
$L_{b56}$
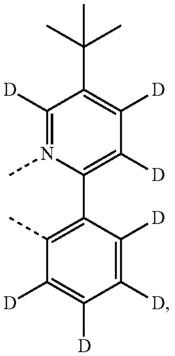
$L_{b57}$
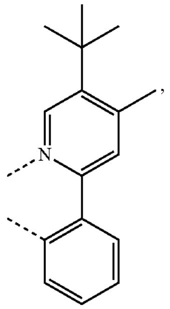

-continued
$L_{b58}$
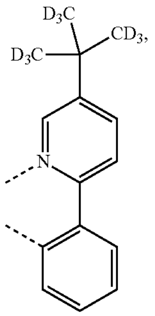
$L_{b59}$
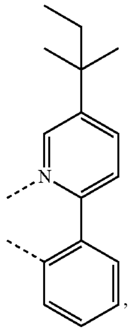
$L_{b60}$
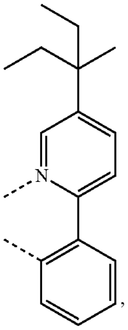
$L_{b61}$
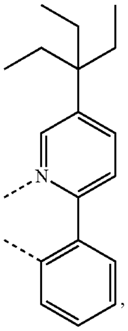
-continued
$L_{b62}$
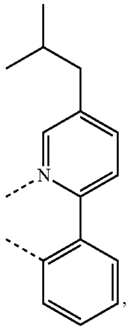
$L_{b63}$
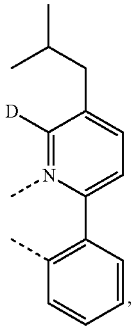
$L_{b64}$
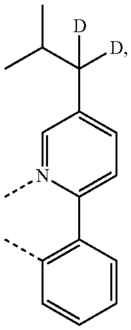
$L_{b65}$
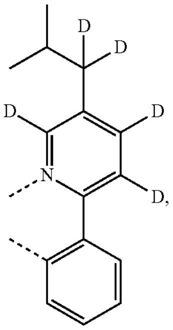

-continued
$L_{b66}$
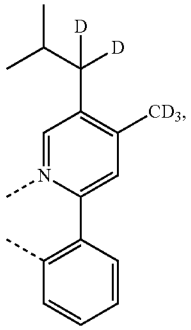
$L_{b67}$
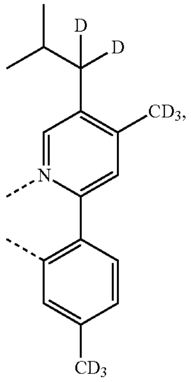
$L_{b68}$
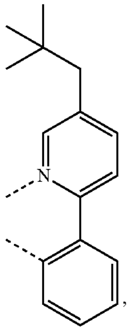
$L_{b69}$
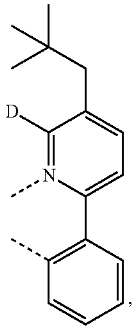
-continued
$L_{b70}$
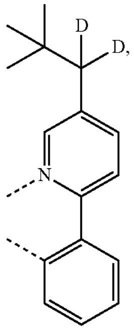
$L_{b71}$
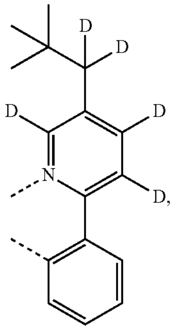
$L_{b72}$
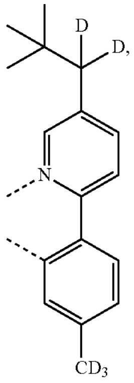
$L_{b73}$
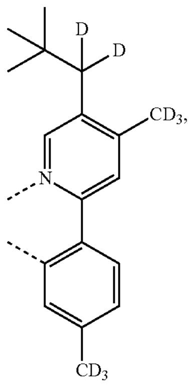

$L_{b74}$
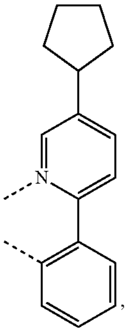
$L_{b75}$
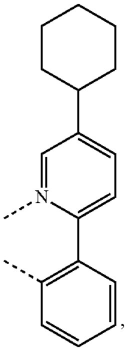
$L_{b76}$
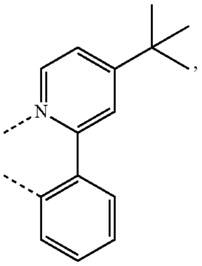
$L_{b77}$
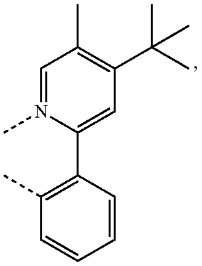
$L_{b78}$
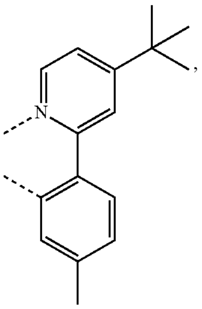
$L_{b79}$
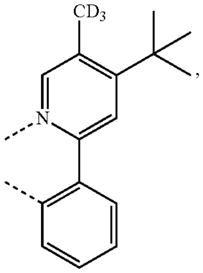
$L_{b80}$
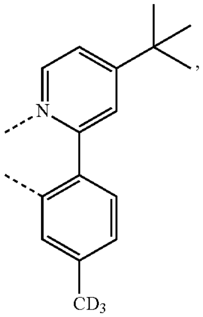
$L_{b81}$
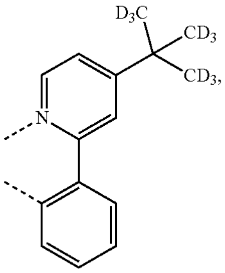
$L_{b82}$
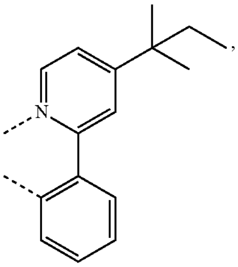
$L_{b83}$
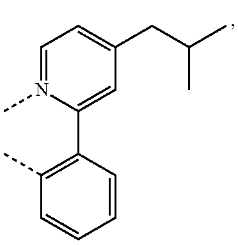

-continued
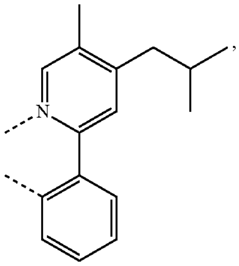
$L_{b84}$
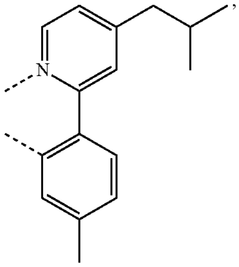
$L_{b85}$
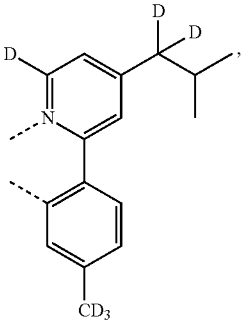
$L_{b86}$
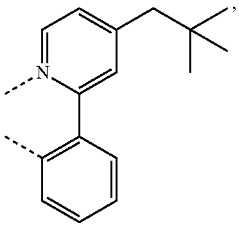
$L_{b87}$
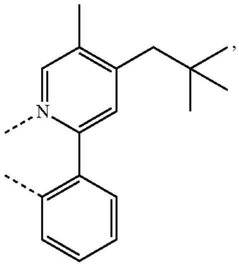
$L_{b88}$
-continued
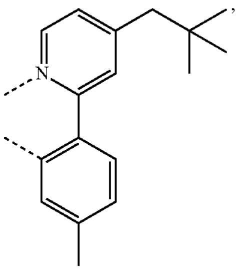
$L_{b89}$
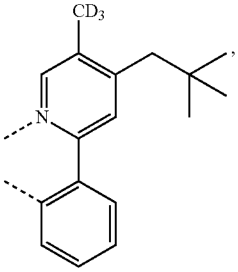
$L_{b90}$
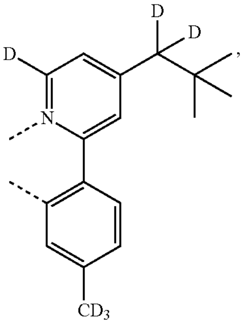
$L_{b91}$
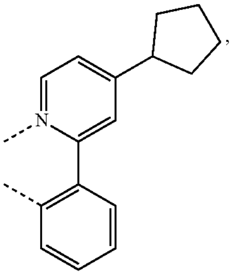
$L_{b92}$
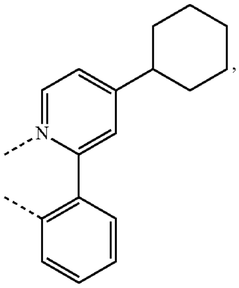
$L_{b93}$ -continued
$L_{b94}$
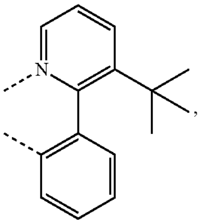
$L_{b95}$
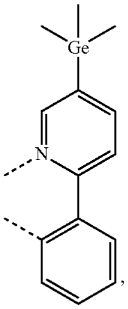
$L_{b96}$
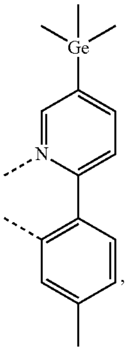
$L_{b97}$
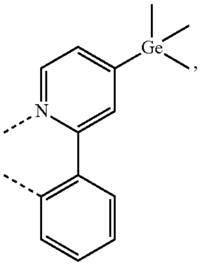
$L_{b98}$
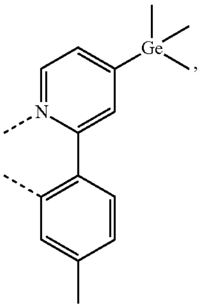
-continued
$L_{b99}$
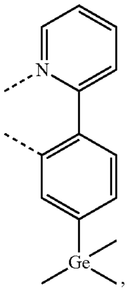
$L_{b100}$
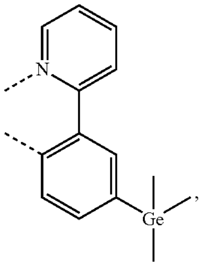
$L_{b101}$
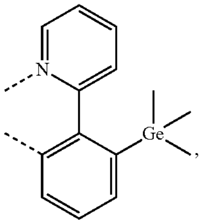
$L_{b102}$
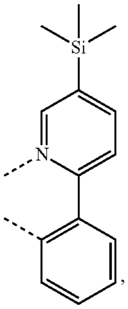
$L_{b103}$
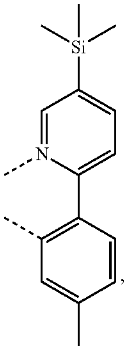

-continued
$L_{b104}$
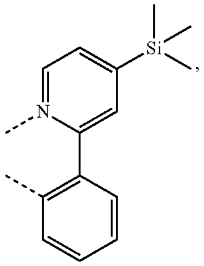
$L_{b105}$
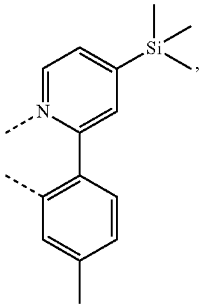
$L_{b106}$
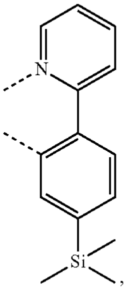
$L_{b107}$
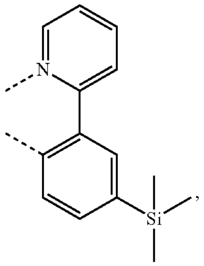
$L_{b108}$
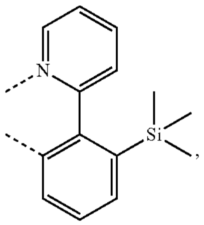
-continued
$L_{b109}$
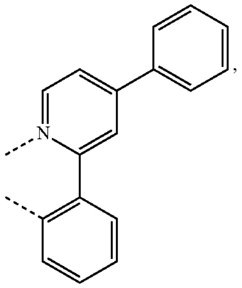
$L_{b110}$
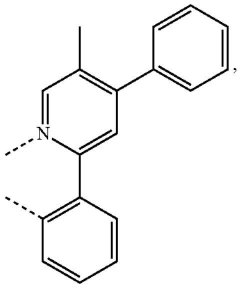
$L_{b111}$
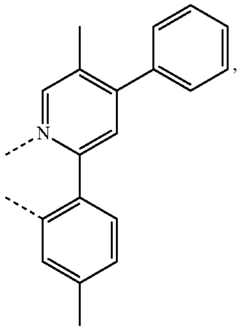
$L_{b112}$
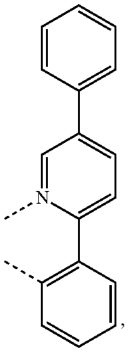

-continued
$L_{b113}$
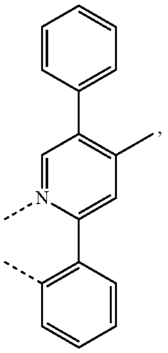
$L_{b114}$
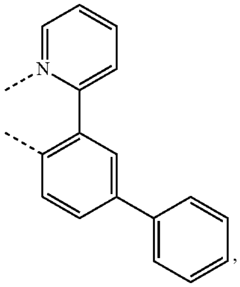
$L_{b115}$
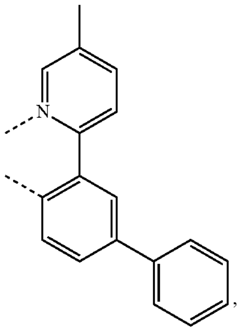
$L_{b116}$
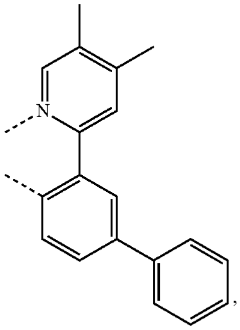
-continued
$L_{b117}$
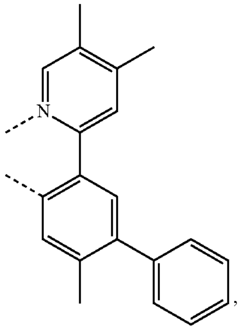
$L_{b118}$
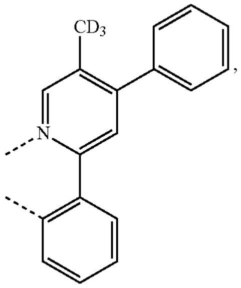
$L_{b119}$
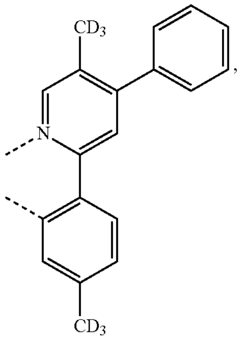
$L_{b120}$
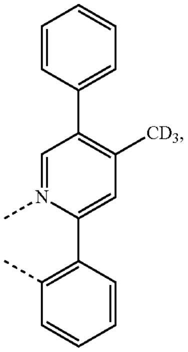

-continued
$L_{b121}$
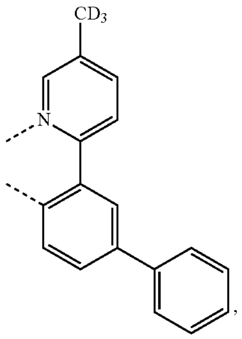
$L_{b122}$
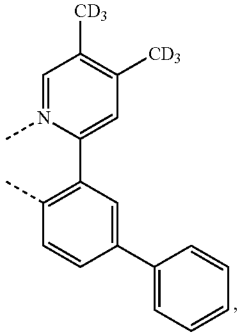
$L_{b123}$
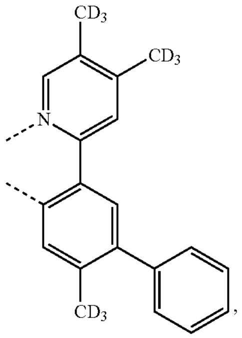
$L_{b124}$
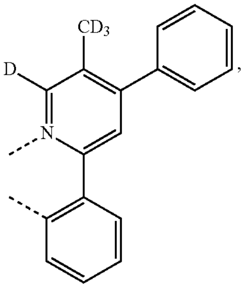
-continued
$L_{b125}$
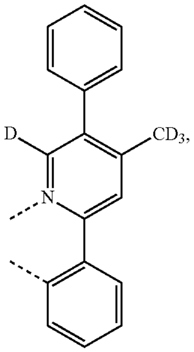
$L_{b126}$
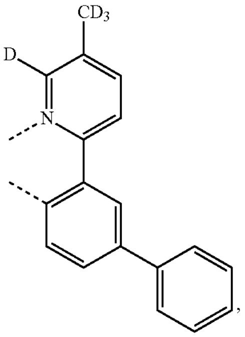
$L_{b127}$
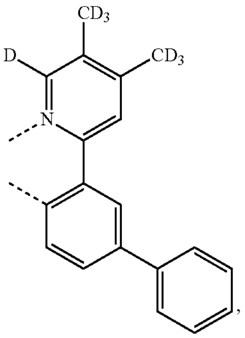
$L_{b128}$
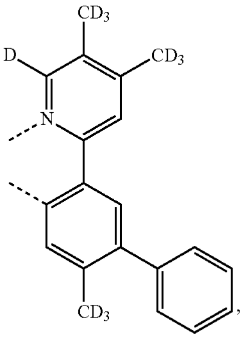

Lb129
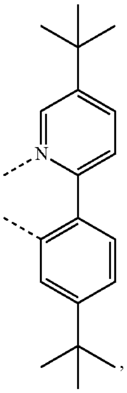
,
Lb130
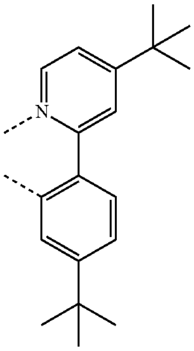
,
Lb131
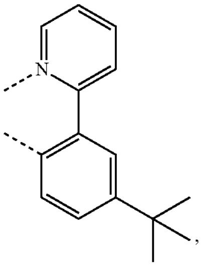
,
Lb132
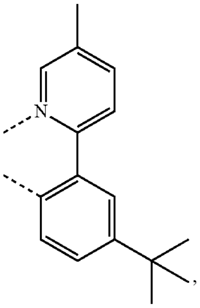
,
Lb133
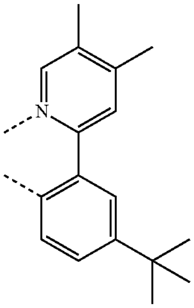
,
Lb134
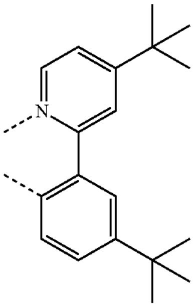
,
Lb135
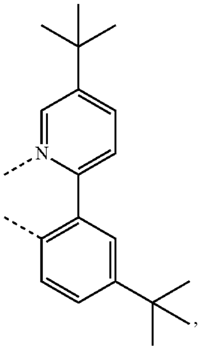
,
Lb136
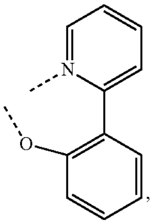
,
Lb137
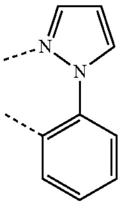
, -continued
$L_{b138}$
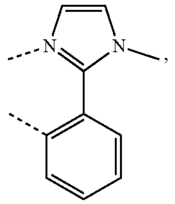
$L_{b139}$
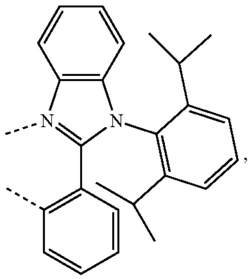
$L_{b140}$
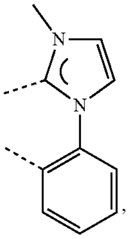
$L_{b141}$
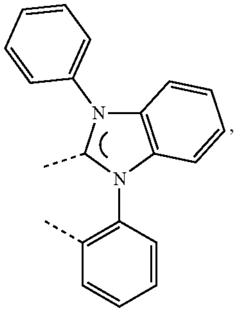
$L_{b142}$
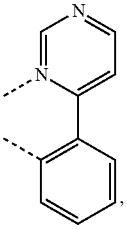
$L_{b143}$
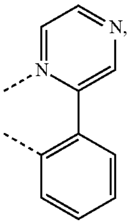
-continued
$L_{b144}$
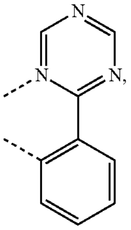
$L_{b145}$
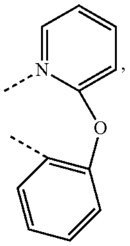
$L_{b146}$
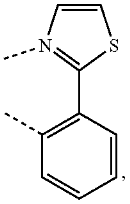
$L_{b147}$
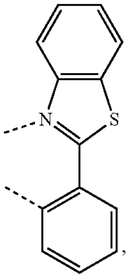
$L_{b148}$
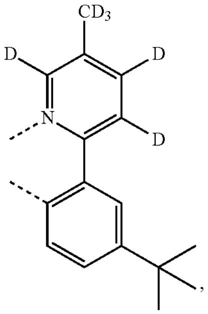
$L_{b149}$
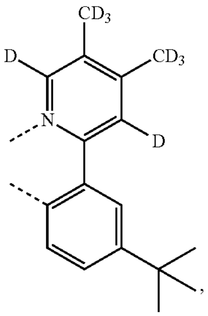

-continued $L_{b150}$

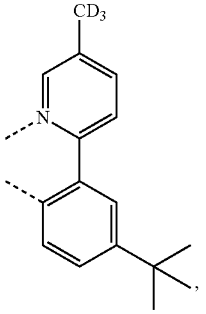

$L_{b151}$

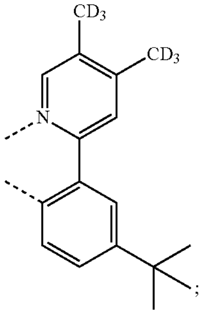

wherein optionally, hydrogens in the above $L_{b1}$ to $L_{b18}$, $L_{b20}$ to $L_{b26}$ and $L_{b31}$ to $L_{b151}$ can be partially or fully substituted with deuterium.

17. The metal complex according to claim 16, wherein the metal complex has a structure of $Ir(L_a)(L_b)_2$, wherein the two $L_b$ are identical or different; and preferably, the metal complex is selected from the group consisting of Metal Complex 1 to Metal Complex 3806, wherein Metal Complex 1 to Metal Complex 3806 each have a structure of $Ir(L_a)(L_b)_2$, wherein the two $L_b$ are identical, and $L_a$ and $L_b$ respectively correspond to the structures in the following table:

-continued

| Metal Complex No. | $L_a$ | $L_b$ | Metal Complex No. | $L_a$ | $L_b$ |
|---|---|---|---|---|---|
| 1 | $L_{a1}$ | $L_{b1}$ | 2 | $L_{a1}$ | $L_{b3}$ |
| 3 | $L_{a12}$ | $L_{b1}$ | 4 | $L_{a12}$ | $L_{b3}$ |
| 5 | $L_{a21}$ | $L_{b1}$ | 6 | $L_{a21}$ | $L_{b3}$ |
| 7 | $L_{a23}$ | $L_{b1}$ | 8 | $L_{a23}$ | $L_{b3}$ |
| 9 | $L_{a33}$ | $L_{b1}$ | 10 | $L_{a33}$ | $L_{b3}$ |
| 11 | $L_{a42}$ | $L_{b1}$ | 12 | $L_{a42}$ | $L_{b3}$ |
| 13 | $L_{a63}$ | $L_{b1}$ | 14 | $L_{a63}$ | $L_{b3}$ |
| 15 | $L_{a66}$ | $L_{b1}$ | 16 | $L_{a66}$ | $L_{b3}$ |
| 17 | $L_{a75}$ | $L_{b1}$ | 18 | $L_{a75}$ | $L_{b3}$ |
| 19 | $L_{a84}$ | $L_{b1}$ | 20 | $L_{a84}$ | $L_{b3}$ |
| 21 | $L_{a105}$ | $L_{b1}$ | 22 | $L_{a105}$ | $L_{b3}$ |
| 23 | $L_{a107}$ | $L_{b1}$ | 24 | $L_{a107}$ | $L_{b3}$ |
| 25 | $L_{a121}$ | $L_{b1}$ | 26 | $L_{a121}$ | $L_{b3}$ |
| 27 | $L_{a128}$ | $L_{b1}$ | 28 | $L_{a128}$ | $L_{b3}$ |
| 29 | $L_{a130}$ | $L_{b1}$ | 30 | $L_{a130}$ | $L_{b3}$ |
| 31 | $L_{a131}$ | $L_{b1}$ | 32 | $L_{a131}$ | $L_{b3}$ |
| 33 | $L_{a132}$ | $L_{b1}$ | 34 | $L_{a132}$ | $L_{b3}$ |
| 35 | $L_{a133}$ | $L_{b1}$ | 36 | $L_{a133}$ | $L_{b3}$ |
| 37 | $L_{a135}$ | $L_{b1}$ | 38 | $L_{a135}$ | $L_{b3}$ |
| 39 | $L_{a136}$ | $L_{b1}$ | 40 | $L_{a136}$ | $L_{b3}$ |
| 41 | $L_{a140}$ | $L_{b1}$ | 42 | $L_{a140}$ | $L_{b3}$ |
| 43 | $L_{a150}$ | $L_{b1}$ | 44 | $L_{a150}$ | $L_{b3}$ |
| 45 | $L_{a152}$ | $L_{b1}$ | 46 | $L_{a152}$ | $L_{b3}$ |
| 47 | $L_{a154}$ | $L_{b1}$ | 48 | $L_{a154}$ | $L_{b3}$ |
| 49 | $L_{a157}$ | $L_{b1}$ | 50 | $L_{a157}$ | $L_{b3}$ |
| 51 | $L_{a161}$ | $L_{b1}$ | 52 | $L_{a161}$ | $L_{b3}$ |
| 53 | $L_{a170}$ | $L_{b1}$ | 54 | $L_{a170}$ | $L_{b3}$ |
| 55 | $L_{a171}$ | $L_{b1}$ | 56 | $L_{a171}$ | $L_{b3}$ |
| 57 | $L_{a180}$ | $L_{b1}$ | 58 | $L_{a180}$ | $L_{b3}$ |
| 59 | $L_{a182}$ | $L_{b1}$ | 60 | $L_{a182}$ | $L_{b3}$ |
| 61 | $L_{a189}$ | $L_{b1}$ | 62 | $L_{a189}$ | $L_{b3}$ |
| 63 | $L_{a191}$ | $L_{b1}$ | 64 | $L_{a191}$ | $L_{b3}$ |
| 65 | $L_{a193}$ | $L_{b1}$ | 66 | $L_{a193}$ | $L_{b3}$ |
| 67 | $L_{a201}$ | $L_{b1}$ | 68 | $L_{a201}$ | $L_{b3}$ |
| 69 | $L_{a203}$ | $L_{b1}$ | 70 | $L_{a203}$ | $L_{b3}$ |
| 71 | $L_{a205}$ | $L_{b1}$ | 72 | $L_{a205}$ | $L_{b3}$ |
| 73 | $L_{a206}$ | $L_{b1}$ | 74 | $L_{a206}$ | $L_{b3}$ |
| 75 | $L_{a212}$ | $L_{b1}$ | 76 | $L_{a212}$ | $L_{b3}$ |
| 77 | $L_{a224}$ | $L_{b1}$ | 78 | $L_{a224}$ | $L_{b3}$ |
| 79 | $L_{a227}$ | $L_{b1}$ | 80 | $L_{a227}$ | $L_{b3}$ |
| 81 | $L_{a233}$ | $L_{b1}$ | 82 | $L_{a233}$ | $L_{b3}$ |
| 83 | $L_{a240}$ | $L_{b1}$ | 84 | $L_{a240}$ | $L_{b3}$ |
| 85 | $L_{a243}$ | $L_{b1}$ | 86 | $L_{a243}$ | $L_{b3}$ |
| 87 | $L_{a252}$ | $L_{b1}$ | 88 | $L_{a252}$ | $L_{b3}$ |
| 89 | $L_{a253}$ | $L_{b1}$ | 90 | $L_{a253}$ | $L_{b3}$ |
| 91 | $L_{a265}$ | $L_{b1}$ | 92 | $L_{a265}$ | $L_{b3}$ |
| 93 | $L_{a272}$ | $L_{b1}$ | 94 | $L_{a272}$ | $L_{b3}$ |
| 95 | $L_{a273}$ | $L_{b1}$ | 96 | $L_{a273}$ | $L_{b3}$ |
| 97 | $L_{a278}$ | $L_{b1}$ | 98 | $L_{a278}$ | $L_{b3}$ |
| 99 | $L_{a282}$ | $L_{b1}$ | 100 | $L_{a282}$ | $L_{b3}$ |
| 101 | $L_{a283}$ | $L_{b1}$ | 102 | $L_{a283}$ | $L_{b3}$ |
| 103 | $L_{a293}$ | $L_{b1}$ | 104 | $L_{a293}$ | $L_{b3}$ |
| 105 | $L_{a294}$ | $L_{b1}$ | 106 | $L_{a294}$ | $L_{b3}$ |
| 107 | $L_{a295}$ | $L_{b1}$ | 108 | $L_{a295}$ | $L_{b3}$ |
| 109 | $L_{a310}$ | $L_{b1}$ | 110 | $L_{a310}$ | $L_{b3}$ |
| 111 | $L_{a314}$ | $L_{b1}$ | 112 | $L_{a314}$ | $L_{b3}$ |
| 113 | $L_{a325}$ | $L_{b1}$ | 114 | $L_{a325}$ | $L_{b3}$ |
| 115 | $L_{a343}$ | $L_{b1}$ | 116 | $L_{a343}$ | $L_{b3}$ |
| 117 | $L_{a345}$ | $L_{b1}$ | 118 | $L_{a345}$ | $L_{b3}$ |
| 119 | $L_{a363}$ | $L_{b1}$ | 120 | $L_{a363}$ | $L_{b3}$ |
| 121 | $L_{a385}$ | $L_{b1}$ | 122 | $L_{a385}$ | $L_{b3}$ |
| 123 | $L_{a396}$ | $L_{b1}$ | 124 | $L_{a396}$ | $L_{b3}$ |
| 125 | $L_{a407}$ | $L_{b1}$ | 126 | $L_{a407}$ | $L_{b3}$ |
| 127 | $L_{a408}$ | $L_{b1}$ | 128 | $L_{a408}$ | $L_{b3}$ |
| 129 | $L_{a414}$ | $L_{b1}$ | 130 | $L_{a414}$ | $L_{b3}$ |
| 131 | $L_{a423}$ | $L_{b1}$ | 132 | $L_{a423}$ | $L_{b3}$ |
| 133 | $L_{a434}$ | $L_{b1}$ | 134 | $L_{a434}$ | $L_{b3}$ |
| 135 | $L_{a456}$ | $L_{b1}$ | 136 | $L_{a456}$ | $L_{b3}$ |
| 137 | $L_{a467}$ | $L_{b1}$ | 138 | $L_{a467}$ | $L_{b3}$ |
| 139 | $L_{a630}$ | $L_{b1}$ | 140 | $L_{a630}$ | $L_{b3}$ |
| 141 | $L_{a631}$ | $L_{b1}$ | 142 | $L_{a631}$ | $L_{b3}$ |
| 143 | $L_{a645}$ | $L_{b1}$ | 144 | $L_{a645}$ | $L_{b3}$ |
| 145 | $L_{a646}$ | $L_{b1}$ | 146 | $L_{a646}$ | $L_{b3}$ |
| 147 | $L_{a647}$ | $L_{b1}$ | 148 | $L_{a647}$ | $L_{b3}$ |
| 149 | $L_{a648}$ | $L_{b1}$ | 150 | $L_{a648}$ | $L_{b3}$ |
| 151 | $L_{a665}$ | $L_{b1}$ | 152 | $L_{a665}$ | $L_{b3}$ |
| 153 | $L_{a746}$ | $L_{b1}$ | 154 | $L_{a746}$ | $L_{b3}$ |
| 155 | $L_{a747}$ | $L_{b1}$ | 156 | $L_{a747}$ | $L_{b3}$ |
| 157 | $L_{a824}$ | $L_{b1}$ | 158 | $L_{a824}$ | $L_{b3}$ |
| 159 | $L_{a825}$ | $L_{b1}$ | 160 | $L_{a825}$ | $L_{b3}$ |
| 161 | $L_{a844}$ | $L_{b1}$ | 162 | $L_{a844}$ | $L_{b3}$ |
| 163 | $L_{a846}$ | $L_{b1}$ | 164 | $L_{a846}$ | $L_{b3}$ |
| 165 | $L_{a865}$ | $L_{b1}$ | 166 | $L_{a865}$ | $L_{b3}$ |
| 167 | $L_{a868}$ | $L_{b1}$ | 168 | $L_{a868}$ | $L_{b3}$ |
| 169 | $L_{a889}$ | $L_{b1}$ | 170 | $L_{a889}$ | $L_{b3}$ |
| 171 | $L_{a909}$ | $L_{b1}$ | 172 | $L_{a909}$ | $L_{b3}$ |
| 173 | $L_{a913}$ | $L_{b1}$ | 174 | $L_{a913}$ | $L_{b3}$ |
| 175 | $L_{a915}$ | $L_{b1}$ | 176 | $L_{a915}$ | $L_{b3}$ |
| 177 | $L_{a920}$ | $L_{b1}$ | 178 | $L_{a920}$ | $L_{b3}$ |
| 179 | $L_{a922}$ | $L_{b1}$ | 180 | $L_{a922}$ | $L_{b3}$ |
| 181 | $L_{a923}$ | $L_{b1}$ | 182 | $L_{a923}$ | $L_{b3}$ |
| 183 | $L_{a924}$ | $L_{b1}$ | 184 | $L_{a924}$ | $L_{b3}$ |
| 185 | $L_{a925}$ | $L_{b1}$ | 186 | $L_{a925}$ | $L_{b3}$ |
| 187 | $L_{a928}$ | $L_{b1}$ | 188 | $L_{a928}$ | $L_{b3}$ |
| 189 | $L_{a953}$ | $L_{b1}$ | 190 | $L_{a953}$ | $L_{b3}$ |
| 191 | $L_{a954}$ | $L_{b1}$ | 192 | $L_{a954}$ | $L_{b3}$ |
| 193 | $L_{a974}$ | $L_{b1}$ | 194 | $L_{a974}$ | $L_{b3}$ |
| 195 | $L_{a976}$ | $L_{b1}$ | 196 | $L_{a976}$ | $L_{b3}$ |
| 197 | $L_{a995}$ | $L_{b1}$ | 198 | $L_{a995}$ | $L_{b3}$ |
| 199 | $L_{a1006}$ | $L_{b1}$ | 200 | $L_{a1006}$ | $L_{b3}$ |
| 201 | $L_{a1017}$ | $L_{b1}$ | 202 | $L_{a1017}$ | $L_{b3}$ |
| 203 | $L_{a1018}$ | $L_{b1}$ | 204 | $L_{a1018}$ | $L_{b3}$ |
| 205 | $L_{a1023}$ | $L_{b1}$ | 206 | $L_{a1023}$ | $L_{b3}$ |

-continued

| Metal Complex No. | $L_a$ | $L_b$ | Metal Complex No. | $L_a$ | $L_b$ |
|---|---|---|---|---|---|
| 207 | $L_{a1024}$ | $L_{b1}$ | 208 | $L_{a1024}$ | $L_{b3}$ |
| 209 | $L_{a1026}$ | $L_{b1}$ | 210 | $L_{a1026}$ | $L_{b3}$ |
| 211 | $L_{a1088}$ | $L_{b1}$ | 212 | $L_{a1088}$ | $L_{b3}$ |
| 213 | $L_{a1089}$ | $L_{b1}$ | 214 | $L_{a1089}$ | $L_{b3}$ |
| 215 | $L_{a1095}$ | $L_{b1}$ | 216 | $L_{a1095}$ | $L_{b3}$ |
| 217 | $L_{a1100}$ | $L_{b1}$ | 218 | $L_{a1100}$ | $L_{b3}$ |
| 219 | $L_{a1116}$ | $L_{b1}$ | 220 | $L_{a1116}$ | $L_{b3}$ |
| 221 | $L_{a1118}$ | $L_{b1}$ | 222 | $L_{a1118}$ | $L_{b3}$ |
| 223 | $L_{a1136}$ | $L_{b1}$ | 224 | $L_{a1136}$ | $L_{b3}$ |
| 225 | $L_{a1148}$ | $L_{b1}$ | 226 | $L_{a1148}$ | $L_{b3}$ |
| 227 | $L_{a1158}$ | $L_{b1}$ | 228 | $L_{a1158}$ | $L_{b3}$ |
| 229 | $L_{a1159}$ | $L_{b1}$ | 230 | $L_{a1159}$ | $L_{b3}$ |
| 231 | $L_{a1161}$ | $L_{b1}$ | 232 | $L_{a1161}$ | $L_{b3}$ |
| 233 | $L_{a1166}$ | $L_{b1}$ | 234 | $L_{a1166}$ | $L_{b3}$ |
| 235 | $L_{a1171}$ | $L_{b1}$ | 236 | $L_{a1171}$ | $L_{b3}$ |
| 237 | $L_{a1187}$ | $L_{b1}$ | 238 | $L_{a1187}$ | $L_{b3}$ |
| 239 | $L_{a1192}$ | $L_{b1}$ | 240 | $L_{a1192}$ | $L_{b3}$ |
| 241 | $L_{a1205}$ | $L_{b1}$ | 242 | $L_{a1205}$ | $L_{b3}$ |
| 243 | $L_{a1208}$ | $L_{b1}$ | 244 | $L_{a1208}$ | $L_{b3}$ |
| 245 | $L_{a1217}$ | $L_{b1}$ | 246 | $L_{a1217}$ | $L_{b3}$ |
| 247 | $L_{a1219}$ | $L_{b1}$ | 248 | $L_{a1219}$ | $L_{b3}$ |
| 249 | $L_{a1230}$ | $L_{b1}$ | 250 | $L_{a1230}$ | $L_{b3}$ |
| 251 | $L_{a1237}$ | $L_{b1}$ | 252 | $L_{a1237}$ | $L_{b3}$ |
| 253 | $L_{a1238}$ | $L_{b1}$ | 254 | $L_{a1238}$ | $L_{b3}$ |
| 255 | $L_{a1239}$ | $L_{b1}$ | 256 | $L_{a1239}$ | $L_{b3}$ |
| 257 | $L_{a1245}$ | $L_{b1}$ | 258 | $L_{a1245}$ | $L_{b3}$ |
| 259 | $L_{a1246}$ | $L_{b1}$ | 260 | $L_{a1246}$ | $L_{b3}$ |
| 261 | $L_{a1247}$ | $L_{b1}$ | 262 | $L_{a1247}$ | $L_{b3}$ |
| 263 | $L_{a1248}$ | $L_{b1}$ | 264 | $L_{a1248}$ | $L_{b3}$ |
| 265 | $L_{a1258}$ | $L_{b1}$ | 266 | $L_{a1258}$ | $L_{b3}$ |
| 267 | $L_{a1260}$ | $L_{b1}$ | 268 | $L_{a1260}$ | $L_{b3}$ |
| 269 | $L_{a1261}$ | $L_{b1}$ | 270 | $L_{a1261}$ | $L_{b3}$ |
| 271 | $L_{a1277}$ | $L_{b1}$ | 272 | $L_{a1277}$ | $L_{b3}$ |
| 273 | $L_{a1278}$ | $L_{b1}$ | 274 | $L_{a1278}$ | $L_{b3}$ |
| 275 | $L_{a1279}$ | $L_{b1}$ | 276 | $L_{a1279}$ | $L_{b3}$ |
| 277 | $L_{a1288}$ | $L_{b1}$ | 278 | $L_{a1288}$ | $L_{b3}$ |
| 279 | $L_{a1289}$ | $L_{b1}$ | 280 | $L_{a1289}$ | $L_{b3}$ |
| 281 | $L_{a1301}$ | $L_{b1}$ | 282 | $L_{a1301}$ | $L_{b3}$ |
| 283 | $L_{a1302}$ | $L_{b1}$ | 284 | $L_{a1302}$ | $L_{b3}$ |
| 285 | $L_{a1442}$ | $L_{b1}$ | 286 | $L_{a1442}$ | $L_{b3}$ |
| 287 | $L_{a1448}$ | $L_{b1}$ | 288 | $L_{a1448}$ | $L_{b3}$ |
| 289 | $L_{a1449}$ | $L_{b1}$ | 290 | $L_{a1449}$ | $L_{b3}$ |
| 291 | $L_{a1460}$ | $L_{b1}$ | 292 | $L_{a1460}$ | $L_{b3}$ |
| 293 | $L_{a1471}$ | $L_{b1}$ | 294 | $L_{a1471}$ | $L_{b3}$ |
| 295 | $L_{a1569}$ | $L_{b1}$ | 296 | $L_{a1569}$ | $L_{b3}$ |
| 297 | $L_{a1570}$ | $L_{b1}$ | 298 | $L_{a1570}$ | $L_{b3}$ |
| 299 | $L_{a1647}$ | $L_{b1}$ | 300 | $L_{a1647}$ | $L_{b3}$ |
| 301 | $L_{a1648}$ | $L_{b1}$ | 302 | $L_{a1648}$ | $L_{b3}$ |
| 303 | $L_{a1649}$ | $L_{b1}$ | 304 | $L_{a1649}$ | $L_{b3}$ |
| 305 | $L_{a1650}$ | $L_{b1}$ | 306 | $L_{a1650}$ | $L_{b3}$ |
| 307 | $L_{a1651}$ | $L_{b1}$ | 308 | $L_{a1651}$ | $L_{b3}$ |
| 309 | $L_{a1677}$ | $L_{b1}$ | 310 | $L_{a1677}$ | $L_{b3}$ |
| 311 | $L_{a1678}$ | $L_{b1}$ | 312 | $L_{a1678}$ | $L_{b3}$ |
| 313 | $L_{a1679}$ | $L_{b1}$ | 314 | $L_{a1679}$ | $L_{b3}$ |
| 315 | $L_{a1680}$ | $L_{b1}$ | 316 | $L_{a1680}$ | $L_{b3}$ |
| 317 | $L_{a1691}$ | $L_{b1}$ | 318 | $L_{a1691}$ | $L_{b3}$ |
| 319 | $L_{a1693}$ | $L_{b1}$ | 320 | $L_{a1693}$ | $L_{b3}$ |
| 321 | $L_{a1695}$ | $L_{b1}$ | 322 | $L_{a1695}$ | $L_{b3}$ |
| 323 | $L_{a1696}$ | $L_{b1}$ | 324 | $L_{a1696}$ | $L_{b3}$ |
| 325 | $L_{a1699}$ | $L_{b1}$ | 326 | $L_{a1699}$ | $L_{b3}$ |
| 327 | $L_{a1701}$ | $L_{b1}$ | 328 | $L_{a1701}$ | $L_{b3}$ |
| 329 | $L_{a1702}$ | $L_{b1}$ | 330 | $L_{a1702}$ | $L_{b3}$ |
| 331 | $L_{a1712}$ | $L_{b1}$ | 332 | $L_{a1712}$ | $L_{b3}$ |
| 333 | $L_{a1713}$ | $L_{b1}$ | 334 | $L_{a1713}$ | $L_{b3}$ |
| 335 | $L_{a1735}$ | $L_{b1}$ | 336 | $L_{a1735}$ | $L_{b3}$ |
| 337 | $L_{a1795}$ | $L_{b1}$ | 338 | $L_{a1795}$ | $L_{b3}$ |
| 339 | $L_{a1820}$ | $L_{b1}$ | 340 | $L_{a1820}$ | $L_{b3}$ |
| 341 | $L_{a1891}$ | $L_{b1}$ | 342 | $L_{a1891}$ | $L_{b3}$ |
| 343 | $L_{a1892}$ | $L_{b1}$ | 344 | $L_{a1892}$ | $L_{b3}$ |
| 345 | $L_{a1893}$ | $L_{b1}$ | 346 | $L_{a1893}$ | $L_{b3}$ |
| 347 | $L_{a1899}$ | $L_{b1}$ | 348 | $L_{a1899}$ | $L_{b3}$ |
| 349 | $L_{a1902}$ | $L_{b1}$ | 350 | $L_{a1902}$ | $L_{b3}$ |
| 351 | $L_{a1913}$ | $L_{b1}$ | 352 | $L_{a1913}$ | $L_{b3}$ |
| 353 | $L_{a1914}$ | $L_{b1}$ | 354 | $L_{a1914}$ | $L_{b3}$ |
| 355 | $L_{a1933}$ | $L_{b1}$ | 356 | $L_{a1933}$ | $L_{b3}$ |
| 357 | $L_{a1945}$ | $L_{b1}$ | 358 | $L_{a1945}$ | $L_{b3}$ |

-continued

| Metal Complex No. | $L_a$ | $L_b$ | Metal Complex No. | $L_a$ | $L_b$ |
|---|---|---|---|---|---|
| 359 | $L_{a1954}$ | $L_{b1}$ | 360 | $L_{a1954}$ | $L_{b3}$ |
| 361 | $L_{a1955}$ | $L_{b1}$ | 362 | $L_{a1955}$ | $L_{b3}$ |
| 363 | $L_{a1956}$ | $L_{b1}$ | 364 | $L_{a1956}$ | $L_{b3}$ |
| 365 | $L_{a1962}$ | $L_{b1}$ | 366 | $L_{a1962}$ | $L_{b3}$ |
| 367 | $L_{a1964}$ | $L_{b1}$ | 368 | $L_{a1964}$ | $L_{b3}$ |
| 369 | $L_{a1965}$ | $L_{b1}$ | 370 | $L_{a1965}$ | $L_{b3}$ |
| 371 | $L_{a1966}$ | $L_{b1}$ | 372 | $L_{a1966}$ | $L_{b3}$ |
| 373 | $L_{a1970}$ | $L_{b1}$ | 374 | $L_{a1970}$ | $L_{b3}$ |
| 375 | $L_{a1973}$ | $L_{b1}$ | 376 | $L_{a1973}$ | $L_{b3}$ |
| 377 | $L_{a2002}$ | $L_{b1}$ | 378 | $L_{a2002}$ | $L_{b3}$ |
| 379 | $L_{a2003}$ | $L_{b1}$ | 380 | $L_{a2003}$ | $L_{b3}$ |
| 381 | $L_{a2013}$ | $L_{b1}$ | 382 | $L_{a2013}$ | $L_{b3}$ |
| 383 | $L_{a2014}$ | $L_{b1}$ | 384 | $L_{a2014}$ | $L_{b3}$ |
| 385 | $L_{a2015}$ | $L_{b1}$ | 386 | $L_{a2015}$ | $L_{b3}$ |
| 387 | $L_{a2033}$ | $L_{b1}$ | 388 | $L_{a2033}$ | $L_{b3}$ |
| 389 | $L_{a2104}$ | $L_{b1}$ | 390 | $L_{a2104}$ | $L_{b3}$ |
| 391 | $L_{a2326}$ | $L_{b1}$ | 392 | $L_{a2326}$ | $L_{b3}$ |
| 393 | $L_{a2337}$ | $L_{b1}$ | 394 | $L_{a2337}$ | $L_{b3}$ |
| 395 | $L_{a2436}$ | $L_{b1}$ | 396 | $L_{a2436}$ | $L_{b3}$ |
| 397 | $L_{a2437}$ | $L_{b1}$ | 398 | $L_{a2437}$ | $L_{b3}$ |
| 399 | $L_{a2514}$ | $L_{b1}$ | 400 | $L_{a2514}$ | $L_{b3}$ |
| 401 | $L_{a2612}$ | $L_{b1}$ | 402 | $L_{a2612}$ | $L_{b3}$ |
| 403 | $L_{a2618}$ | $L_{b1}$ | 404 | $L_{a2618}$ | $L_{b3}$ |
| 405 | $L_{a2643}$ | $L_{b1}$ | 406 | $L_{a2643}$ | $L_{b3}$ |
| 407 | $L_{a2654}$ | $L_{b1}$ | 408 | $L_{a2654}$ | $L_{b3}$ |
| 409 | $L_{a2714}$ | $L_{b1}$ | 410 | $L_{a2714}$ | $L_{b3}$ |
| 411 | $L_{a2785}$ | $L_{b1}$ | 412 | $L_{a2785}$ | $L_{b3}$ |
| 413 | $L_{a2856}$ | $L_{b1}$ | 414 | $L_{a2856}$ | $L_{b3}$ |
| 415 | $L_{a2927}$ | $L_{b1}$ | 416 | $L_{a2927}$ | $L_{b3}$ |
| 417 | $L_{a3337}$ | $L_{b1}$ | 418 | $L_{a3337}$ | $L_{b3}$ |
| 419 | $L_{a3338}$ | $L_{b1}$ | 420 | $L_{a3338}$ | $L_{b3}$ |
| 421 | $L_{a3339}$ | $L_{b1}$ | 422 | $L_{a3339}$ | $L_{b3}$ |
| 423 | $L_{a3340}$ | $L_{b1}$ | 424 | $L_{a3340}$ | $L_{b3}$ |
| 425 | $L_{a3341}$ | $L_{b1}$ | 426 | $L_{a3341}$ | $L_{b3}$ |
| 427 | $L_{a1}$ | $L_{b8}$ | 428 | $L_{a1}$ | $L_{b20}$ |
| 429 | $L_{a12}$ | $L_{b8}$ | 430 | $L_{a12}$ | $L_{b20}$ |
| 431 | $L_{a21}$ | $L_{b8}$ | 432 | $L_{a21}$ | $L_{b20}$ |
| 433 | $L_{a23}$ | $L_{b8}$ | 434 | $L_{a23}$ | $L_{b20}$ |
| 435 | $L_{a33}$ | $L_{b8}$ | 436 | $L_{a33}$ | $L_{b20}$ |
| 437 | $L_{a42}$ | $L_{b8}$ | 438 | $L_{a42}$ | $L_{b20}$ |
| 439 | $L_{a63}$ | $L_{b8}$ | 440 | $L_{a63}$ | $L_{b20}$ |
| 441 | $L_{a66}$ | $L_{b8}$ | 442 | $L_{a66}$ | $L_{b20}$ |
| 443 | $L_{a75}$ | $L_{b8}$ | 444 | $L_{a75}$ | $L_{b20}$ |
| 445 | $L_{a84}$ | $L_{b8}$ | 446 | $L_{a84}$ | $L_{b20}$ |
| 447 | $L_{a105}$ | $L_{b8}$ | 448 | $L_{a105}$ | $L_{b20}$ |
| 449 | $L_{a107}$ | $L_{b8}$ | 450 | $L_{a107}$ | $L_{b20}$ |
| 451 | $L_{a121}$ | $L_{b8}$ | 452 | $L_{a121}$ | $L_{b20}$ |
| 453 | $L_{a128}$ | $L_{b8}$ | 454 | $L_{a128}$ | $L_{b20}$ |
| 455 | $L_{a130}$ | $L_{b8}$ | 456 | $L_{a130}$ | $L_{b20}$ |
| 457 | $L_{a131}$ | $L_{b8}$ | 458 | $L_{a131}$ | $L_{b20}$ |
| 459 | $L_{a132}$ | $L_{b8}$ | 460 | $L_{a132}$ | $L_{b20}$ |
| 461 | $L_{a133}$ | $L_{b8}$ | 462 | $L_{a133}$ | $L_{b20}$ |
| 463 | $L_{a135}$ | $L_{b8}$ | 464 | $L_{a135}$ | $L_{b20}$ |
| 465 | $L_{a136}$ | $L_{b8}$ | 466 | $L_{a136}$ | $L_{b20}$ |
| 467 | $L_{a140}$ | $L_{b8}$ | 468 | $L_{a140}$ | $L_{b20}$ |
| 469 | $L_{a150}$ | $L_{b8}$ | 470 | $L_{a150}$ | $L_{b20}$ |
| 471 | $L_{a152}$ | $L_{b8}$ | 472 | $L_{a152}$ | $L_{b20}$ |
| 473 | $L_{a154}$ | $L_{b8}$ | 474 | $L_{a154}$ | $L_{b20}$ |
| 475 | $L_{a157}$ | $L_{b8}$ | 476 | $L_{a157}$ | $L_{b20}$ |
| 477 | $L_{a161}$ | $L_{b8}$ | 478 | $L_{a161}$ | $L_{b20}$ |
| 479 | $L_{a170}$ | $L_{b8}$ | 480 | $L_{a170}$ | $L_{b20}$ |
| 481 | $L_{a171}$ | $L_{b8}$ | 482 | $L_{a171}$ | $L_{b20}$ |
| 483 | $L_{a180}$ | $L_{b8}$ | 484 | $L_{a180}$ | $L_{b20}$ |
| 485 | $L_{a182}$ | $L_{b8}$ | 486 | $L_{a182}$ | $L_{b20}$ |
| 487 | $L_{a189}$ | $L_{b8}$ | 488 | $L_{a189}$ | $L_{b20}$ |
| 489 | $L_{a191}$ | $L_{b8}$ | 490 | $L_{a191}$ | $L_{b20}$ |
| 491 | $L_{a193}$ | $L_{b8}$ | 492 | $L_{a193}$ | $L_{b20}$ |
| 493 | $L_{a201}$ | $L_{b8}$ | 494 | $L_{a201}$ | $L_{b20}$ |
| 495 | $L_{a203}$ | $L_{b8}$ | 496 | $L_{a203}$ | $L_{b20}$ |
| 497 | $L_{a205}$ | $L_{b8}$ | 498 | $L_{a205}$ | $L_{b20}$ |
| 499 | $L_{a206}$ | $L_{b\&}$ | 500 | $L_{a206}$ | $L_{b20}$ |
| 501 | $L_{a212}$ | $L_{b8}$ | 502 | $L_{a212}$ | $L_{b20}$ |
| 503 | $L_{a224}$ | $L_{b8}$ | 504 | $L_{a224}$ | $L_{b20}$ |
| 505 | $L_{a227}$ | $L_{b8}$ | 506 | $L_{a227}$ | $L_{b20}$ |
| 507 | $L_{a233}$ | $L_{b8}$ | 508 | $L_{a233}$ | $L_{b20}$ |
| 509 | $L_{a240}$ | $L_{b8}$ | 510 | $L_{a240}$ | $L_{b20}$ |

-continued

| Metal Complex No. | $L_a$ | $L_b$ | Metal Complex No. | $L_a$ | $L_b$ |
|---|---|---|---|---|---|
| 511 | $L_{a243}$ | $L_{b8}$ | 512 | $L_{a243}$ | $L_{b20}$ |
| 513 | $L_{a252}$ | $L_{b8}$ | 514 | $L_{a252}$ | $L_{b20}$ |
| 515 | $L_{a253}$ | $L_{b8}$ | 516 | $L_{a253}$ | $L_{b20}$ |
| 517 | $L_{a265}$ | $L_{b8}$ | 518 | $L_{a265}$ | $L_{b20}$ |
| 519 | $L_{a272}$ | $L_{b8}$ | 520 | $L_{a272}$ | $L_{b20}$ |
| 521 | $L_{a273}$ | $L_{b8}$ | 522 | $L_{a273}$ | $L_{b20}$ |
| 523 | $L_{a278}$ | $L_{b8}$ | 524 | $L_{a278}$ | $L_{b20}$ |
| 525 | $L_{a282}$ | $L_{b8}$ | 526 | $L_{a282}$ | $L_{b20}$ |
| 527 | $L_{a283}$ | $L_{b8}$ | 528 | $L_{a283}$ | $L_{b20}$ |
| 529 | $L_{a293}$ | $L_{b8}$ | 530 | $L_{a293}$ | $L_{b20}$ |
| 531 | $L_{a294}$ | $L_{b8}$ | 532 | $L_{a294}$ | $L_{b20}$ |
| 533 | $L_{a295}$ | $L_{b8}$ | 534 | $L_{a295}$ | $L_{b20}$ |
| 535 | $L_{a310}$ | $L_{b8}$ | 536 | $L_{a310}$ | $L_{b20}$ |
| 537 | $L_{a314}$ | $L_{b8}$ | 538 | $L_{a314}$ | $L_{b20}$ |
| 539 | $L_{a325}$ | $L_{b8}$ | 540 | $L_{a325}$ | $L_{b20}$ |
| 541 | $L_{a343}$ | $L_{b8}$ | 542 | $L_{a343}$ | $L_{b20}$ |
| 543 | $L_{a345}$ | $L_{b8}$ | 544 | $L_{a345}$ | $L_{b20}$ |
| 545 | $L_{a363}$ | $L_{b8}$ | 546 | $L_{a363}$ | $L_{b20}$ |
| 547 | $L_{a385}$ | $L_{b8}$ | 548 | $L_{a385}$ | $L_{b20}$ |
| 549 | $L_{a396}$ | $L_{b8}$ | 550 | $L_{a396}$ | $L_{b20}$ |
| 551 | $L_{a407}$ | $L_{b8}$ | 552 | $L_{a407}$ | $L_{b20}$ |
| 553 | $L_{a408}$ | $L_{b8}$ | 554 | $L_{a408}$ | $L_{b20}$ |
| 555 | $L_{a414}$ | $L_{b8}$ | 556 | $L_{a414}$ | $L_{b20}$ |
| 557 | $L_{a423}$ | $L_{b8}$ | 558 | $L_{a423}$ | $L_{b20}$ |
| 559 | $L_{a434}$ | $L_{b8}$ | 560 | $L_{a434}$ | $L_{b20}$ |
| 561 | $L_{a456}$ | $L_{b8}$ | 562 | $L_{a456}$ | $L_{b20}$ |
| 563 | $L_{a467}$ | $L_{b8}$ | 564 | $L_{a467}$ | $L_{b20}$ |
| 565 | $L_{a630}$ | $L_{b8}$ | 566 | $L_{a630}$ | $L_{b20}$ |
| 567 | $L_{a631}$ | $L_{b8}$ | 568 | $L_{a631}$ | $L_{b20}$ |
| 569 | $L_{a645}$ | $L_{b8}$ | 570 | $L_{a645}$ | $L_{b20}$ |
| 571 | $L_{a646}$ | $L_{b8}$ | 572 | $L_{a646}$ | $L_{b20}$ |
| 573 | $L_{a647}$ | $L_{b8}$ | 574 | $L_{a647}$ | $L_{b20}$ |
| 575 | $L_{a648}$ | $L_{b8}$ | 576 | $L_{a648}$ | $L_{b20}$ |
| 577 | $L_{a665}$ | $L_{b8}$ | 578 | $L_{a665}$ | $L_{620}$ |
| 579 | $L_{a746}$ | $L_{b8}$ | 580 | $L_{a746}$ | $L_{b20}$ |
| 581 | $L_{a747}$ | $L_{b8}$ | 582 | $L_{a747}$ | $L_{b20}$ |
| 583 | $L_{a824}$ | $L_{b8}$ | 584 | $L_{a824}$ | $L_{b20}$ |
| 585 | $L_{a825}$ | $L_{b8}$ | 586 | $L_{a825}$ | $L_{b20}$ |
| 587 | $L_{a844}$ | $L_{b8}$ | 588 | $L_{a844}$ | $L_{b20}$ |
| 589 | $L_{a846}$ | $L_{b8}$ | 590 | $L_{a846}$ | $L_{b20}$ |
| 591 | $L_{a865}$ | $L_{b8}$ | 592 | $L_{a865}$ | $L_{b20}$ |
| 593 | $L_{a868}$ | $L_{b8}$ | 594 | $L_{a868}$ | $L_{b20}$ |
| 595 | $L_{a889}$ | $L_{b8}$ | 596 | $L_{a889}$ | $L_{b20}$ |
| 597 | $L_{a909}$ | $L_{b8}$ | 598 | $L_{a909}$ | $L_{b20}$ |
| 599 | $L_{a913}$ | $L_{b8}$ | 600 | $L_{a913}$ | $L_{b20}$ |
| 601 | $L_{a915}$ | $L_{b8}$ | 602 | $L_{a915}$ | $L_{b20}$ |
| 603 | $L_{a920}$ | $L_{b8}$ | 604 | $L_{a920}$ | $L_{b20}$ |
| 605 | $L_{a922}$ | $L_{b8}$ | 606 | $L_{a922}$ | $L_{b20}$ |
| 607 | $L_{a923}$ | $L_{b8}$ | 608 | $L_{a923}$ | $L_{b20}$ |
| 609 | $L_{a924}$ | $L_{b8}$ | 610 | $L_{a924}$ | $L_{b20}$ |
| 611 | $L_{a925}$ | $L_{b8}$ | 612 | $L_{a925}$ | $L_{b20}$ |
| 613 | $L_{a928}$ | $L_{b8}$ | 614 | $L_{a928}$ | $L_{b20}$ |
| 615 | $L_{a953}$ | $L_{b8}$ | 616 | $L_{a953}$ | $L_{b20}$ |
| 617 | $L_{a954}$ | $L_{b8}$ | 618 | $L_{a954}$ | $L_{b20}$ |
| 619 | $L_{a974}$ | $L_{b8}$ | 620 | $L_{a974}$ | $L_{b20}$ |
| 621 | $L_{a976}$ | $L_{b8}$ | 622 | $L_{a976}$ | $L_{b20}$ |
| 623 | $L_{a995}$ | $L_{b8}$ | 624 | $L_{a995}$ | $L_{b20}$ |
| 625 | $L_{a1006}$ | $L_{b8}$ | 626 | $L_{a1006}$ | $L_{b20}$ |
| 627 | $L_{a1017}$ | $L_{b8}$ | 628 | $L_{a1017}$ | $L_{b20}$ |
| 629 | $L_{a1018}$ | $L_{b8}$ | 630 | $L_{a1018}$ | $L_{b20}$ |
| 631 | $L_{a1023}$ | $L_{b8}$ | 632 | $L_{a1023}$ | $L_{b20}$ |
| 633 | $L_{a1024}$ | $L_{b8}$ | 634 | $L_{a1024}$ | $L_{b20}$ |
| 635 | $L_{a1026}$ | $L_{b8}$ | 636 | $L_{a1026}$ | $L_{b20}$ |
| 637 | $L_{a1088}$ | $L_{b8}$ | 638 | $L_{a1088}$ | $L_{b20}$ |
| 639 | $L_{a1089}$ | $L_{b8}$ | 640 | $L_{a1089}$ | $L_{b20}$ |
| 641 | $L_{a1095}$ | $L_{b8}$ | 642 | $L_{a1095}$ | $L_{b20}$ |
| 643 | $L_{a1100}$ | $L_{b8}$ | 644 | $L_{a1100}$ | $L_{b20}$ |
| 645 | $L_{a1116}$ | $L_{b8}$ | 646 | $L_{a1116}$ | $L_{b20}$ |
| 647 | $L_{a1118}$ | $L_{b8}$ | 648 | $L_{a1118}$ | $L_{b20}$ |
| 649 | $L_{a1136}$ | $L_{b8}$ | 650 | $L_{a1136}$ | $L_{b20}$ |
| 651 | $L_{a1148}$ | $L_{b8}$ | 652 | $L_{a1148}$ | $L_{b20}$ |
| 653 | $L_{a1158}$ | $L_{b8}$ | 654 | $L_{a1158}$ | $L_{b20}$ |
| 655 | $L_{a1159}$ | $L_{b8}$ | 656 | $L_{a1159}$ | $L_{b20}$ |
| 657 | $L_{a1161}$ | $L_{b8}$ | 658 | $L_{a1161}$ | $L_{b20}$ |
| 659 | $L_{a1166}$ | $L_{b8}$ | 660 | $L_{a1166}$ | $L_{b20}$ |
| 661 | $L_{a1171}$ | $L_{b8}$ | 662 | $L_{a1171}$ | $L_{b20}$ |

-continued

| Metal Complex No. | $L_a$ | $L_b$ | Metal Complex No. | $L_a$ | $L_b$ |
|---|---|---|---|---|---|
| 663 | $L_{a1187}$ | $L_{b8}$ | 664 | $L_{a1187}$ | $L_{b20}$ |
| 665 | $L_{a1192}$ | $L_{b8}$ | 666 | $L_{a1192}$ | $L_{b20}$ |
| 667 | $L_{a1205}$ | $L_{b8}$ | 668 | $L_{a1205}$ | $L_{b20}$ |
| 669 | $L_{a1208}$ | $L_{b8}$ | 670 | $L_{a1208}$ | $L_{b20}$ |
| 671 | $L_{a1217}$ | $L_{b8}$ | 672 | $L_{a1217}$ | $L_{b20}$ |
| 673 | $L_{a1219}$ | $L_{b8}$ | 674 | $L_{a1219}$ | $L_{b20}$ |
| 675 | $L_{a1230}$ | $L_{b8}$ | 676 | $L_{a1230}$ | $L_{b20}$ |
| 677 | $L_{a1237}$ | $L_{b8}$ | 678 | $L_{a1237}$ | $L_{b20}$ |
| 679 | $L_{a1238}$ | $L_{b8}$ | 680 | $L_{a1238}$ | $L_{b20}$ |
| 681 | $L_{a1239}$ | $L_{b8}$ | 682 | $L_{a1239}$ | $L_{b20}$ |
| 683 | $L_{a1245}$ | $L_{b8}$ | 684 | $L_{a1245}$ | $L_{b20}$ |
| 685 | $L_{a1246}$ | $L_{b8}$ | 686 | $L_{a1246}$ | $L_{b20}$ |
| 687 | $L_{a1247}$ | $L_{b8}$ | 688 | $L_{a1247}$ | $L_{b20}$ |
| 689 | $L_{a1248}$ | $L_{b8}$ | 690 | $L_{a1248}$ | $L_{b20}$ |
| 691 | $L_{a1258}$ | $L_{b8}$ | 692 | $L_{a1258}$ | $L_{b20}$ |
| 693 | $L_{a1260}$ | $L_{b8}$ | 694 | $L_{a1260}$ | $L_{b20}$ |
| 695 | $L_{a1261}$ | $L_{b8}$ | 696 | $L_{a1261}$ | $L_{b20}$ |
| 697 | $L_{a1277}$ | $L_{b8}$ | 698 | $L_{a1277}$ | $L_{b20}$ |
| 699 | $L_{a1278}$ | $L_{b8}$ | 700 | $L_{a1278}$ | $L_{b20}$ |
| 701 | $L_{a1279}$ | $L_{b8}$ | 702 | $L_{a1279}$ | $L_{b20}$ |
| 703 | $L_{a1288}$ | $L_{b8}$ | 704 | $L_{a1288}$ | $L_{b20}$ |
| 705 | $L_{a1289}$ | $L_{b8}$ | 706 | $L_{a1289}$ | $L_{b20}$ |
| 707 | $L_{a1301}$ | $L_{bs}$ | 708 | $L_{a1301}$ | $L_{b20}$ |
| 709 | $L_{a1302}$ | $L_{b8}$ | 710 | $L_{a1302}$ | $L_{b20}$ |
| 711 | $L_{a1442}$ | $L_{b8}$ | 712 | $L_{a1442}$ | $L_{b20}$ |
| 713 | $L_{a1448}$ | $L_{b8}$ | 714 | $L_{a1448}$ | $L_{b20}$ |
| 715 | $L_{a1449}$ | $L_{b8}$ | 716 | $L_{a1449}$ | $L_{b20}$ |
| 717 | $L_{a1460}$ | $L_{b8}$ | 718 | $L_{a1460}$ | $L_{b20}$ |
| 719 | $L_{a1471}$ | $L_{b8}$ | 720 | $L_{a1471}$ | $L_{b20}$ |
| 721 | $L_{a1569}$ | $L_{b8}$ | 722 | $L_{a1569}$ | $L_{b20}$ |
| 723 | $L_{a1570}$ | $L_{b8}$ | 724 | $L_{a1570}$ | $L_{b20}$ |
| 725 | $L_{a1647}$ | $L_{b8}$ | 726 | $L_{a1647}$ | $L_{b20}$ |
| 727 | $L_{a1648}$ | $L_{b8}$ | 728 | $L_{a1648}$ | $L_{b20}$ |
| 729 | $L_{a1649}$ | $L_{b8}$ | 730 | $L_{a1649}$ | $L_{b20}$ |
| 731 | $L_{a1650}$ | $L_{b8}$ | 732 | $L_{a1650}$ | $L_{b20}$ |
| 733 | $L_{a1651}$ | $L_{b8}$ | 734 | $L_{a1651}$ | $L_{b20}$ |
| 735 | $L_{a1677}$ | $L_{b8}$ | 736 | $L_{a1677}$ | $L_{b20}$ |
| 737 | $L_{a1678}$ | $L_{b8}$ | 738 | $L_{a1678}$ | $L_{b20}$ |
| 739 | $L_{a1679}$ | $L_{b8}$ | 740 | $L_{a1679}$ | $L_{b20}$ |
| 741 | $L_{a1680}$ | $L_{b8}$ | 742 | $L_{a1680}$ | $L_{b20}$ |
| 743 | $L_{a1691}$ | $L_{b8}$ | 744 | $L_{a1691}$ | $L_{b20}$ |
| 745 | $L_{a1693}$ | $L_{b8}$ | 746 | $L_{a1693}$ | $L_{b20}$ |
| 747 | $L_{a1695}$ | $L_{b8}$ | 748 | $L_{a1695}$ | $L_{b20}$ |
| 749 | $L_{a1696}$ | $L_{b8}$ | 750 | $L_{a1696}$ | $L_{b20}$ |
| 751 | $L_{a1699}$ | $L_{b8}$ | 752 | $L_{a1699}$ | $L_{b20}$ |
| 753 | $L_{a1701}$ | $L_{b8}$ | 754 | $L_{a1701}$ | $L_{b20}$ |
| 755 | $L_{a1702}$ | $L_{b8}$ | 756 | $L_{a1702}$ | $L_{b20}$ |
| 757 | $L_{a1712}$ | $L_{b8}$ | 758 | $L_{a1712}$ | $L_{b20}$ |
| 759 | $L_{a1713}$ | $L_{b8}$ | 760 | $L_{a1713}$ | $L_{b20}$ |
| 761 | $L_{a1735}$ | $L_{b8}$ | 762 | $L_{a1735}$ | $L_{b20}$ |
| 763 | $L_{a1795}$ | $L_{b8}$ | 764 | $L_{a1795}$ | $L_{b20}$ |
| 765 | $L_{a1820}$ | $L_{b8}$ | 766 | $L_{a1820}$ | $L_{b20}$ |
| 767 | $L_{a1891}$ | $L_{b8}$ | 768 | $L_{a1891}$ | $L_{b20}$ |
| 769 | $L_{a1892}$ | $L_{b8}$ | 770 | $L_{a1892}$ | $L_{b20}$ |
| 771 | $L_{a1893}$ | $L_{b8}$ | 772 | $L_{a1893}$ | $L_{b20}$ |
| 773 | $L_{a1899}$ | $L_{b8}$ | 774 | $L_{a1899}$ | $L_{b20}$ |
| 775 | $L_{a1902}$ | $L_{b8}$ | 776 | $L_{a1902}$ | $L_{b20}$ |
| 777 | $L_{a1913}$ | $L_{b8}$ | 778 | $L_{a1913}$ | $L_{b20}$ |
| 779 | $L_{a1914}$ | $L_{b8}$ | 780 | $L_{a1914}$ | $L_{b20}$ |
| 781 | $L_{a1933}$ | $L_{b8}$ | 782 | $L_{a1933}$ | $L_{b20}$ |
| 783 | $L_{a1945}$ | $L_{b8}$ | 784 | $L_{a1945}$ | $L_{b20}$ |
| 785 | $L_{a1954}$ | $L_{b8}$ | 786 | $L_{a1954}$ | $L_{b20}$ |
| 787 | $L_{a1955}$ | $L_{b8}$ | 788 | $L_{a1955}$ | $L_{b20}$ |
| 789 | $L_{a1956}$ | $L_{b8}$ | 790 | $L_{a1956}$ | $L_{b20}$ |
| 791 | $L_{a1962}$ | $L_{b8}$ | 792 | $L_{a1962}$ | $L_{b20}$ |
| 793 | $L_{a1964}$ | $L_{b8}$ | 794 | $L_{a1964}$ | $L_{b20}$ |
| 795 | $L_{a1965}$ | $L_{b8}$ | 796 | $L_{a1965}$ | $L_{b20}$ |
| 797 | $L_{a1966}$ | $L_{b8}$ | 798 | $L_{a1966}$ | $L_{b20}$ |
| 799 | $L_{a1970}$ | $L_{b8}$ | 800 | $L_{a1970}$ | $L_{b20}$ |
| 801 | $L_{a1973}$ | $L_{b8}$ | 802 | $L_{a1973}$ | $L_{b20}$ |
| 803 | $L_{a2002}$ | $L_{b8}$ | 804 | $L_{a2002}$ | $L_{b20}$ |
| 805 | $L_{a2003}$ | $L_{b8}$ | 806 | $L_{a2003}$ | $L_{b20}$ |
| 807 | $L_{a2013}$ | $L_{b8}$ | 808 | $L_{a2013}$ | $L_{620}$ |
| 809 | $L_{a2014}$ | $L_{b8}$ | 810 | $L_{a2014}$ | $L_{b20}$ |
| 811 | $L_{a2015}$ | $L_{b8}$ | 812 | $L_{a2015}$ | $L_{b20}$ |
| 813 | $L_{a2033}$ | $L_{b8}$ | 814 | $L_{a2033}$ | $L_{b20}$ |

-continued

| Metal Complex No. | $L_a$ | $L_b$ | Metal Complex No. | $L_a$ | $L_b$ |
|---|---|---|---|---|---|
| 815 | $L_{a2104}$ | $L_{b8}$ | 816 | $L_{a2104}$ | $L_{b20}$ |
| 817 | $L_{a2326}$ | $L_{b8}$ | 818 | $L_{a2326}$ | $L_{b20}$ |
| 819 | $L_{a2337}$ | $L_{b8}$ | 820 | $L_{a2337}$ | $L_{b20}$ |
| 821 | $L_{a2436}$ | $L_{b8}$ | 822 | $L_{a2436}$ | $L_{b20}$ |
| 823 | $L_{a2437}$ | $L_{b8}$ | 824 | $L_{a2437}$ | $L_{b20}$ |
| 825 | $L_{a2514}$ | $L_{b8}$ | 826 | $L_{a2514}$ | $L_{b20}$ |
| 827 | $L_{a2612}$ | $L_{b8}$ | 828 | $L_{a2612}$ | $L_{b20}$ |
| 829 | $L_{a2618}$ | $L_{b8}$ | 830 | $L_{a2618}$ | $L_{b20}$ |
| 831 | $L_{a2643}$ | $L_{b8}$ | 832 | $L_{a2643}$ | $L_{b20}$ |
| 833 | $L_{a2654}$ | $L_{b8}$ | 834 | $L_{a2654}$ | $L_{b20}$ |
| 835 | $L_{a2714}$ | $L_{b8}$ | 836 | $L_{a2714}$ | $L_{b20}$ |
| 837 | $L_{a2785}$ | $L_{b8}$ | 838 | $L_{a2785}$ | $L_{b20}$ |
| 839 | $L_{a2856}$ | $L_{b8}$ | 840 | $L_{a2856}$ | $L_{b20}$ |
| 841 | $L_{a2927}$ | $L_{b8}$ | 842 | $L_{a2927}$ | $L_{b20}$ |
| 843 | $L_{a3337}$ | $L_{b8}$ | 844 | $L_{a3337}$ | $L_{b20}$ |
| 845 | $L_{a3338}$ | $L_{b8}$ | 846 | $L_{a3338}$ | $L_{b20}$ |
| 847 | $L_{a3339}$ | $L_{b8}$ | 848 | $L_{a3339}$ | $L_{b20}$ |
| 849 | $L_{a3340}$ | $L_{b8}$ | 850 | $L_{a3340}$ | $L_{b20}$ |
| 851 | $L_{a3341}$ | $L_{b8}$ | 852 | $L_{a3341}$ | $L_{b20}$ |
| 853 | $L_{a1}$ | $L_{b118}$ | 854 | $L_{a1}$ | $L_{b132}$ |
| 855 | $L_{a12}$ | $L_{b118}$ | 856 | $L_{a12}$ | $L_{b132}$ |
| 857 | $L_{a21}$ | $L_{b118}$ | 858 | $L_{a21}$ | $L_{b132}$ |
| 859 | $L_{a23}$ | $L_{b118}$ | 860 | $L_{a23}$ | $L_{b132}$ |
| 861 | $L_{a33}$ | $L_{b118}$ | 862 | $L_{a33}$ | $L_{b132}$ |
| 863 | $L_{a42}$ | $L_{b118}$ | 864 | $L_{a42}$ | $L_{b132}$ |
| 865 | $L_{a63}$ | $L_{b118}$ | 866 | $L_{a63}$ | $L_{b132}$ |
| 867 | $L_{a66}$ | $L_{b118}$ | 868 | $L_{a66}$ | $L_{b132}$ |
| 869 | $L_{a75}$ | $L_{b118}$ | 870 | $L_{a75}$ | $L_{b132}$ |
| 871 | $L_{a84}$ | $L_{b118}$ | 872 | $L_{a84}$ | $L_{b132}$ |
| 873 | $L_{a105}$ | $L_{b118}$ | 874 | $L_{a105}$ | $L_{b132}$ |
| 875 | $L_{a107}$ | $L_{b118}$ | 876 | $L_{a107}$ | $L_{b132}$ |
| 877 | $L_{a121}$ | $L_{b118}$ | 878 | $L_{a121}$ | $L_{b132}$ |
| 879 | $L_{a128}$ | $L_{b118}$ | 880 | $L_{a128}$ | $L_{b132}$ |
| 881 | $L_{a130}$ | $L_{b118}$ | 882 | $L_{a130}$ | $L_{b132}$ |
| 883 | $L_{a131}$ | $L_{b118}$ | 884 | $L_{a131}$ | $L_{b132}$ |
| 885 | $L_{a132}$ | $L_{b118}$ | 886 | $L_{a132}$ | $L_{b132}$ |
| 887 | $L_{a133}$ | $L_{b118}$ | 888 | $L_{a133}$ | $L_{b132}$ |
| 889 | $L_{a135}$ | $L_{b118}$ | 890 | $L_{a135}$ | $L_{b132}$ |
| 891 | $L_{a136}$ | $L_{b118}$ | 892 | $L_{a136}$ | $L_{b132}$ |
| 893 | $L_{a140}$ | $L_{b118}$ | 894 | $L_{a140}$ | $L_{b132}$ |
| 895 | $L_{a150}$ | $L_{b118}$ | 896 | $L_{a150}$ | $L_{b132}$ |
| 897 | $L_{a152}$ | $L_{b118}$ | 898 | $L_{a152}$ | $L_{b132}$ |
| 899 | $L_{a154}$ | $L_{b118}$ | 900 | $L_{a154}$ | $L_{b132}$ |
| 901 | $L_{a157}$ | $L_{b118}$ | 902 | $L_{a157}$ | $L_{b132}$ |
| 903 | $L_{a161}$ | $L_{b118}$ | 904 | $L_{a161}$ | $L_{b132}$ |
| 905 | $L_{a170}$ | $L_{b118}$ | 906 | $L_{a170}$ | $L_{b132}$ |
| 907 | $L_{a171}$ | $L_{b118}$ | 908 | $L_{a171}$ | $L_{b132}$ |
| 909 | $L_{a180}$ | $L_{b118}$ | 910 | $L_{a180}$ | $L_{b132}$ |
| 911 | $L_{a182}$ | $L_{b118}$ | 912 | $L_{a182}$ | $L_{b132}$ |
| 913 | $L_{a189}$ | $L_{b118}$ | 914 | $L_{a189}$ | $L_{b132}$ |
| 915 | $L_{a191}$ | $L_{b118}$ | 916 | $L_{a191}$ | $L_{b132}$ |
| 917 | $L_{a193}$ | $L_{b118}$ | 918 | $L_{a193}$ | $L_{b132}$ |
| 919 | $L_{a201}$ | $L_{b118}$ | 920 | $L_{a201}$ | $L_{b132}$ |
| 921 | $L_{a203}$ | $L_{b118}$ | 922 | $L_{a203}$ | $L_{b132}$ |
| 923 | $L_{a205}$ | $L_{b118}$ | 924 | $L_{a205}$ | $L_{b132}$ |
| 925 | $L_{a206}$ | $L_{b118}$ | 926 | $L_{a206}$ | $L_{b132}$ |
| 927 | $L_{a212}$ | $L_{b118}$ | 928 | $L_{a212}$ | $L_{b132}$ |
| 929 | $L_{a224}$ | $L_{b118}$ | 930 | $L_{a224}$ | $L_{b132}$ |
| 931 | $L_{a227}$ | $L_{b118}$ | 932 | $L_{a227}$ | $L_{b132}$ |
| 933 | $L_{a233}$ | $L_{b118}$ | 934 | $L_{a233}$ | $L_{b132}$ |
| 935 | $L_{a240}$ | $L_{b118}$ | 936 | $L_{a240}$ | $L_{b132}$ |
| 937 | $L_{a243}$ | $L_{b118}$ | 938 | $L_{a243}$ | $L_{b132}$ |
| 939 | $L_{a252}$ | $L_{b118}$ | 940 | $L_{a252}$ | $L_{b132}$ |
| 941 | $L_{a253}$ | $L_{b118}$ | 942 | $L_{a253}$ | $L_{b132}$ |
| 943 | $L_{a265}$ | $L_{b118}$ | 944 | $L_{a265}$ | $L_{b132}$ |
| 945 | $L_{a272}$ | $L_{b118}$ | 946 | $L_{a272}$ | $L_{b132}$ |
| 947 | $L_{a273}$ | $L_{b118}$ | 948 | $L_{a273}$ | $L_{b132}$ |
| 949 | $L_{a278}$ | $L_{b118}$ | 950 | $L_{a278}$ | $L_{b132}$ |
| 951 | $L_{a282}$ | $L_{b118}$ | 952 | $L_{a282}$ | $L_{b132}$ |
| 953 | $L_{a283}$ | $L_{b118}$ | 954 | $L_{a283}$ | $L_{b132}$ |
| 955 | $L_{a293}$ | $L_{b118}$ | 956 | $L_{a293}$ | $L_{b132}$ |
| 957 | $L_{a294}$ | $L_{b118}$ | 958 | $L_{a294}$ | $L_{b132}$ |
| 959 | $L_{a295}$ | $L_{b118}$ | 960 | $L_{a295}$ | $L_{b132}$ |
| 961 | $L_{a310}$ | $L_{b118}$ | 962 | $L_{a310}$ | $L_{b132}$ |
| 963 | $L_{a314}$ | $L_{b118}$ | 964 | $L_{a314}$ | $L_{b132}$ |
| 965 | $L_{a325}$ | $L_{b118}$ | 966 | $L_{a325}$ | $L_{b132}$ |

-continued

| Metal Complex No. | $L_a$ | $L_b$ | Metal Complex No. | $L_a$ | $L_b$ |
|---|---|---|---|---|---|
| 967 | $L_{a343}$ | $L_{b118}$ | 968 | $L_{a343}$ | $L_{b132}$ |
| 969 | $L_{a345}$ | $L_{b118}$ | 970 | $L_{a345}$ | $L_{b132}$ |
| 971 | $L_{a363}$ | $L_{b118}$ | 972 | $L_{a363}$ | $L_{b132}$ |
| 973 | $L_{a385}$ | $L_{b118}$ | 974 | $L_{a385}$ | $L_{b132}$ |
| 975 | $L_{a396}$ | $L_{b118}$ | 976 | $L_{a396}$ | $L_{b132}$ |
| 977 | $L_{a407}$ | $L_{b118}$ | 978 | $L_{a407}$ | $L_{b132}$ |
| 979 | $L_{a408}$ | $L_{b118}$ | 980 | $L_{a408}$ | $L_{b132}$ |
| 981 | $L_{a414}$ | $L_{b118}$ | 982 | $L_{a414}$ | $L_{b132}$ |
| 983 | $L_{a423}$ | $L_{b118}$ | 984 | $L_{a423}$ | $L_{b132}$ |
| 985 | $L_{a434}$ | $L_{b118}$ | 986 | $L_{a434}$ | $L_{b132}$ |
| 987 | $L_{a456}$ | $L_{b118}$ | 988 | $L_{a456}$ | $L_{b132}$ |
| 989 | $L_{a467}$ | $L_{b118}$ | 990 | $L_{a467}$ | $L_{b132}$ |
| 991 | $L_{a630}$ | $L_{b118}$ | 992 | $L_{a630}$ | $L_{b132}$ |
| 993 | $L_{a631}$ | $L_{b118}$ | 994 | $L_{a631}$ | $L_{b132}$ |
| 995 | $L_{a645}$ | $L_{b118}$ | 996 | $L_{a645}$ | $L_{b132}$ |
| 997 | $L_{a646}$ | $L_{b118}$ | 998 | $L_{a646}$ | $L_{b132}$ |
| 999 | $L_{a647}$ | $L_{b118}$ | 1000 | $L_{a647}$ | $L_{b132}$ |
| 1001 | $L_{a648}$ | $L_{b118}$ | 1002 | $L_{a648}$ | $L_{b132}$ |
| 1003 | $L_{a665}$ | $L_{b118}$ | 1004 | $L_{a665}$ | $L_{b132}$ |
| 1005 | $L_{a746}$ | $L_{b118}$ | 1006 | $L_{a746}$ | $L_{b132}$ |
| 1007 | $L_{a747}$ | $L_{b118}$ | 1008 | $L_{a747}$ | $L_{b132}$ |
| 1009 | $L_{a824}$ | $L_{b118}$ | 1010 | $L_{a824}$ | $L_{b132}$ |
| 1011 | $L_{a825}$ | $L_{b118}$ | 1012 | $L_{a825}$ | $L_{b132}$ |
| 1013 | $L_{a844}$ | $L_{b118}$ | 1014 | $L_{a844}$ | $L_{b132}$ |
| 1015 | $L_{a846}$ | $L_{b118}$ | 1016 | $L_{a846}$ | $L_{b132}$ |
| 1017 | $L_{a865}$ | $L_{b118}$ | 1018 | $L_{a865}$ | $L_{b132}$ |
| 1019 | $L_{a868}$ | $L_{b118}$ | 1020 | $L_{a868}$ | $L_{b132}$ |
| 1021 | $L_{a889}$ | $L_{b118}$ | 1022 | $L_{a889}$ | $L_{b132}$ |
| 1023 | $L_{a909}$ | $L_{b118}$ | 1024 | $L_{a909}$ | $L_{b132}$ |
| 1025 | $L_{a913}$ | $L_{b118}$ | 1026 | $L_{a913}$ | $L_{b132}$ |
| 1027 | $L_{a915}$ | $L_{b118}$ | 1028 | $L_{a915}$ | $L_{b132}$ |
| 1029 | $L_{a920}$ | $L_{b118}$ | 1030 | $L_{a920}$ | $L_{b132}$ |
| 1031 | $L_{a922}$ | $L_{b118}$ | 1032 | $L_{a922}$ | $L_{b132}$ |
| 1033 | $L_{a923}$ | $L_{b118}$ | 1034 | $L_{a923}$ | $L_{b132}$ |
| 1035 | $L_{a924}$ | $L_{b118}$ | 1036 | $L_{a924}$ | $L_{b132}$ |
| 1037 | $L_{a925}$ | $L_{b118}$ | 1038 | $L_{a925}$ | $L_{b132}$ |
| 1039 | $L_{a928}$ | $L_{b118}$ | 1040 | $L_{a928}$ | $L_{b132}$ |
| 1041 | $L_{a953}$ | $L_{b118}$ | 1042 | $L_{a953}$ | $L_{b132}$ |
| 1043 | $L_{a954}$ | $L_{b118}$ | 1044 | $L_{a954}$ | $L_{b132}$ |
| 1045 | $L_{a974}$ | $L_{b118}$ | 1046 | $L_{a974}$ | $L_{b132}$ |
| 1047 | $L_{a976}$ | $L_{b118}$ | 1048 | $L_{a976}$ | $L_{b132}$ |
| 1049 | $L_{a995}$ | $L_{b118}$ | 1050 | $L_{a995}$ | $L_{b132}$ |
| 1051 | $L_{a1006}$ | $L_{b118}$ | 1052 | $L_{a1006}$ | $L_{b132}$ |
| 1053 | $L_{a1017}$ | $L_{b118}$ | 1054 | $L_{a1017}$ | $L_{b132}$ |
| 1055 | $L_{a1018}$ | $L_{b118}$ | 1056 | $L_{a1018}$ | $L_{b132}$ |
| 1057 | $L_{a1023}$ | $L_{b118}$ | 1058 | $L_{a1023}$ | $L_{b132}$ |
| 1059 | $L_{a1024}$ | $L_{b118}$ | 1060 | $L_{a1024}$ | $L_{b132}$ |
| 1061 | $L_{a1026}$ | $L_{b118}$ | 1062 | $L_{a1026}$ | $L_{b132}$ |
| 1063 | $L_{a1088}$ | $L_{b118}$ | 1064 | $L_{a1088}$ | $L_{b132}$ |
| 1065 | $L_{a1089}$ | $L_{b118}$ | 1066 | $L_{a1089}$ | $L_{b132}$ |
| 1067 | $L_{a1095}$ | $L_{b118}$ | 1068 | $L_{a1095}$ | $L_{b132}$ |
| 1069 | $L_{a1100}$ | $L_{b118}$ | 1070 | $L_{a1100}$ | $L_{b132}$ |
| 1071 | $L_{a1116}$ | $L_{b118}$ | 1072 | $L_{a1116}$ | $L_{b132}$ |
| 1073 | $L_{a1118}$ | $L_{b118}$ | 1074 | $L_{a1118}$ | $L_{b132}$ |
| 1075 | $L_{a1136}$ | $L_{b118}$ | 1076 | $L_{a1136}$ | $L_{b132}$ |
| 1077 | $L_{a1148}$ | $L_{b118}$ | 1078 | $L_{a1148}$ | $L_{b132}$ |
| 1079 | $L_{a1158}$ | $L_{b118}$ | 1080 | $L_{a1158}$ | $L_{b132}$ |
| 1081 | $L_{a1159}$ | $L_{b118}$ | 1082 | $L_{a1159}$ | $L_{b132}$ |
| 1083 | $L_{a1161}$ | $L_{b118}$ | 1084 | $L_{a1161}$ | $L_{b132}$ |
| 1085 | $L_{a1166}$ | $L_{b118}$ | 1086 | $L_{a1166}$ | $L_{b132}$ |
| 1087 | $L_{a1171}$ | $L_{b118}$ | 1088 | $L_{a1171}$ | $L_{b132}$ |
| 1089 | $L_{a1187}$ | $L_{b118}$ | 1090 | $L_{a1187}$ | $L_{b132}$ |
| 1091 | $L_{a1192}$ | $L_{b118}$ | 1092 | $L_{a1192}$ | $L_{b132}$ |
| 1093 | $L_{a1205}$ | $L_{b118}$ | 1094 | $L_{a1205}$ | $L_{b132}$ |
| 1095 | $L_{a1208}$ | $L_{b118}$ | 1096 | $L_{a1208}$ | $L_{b132}$ |
| 1097 | $L_{a1217}$ | $L_{b118}$ | 1098 | $L_{a1217}$ | $L_{b132}$ |
| 1099 | $L_{a1219}$ | $L_{b118}$ | 1100 | $L_{a1219}$ | $L_{b132}$ |
| 1101 | $L_{a1230}$ | $L_{b118}$ | 1102 | $L_{a1230}$ | $L_{b132}$ |
| 1103 | $L_{a1237}$ | $L_{b118}$ | 1104 | $L_{a1237}$ | $L_{b132}$ |
| 1105 | $L_{a1238}$ | $L_{b118}$ | 1106 | $L_{a1238}$ | $L_{b132}$ |
| 1107 | $L_{a1239}$ | $L_{b118}$ | 1108 | $L_{a1239}$ | $L_{b132}$ |
| 1109 | $L_{a1245}$ | $L_{b118}$ | 1110 | $L_{a1245}$ | $L_{b132}$ |
| 1111 | $L_{a1246}$ | $L_{b118}$ | 1112 | $L_{a1246}$ | $L_{b132}$ |
| 1113 | $L_{a1247}$ | $L_{b118}$ | 1114 | $L_{a1247}$ | $L_{b132}$ |
| 1115 | $L_{a1248}$ | $L_{b118}$ | 1116 | $L_{a1248}$ | $L_{b132}$ |
| 1117 | $L_{a1258}$ | $L_{b118}$ | 1118 | $L_{a1258}$ | $L_{b132}$ |

-continued

| Metal Complex No. | $L_a$ | $L_b$ | Metal Complex No. | $L_a$ | $L_b$ |
|---|---|---|---|---|---|
| 1119 | $L_{a1260}$ | $L_{b118}$ | 1120 | $L_{a1260}$ | $L_{b132}$ |
| 1121 | $L_{a1261}$ | $L_{b118}$ | 1122 | $L_{a1261}$ | $L_{b132}$ |
| 1123 | $L_{a1277}$ | $L_{b118}$ | 1124 | $L_{a1277}$ | $L_{b132}$ |
| 1125 | $L_{a1278}$ | $L_{b118}$ | 1126 | $L_{a1278}$ | $L_{b132}$ |
| 1127 | $L_{a1279}$ | $L_{b118}$ | 1128 | $L_{a1279}$ | $L_{b132}$ |
| 1129 | $L_{a1288}$ | $L_{b118}$ | 1130 | $L_{a1288}$ | $L_{b132}$ |
| 1131 | $L_{a1289}$ | $L_{b118}$ | 1132 | $L_{a1289}$ | $L_{b132}$ |
| 1133 | $L_{a1301}$ | $L_{b118}$ | 1134 | $L_{a1301}$ | $L_{b132}$ |
| 1135 | $L_{a1302}$ | $L_{b118}$ | 1136 | $L_{a1302}$ | $L_{b132}$ |
| 1137 | $L_{a1442}$ | $L_{b118}$ | 1138 | $L_{a1442}$ | $L_{b132}$ |
| 1139 | $L_{a1448}$ | $L_{b118}$ | 1140 | $L_{a1448}$ | $L_{b132}$ |
| 1141 | $L_{a1449}$ | $L_{b118}$ | 1142 | $L_{a1449}$ | $L_{b132}$ |
| 1143 | $L_{a1460}$ | $L_{b118}$ | 1144 | $L_{a1460}$ | $L_{b132}$ |
| 1145 | $L_{a1471}$ | $L_{b118}$ | 1146 | $L_{a1471}$ | $L_{b132}$ |
| 1147 | $L_{a1569}$ | $L_{b118}$ | 1148 | $L_{a1569}$ | $L_{b132}$ |
| 1149 | $L_{a1570}$ | $L_{b118}$ | 1150 | $L_{a1570}$ | $L_{b132}$ |
| 1151 | $L_{a1647}$ | $L_{b118}$ | 1152 | $L_{a1647}$ | $L_{b132}$ |
| 1153 | $L_{a1648}$ | $L_{b118}$ | 1154 | $L_{a1648}$ | $L_{b132}$ |
| 1155 | $L_{a1649}$ | $L_{b118}$ | 1156 | $L_{a1649}$ | $L_{b132}$ |
| 1157 | $L_{a1650}$ | $L_{b118}$ | 1158 | $L_{a1650}$ | $L_{b132}$ |
| 1159 | $L_{a1651}$ | $L_{b118}$ | 1160 | $L_{a1651}$ | $L_{b132}$ |
| 1161 | $L_{a1677}$ | $L_{b118}$ | 1162 | $L_{a1677}$ | $L_{b132}$ |
| 1163 | $L_{a1678}$ | $L_{b118}$ | 1164 | $L_{a1678}$ | $L_{b132}$ |
| 1165 | $L_{a1679}$ | $L_{b118}$ | 1166 | $L_{a1679}$ | $L_{b132}$ |
| 1167 | $L_{a1680}$ | $L_{b118}$ | 1168 | $L_{a1680}$ | $L_{b132}$ |
| 1169 | $L_{a1691}$ | $L_{b118}$ | 1170 | $L_{a1691}$ | $L_{b132}$ |
| 1171 | $L_{a1693}$ | $L_{b118}$ | 1172 | $L_{a1693}$ | $L_{b132}$ |
| 1173 | $L_{a1695}$ | $L_{b118}$ | 1174 | $L_{a1695}$ | $L_{b132}$ |
| 1175 | $L_{a1696}$ | $L_{b118}$ | 1176 | $L_{a1696}$ | $L_{b132}$ |
| 1177 | $L_{a1699}$ | $L_{b118}$ | 1178 | $L_{a1699}$ | $L_{b132}$ |
| 1179 | $L_{a1701}$ | $L_{b118}$ | 1180 | $L_{a1701}$ | $L_{b132}$ |
| 1181 | $L_{a1702}$ | $L_{b118}$ | 1182 | $L_{a1702}$ | $L_{b132}$ |
| 1183 | $L_{a1712}$ | $L_{b118}$ | 1184 | $L_{a1712}$ | $L_{b132}$ |
| 1185 | $L_{a1713}$ | $L_{b118}$ | 1186 | $L_{a1713}$ | $L_{b132}$ |
| 1187 | $L_{a1735}$ | $L_{b118}$ | 1188 | $L_{a1735}$ | $L_{b132}$ |
| 1189 | $L_{a1795}$ | $L_{b118}$ | 1190 | $L_{a1795}$ | $L_{b132}$ |
| 1191 | $L_{a1820}$ | $L_{b118}$ | 1192 | $L_{a1820}$ | $L_{b132}$ |
| 1193 | $L_{a1891}$ | $L_{b118}$ | 1194 | $L_{a1891}$ | $L_{b132}$ |
| 1195 | $L_{a1892}$ | $L_{b118}$ | 1196 | $L_{a1892}$ | $L_{b132}$ |
| 1197 | $L_{a1893}$ | $L_{b118}$ | 1198 | $L_{a1893}$ | $L_{b132}$ |
| 1199 | $L_{a1899}$ | $L_{b118}$ | 1200 | $L_{a1899}$ | $L_{b132}$ |
| 1201 | $L_{a1902}$ | $L_{b118}$ | 1202 | $L_{a1902}$ | $L_{b132}$ |
| 1203 | $L_{a1913}$ | $L_{b118}$ | 1204 | $L_{a1913}$ | $L_{b132}$ |
| 1205 | $L_{a1914}$ | $L_{b118}$ | 1206 | $L_{a1914}$ | $L_{b132}$ |
| 1207 | $L_{a1933}$ | $L_{b118}$ | 1208 | $L_{a1933}$ | $L_{b132}$ |
| 1209 | $L_{a1945}$ | $L_{b118}$ | 1210 | $L_{a1945}$ | $L_{b132}$ |
| 1211 | $L_{a1954}$ | $L_{b118}$ | 1212 | $L_{a1954}$ | $L_{b132}$ |
| 1213 | $L_{a1955}$ | $L_{b118}$ | 1214 | $L_{a1955}$ | $L_{b132}$ |
| 1215 | $L_{a1956}$ | $L_{b118}$ | 1216 | $L_{a1956}$ | $L_{b132}$ |
| 1217 | $L_{a1962}$ | $L_{b118}$ | 1218 | $L_{a1962}$ | $L_{b132}$ |
| 1219 | $L_{a1964}$ | $L_{b118}$ | 1220 | $L_{a1964}$ | $L_{b132}$ |
| 1221 | $L_{a1965}$ | $L_{b118}$ | 1222 | $L_{a1965}$ | $L_{b132}$ |
| 1223 | $L_{a1966}$ | $L_{b118}$ | 1224 | $L_{a1966}$ | $L_{b132}$ |
| 1225 | $L_{a1970}$ | $L_{b118}$ | 1226 | $L_{a1970}$ | $L_{b132}$ |
| 1227 | $L_{a1973}$ | $L_{b118}$ | 1228 | $L_{a1973}$ | $L_{b132}$ |
| 1229 | $L_{a2002}$ | $L_{b118}$ | 1230 | $L_{a2002}$ | $L_{b132}$ |
| 1231 | $L_{a2003}$ | $L_{b118}$ | 1232 | $L_{a2003}$ | $L_{b132}$ |
| 1233 | $L_{a2013}$ | $L_{b118}$ | 1234 | $L_{a2013}$ | $L_{b132}$ |
| 1235 | $L_{a2014}$ | $L_{b118}$ | 1236 | $L_{a2014}$ | $L_{b132}$ |
| 1237 | $L_{a2015}$ | $L_{b118}$ | 1238 | $L_{a2015}$ | $L_{b132}$ |
| 1239 | $L_{a2033}$ | $L_{b118}$ | 1240 | $L_{a2033}$ | $L_{b132}$ |
| 1241 | $L_{a2104}$ | $L_{b118}$ | 1242 | $L_{a2104}$ | $L_{b132}$ |
| 1243 | $L_{a2326}$ | $L_{b118}$ | 1244 | $L_{a2326}$ | $L_{b132}$ |
| 1245 | $L_{a2337}$ | $L_{b118}$ | 1246 | $L_{a2337}$ | $L_{b132}$ |
| 1247 | $L_{a2436}$ | $L_{b118}$ | 1248 | $L_{a2436}$ | $L_{b132}$ |
| 1249 | $L_{a2437}$ | $L_{b118}$ | 1250 | $L_{a2437}$ | $L_{b132}$ |
| 1251 | $L_{a2514}$ | $L_{b118}$ | 1252 | $L_{a2514}$ | $L_{b132}$ |
| 1253 | $L_{a2612}$ | $L_{b118}$ | 1254 | $L_{a2612}$ | $L_{b132}$ |
| 1255 | $L_{a2618}$ | $L_{b118}$ | 1256 | $L_{a2618}$ | $L_{b132}$ |
| 1257 | $L_{a2643}$ | $L_{b118}$ | 1258 | $L_{a2643}$ | $L_{b132}$ |
| 1259 | $L_{a2654}$ | $L_{b118}$ | 1260 | $L_{a2654}$ | $L_{b132}$ |
| 1261 | $L_{a2714}$ | $L_{b118}$ | 1262 | $L_{a2714}$ | $L_{b132}$ |
| 1263 | $L_{a2785}$ | $L_{b118}$ | 1264 | $L_{a2785}$ | $L_{b132}$ |
| 1265 | $L_{a2856}$ | $L_{b118}$ | 1266 | $L_{a2856}$ | $L_{b132}$ |
| 1267 | $L_{a2927}$ | $L_{b118}$ | 1268 | $L_{a2927}$ | $L_{b132}$ |
| 1269 | $L_{a3337}$ | $L_{b118}$ | 1270 | $L_{a3337}$ | $L_{b132}$ |

-continued

| Metal Complex No. | $L_a$ | $L_b$ | Metal Complex No. | $L_a$ | $L_b$ |
|---|---|---|---|---|---|
| 1271 | $L_{a3338}$ | $L_{b118}$ | 1272 | $L_{a3338}$ | $L_{b132}$ |
| 1273 | $L_{a3339}$ | $L_{b118}$ | 1274 | $L_{a3339}$ | $L_{b132}$ |
| 1275 | $L_{a3340}$ | $L_{b118}$ | 1276 | $L_{a3340}$ | $L_{b132}$ |
| 1277 | $L_{a3341}$ | $L_{b118}$ | 1278 | $L_{a3341}$ | $L_{b132}$ |
| 1279 | $L_{a1}$ | $L_{b52}$ | 1280 | $L_{a88}$ | $L_{b52}$ |
| 1281 | $L_{a12}$ | $L_{b52}$ | 1282 | $L_{a89}$ | $L_{b52}$ |
| 1283 | $L_{a21}$ | $L_{b52}$ | 1284 | $L_{a90}$ | $L_{b52}$ |
| 1285 | $L_{a23}$ | $L_{b52}$ | 1286 | $L_{a91}$ | $L_{b52}$ |
| 1287 | $L_{a33}$ | $L_{b52}$ | 1288 | $L_{a92}$ | $L_{b52}$ |
| 1289 | $L_{a42}$ | $L_{b52}$ | 1290 | $L_{a100}$ | $L_{b52}$ |
| 1291 | $L_{a63}$ | $L_{b52}$ | 1292 | $L_{a101}$ | $L_{b52}$ |
| 1293 | $L_{a66}$ | $L_{b52}$ | 1294 | $L_{a102}$ | $L_{b52}$ |
| 1295 | $L_{a75}$ | $L_{b52}$ | 1296 | $L_{a103}$ | $L_{b52}$ |
| 1297 | $L_{a84}$ | $L_{b52}$ | 1298 | $L_{a174}$ | $L_{b52}$ |
| 1299 | $L_{a105}$ | $L_{b52}$ | 1300 | $L_{a175}$ | $L_{b52}$ |
| 1301 | $L_{a107}$ | $L_{b52}$ | 1302 | $L_{a176}$ | $L_{b52}$ |
| 1303 | $L_{a121}$ | $L_{b52}$ | 1304 | $L_{a177}$ | $L_{b52}$ |
| 1305 | $L_{a128}$ | $L_{b52}$ | 1306 | $L_{a209}$ | $L_{b52}$ |
| 1307 | $L_{a130}$ | $L_{b52}$ | 1308 | $L_{a210}$ | $L_{b52}$ |
| 1309 | $L_{a131}$ | $L_{b52}$ | 1310 | $L_{a221}$ | $L_{b52}$ |
| 1311 | $L_{a132}$ | $L_{b52}$ | 1312 | $L_{a222}$ | $L_{b52}$ |
| 1313 | $L_{a133}$ | $L_{b52}$ | 1314 | $L_{a248}$ | $L_{b52}$ |
| 1315 | $L_{a135}$ | $L_{b52}$ | 1316 | $L_{a249}$ | $L_{b52}$ |
| 1317 | $L_{a136}$ | $L_{b52}$ | 1318 | $L_{a250}$ | $L_{b52}$ |
| 1319 | $L_{a140}$ | $L_{b52}$ | 1320 | $L_{a268}$ | $L_{b52}$ |
| 1321 | $L_{a150}$ | $L_{b52}$ | 1322 | $L_{a269}$ | $L_{b52}$ |
| 1323 | $L_{a152}$ | $L_{b52}$ | 1324 | $L_{a301}$ | $L_{b52}$ |
| 1325 | $L_{a154}$ | $L_{b52}$ | 1326 | $L_{a302}$ | $L_{b52}$ |
| 1327 | $L_{a157}$ | $L_{b52}$ | 1328 | $L_{a303}$ | $L_{b52}$ |
| 1329 | $L_{a161}$ | $L_{b52}$ | 1330 | $L_{a304}$ | $L_{b52}$ |
| 1331 | $L_{a170}$ | $L_{b52}$ | 1332 | $L_{a322}$ | $L_{b52}$ |
| 1333 | $L_{a171}$ | $L_{b52}$ | 1334 | $L_{a323}$ | $L_{b52}$ |
| 1335 | $L_{a180}$ | $L_{b52}$ | 1336 | $L_{a324}$ | $L_{b52}$ |
| 1337 | $L_{a182}$ | $L_{b52}$ | 1338 | $L_{a336}$ | $L_{b52}$ |
| 1339 | $L_{a189}$ | $L_{b52}$ | 1340 | $L_{a337}$ | $L_{b52}$ |
| 1341 | $L_{a191}$ | $L_{b52}$ | 1342 | $L_{a338}$ | $L_{b52}$ |
| 1343 | $L_{a193}$ | $L_{b52}$ | 1344 | $L_{a365}$ | $L_{b52}$ |
| 1345 | $L_{a201}$ | $L_{b52}$ | 1346 | $L_{a366}$ | $L_{b52}$ |
| 1347 | $L_{a203}$ | $L_{b52}$ | 1348 | $L_{a367}$ | $L_{b52}$ |
| 1349 | $L_{a205}$ | $L_{b52}$ | 1350 | $L_{a381}$ | $L_{b52}$ |
| 1351 | $L_{a206}$ | $L_{b52}$ | 1352 | $L_{a382}$ | $L_{b52}$ |
| 1353 | $L_{a212}$ | $L_{b52}$ | 1354 | $L_{a383}$ | $L_{b52}$ |
| 1355 | $L_{a224}$ | $L_{b52}$ | 1356 | $L_{a417}$ | $L_{b52}$ |
| 1357 | $L_{a227}$ | $L_{b52}$ | 1358 | $L_{a418}$ | $L_{b52}$ |
| 1359 | $L_{a233}$ | $L_{b52}$ | 1360 | $L_{a419}$ | $L_{b52}$ |
| 1361 | $L_{a240}$ | $L_{b52}$ | 1362 | $L_{a420}$ | $L_{b52}$ |
| 1363 | $L_{a243}$ | $L_{b52}$ | 1364 | $L_{a437}$ | $L_{b52}$ |
| 1365 | $L_{a252}$ | $L_{b52}$ | 1366 | $L_{a438}$ | $L_{b52}$ |
| 1367 | $L_{a253}$ | $L_{b52}$ | 1368 | $L_{a439}$ | $L_{b52}$ |
| 1369 | $L_{a265}$ | $L_{b52}$ | 1370 | $L_{a453}$ | $L_{b52}$ |
| 1371 | $L_{a272}$ | $L_{b52}$ | 1372 | $L_{a454}$ | $L_{b52}$ |
| 1373 | $L_{a273}$ | $L_{b52}$ | 1374 | $L_{a464}$ | $L_{b52}$ |
| 1375 | $L_{a278}$ | $L_{b52}$ | 1376 | $L_{a465}$ | $L_{b52}$ |
| 1377 | $L_{a282}$ | $L_{b52}$ | 1378 | $L_{a466}$ | $L_{b52}$ |
| 1379 | $L_{a283}$ | $L_{b52}$ | 1380 | $L_{a467}$ | $L_{b52}$ |
| 1381 | $L_{a293}$ | $L_{b52}$ | 1382 | $L_{a485}$ | $L_{b52}$ |
| 1383 | $L_{a294}$ | $L_{b52}$ | 1384 | $L_{a486}$ | $L_{b52}$ |
| 1385 | $L_{a295}$ | $L_{b52}$ | 1386 | $L_{a487}$ | $L_{b52}$ |
| 1387 | $L_{a310}$ | $L_{b52}$ | 1388 | $L_{a504}$ | $L_{b52}$ |
| 1389 | $L_{a314}$ | $L_{b52}$ | 1390 | $L_{a505}$ | $L_{b52}$ |
| 1391 | $L_{a325}$ | $L_{b52}$ | 1392 | $L_{a506}$ | $L_{b52}$ |
| 1393 | $L_{a343}$ | $L_{b52}$ | 1394 | $L_{a507}$ | $L_{b52}$ |
| 1395 | $L_{a345}$ | $L_{b52}$ | 1396 | $L_{a534}$ | $L_{b52}$ |
| 1397 | $L_{a363}$ | $L_{b52}$ | 1398 | $L_{a535}$ | $L_{b52}$ |
| 1399 | $L_{a385}$ | $L_{b52}$ | 1400 | $L_{a536}$ | $L_{b52}$ |
| 1401 | $L_{a396}$ | $L_{b52}$ | 1402 | $L_{a548}$ | $L_{b52}$ |
| 1403 | $L_{a407}$ | $L_{b52}$ | 1404 | $L_{a549}$ | $L_{b52}$ |
| 1405 | $L_{a408}$ | $L_{b52}$ | 1406 | $L_{a550}$ | $L_{b52}$ |
| 1407 | $L_{a414}$ | $L_{b52}$ | 1408 | $L_{a551}$ | $L_{b52}$ |
| 1409 | $L_{a423}$ | $L_{b52}$ | 1410 | $L_{a575}$ | $L_{b52}$ |
| 1411 | $L_{a434}$ | $L_{b52}$ | 1412 | $L_{a576}$ | $L_{b52}$ |
| 1413 | $L_{a456}$ | $L_{b52}$ | 1414 | $L_{a604}$ | $L_{b52}$ |
| 1415 | $L_{a467}$ | $L_{b52}$ | 1416 | $L_{a605}$ | $L_{b52}$ |
| 1417 | $L_{a630}$ | $L_{b52}$ | 1418 | $L_{a606}$ | $L_{b52}$ |
| 1419 | $L_{a631}$ | $L_{b52}$ | 1420 | $L_{a607}$ | $L_{b52}$ |
| 1421 | $L_{a645}$ | $L_{b52}$ | 1422 | $L_{a637}$ | $L_{b52}$ |

-continued

| Metal Complex No. | $L_a$ | $L_b$ | Metal Complex No. | $L_a$ | $L_b$ |
|---|---|---|---|---|---|
| 1423 | $L_{a646}$ | $L_{b52}$ | 1424 | $L_{a638}$ | $L_{b52}$ |
| 1425 | $L_{a647}$ | $L_{b52}$ | 1426 | $L_{a639}$ | $L_{b52}$ |
| 1427 | $L_{a648}$ | $L_{b52}$ | 1428 | $L_{a654}$ | $L_{b52}$ |
| 1429 | $L_{a665}$ | $L_{b52}$ | 1430 | $L_{a655}$ | $L_{b52}$ |
| 1431 | $L_{a746}$ | $L_{b52}$ | 1432 | $L_{a656}$ | $L_{b52}$ |
| 1433 | $L_{a747}$ | $L_{b52}$ | 1434 | $L_{a657}$ | $L_{b52}$ |
| 1435 | $L_{a824}$ | $L_{b52}$ | 1436 | $L_{a670}$ | $L_{b52}$ |
| 1437 | $L_{a825}$ | $L_{b52}$ | 1438 | $L_{a671}$ | $L_{b52}$ |
| 1439 | $L_{a844}$ | $L_{b52}$ | 1440 | $L_{a672}$ | $L_{b52}$ |
| 1441 | $L_{a846}$ | $L_{b52}$ | 1442 | $L_{a673}$ | $L_{b52}$ |
| 1443 | $L_{a865}$ | $L_{b52}$ | 1444 | $L_{a674}$ | $L_{b52}$ |
| 1445 | $L_{a868}$ | $L_{b52}$ | 1446 | $L_{a675}$ | $L_{b52}$ |
| 1447 | $L_{a889}$ | $L_{b52}$ | 1448 | $L_{a684}$ | $L_{b52}$ |
| 1449 | $L_{a909}$ | $L_{b52}$ | 1450 | $L_{a685}$ | $L_{b52}$ |
| 1451 | $L_{a913}$ | $L_{b52}$ | 1452 | $L_{a686}$ | $L_{b52}$ |
| 1453 | $L_{a915}$ | $L_{b52}$ | 1454 | $L_{a687}$ | $L_{b52}$ |
| 1455 | $L_{a920}$ | $L_{b52}$ | 1456 | $L_{a701}$ | $L_{b52}$ |
| 1457 | $L_{a922}$ | $L_{b52}$ | 1458 | $L_{a702}$ | $L_{b52}$ |
| 1459 | $L_{a923}$ | $L_{b52}$ | 1460 | $L_{a703}$ | $L_{b52}$ |
| 1461 | $L_{a924}$ | $L_{b52}$ | 1462 | $L_{a704}$ | $L_{b52}$ |
| 1463 | $L_{a925}$ | $L_{b52}$ | 1464 | $L_{a708}$ | $L_{b52}$ |
| 1465 | $L_{a928}$ | $L_{b52}$ | 1466 | $L_{a709}$ | $L_{b52}$ |
| 1467 | $L_{a953}$ | $L_{b52}$ | 1468 | $L_{a710}$ | $L_{b52}$ |
| 1469 | $L_{a954}$ | $L_{b52}$ | 1470 | $L_{a711}$ | $L_{b52}$ |
| 1471 | $L_{a974}$ | $L_{b52}$ | 1472 | $L_{a712}$ | $L_{b52}$ |
| 1473 | $L_{a976}$ | $L_{b52}$ | 1474 | $L_{a713}$ | $L_{b52}$ |
| 1475 | $L_{a995}$ | $L_{b52}$ | 1476 | $L_{a714}$ | $L_{b52}$ |
| 1477 | $L_{a1006}$ | $L_{b52}$ | 1478 | $L_{a729}$ | $L_{b52}$ |
| 1479 | $L_{a1017}$ | $L_{b52}$ | 1480 | $L_{a731}$ | $L_{b52}$ |
| 1481 | $L_{a1018}$ | $L_{b52}$ | 1482 | $L_{a732}$ | $L_{b52}$ |
| 1483 | $L_{a1023}$ | $L_{b52}$ | 1484 | $L_{a733}$ | $L_{b52}$ |
| 1485 | $L_{a1024}$ | $L_{b52}$ | 1486 | $L_{a741}$ | $L_{b52}$ |
| 1487 | $L_{a1026}$ | $L_{b52}$ | 1488 | $L_{a742}$ | $L_{b52}$ |
| 1489 | $L_{a1088}$ | $L_{b52}$ | 1490 | $L_{a743}$ | $L_{b52}$ |
| 1491 | $L_{a1089}$ | $L_{b52}$ | 1492 | $L_{a744}$ | $L_{b52}$ |
| 1493 | $L_{a1095}$ | $L_{b52}$ | 1494 | $L_{a748}$ | $L_{b52}$ |
| 1495 | $L_{a1100}$ | $L_{b52}$ | 1496 | $L_{a749}$ | $L_{b52}$ |
| 1497 | $L_{a1116}$ | $L_{b52}$ | 1498 | $L_{a750}$ | $L_{b52}$ |
| 1499 | $L_{a1118}$ | $L_{b52}$ | 1500 | $L_{a751}$ | $L_{b52}$ |
| 1501 | $L_{a1136}$ | $L_{b52}$ | 1502 | $L_{a752}$ | $L_{b52}$ |
| 1503 | $L_{a1148}$ | $L_{b52}$ | 1504 | $L_{a753}$ | $L_{b52}$ |
| 1505 | $L_{a1158}$ | $L_{b52}$ | 1506 | $L_{a754}$ | $L_{b52}$ |
| 1507 | $L_{a1159}$ | $L_{b52}$ | 1508 | $L_{a755}$ | $L_{b52}$ |
| 1509 | $L_{a1161}$ | $L_{b52}$ | 1510 | $L_{a756}$ | $L_{b52}$ |
| 1511 | $L_{a1166}$ | $L_{b52}$ | 1512 | $L_{a757}$ | $L_{b52}$ |
| 1513 | $L_{a1171}$ | $L_{b52}$ | 1514 | $L_{a758}$ | $L_{b52}$ |
| 1515 | $L_{a1187}$ | $L_{b52}$ | 1516 | $L_{a766}$ | $L_{b52}$ |
| 1517 | $L_{a1192}$ | $L_{b52}$ | 1518 | $L_{a767}$ | $L_{b52}$ |
| 1519 | $L_{a1205}$ | $L_{b52}$ | 1520 | $L_{a768}$ | $L_{b52}$ |
| 1521 | $L_{a1208}$ | $L_{b52}$ | 1522 | $L_{a769}$ | $L_{b52}$ |
| 1523 | $L_{a1217}$ | $L_{b52}$ | 1524 | $L_{a770}$ | $L_{b52}$ |
| 1525 | $L_{a1219}$ | $L_{b52}$ | 1526 | $L_{a771}$ | $L_{b52}$ |
| 1527 | $L_{a1230}$ | $L_{b52}$ | 1528 | $L_{a772}$ | $L_{b52}$ |
| 1529 | $L_{a1237}$ | $L_{b52}$ | 1530 | $L_{a773}$ | $L_{b52}$ |
| 1531 | $L_{a1238}$ | $L_{b52}$ | 1532 | $L_{a774}$ | $L_{b52}$ |
| 1533 | $L_{a1239}$ | $L_{b52}$ | 1534 | $L_{a775}$ | $L_{b52}$ |
| 1535 | $L_{a1245}$ | $L_{b52}$ | 1536 | $L_{a776}$ | $L_{b52}$ |
| 1537 | $L_{a1246}$ | $L_{b52}$ | 1538 | $L_{a777}$ | $L_{b52}$ |
| 1539 | $L_{a1247}$ | $L_{b52}$ | 1540 | $L_{a778}$ | $L_{b52}$ |
| 1541 | $L_{a1248}$ | $L_{b52}$ | 1542 | $L_{a779}$ | $L_{b52}$ |
| 1543 | $L_{a1258}$ | $L_{b52}$ | 1544 | $L_{a780}$ | $L_{b52}$ |
| 1545 | $L_{a1260}$ | $L_{b52}$ | 1546 | $L_{a781}$ | $L_{b52}$ |
| 1547 | $L_{a1261}$ | $L_{b52}$ | 1548 | $L_{a782}$ | $L_{b52}$ |
| 1549 | $L_{a1277}$ | $L_{b52}$ | 1550 | $L_{a790}$ | $L_{b52}$ |
| 1551 | $L_{a1278}$ | $L_{b52}$ | 1552 | $L_{a791}$ | $L_{b52}$ |
| 1553 | $L_{a1279}$ | $L_{b52}$ | 1554 | $L_{a792}$ | $L_{b52}$ |
| 1555 | $L_{a1288}$ | $L_{b52}$ | 1556 | $L_{a793}$ | $L_{b52}$ |
| 1557 | $L_{a1289}$ | $L_{b52}$ | 1558 | $L_{a794}$ | $L_{b52}$ |
| 1559 | $L_{a1301}$ | $L_{b52}$ | 1560 | $L_{a800}$ | $L_{b52}$ |
| 1561 | $L_{a1302}$ | $L_{b52}$ | 1562 | $L_{a804}$ | $L_{b52}$ |
| 1563 | $L_{a1442}$ | $L_{b52}$ | 1564 | $L_{a805}$ | $L_{b52}$ |
| 1565 | $L_{a1448}$ | $L_{b52}$ | 1566 | $L_{a933}$ | $L_{b52}$ |
| 1567 | $L_{a1449}$ | $L_{b52}$ | 1568 | $L_{a934}$ | $L_{b52}$ |
| 1569 | $L_{a1460}$ | $L_{b52}$ | 1570 | $L_{a935}$ | $L_{b52}$ |
| 1571 | $L_{a1471}$ | $L_{b52}$ | 1572 | $L_{a936}$ | $L_{b52}$ |
| 1573 | $L_{a1569}$ | $L_{b52}$ | 1574 | $L_{a992}$ | $L_{b52}$ |

-continued

| Metal Complex No. | $L_a$ | $L_b$ | Metal Complex No. | $L_a$ | $L_b$ |
|---|---|---|---|---|---|
| 1575 | $L_{a1570}$ | $L_{b52}$ | 1576 | $L_{a993}$ | $L_{b52}$ |
| 1577 | $L_{a1647}$ | $L_{b52}$ | 1578 | $L_{a994}$ | $L_{b52}$ |
| 1579 | $L_{a1648}$ | $L_{b52}$ | 1580 | $L_{a1015}$ | $L_{b52}$ |
| 1581 | $L_{a1649}$ | $L_{b52}$ | 1582 | $L_{a1016}$ | $L_{b52}$ |
| 1583 | $L_{a1650}$ | $L_{b52}$ | 1584 | $L_{a1028}$ | $L_{b52}$ |
| 1585 | $L_{a1651}$ | $L_{b52}$ | 1586 | $L_{a1029}$ | $L_{b52}$ |
| 1587 | $L_{a1677}$ | $L_{b52}$ | 1588 | $L_{a1030}$ | $L_{b52}$ |
| 1589 | $L_{a1678}$ | $L_{b52}$ | 1590 | $L_{a1031}$ | $L_{b52}$ |
| 1591 | $L_{a1679}$ | $L_{b52}$ | 1592 | $L_{a1044}$ | $L_{b52}$ |
| 1593 | $L_{a1680}$ | $L_{b52}$ | 1594 | $L_{a1045}$ | $L_{b52}$ |
| 1595 | $L_{a1691}$ | $L_{b52}$ | 1596 | $L_{a1046}$ | $L_{b52}$ |
| 1597 | $L_{a1693}$ | $L_{b52}$ | 1598 | $L_{a1047}$ | $L_{b52}$ |
| 1599 | $L_{a1695}$ | $L_{b52}$ | 1600 | $L_{a1061}$ | $L_{b52}$ |
| 1601 | $L_{a1696}$ | $L_{b52}$ | 1602 | $L_{a1062}$ | $L_{b52}$ |
| 1603 | $L_{a1699}$ | $L_{b52}$ | 1604 | $L_{a1063}$ | $L_{b52}$ |
| 1605 | $L_{a1701}$ | $L_{b52}$ | 1606 | $L_{a1064}$ | $L_{b52}$ |
| 1607 | $L_{a1702}$ | $L_{b52}$ | 1608 | $L_{a1065}$ | $L_{b52}$ |
| 1609 | $L_{a1712}$ | $L_{b52}$ | 1610 | $L_{a1074}$ | $L_{b52}$ |
| 1611 | $L_{a1713}$ | $L_{b52}$ | 1612 | $L_{a1075}$ | $L_{b52}$ |
| 1613 | $L_{a1735}$ | $L_{b52}$ | 1614 | $L_{a1076}$ | $L_{b52}$ |
| 1615 | $L_{a1795}$ | $L_{b52}$ | 1616 | $L_{a1083}$ | $L_{b52}$ |
| 1617 | $L_{a1820}$ | $L_{b52}$ | 1618 | $L_{a1084}$ | $L_{b52}$ |
| 1619 | $L_{a1891}$ | $L_{b52}$ | 1620 | $L_{a1085}$ | $L_{b52}$ |
| 1621 | $L_{a1892}$ | $L_{b52}$ | 1622 | $L_{a1090}$ | $L_{b52}$ |
| 1623 | $L_{a1893}$ | $L_{b52}$ | 1624 | $L_{a1091}$ | $L_{b52}$ |
| 1625 | $L_{a1899}$ | $L_{b52}$ | 1626 | $L_{a1092}$ | $L_{b52}$ |
| 1627 | $L_{a1902}$ | $L_{b52}$ | 1628 | $L_{a1113}$ | $L_{b52}$ |
| 1629 | $L_{a1913}$ | $L_{b52}$ | 1630 | $L_{a1114}$ | $L_{b52}$ |
| 1631 | $L_{a1914}$ | $L_{b52}$ | 1632 | $L_{a1121}$ | $L_{b52}$ |
| 1633 | $L_{a1933}$ | $L_{b52}$ | 1634 | $L_{a1122}$ | $L_{b52}$ |
| 1635 | $L_{a1945}$ | $L_{b52}$ | 1636 | $L_{a1123}$ | $L_{b52}$ |
| 1637 | $L_{a1954}$ | $L_{b52}$ | 1638 | $L_{a1124}$ | $L_{b52}$ |
| 1639 | $L_{a1955}$ | $L_{b52}$ | 1640 | $L_{a1133}$ | $L_{b52}$ |
| 1641 | $L_{a1956}$ | $L_{b52}$ | 1642 | $L_{a1134}$ | $L_{b52}$ |
| 1643 | $L_{a1962}$ | $L_{b52}$ | 1644 | $L_{a1135}$ | $L_{b52}$ |
| 1645 | $L_{a1964}$ | $L_{b52}$ | 1646 | $L_{a1145}$ | $L_{b52}$ |
| 1647 | $L_{a1965}$ | $L_{b52}$ | 1648 | $L_{a1146}$ | $L_{b52}$ |
| 1649 | $L_{a1966}$ | $L_{b52}$ | 1650 | $L_{a1147}$ | $L_{b52}$ |
| 1651 | $L_{a1970}$ | $L_{b52}$ | 1652 | $L_{a1175}$ | $L_{b52}$ |
| 1653 | $L_{a1973}$ | $L_{b52}$ | 1654 | $L_{a1176}$ | $L_{b52}$ |
| 1655 | $L_{a2002}$ | $L_{b52}$ | 1656 | $L_{a1177}$ | $L_{b52}$ |
| 1657 | $L_{a2003}$ | $L_{b52}$ | 1658 | $L_{a1227}$ | $L_{b52}$ |
| 1659 | $L_{a2013}$ | $L_{b52}$ | 1660 | $L_{a1228}$ | $L_{b52}$ |
| 1661 | $L_{a2014}$ | $L_{b52}$ | 1662 | $L_{a1241}$ | $L_{b52}$ |
| 1663 | $L_{a2015}$ | $L_{b52}$ | 1664 | $L_{a1242}$ | $L_{b52}$ |
| 1665 | $L_{a2033}$ | $L_{b52}$ | 1666 | $L_{a1265}$ | $L_{b52}$ |
| 1667 | $L_{a2104}$ | $L_{b52}$ | 1668 | $L_{a1266}$ | $L_{b52}$ |
| 1669 | $L_{a2326}$ | $L_{b52}$ | 1670 | $L_{a1267}$ | $L_{b52}$ |
| 1671 | $L_{a2337}$ | $L_{b52}$ | 1672 | $L_{a1298}$ | $L_{b52}$ |
| 1673 | $L_{a2436}$ | $L_{b52}$ | 1674 | $L_{a1299}$ | $L_{b52}$ |
| 1675 | $L_{a2437}$ | $L_{b52}$ | 1676 | $L_{a1308}$ | $L_{b52}$ |
| 1677 | $L_{a2514}$ | $L_{b52}$ | 1678 | $L_{a1309}$ | $L_{b52}$ |
| 1679 | $L_{a2612}$ | $L_{b52}$ | 1680 | $L_{a1329}$ | $L_{b52}$ |
| 1681 | $L_{a2618}$ | $L_{b52}$ | 1682 | $L_{a1330}$ | $L_{b52}$ |
| 1683 | $L_{a2643}$ | $L_{b52}$ | 1684 | $L_{a1334}$ | $L_{b52}$ |
| 1685 | $L_{a2654}$ | $L_{b52}$ | 1686 | $L_{a1335}$ | $L_{b52}$ |
| 1687 | $L_{a2714}$ | $L_{b52}$ | 1688 | $L_{a1336}$ | $L_{b52}$ |
| 1689 | $L_{a2785}$ | $L_{b52}$ | 1690 | $L_{a1345}$ | $L_{b52}$ |
| 1691 | $L_{a2856}$ | $L_{b52}$ | 1692 | $L_{a1346}$ | $L_{b52}$ |
| 1693 | $L_{a2927}$ | $L_{b52}$ | 1694 | $L_{a1347}$ | $L_{b52}$ |
| 1695 | $L_{a3337}$ | $L_{b52}$ | 1696 | $L_{a1348}$ | $L_{b52}$ |
| 1697 | $L_{a3338}$ | $L_{b52}$ | 1698 | $L_{a1357}$ | $L_{b52}$ |
| 1699 | $L_{a3339}$ | $L_{b52}$ | 1700 | $L_{a1358}$ | $L_{b52}$ |
| 1701 | $L_{a3340}$ | $L_{b52}$ | 1702 | $L_{a1359}$ | $L_{b52}$ |
| 1703 | $L_{a3341}$ | $L_{b52}$ | 1704 | $L_{a1360}$ | $L_{b52}$ |
| 1705 | $L_{a1369}$ | $L_{b52}$ | 1706 | $L_{a1427}$ | $L_{b52}$ |
| 1707 | $L_{a1370}$ | $L_{b52}$ | 1708 | $L_{a1428}$ | $L_{b52}$ |
| 1709 | $L_{a1371}$ | $L_{b52}$ | 1710 | $L_{a1429}$ | $L_{b52}$ |
| 1711 | $L_{a1372}$ | $L_{b52}$ | 1712 | $L_{a1430}$ | $L_{b52}$ |
| 1713 | $L_{a1397}$ | $L_{b52}$ | 1714 | $L_{a1431}$ | $L_{b52}$ |
| 1715 | $L_{a1398}$ | $L_{b52}$ | 1716 | $L_{a1438}$ | $L_{b52}$ |
| 1717 | $L_{a1399}$ | $L_{b52}$ | 1718 | $L_{a1439}$ | $L_{b52}$ |
| 1719 | $L_{a1400}$ | $L_{b52}$ | 1720 | $L_{a1440}$ | $L_{b52}$ |
| 1721 | $L_{a1415}$ | $L_{b52}$ | 1722 | $L_{a1441}$ | $L_{b52}$ |
| 1723 | $L_{a1416}$ | $L_{b52}$ | 1724 | $L_{a1463}$ | $L_{b52}$ |
| 1725 | $L_{a1417}$ | $L_{b52}$ | 1726 | $L_{a1464}$ | $L_{b52}$ |

-continued

| Metal Complex No. | $L_a$ | $L_b$ | Metal Complex No. | $L_a$ | $L_b$ |
|---|---|---|---|---|---|
| 1727 | $L_{a1418}$ | $L_{b52}$ | 1728 | $L_{a1465}$ | $L_{b52}$ |
| 1729 | $L_{a1419}$ | $L_{b52}$ | 1730 | $L_{a1466}$ | $L_{b52}$ |
| 1731 | $L_{a1478}$ | $L_{b52}$ | 1732 | $L_{a1491}$ | $L_{b52}$ |
| 1733 | $L_{a1479}$ | $L_{b52}$ | 1734 | $L_{a1492}$ | $L_{b52}$ |
| 1735 | $L_{a1480}$ | $L_{b52}$ | 1736 | $L_{a1493}$ | $L_{b52}$ |
| 1737 | $L_{a1481}$ | $L_{b52}$ | 1738 | $L_{a1505}$ | $L_{b52}$ |
| 1739 | $L_{a1482}$ | $L_{b52}$ | 1740 | $L_{a1506}$ | $L_{b52}$ |
| 1741 | $L_{a1525}$ | $L_{b52}$ | 1742 | $L_{a1507}$ | $L_{b52}$ |
| 1743 | $L_{a1526}$ | $L_{b52}$ | 1744 | $L_{a1508}$ | $L_{b52}$ |
| 1745 | $L_{a1527}$ | $L_{b52}$ | 1746 | $L_{a1537}$ | $L_{b52}$ |
| 1747 | $L_{a1528}$ | $L_{b52}$ | 1748 | $L_{a1538}$ | $L_{b52}$ |
| 1749 | $L_{a1529}$ | $L_{b52}$ | 1750 | $L_{a1539}$ | $L_{b52}$ |
| 1751 | $L_{a1530}$ | $L_{b52}$ | 1752 | $L_{a1540}$ | $L_{b52}$ |
| 1753 | $L_{a1550}$ | $L_{b52}$ | 1754 | $L_{a1541}$ | $L_{b52}$ |
| 1755 | $L_{a1551}$ | $L_{b52}$ | 1756 | $L_{a1542}$ | $L_{b52}$ |
| 1757 | $L_{a1552}$ | $L_{b52}$ | 1758 | $L_{a1577}$ | $L_{b52}$ |
| 1759 | $L_{a1559}$ | $L_{b52}$ | 1760 | $L_{a1578}$ | $L_{b52}$ |
| 1761 | $L_{a1560}$ | $L_{b52}$ | 1762 | $L_{a1579}$ | $L_{b52}$ |
| 1763 | $L_{a1561}$ | $L_{b52}$ | 1764 | $L_{a1580}$ | $L_{b52}$ |
| 1765 | $L_{a1562}$ | $L_{b52}$ | 1766 | $L_{a1592}$ | $L_{b52}$ |
| 1767 | $L_{a1563}$ | $L_{b52}$ | 1768 | $L_{a1593}$ | $L_{b52}$ |
| 1769 | $L_{a1598}$ | $L_{b52}$ | 1770 | $L_{a1594}$ | $L_{b52}$ |
| 1771 | $L_{a1599}$ | $L_{b52}$ | 1772 | $L_{a1606}$ | $L_{b52}$ |
| 1773 | $L_{a1600}$ | $L_{b52}$ | 1774 | $L_{a1607}$ | $L_{b52}$ |
| 1775 | $L_{a1601}$ | $L_{b52}$ | 1776 | $L_{a1608}$ | $L_{b52}$ |
| 1777 | $L_{a1617}$ | $L_{b52}$ | 1778 | $L_{a1643}$ | $L_{b52}$ |
| 1779 | $L_{a1618}$ | $L_{b52}$ | 1780 | $L_{a1644}$ | $L_{b52}$ |
| 1781 | $L_{a1619}$ | $L_{b52}$ | 1782 | $L_{a1654}$ | $L_{b52}$ |
| 1783 | $L_{a1620}$ | $L_{b52}$ | 1784 | $L_{a1655}$ | $L_{b52}$ |
| 1785 | $L_{a1687}$ | $L_{b52}$ | 1786 | $L_{a1656}$ | $L_{b52}$ |
| 1787 | $L_{a1688}$ | $L_{b52}$ | 1788 | $L_{a1657}$ | $L_{b52}$ |
| 1789 | $L_{a1689}$ | $L_{b52}$ | 1790 | $L_{a1658}$ | $L_{b52}$ |
| 1791 | $L_{a1718}$ | $L_{b52}$ | 1792 | $L_{a1659}$ | $L_{b52}$ |
| 1793 | $L_{a1719}$ | $L_{b52}$ | 1794 | $L_{a1753}$ | $L_{b52}$ |
| 1795 | $L_{a1720}$ | $L_{b52}$ | 1796 | $L_{a1754}$ | $L_{b52}$ |
| 1797 | $L_{a1721}$ | $L_{b52}$ | 1798 | $L_{a1755}$ | $L_{b52}$ |
| 1799 | $L_{a1722}$ | $L_{b52}$ | 1800 | $L_{a1756}$ | $L_{b52}$ |
| 1801 | $L_{a1773}$ | $L_{b52}$ | 1802 | $L_{a1757}$ | $L_{b52}$ |
| 1803 | $L_{a1774}$ | $L_{b52}$ | 1804 | $L_{a1758}$ | $L_{b52}$ |
| 1805 | $L_{a1775}$ | $L_{b52}$ | 1806 | $L_{a1799}$ | $L_{b52}$ |
| 1807 | $L_{a1776}$ | $L_{b52}$ | 1808 | $L_{a1800}$ | $L_{b52}$ |
| 1809 | $L_{a1777}$ | $L_{b52}$ | 1810 | $L_{a1801}$ | $L_{b52}$ |
| 1811 | $L_{a1778}$ | $L_{b52}$ | 1812 | $L_{a1815}$ | $L_{b52}$ |
| 1813 | $L_{a1779}$ | $L_{b52}$ | 1814 | $L_{a1816}$ | $L_{b52}$ |
| 1815 | $L_{a1828}$ | $L_{b52}$ | 1816 | $L_{a1817}$ | $L_{b52}$ |
| 1817 | $L_{a1829}$ | $L_{b52}$ | 1818 | $L_{a1841}$ | $L_{b52}$ |
| 1819 | $L_{a1830}$ | $L_{b52}$ | 1820 | $L_{a1842}$ | $L_{b52}$ |
| 1821 | $L_{a1849}$ | $L_{b52}$ | 1822 | $L_{a1843}$ | $L_{b52}$ |
| 1823 | $L_{a1850}$ | $L_{b52}$ | 1824 | $L_{a1844}$ | $L_{b52}$ |
| 1825 | $L_{a1851}$ | $L_{b52}$ | 1826 | $L_{a1859}$ | $L_{b52}$ |
| 1827 | $L_{a1875}$ | $L_{b52}$ | 1828 | $L_{a1860}$ | $L_{b52}$ |
| 1829 | $L_{a1876}$ | $L_{b52}$ | 1830 | $L_{a1861}$ | $L_{b52}$ |
| 1831 | $L_{a1877}$ | $L_{b52}$ | 1832 | $L_{a1862}$ | $L_{b52}$ |
| 1833 | $L_{a1918}$ | $L_{b52}$ | 1834 | $L_{a1885}$ | $L_{b52}$ |
| 1835 | $L_{a1919}$ | $L_{b52}$ | 1836 | $L_{a1886}$ | $L_{b52}$ |
| 1837 | $L_{a1920}$ | $L_{b52}$ | 1838 | $L_{a1887}$ | $L_{b52}$ |
| 1839 | $L_{a1958}$ | $L_{b52}$ | 1840 | $L_{a1983}$ | $L_{b52}$ |
| 1841 | $L_{a1959}$ | $L_{b52}$ | 1842 | $L_{a1984}$ | $L_{b52}$ |
| 1843 | $L_{a1960}$ | $L_{b52}$ | 1844 | $L_{a1985}$ | $L_{b52}$ |
| 1845 | $L_{a2024}$ | $L_{b52}$ | 1846 | $L_{a1986}$ | $L_{b52}$ |
| 1847 | $L_{a2025}$ | $L_{b52}$ | 1848 | $L_{a2072}$ | $L_{b52}$ |
| 1849 | $L_{a2096}$ | $L_{b52}$ | 1850 | $L_{a2073}$ | $L_{b52}$ |
| 1851 | $L_{a2097}$ | $L_{b52}$ | 1852 | $L_{a2124}$ | $L_{b52}$ |
| 1853 | $L_{a2098}$ | $L_{b52}$ | 1854 | $L_{a2125}$ | $L_{b52}$ |
| 1855 | $L_{a2143}$ | $L_{b52}$ | 1856 | $L_{a2126}$ | $L_{b52}$ |
| 1857 | $L_{a2144}$ | $L_{b52}$ | 1858 | $L_{a2127}$ | $L_{b52}$ |
| 1859 | $L_{a2145}$ | $L_{b52}$ | 1860 | $L_{a2128}$ | $L_{b52}$ |
| 1861 | $L_{a2154}$ | $L_{b52}$ | 1862 | $L_{a2160}$ | $L_{b52}$ |
| 1863 | $L_{a2155}$ | $L_{b52}$ | 1864 | $L_{a2161}$ | $L_{b52}$ |
| 1865 | $L_{a2156}$ | $L_{b52}$ | 1866 | $L_{a2195}$ | $L_{b52}$ |
| 1867 | $L_{a2157}$ | $L_{b52}$ | 1868 | $L_{a2196}$ | $L_{b52}$ |
| 1869 | $L_{a2213}$ | $L_{b52}$ | 1870 | $L_{a2197}$ | $L_{b52}$ |
| 1871 | $L_{a2214}$ | $L_{b52}$ | 1872 | $L_{a2225}$ | $L_{b52}$ |
| 1873 | $L_{a2215}$ | $L_{b52}$ | 1874 | $L_{a2226}$ | $L_{b52}$ |
| 1875 | $L_{a2216}$ | $L_{b52}$ | 1876 | $L_{a2227}$ | $L_{b52}$ |
| 1877 | $L_{a2244}$ | $L_{b52}$ | 1878 | $L_{a2265}$ | $L_{b52}$ |

-continued

| Metal Complex No. | $L_a$ | $L_b$ | Metal Complex No. | $L_a$ | $L_b$ |
|---|---|---|---|---|---|
| 1879 | $L_{a2245}$ | $L_{b52}$ | 1880 | $L_{a2266}$ | $L_{b52}$ |
| 1881 | $L_{a2246}$ | $L_{b52}$ | 1882 | $L_{a2300}$ | $L_{b52}$ |
| 1883 | $L_{a2310}$ | $L_{b52}$ | 1884 | $L_{a2301}$ | $L_{b52}$ |
| 1885 | $L_{a2311}$ | $L_{b52}$ | 1886 | $L_{a2320}$ | $L_{b52}$ |
| 1887 | $L_{a2312}$ | $L_{b52}$ | 1888 | $L_{a2321}$ | $L_{b52}$ |
| 1889 | $L_{a2345}$ | $L_{b52}$ | 1890 | $L_{a2392}$ | $L_{b52}$ |
| 1891 | $L_{a2346}$ | $L_{b52}$ | 1892 | $L_{a2393}$ | $L_{b52}$ |
| 1893 | $L_{a2428}$ | $L_{b52}$ | 1894 | $L_{a2394}$ | $L_{b52}$ |
| 1895 | $L_{a2429}$ | $L_{b52}$ | 1896 | $L_{a2395}$ | $L_{b52}$ |
| 1897 | $L_{a2430}$ | $L_{b52}$ | 1898 | $L_{a2485}$ | $L_{b52}$ |
| 1899 | $L_{a2468}$ | $L_{b52}$ | 1900 | $L_{a2486}$ | $L_{b52}$ |
| 1901 | $L_{a2469}$ | $L_{b52}$ | 1902 | $L_{a2487}$ | $L_{b52}$ |
| 1903 | $L_{a2470}$ | $L_{b52}$ | 1904 | $L_{a2488}$ | $L_{b52}$ |
| 1905 | $L_{a2471}$ | $L_{b52}$ | 1906 | $L_{a2535}$ | $L_{b52}$ |
| 1907 | $L_{a2510}$ | $L_{b52}$ | 1908 | $L_{a2536}$ | $L_{b52}$ |
| 1909 | $L_{a2511}$ | $L_{b52}$ | 1910 | $L_{a2537}$ | $L_{b52}$ |
| 1911 | $L_{a2512}$ | $L_{b52}$ | 1912 | $L_{a2556}$ | $L_{b52}$ |
| 1913 | $L_{a2577}$ | $L_{b52}$ | 1914 | $L_{a2557}$ | $L_{b52}$ |
| 1915 | $L_{a2578}$ | $L_{b52}$ | 1916 | $L_{a2558}$ | $L_{b52}$ |
| 1917 | $L_{a2579}$ | $L_{b52}$ | 1918 | $L_{a2636}$ | $L_{b52}$ |
| 1919 | $L_{a2597}$ | $L_{b52}$ | 1920 | $L_{a2637}$ | $L_{b52}$ |
| 1921 | $L_{a2598}$ | $L_{b52}$ | 1922 | $L_{a2638}$ | $L_{b52}$ |
| 1923 | $L_{a2599}$ | $L_{b52}$ | 1924 | $L_{a2682}$ | $L_{b52}$ |
| 1925 | $L_{a2649}$ | $L_{b52}$ | 1926 | $L_{a2683}$ | $L_{b52}$ |
| 1927 | $L_{a2650}$ | $L_{b52}$ | 1928 | $L_{a2684}$ | $L_{b52}$ |
| 1929 | $L_{a2651}$ | $L_{b52}$ | 1930 | $L_{a2722}$ | $L_{b52}$ |
| 1931 | $L_{a2694}$ | $L_{b52}$ | 1932 | $L_{a2723}$ | $L_{b52}$ |
| 1933 | $L_{a2695}$ | $L_{b52}$ | 1934 | $L_{a2724}$ | $L_{b52}$ |
| 1935 | $L_{a2696}$ | $L_{b52}$ | 1936 | $L_{a2735}$ | $L_{b52}$ |
| 1937 | $L_{a2742}$ | $L_{b52}$ | 1938 | $L_{a2736}$ | $L_{b52}$ |
| 1939 | $L_{a2743}$ | $L_{b52}$ | 1940 | $L_{a2737}$ | $L_{b52}$ |
| 1941 | $L_{a2744}$ | $L_{b52}$ | 1942 | $L_{a2804}$ | $L_{b52}$ |
| 1943 | $L_{a2776}$ | $L_{b52}$ | 1944 | $L_{a2805}$ | $L_{b52}$ |
| 1945 | $L_{a2777}$ | $L_{b52}$ | 1946 | $L_{a2806}$ | $L_{b52}$ |
| 1947 | $L_{a2778}$ | $L_{b52}$ | 1948 | $L_{a2807}$ | $L_{b52}$ |
| 1949 | $L_{a2779}$ | $L_{b52}$ | 1950 | $L_{a2808}$ | $L_{b52}$ |
| 1951 | $L_{a2780}$ | $L_{b52}$ | 1952 | $L_{a2825}$ | $L_{b52}$ |
| 1953 | $L_{a2781}$ | $L_{b52}$ | 1954 | $L_{a2826}$ | $L_{b52}$ |
| 1955 | $L_{a2782}$ | $L_{b52}$ | 1956 | $L_{a2827}$ | $L_{b52}$ |
| 1957 | $L_{a2847}$ | $L_{b52}$ | 1958 | $L_{a2855}$ | $L_{b52}$ |
| 1959 | $L_{a2848}$ | $L_{b52}$ | 1960 | $L_{a2856}$ | $L_{b52}$ |
| 1961 | $L_{a2849}$ | $L_{b52}$ | 1962 | $L_{a2857}$ | $L_{b52}$ |
| 1963 | $L_{a2850}$ | $L_{b52}$ | 1964 | $L_{a2876}$ | $L_{b52}$ |
| 1965 | $L_{a2895}$ | $L_{b52}$ | 1966 | $L_{a2877}$ | $L_{b52}$ |
| 1967 | $L_{a2896}$ | $L_{b52}$ | 1968 | $L_{a2878}$ | $L_{b52}$ |
| 1969 | $L_{a2897}$ | $L_{b52}$ | 1970 | $L_{a2907}$ | $L_{b52}$ |
| 1971 | $L_{a2926}$ | $L_{b52}$ | 1972 | $L_{a2908}$ | $L_{b52}$ |
| 1973 | $L_{a2927}$ | $L_{b52}$ | 1974 | $L_{a2909}$ | $L_{b52}$ |
| 1975 | $L_{a2928}$ | $L_{b52}$ | 1976 | $L_{a2948}$ | $L_{b52}$ |
| 1977 | $L_{a3003}$ | $L_{b52}$ | 1978 | $L_{a2949}$ | $L_{b52}$ |
| 1979 | $L_{a3004}$ | $L_{b52}$ | 1980 | $L_{a2950}$ | $L_{b52}$ |
| 1981 | $L_{a3048}$ | $L_{b52}$ | 1982 | $L_{a3088}$ | $L_{b52}$ |
| 1983 | $L_{a3049}$ | $L_{b52}$ | 1984 | $L_{a3089}$ | $L_{b52}$ |
| 1985 | $L_{a3050}$ | $L_{b52}$ | 1986 | $L_{a3090}$ | $L_{b52}$ |
| 1987 | $L_{a3128}$ | $L_{b52}$ | 1988 | $L_{a3147}$ | $L_{b52}$ |
| 1989 | $L_{a3129}$ | $L_{b52}$ | 1990 | $L_{a3148}$ | $L_{b52}$ |
| 1991 | $L_{a3130}$ | $L_{b52}$ | 1992 | $L_{a3149}$ | $L_{b52}$ |
| 1993 | $L_{a3131}$ | $L_{b52}$ | 1994 | $L_{a3150}$ | $L_{b52}$ |
| 1995 | $L_{a3178}$ | $L_{b52}$ | 1996 | $L_{a3287}$ | $L_{b52}$ |
| 1997 | $L_{a3179}$ | $L_{b52}$ | 1998 | $L_{a3288}$ | $L_{b52}$ |
| 1999 | $L_{a3180}$ | $L_{b52}$ | 2000 | $L_{a3289}$ | $L_{b52}$ |
| 2001 | $L_{a3337}$ | $L_{b52}$ | 2002 | $L_{a3363}$ | $L_{b52}$ |
| 2003 | $L_{a3338}$ | $L_{b52}$ | 2004 | $L_{a3364}$ | $L_{b52}$ |
| 2005 | $L_{a3339}$ | $L_{b52}$ | 2006 | $L_{a3365}$ | $L_{b52}$ |
| 2007 | $L_{a1}$ | $L_{b2}$ | 2008 | $L_{a105}$ | $L_{b2}$ |
| 2009 | $L_{a1}$ | $L_{b4}$ | 2010 | $L_{a105}$ | $L_{b4}$ |
| 2011 | $L_{a1}$ | $L_{b5}$ | 2012 | $L_{a105}$ | $L_{b5}$ |
| 2013 | $L_{a1}$ | $L_{b10}$ | 2014 | $L_{a105}$ | $L_{b10}$ |
| 2015 | $L_{a1}$ | $L_{b11}$ | 2016 | $L_{a105}$ | $L_{b11}$ |
| 2017 | $L_{a1}$ | $L_{b12}$ | 2018 | $L_{a105}$ | $L_{b12}$ |
| 2019 | $L_{a1}$ | $L_{b13}$ | 2020 | $L_{a105}$ | $L_{b13}$ |
| 2021 | $L_{a1}$ | $L_{b14}$ | 2022 | $L_{a105}$ | $L_{b14}$ |
| 2023 | $L_{a1}$ | $L_{b15}$ | 2024 | $L_{a105}$ | $L_{b15}$ |
| 2025 | $L_{a1}$ | $L_{b17}$ | 2026 | $L_{a105}$ | $L_{b17}$ |
| 2027 | $L_{a1}$ | $L_{b19}$ | 2028 | $L_{a105}$ | $L_{b19}$ |
| 2029 | $L_{a1}$ | $L_{b21}$ | 2030 | $L_{a105}$ | $L_{b21}$ |

-continued

| Metal Complex No. | $L_a$ | $L_b$ | Metal Complex No. | $L_a$ | $L_b$ |
|---|---|---|---|---|---|
| 2031 | $L_{a1}$ | $L_{b22}$ | 2032 | $L_{a105}$ | $L_{b22}$ |
| 2033 | $L_{a1}$ | $L_{b23}$ | 2034 | $L_{a105}$ | $L_{b23}$ |
| 2035 | $L_{a1}$ | $L_{b24}$ | 2036 | $L_{a105}$ | $L_{b24}$ |
| 2037 | $L_{a1}$ | $L_{b25}$ | 2038 | $L_{a105}$ | $L_{b25}$ |
| 2039 | $L_{a1}$ | $L_{b26}$ | 2040 | $L_{a105}$ | $L_{b26}$ |
| 2041 | $L_{a1}$ | $L_{b27}$ | 2042 | $L_{a105}$ | $L_{b27}$ |
| 2043 | $L_{a1}$ | $L_{b28}$ | 2044 | $L_{a105}$ | $L_{b28}$ |
| 2045 | $L_{a1}$ | $L_{b29}$ | 2046 | $L_{a105}$ | $L_{b29}$ |
| 2047 | $L_{a1}$ | $L_{b30}$ | 2048 | $L_{a105}$ | $L_{b30}$ |
| 2049 | $L_{a1}$ | $L_{b31}$ | 2050 | $L_{a105}$ | $L_{b31}$ |
| 2051 | $L_{a1}$ | $L_{b32}$ | 2052 | $L_{a105}$ | $L_{b32}$ |
| 2053 | $L_{a1}$ | $L_{b33}$ | 2054 | $L_{a105}$ | $L_{b33}$ |
| 2055 | $L_{a1}$ | $L_{b42}$ | 2056 | $L_{a105}$ | $L_{b42}$ |
| 2057 | $L_{a1}$ | $L_{b43}$ | 2058 | $L_{a105}$ | $L_{b43}$ |
| 2059 | $L_{a1}$ | $L_{b44}$ | 2060 | $L_{a105}$ | $L_{b44}$ |
| 2061 | $L_{a1}$ | $L_{b45}$ | 2062 | $L_{a105}$ | $L_{b45}$ |
| 2063 | $L_{a1}$ | $L_{b46}$ | 2064 | $L_{a105}$ | $L_{b46}$ |
| 2065 | $L_{a1}$ | $L_{b50}$ | 2066 | $L_{a105}$ | $L_{b50}$ |
| 2067 | $L_{a1}$ | $L_{b51}$ | 2068 | $L_{a105}$ | $L_{b51}$ |
| 2069 | $L_{a1}$ | $L_{b53}$ | 2070 | $L_{a105}$ | $L_{b53}$ |
| 2071 | $L_{a1}$ | $L_{b54}$ | 2072 | $L_{a105}$ | $L_{b54}$ |
| 2073 | $L_{a1}$ | $L_{b55}$ | 2074 | $L_{a105}$ | $L_{b55}$ |
| 2075 | $L_{a1}$ | $L_{b56}$ | 2076 | $L_{a105}$ | $L_{b56}$ |
| 2077 | $L_{a1}$ | $L_{b57}$ | 2078 | $L_{a105}$ | $L_{b57}$ |
| 2079 | $L_{a1}$ | $L_{b58}$ | 2080 | $L_{a105}$ | $L_{b58}$ |
| 2081 | $L_{a1}$ | $L_{b59}$ | 2082 | $L_{a105}$ | $L_{b59}$ |
| 2083 | $L_{a1}$ | $L_{b66}$ | 2084 | $L_{a105}$ | $L_{b66}$ |
| 2085 | $L_{a1}$ | $L_{b68}$ | 2086 | $L_{a105}$ | $L_{b68}$ |
| 2087 | $L_{a1}$ | $L_{b70}$ | 2088 | $L_{a105}$ | $L_{b70}$ |
| 2089 | $L_{a1}$ | $L_{b75}$ | 2090 | $L_{a105}$ | $L_{b75}$ |
| 2091 | $L_{a1}$ | $L_{b76}$ | 2092 | $L_{a105}$ | $L_{b76}$ |
| 2093 | $L_{a1}$ | $L_{b87}$ | 2094 | $L_{a105}$ | $L_{b87}$ |
| 2095 | $L_{a1}$ | $L_{b95}$ | 2096 | $L_{a105}$ | $L_{b95}$ |
| 2097 | $L_{a1}$ | $L_{b96}$ | 2098 | $L_{a105}$ | $L_{b96}$ |
| 2099 | $L_{a1}$ | $L_{b97}$ | 2100 | $L_{a105}$ | $L_{b97}$ |
| 2101 | $L_{a1}$ | $L_{b98}$ | 2102 | $L_{a105}$ | $L_{b98}$ |
| 2103 | $L_{a1}$ | $L_{b109}$ | 2104 | $L_{a105}$ | $L_{b109}$ |
| 2105 | $L_{a1}$ | $L_{b110}$ | 2106 | $L_{a105}$ | $L_{b110}$ |
| 2107 | $L_{a1}$ | $L_{b111}$ | 2108 | $L_{a105}$ | $L_{b111}$ |
| 2109 | $L_{al}$ | $L_{b112}$ | 2110 | $L_{a105}$ | $L_{b112}$ |
| 2111 | $L_{a1}$ | $L_{b114}$ | 2112 | $L_{a105}$ | $L_{b114}$ |
| 2113 | $L_{a1}$ | $L_{b117}$ | 2114 | $L_{a105}$ | $L_{b117}$ |
| 2115 | $L_{a1}$ | $L_{b122}$ | 2116 | $L_{a105}$ | $L_{b122}$ |
| 2117 | $L_{a1}$ | $L_{b123}$ | 2118 | $L_{a105}$ | $L_{b123}$ |
| 2119 | $L_{a1}$ | $L_{b129}$ | 2120 | $L_{a105}$ | $L_{b129}$ |
| 2121 | $L_{a1}$ | $L_{b130}$ | 2122 | $L_{a105}$ | $L_{b130}$ |
| 2123 | $L_{a1}$ | $L_{b131}$ | 2124 | $L_{a105}$ | $L_{b131}$ |
| 2125 | $L_{a1}$ | $L_{b133}$ | 2126 | $L_{a105}$ | $L_{b133}$ |
| 2127 | $L_{a1}$ | $L_{b134}$ | 2128 | $L_{a105}$ | $L_{b134}$ |
| 2129 | $L_{a1}$ | $L_{b135}$ | 2130 | $L_{a105}$ | $L_{b135}$ |
| 2131 | $L_{a1}$ | $L_{b148}$ | 2132 | $L_{a105}$ | $L_{b148}$ |
| 2133 | $L_{a1}$ | $L_{b149}$ | 2134 | $L_{a105}$ | $L_{b149}$ |
| 2135 | $L_{a1}$ | $L_{b150}$ | 2136 | $L_{a105}$ | $L_{b150}$ |
| 2137 | $L_{a1}$ | $L_{b151}$ | 2138 | $L_{a105}$ | $L_{b151}$ |
| 2139 | $L_{a130}$ | $L_{b2}$ | 2140 | $L_{a201}$ | $L_{b2}$ |
| 2141 | $L_{a130}$ | $L_{b4}$ | 2142 | $L_{a201}$ | $L_{b4}$ |
| 2143 | $L_{a130}$ | $L_{b5}$ | 2144 | $L_{a201}$ | $L_{b5}$ |
| 2145 | $L_{a130}$ | $L_{b10}$ | 2146 | $L_{a201}$ | $L_{b10}$ |
| 2147 | $L_{a130}$ | $L_{b11}$ | 2148 | $L_{a201}$ | $L_{b11}$ |
| 2149 | $L_{a130}$ | $L_{b12}$ | 2150 | $L_{a201}$ | $L_{b12}$ |
| 2151 | $L_{a130}$ | $L_{b13}$ | 2152 | $L_{a201}$ | $L_{b13}$ |
| 2153 | $L_{a130}$ | $L_{b14}$ | 2154 | $L_{a201}$ | $L_{b14}$ |
| 2155 | $L_{a130}$ | $L_{b15}$ | 2156 | $L_{a201}$ | $L_{b15}$ |
| 2157 | $L_{a130}$ | $L_{b17}$ | 2158 | $L_{a201}$ | $L_{b17}$ |
| 2159 | $L_{a130}$ | $L_{b19}$ | 2160 | $L_{a201}$ | $L_{b19}$ |
| 2161 | $L_{a130}$ | $L_{b21}$ | 2162 | $L_{a201}$ | $L_{b21}$ |
| 2163 | $L_{a130}$ | $L_{b22}$ | 2164 | $L_{a201}$ | $L_{b22}$ |
| 2165 | $L_{a130}$ | $L_{b23}$ | 2166 | $L_{a201}$ | $L_{b23}$ |
| 2167 | $L_{a130}$ | $L_{b24}$ | 2168 | $L_{a201}$ | $L_{b24}$ |
| 2169 | $L_{a130}$ | $L_{b25}$ | 2170 | $L_{a201}$ | $L_{h25}$ |
| 2171 | $L_{a130}$ | $L_{b26}$ | 2172 | $L_{a201}$ | $L_{b26}$ |
| 2173 | $L_{a130}$ | $L_{b27}$ | 2174 | $L_{a201}$ | $L_{b27}$ |
| 2175 | $L_{a130}$ | $L_{b28}$ | 2176 | $L_{a201}$ | $L_{b28}$ |
| 2177 | $L_{a130}$ | $L_{b29}$ | 2178 | $L_{a201}$ | $L_{b29}$ |
| 2179 | $L_{a130}$ | $L_{b30}$ | 2180 | $L_{a201}$ | $L_{b30}$ |
| 2181 | $L_{a130}$ | $L_{b31}$ | 2182 | $L_{a201}$ | $L_{b31}$ |

-continued

| Metal Complex No. | $L_a$ | $L_b$ | Metal Complex No. | $L_a$ | $L_b$ |
|---|---|---|---|---|---|
| 2183 | $L_{a130}$ | $L_{b32}$ | 2184 | $L_{a201}$ | $L_{b32}$ |
| 2185 | $L_{a130}$ | $L_{b33}$ | 2186 | $L_{a201}$ | $L_{b33}$ |
| 2187 | $L_{a130}$ | $L_{b42}$ | 2188 | $L_{a201}$ | $L_{b42}$ |
| 2189 | $L_{a130}$ | $L_{b43}$ | 2190 | $L_{a201}$ | $L_{b43}$ |
| 2191 | $L_{a130}$ | $L_{b44}$ | 2192 | $L_{a201}$ | $L_{b44}$ |
| 2193 | $L_{a130}$ | $L_{b45}$ | 2194 | $L_{a201}$ | $L_{645}$ |
| 2195 | $L_{a130}$ | $L_{b46}$ | 2196 | $L_{a201}$ | $L_{b46}$ |
| 2197 | $L_{a130}$ | $L_{b50}$ | 2198 | $L_{a201}$ | $L_{b50}$ |
| 2199 | $L_{a130}$ | $L_{b51}$ | 2200 | $L_{a201}$ | $L_{b51}$ |
| 2201 | $L_{a130}$ | $L_{b53}$ | 2202 | $L_{a201}$ | $L_{b53}$ |
| 2203 | $L_{a130}$ | $L_{b54}$ | 2204 | $L_{a201}$ | $L_{b54}$ |
| 2205 | $L_{a130}$ | $L_{b55}$ | 2206 | $L_{a201}$ | $L_{b55}$ |
| 2207 | $L_{a130}$ | $L_{b56}$ | 2208 | $L_{a201}$ | $L_{b56}$ |
| 2209 | $L_{a130}$ | $L_{b57}$ | 2210 | $L_{a201}$ | $L_{b57}$ |
| 2211 | $L_{a130}$ | $L_{b58}$ | 2212 | $L_{a201}$ | $L_{b58}$ |
| 2213 | $L_{a130}$ | $L_{b59}$ | 2214 | $L_{a201}$ | $L_{b59}$ |
| 2215 | $L_{a130}$ | $L_{b66}$ | 2216 | $L_{a201}$ | $L_{b66}$ |
| 2217 | $L_{a130}$ | $L_{b68}$ | 2218 | $L_{a201}$ | $L_{b68}$ |
| 2219 | $L_{a130}$ | $L_{b70}$ | 2220 | $L_{a201}$ | $L_{670}$ |
| 2221 | $L_{a130}$ | $L_{b75}$ | 2222 | $L_{a201}$ | $L_{b75}$ |
| 2223 | $L_{a130}$ | $L_{b76}$ | 2224 | $L_{a201}$ | $L_{b76}$ |
| 2225 | $L_{a130}$ | $L_{b87}$ | 2226 | $L_{a201}$ | $L_{b87}$ |
| 2227 | $L_{a130}$ | $L_{b95}$ | 2228 | $L_{a201}$ | $L_{b95}$ |
| 2229 | $L_{a130}$ | $L_{b96}$ | 2230 | $L_{a201}$ | $L_{b96}$ |
| 2231 | $L_{a130}$ | $L_{b97}$ | 2232 | $L_{a201}$ | $L_{b97}$ |
| 2233 | $L_{a130}$ | $L_{b98}$ | 2234 | $L_{a201}$ | $L_{b98}$ |
| 2235 | $L_{a130}$ | $L_{b109}$ | 2236 | $L_{a201}$ | $L_{b109}$ |
| 2237 | $L_{a130}$ | $L_{b110}$ | 2238 | $L_{a201}$ | $L_{b110}$ |
| 2239 | $L_{a130}$ | $L_{b111}$ | 2240 | $L_{a201}$ | $L_{b111}$ |
| 2241 | $L_{a130}$ | $L_{b112}$ | 2242 | $L_{a201}$ | $L_{b112}$ |
| 2243 | $L_{a130}$ | $L_{b114}$ | 2244 | $L_{a201}$ | $L_{b114}$ |
| 2245 | $L_{a130}$ | $L_{b117}$ | 2246 | $L_{a201}$ | $L_{b117}$ |
| 2247 | $L_{a130}$ | $L_{b122}$ | 2248 | $L_{a201}$ | $L_{b122}$ |
| 2249 | $L_{a130}$ | $L_{b123}$ | 2250 | $L_{a201}$ | $L_{b123}$ |
| 2251 | $L_{a130}$ | $L_{b129}$ | 2252 | $L_{a201}$ | $L_{b129}$ |
| 2253 | $L_{a130}$ | $L_{b130}$ | 2254 | $L_{a201}$ | $L_{b130}$ |
| 2255 | $L_{a130}$ | $L_{b131}$ | 2256 | $L_{a201}$ | $L_{b131}$ |
| 2257 | $L_{a130}$ | $L_{b133}$ | 2258 | $L_{a201}$ | $L_{b133}$ |
| 2259 | $L_{a130}$ | $L_{b134}$ | 2260 | $L_{a201}$ | $L_{b134}$ |
| 2261 | $L_{a130}$ | $L_{b135}$ | 2262 | $L_{a201}$ | $L_{b135}$ |
| 2263 | $L_{a130}$ | $L_{b148}$ | 2264 | $L_{a201}$ | $L_{b148}$ |
| 2265 | $L_{a130}$ | $L_{b149}$ | 2266 | $L_{a201}$ | $L_{b149}$ |
| 2267 | $L_{a130}$ | $L_{b150}$ | 2268 | $L_{a201}$ | $L_{b150}$ |
| 2269 | $L_{a130}$ | $L_{b151}$ | 2270 | $L_{a201}$ | $L_{b151}$ |
| 2271 | $L_{a272}$ | $L_{b2}$ | 2272 | $L_{a343}$ | $L_{b2}$ |
| 2273 | $L_{a272}$ | $L_{b4}$ | 2274 | $L_{a343}$ | $L_{b4}$ |
| 2275 | $L_{a272}$ | $L_{b5}$ | 2276 | $L_{a343}$ | $L_{b5}$ |
| 2277 | $L_{a272}$ | $L_{b10}$ | 2278 | $L_{a343}$ | $L_{b10}$ |
| 2279 | $L_{a272}$ | $L_{b11}$ | 2280 | $L_{a343}$ | $L_{b11}$ |
| 2281 | $L_{a272}$ | $L_{b12}$ | 2282 | $L_{a343}$ | $L_{b12}$ |
| 2283 | $L_{a272}$ | $L_{b13}$ | 2284 | $L_{a343}$ | $L_{b13}$ |
| 2285 | $L_{a272}$ | $L_{b14}$ | 2286 | $L_{a343}$ | $L_{b14}$ |
| 2287 | $L_{a272}$ | $L_{b15}$ | 2288 | $L_{a343}$ | $L_{b15}$ |
| 2289 | $L_{a272}$ | $L_{b17}$ | 2290 | $L_{a343}$ | $L_{b17}$ |
| 2291 | $L_{a272}$ | $L_{b19}$ | 2292 | $L_{a343}$ | $L_{b19}$ |
| 2293 | $L_{a272}$ | $L_{b21}$ | 2294 | $L_{a343}$ | $L_{b21}$ |
| 2295 | $L_{a272}$ | $L_{b22}$ | 2296 | $L_{a343}$ | $L_{b22}$ |
| 2297 | $L_{a272}$ | $L_{b23}$ | 2298 | $L_{a343}$ | $L_{b23}$ |
| 2299 | $L_{a272}$ | $L_{b24}$ | 2300 | $L_{a343}$ | $L_{b24}$ |
| 2301 | $L_{a272}$ | $L_{b25}$ | 2302 | $L_{a343}$ | $L_{b25}$ |
| 2303 | $L_{a272}$ | $L_{b26}$ | 2304 | $L_{a343}$ | $L_{b26}$ |
| 2305 | $L_{a272}$ | $L_{b27}$ | 2306 | $L_{a343}$ | $L_{b27}$ |
| 2307 | $L_{a272}$ | $L_{b28}$ | 2308 | $L_{a343}$ | $L_{b28}$ |
| 2309 | $L_{a272}$ | $L_{b29}$ | 2310 | $L_{a343}$ | $L_{b29}$ |
| 2311 | $L_{a272}$ | $L_{b30}$ | 2312 | $L_{a343}$ | $L_{b30}$ |
| 2313 | $L_{a272}$ | $L_{b31}$ | 2314 | $L_{a343}$ | $L_{b31}$ |
| 2315 | $L_{a272}$ | $L_{b32}$ | 2316 | $L_{a343}$ | $L_{b32}$ |
| 2317 | $L_{a272}$ | $L_{b33}$ | 2318 | $L_{a343}$ | $L_{b33}$ |
| 2319 | $L_{a272}$ | $L_{b42}$ | 2320 | $L_{a343}$ | $L_{b42}$ |
| 2321 | $L_{a272}$ | $L_{b43}$ | 2322 | $L_{a343}$ | $L_{b43}$ |
| 2323 | $L_{a272}$ | $L_{b44}$ | 2324 | $L_{a343}$ | $L_{b44}$ |
| 2325 | $L_{a272}$ | $L_{b45}$ | 2326 | $L_{a343}$ | $L_{b45}$ |
| 2327 | $L_{a272}$ | $L_{b46}$ | 2328 | $L_{a343}$ | $L_{b46}$ |
| 2329 | $L_{a272}$ | $L_{b50}$ | 2330 | $L_{a343}$ | $L_{b50}$ |
| 2331 | $L_{a272}$ | $L_{b51}$ | 2332 | $L_{a343}$ | $L_{b51}$ |
| 2333 | $L_{a272}$ | $L_{b53}$ | 2334 | $L_{a343}$ | $L_{b53}$ |

-continued

| Metal Complex No. | $L_a$ | $L_b$ | Metal Complex No. | $L_a$ | $L_b$ |
|---|---|---|---|---|---|
| 2335 | $L_{a272}$ | $L_{b54}$ | 2336 | $L_{a343}$ | $L_{b54}$ |
| 2337 | $L_{a272}$ | $L_{b55}$ | 2338 | $L_{a343}$ | $L_{b55}$ |
| 2339 | $L_{a272}$ | $L_{b56}$ | 2340 | $L_{a343}$ | $L_{b56}$ |
| 2341 | $L_{a272}$ | $L_{b57}$ | 2342 | $L_{a343}$ | $L_{b57}$ |
| 2343 | $L_{a272}$ | $L_{b58}$ | 2344 | $L_{a343}$ | $L_{b58}$ |
| 2345 | $L_{a272}$ | $L_{b59}$ | 2346 | $L_{a343}$ | $L_{b59}$ |
| 2347 | $L_{a272}$ | $L_{b66}$ | 2348 | $L_{a343}$ | $L_{b66}$ |
| 2349 | $L_{a272}$ | $L_{b68}$ | 2350 | $L_{a343}$ | $L_{b68}$ |
| 2351 | $L_{a272}$ | $L_{b70}$ | 2352 | $L_{a343}$ | $L_{b70}$ |
| 2353 | $L_{a272}$ | $L_{b75}$ | 2354 | $L_{a343}$ | $L_{b75}$ |
| 2355 | $L_{a272}$ | $L_{b76}$ | 2356 | $L_{a343}$ | $L_{b76}$ |
| 2357 | $L_{a272}$ | $L_{b87}$ | 2358 | $L_{a343}$ | $L_{b87}$ |
| 2359 | $L_{a272}$ | $L_{b95}$ | 2360 | $L_{a343}$ | $L_{b95}$ |
| 2361 | $L_{a272}$ | $L_{b96}$ | 2362 | $L_{a343}$ | $L_{b96}$ |
| 2363 | $L_{a272}$ | $L_{b97}$ | 2364 | $L_{a343}$ | $L_{b97}$ |
| 2365 | $L_{a272}$ | $L_{b98}$ | 2366 | $L_{a343}$ | $L_{b98}$ |
| 2367 | $L_{a272}$ | $L_{b109}$ | 2368 | $L_{a343}$ | $L_{b109}$ |
| 2369 | $L_{a272}$ | $L_{b110}$ | 2370 | $L_{a343}$ | $L_{b110}$ |
| 2371 | $L_{a272}$ | $L_{b111}$ | 2372 | $L_{a343}$ | $L_{b111}$ |
| 2373 | $L_{a272}$ | $L_{b112}$ | 2374 | $L_{a343}$ | $L_{b112}$ |
| 2375 | $L_{a272}$ | $L_{b114}$ | 2376 | $L_{a343}$ | $L_{b114}$ |
| 2377 | $L_{a272}$ | $L_{b117}$ | 2378 | $L_{a343}$ | $L_{b117}$ |
| 2379 | $L_{a272}$ | $L_{b122}$ | 2380 | $L_{a343}$ | $L_{b122}$ |
| 2381 | $L_{a272}$ | $L_{b123}$ | 2382 | $L_{a343}$ | $L_{b123}$ |
| 2383 | $L_{a272}$ | $L_{b129}$ | 2384 | $L_{a343}$ | $L_{b129}$ |
| 2385 | $L_{a272}$ | $L_{b130}$ | 2386 | $L_{a343}$ | $L_{b130}$ |
| 2387 | $L_{a272}$ | $L_{b131}$ | 2388 | $L_{a343}$ | $L_{b131}$ |
| 2389 | $L_{a272}$ | $L_{b133}$ | 2390 | $L_{a343}$ | $L_{b133}$ |
| 2391 | $L_{a272}$ | $L_{b134}$ | 2392 | $L_{a343}$ | $L_{b134}$ |
| 2393 | $L_{a272}$ | $L_{b135}$ | 2394 | $L_{a343}$ | $L_{b135}$ |
| 2395 | $L_{a272}$ | $L_{b148}$ | 2396 | $L_{a343}$ | $L_{b148}$ |
| 2397 | $L_{a272}$ | $L_{b149}$ | 2398 | $L_{a343}$ | $L_{b149}$ |
| 2399 | $L_{a272}$ | $L_{b150}$ | 2400 | $L_{a343}$ | $L_{b150}$ |
| 2401 | $L_{a272}$ | $L_{b151}$ | 2402 | $L_{a343}$ | $L_{b151}$ |
| 2403 | $L_{a414}$ | $L_{b2}$ | 2404 | $L_{a746}$ | $L_{b2}$ |
| 2405 | $L_{a414}$ | $L_{b4}$ | 2406 | $L_{a746}$ | $L_{b4}$ |
| 2407 | $L_{a414}$ | $L_{b5}$ | 2408 | $L_{a746}$ | $L_{b5}$ |
| 2409 | $L_{a414}$ | $L_{b10}$ | 2410 | $L_{a746}$ | $L_{b10}$ |
| 2411 | $L_{a414}$ | $L_{b11}$ | 2412 | $L_{a746}$ | $L_{b11}$ |
| 2413 | $L_{a414}$ | $L_{b12}$ | 2414 | $L_{a746}$ | $L_{b12}$ |
| 2415 | $L_{a414}$ | $L_{b13}$ | 2416 | $L_{a746}$ | $L_{b13}$ |
| 2417 | $L_{a414}$ | $L_{b14}$ | 2418 | $L_{a746}$ | $L_{b14}$ |
| 2419 | $L_{a414}$ | $L_{b15}$ | 2420 | $L_{a746}$ | $L_{b15}$ |
| 2421 | $L_{a414}$ | $L_{b17}$ | 2422 | $L_{a746}$ | $L_{b17}$ |
| 2423 | $L_{a414}$ | $L_{b19}$ | 2424 | $L_{a746}$ | $L_{b19}$ |
| 2425 | $L_{a414}$ | $L_{b21}$ | 2426 | $L_{a746}$ | $L_{b21}$ |
| 2427 | $L_{a414}$ | $L_{b22}$ | 2428 | $L_{a746}$ | $L_{b22}$ |
| 2429 | $L_{a414}$ | $L_{b23}$ | 2430 | $L_{a746}$ | $L_{b23}$ |
| 2431 | $L_{a414}$ | $L_{b24}$ | 2432 | $L_{a746}$ | $L_{b24}$ |
| 2433 | $L_{a414}$ | $L_{b25}$ | 2434 | $L_{a746}$ | $L_{b25}$ |
| 2435 | $L_{a414}$ | $L_{b26}$ | 2436 | $L_{a746}$ | $L_{b26}$ |
| 2437 | $L_{a414}$ | $L_{b27}$ | 2438 | $L_{a746}$ | $L_{b27}$ |
| 2439 | $L_{a414}$ | $L_{b28}$ | 2440 | $L_{a746}$ | $L_{b28}$ |
| 2441 | $L_{a414}$ | $L_{b29}$ | 2442 | $L_{a746}$ | $L_{b29}$ |
| 2443 | $L_{a414}$ | $L_{b30}$ | 2444 | $L_{a746}$ | $L_{b30}$ |
| 2445 | $L_{a414}$ | $L_{b31}$ | 2446 | $L_{a746}$ | $L_{b31}$ |
| 2447 | $L_{a414}$ | $L_{b32}$ | 2448 | $L_{a746}$ | $L_{b32}$ |
| 2449 | $L_{a414}$ | $L_{b33}$ | 2450 | $L_{a746}$ | $L_{b33}$ |
| 2451 | $L_{a414}$ | $L_{b42}$ | 2452 | $L_{a746}$ | $L_{b42}$ |
| 2453 | $L_{a414}$ | $L_{b43}$ | 2454 | $L_{a746}$ | $L_{b43}$ |
| 2455 | $L_{a414}$ | $L_{b41}$ | 2456 | $L_{a746}$ | $L_{b44}$ |
| 2457 | $L_{a414}$ | $L_{b45}$ | 2458 | $L_{a746}$ | $L_{b45}$ |
| 2459 | $L_{a414}$ | $L_{b46}$ | 2460 | $L_{a746}$ | $L_{b46}$ |
| 2461 | $L_{a414}$ | $L_{b50}$ | 2462 | $L_{a746}$ | $L_{b50}$ |
| 2463 | $L_{a414}$ | $L_{b51}$ | 2464 | $L_{a746}$ | $L_{b51}$ |
| 2465 | $L_{a414}$ | $L_{b53}$ | 2466 | $L_{a746}$ | $L_{b53}$ |
| 2467 | $L_{a414}$ | $L_{b54}$ | 2468 | $L_{a746}$ | $L_{b54}$ |
| 2469 | $L_{a414}$ | $L_{b55}$ | 2470 | $L_{a746}$ | $L_{b55}$ |
| 2471 | $L_{a414}$ | $L_{b56}$ | 2472 | $L_{a746}$ | $L_{b56}$ |
| 2473 | $L_{a414}$ | $L_{b57}$ | 2474 | $L_{a746}$ | $L_{b57}$ |
| 2475 | $L_{a414}$ | $L_{b58}$ | 2476 | $L_{a746}$ | $L_{b58}$ |
| 2477 | $L_{a414}$ | $L_{b59}$ | 2478 | $L_{a746}$ | $L_{b59}$ |
| 2479 | $L_{a414}$ | $L_{b66}$ | 2480 | $L_{a746}$ | $L_{b66}$ |
| 2481 | $L_{a414}$ | $L_{b68}$ | 2482 | $L_{a746}$ | $L_{b68}$ |
| 2483 | $L_{a414}$ | $L_{b70}$ | 2484 | $L_{a746}$ | $L_{b70}$ |
| 2485 | $L_{a414}$ | $L_{b75}$ | 2486 | $L_{a746}$ | $L_{b75}$ |

-continued

| Metal Complex No. | $L_a$ | $L_b$ | Metal Complex No. | $L_a$ | $L_b$ |
|---|---|---|---|---|---|
| 2487 | $L_{a414}$ | $L_{b76}$ | 2488 | $L_{a746}$ | $L_{b76}$ |
| 2489 | $L_{a414}$ | $L_{b87}$ | 2490 | $L_{a746}$ | $L_{b87}$ |
| 2491 | $L_{a414}$ | $L_{b95}$ | 2492 | $L_{a746}$ | $L_{b95}$ |
| 2493 | $L_{a414}$ | $L_{b96}$ | 2494 | $L_{a746}$ | $L_{b96}$ |
| 2495 | $L_{a414}$ | $L_{b97}$ | 2496 | $L_{a746}$ | $L_{b97}$ |
| 2497 | $L_{a414}$ | $L_{b98}$ | 2498 | $L_{a746}$ | $L_{b98}$ |
| 2499 | $L_{a414}$ | $L_{b109}$ | 2500 | $L_{a746}$ | $L_{b109}$ |
| 2501 | $L_{a414}$ | $L_{b110}$ | 2502 | $L_{a746}$ | $L_{b110}$ |
| 2503 | $L_{a414}$ | $L_{b111}$ | 2504 | $L_{a746}$ | $L_{b111}$ |
| 2505 | $L_{a414}$ | $L_{b112}$ | 2506 | $L_{a746}$ | $L_{b112}$ |
| 2507 | $L_{a414}$ | $L_{b114}$ | 2508 | $L_{a746}$ | $L_{b114}$ |
| 2509 | $L_{a414}$ | $L_{b117}$ | 2510 | $L_{a746}$ | $L_{b117}$ |
| 2511 | $L_{a414}$ | $L_{b122}$ | 2512 | $L_{a746}$ | $L_{b122}$ |
| 2513 | $L_{a414}$ | $L_{b123}$ | 2514 | $L_{a746}$ | $L_{b123}$ |
| 2515 | $L_{a414}$ | $L_{b129}$ | 2516 | $L_{a746}$ | $L_{b129}$ |
| 2517 | $L_{a414}$ | $L_{b130}$ | 2518 | $L_{a746}$ | $L_{b130}$ |
| 2519 | $L_{a414}$ | $L_{b131}$ | 2520 | $L_{a746}$ | $L_{b131}$ |
| 2521 | $L_{a414}$ | $L_{b133}$ | 2522 | $L_{a746}$ | $L_{b133}$ |
| 2523 | $L_{a414}$ | $L_{b134}$ | 2524 | $L_{a746}$ | $L_{b134}$ |
| 2525 | $L_{a414}$ | $L_{b135}$ | 2526 | $L_{a746}$ | $L_{b135}$ |
| 2527 | $L_{a414}$ | $L_{b148}$ | 2528 | $L_{a746}$ | $L_{b148}$ |
| 2529 | $L_{a414}$ | $L_{b149}$ | 2530 | $L_{a746}$ | $L_{b149}$ |
| 2531 | $L_{a414}$ | $L_{b150}$ | 2532 | $L_{a746}$ | $L_{b150}$ |
| 2533 | $L_{a414}$ | $L_{b151}$ | 2534 | $L_{a746}$ | $L_{b151}$ |
| 2535 | $L_{a747}$ | $L_{b2}$ | 2536 | $L_{a824}$ | $L_{b2}$ |
| 2537 | $L_{a747}$ | $L_{b4}$ | 2538 | $L_{a824}$ | $L_{b4}$ |
| 2539 | $L_{a747}$ | $L_{b5}$ | 2540 | $L_{a824}$ | $L_{b5}$ |
| 2541 | $L_{a747}$ | $L_{b10}$ | 2542 | $L_{a824}$ | $L_{b1}$ |
| 2543 | $L_{a747}$ | $L_{b11}$ | 2544 | $L_{a824}$ | $L_{b11}$ |
| 2545 | $L_{a747}$ | $L_{b12}$ | 2546 | $L_{a824}$ | $L_{b12}$ |
| 2547 | $L_{a747}$ | $L_{b13}$ | 2548 | $L_{a824}$ | $L_{b13}$ |
| 2549 | $L_{a747}$ | $L_{b14}$ | 2550 | $L_{a824}$ | $L_{b14}$ |
| 2551 | $L_{a747}$ | $L_{b15}$ | 2552 | $L_{a824}$ | $L_{b15}$ |
| 2553 | $L_{a747}$ | $L_{b17}$ | 2554 | $L_{a824}$ | $L_{b17}$ |
| 2555 | $L_{a747}$ | $L_{b19}$ | 2556 | $L_{a824}$ | $L_{b19}$ |
| 2557 | $L_{a747}$ | $L_{b21}$ | 2558 | $L_{a824}$ | $L_{b21}$ |
| 2559 | $L_{a747}$ | $L_{b22}$ | 2560 | $L_{a824}$ | $L_{b22}$ |
| 2561 | $L_{a747}$ | $L_{b23}$ | 2562 | $L_{a824}$ | $L_{b23}$ |
| 2563 | $L_{a747}$ | $L_{b24}$ | 2564 | $L_{a824}$ | $L_{b24}$ |
| 2565 | $L_{a747}$ | $L_{b25}$ | 2566 | $L_{a824}$ | $L_{b25}$ |
| 2567 | $L_{a747}$ | $L_{b26}$ | 2568 | $L_{a824}$ | $L_{b26}$ |
| 2569 | $L_{a747}$ | $L_{b27}$ | 2570 | $L_{a824}$ | $L_{b27}$ |
| 2571 | $L_{a747}$ | $L_{b28}$ | 2572 | $L_{a824}$ | $L_{b28}$ |
| 2573 | $L_{a747}$ | $L_{b29}$ | 2574 | $L_{a824}$ | $L_{b29}$ |
| 2575 | $L_{a747}$ | $L_{b30}$ | 2576 | $L_{a824}$ | $L_{b30}$ |
| 2577 | $L_{a747}$ | $L_{b31}$ | 2578 | $L_{a824}$ | $L_{b31}$ |
| 2579 | $L_{a747}$ | $L_{b32}$ | 2580 | $L_{a824}$ | $L_{b32}$ |
| 2581 | $L_{a747}$ | $L_{b33}$ | 2582 | $L_{a824}$ | $L_{b3:}$ |
| 2583 | $L_{a747}$ | $L_{b42}$ | 2584 | $L_{a824}$ | $L_{b42}$ |
| 2585 | $L_{a747}$ | $L_{b43}$ | 2586 | $L_{a824}$ | $L_{b43}$ |
| 2587 | $L_{a747}$ | $L_{b44}$ | 2588 | $L_{a824}$ | $L_{b44}$ |
| 2589 | $L_{a747}$ | $L_{b45}$ | 2590 | $L_{a824}$ | $L_{b45}$ |
| 2591 | $L_{a747}$ | $L_{b46}$ | 2592 | $L_{a824}$ | $L_{b46}$ |
| 2593 | $L_{a747}$ | $L_{b50}$ | 2594 | $L_{a824}$ | $L_{b50}$ |
| 2595 | $L_{a747}$ | $L_{b51}$ | 2596 | $L_{a824}$ | $L_{b51}$ |
| 2597 | $L_{a747}$ | $L_{b53}$ | 2598 | $L_{a824}$ | $L_{b53}$ |
| 2599 | $L_{a747}$ | $L_{b54}$ | 2600 | $L_{a824}$ | $L_{b54}$ |
| 2601 | $L_{a747}$ | $L_{b55}$ | 2602 | $L_{a824}$ | $L_{b55}$ |
| 2603 | $L_{a747}$ | $L_{b56}$ | 2604 | $L_{a824}$ | $L_{b56}$ |
| 2605 | $L_{a747}$ | $L_{b57}$ | 2606 | $L_{a824}$ | $L_{b57}$ |
| 2607 | $L_{a747}$ | $L_{b58}$ | 2608 | $L_{a824}$ | $L_{b58}$ |
| 2609 | $L_{a747}$ | $L_{b59}$ | 2610 | $L_{a824}$ | $L_{b59}$ |
| 2611 | $L_{a747}$ | $L_{b66}$ | 2612 | $L_{a824}$ | $L_{b66}$ |
| 2613 | $L_{a747}$ | $L_{b68}$ | 2614 | $L_{a824}$ | $L_{b68}$ |
| 2615 | $L_{a747}$ | $L_{b70}$ | 2616 | $L_{a824}$ | $L_{b70}$ |
| 2617 | $L_{a747}$ | $L_{b75}$ | 2618 | $L_{a824}$ | $L_{b75}$ |
| 2619 | $L_{a747}$ | $L_{b76}$ | 2620 | $L_{a824}$ | $L_{b76}$ |
| 2621 | $L_{a747}$ | $L_{b87}$ | 2622 | $L_{a824}$ | $L_{b87}$ |
| 2623 | $L_{a747}$ | $L_{b95}$ | 2624 | $L_{a824}$ | $L_{b95}$ |
| 2625 | $L_{a747}$ | $L_{b96}$ | 2626 | $L_{a824}$ | $L_{b96}$ |
| 2627 | $L_{a747}$ | $L_{b97}$ | 2628 | $L_{a824}$ | $L_{b97}$ |
| 2629 | $L_{a747}$ | $L_{b98}$ | 2630 | $L_{a824}$ | $L_{b98}$ |
| 2631 | $L_{a747}$ | $L_{b109}$ | 2632 | $L_{a824}$ | $L_{b109}$ |
| 2633 | $L_{a747}$ | $L_{b110}$ | 2634 | $L_{a824}$ | $L_{b110}$ |
| 2635 | $L_{a747}$ | $L_{b111}$ | 2636 | $L_{a824}$ | $L_{b111}$ |
| 2637 | $L_{a747}$ | $L_{b112}$ | 2638 | $L_{a824}$ | $L_{b112}$ |

-continued

| Metal Complex No. | $L_a$ | $L_b$ | Metal Complex No. | $L_a$ | $L_b$ |
|---|---|---|---|---|---|
| 2639 | $L_{a747}$ | $L_{b114}$ | 2640 | $L_{a824}$ | $L_{b114}$ |
| 2641 | $L_{a747}$ | $L_{b117}$ | 2642 | $L_{a824}$ | $L_{b117}$ |
| 2643 | $L_{a747}$ | $L_{b122}$ | 2644 | $L_{a824}$ | $L_{b122}$ |
| 2645 | $L_{a747}$ | $L_{b123}$ | 2646 | $L_{a824}$ | $L_{b123}$ |
| 2647 | $L_{a747}$ | $L_{b129}$ | 2648 | $L_{a824}$ | $L_{b129}$ |
| 2649 | $L_{a747}$ | $L_{b130}$ | 2650 | $L_{a824}$ | $L_{b130}$ |
| 2651 | $L_{a747}$ | $L_{b131}$ | 2652 | $L_{a824}$ | $L_{b131}$ |
| 2653 | $L_{a747}$ | $L_{b133}$ | 2654 | $L_{a824}$ | $L_{b133}$ |
| 2655 | $L_{a747}$ | $L_{b134}$ | 2656 | $L_{a824}$ | $L_{b134}$ |
| 2657 | $L_{a747}$ | $L_{b135}$ | 2658 | $L_{a824}$ | $L_{b135}$ |
| 2659 | $L_{a747}$ | $L_{b148}$ | 2660 | $L_{a824}$ | $L_{b148}$ |
| 2661 | $L_{a747}$ | $L_{b149}$ | 2662 | $L_{a824}$ | $L_{b149}$ |
| 2663 | $L_{a747}$ | $L_{b150}$ | 2664 | $L_{a824}$ | $L_{b150}$ |
| 2665 | $L_{a747}$ | $L_{b151}$ | 2666 | $L_{a824}$ | $L_{b151}$ |
| 2667 | $L_{a953}$ | $L_{b2}$ | 2668 | $L_{a1024}$ | $L_{b2}$ |
| 2669 | $L_{a953}$ | $L_{b4}$ | 2670 | $L_{a1024}$ | $L_{b4}$ |
| 2671 | $L_{a953}$ | $L_{b5}$ | 2672 | $L_{a1024}$ | $L_{b5}$ |
| 2673 | $L_{a953}$ | $L_{b10}$ | 2674 | $L_{a1024}$ | $L_{b10}$ |
| 2675 | $L_{a953}$ | $L_{b11}$ | 2676 | $L_{a1024}$ | $L_{b11}$ |
| 2677 | $L_{a953}$ | $L_{b12}$ | 2678 | $L_{a1024}$ | $L_{b12}$ |
| 2679 | $L_{a953}$ | $L_{b13}$ | 2680 | $L_{a1024}$ | $L_{b13}$ |
| 2681 | $L_{a953}$ | $L_{b14}$ | 2682 | $L_{a1024}$ | $L_{b14}$ |
| 2683 | $L_{a953}$ | $L_{b15}$ | 2684 | $L_{a1024}$ | $L_{b15}$ |
| 2685 | $L_{a953}$ | $L_{b17}$ | 2686 | $L_{a1024}$ | $L_{b17}$ |
| 2687 | $L_{a953}$ | $L_{b19}$ | 2688 | $L_{a1024}$ | $L_{b19}$ |
| 2689 | $L_{a953}$ | $L_{b21}$ | 2690 | $L_{a1024}$ | $L_{b21}$ |
| 2691 | $L_{a953}$ | $L_{b22}$ | 2692 | $L_{a1024}$ | $L_{b22}$ |
| 2693 | $L_{a953}$ | $L_{b23}$ | 2694 | $L_{a1024}$ | $L_{b23}$ |
| 2695 | $L_{a953}$ | $L_{b24}$ | 2696 | $L_{a1024}$ | $L_{b24}$ |
| 2697 | $L_{a953}$ | $L_{b25}$ | 2698 | $L_{a1024}$ | $L_{b25}$ |
| 2699 | $L_{a953}$ | $L_{b26}$ | 2700 | $L_{a1024}$ | $L_{b26}$ |
| 2701 | $L_{a953}$ | $L_{b27}$ | 2702 | $L_{a1024}$ | $L_{b27}$ |
| 2703 | $L_{a953}$ | $L_{b28}$ | 2704 | $L_{a1024}$ | $L_{b28}$ |
| 2705 | $L_{a953}$ | $L_{b29}$ | 2706 | $L_{a1024}$ | $L_{b29}$ |
| 2707 | $L_{a953}$ | $L_{b30}$ | 2708 | $L_{a1024}$ | $L_{b30}$ |
| 2709 | $L_{a953}$ | $L_{b31}$ | 2710 | $L_{a1024}$ | $L_{b31}$ |
| 2711 | $L_{a953}$ | $L_{b32}$ | 2712 | $L_{a1024}$ | $L_{b32}$ |
| 2713 | $L_{a953}$ | $L_{b33}$ | 2714 | $L_{a1024}$ | $L_{b33}$ |
| 2715 | $L_{a953}$ | $L_{b42}$ | 2716 | $L_{a1024}$ | $L_{b42}$ |
| 2717 | $L_{a953}$ | $L_{b43}$ | 2718 | $L_{a1024}$ | $L_{b43}$ |
| 2719 | $L_{a953}$ | $L_{b44}$ | 2720 | $L_{a1024}$ | $L_{b44}$ |
| 2721 | $L_{a953}$ | $L_{b45}$ | 2722 | $L_{a1024}$ | $L_{b45}$ |
| 2723 | $L_{a953}$ | $L_{b46}$ | 2724 | $L_{a1024}$ | $L_{b46}$ |
| 2725 | $L_{a953}$ | $L_{b50}$ | 2726 | $L_{a1024}$ | $L_{b50}$ |
| 2727 | $L_{a953}$ | $L_{b51}$ | 2728 | $L_{a1024}$ | $L_{b51}$ |
| 2729 | $L_{a953}$ | $L_{b53}$ | 2730 | $L_{a1024}$ | $L_{b53}$ |
| 2731 | $L_{a953}$ | $L_{b54}$ | 2732 | $L_{a1024}$ | $L_{b54}$ |
| 2733 | $L_{a953}$ | $L_{b55}$ | 2734 | $L_{a1024}$ | $L_{b55}$ |
| 2735 | $L_{a953}$ | $L_{b56}$ | 2736 | $L_{a1024}$ | $L_{b56}$ |
| 2737 | $L_{a953}$ | $L_{b57}$ | 2738 | $L_{a1024}$ | $L_{b57}$ |
| 2739 | $L_{a953}$ | $L_{b58}$ | 2740 | $L_{a1024}$ | $L_{b58}$ |
| 2741 | $L_{a953}$ | $L_{b59}$ | 2742 | $L_{a1024}$ | $L_{b59}$ |
| 2743 | $L_{a953}$ | $L_{b66}$ | 2744 | $L_{a1024}$ | $L_{b66}$ |
| 2745 | $L_{a953}$ | $L_{b68}$ | 2746 | $L_{a1024}$ | $L_{b68}$ |
| 2747 | $L_{a953}$ | $L_{b70}$ | 2748 | $L_{a1024}$ | $L_{b70}$ |
| 2749 | $L_{a953}$ | $L_{b75}$ | 2750 | $L_{a1024}$ | $L_{b75}$ |
| 2751 | $L_{a953}$ | $L_{b76}$ | 2752 | $L_{a1024}$ | $L_{b76}$ |
| 2753 | $L_{a953}$ | $L_{b87}$ | 2754 | $L_{a1024}$ | $L_{b87}$ |
| 2755 | $L_{a953}$ | $L_{b95}$ | 2756 | $L_{a1024}$ | $L_{b95}$ |
| 2757 | $L_{a953}$ | $L_{b96}$ | 2758 | $L_{a1024}$ | $L_{b96}$ |
| 2759 | $L_{a953}$ | $L_{b97}$ | 2760 | $L_{a1024}$ | $L_{b97}$ |
| 2761 | $L_{a953}$ | $L_{b98}$ | 2762 | $L_{a1024}$ | $L_{b98}$ |
| 2763 | $L_{a953}$ | $L_{b109}$ | 2764 | $L_{a1024}$ | $L_{b109}$ |
| 2765 | $L_{a953}$ | $L_{b110}$ | 2766 | $L_{a1024}$ | $L_{b110}$ |
| 2767 | $L_{a953}$ | $L_{b111}$ | 2768 | $L_{a1024}$ | $L_{b111}$ |
| 2769 | $L_{a953}$ | $L_{b112}$ | 2770 | $L_{a1024}$ | $L_{b112}$ |
| 2771 | $L_{a953}$ | $L_{b114}$ | 2772 | $L_{a1024}$ | $L_{b114}$ |
| 2773 | $L_{a953}$ | $L_{b117}$ | 2774 | $L_{a1024}$ | $L_{b117}$ |
| 2775 | $L_{a953}$ | $L_{b122}$ | 2776 | $L_{a1024}$ | $L_{b122}$ |
| 2777 | $L_{a953}$ | $L_{b123}$ | 2778 | $L_{a1024}$ | $L_{b123}$ |
| 2779 | $L_{a953}$ | $L_{b129}$ | 2780 | $L_{a1024}$ | $L_{b129}$ |
| 2781 | $L_{a953}$ | $L_{b130}$ | 2782 | $L_{a1024}$ | $L_{b130}$ |
| 2783 | $L_{a953}$ | $L_{b131}$ | 2784 | $L_{a1024}$ | $L_{b131}$ |
| 2785 | $L_{a953}$ | $L_{b133}$ | 2786 | $L_{a1024}$ | $L_{b133}$ |
| 2787 | $L_{a953}$ | $L_{b134}$ | 2788 | $L_{a1024}$ | $L_{b134}$ |
| 2789 | $L_{a953}$ | $L_{b135}$ | 2790 | $L_{a1024}$ | $L_{b135}$ |

-continued

| Metal Complex No. | $L_a$ | $L_b$ | Metal Complex No. | $L_a$ | $L_b$ |
|---|---|---|---|---|---|
| 2791 | $L_{a953}$ | $L_{b148}$ | 2792 | $L_{a1024}$ | $L_{b148}$ |
| 2793 | $L_{a953}$ | $L_{b149}$ | 2794 | $L_{a1024}$ | $L_{b149}$ |
| 2795 | $L_{a953}$ | $L_{b150}$ | 2796 | $L_{a1024}$ | $L_{b150}$ |
| 2797 | $L_{a953}$ | $L_{b151}$ | 2798 | $L_{a1024}$ | $L_{b151}$ |
| 2799 | $L_{a1095}$ | $L_{b2}$ | 2800 | $L_{a1166}$ | $L_{b2}$ |
| 2801 | $L_{a1095}$ | $L_{b4}$ | 2802 | $L_{a1166}$ | $L_{b4}$ |
| 2803 | $L_{a1095}$ | $L_{b5}$ | 2804 | $L_{a1166}$ | $L_{b5}$ |
| 2805 | $L_{a1095}$ | $L_{b10}$ | 2806 | $L_{a1166}$ | $L_{b10}$ |
| 2807 | $L_{a1095}$ | $L_{b11}$ | 2808 | $L_{a1166}$ | $L_{b11}$ |
| 2809 | $L_{a1095}$ | $L_{b12}$ | 2810 | $L_{a1166}$ | $L_{b12}$ |
| 2811 | $L_{a1095}$ | $L_{b13}$ | 2812 | $L_{a1166}$ | $L_{b13}$ |
| 2813 | $L_{a1095}$ | $L_{b14}$ | 2814 | $L_{a1166}$ | $L_{b14}$ |
| 2815 | $L_{a1095}$ | $L_{b15}$ | 2816 | $L_{a1166}$ | $L_{b15}$ |
| 2817 | $L_{a1095}$ | $L_{b17}$ | 2818 | $L_{a1166}$ | $L_{b17}$ |
| 2819 | $L_{a1095}$ | $L_{b19}$ | 2820 | $L_{a1166}$ | $L_{b19}$ |
| 2821 | $L_{a1095}$ | $L_{b21}$ | 2822 | $L_{a1166}$ | $L_{b21}$ |
| 2823 | $L_{a1095}$ | $L_{b22}$ | 2824 | $L_{a1166}$ | $L_{b22}$ |
| 2825 | $L_{a1095}$ | $L_{b23}$ | 2826 | $L_{a1166}$ | $L_{b23}$ |
| 2827 | $L_{a1095}$ | $L_{b24}$ | 2828 | $L_{a1166}$ | $L_{b24}$ |
| 2829 | $L_{a1095}$ | $L_{b25}$ | 2830 | $L_{a1166}$ | $L_{b25}$ |
| 2831 | $L_{a1095}$ | $L_{b26}$ | 2832 | $L_{a1166}$ | $L_{b26}$ |
| 2833 | $L_{a1095}$ | $L_{b27}$ | 2834 | $L_{a1166}$ | $L_{b27}$ |
| 2835 | $L_{a1095}$ | $L_{b28}$ | 2836 | $L_{a1166}$ | $L_{b28}$ |
| 2837 | $L_{a1095}$ | $L_{b29}$ | 2838 | $L_{a1166}$ | $L_{b29}$ |
| 2839 | $L_{a1095}$ | $L_{b30}$ | 2840 | $L_{a1166}$ | $L_{b30}$ |
| 2841 | $L_{a1095}$ | $L_{b31}$ | 2842 | $L_{a1166}$ | $L_{b31}$ |
| 2843 | $L_{a1095}$ | $L_{b32}$ | 2844 | $L_{a1166}$ | $L_{b32}$ |
| 2845 | $L_{a1095}$ | $L_{b33}$ | 2846 | $L_{a1166}$ | $L_{b33}$ |
| 2847 | $L_{a1095}$ | $L_{b42}$ | 2848 | $L_{a1166}$ | $L_{b42}$ |
| 2849 | $L_{a1095}$ | $L_{b43}$ | 2850 | $L_{a1166}$ | $L_{b43}$ |
| 2851 | $L_{a1095}$ | $L_{b44}$ | 2852 | $L_{a1166}$ | $L_{b44}$ |
| 2853 | $L_{a1095}$ | $L_{b45}$ | 2854 | $L_{a1166}$ | $L_{b45}$ |
| 2855 | $L_{a1095}$ | $L_{b46}$ | 2856 | $L_{a1166}$ | $L_{b46}$ |
| 2857 | $L_{a1095}$ | $L_{b50}$ | 2858 | $L_{a1166}$ | $L_{b50}$ |
| 2859 | $L_{a1095}$ | $L_{b51}$ | 2860 | $L_{a1166}$ | $L_{b51}$ |
| 2861 | $L_{a1095}$ | $L_{b53}$ | 2862 | $L_{a1166}$ | $L_{b53}$ |
| 2863 | $L_{a1095}$ | $L_{b54}$ | 2864 | $L_{a1166}$ | $L_{b54}$ |
| 2865 | $L_{a1095}$ | $L_{b55}$ | 2866 | $L_{a1166}$ | $L_{b55}$ |
| 2867 | $L_{a1095}$ | $L_{b56}$ | 2868 | $L_{a1166}$ | $L_{b56}$ |
| 2869 | $L_{a1095}$ | $L_{b57}$ | 2870 | $L_{a1166}$ | $L_{b57}$ |
| 2871 | $L_{a1095}$ | $L_{b58}$ | 2872 | $L_{a1166}$ | $L_{b58}$ |
| 2873 | $L_{a1095}$ | $L_{b59}$ | 2874 | $L_{a1166}$ | $L_{b59}$ |
| 2875 | $L_{a1095}$ | $L_{b66}$ | 2876 | $L_{a1166}$ | $L_{b66}$ |
| 2877 | $L_{a1095}$ | $L_{b68}$ | 2878 | $L_{a1166}$ | $L_{b68}$ |
| 2879 | $L_{a1095}$ | $L_{b70}$ | 2880 | $L_{a1166}$ | $L_{b70}$ |
| 2881 | $L_{a1095}$ | $L_{b75}$ | 2882 | $L_{a1166}$ | $L_{b75}$ |
| 2883 | $L_{a1095}$ | $L_{b76}$ | 2884 | $L_{a1166}$ | $L_{b76}$ |
| 2885 | $L_{a1095}$ | $L_{b87}$ | 2886 | $L_{a1166}$ | $L_{b87}$ |
| 2887 | $L_{a1095}$ | $L_{b95}$ | 2888 | $L_{a1166}$ | $L_{b95}$ |
| 2889 | $L_{a1095}$ | $L_{b96}$ | 2890 | $L_{a1166}$ | $L_{b96}$ |
| 2891 | $L_{a1095}$ | $L_{b97}$ | 2892 | $L_{a1166}$ | $L_{b97}$ |
| 2893 | $L_{a1095}$ | $L_{b98}$ | 2894 | $L_{a1166}$ | $L_{b98}$ |
| 2895 | $L_{a1095}$ | $L_{b109}$ | 2896 | $L_{a1166}$ | $L_{b109}$ |
| 2897 | $L_{a1095}$ | $L_{b110}$ | 2898 | $L_{a1166}$ | $L_{b110}$ |
| 2899 | $L_{a1095}$ | $L_{b111}$ | 2900 | $L_{a1166}$ | $L_{b111}$ |
| 2901 | $L_{a1095}$ | $L_{b112}$ | 2902 | $L_{a1166}$ | $L_{b112}$ |
| 2903 | $L_{a1095}$ | $L_{b114}$ | 2904 | $L_{a1166}$ | $L_{b114}$ |
| 2905 | $L_{a1095}$ | $L_{b117}$ | 2906 | $L_{a1166}$ | $L_{b117}$ |
| 2907 | $L_{a1095}$ | $L_{b122}$ | 2908 | $L_{a1166}$ | $L_{b122}$ |
| 2909 | $L_{a1095}$ | $L_{b123}$ | 2910 | $L_{a1166}$ | $L_{b123}$ |
| 2911 | $L_{a1095}$ | $L_{b129}$ | 2912 | $L_{a1166}$ | $L_{b129}$ |
| 2913 | $L_{a1095}$ | $L_{b130}$ | 2914 | $L_{a1166}$ | $L_{b130}$ |
| 2915 | $L_{a1095}$ | $L_{b131}$ | 2916 | $L_{a1166}$ | $L_{b131}$ |
| 2917 | $L_{a1095}$ | $L_{b133}$ | 2918 | $L_{a1166}$ | $L_{b133}$ |
| 2919 | $L_{a1095}$ | $L_{b134}$ | 2920 | $L_{a1166}$ | $L_{b134}$ |
| 2921 | $L_{a1095}$ | $L_{b135}$ | 2922 | $L_{a1166}$ | $L_{b135}$ |
| 2923 | $L_{a1095}$ | $L_{b148}$ | 2924 | $L_{a1166}$ | $L_{b148}$ |
| 2925 | $L_{a1095}$ | $L_{b149}$ | 2926 | $L_{a1166}$ | $L_{b149}$ |
| 2927 | $L_{a1095}$ | $L_{b150}$ | 2928 | $L_{a1166}$ | $L_{b150}$ |
| 2929 | $L_{a1095}$ | $L_{b151}$ | 2930 | $L_{a1166}$ | $L_{b151}$ |
| 2931 | $L_{a1237}$ | $L_{b2}$ | 2932 | $L_{a1569}$ | $L_{b2}$ |
| 2933 | $L_{a1237}$ | $L_{b4}$ | 2934 | $L_{a1569}$ | $L_{b4}$ |
| 2935 | $L_{a1237}$ | $L_{b5}$ | 2936 | $L_{a1569}$ | $L_{b5}$ |
| 2937 | $L_{a1237}$ | $L_{b10}$ | 2938 | $L_{a1569}$ | $L_{b10}$ |
| 2939 | $L_{a1237}$ | $L_{b11}$ | 2940 | $L_{a1569}$ | $L_{b11}$ |
| 2941 | $L_{a1237}$ | $L_{b12}$ | 2942 | $L_{a1569}$ | $L_{b12}$ |

-continued

| Metal Complex No. | $L_a$ | $L_b$ | Metal Complex No. | $L_a$ | $L_b$ |
|---|---|---|---|---|---|
| 2943 | $L_{a1237}$ | $L_{b13}$ | 2944 | $L_{a1569}$ | $L_{b13}$ |
| 2945 | $L_{a1237}$ | $L_{b14}$ | 2946 | $L_{a1569}$ | $L_{b14}$ |
| 2947 | $L_{a1237}$ | $L_{b15}$ | 2948 | $L_{a1569}$ | $L_{b15}$ |
| 2949 | $L_{a1237}$ | $L_{b17}$ | 2950 | $L_{a1569}$ | $L_{b17}$ |
| 2951 | $L_{a1237}$ | $L_{b19}$ | 2952 | $L_{a1569}$ | $L_{b19}$ |
| 2953 | $L_{a1237}$ | $L_{b21}$ | 2954 | $L_{a1569}$ | $L_{b21}$ |
| 2955 | $L_{a1237}$ | $L_{b22}$ | 2956 | $L_{a1569}$ | $L_{b22}$ |
| 2957 | $L_{a1237}$ | $L_{b23}$ | 2958 | $L_{a1569}$ | $L_{b23}$ |
| 2959 | $L_{a1237}$ | $L_{b24}$ | 2960 | $L_{a1569}$ | $L_{b24}$ |
| 2961 | $L_{a1237}$ | $L_{b25}$ | 2962 | $L_{a1569}$ | $L_{b25}$ |
| 2963 | $L_{a1237}$ | $L_{b26}$ | 2964 | $L_{a1569}$ | $L_{b26}$ |
| 2965 | $L_{a1237}$ | $L_{b27}$ | 2966 | $L_{a1569}$ | $L_{b27}$ |
| 2967 | $L_{a1237}$ | $L_{b28}$ | 2968 | $L_{a1569}$ | $L_{b28}$ |
| 2969 | $L_{a1237}$ | $L_{b29}$ | 2970 | $L_{a1569}$ | $L_{b29}$ |
| 2971 | $L_{a1237}$ | $L_{b30}$ | 2972 | $L_{a1569}$ | $L_{b30}$ |
| 2973 | $L_{a1237}$ | $L_{b31}$ | 2974 | $L_{a1569}$ | $L_{b31}$ |
| 2975 | $L_{a1237}$ | $L_{b32}$ | 2976 | $L_{a1569}$ | $L_{b32}$ |
| 2977 | $L_{a1237}$ | $L_{b33}$ | 2978 | $L_{a1569}$ | $L_{b33}$ |
| 2979 | $L_{a1237}$ | $L_{b42}$ | 2980 | $L_{a1569}$ | $L_{b42}$ |
| 2981 | $L_{a1237}$ | $L_{b43}$ | 2982 | $L_{a1569}$ | $L_{b43}$ |
| 2983 | $L_{a1237}$ | $L_{b44}$ | 2984 | $L_{a1569}$ | $L_{b44}$ |
| 2985 | $L_{a1237}$ | $L_{b45}$ | 2986 | $L_{a1569}$ | $L_{b45}$ |
| 2987 | $L_{a1237}$ | $L_{b46}$ | 2988 | $L_{a1569}$ | $L_{b46}$ |
| 2989 | $L_{a1237}$ | $L_{b50}$ | 2990 | $L_{a1569}$ | $L_{b50}$ |
| 2991 | $L_{a1237}$ | $L_{b51}$ | 2992 | $L_{a1569}$ | $L_{b51}$ |
| 2993 | $L_{a1237}$ | $L_{b53}$ | 2994 | $L_{a1569}$ | $L_{b53}$ |
| 2995 | $L_{a1237}$ | $L_{b54}$ | 2996 | $L_{a1569}$ | $L_{b54}$ |
| 2997 | $L_{a1237}$ | $L_{b55}$ | 2998 | $L_{a1569}$ | $L_{b55}$ |
| 2999 | $L_{a1237}$ | $L_{b56}$ | 3000 | $L_{a1569}$ | $L_{b56}$ |
| 3001 | $L_{a1237}$ | $L_{b57}$ | 3002 | $L_{a1569}$ | $L_{b57}$ |
| 3003 | $L_{a1237}$ | $L_{b58}$ | 3004 | $L_{a1569}$ | $L_{b58}$ |
| 3005 | $L_{a1237}$ | $L_{b59}$ | 3006 | $L_{a1569}$ | $L_{b59}$ |
| 3007 | $L_{a1237}$ | $L_{b66}$ | 3008 | $L_{a1569}$ | $L_{b66}$ |
| 3009 | $L_{a1237}$ | $L_{b68}$ | 3010 | $L_{a1569}$ | $L_{b68}$ |
| 3011 | $L_{a1237}$ | $L_{b70}$ | 3012 | $L_{a1569}$ | $L_{b70}$ |
| 3013 | $L_{a1237}$ | $L_{b75}$ | 3014 | $L_{a1569}$ | $L_{b75}$ |
| 3015 | $L_{a1237}$ | $L_{b76}$ | 3016 | $L_{a1569}$ | $L_{b76}$ |
| 3017 | $L_{a1237}$ | $L_{b87}$ | 3018 | $L_{a1569}$ | $L_{b87}$ |
| 3019 | $L_{a1237}$ | $L_{b95}$ | 3020 | $L_{a1569}$ | $L_{b95}$ |
| 3021 | $L_{a1237}$ | $L_{b96}$ | 3022 | $L_{a1569}$ | $L_{b96}$ |
| 3023 | $L_{a1237}$ | $L_{b97}$ | 3024 | $L_{a1569}$ | $L_{b97}$ |
| 3025 | $L_{a1237}$ | $L_{b98}$ | 3026 | $L_{a1569}$ | $L_{b98}$ |
| 3027 | $L_{a1237}$ | $L_{b109}$ | 3028 | $L_{a1569}$ | $L_{b109}$ |
| 3029 | $L_{a1237}$ | $L_{b110}$ | 3030 | $L_{a1569}$ | $L_{b110}$ |
| 3031 | $L_{a1237}$ | $L_{b111}$ | 3032 | $L_{a1569}$ | $L_{b111}$ |
| 3033 | $L_{a1237}$ | $L_{b112}$ | 3034 | $L_{a1569}$ | $L_{b112}$ |
| 3035 | $L_{a1237}$ | $L_{b114}$ | 3036 | $L_{a1569}$ | $L_{b114}$ |
| 3037 | $L_{a1237}$ | $L_{b117}$ | 3038 | $L_{a1569}$ | $L_{b117}$ |
| 3039 | $L_{a1237}$ | $L_{b122}$ | 3040 | $L_{a1569}$ | $L_{b122}$ |
| 3041 | $L_{a1237}$ | $L_{b123}$ | 3042 | $L_{a1569}$ | $L_{b123}$ |
| 3043 | $L_{a1237}$ | $L_{b129}$ | 3044 | $L_{a1569}$ | $L_{b129}$ |
| 3045 | $L_{a1237}$ | $L_{b130}$ | 3046 | $L_{a1569}$ | $L_{b130}$ |
| 3047 | $L_{a1237}$ | $L_{b131}$ | 3048 | $L_{a1569}$ | $L_{b131}$ |
| 3049 | $L_{a1237}$ | $L_{b133}$ | 3050 | $L_{a1569}$ | $L_{b133}$ |
| 3051 | $L_{a1237}$ | $L_{b134}$ | 3052 | $L_{a1569}$ | $L_{b134}$ |
| 3053 | $L_{a1237}$ | $L_{b135}$ | 3054 | $L_{a1569}$ | $L_{b135}$ |
| 3055 | $L_{a1237}$ | $L_{b148}$ | 3056 | $L_{a1569}$ | $L_{b148}$ |
| 3057 | $L_{a1237}$ | $L_{b149}$ | 3058 | $L_{a1569}$ | $L_{b149}$ |
| 3059 | $L_{a1237}$ | $L_{b150}$ | 3060 | $L_{a1569}$ | $L_{b150}$ |
| 3061 | $L_{a1237}$ | $L_{b151}$ | 3062 | $L_{a1569}$ | $L_{b151}$ |
| 3063 | $L_{a1570}$ | $L_{b2}$ | 3064 | $L_{a1891}$ | $L_{b2}$ |
| 3065 | $L_{a1570}$ | $L_{b4}$ | 3066 | $L_{a1891}$ | $L_{b4}$ |
| 3067 | $L_{a1570}$ | $L_{b5}$ | 3068 | $L_{a1891}$ | $L_{b5}$ |
| 3069 | $L_{a1570}$ | $L_{b10}$ | 3070 | $L_{a1891}$ | $L_{b10}$ |
| 3071 | $L_{a1570}$ | $L_{b11}$ | 3072 | $L_{a1891}$ | $L_{b11}$ |
| 3073 | $L_{a1570}$ | $L_{b12}$ | 3074 | $L_{a1891}$ | $L_{b12}$ |
| 3075 | $L_{a1570}$ | $L_{b13}$ | 3076 | $L_{a1891}$ | $L_{b13}$ |
| 3077 | $L_{a1570}$ | $L_{b14}$ | 3078 | $L_{a1891}$ | $L_{b14}$ |
| 3079 | $L_{a1570}$ | $L_{b15}$ | 3080 | $L_{a1891}$ | $L_{b15}$ |
| 3081 | $L_{a1570}$ | $L_{b17}$ | 3082 | $L_{a1891}$ | $L_{b17}$ |
| 3083 | $L_{a1570}$ | $L_{b19}$ | 3084 | $L_{a1891}$ | $L_{b19}$ |
| 3085 | $L_{a1570}$ | $L_{b21}$ | 3086 | $L_{a1891}$ | $L_{b21}$ |
| 3087 | $L_{a1570}$ | $L_{b22}$ | 3088 | $L_{a1891}$ | $L_{b22}$ |
| 3089 | $L_{a1570}$ | $L_{b23}$ | 3090 | $L_{a1891}$ | $L_{b23}$ |
| 3091 | $L_{a1570}$ | $L_{b24}$ | 3092 | $L_{a1891}$ | $L_{b24}$ |
| 3093 | $L_{a1570}$ | $L_{b25}$ | 3094 | $L_{a1891}$ | $L_{b25}$ |

-continued

| Metal Complex No. | $L_a$ | $L_b$ | Metal Complex No. | $L_a$ | $L_b$ |
|---|---|---|---|---|---|
| 3095 | $L_{a1570}$ | $L_{b26}$ | 3096 | $L_{a1891}$ | $L_{b26}$ |
| 3097 | $L_{a1570}$ | $L_{b27}$ | 3098 | $L_{a1891}$ | $L_{b27}$ |
| 3099 | $L_{a1570}$ | $L_{b28}$ | 3100 | $L_{a1891}$ | $L_{b28}$ |
| 3101 | $L_{a1570}$ | $L_{b29}$ | 3102 | $L_{a1891}$ | $L_{b29}$ |
| 3103 | $L_{a1570}$ | $L_{b30}$ | 3104 | $L_{a1891}$ | $L_{b30}$ |
| 3105 | $L_{a1570}$ | $L_{b31}$ | 3106 | $L_{a1891}$ | $L_{b31}$ |
| 3107 | $L_{a1570}$ | $L_{b32}$ | 3108 | $L_{a1891}$ | $L_{b32}$ |
| 3109 | $L_{a1570}$ | $L_{b33}$ | 3110 | $L_{a1891}$ | $L_{b33}$ |
| 3111 | $L_{a1570}$ | $L_{b42}$ | 3112 | $L_{a1891}$ | $L_{b42}$ |
| 3113 | $L_{a1570}$ | $L_{b43}$ | 3114 | $L_{a1891}$ | $L_{b43}$ |
| 3115 | $L_{a1570}$ | $L_{b44}$ | 3116 | $L_{a1891}$ | $L_{b44}$ |
| 3117 | $L_{a1570}$ | $L_{b45}$ | 3118 | $L_{a1891}$ | $L_{b45}$ |
| 3119 | $L_{a1570}$ | $L_{b46}$ | 3120 | $L_{a1891}$ | $L_{b46}$ |
| 3121 | $L_{a1570}$ | $L_{b50}$ | 3122 | $L_{a1891}$ | $L_{b50}$ |
| 3123 | $L_{a1570}$ | $L_{b51}$ | 3124 | $L_{a1891}$ | $L_{b51}$ |
| 3125 | $L_{a1570}$ | $L_{b53}$ | 3126 | $L_{a1891}$ | $L_{b53}$ |
| 3127 | $L_{a1570}$ | $L_{b54}$ | 3128 | $L_{a1891}$ | $L_{b54}$ |
| 3129 | $L_{a1570}$ | $L_{b55}$ | 3130 | $L_{a1891}$ | $L_{b55}$ |
| 3131 | $L_{a1570}$ | $L_{b56}$ | 3132 | $L_{a1891}$ | $L_{b56}$ |
| 3133 | $L_{a1570}$ | $L_{b57}$ | 3134 | $L_{a1891}$ | $L_{b57}$ |
| 3135 | $L_{a1570}$ | $L_{b58}$ | 3136 | $L_{a1891}$ | $L_{b58}$ |
| 3137 | $L_{a1570}$ | $L_{b59}$ | 3138 | $L_{a1891}$ | $L_{b59}$ |
| 3139 | $L_{a1570}$ | $L_{b66}$ | 3140 | $L_{a1891}$ | $L_{b66}$ |
| 3141 | $L_{a1570}$ | $L_{b68}$ | 3142 | $L_{a1891}$ | $L_{b68}$ |
| 3143 | $L_{a1570}$ | $L_{b70}$ | 3144 | $L_{a1891}$ | $L_{b70}$ |
| 3145 | $L_{a1570}$ | $L_{b75}$ | 3146 | $L_{a1891}$ | $L_{b75}$ |
| 3147 | $L_{a1570}$ | $L_{b76}$ | 3148 | $L_{a1891}$ | $L_{b76}$ |
| 3149 | $L_{a1570}$ | $L_{b87}$ | 3150 | $L_{a1891}$ | $L_{b87}$ |
| 3151 | $L_{a1570}$ | $L_{b95}$ | 3152 | $L_{a1891}$ | $L_{b95}$ |
| 3153 | $L_{a1570}$ | $L_{b96}$ | 3154 | $L_{a1891}$ | $L_{b96}$ |
| 3155 | $L_{a1570}$ | $L_{b97}$ | 3156 | $L_{a1891}$ | $L_{b97}$ |
| 3157 | $L_{a1570}$ | $L_{b98}$ | 3158 | $L_{a1891}$ | $L_{b98}$ |
| 3159 | $L_{a1570}$ | $L_{b109}$ | 3160 | $L_{a1891}$ | $L_{b109}$ |
| 3161 | $L_{a1570}$ | $L_{b110}$ | 3162 | $L_{a1891}$ | $L_{b110}$ |
| 3163 | $L_{a1570}$ | $L_{b111}$ | 3164 | $L_{a1891}$ | $L_{b111}$ |
| 3165 | $L_{a1570}$ | $L_{b112}$ | 3166 | $L_{a1891}$ | $L_{b112}$ |
| 3167 | $L_{a1570}$ | $L_{b114}$ | 3168 | $L_{a1891}$ | $L_{b114}$ |
| 3169 | $L_{a1570}$ | $L_{b117}$ | 3170 | $L_{a1891}$ | $L_{b117}$ |
| 3171 | $L_{a1570}$ | $L_{b122}$ | 3172 | $L_{a1891}$ | $L_{b122}$ |
| 3173 | $L_{a1570}$ | $L_{b123}$ | 3174 | $L_{a1891}$ | $L_{b123}$ |
| 3175 | $L_{a1570}$ | $L_{b129}$ | 3176 | $L_{a1891}$ | $L_{b129}$ |
| 3177 | $L_{a1570}$ | $L_{b130}$ | 3178 | $L_{a1891}$ | $L_{b130}$ |
| 3179 | $L_{a1570}$ | $L_{b131}$ | 3180 | $L_{a1891}$ | $L_{b131}$ |
| 3181 | $L_{a1570}$ | $L_{b133}$ | 3182 | $L_{a1891}$ | $L_{b133}$ |
| 3183 | $L_{a1570}$ | $L_{b134}$ | 3184 | $L_{a1891}$ | $L_{b134}$ |
| 3185 | $L_{a1570}$ | $L_{b135}$ | 3186 | $L_{a1891}$ | $L_{b135}$ |
| 3187 | $L_{a1570}$ | $L_{b148}$ | 3188 | $L_{a1891}$ | $L_{b148}$ |
| 3189 | $L_{a1570}$ | $L_{b149}$ | 3190 | $L_{a1891}$ | $L_{b149}$ |
| 3191 | $L_{a1570}$ | $L_{b150}$ | 3192 | $L_{a1891}$ | $L_{b150}$ |
| 3193 | $L_{a1570}$ | $L_{b151}$ | 3194 | $L_{a1891}$ | $L_{b151}$ |
| 3195 | $L_{a1962}$ | $L_{b2}$ | 3196 | $L_{a2785}$ | $L_{b2}$ |
| 3197 | $L_{a1962}$ | $L_{b4}$ | 3198 | $L_{a2785}$ | $L_{b4}$ |
| 3199 | $L_{a1962}$ | $L_{b5}$ | 3200 | $L_{a2785}$ | $L_{b5}$ |
| 3201 | $L_{a1962}$ | $L_{b10}$ | 3202 | $L_{a2785}$ | $L_{b10}$ |
| 3203 | $L_{a1962}$ | $L_{b11}$ | 3204 | $L_{a2785}$ | $L_{b11}$ |
| 3205 | $L_{a1962}$ | $L_{b12}$ | 3206 | $L_{a2785}$ | $L_{b12}$ |
| 3207 | $L_{a1962}$ | $L_{b13}$ | 3208 | $L_{a2785}$ | $L_{b13}$ |
| 3209 | $L_{a1962}$ | $L_{b14}$ | 3210 | $L_{a2785}$ | $L_{b14}$ |
| 3211 | $L_{a1962}$ | $L_{b15}$ | 3212 | $L_{a2785}$ | $L_{b15}$ |
| 3213 | $L_{a1962}$ | $L_{b17}$ | 3214 | $L_{a2785}$ | $L_{b17}$ |
| 3215 | $L_{a1962}$ | $L_{b19}$ | 3216 | $L_{a2785}$ | $L_{b19}$ |
| 3217 | $L_{a1962}$ | $L_{b21}$ | 3218 | $L_{a2785}$ | $L_{b21}$ |
| 3219 | $L_{a1962}$ | $L_{b22}$ | 3220 | $L_{a2785}$ | $L_{b22}$ |
| 3221 | $L_{a1962}$ | $L_{b23}$ | 3222 | $L_{a2785}$ | $L_{b23}$ |
| 3223 | $L_{a1962}$ | $L_{b24}$ | 3224 | $L_{a2785}$ | $L_{b24}$ |
| 3225 | $L_{a1962}$ | $L_{b25}$ | 3226 | $L_{a2785}$ | $L_{b25}$ |
| 3227 | $L_{a1962}$ | $L_{b26}$ | 3228 | $L_{a2785}$ | $L_{b26}$ |
| 3229 | $L_{a1962}$ | $L_{b27}$ | 3230 | $L_{a2785}$ | $L_{b27}$ |
| 3231 | $L_{a1962}$ | $L_{b28}$ | 3232 | $L_{a2785}$ | $L_{b28}$ |
| 3233 | $L_{a1962}$ | $L_{b29}$ | 3234 | $L_{a2785}$ | $L_{b29}$ |
| 3235 | $L_{a1962}$ | $L_{b30}$ | 3236 | $L_{a2785}$ | $L_{b30}$ |
| 3237 | $L_{a1962}$ | $L_{b31}$ | 3238 | $L_{a2785}$ | $L_{b31}$ |
| 3239 | $L_{a1962}$ | $L_{b32}$ | 3240 | $L_{a2785}$ | $L_{b32}$ |
| 3241 | $L_{a1962}$ | $L_{b33}$ | 3242 | $L_{a2785}$ | $L_{b33}$ |
| 3243 | $L_{a1962}$ | $L_{b42}$ | 3244 | $L_{a2785}$ | $L_{b42}$ |
| 3245 | $L_{a1962}$ | $L_{b43}$ | 3246 | $L_{a2785}$ | $L_{b43}$ |

-continued

| Metal Complex No. | $L_a$ | $L_b$ | Metal Complex No. | $L_a$ | $L_b$ |
|---|---|---|---|---|---|
| 3247 | $L_{a1962}$ | $L_{b44}$ | 3248 | $L_{a2785}$ | $L_{b44}$ |
| 3249 | $L_{a1962}$ | $L_{b45}$ | 3250 | $L_{a2785}$ | $L_{b45}$ |
| 3251 | $L_{a1962}$ | $L_{b46}$ | 3252 | $L_{a2785}$ | $L_{b46}$ |
| 3253 | $L_{a1962}$ | $L_{b50}$ | 3254 | $L_{a2785}$ | $L_{b50}$ |
| 3255 | $L_{a1962}$ | $L_{b51}$ | 3256 | $L_{a2785}$ | $L_{b51}$ |
| 3257 | $L_{a1962}$ | $L_{b53}$ | 3258 | $L_{a2785}$ | $L_{b53}$ |
| 3259 | $L_{a1962}$ | $L_{b54}$ | 3260 | $L_{a2785}$ | $L_{b54}$ |
| 3261 | $L_{a1962}$ | $L_{b55}$ | 3262 | $L_{a2785}$ | $L_{b55}$ |
| 3263 | $L_{a1962}$ | $L_{b56}$ | 3264 | $L_{a2785}$ | $L_{b56}$ |
| 3265 | $L_{a1962}$ | $L_{b57}$ | 3266 | $L_{a2785}$ | $L_{b57}$ |
| 3267 | $L_{a1962}$ | $L_{b58}$ | 3268 | $L_{a2785}$ | $L_{b58}$ |
| 3269 | $L_{a1962}$ | $L_{b59}$ | 3270 | $L_{a2785}$ | $L_{b59}$ |
| 3271 | $L_{a1962}$ | $L_{b66}$ | 3272 | $L_{a2785}$ | $L_{b66}$ |
| 3273 | $L_{a1962}$ | $L_{b68}$ | 3274 | $L_{a2785}$ | $L_{b68}$ |
| 3275 | $L_{a1962}$ | $L_{b70}$ | 3276 | $L_{a2785}$ | $L_{b70}$ |
| 3277 | $L_{a1962}$ | $L_{b75}$ | 3278 | $L_{a2785}$ | $L_{b75}$ |
| 3279 | $L_{a1962}$ | $L_{b76}$ | 3280 | $L_{a2785}$ | $L_{b76}$ |
| 3281 | $L_{a1962}$ | $L_{b87}$ | 3282 | $L_{a2785}$ | $L_{b87}$ |
| 3283 | $L_{a1962}$ | $L_{b95}$ | 3284 | $L_{a2785}$ | $L_{b95}$ |
| 3285 | $L_{a1962}$ | $L_{b96}$ | 3286 | $L_{a2785}$ | $L_{b96}$ |
| 3287 | $L_{a1962}$ | $L_{b97}$ | 3288 | $L_{a2785}$ | $L_{b97}$ |
| 3289 | $L_{a1962}$ | $L_{b98}$ | 3290 | $L_{a2785}$ | $L_{b98}$ |
| 3291 | $L_{a1962}$ | $L_{b109}$ | 3292 | $L_{a2785}$ | $L_{b109}$ |
| 3293 | $L_{a1962}$ | $L_{b110}$ | 3294 | $L_{a2785}$ | $L_{b110}$ |
| 3295 | $L_{a1962}$ | $L_{b111}$ | 3296 | $L_{a2785}$ | $L_{b111}$ |
| 3297 | $L_{a1962}$ | $L_{b112}$ | 3298 | $L_{a2785}$ | $L_{b112}$ |
| 3299 | $L_{a1962}$ | $L_{b114}$ | 3300 | $L_{a2785}$ | $L_{b114}$ |
| 3301 | $L_{a1962}$ | $L_{b117}$ | 3302 | $L_{a2785}$ | $L_{b117}$ |
| 3303 | $L_{a1962}$ | $L_{b122}$ | 3304 | $L_{a2785}$ | $L_{b122}$ |
| 3305 | $L_{a1962}$ | $L_{b123}$ | 3306 | $L_{a2785}$ | $L_{b123}$ |
| 3307 | $L_{a1962}$ | $L_{b129}$ | 3308 | $L_{a2785}$ | $L_{b129}$ |
| 3309 | $L_{a1962}$ | $L_{b130}$ | 3310 | $L_{a2785}$ | $L_{b130}$ |
| 3311 | $L_{a1962}$ | $L_{b131}$ | 3312 | $L_{a2785}$ | $L_{b131}$ |
| 3313 | $L_{a1962}$ | $L_{b133}$ | 3314 | $L_{a2785}$ | $L_{b133}$ |
| 3315 | $L_{a1962}$ | $L_{b134}$ | 3316 | $L_{a2785}$ | $L_{b134}$ |
| 3317 | $L_{a1962}$ | $L_{b135}$ | 3318 | $L_{a2785}$ | $L_{b135}$ |
| 3319 | $L_{a1962}$ | $L_{b148}$ | 3320 | $L_{a2785}$ | $L_{b148}$ |
| 3321 | $L_{a1962}$ | $L_{b149}$ | 3322 | $L_{a2785}$ | $L_{b149}$ |
| 3323 | $L_{a1962}$ | $L_{b150}$ | 3324 | $L_{a2785}$ | $L_{b150}$ |
| 3325 | $L_{a1962}$ | $L_{b151}$ | 3326 | $L_{a2785}$ | $L_{b151}$ |
| 3327 | $L_{a1647}$ | $L_{b2}$ | 3328 | $L_{a1677}$ | $L_{b2}$ |
| 3329 | $L_{a1647}$ | $L_{b4}$ | 3330 | $L_{a1677}$ | $L_{b4}$ |
| 3331 | $L_{a1647}$ | $L_{b5}$ | 3332 | $L_{a1677}$ | $L_{b5}$ |
| 3333 | $L_{a1647}$ | $L_{b10}$ | 3334 | $L_{a1677}$ | $L_{b10}$ |
| 3335 | $L_{a1647}$ | $L_{b11}$ | 3336 | $L_{a1677}$ | $L_{b11}$ |
| 3337 | $L_{a1647}$ | $L_{b12}$ | 3338 | $L_{a1677}$ | $L_{b12}$ |
| 3339 | $L_{a1647}$ | $L_{b13}$ | 3340 | $L_{a2856}$ | $L_{b13}$ |
| 3341 | $L_{a1647}$ | $L_{b14}$ | 3342 | $L_{a2856}$ | $L_{b14}$ |
| 3343 | $L_{a1647}$ | $L_{b15}$ | 3344 | $L_{a2856}$ | $L_{b15}$ |
| 3345 | $L_{a1647}$ | $L_{b17}$ | 3346 | $L_{a2856}$ | $L_{b17}$ |
| 3347 | $L_{a1648}$ | $L_{b19}$ | 3348 | $L_{a2856}$ | $L_{b19}$ |
| 3349 | $L_{a1648}$ | $L_{b21}$ | 3350 | $L_{a2856}$ | $L_{b21}$ |
| 3351 | $L_{a1648}$ | $L_{b22}$ | 3352 | $L_{a2856}$ | $L_{b22}$ |
| 3353 | $L_{a1648}$ | $L_{b23}$ | 3354 | $L_{a1651}$ | $L_{b23}$ |
| 3355 | $L_{a1648}$ | $L_{b24}$ | 3356 | $L_{a1651}$ | $L_{b24}$ |
| 3357 | $L_{a1648}$ | $L_{b25}$ | 3358 | $L_{a1651}$ | $L_{b25}$ |
| 3359 | $L_{a1648}$ | $L_{b26}$ | 3360 | $L_{a1651}$ | $L_{b26}$ |
| 3361 | $L_{a1649}$ | $L_{b27}$ | 3362 | $L_{a1651}$ | $L_{b27}$ |
| 3363 | $L_{a1649}$ | $L_{b28}$ | 3364 | $L_{a1651}$ | $L_{b28}$ |
| 3365 | $L_{a1649}$ | $L_{b29}$ | 3366 | $L_{a1651}$ | $L_{b29}$ |
| 3367 | $L_{a1649}$ | $L_{b30}$ | 3368 | $L_{a1651}$ | $L_{b30}$ |
| 3369 | $L_{a1649}$ | $L_{b31}$ | 3370 | $L_{a1651}$ | $L_{b31}$ |
| 3371 | $L_{a1649}$ | $L_{b32}$ | 3372 | $L_{a1678}$ | $L_{b32}$ |
| 3373 | $L_{a1649}$ | $L_{b33}$ | 3374 | $L_{a1678}$ | $L_{b33}$ |
| 3375 | $L_{a1649}$ | $L_{b42}$ | 3376 | $L_{a1678}$ | $L_{b42}$ |
| 3377 | $L_{a1649}$ | $L_{b43}$ | 3378 | $L_{a1678}$ | $L_{b43}$ |
| 3379 | $L_{a1649}$ | $L_{b44}$ | 3380 | $L_{a1678}$ | $L_{b44}$ |
| 3381 | $L_{a1649}$ | $L_{b45}$ | 3382 | $L_{a1678}$ | $L_{b45}$ |
| 3383 | $L_{a1649}$ | $L_{b46}$ | 3384 | $L_{a1678}$ | $L_{b46}$ |
| 3385 | $L_{a1650}$ | $L_{b50}$ | 3386 | $L_{a1678}$ | $L_{b50}$ |
| 3387 | $L_{a1650}$ | $L_{b51}$ | 3388 | $L_{a2104}$ | $L_{b51}$ |
| 3389 | $L_{a1650}$ | $L_{b53}$ | 3390 | $L_{a2104}$ | $L_{b53}$ |
| 3391 | $L_{a1650}$ | $L_{b54}$ | 3392 | $L_{a2104}$ | $L_{b54}$ |
| 3393 | $L_{a1650}$ | $L_{b55}$ | 3394 | $L_{a2104}$ | $L_{b55}$ |
| 3395 | $L_{a1650}$ | $L_{b56}$ | 3396 | $L_{a2104}$ | $L_{b56}$ |
| 3397 | $L_{a1650}$ | $L_{b57}$ | 3398 | $L_{a2104}$ | $L_{b57}$ |

-continued

| Metal Complex No. | $L_a$ | $L_b$ | Metal Complex No. | $L_a$ | $L_b$ |
|---|---|---|---|---|---|
| 3399 | $L_{a1650}$ | $L_{b58}$ | 3400 | $L_{a2104}$ | $L_{b58}$ |
| 3401 | $L_{a1650}$ | $L_{b59}$ | 3402 | $L_{a2104}$ | $L_{b59}$ |
| 3403 | $L_{a928}$ | $L_{b66}$ | 3404 | $L_{a2104}$ | $L_{b66}$ |
| 3405 | $L_{a928}$ | $L_{b68}$ | 3406 | $L_{a2104}$ | $L_{b68}$ |
| 3407 | $L_{a928}$ | $L_{b70}$ | 3408 | $L_{a2104}$ | $L_{b70}$ |
| 3409 | $L_{a928}$ | $L_{b75}$ | 3410 | $L_{a2927}$ | $L_{b75}$ |
| 3411 | $L_{a928}$ | $L_{b76}$ | 3412 | $L_{a2927}$ | $L_{b76}$ |
| 3413 | $L_{a928}$ | $L_{687}$ | 3414 | $L_{a2927}$ | $L_{b87}$ |
| 3415 | $L_{a928}$ | $L_{b95}$ | 3416 | $L_{a2927}$ | $L_{b95}$ |
| 3417 | $L_{a928}$ | $L_{b96}$ | 3418 | $L_{a2927}$ | $L_{b96}$ |
| 3419 | $L_{a2714}$ | $L_{b97}$ | 3420 | $L_{a2927}$ | $L_{b97}$ |
| 3421 | $L_{a2714}$ | $L_{b98}$ | 3422 | $L_{a2927}$ | $L_{b98}$ |
| 3423 | $L_{a2714}$ | $L_{b109}$ | 3424 | $L_{a2927}$ | $L_{b109}$ |
| 3425 | $L_{a2714}$ | $L_{b110}$ | 3426 | $L_{a2927}$ | $L_{b110}$ |
| 3427 | $L_{a2714}$ | $L_{b111}$ | 3428 | $L_{a1679}$ | $L_{b111}$ |
| 3429 | $L_{a2714}$ | $L_{b112}$ | 3430 | $L_{a1679}$ | $L_{b112}$ |
| 3431 | $L_{a2714}$ | $L_{b114}$ | 3432 | $L_{a1679}$ | $L_{b114}$ |
| 3433 | $L_{a2714}$ | $L_{b117}$ | 3434 | $L_{a1679}$ | $L_{b117}$ |
| 3435 | $L_{a2714}$ | $L_{b122}$ | 3436 | $L_{a1679}$ | $L_{b122}$ |
| 3437 | $L_{a2643}$ | $L_{b123}$ | 3438 | $L_{a1679}$ | $L_{b123}$ |
| 3439 | $L_{a2643}$ | $L_{b129}$ | 3440 | $L_{a1679}$ | $L_{b129}$ |
| 3441 | $L_{a2643}$ | $L_{b130}$ | 3442 | $L_{a1679}$ | $L_{b130}$ |
| 3443 | $L_{a2643}$ | $L_{b131}$ | 3444 | $L_{a1680}$ | $L_{b131}$ |
| 3445 | $L_{a2643}$ | $L_{b133}$ | 3446 | $L_{a1680}$ | $L_{b133}$ |
| 3447 | $L_{a2643}$ | $L_{b134}$ | 3448 | $L_{a1680}$ | $L_{b134}$ |
| 3449 | $L_{a2643}$ | $L_{b135}$ | 3450 | $L_{a1680}$ | $L_{b135}$ |
| 3451 | $L_{a2033}$ | $L_{b148}$ | 3452 | $L_{a1680}$ | $L_{b148}$ |
| 3453 | $L_{a2033}$ | $L_{b149}$ | 3454 | $L_{a1680}$ | $L_{b149}$ |
| 3455 | $L_{a2033}$ | $L_{b150}$ | 3456 | $L_{a1680}$ | $L_{b150}$ |
| 3457 | $L_{a2033}$ | $L_{b151}$ | 3458 | $L_{a1680}$ | $L_{b151}$ |
| 3459 | $L_{a1795}$ | $L_{b2}$ | 3460 | $L_{a1570}$ | $L_{b2}$ |
| 3461 | $L_{a1795}$ | $L_{b4}$ | 3462 | $L_{a1570}$ | $L_{b4}$ |
| 3463 | $L_{a1795}$ | $L_{b5}$ | 3464 | $L_{a1570}$ | $L_{b5}$ |
| 3465 | $L_{a1795}$ | $L_{b10}$ | 3466 | $L_{a1570}$ | $L_{b10}$ |
| 3467 | $L_{a1795}$ | $L_{b11}$ | 3468 | $L_{a1570}$ | $L_{b11}$ |
| 3469 | $L_{a1795}$ | $L_{b12}$ | 3470 | $L_{a1570}$ | $L_{b12}$ |
| 3471 | $L_{a1795}$ | $L_{b13}$ | 3472 | $L_{a1570}$ | $L_{b13}$ |
| 3473 | $L_{a1795}$ | $L_{b14}$ | 3474 | $L_{a1570}$ | $L_{b14}$ |
| 3475 | $L_{a1795}$ | $L_{b15}$ | 3476 | $L_{a1570}$ | $L_{b15}$ |
| 3477 | $L_{a1795}$ | $L_{b17}$ | 3478 | $L_{a1570}$ | $L_{b17}$ |
| 3479 | $L_{a1820}$ | $L_{b19}$ | 3480 | $L_{a1570}$ | $L_{b19}$ |
| 3481 | $L_{a1820}$ | $L_{b21}$ | 3482 | $L_{a1570}$ | $L_{b21}$ |
| 3483 | $L_{a1820}$ | $L_{b22}$ | 3484 | $L_{a1691}$ | $L_{b22}$ |
| 3485 | $L_{a1820}$ | $L_{b23}$ | 3486 | $L_{a1691}$ | $L_{b23}$ |
| 3487 | $L_{a1820}$ | $L_{b24}$ | 3488 | $L_{a1691}$ | $L_{b24}$ |
| 3489 | $L_{a1820}$ | $L_{b25}$ | 3490 | $L_{a1691}$ | $L_{b25}$ |
| 3491 | $L_{a1820}$ | $L_{b26}$ | 3492 | $L_{a1691}$ | $L_{b26}$ |
| 3493 | $L_{a1820}$ | $L_{b27}$ | 3494 | $L_{a1691}$ | $L_{b27}$ |
| 3495 | $L_{a1820}$ | $L_{b28}$ | 3496 | $L_{a1691}$ | $L_{b28}$ |
| 3497 | $L_{a1820}$ | $L_{b29}$ | 3498 | $L_{a1691}$ | $L_{b29}$ |
| 3499 | $L_{a2437}$ | $L_{b30}$ | 3500 | $L_{a1691}$ | $L_{b30}$ |
| 3501 | $L_{a2437}$ | $L_{b31}$ | 3502 | $L_{a1691}$ | $L_{b31}$ |
| 3503 | $L_{a2437}$ | $L_{b32}$ | 3504 | $L_{a1691}$ | $L_{b32}$ |
| 3505 | $L_{a2437}$ | $L_{b33}$ | 3506 | $L_{a1691}$ | $L_{b33}$ |
| 3507 | $L_{a2437}$ | $L_{b42}$ | 3508 | $L_{a2436}$ | $L_{b42}$ |
| 3509 | $L_{a2437}$ | $L_{b43}$ | 3510 | $L_{a2436}$ | $L_{b43}$ |
| 3511 | $L_{a2437}$ | $L_{b41}$ | 3512 | $L_{a2436}$ | $L_{b44}$ |
| 3513 | $L_{a2437}$ | $L_{645}$ | 3514 | $L_{a2436}$ | $L_{b45}$ |
| 3515 | $L_{a2437}$ | $L_{b46}$ | 3516 | $L_{a2436}$ | $L_{b46}$ |
| 3517 | $L_{a2437}$ | $L_{b50}$ | 3518 | $L_{a2436}$ | $L_{b50}$ |
| 3519 | $L_{a2437}$ | $L_{b51}$ | 3520 | $L_{a2436}$ | $L_{b51}$ |
| 3521 | $L_{a2437}$ | $L_{b53}$ | 3522 | $L_{a2436}$ | $L_{b53}$ |
| 3523 | $L_{a2437}$ | $L_{b54}$ | 3524 | $L_{a2436}$ | $L_{b54}$ |
| 3525 | $L_{a2437}$ | $L_{b55}$ | 3526 | $L_{a2436}$ | $L_{b55}$ |
| 3527 | $L_{a2437}$ | $L_{b56}$ | 3528 | $L_{a2436}$ | $L_{b56}$ |
| 3529 | $L_{a2437}$ | $L_{b57}$ | 3530 | $L_{a2436}$ | $L_{b57}$ |
| 3531 | $L_{a2437}$ | $L_{b58}$ | 3532 | $L_{a2436}$ | $L_{b58}$ |
| 3533 | $L_{a2437}$ | $L_{b59}$ | 3534 | $L_{a2436}$ | $L_{b59}$ |
| 3535 | $L_{a2437}$ | $L_{b66}$ | 3536 | $L_{a2436}$ | $L_{b66}$ |
| 3537 | $L_{a2437}$ | $L_{b68}$ | 3538 | $L_{a2436}$ | $L_{b68}$ |
| 3539 | $L_{a2437}$ | $L_{b70}$ | 3540 | $L_{a2436}$ | $L_{b70}$ |
| 3541 | $L_{a2618}$ | $L_{b75}$ | 3542 | $L_{a2436}$ | $L_{b75}$ |
| 3543 | $L_{a2618}$ | $L_{b76}$ | 3544 | $L_{a2436}$ | $L_{b76}$ |
| 3545 | $L_{a2618}$ | $L_{b87}$ | 3546 | $L_{a2436}$ | $L_{b87}$ |
| 3547 | $L_{a2618}$ | $L_{b95}$ | 3548 | $L_{a2436}$ | $L_{b95}$ |
| 3549 | $L_{a2618}$ | $L_{b96}$ | 3550 | $L_{a2436}$ | $L_{b96}$ |

-continued

| Metal Complex No. | $L_a$ | $L_b$ | Metal Complex No. | $L_a$ | $L_b$ |
|---|---|---|---|---|---|
| 3551 | $L_{a2618}$ | $L_{b97}$ | 3552 | $L_{a2436}$ | $L_{b97}$ |
| 3553 | $L_{a2618}$ | $L_{b98}$ | 3554 | $L_{a2436}$ | $L_{b98}$ |
| 3555 | $L_{a2618}$ | $L_{b109}$ | 3556 | $L_{a2436}$ | $L_{b109}$ |
| 3557 | $L_{a2618}$ | $L_{b110}$ | 3558 | $L_{a3365}$ | $L_{b110}$ |
| 3559 | $L_{a2618}$ | $L_{b111}$ | 3560 | $L_{a3365}$ | $L_{b111}$ |
| 3561 | $L_{a2618}$ | $L_{b112}$ | 3562 | $L_{a3365}$ | $L_{b112}$ |
| 3563 | $L_{a2618}$ | $L_{b114}$ | 3564 | $L_{a3365}$ | $L_{b114}$ |
| 3565 | $L_{a2618}$ | $L_{b117}$ | 3566 | $L_{a3365}$ | $L_{b117}$ |
| 3567 | $L_{a2618}$ | $L_{b122}$ | 3568 | $L_{a3365}$ | $L_{b122}$ |
| 3569 | $L_{a3341}$ | $L_{b123}$ | 3570 | $L_{a3365}$ | $L_{b123}$ |
| 3571 | $L_{a3341}$ | $L_{b129}$ | 3572 | $L_{a3365}$ | $L_{b129}$ |
| 3573 | $L_{a3341}$ | $L_{b130}$ | 3574 | $L_{a3365}$ | $L_{b130}$ |
| 3575 | $L_{a3341}$ | $L_{b131}$ | 3576 | $L_{a3365}$ | $L_{b131}$ |
| 3577 | $L_{a3341}$ | $L_{b133}$ | 3578 | $L_{a3365}$ | $L_{b133}$ |
| 3579 | $L_{a3341}$ | $L_{b134}$ | 3580 | $L_{a3365}$ | $L_{b134}$ |
| 3581 | $L_{a3341}$ | $L_{b135}$ | 3582 | $L_{a3365}$ | $L_{b135}$ |
| 3583 | $L_{a3341}$ | $L_{b148}$ | 3584 | $L_{a3365}$ | $L_{b148}$ |
| 3585 | $L_{a3341}$ | $L_{b149}$ | 3586 | $L_{a3365}$ | $L_{b149}$ |
| 3587 | $L_{a3341}$ | $L_{b150}$ | 3588 | $L_{a3365}$ | $L_{b150}$ |
| 3589 | $L_{a3341}$ | $L_{b151}$ | 3590 | $L_{a3365}$ | $L_{b151}$ |
| 3591 | $L_{a3367}$ | $L_{b52}$ | 3592 | $L_{a3391}$ | $L_{b52}$ |
| 3593 | $L_{a3368}$ | $L_{b52}$ | 3594 | $L_{a3400}$ | $L_{b52}$ |
| 3595 | $L_{a3381}$ | $L_{b52}$ | 3596 | $L_{a3416}$ | $L_{b52}$ |
| 3597 | $L_{a3367}$ | $L_{b52}$ | 3598 | $L_{a3367}$ | $L_{b20}$ |
| 3599 | $L_{a3368}$ | $L_{b52}$ | 3600 | $L_{a3368}$ | $L_{b20}$ |
| 3601 | $L_{a3369}$ | $L_{b52}$ | 3602 | $L_{a3369}$ | $L_{b20}$ |
| 3603 | $L_{a3370}$ | $L_{b52}$ | 3604 | $L_{a3370}$ | $L_{b20}$ |
| 3605 | $L_{a3371}$ | $L_{b52}$ | 3606 | $L_{a3371}$ | $L_{b20}$ |
| 3607 | $L_{a3372}$ | $L_{b52}$ | 3608 | $L_{a3372}$ | $L_{b20}$ |
| 3609 | $L_{a3373}$ | $L_{b52}$ | 3610 | $L_{a3373}$ | $L_{b20}$ |
| 3611 | $L_{a3374}$ | $L_{b52}$ | 3612 | $L_{a3374}$ | $L_{b20}$ |
| 3613 | $L_{a3375}$ | $L_{b52}$ | 3614 | $L_{a3375}$ | $L_{b20}$ |
| 3615 | $L_{a3376}$ | $L_{b52}$ | 3616 | $L_{a3376}$ | $L_{b20}$ |
| 3617 | $L_{a3377}$ | $L_{b52}$ | 3618 | $L_{a3377}$ | $L_{b20}$ |
| 3619 | $L_{a3378}$ | $L_{b52}$ | 3620 | $L_{a3378}$ | $L_{b20}$ |
| 3621 | $L_{a3379}$ | $L_{b52}$ | 3622 | $L_{a3379}$ | $L_{b20}$ |
| 3623 | $L_{a3380}$ | $L_{b52}$ | 3624 | $L_{a3380}$ | $L_{b20}$ |
| 3625 | $L_{a3381}$ | $L_{b52}$ | 3626 | $L_{a3381}$ | $L_{b20}$ |
| 3627 | $L_{a3382}$ | $L_{b52}$ | 3628 | $L_{a3382}$ | $L_{b20}$ |
| 3629 | $L_{a3408}$ | $L_{b52}$ | 3630 | $L_{a3408}$ | $L_{b20}$ |
| 3631 | $L_{a3409}$ | $L_{b52}$ | 3632 | $L_{a3409}$ | $L_{b20}$ |
| 3633 | $L_{a3410}$ | $L_{b52}$ | 3634 | $L_{a3410}$ | $L_{b20}$ |
| 3635 | $L_{a3423}$ | $L_{b52}$ | 3636 | $L_{a3423}$ | $L_{b20}$ |
| 3637 | $L_{a3424}$ | $L_{b52}$ | 3638 | $L_{a3424}$ | $L_{b20}$ |
| 3639 | $L_{a3425}$ | $L_{b52}$ | 3640 | $L_{a3425}$ | $L_{b20}$ |
| 3641 | $L_{a3453}$ | $L_{b52}$ | 3642 | $L_{a3453}$ | $L_{b20}$ |
| 3643 | $L_{a3454}$ | $L_{b52}$ | 3644 | $L_{a3454}$ | $L_{b20}$ |
| 3645 | $L_{a3455}$ | $L_{b52}$ | 3646 | $L_{a3455}$ | $L_{b20}$ |
| 3647 | $L_{a3383}$ | $L_{b52}$ | 3648 | $L_{a3383}$ | $L_{b20}$ |
| 3649 | $L_{a3384}$ | $L_{b52}$ | 3650 | $L_{a3384}$ | $L_{b20}$ |
| 3651 | $L_{a3385}$ | $L_{b52}$ | 3652 | $L_{a3385}$ | $L_{b20}$ |
| 3653 | $L_{a3386}$ | $L_{b52}$ | 3654 | $L_{a3386}$ | $L_{b20}$ |
| 3655 | $L_{a3387}$ | $L_{b52}$ | 3656 | $L_{a3387}$ | $L_{b20}$ |
| 3657 | $L_{a3388}$ | $L_{b52}$ | 3658 | $L_{a3388}$ | $L_{b20}$ |
| 3659 | $L_{a3389}$ | $L_{b52}$ | 3660 | $L_{a3389}$ | $L_{b20}$ |
| 3661 | $L_{a3390}$ | $L_{b52}$ | 3662 | $L_{a3390}$ | $L_{b20}$ |
| 3663 | $L_{a3391}$ | $L_{b52}$ | 3664 | $L_{a3391}$ | $L_{b20}$ |
| 3665 | $L_{a3392}$ | $L_{b52}$ | 3666 | $L_{a3392}$ | $L_{b20}$ |
| 3667 | $L_{a420}$ | $L_{b52}$ | 3668 | $L_{a490}$ | $L_{b52}$ |
| 3669 | $L_{a420}$ | $L_{b20}$ | 3670 | $L_{a490}$ | $L_{b20}$ |
| 3671 | $L_{a420}$ | $L_{b135}$ | 3672 | $L_{a490}$ | $L_{b135}$ |
| 3673 | $L_{a420}$ | $L_{b1}$ | 3674 | $L_{a490}$ | $L_{b1}$ |
| 3675 | $L_{a420}$ | $L_{b3}$ | 3676 | $L_{a490}$ | $L_{b3}$ |
| 3677 | $L_{a420}$ | $L_{b8}$ | 3678 | $L_{a490}$ | $L_{b8}$ |
| 3679 | $L_{a420}$ | $L_{b118}$ | 3680 | $L_{a490}$ | $L_{b118}$ |
| 3681 | $L_{a420}$ | $L_{b132}$ | 3682 | $L_{a490}$ | $L_{b132}$ |
| 3683 | $L_{a420}$ | $L_{b150}$ | 3684 | $L_{a490}$ | $L_{b150}$ |
| 3685 | $L_{a420}$ | $L_{b151}$ | 3686 | $L_{a490}$ | $L_{b151}$ |
| 3687 | $L_{a136}$ | $L_{b135}$ | 3688 | $L_{a157}$ | $L_{b135}$ |
| 3689 | $L_{a136}$ | $L_{b150}$ | 3690 | $L_{a157}$ | $L_{b150}$ |
| 3691 | $L_{a136}$ | $L_{b151}$ | 3692 | $L_{a157}$ | $L_{b151}$ |
| 3693 | $L_{a278}$ | $L_{b135}$ | 3694 | $L_{a6}$ | $L_{b52}$ |
| 3695 | $L_{a278}$ | $L_{b150}$ | 3696 | $L_{a6}$ | $L_{b20}$ |
| 3697 | $L_{a278}$ | $L_{b151}$ | 3698 | $L_{a6}$ | $L_{b135}$ |
| 3699 | $L_{a106}$ | $L_{b52}$ | 3700 | $L_{a6}$ | $L_{b1}$ |
| 3701 | $L_{a106}$ | $L_{b20}$ | 3702 | $L_{a6}$ | $L_{b3}$ |

-continued

| Metal Complex No. | $L_a$ | $L_b$ | Metal Complex No. | $L_a$ | $L_b$ |
|---|---|---|---|---|---|
| 3703 | $L_{a106}$ | $L_{b135}$ | 3704 | $L_{ab}$ | $L_{b8}$ |
| 3705 | $L_{a106}$ | $L_{b1}$ | 3706 | $L_{a6}$ | $L_{b118}$ |
| 3707 | $L_{a106}$ | $L_{b3}$ | 3708 | $L_{a6}$ | $L_{b132}$ |
| 3709 | $L_{a106}$ | $L_{b8}$ | 3710 | $L_{a6}$ | $L_{b150}$ |
| 3711 | $L_{a106}$ | $L_{b118}$ | 3712 | $L_{a6}$ | $L_{b151}$ |
| 3713 | $L_{a106}$ | $L_{b132}$ | 3714 | $L_{a111}$ | $L_{b52}$ |
| 3715 | $L_{a106}$ | $L_{b150}$ | 3716 | $L_{a111}$ | $L_{b20}$ |
| 3717 | $L_{a106}$ | $L_{b151}$ | 3718 | $L_{a111}$ | $L_{b135}$ |
| 3719 | $L_{a49}$ | $L_{b52}$ | 3720 | $L_{a111}$ | $L_{b1}$ |
| 3721 | $L_{a49}$ | $L_{b20}$ | 3722 | $L_{a111}$ | $L_{b3}$ |
| 3723 | $L_{a49}$ | $L_{b135}$ | 3724 | $L_{a111}$ | $L_{b8}$ |
| 3725 | $L_{a49}$ | $L_{b1}$ | 3726 | $L_{a111}$ | $L_{b118}$ |
| 3727 | $L_{a49}$ | $L_{b3}$ | 3728 | $L_{a111}$ | $L_{b132}$ |
| 3729 | $L_{a49}$ | $L_{b8}$ | 3730 | $L_{a111}$ | $L_{b150}$ |
| 3731 | $L_{a49}$ | $L_{b118}$ | 3732 | $L_{a111}$ | $L_{b151}$ |
| 3733 | $L_{a49}$ | $L_{b132}$ | 3734 | $L_{a228}$ | $L_{b52}$ |
| 3735 | $L_{a49}$ | $L_{b150}$ | 3736 | $L_{a228}$ | $L_{b20}$ |
| 3737 | $L_{a49}$ | $L_{b151}$ | 3738 | $L_{a228}$ | $L_{b135}$ |
| 3739 | $L_{a207}$ | $L_{b52}$ | 3740 | $L_{a228}$ | $L_{b1}$ |
| 3741 | $L_{a207}$ | $L_{b20}$ | 3742 | $L_{a228}$ | $L_{b3}$ |
| 3743 | $L_{a207}$ | $L_{b135}$ | 3744 | $L_{a228}$ | $L_{b8}$ |
| 3745 | $L_{a207}$ | $L_{b1}$ | 3746 | $L_{a228}$ | $L_{b118}$ |
| 3747 | $L_{a207}$ | $L_{b3}$ | 3748 | $L_{a228}$ | $L_{b132}$ |
| 3749 | $L_{a207}$ | $L_{b8}$ | 3750 | $L_{a228}$ | $L_{b150}$ |
| 3751 | $L_{a207}$ | $L_{b118}$ | 3752 | $L_{a228}$ | $L_{b151}$ |
| 3753 | $L_{a207}$ | $L_{b132}$ | 3754 | $L_{a370}$ | $L_{b52}$ |
| 3755 | $L_{a207}$ | $L_{b150}$ | 3756 | $L_{a370}$ | $L_{b20}$ |
| 3757 | $L_{a207}$ | $L_{b151}$ | 3758 | $L_{a370}$ | $L_{b135}$ |
| 3759 | $L_{a349}$ | $L_{b52}$ | 3760 | $L_{a370}$ | $L_{b1}$ |
| 3761 | $L_{a349}$ | $L_{b20}$ | 3762 | $L_{a370}$ | $L_{b3}$ |
| 3763 | $L_{a349}$ | $L_{b135}$ | 3764 | $L_{a370}$ | $L_{b8}$ |
| 3765 | $L_{a349}$ | $L_{b1}$ | 3766 | $L_{a370}$ | $L_{b118}$ |
| 3767 | $L_{a349}$ | $L_{b3}$ | 3768 | $L_{a370}$ | $L_{b132}$ |
| 3769 | $L_{a349}$ | $L_{b8}$ | 3770 | $L_{a370}$ | $L_{b150}$ |
| 3771 | $L_{a349}$ | $L_{b118}$ | 3772 | $L_{a370}$ | $L_{b151}$ |
| 3773 | $L_{a349}$ | $L_{b132}$ | 3774 | $L_{a511}$ | $L_{b52}$ |
| 3775 | $L_{a349}$ | $L_{b150}$ | 3776 | $L_{a511}$ | $L_{b20}$ |
| 3777 | $L_{a349}$ | $L_{b151}$ | 3778 | $L_{a511}$ | $L_{b135}$ |
| 3779 | $L_{a581}$ | $L_{b52}$ | 3780 | $L_{a511}$ | $L_{b1}$ |
| 3781 | $L_{a581}$ | $L_{b20}$ | 3782 | $L_{a511}$ | $L_{b3}$ |
| 3783 | $L_{a581}$ | $L_{b135}$ | 3784 | $L_{a511}$ | $L_{b8}$ |
| 3785 | $L_{a581}$ | $L_{b1}$ | 3786 | $L_{a511}$ | $L_{b118}$ |
| 3787 | $L_{a581}$ | $L_{b3}$ | 3788 | $L_{a511}$ | $L_{b132}$ |
| 3789 | $L_{a581}$ | $L_{b8}$ | 3790 | $L_{a511}$ | $L_{b150}$ |
| 3791 | $L_{a581}$ | $L_{b118}$ | 3792 | $L_{a511}$ | $L_{b151}$ |
| 3793 | $L_{a581}$ | $L_{b132}$ | 3794 | $L_{a560}$ | $L_{b52}$ |
| 3795 | $L_{a581}$ | $L_{b150}$ | 3796 | $L_{a560}$ | $L_{b20}$ |
| 3797 | $L_{a581}$ | $L_{b151}$ | 3798 | $L_{a560}$ | $L_{b135}$ |
| 3799 | $L_{a560}$ | $L_{b118}$ | 3800 | $L_{a560}$ | $L_{b1}$ |
| 3801 | $L_{a560}$ | $L_{b132}$ | 3802 | $L_{a560}$ | $L_{b3}$ |
| 3803 | $L_{a560}$ | $L_{b150}$ | 3804 | $L_{a560}$ | $L_{b8}$ |
| 3805 | $L_{a560}$ | $L_{b151}$ | 3806 | $L_{a560}$ | $L_{b31}$. |

18. An organic electroluminescent device, comprising:

an anode, a cathode, and an organic layer disposed between the anode and the cathode, wherein at least one layer of the organic layer comprises the metal complex according to claim 1.

19. The organic electroluminescent device according to claim 18, wherein the organic layer comprising the metal complex is a light-emitting layer.

20. The organic electroluminescent device according to claim 19, wherein the light-emitting layer further comprises a first host compound;

preferably, the light-emitting layer further comprises a second host compound; and more preferably, the first host compound and/or the second host compound comprise at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene and combinations thereof.

21. The organic electroluminescent device according to claim 20, wherein the metal complex is doped in the first host compound and the second host compound, and the weight of the metal complex accounts for 1% to 30% of the total weight of the light-emitting layer; and preferably, the weight of the metal complex accounts for 3% to 13% of the total weight of the light-emitting layer.

22. A composition, comprising the metal complex according to claim 1.

* * * * *